US011482683B2

(12) United States Patent
Tsai et al.

(10) Patent No.: US 11,482,683 B2
(45) Date of Patent: Oct. 25, 2022

(54) ORGANIC ELECTROLUMINESCENT MATERIALS AND DEVICES

(71) Applicant: Universal Display Corporation, Ewing, NJ (US)

(72) Inventors: Jui-Yi Tsai, Newtown, PA (US); Zhiqiang Ji, Hillsborough, NJ (US); Alexey Borisovich Dyatkin, Ambler, PA (US); Chuanjun Xia, Lawrenceville, NJ (US); Chun Lin, Yardley, PA (US); Lichang Zeng, Lawrenceville, NJ (US); Walter Yeager, Yardley, PA (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 459 days.

(21) Appl. No.: 15/619,190

(22) Filed: Jun. 9, 2017

(65) Prior Publication Data

US 2017/0365800 A1 Dec. 21, 2017

Related U.S. Application Data

(60) Provisional application No. 62/516,329, filed on Jun. 7, 2017, provisional application No. 62/480,746, filed
(Continued)

(51) Int. Cl.
*H01L 51/00* (2006.01)
*C07F 15/00* (2006.01)
(Continued)

(52) U.S. Cl.
CPC ...... *H01L 51/0085* (2013.01); *C07F 15/0033* (2013.01); *C09K 11/025* (2013.01);
(Continued)

(58) Field of Classification Search
CPC ............. H01L 51/0085; H01L 51/0054; H01L 51/0067; H01L 51/0074; H01L 51/5016;
(Continued)

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |

(Continued)

FOREIGN PATENT DOCUMENTS

| | | |
|---|---|---|
| CN | 103804426 | 5/2014 |
| EP | 0650955 | 5/1995 |

(Continued)

OTHER PUBLICATIONS

Choi, Gyeongshin et al., "Hemilabile N-Xylyl-N'-methylperimidine Carbene Iridium Complexes as Catalysts for C—H Activation and Dehydrogenative Silylation: Dual Role of N-Xylyl Moiety for ortho-C—H Bond Activation and Reductive Bong Cleavage" J. Am. Chem. Soc. 2013, 135, 13149-13161.
Tordera, Daniel et al., "Stable Green Electroluminescence from an Iridium Tris-Heteroleptic Ionic Complex" Chem. Mater. 2012, 24, 1896-1903.
Baranoff, Etienne et al., "Acid-Induced Degradation of Phosphorescent Dopants for OLEDs and Its Application to the Synthesis of Tris-heteroleptic Iridium(III) Bis-cyclometalated Complexes" Inorg. Chem. 2012, 51, 215-224.
Edkins, Robert M., et al., "The synthesis and photophysics of tris-heteroleptic cyclometalated iridium complexes" Dalton Trans., 2011, 40, 9672-9678.
Lepeltier, Marc et al., "Tris-cyclometalated Iridium(III) Complexes with Three Different Ligands: a New Example with 2-(2,4-Difluorophenyl)pyridine-Based Complex" Helvetica Chimica Acta—vol. 97 (2014), 939-956.
Park, Gui Youn et al., "Iridium Complexes Containing Three Different Ligands as White OLED Dopants" Molecular Crystals and Liquid Crystals, vol. 462, pp. 179-188, 2007.

(Continued)

*Primary Examiner* — Dylan C Kershner
(74) *Attorney, Agent, or Firm* — Duane Morris LLP

(57) ABSTRACT

Iridium complexes comprising three different bidentate ligands and their use in OLEDs to enhance the device efficiency and lifetime are disclosed. The complexes have a structure of the formula $Ir(L_A)(L_B)(L_C)$, where ligand $L_A$ is selected from a variety of structures, ligand $L_B$ has the structure

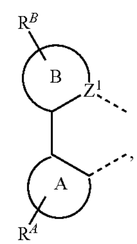

and $L_C$ has the structure

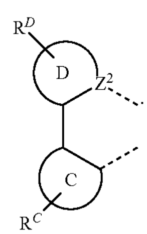

In these structures, rings A, B, C, and D are each independently a 5 or 6-membered carbocyclic or heterocyclic ring; $R^1$, $R^2$, $R^3$, $R^A$, $R^B$, $R^C$, and $R^D$ can be any of a variety of substituents, and $Z^1$ and $Z^2$ are each independently C or N.

20 Claims, 2 Drawing Sheets

Related U.S. Application Data on Apr. 3, 2017, provisional application No. 62/479,795, filed on Mar. 31, 2017, provisional application No. 62/450,848, filed on Jan. 26, 2017, provisional application No. 62/352,139, filed on Jun. 20, 2016.

(51) Int. Cl.
*C09K 11/02* (2006.01)
*C09K 11/06* (2006.01)
*H01L 51/50* (2006.01)

(52) U.S. Cl.
CPC .......... *C09K 11/06* (2013.01); *H01L 51/0054* (2013.01); *H01L 51/0067* (2013.01); *H01L 51/0074* (2013.01); *C09K 2211/1029* (2013.01); *C09K 2211/1033* (2013.01); *C09K 2211/185* (2013.01); *H01L 51/5016* (2013.01); *H01L 51/5056* (2013.01); *H01L 51/5072* (2013.01); *H01L 51/5088* (2013.01); *H01L 2251/5384* (2013.01)

(58) Field of Classification Search
CPC ............. H01L 51/5056; H01L 51/5072; H01L 51/5088; C09K 11/06; C09K 2211/1029; C09K 2211/1033; C09K 2211/185; C09K 11/025; C07F 15/0033
USPC .................... 428/690, 691, 917; 427/58, 66; 313/500–512; 257/40, 88–104, 257/E51.001–E51.052; 252/301.16–301.35
See application file for complete search history.

(56) References Cited

U.S. PATENT DOCUMENTS 5,247,190 A 9/1993 Friend et al.
5,703,436 A 12/1997 Forrest et al.
5,707,745 A 1/1998 Forrest et al.
5,834,893 A 11/1998 Bulovic et al.
5,844,363 A 12/1998 Gu et al.
6,013,982 A 1/2000 Thompson et al.
6,087,196 A 7/2000 Sturm et al.
6,091,195 A 7/2000 Forrest et al.
6,097,147 A 8/2000 Baldo et al.
6,294,398 B1 9/2001 Kim et al.
6,303,238 B1 10/2001 Thompson et al.
6,337,102 B1 1/2002 Forrest et al.
6,468,819 B1 10/2002 Kim et al.
6,528,187 B1 3/2003 Okada
6,687,266 B1 2/2004 Ma et al.
6,835,469 B2 12/2004 Kwong et al.
6,921,915 B2 7/2005 Takiguchi et al.
7,087,321 B2 8/2006 Kwong et al.
7,090,928 B2 8/2006 Thompson et al.
7,154,114 B2 12/2006 Brooks et al.
7,250,226 B2 7/2007 Tokito et al.
7,279,704 B2 10/2007 Walters et al.
7,332,232 B2 2/2008 Ma et al.
7,338,722 B2 3/2008 Thompson et al.
7,393,599 B2 7/2008 Thompson et al.
7,396,598 B2 7/2008 Takeuchi et al.
7,431,968 B1 10/2008 Shtein et al.
7,445,855 B2 11/2008 Mackenzie et al.
7,534,505 B2 5/2009 Lin et al.
8,946,697 B1 2/2015 Ma et al.
9,670,404 B2* 6/2017 Xia ........................ C09K 11/06
10,355,227 B2 7/2019 Ma et al.
2002/0034656 A1 3/2002 Thompson et al.
2002/0134984 A1 9/2002 Igarashi
2002/0158242 A1 10/2002 Son et al.
2003/0138657 A1 7/2003 Li et al.
2003/0152802 A1 8/2003 Tsuboyama et al.
2003/0162053 A1 8/2003 Marks et al.
2003/0175553 A1 9/2003 Thompson et al.
2003/0230980 A1 12/2003 Forrest et al.
2004/0036077 A1 2/2004 Ise
2004/0137267 A1 7/2004 Igarashi et al.
2004/0137268 A1 7/2004 Igarashi et al.
2004/0174116 A1 9/2004 Lu et al.
2005/0025993 A1 2/2005 Thompson et al.
2005/0112407 A1 5/2005 Ogasawara et al.
2005/0238919 A1 10/2005 Ogasawara
2005/0244673 A1 11/2005 Satoh et al.
2005/0260441 A1* 11/2005 Thompson .......... C07F 15/0033 428/690
2005/0260449 A1 11/2005 Walters et al.
2006/0008670 A1 1/2006 Lin et al.
2006/0202194 A1 9/2006 Jeong et al.
2006/0240279 A1 10/2006 Adamovich et al.
2006/0251923 A1 11/2006 Lin et al.
2006/0263635 A1 11/2006 Ise
2006/0280965 A1 12/2006 Kwong et al.
2007/0003789 A1* 1/2007 Kwong ............... C07F 15/0033 428/690
2007/0190359 A1 8/2007 Knowles et al.
2007/0278938 A1 12/2007 Yabunouchi et al.
2008/0001530 A1 1/2008 Ise
2008/0015355 A1 1/2008 Schafer et al.
2008/0018221 A1 1/2008 Egen et al.
2008/0106190 A1 5/2008 Yabunouchi et al.
2008/0124572 A1 5/2008 Mizuki et al.
2008/0220265 A1 9/2008 Xia et al.
2008/0297033 A1 12/2008 Knowles et al.
2009/0008605 A1 1/2009 Kawamura et al.
2009/0009065 A1 1/2009 Nishimura et al.
2009/0017330 A1 1/2009 Iwakuma et al.
2009/0030202 A1 1/2009 Iwakuma et al.
2009/0039776 A1 2/2009 Yamada et al.
2009/0045730 A1 2/2009 Nishimura et al.
2009/0045731 A1 2/2009 Nishimura et al.
2009/0101870 A1 4/2009 Pakash et al.
2009/0108737 A1* 4/2009 Kwong ............... C07F 15/0033 313/504
2009/0115316 A1 5/2009 Zheng et al.
2009/0165846 A1 7/2009 Johannes et al.
2009/0167162 A1 7/2009 Lin et al.
2009/0179554 A1 7/2009 Kuma et al.
2010/0237334 A1* 9/2010 Ma ....................... C07D 307/91 257/40
2010/0244004 A1* 9/2010 Xia ..................... C07F 15/0033 257/40
2010/0270916 A1* 10/2010 Xia ..................... C07F 15/0033 313/504
2011/0049496 A1 3/2011 Fukuzaki
2011/0227049 A1* 9/2011 Xia ..................... C07F 15/0033 257/40
2011/0315933 A1 12/2011 Stoessel
2013/0328018 A1 12/2013 Chen et al.
2013/0328019 A1* 12/2013 Xia ........................ C09K 11/06 257/40
2014/0197386 A1 7/2014 Kim et al.
2014/0306206 A1 10/2014 Watanabe et al.
2015/0069334 A1 3/2015 Xia et al.
2015/0357587 A1* 12/2015 Kishino ................. C09K 11/06 257/40
2015/0380666 A1 12/2015 Szigethy
2016/0133860 A1 5/2016 Boudreault et al.

FOREIGN PATENT DOCUMENTS

EP 1725079 11/2006
EP 2034538 3/2009
JP 200511610 1/2005
JP 2007123392 5/2007
JP 2007254297 10/2007
JP 2008074939 4/2008
JP 2015166336 9/2015
JP 2015173199 10/2015
KR 20150030511 3/2015
WO 01/39234 5/2001
WO 02/02714 1/2002

(56) References Cited

FOREIGN PATENT DOCUMENTS

| | | |
|---|---|---|
| WO | 02015654 | 2/2002 |
| WO | 03040257 | 5/2003 |
| WO | 03060956 | 7/2003 |
| WO | 2004093207 | 10/2004 |
| WO | 04107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005/097942 | 10/2005 |
| WO | 2005123873 | 12/2005 |
| WO | 2006009024 | 1/2006 |
| WO | 2006056418 | 6/2006 |
| WO | 2006072092 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2014/033050 | 3/2014 |
| WO | 2014/112450 | 7/2014 |
| WO | 2014/112657 | 7/2014 |
| WO | 2018084189 | 5/2018 |

OTHER PUBLICATIONS

Felici, Marco et al., "Cationic Heteroleptic Cyclometalated Iridium(III) Complexes Containing Phenyl-Triazole and Triazole-Pyridine Clicked Ligands" Molecules 2010, 15, 2039-2059.

Jurow, Matthew J. et al., "Understanding and predicting the orientation of heteroleptic phosphors in organic light-emitting materials" Nature Materials, vol. 15, Jan. 2016, pp. 85-91.

Graf, A. et al., "Correlating the transition dipole moment orientation of phosphorescent emitter molecules in OLEDs with basic material properties" J. Mater. Chem. C., 2014, 2, 10298-10304.

Kim, Kwon-Hyeon et al., "Phosphorescent dye-based supramolecules for high-efficiency organic light-emitting diodes" Nature Communications, 2014, 5, 4769, 1-8.

Kim, Kwon-Hyeon et al., "Design of Heteroleptic Ir Complexes with Horizontal Emitting Dipoles for Highly Efficient Organic Light-Emitting Diodes with an External Quantum Efficiency of 38%", Chem. Mater. 2016, 28, pp. 7505-7510.

Kim, Kwon-Hyeon et al., "Highly Efficient Organic Light-Emitting Diodes with Phosphorescent Emitters Having High Quantum Yield and Horizontal Orientation of Transition Dipole Moments", Adv. Mater. 2014, 26, pp. 3844-3847.

Burke, Christopher S. and Keyes, Tia E. An Efficient Route to Asymmetrically Diconjugated tris(heteroleptic) Complexes of Ru(II), RSC Advances, vol. 6, Jan. 1, 2013, pp. 40869-40877.

Xu, Xianbin et al., "Trifunctional IRIII ppy-type asymmetric phosphorescent emitters with ambiopolar features for highly efficient electroluminescent devices" Chem. Commun., 2014, 50, pp. 2473-2476.

Xu, Xianbin et al., "tris-Heteroleptic Cyclometalated Iridium(III) Complexes with Ambipolar or Electron Injection/Transport Features for Highly Efficient Electrophosphorescent Devices" Chem. Asian J. 2015, 10, pp. 252-262.

Extended European Search Report dated Apr. 11, 2018 for corresponding EP Application No. 17176681.9.

European Search Report dated Oct. 26, 2017 for corresponding European Patent Application No. 17176695.9.

Plummer, Edward A. et al., "Electrophosphorescent Devices Based on Cationic Complexes: Control of Switch-on Voltage and Efficiency Through Modification of Charge Injection and Charge Transport", Adv. Funct. Mater. 2005, vol. 15, No. 2, Feb. 2005, pp. 281-289.

Adachi, Chihaya et al., "Organic Electroluminescent Device Having a Hole Conductor as an Emitting Layer," Appl. Phys. Lett, 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electro phosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato)beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of $CHF_3$," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-

(56) References Cited

OTHER PUBLICATIONS

Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1) 162-164 (2002).
Lamansky, Sergey et al., "Synthesis and Characterization of Phosphorescent Cyclometalated Iridium Complexes," Inorg Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl Phys Lett., 77(15):2280-2282 (2000).
Lo, Shih-Chun et al., "Blue Phosphorescence from Iridium(III) Complexes at Room Temperature," Chem. Mater., 18(21)5119-5129 (2006).
Ma, Yuguang et al., "Triplet Luminescent Dinuclear-Gold(I) Complex-Based Light-Emitting Diodes with Low Tum-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1 - 153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69 (15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Jia-Ling Liao et al.: "Ir(III)-Based Phosphors with Bipyrazolate Ancillaries; Rational Design, Photophysics, and Applications in Organic Light-Emitting Diodes" Inorganic Chemistry, vol. 54, No. 22, Nov. 16, 2015 (Nov. 16, 2015), pp. 10811-10821.
European Search Report dated Oct. 26, 17 for corresponding EP Application No. 17176668.6.
Lepeltier, Marc et al., "Tris-cyclometalated Iridium(III) Complexes with Three Different Ligands: a New Example with 2-(2,4-Difluorophenyl)pyridine-Based Complex," Helvetica Chimica Acta, vol. 97, Issue 7, Jul. 2014, pp. 939-956.
Office Action dated Jun. 3, 2020 for corresponding CN Application No. 201710471274.2.
Extended European Search Report dated Nov. 12, 2020 for corresponding European Patent Application No. 20190784.7.
Hohenleutner, Andreas et al., "Rapid Combinational Synthesis and Chromatography Based Screening of Phosphorescent Iridium Complexes for Solution Processing", Adv. Funct. Mater., 2012, 22, 3406-3413.
Notice of Reasons for Rejection dated Oct. 13, 2020 in corresponding Japanese Patent Application No. 2017-119910.
Wang, B., et al., "Strongly phosphorescent platinum(ii) complexes supported by tetradentate benzazole-containing ligands," J. Mater. Chem C., 2015, vol. 3, pp. 8212-8218.

* cited by examiner

ORGANIC ELECTROLUMINESCENT MATERIALS AND DEVICES

CROSS-REFERENCE TO RELATED APPLICATIONS

This application claims priority under 35 U.S.C. § 119(e) (1) from U.S. Provisional Application Ser. No. 62/516,329, filed Jun. 7, 2017, 62/352,139, filed Jun. 20, 2016, 62/450,848, filed Jan. 26, 2017, 62/479,795, filed Mar. 31, 2017, and 62/480,746, filed Apr. 3, 2017, the entire contents of which are incorporated herein by reference.

FIELD

The present disclosure relates to compounds for use as phosphorescent emitters, and devices, such as organic light emitting diodes, including the same. More specifically, this disclosure relates to iridium complexes comprising three different bidentate ligands and their use in OLEDs to enhance the device efficiency and lifetime.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

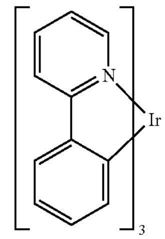

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an aspect of the present disclosure, a compound having a formula $Ir(L_A)(L_B)(L_C)$ is disclosed, wherein the ligand $L_A$ is selected from the group consisting of:

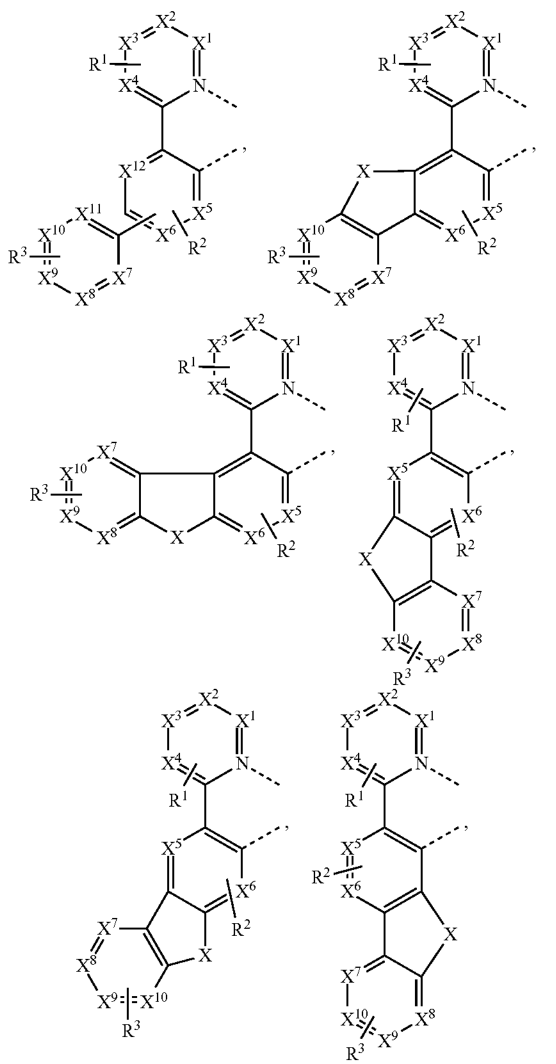

-continued

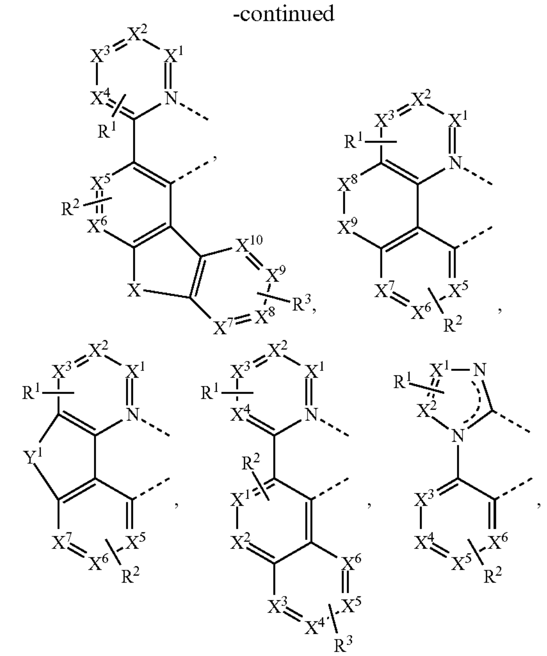

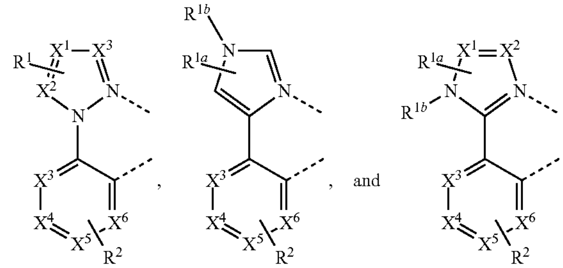

wherein the ligand $L_B$ is

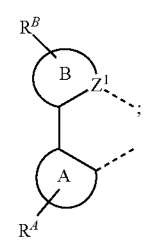

wherein the ligand $L_C$ is

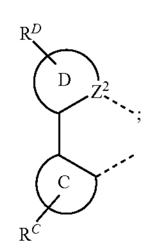

wherein rings A, B, C, and D are each independently a 5 or 6-membered carbocyclic or heterocyclic ring;

wherein $R^1$, $R^2$, $R^3$, $R^A$, $R^B$, $R^C$, and $R^D$ each independently represents mono, to a maximum possible number of substitution, or no substitution;

wherein $X^1$ to $X^{12}$, $Z^1$, and $Z^2$ are each independently C or N;

wherein $Y^1$ is selected from the group consisting of O, S, Se, and Ge;

wherein X is selected from the group consisting of BR', NR', PR', O, S, Se, C═O, S═O, $SO_2$, CR'R", SiR'R", and GeR'R";

wherein $L_A$, $L_B$, and $L_C$ are different from each other, and can be connected to each other to form multidentate ligand;

wherein $R^1$, $R^2$, $R^3$, $R^A$, $R^B$, $R^C$, $R^D$, R', and R" are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and wherein any two or more substituents among $R^1$, $R^2$, $R^3$, $R^A$, $R^B$, $R^C$, $R^D$, R', and R" are optionally joined or fused into a ring.

According to an aspect of the present disclosure, an OLED is also disclosed. The OLED comprises: an anode; a cathode; and an organic layer, disposed between the anode and the cathode. The organic layer comprising a compound having the formula $Ir(L_A)(L_B)(L_C)$ described herein.

A formulation comprising the compound described herein is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
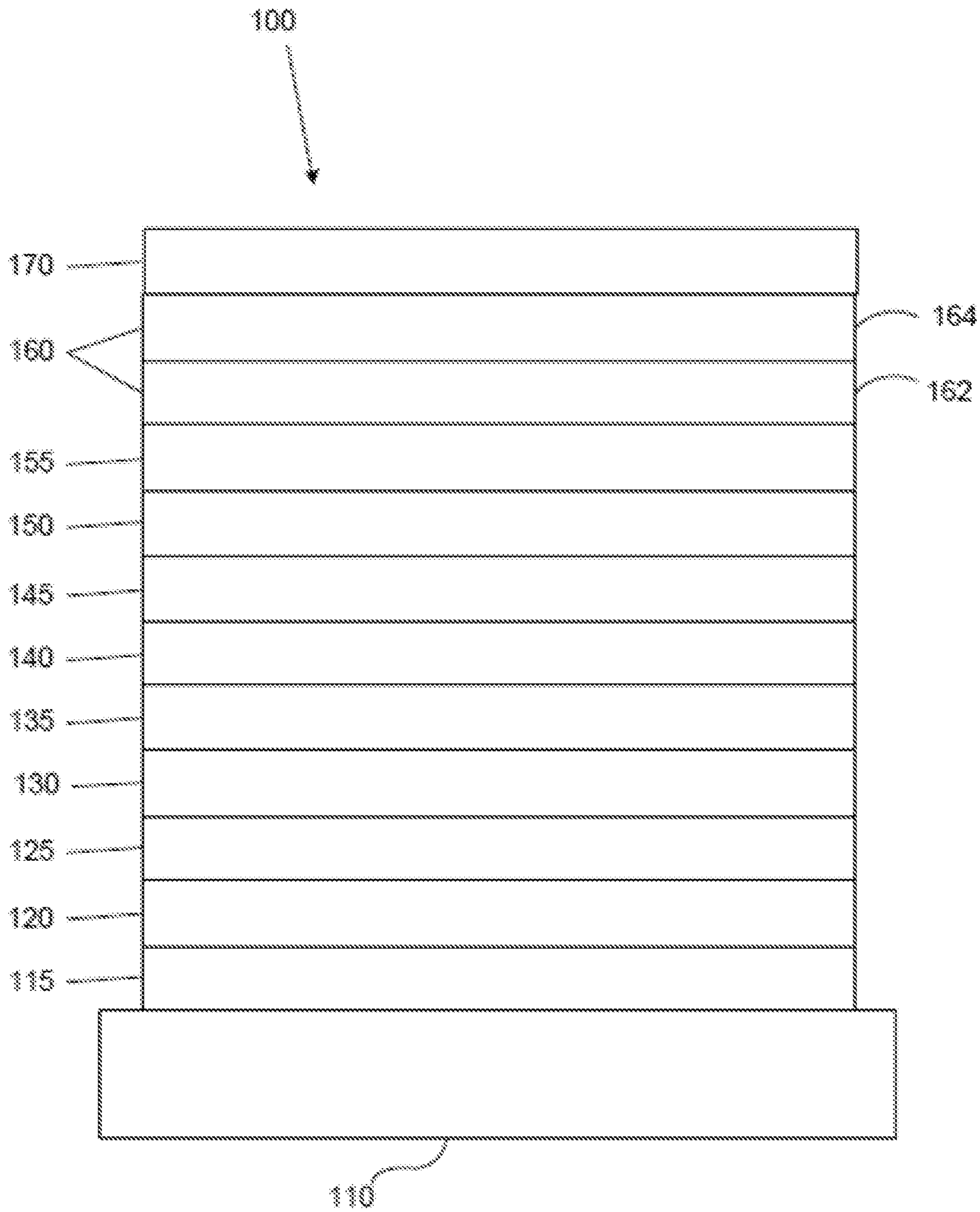
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
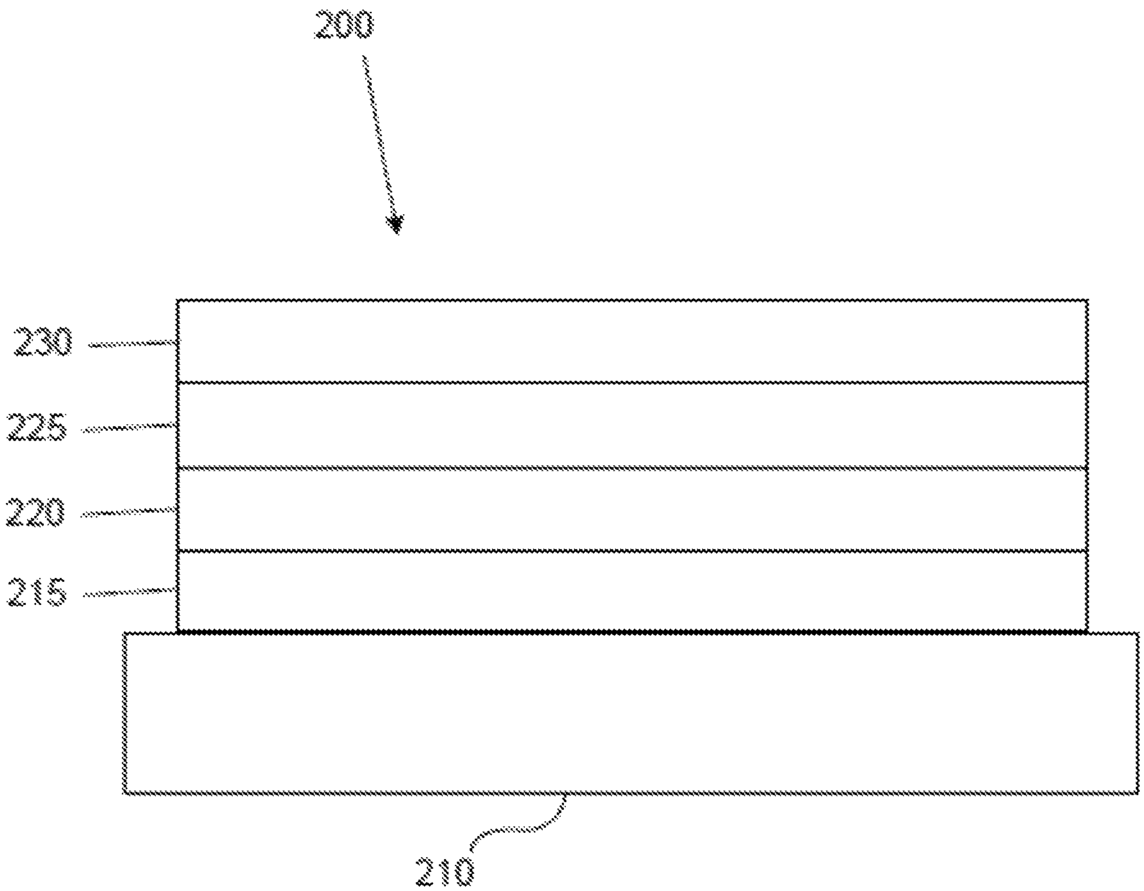
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

OLEDs fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo," "halogen," or "halide" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" as used herein contemplates cyclic alkyl radicals. Preferred cycloalkyl groups are those containing 3 to 10 ring carbon atoms and includes cyclopropyl, cyclopentyl, cyclohexyl, adamantyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Heteroaromatic cyclic radicals also means heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" as used herein contemplates single-ring hetero-aromatic groups that may include from one to five heteroatoms. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

According to an aspect of the present disclosure novel Iridium complexes comprising of three different bidenate ligands when incorporated in OLED devices provide better device efficiency and life time. The present disclosure discloses heterolyptic transition metal (Ir, Os, Rh, Ru, and Re) compounds used as emitters for PHOLED to improve the performance. The metal compounds disclosed herein have three different bidentate cyclometalated ligands coordinating to iridium metal center. The ligands were arranged in such a way that yield better device efficiency and stability.

According to an aspect, a compound having a formula $Ir(L_A)(L_B)(L_C)$ is disclosed, wherein the ligand $L_A$ is selected from the group consisting of:

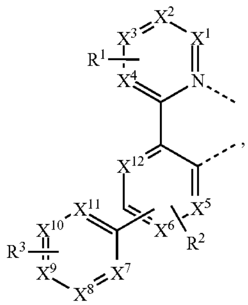

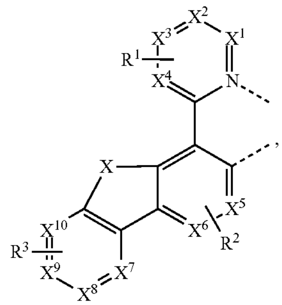

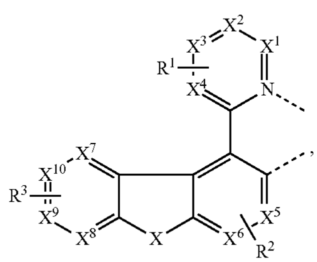

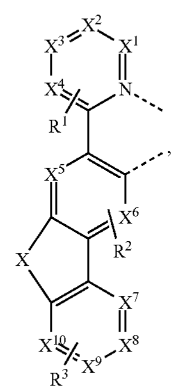

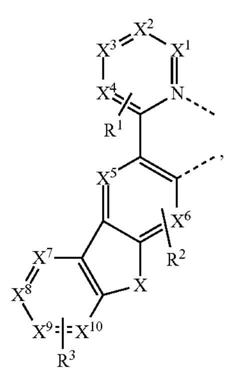

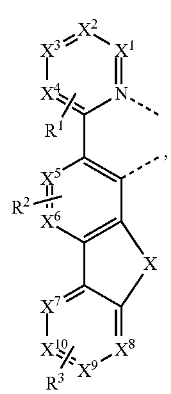

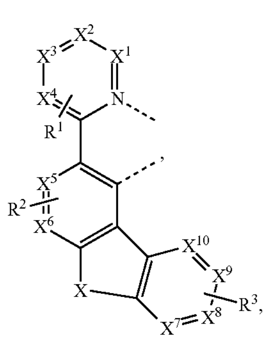

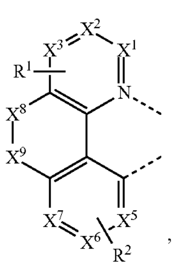

-continued

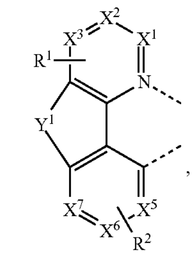

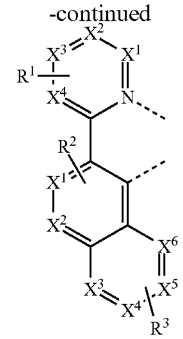

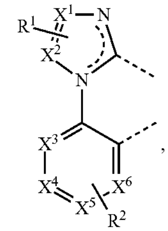

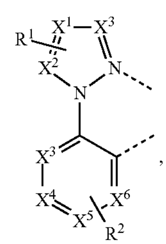

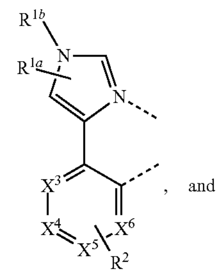

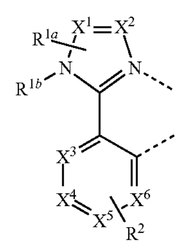

wherein the ligand $L_B$ is

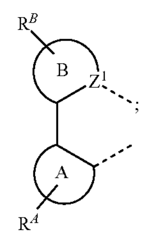

wherein the ligand $L_C$ is

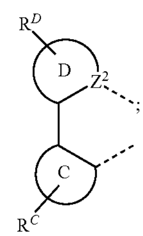

wherein rings A, B, C, and D are each independently a 5 or 6-membered carbocyclic or heterocyclic ring;

wherein $R^1$, $R^2$, $R^3$, $R^A$, $R^B$, $R^C$, and $R^D$ each independently represents mono, to a maximum possible number of substitution, or no substitution;

wherein $X^1$ to $X^{12}$, $Z^1$, and $Z^2$ are each independently C or N;

wherein $Y^1$ is selected from the group consisting of O, S, Se, and Ge;

wherein X is selected from the group consisting of BR', NR', PR', O, S, Se, C═O, S═O, $SO_2$, CR'R", SiR'R", and GeR'R";

wherein $L_A$, $L_B$, and $L_C$ are different from each other, and can be connected to each other to form multidentate ligand;

wherein $R^1$, $R^2$, $R^3$, $R^A$, $R^B$, $R^C$, $R^D$, R', and R" are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any two or more substituents among $R^1$, $R^2$, $R^3$, $R^A$, $R^B$, $R^C$, $R^D$, R', and R" are optionally joined or fused into a ring.

In some embodiments of the compound, any two substituents among $R^1$, $R^2$, $R^3$, $R^A$, $R^B$, $R^C$, $R^D$, R', and R" are optionally joined or fused into a ring.

In some embodiments of the compound, the rings A and C are benzene, and the rings B and D are pyridine. In some embodiments, the rings A, B, C, and D are each independently selected from the group consisting of phenyl, pyridine, imidazole, and imidazole derived carbene.

In some embodiments of the compound, $Z^1$ and $Z^2$ are N. In some embodiments of the compound, X is selected from the group consisting of NR', O, CR'R", and SiR'R".

In some embodiments of the compound, at least one of $R^1$, $R^2$, $R^3$, $R^A$, $R^B$, $R^C$, and $R^D$ is selected from the group consisting of alkyl, cycloalkyl, aryl, heteroaryl, partially or fully deuterated variants thereof, partially or fully fluorinated variants thereof, and combinations thereof.

In some embodiments of the compound, the ligand $L_A$ is selected from the group consisting of:

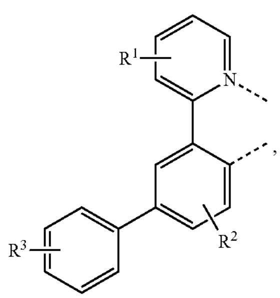

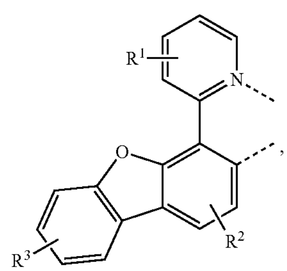

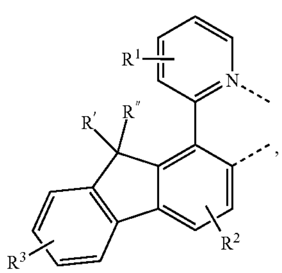

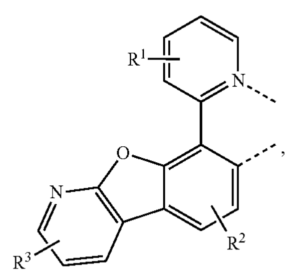

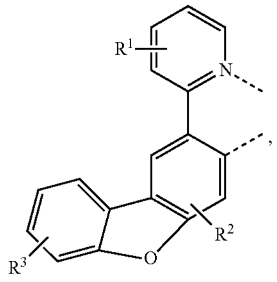

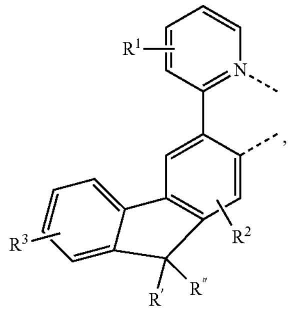

-continued

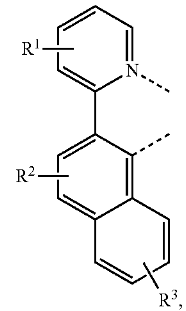

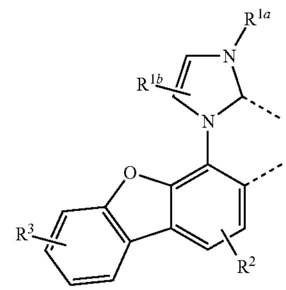

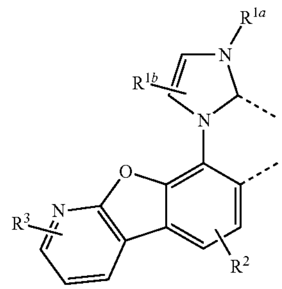

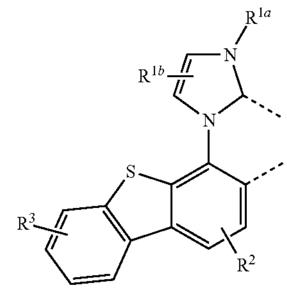

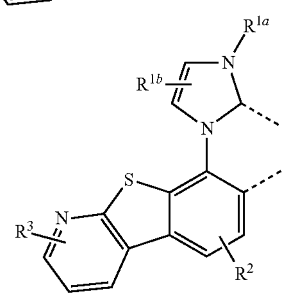

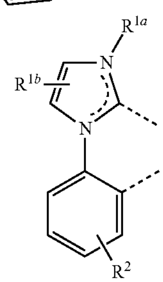

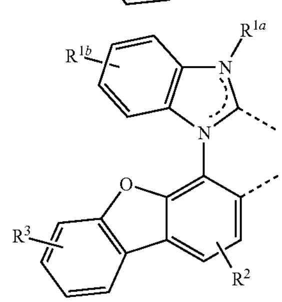

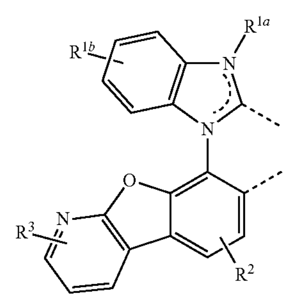

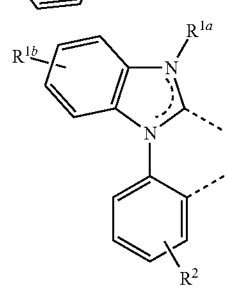

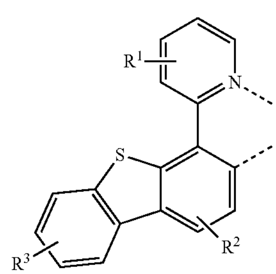

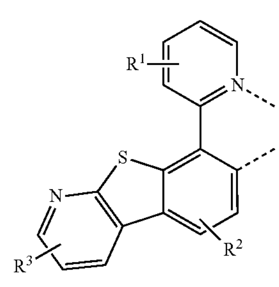

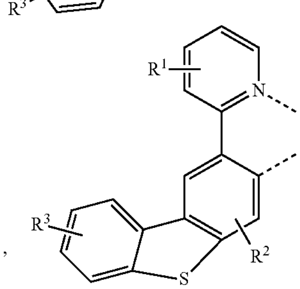

-continued
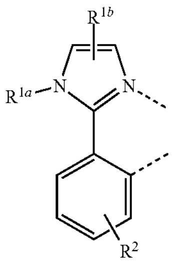
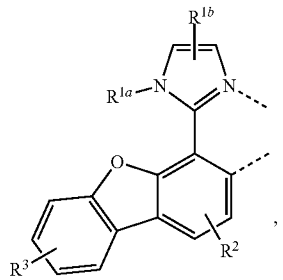
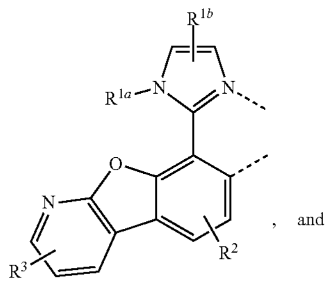
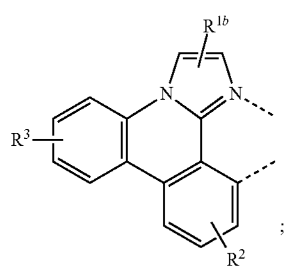
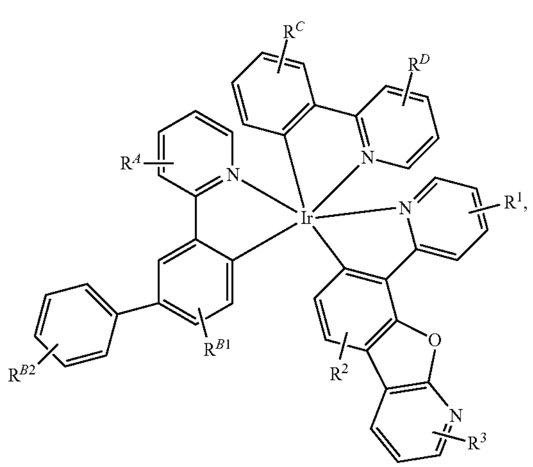
wherein $R^{1a}$ and $R^{1b}$ have the same definition as $R^1$.
In some embodiments of the compound, the compound is selected from the group consisting of:
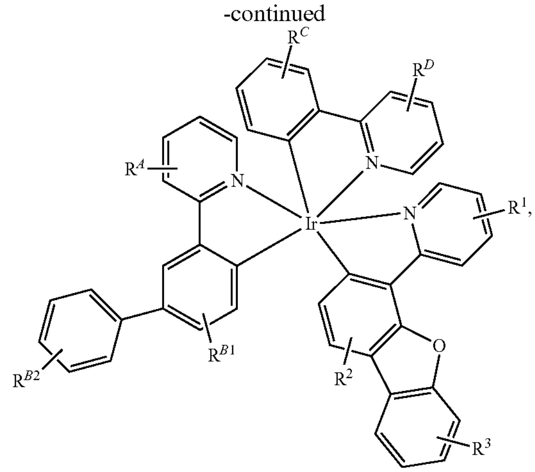
-continued
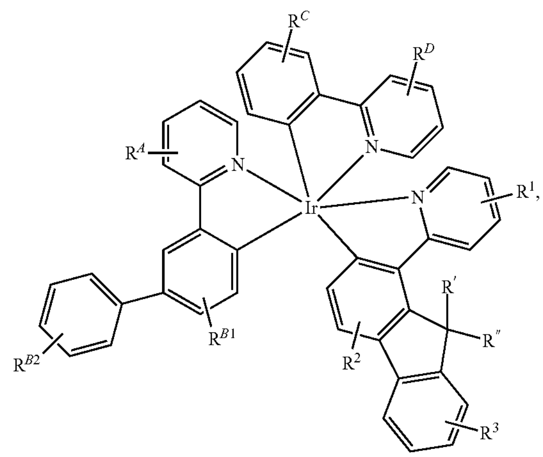
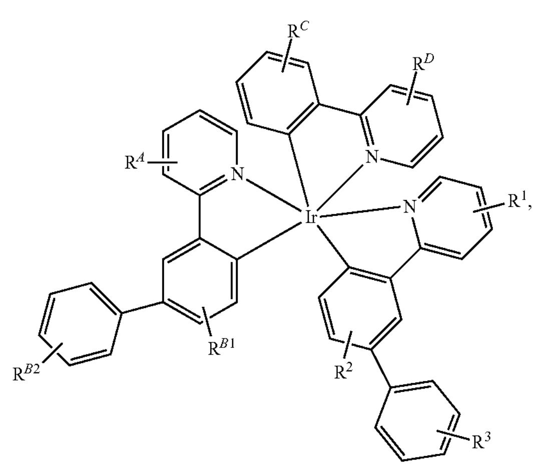

-continued
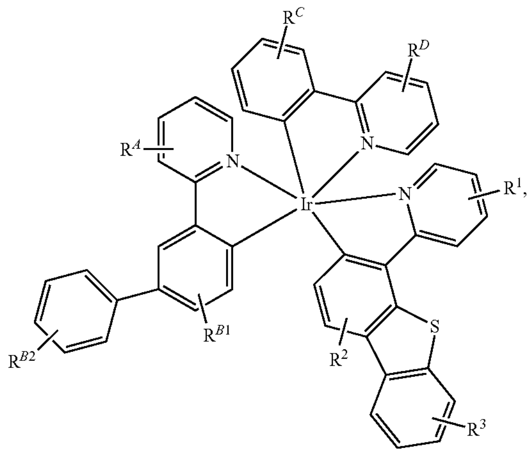
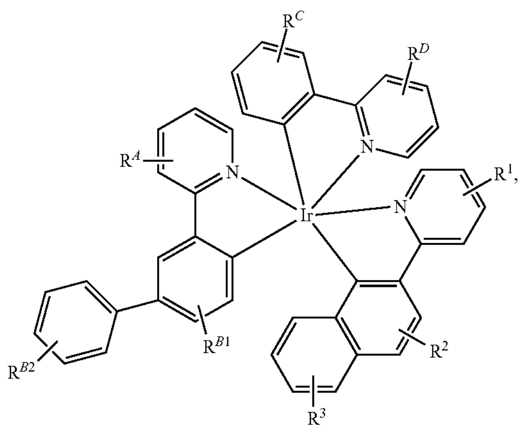
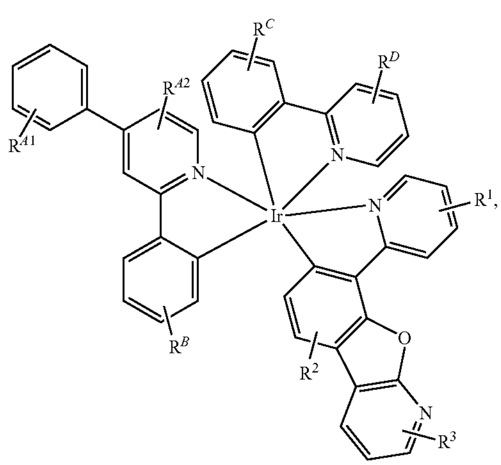
-continued
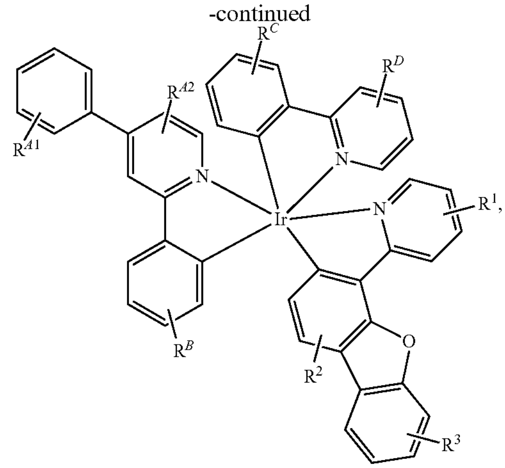
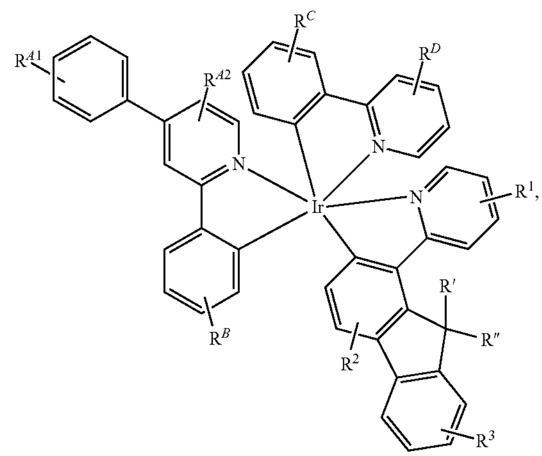
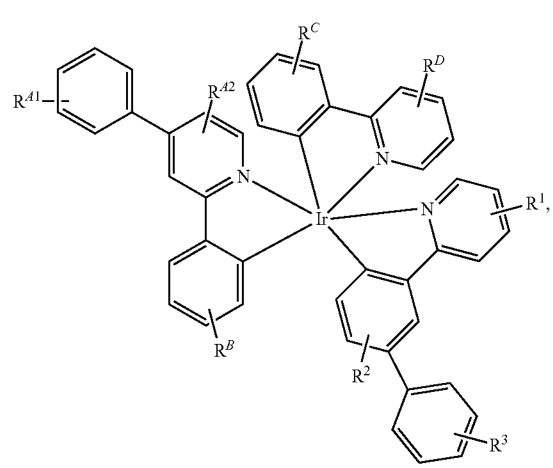

-continued
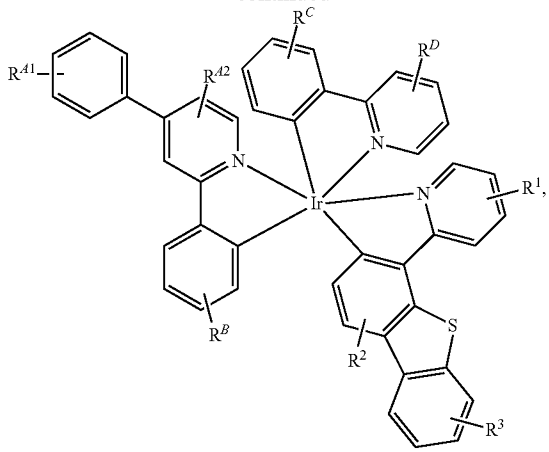
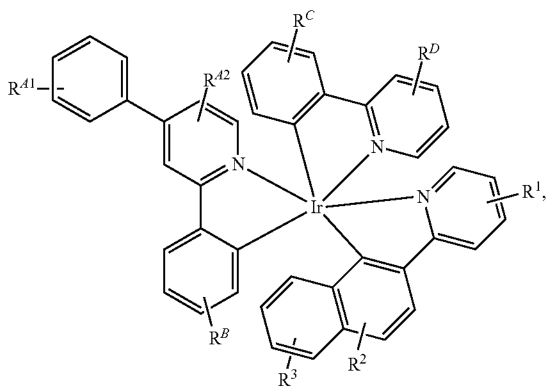
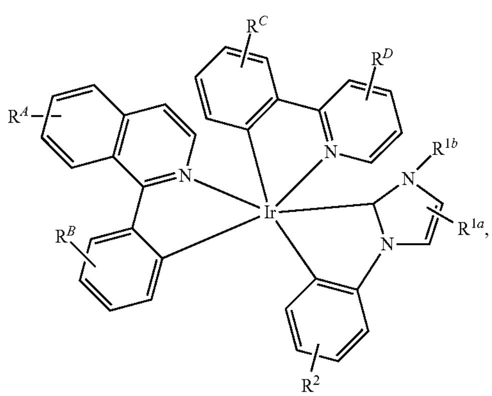
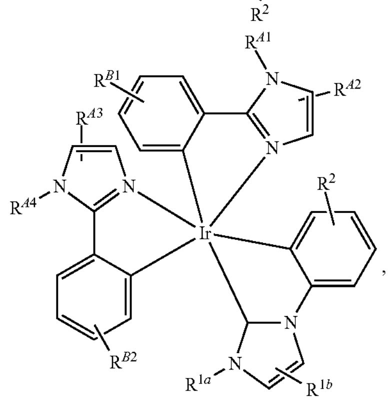
-continued
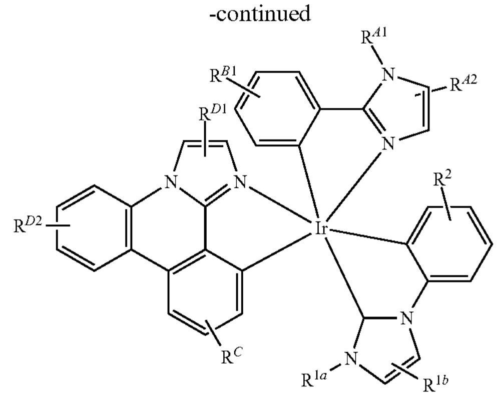
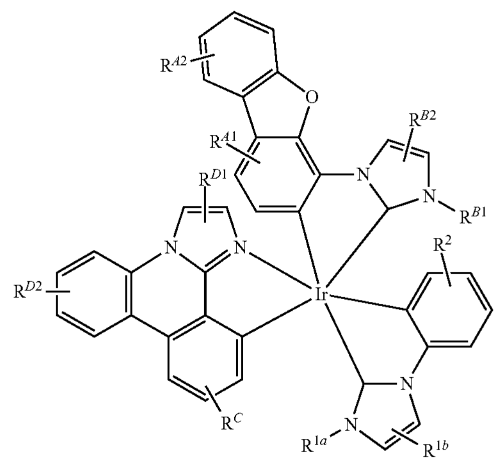
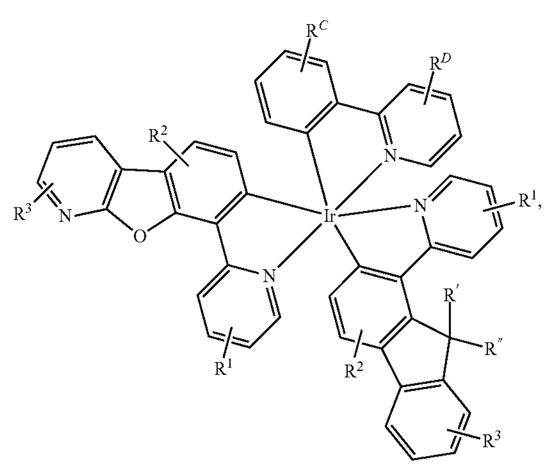
and -continued
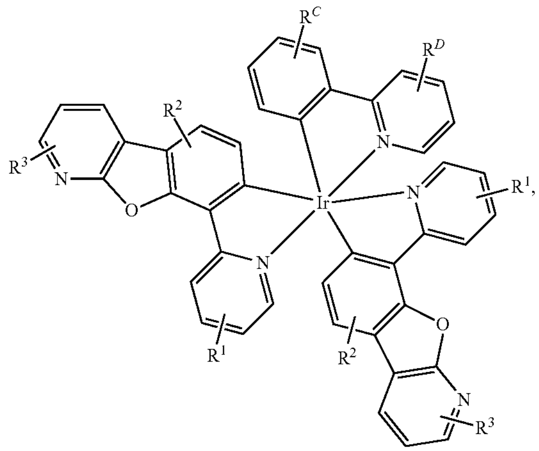
wherein $R^{1a}$ and $R^{1b}$ have the same definition as $R^1$; $R^{A1}$ and $R^{A2}$ have the same definition as $R^A$; and $R^{B1}$ and $R^{B2}$ have the same definition as $R^B$.
In some embodiments of the compound, at least one of $L_A$, $L_B$, and $L_C$ is selected from the group consisting of:
$L^a_{Al}$
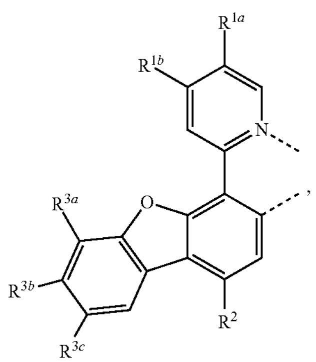
$L^b_{Ai}$
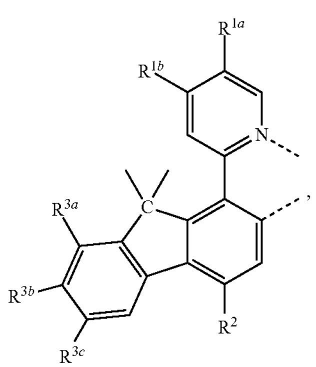
-continued
$L^c_{Ai}$
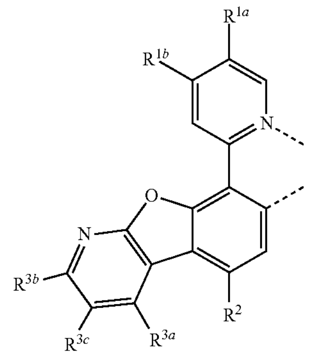
$L^d_{Ai}$
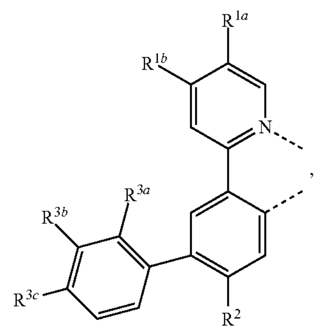
$L^e_{Ai}$
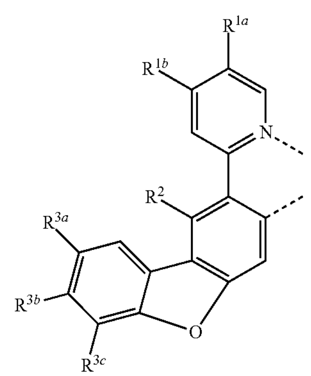
$L^f_{Ai}$
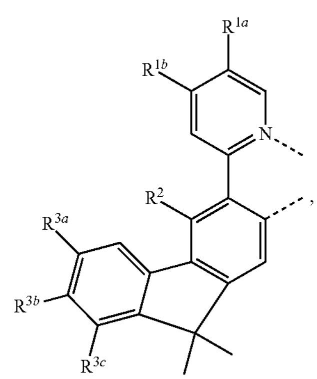

-continued
$L^g_{Ai}$
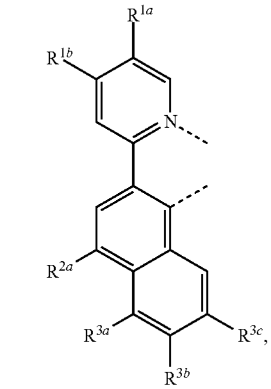
$L^h_{Ai}$
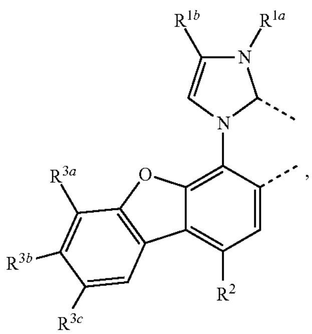
$L^i_{Ai}$
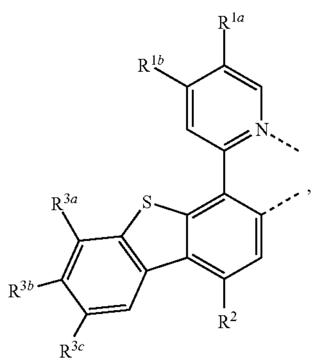
-continued
$L^j_{Ai}$
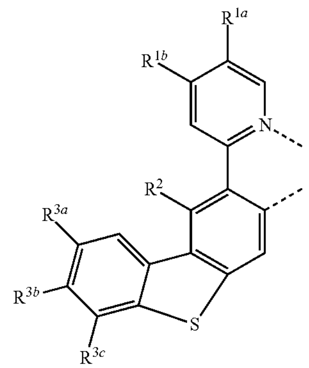
$L^k_{Ai}$
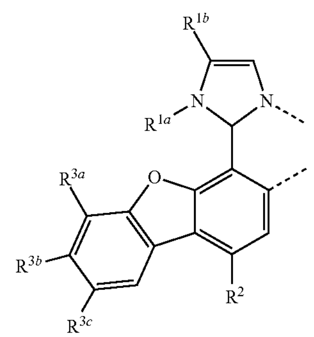
where i in Ai is 1 to 212 and the substituents $R^{1a}$, $R^{1b}$, $R^2$, $R^{3a}$, $R^{3b}$, and $R^{3c}$ in $L^a_{Ai}$ to $L^k_{Ai}$ are defined as shown in the following table,
| $L^a_{Ai}$ to $L^k_{Ai}$, where i is | $R^{1a}$ | $R^{1b}$ | $R^2$ | $R^{3a}$ | $R^{3b}$ | $R^{3c}$ |
|---|---|---|---|---|---|---|
| 1. | H | H | H | H | H | H |
| 2. | H | CH3 | H | H | H | H |
| 3. | H | CD3 | H | H | H | H |
| 4. | H | C2H5 | H | H | H | H |
| 5. | H | CD2CH3 | H | H | H | H |
| 6. | H | CHMe2 | H | H | H | H |
| 7. | H | CDMe2 | H | H | H | H |
| 8. | H | 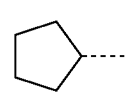 | H | H | H | H |
| 9. | H | 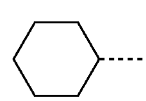 | H | H | H | H |

-continued
| $L^{a}_{Ai}$ to $L^{k}_{Ai}$, where i is | $R^{1a}$ | $R^{1b}$ | $R^{2}$ | $R^{3a}$ | $R^{3b}$ | $R^{3c}$ |
|---|---|---|---|---|---|---|
| 10. | H | 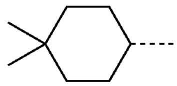 | H | H | H | H |
| 11. | H | 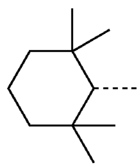 | H | H | H | H |
| 12. | H | 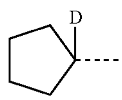 | H | H | H | H |
| 13. | H | 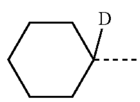 | H | H | H | H |
| 14. | H | 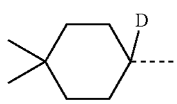 | H | H | H | H |
| 15. | H | 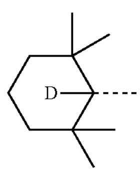 | H | H | H | H |
| 16. | H | 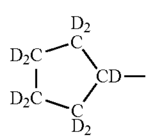 | H | H | H | H |
| 17. | H | CH2CMe3 | H | H | H | H |
| 18. | H | CD2CMe3 | H | H | H | H |
| 19. | H | 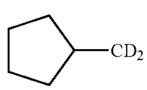 | H | H | H | H |
| 20. | H | 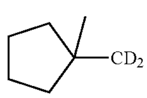 | H | H | H | H |
| 21. | CH3 | H | H | H | H | H |
| 22. | CD3 | H | H | H | H | H |
| 23. | C2H5 | H | H | H | H | H |
| 24. | CD2CH3 | H | H | H | H | H |
| 25. | CHMe2 | H | H | H | H | H |
| 26. | CDMe2 | H | H | H | H | H |
| 27. | 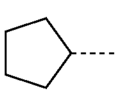 | H | H | H | H | H |
| 28. | 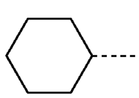 | H | H | H | H | H |

-continued
| $L^a_{Ai}$ to $L^k_{Ai}$, where i is | $R^{1a}$ | $R^{1b}$ | $R^2$ | $R^{3a}$ | $R^{3b}$ | $R^{3c}$ |
|---|---|---|---|---|---|---|
| 29. | 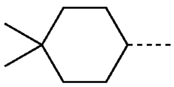 | H | H | H | H | H |
| 30. | 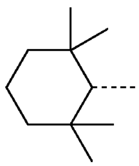 | H | H | H | H | H |
| 31. | 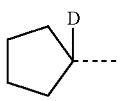 | H | H | H | H | H |
| 32. | 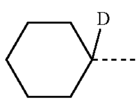 | H | H | H | H | H |
| 33. | 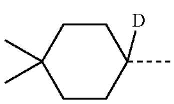 | H | H | H | H | H |
| 34. | 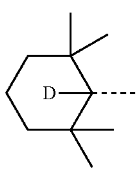 | H | H | H | H | H |
| 35. | 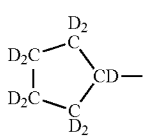 | H | H | H | H | H |
| 36. | CH2CMe3 | H | H | H | H | H |
| 37. | CD2CMe3 | H | H | H | H | H |
| 38. | 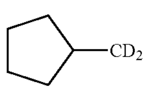 | H | H | H | H | H |
| 39. | 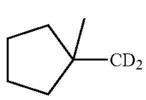 | H | H | H | H | H |
| 40. | CD3 | CH3 | H | H | H | H |
| 41. | CD3 | CD3 | H | H | H | H |
| 42. | CD3 | C2H5 | H | H | H | H |
| 43. | CD3 | CD2CH3 | H | H | H | H |
| 44. | CD3 | CHMe2 | H | H | H | H |
| 45. | CD3 | CDMe2 | H | H | H | H |
| 46. | CD3 | 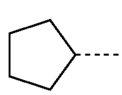 | H | H | H | H |
| 47. | CD3 | 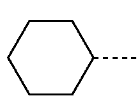 | H | H | H | H |

-continued
| $L^a_{Ai}$ to $L^k_{Ai}$, where i is | $R^{1a}$ | $R^{1b}$ | $R^2$ | $R^{3a}$ | $R^{3b}$ | $R^{3c}$ |
|---|---|---|---|---|---|---|
| 48. | CD3 | 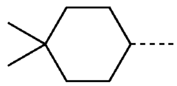 | H | H | H | H |
| 49. | CD3 | 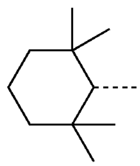 | H | H | H | H |
| 50. | CD3 | 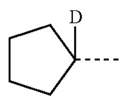 | H | H | H | H |
| 51. | CD3 | 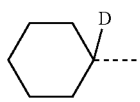 | H | H | H | H |
| 52. | CD3 | 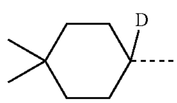 | H | H | H | H |
| 53. | CD3 | 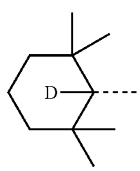 | H | H | H | H |
| 54. | CD3 | 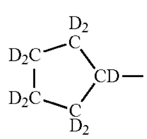 | H | H | H | H |
| 55. | CD3 | CH2CMe3 | H | H | H | H |
| 56. | CD3 | CD2CMe3 | H | H | H | H |
| 57. | CH2CH3 | CD3 | H | H | H | H |
| 58. | CD2CD3 | CD3 | H | H | H | H |
| 59. | C2H5 | CD3 | H | H | H | H |
| 60. | CD2CH3 | CD2CD3 | H | H | H | H |
| 61. | CHMe2 | CD3 | H | H | H | H |
| 62. | CDMe2 | CD3 | H | H | H | H |
| 63. | 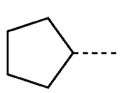 | CD3 | H | H | H | H |
| 64. | 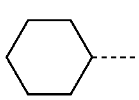 | CD3 | H | H | H | H |
| 65. | 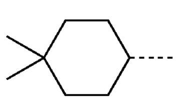 | CD3 | H | H | H | H |

-continued
| $L^a_{Ai}$ to $L^k_{Ai}$, where i is | $R^{1a}$ | $R^{1b}$ | $R^2$ | $R^{3a}$ | $R^{3b}$ | $R^{3c}$ |
|---|---|---|---|---|---|---|
| 66. | 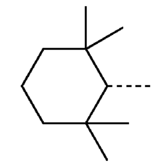 | CD3 | H | H | H | H |
| 67. | 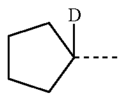 | CD3 | H | H | H | H |
| 68. | 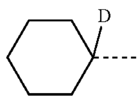 | CD3 | H | H | H | H |
| 69. | 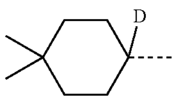 | CD3 | H | H | H | H |
| 70. | 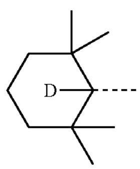 | CD3 | H | H | H | H |
| 71. | 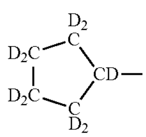 | CD3 | H | H | H | H |
| 72. | CH2CMe3 | CD3 | H | H | H | H |
| 73. | CD2CMe3 | CD3 | H | H | H | H |
| 74. | H | H | CD3 | H | H | H |
| 75. | H | CH3 | CD3 | H | H | H |
| 76. | H | CD3 | CD3 | H | H | H |
| 77. | H | C2H5 | CD3 | H | H | H |
| 78. | H | CD2CH3 | CD3 | H | H | H |
| 79. | H | CHMe2 | CD3 | H | H | H |
| 80. | H | CDMe2 | CD3 | H | H | H |
| 81. | H | 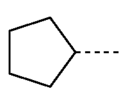 | CD3 | H | H | H |
| 82. | H | 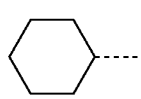 | CD3 | H | H | H |
| 83. | H | 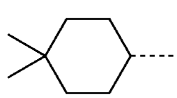 | CD3 | H | H | H |
| 84. | H | 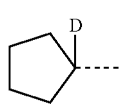 | CD3 | H | H | H |
| 85. | H | 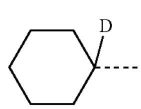 | CD3 | H | H | H |

-continued
| $L^a_{Ai}$ to $L^k_{Ai}$, where i is | $R^{1a}$ | $R^{1b}$ | $R^2$ | $R^{3a}$ | $R^{3b}$ | $R^{3c}$ |
|---|---|---|---|---|---|---|
| 86. | H | 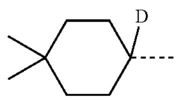 | CD3 | H | H | H |
| 87. | H | 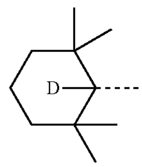 | CD3 | H | H | H |
| 88. | H | 1-Ad | CD3 | H | H | H |
| 89. | H | 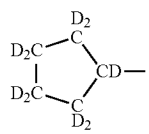 | CD3 | H | H | H |
| 90. | H | CH2CMe3 | CD3 | H | H | H |
| 91. | H | CD2CMe3 | CD3 | H | H | H |
| 92. | H | 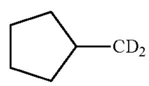 | CD3 | H | H | H |
| 93. | H | 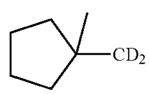 | CD3 | H | H | H |
| 94. | H | 2-Ad | CD3 | H | H | H |
| 95. | H | H | CD3 | H | H | CD3 |
| 96. | H | CH3 | CD3 | H | H | CD3 |
| 97. | H | CD3 | CD3 | H | H | CD3 |
| 98. | H | C2H5 | CD3 | H | H | CD3 |
| 99. | H | CD2CH3 | CD3 | H | H | CD3 |
| 100. | H | CHMe2 | CD3 | H | H | CD3 |
| 101. | H | CDMe2 | CD3 | H | H | CD3 |
| 102. | H | 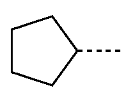 | CD3 | H | H | CD3 |
| 103. | H | 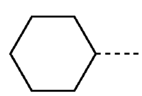 | CD3 | H | H | CD3 |
| 104. | H | 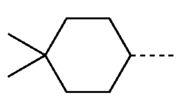 | CD3 | H | H | CD3 |
| 105. | H | 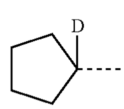 | CD3 | H | H | CD3 |
| 106. | H | 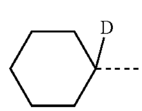 | CD3 | H | H | CD3 |
| 107. | H | 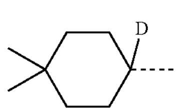 | CD3 | H | H | CD3 |

-continued
| $L^a_{Ai}$ to $L^k_{Ai}$, where i is | $R^{1a}$ | $R^{1b}$ | $R^2$ | $R^{3a}$ | $R^{3b}$ | $R^{3c}$ |
|---|---|---|---|---|---|---|
| 108. | H | 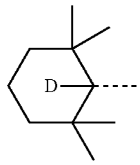 | CD3 | H | H | CD3 |
| 109. | H | 1-Ad | CD3 | H | H | CD3 |
| 110. | H | 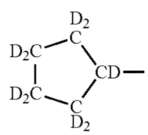 | CD3 | H | H | CD3 |
| 111. | H | CH2CMe3 | CD3 | H | H | CD3 |
| 112. | H | CD2CMe3 | CD3 | H | H | CD3 |
| 113. | H | 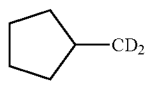 | CD3 | H | H | CD3 |
| 114. | H | 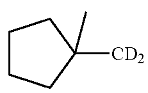 | CD3 | H | H | CD3 |
| 115. | H | 2-Ad | CD3 | H | H | H |
| 116. | H | H | CD3 | H | H | H |
| 117. | H | CH3 | CD3 | H | H | H |
| 118. | H | CD3 | CD3 | H | H | H |
| 119. | H | C2H5 | CD3 | H | H | H |
| 120. | H | CD2CH3 | CD3 | H | H | H |
| 121. | H | CHMe2 | CD3 | H | H | H |
| 122. | H | CDMe2 | CD3 | H | H | H |
| 123. | H | 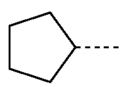 | CD3 | H | H | H |
| 124. | H | 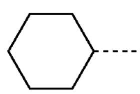 | CD3 | H | H | H |
| 125. | H | 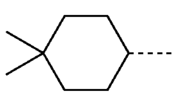 | CD3 | H | H | H |
| 126. | H | 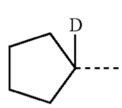 | CD3 | H | H | H |
| 127. | H | 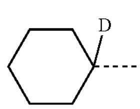 | CD3 | H | H | H |
| 128. | H | 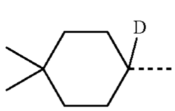 | CD3 | H | H | H |

-continued
| $L^a_{Ai}$ to $L^k_{Ai}$, where i is | $R^{1a}$ | $R^{1b}$ | $R^2$ | $R^{3a}$ | $R^{3b}$ | $R^{3c}$ |
|---|---|---|---|---|---|---|
| 129. | H | 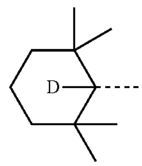 | CD3 | H | H | H |
| 130. | H | 1-Ad | CD3 | H | H | H |
| 131. | H | 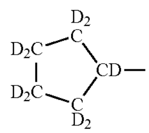 | CD3 | H | H | H |
| 132. | H | CH2CMe3 | CD3 | H | H | H |
| 133. | H | CD2CMe3 | CD3 | H | H | H |
| 134. | H | 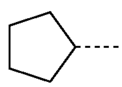 | CD3 | H | H | H |
| 135. | H | 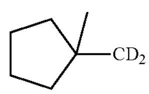 | CD3 | H | H | H |
| 136. | H | 2-Ad | CD3 | H | H | H |
| 137. | H | H | H | H | CD3 | H |
| 138. | H | CH3 | H | H | CD3 | H |
| 139. | H | CD3 | H | H | CD3 | H |
| 140. | H | C2H5 | H | H | CD3 | H |
| 141. | H | CD2CH3 | H | H | CD3 | H |
| 142. | H | CHMe2 | H | H | CD3 | H |
| 143. | H | CDMe2 | H | H | CD3 | H |
| 144. | H | 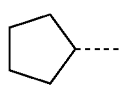 | H | H | CD3 | H |
| 145. | H | 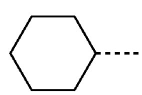 | H | H | CD3 | H |
| 146. | H | 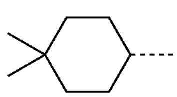 | H | H | CD3 | H |
| 147. | H | 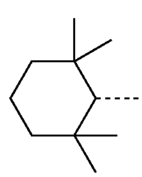 | H | H | CD3 | H |
| 148. | H | 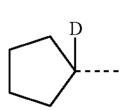 | H | H | CD3 | H |
| 149. | H | 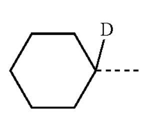 | H | H | CD3 | H |

-continued
| $L^a_{Ai}$ to $L^k_{Ai}$, where i is | $R^{1a}$ | $R^{1b}$ | $R^2$ | $R^{3a}$ | $R^{3b}$ | $R^{3c}$ |
|---|---|---|---|---|---|---|
| 150. | H | 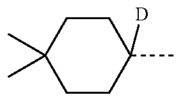 | H | H | CD3 | H |
| 151. | H | 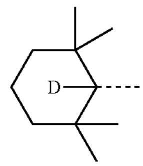 | H | H | CD3 | H |
| 152. | H | 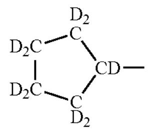 | H | H | CD3 | H |
| 153. | H | CH2CMe3 | H | H | CD3 | H |
| 154. | H | CD2CMe3 | H | H | CD3 | H |
| 155. | H | 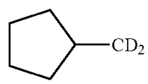 | H | H | CD3 | H |
| 156. | H | 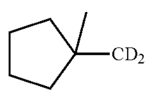 | H | H | CD3 | H |
| 157. | H | H | H | CD3 | H | H |
| 158. | H | CH3 | H | CD3 | H | H |
| 159. | H | CD3 | H | CD3 | H | H |
| 160. | H | C2H5 | H | CD3 | H | H |
| 161. | H | CD2CH3 | H | CD3 | H | H |
| 162. | H | CHMe2 | H | CD3 | H | H |
| 163. | H | CDMe2 | H | CD3 | H | H |
| 164. | H | 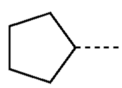 | H | CD3 | H | H |
| 165. | H | 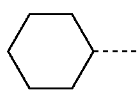 | H | CD3 | H | H |
| 166. | H | 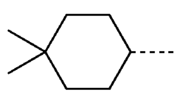 | H | CD3 | H | H |
| 167. | H | 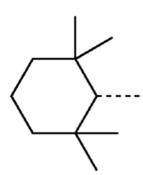 | H | CD3 | H | H |
| 168. | H | 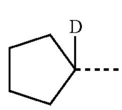 | H | CD3 | H | H |
| 169. | H | 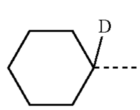 | H | CD3 | H | H |

-continued
| $L^a_{Ai}$ to $L^k_{Ai}$, where i is | $R^{1a}$ | $R^{1b}$ | $R^2$ | $R^{3a}$ | $R^{3b}$ | $R^{3c}$ |
|---|---|---|---|---|---|---|
| 170. | H | 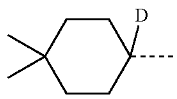 | H | CD3 | H | H |
| 171. | H | 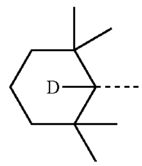 | H | CD3 | H | H |
| 172. | H | 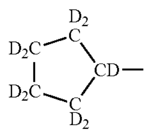 | H | CD3 | H | H |
| 173. | H | CH2CMe3 | H | CD3 | H | H |
| 174. | H | CD2CMe3 | H | CD3 | H | H |
| 175. | H | 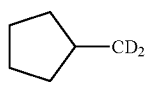 | H | CD3 | H | H |
| 176. | H | 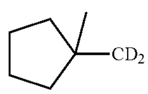 | H | CD3 | H | H |
| 177. | CD3 | Ph | H | H | H | H |
| 178. | CD3 | 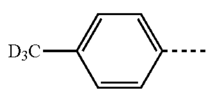 | H | H | H | H |
| 179. | CD3 | 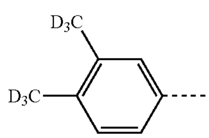 | H | H | H | H |
| 180. | CD3 | 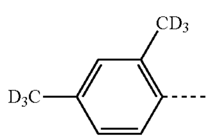 | H | H | H | H |
| 181. | H | Ph | H | H | H | H |
| 182. | H | 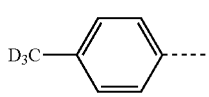 | H | H | H | H |
| 183. | H | 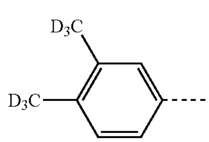 | H | H | H | H |
| 184. | H | 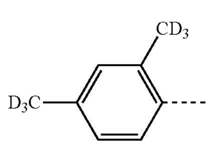 | H | H | H | H |

-continued
| $L^{a}_{Ai}$ to $L^{k}_{Ai}$, where i is | $R^{1a}$ | $R^{1b}$ | $R^{2}$ | $R^{3a}$ | $R^{3b}$ | $R^{3c}$ |
|---|---|---|---|---|---|---|
| 185. | CD3 | Ph | CD3 | H | H | H |
| 186. | CD3 | 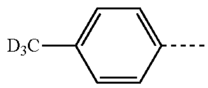 | CD3 | H | H | H |
| 187. | CD3 | 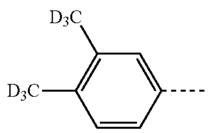 | CD3 | H | H | H |
| 188. | CD3 | 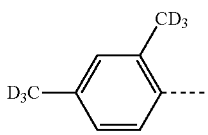 | CD3 | H | H | H |
| 189. | H | Ph | CD3 | H | H | H |
| 190. | H | 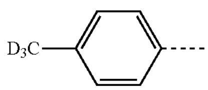 | CD3 | H | H | H |
| 191. | H | 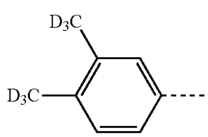 | CD3 | H | H | H |
| 192. | H | 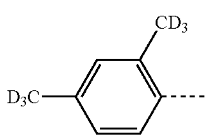 | CD3 | H | H | H |
| 193. | H | H | H | H | H | H |
| 194. | H | CH3 | H | H | H | H |
| 195. | H | CD3 | H | H | H | H |
| 196. | H | C2H5 | H | H | H | H |
| 197. | H | CD2CH3 | H | H | H | H |
| 198. | H | CHMe2 | H | H | H | H |
| 199. | H | CDMe2 | H | H | H | H |
| 200. | H | 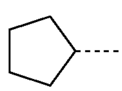 | H | H | H | H |
| 201. | H | 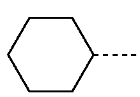 | H | H | H | H |
| 202. | H | 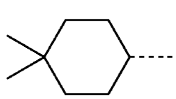 | H | H | H | H |
| 203. | H | 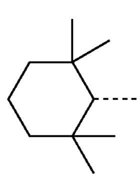 | H | H | H | H |

-continued
| $L^a_{Ai}$ to $L^k_{Ai}$, where i is | $R^{1a}$ | $R^{1b}$ | $R^2$ | $R^{3a}$ | $R^{3b}$ | $R^{3c}$ |
|---|---|---|---|---|---|---|
| 204. | H | 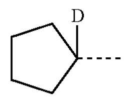 | H | H | H | H |
| 205. | H | 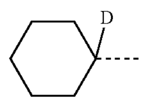 | H | H | H | H |
| 206. | H | 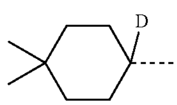 | H | H | H | H |
| 207. | H | 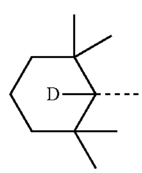 | H | H | H | H |
| 208. | H | 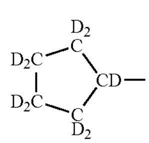 | H | H | H | H |
| 209. | CD3 | CD3 | H | H | CD3 | H |
| 210. | H | CD3 | H | CD3 | H | CD3 |
| 211. | CD3 | H | CD3 | H | H | H |
| 212. | CD3 | H | CD3 | H | H | 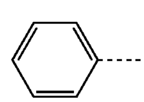 |
| 213. | H | 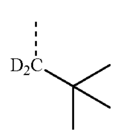 | H | H | CD3 | H | and $L_i$, wherein $L_i$ is

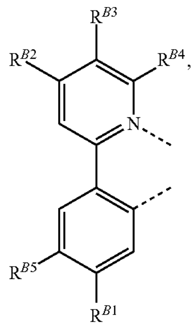

wherein for each i from 1 to 1462, $R^{B1}$, $R^{B2}$, $R^{B3}$, and $R^{B4}$ are defined as follows for each i:

| i in Li | $R^{B1}$ | $R^{B2}$ | $R^{B3}$ | $R^{B4}$ | RB5 |
|---|---|---|---|---|---|
| 1. | H | H | H | H | H |
| 2. | $CH_3$ | H | H | H | H |
| 3. | H | $CH_3$ | H | H | H |
| 4. | H | H | $CH_3$ | H | H |
| 5. | $CH_3$ | $CH_3$ | H | $CH_3$ | H |
| 6. | $CH_3$ | H | $CH_3$ | H | H |
| 7. | CH | H | H | $CH_3$ | H |
| 8. | H | $CH_3$ | $CH_3$ | H | H |
| 9. | H | $CH_3$ | H | $CH_3$ | H |
| 10. | H | H | $CH_3$ | $CH_3$ | H |
| 11. | $CH_3$ | $CH_3$ | $CH_3$ | H | H |
| 12. | $CH_3$ | $CH_3$ | H | $CH_3$ | H |
| 13. | $CH_3$ | H | $CH_3$ | $CH_3$ | H |
| 14. | H | $CH_3$ | $CH_3$ | $CH_3$ | H |
| 15. | $CH_3$ | $CH_3$ | $CH_3$ | $CH_3$ | H |
| 16. | $CH_2CH_3$ | H | H | H | H |
| 17. | $CH_2CH_3$ | $CH_3$ | H | $CH_3$ | H |
| 18. | $CH_2CH_3$ | H | $CH_3$ | H | H |
| 19. | $CH_2CH_3$ | H | H | $CH_3$ | H |
| 20. | $CH_2CH_3$ | $CH_3$ | $CH_3$ | H | H |
| 21. | $CH_2CH_3$ | $CH_3$ | H | $CH_3$ | H |
| 22. | $CH_2CH_3$ | H | $CH_3$ | $CH_3$ | H |
| 23. | $CH_2CH_3$ | $CH_3$ | $CH_3$ | $CH_3$ | H |
| 24. | H | $CH_2CH_3$ | H | H | H |
| 25. | $CH_3$ | $CH_2CH_3$ | H | $CH_3$ | H |
| 26. | H | $CH_2CH_3$ | $CH_3$ | H | H |
| 27. | H | $CH_2CH_3$ | H | $CH_3$ | H |
| 28. | $CH_3$ | $CH_2CH_3$ | $CH_3$ | H | H |
| 29. | $CH_3$ | $CH_2CH_3$ | H | $CH_3$ | H |
| 30. | H | $CH_2CH_3$ | $CH_3$ | $CH_3$ | H |
| 31. | $CH_3$ | $CH_2CH_3$ | $CH_3$ | $CH_3$ | H |
| 32. | H | H | $CH_2CH_3$ | H | H |
| 33. | CH | H | $CH_2CH_3$ | H | H |
| 34. | H | $CH_3$ | $CH_2CH_3$ | H | H |
| 35. | H | H | $CH_2CH_3$ | $CH_3$ | H |
| 36. | $CH_3$ | $CH_3$ | $CH_2CH_3$ | H | H |
| 37. | $CH_3$ | H | $CH_2CH_3$ | $CH_3$ | H |
| 38. | H | $CH_3$ | $CH_2CH_3$ | $CH_3$ | H |
| 39. | $CH_3$ | $CH_3$ | $CH_2CH_3$ | $CH_3$ | H |
| 40. | $CH(CH_3)_2$ | H | H | H | H |
| 41. | $CH(CH_3)_2$ | $CH_3$ | H | $CH_3$ | H |
| 42. | $CH(CH_3)_2$ | H | $CH_3$ | H | H |
| 43. | $CH(CH_3)_2$ | H | H | $CH_3$ | H |
| 44. | $CH(CH_3)_2$ | $CH_3$ | $CH_3$ | H | H |
| 45. | $CH(CH_3)_2$ | $CH_3$ | H | $CH_3$ | H |
| 46. | $CH(CH_3)_2$ | H | $CH_3$ | $CH_3$ | H |
| 47. | $CH(CH_3)_2$ | $CH_3$ | $CH_3$ | $CH_3$ | H |
| 48. | H | $CH(CH_3)_2$ | H | H | H |
| 49. | CH | $CH(CH_3)_2$ | H | $CH_3$ | H |
| 50. | H | $CH(CH_3)_2$ | $CH_3$ | H | H |
| 51. | H | $CH(CH_3)_2$ | H | $CH_3$ | H |
| 52. | $CH_3$ | $CH(CH_3)_2$ | $CH_3$ | H | H |
| 53. | $CH_3$ | $CH(CH_3)_2$ | H | $CH_3$ | H |
| 54. | H | $CH(CH_3)_2$ | $CH_3$ | $CH_3$ | H |
| 55. | CH | $CH(CH_3)_2$ | $CH_3$ | $CH_3$ | H |

-continued

| i in Li | $R^{B1}$ | $R^{B2}$ | $R^{B3}$ | $R^{B4}$ | $R^{B5}$ |
|---|---|---|---|---|---|
| 56. | H | H | $CH(CH_3)_2$ | H | H |
| 57. | CH | H | $CH(CH_3)_2$ | H | H |
| 58. | H | $CH_3$ | $CH(CH_3)_2$ | H | H |
| 59. | H | H | $CH(CH_3)_2$ | $CH_3$ | H |
| 60. | $CH_3$ | $CH_3$ | $CH(CH_3)_2$ | H | H |
| 61. | $CH_3$ | H | $CH(CH_3)_2$ | $CH_3$ | H |
| 62. | H | $CH_3$ | $CH(CH_3)_2$ | $CH_3$ | H |
| 63. | $CH_3$ | $CH_3$ | $CH(CH_3)_2$ | $CH_3$ | H |
| 64. | $CH_2CH(CH_3)_2$ | H | H | H | H |
| 65. | $CH_2CH(CH_3)_2$ | $CH_3$ | H | $CH_3$ | H |
| 66. | $CH_2CH(CH_3)_2$ | H | $CH_3$ | H | H |
| 67. | $CH_2CH(CH_3)_2$ | H | H | $CH_3$ | H |
| 68. | $CH_2CH(CH_3)_2$ | $CH_3$ | $CH_3$ | H | H |
| 69. | $CH_2CH(CH_3)_2$ | $CH_3$ | H | $CH_3$ | H |
| 70. | $CH_2CH(CH_3)_2$ | H | $CH_3$ | $CH_3$ | H |
| 71. | $CH_2CH(CH_3)_2$ | $CH_3$ | $CH_3$ | $CH_3$ | H |
| 72. | H | $CH_2CH(CH_3)_2$ | H | H | H |
| 73. | $CH_3$ | $CH_2CH(CH_3)_2$ | H | $CH_3$ | H |
| 74. | H | $CH_2CH(CH_3)_2$ | $CH_3$ | H | H |
| 75. | H | $CH_2CH(CH_3)_2$ | H | $CH_3$ | H |
| 76. | $CH_3$ | $CH_2CH(CH_3)_2$ | $CH_3$ | H | H |
| 77. | CH | $CH_2CH(CH_3)_2$ | H | $CH_3$ | H |
| 78. | H | $CH_2CH(CH_3)_2$ | $CH_3$ | $CH_3$ | H |
| 79. | CH | $CH_2CH(CH_3)_2$ | $CH_3$ | $CH_3$ | H |
| 80. | H | H | $CH_2CH(CH_3)_2$ | H | H |
| 81. | $CH_3$ | H | $CH_2CH(CH_3)_2$ | H | H |
| 82. | H | $CH_3$ | $CH_2CH(CH_3)_2$ | H | H |
| 83. | H | H | $CH_2CH(CH_3)_2$ | $CH_3$ | H |
| 84. | $CH_3$ | $CH_3$ | $CH_2CH(CH_3)_2$ | H | H |
| 85. | $CH_3$ | H | $CH_2CH(CH_3)_2$ | $CH_3$ | H |
| 86. | H | $CH_3$ | $CH_2CH(CH_3)_2$ | $CH_3$ | H |
| 87. | $CH_3$ | $CH_3$ | $CH_2CH(CH_3)_2$ | $CH_3$ | H |
| 88. | $C(CH_3)_3$ | H | H | H | H |
| 89. | $C(CH_3)_3$ | $CH_3$ | H | $CH_3$ | H |
| 90. | $C(CH_3)_3$ | H | $CH_3$ | H | H |
| 91. | $C(CH_3)_3$ | H | H | $CH_3$ | H |
| 92. | $C(CH_3)_3$ | $CH_3$ | $CH_3$ | H | H |
| 93. | $C(CH_3)_3$ | $CH_3$ | H | $CH_3$ | H |
| 94. | $C(CH_3)_3$ | H | $CH_3$ | $CH_3$ | H |
| 95. | $C(CH_3)_3$ | $CH_3$ | $CH_3$ | $CH_3$ | H |
| 96. | H | $C(CH_3)_3$ | H | H | H |
| 97. | CH | $C(CH_3)_3$ | H | $CH_3$ | H |
| 98. | H | $C(CH_3)_3$ | $CH_3$ | H | H |
| 99. | H | $C(CH_3)_3$ | H | $CH_3$ | H |
| 100. | $CH_3$ | $C(CH_3)_3$ | $CH_3$ | H | H |
| 101. | $CH_3$ | $C(CH_3)_3$ | H | $CH_3$ | H |
| 102. | H | $C(CH_3)_3$ | $CH_3$ | $CH_3$ | H |
| 103. | $CH_3$ | $C(CH_3)_3$ | $CH_3$ | $CH_3$ | H |
| 104. | H | H | $C(CH_3)_3$ | H | H |
| 105. | $CH_3$ | H | $C(CH_3)_3$ | H | H |
| 106. | H | $CH_3$ | $C(CH_3)_3$ | H | H |
| 107. | H | H | $C(CH_3)_3$ | $CH_3$ | H |
| 108. | $CH_3$ | $CH_3$ | $C(CH_3)_3$ | H | H |
| 109. | $CH_3$ | H | $C(CH_3)_3$ | $CH_3$ | H |
| 110. | H | $CH_3$ | $C(CH_3)_3$ | $CH_3$ | H |
| 111. | $CH_3$ | $CH_3$ | $C(CH_3)_3$ | $CH_3$ | H |
| 112. | $CH_2C(CH_3)_3$ | H | H | H | H |
| 113. | $CH_2C(CH_3)_3$ | $CH_3$ | H | $CH_3$ | H |
| 114. | $CH_2C(CH_3)_3$ | H | $CH_3$ | H | H |
| 115. | $CH_2C(CH_3)_3$ | H | H | $CH_3$ | H |
| 116. | $CH_2C(CH_3)_3$ | $CH_3$ | $CH_3$ | H | H |
| 117. | $CH_2C(CH_3)_3$ | $CH_3$ | H | $CH_3$ | H |
| 118. | $CH_2C(CH_3)_3$ | H | $CH_3$ | $CH_3$ | H |
| 119. | $CH_2C(CH_3)_3$ | $CH_3$ | $CH_3$ | $CH_3$ | H |
| 120. | H | $CH_2C(CH_3)_3$ | H | H | H |
| 121. | $CH_3$ | $CH_2C(CH_3)_3$ | H | $CH_3$ | H |
| 122. | H | $CH_2C(CH_3)_3$ | $CH_3$ | H | H |
| 123. | H | $CH_2C(CH_3)_3$ | H | $CH_3$ | H |
| 124. | $CH_3$ | $CH_2C(CH_3)_3$ | $CH_3$ | H | H |
| 125. | $CH_3$ | $CH_2C(CH_3)_3$ | H | $CH_3$ | H |
| 126. | H | $CH_2C(CH_3)_3$ | $CH_3$ | $CH_3$ | H |
| 127. | $CH_3$ | $CH_2C(CH_3)_3$ | $CH_3$ | $CH_3$ | H |
| 128. | H | H | $CH_2C(CH_3)_3$ | H | H |
| 129. | $CH_3$ | H | $CH_2C(CH_3)_3$ | H | H |
| 130. | H | $CH_3$ | $CH_2C(CH_3)_3$ | H | H |
| 131. | H | H | $CH_2C(CH_3)_3$ | $CH_3$ | H |
| 132. | $CH_3$ | $CH_3$ | $CH_2C(CH_3)_3$ | H | H |

-continued
| i in Li | $R^{B1}$ | $R^{B2}$ | $R^{B3}$ | $R^{B4}$ | RB5 |
|---|---|---|---|---|---|
| 133. | $CH_3$ | H | $CH_2C(CH_3)_3$ | $CH_3$ | H |
| 134. | H | $CH_3$ | $CH_2C(CH_3)_3$ | $CH_3$ | H |
| 135. | $CH_3$ | $CH_3$ | $CH_2C(CH_3)_3$ | $CH_3$ | H |
| 136. | 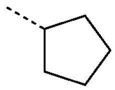 | H | H | H | H |
| 137. | 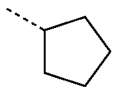 | $CH_3$ | H | $CH_3$ | H |
| 138. | 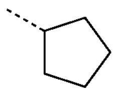 | H | $CH_3$ | H | H |
| 139. | 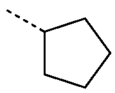 | H | H | $CH_3$ | H |
| 140. | 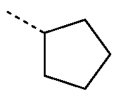 | $CH_3$ | $CH_3$ | H | H |
| 141. | 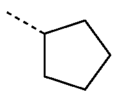 | $CH_3$ | H | $CH_3$ | H |
| 142. | 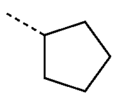 | H | $CH_3$ | $CH_3$ | H |
| 143. | 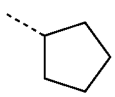 | $CH_3$ | $CH_3$ | $CH_3$ | H |
| 144. | H | 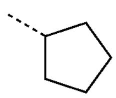 | H | H | H |
| 145. | $CH_3$ | 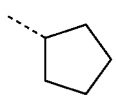 | H | $CH_3$ | H |
| 146. | H | 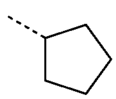 | $CH_3$ | H | H |
| 147. | H | 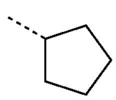 | H | $CH_3$ | H |
| 148. | $CH_3$ | 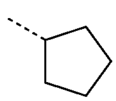 | $CH_3$ | H | H |
| 149. | $CH_3$ | 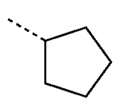 | H | $CH_3$ | H |

-continued
| i in Li | $R^{B1}$ | $R^{B2}$ | $R^{B3}$ | $R^{B4}$ | RB5 |
|---|---|---|---|---|---|
| 150. | H | 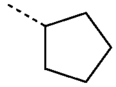 | $CH_3$ | $CH_3$ | H |
| 151. | $CH_3$ | 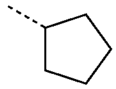 | $CH_3$ | $CH_3$ | H |
| 152. | H | H | 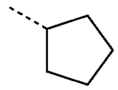 | H | H |
| 153. | $CH_3$ | H | 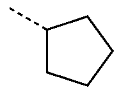 | H | H |
| 154. | H | $CH_3$ | 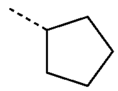 | H | H |
| 155. | H | H | 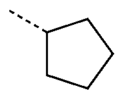 | $CH_3$ | H |
| 156. | $CH_3$ | $CH_3$ | 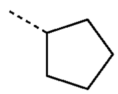 | H | H |
| 157. | $CH_3$ | H | 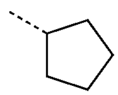 | $CH_3$ | H |
| 158. | H | $CH_3$ | 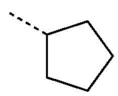 | $CH_3$ | H |
| 159. | $CH_3$ | $CH_3$ | 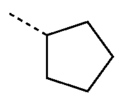 | $CH_3$ | H |
| 160. | 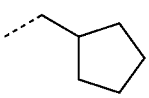 | H | H | H | H |
| 161. | 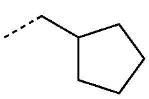 | $CH_3$ | H | $CH_3$ | H |
| 162. | 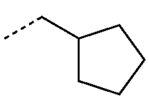 | H | $CH_3$ | H | H |
| 163. | 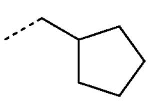 | H | H | $CH_3$ | H |
| 164. | 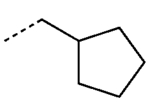 | $CH_3$ | $CH_3$ | H | H |

-continued
| i in Li | $R^{B1}$ | $R^{B2}$ | $R^{B3}$ | $R^{B4}$ | $R^{B5}$ |
|---|---|---|---|---|---|
| 165. | 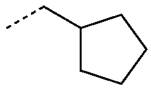 | $CH_3$ | H | $CH_3$ | H |
| 166. | 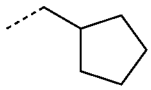 | H | $CH_3$ | $CH_3$ | H |
| 167. | 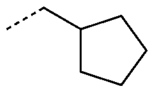 | $CH_3$ | $CH_3$ | $CH_3$ | H |
| 168. | H | 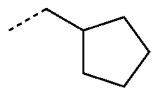 | H | H | H |
| 169. | $CH_3$ | 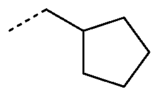 | H | $CH_3$ | H |
| 170. | H | 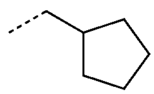 | $CH_3$ | H | H |
| 171. | H | 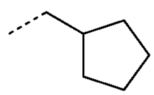 | H | $CH_3$ | H |
| 172. | $CH_3$ | 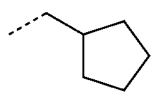 | $CH_3$ | H | H |
| 173. | $CH_3$ | 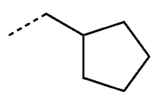 | H | $CH_3$ | H |
| 174. | H | 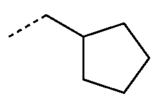 | $CH_3$ | $CH_3$ | H |
| 175. | $CH_3$ | 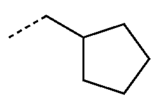 | $CH_3$ | $CH_3$ | H |
| 176. | H | H | 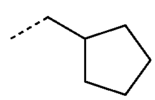 | H | H |
| 177. | $CH_3$ | H | 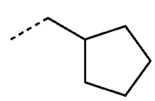 | H | H |
| 178. | H | $CH_3$ | 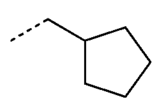 | H | H |
| 179. | H | H | 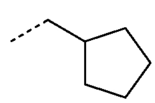 | $CH_3$ | H |

-continued
| i in Li | $R^{B1}$ | $R^{B2}$ | $R^{B3}$ | $R^{B4}$ | RB5 |
|---|---|---|---|---|---|
| 180. | $CH_3$ | $CH_3$ | 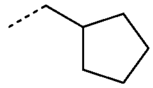 | H | H |
| 181. | $CH_3$ | H | 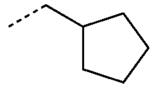 | $CH_3$ | H |
| 182. | H | $CH_3$ | 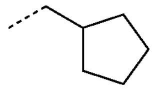 | $CH_3$ | H |
| 183. | $CH_3$ | $CH_3$ | 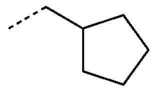 | $CH_3$ | H |
| 184. | 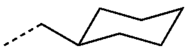 | H | H | H | H |
| 185. | 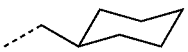 | $CH_3$ | H | $CH_3$ | H |
| 186. | 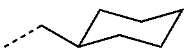 | H | $CH_3$ | H | H |
| 187. | 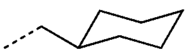 | H | H | $CH_3$ | H |
| 188. | 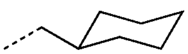 | $CH_3$ | $CH_3$ | H | H |
| 189. | 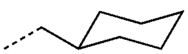 | $CH_3$ | H | $CH_3$ | H |
| 190. | 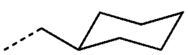 | H | $CH_3$ | $CH_3$ | H |
| 191. | 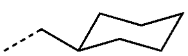 | $CH_3$ | $CH_3$ | $CH_3$ | H |
| 192. | H | 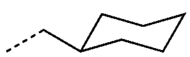 | H | H | H |
| 193. | $CH_3$ | 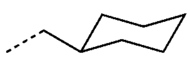 | H | $CH_3$ | H |
| 194. | H | 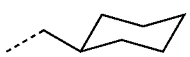 | CH | H | H |
| 195. | H | 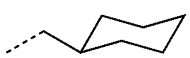 | H | $CH_3$ | H |
| 196. | $CH_3$ | 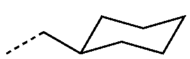 | $CH_3$ | H | H |
| 197. | $CH_3$ | 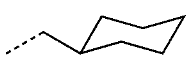 | H | $CH_3$ | H |
| 198. | H | 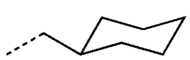 | $CH_3$ | $CH_3$ | H |
| 199. | $CH_3$ | 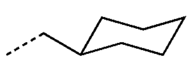 | $CH_3$ | $CH_3$ | H |
| 200. | H | H | 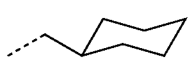 | H | H |
| 201. | $CH_3$ | H | 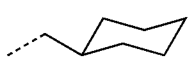 | H | H |

-continued
| i in Li | $R^{B1}$ | $R^{B2}$ | $R^{B3}$ | $R^{B4}$ | $R^{B5}$ |
|---|---|---|---|---|---|
| 202. | H | $CH_3$ | 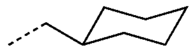 | H | H |
| 203. | H | H | 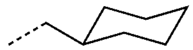 | $CH_3$ | H |
| 204. | $CH_3$ | $CH_3$ | 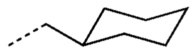 | H | H |
| 205. | $CH_3$ | H | 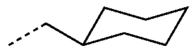 | $CH_3$ | H |
| 206. | H | $CH_3$ | 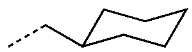 | $CH_3$ | H |
| 207. | $CH_3$ | $CH_3$ | 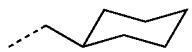 | $CH_3$ | H |
| 208. | 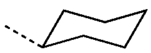 | H | H | H | H |
| 209. | 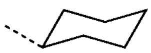 | $CH_3$ | H | $CH_3$ | H |
| 210. | 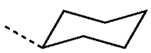 | H | $CH_3$ | H | H |
| 211. | 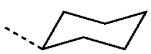 | H | $CH_3$ | H | H |
| 212. | 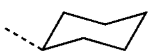 | $CH_3$ | $CH_3$ | H | H |
| 213. | 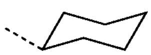 | $CH_3$ | H | $CH_3$ | H |
| 214. | 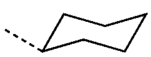 | H | $CH_3$ | $CH_3$ | H |
| 215. | 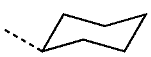 | $CH_3$ | $CH_3$ | $CH_3$ | H |
| 216. | H | 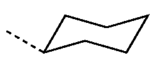 | H | H | H |
| 217. | $CH_3$ | 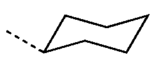 | H | $CH_3$ | H |
| 218. | H | 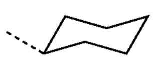 | $CH_3$ | H | H |
| 219. | H | 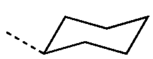 | H | $CH_3$ | H |
| 220. | $CH_3$ | 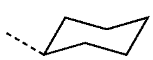 | $CH_3$ | H | H |
| 221. | $CH_3$ | 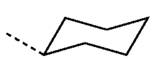 | H | $CH_3$ | H |
| 222. | H | 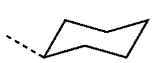 | $CH_3$ | $CH_3$ | H |
| 223. | $CH_3$ | 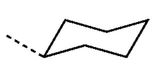 | $CH_3$ | $CH_3$ | H |
| 224. | H | H | 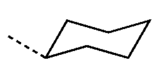 | H | H |
| 225. | $CH_3$ | H | 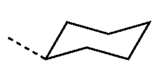 | H | H |

-continued
| i in Li | $R^{B1}$ | $R^{B2}$ | $R^{B3}$ | $R^{B4}$ | $R^{B5}$ |
|---|---|---|---|---|---|
| 226. | H | $CH_3$ | 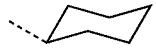 | H | H |
| 227. | H | H | 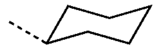 | $CH_3$ | H |
| 228. | $CH_3$ | $CH_3$ | 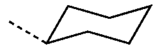 | H | H |
| 229. | $CH_3$ | H | 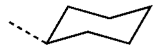 | $CH_3$ | H |
| 230. | H | $CH_3$ | 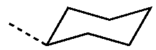 | $CH_3$ | H |
| 231. | $CH_3$ | $CH_3$ | 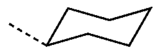 | $CH_3$ | H |
| 232. | 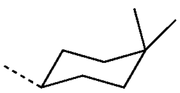 | H | H | H | H |
| 233. | 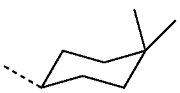 | $CH_3$ | H | $CH_3$ | H |
| 234. | 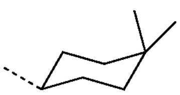 | H | $CH_3$ | H | H |
| 235. | 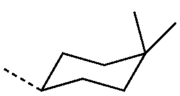 | H | H | $CH_3$ | H |
| 236. | 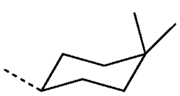 | $CH_3$ | $CH_3$ | H | H |
| 237. | 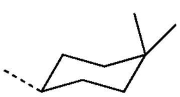 | $CH_3$ | H | $CH_3$ | H |
| 238. | 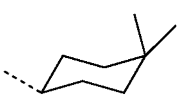 | H | $CH_3$ | $CH_3$ | H |
| 239. | 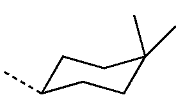 | $CH_3$ | $CH_3$ | $CH_3$ | H |
| 240. | H | 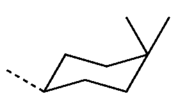 | H | H | H |
| 241. | $CH_3$ | 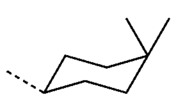 | H | $CH_3$ | H |
| 242. | H | 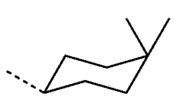 | $CH_3$ | H | H |
| 243. | H | 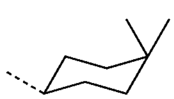 | H | $CH_3$ | H |

-continued
| i in Li | $R^{B1}$ | $R^{B2}$ | $R^{B3}$ | $R^{B4}$ | RB5 |
|---|---|---|---|---|---|
| 244. | $CH_3$ | 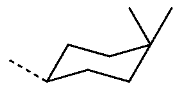 | $CH_3$ | H | H |
| 245. | $CH_3$ | 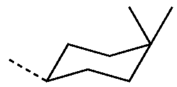 | H | $CH_3$ | H |
| 246. | H | 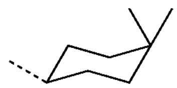 | $CH_3$ | $CH_3$ | H |
| 247. | $CH_3$ | 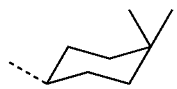 | $CH_3$ | $CH_3$ | H |
| 248. | H | H | 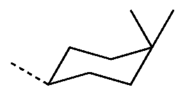 | H | H |
| 249. | $CH_3$ | H | 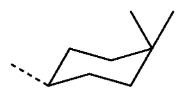 | H | H |
| 250. | H | $CH_3$ | 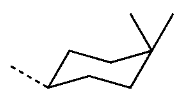 | H | H |
| 251. | H | H | 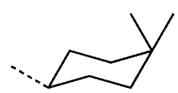 | $CH_3$ | H |
| 252. | $CH_3$ | $CH_3$ | 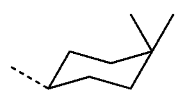 | H | H |
| 253. | $CH_3$ | H | 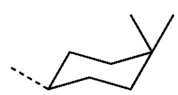 | $CH_3$ | H |
| 254. | H | $CH_3$ | 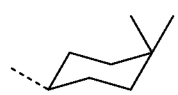 | $CH_3$ | H |
| 255. | $CH_3$ | $CH_3$ | 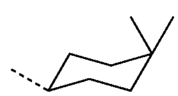 | $CH_3$ | H |
| 256. | 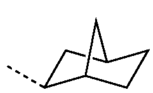 | H | H | H | H |
| 257. | 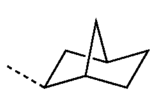 | $CH_3$ | H | $CH_3$ | H |
| 258. | 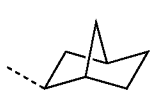 | H | $CH_3$ | H | H |
| 259. | 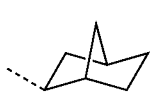 | H | H | $CH_3$ | H |

-continued
| i in Li | $R^{B1}$ | $R^{B2}$ | $R^{B3}$ | $R^{B4}$ | $R^{B5}$ |
|---|---|---|---|---|---|
| 260. | 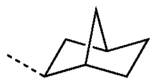 | $CH_3$ | $CH_3$ | H | H |
| 261. | 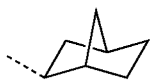 | $CH_3$ | H | $CH_3$ | H |
| 262. | 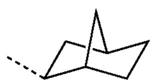 | H | $CH_3$ | $CH_3$ | H |
| 263. | 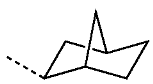 | $CH_3$ | $CH_3$ | $CH_3$ | H |
| 264. | H | 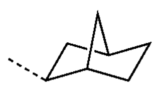 | H | H | H |
| 265. | $CH_3$ | 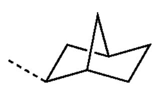 | H | $CH_3$ | H |
| 266. | H | 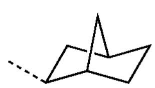 | $CH_3$ | H | H |
| 267. | H | 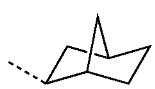 | H | $CH_3$ | H |
| 268. | $CH_3$ | 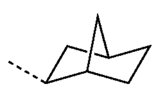 | $CH_3$ | H | H |
| 269. | $CH_3$ | 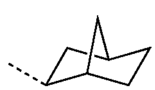 | H | $CH_3$ | H |
| 270. | H | 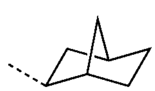 | $CH_3$ | $CH_3$ | H |
| 271. | $CH_3$ | 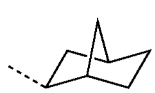 | $CH_3$ | $CH_3$ | H |
| 272. | H | H | 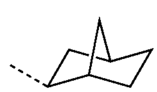 | H | H |
| 273. | $CH_3$ | H |  | H | H |
| 274. | H | $CH_3$ | 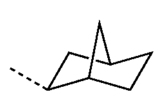 | H | H |
| 275. | H | H | 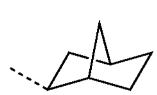 | $CH_3$ | H |

-continued

| i in Li | $R^{B1}$ | $R^{B2}$ | $R^{B3}$ | $R^{B4}$ | RB5 |
|---|---|---|---|---|---|
| 276. | $CH_3$ | $CH_3$ | 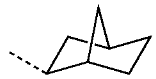 | H | H |
| 277. | $CH_3$ | H | 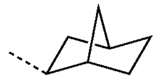 | $CH_3$ | H |
| 278. | H | $CH_3$ | 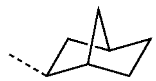 | $CH_3$ | H |
| 279. | $CH_3$ | $CH_3$ | 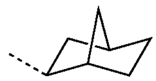 | $CH_3$ | H |
| 280. | $CH(CH_3)_2$ | H | $CH_2CH_3$ | H | H |
| 281. | $CH(CH_3)_2$ | H | $CH(CH_3)_2$ | H | H |
| 282. | $CH(CH_3)_2$ | H | $CH_2CH(CH_3)_2$ | H | H |
| 283. | $CH(CH_3)_2$ | H | $C(CH_3)_3$ | H | H |
| 284. | $CH(CH_3)_2$ | H | $CH_2C(CH_3)_3$ | H | H |
| 285. | $CH(CH_3)_2$ | H | 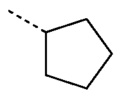 | H | H |
| 286. | $CH(CH_3)_2$ | H | 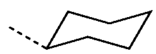 | H | H |
| 287. | $CH(CH_3)_2$ | H | 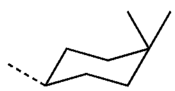 | H | H |
| 288. | $CH(CH_3)_2$ | H | 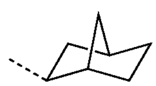 | H | H |
| 289. | $CH(CH_3)_2$ | H | 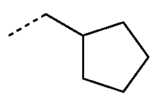 | H | H |
| 290. | $CH(CH_3)_2$ | H | 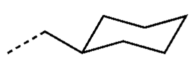 | H | H |
| 291. | $CH(CH_3)_2$ | H | $CH_2CH_3$ | H | H |
| 292. | $CH(CH_3)_2$ | H | $CH(CH_3)_2$ | H | H |
| 293. | $CH(CH_3)_2$ | H | $CH_2CH(CH_3)_2$ | H | H |
| 294. | $CH(CH_3)_2$ | H | $C(CH_3)_3$ | H | H |
| 295. | $CH(CH_3)_2$ | H | $CH_2C(CH_3)_3$ | H | H |
| 296. | $CH(CH_3)_2$ | H | 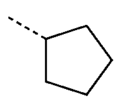 | H | H |
| 297. | $CH(CH_3)_2$ | H | 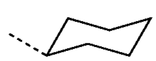 | H | H |
| 298. | $CH(CH_3)_2$ | H | 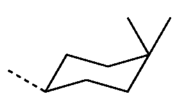 | H | H |
| 299. | $CH(CH_3)_2$ | H | 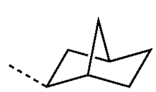 | H | H |

-continued
| i in Li | $R^{B1}$ | $R^{B2}$ | $R^{B3}$ | $R^{B4}$ | RB5 |
|---|---|---|---|---|---|
| 300. | $CH(CH_3)_2$ | H | 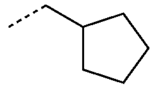 | H | H |
| 301. | $CH(CH_3)_2$ | H | 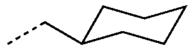 | H | H |
| 302. | $CH_2C(CH_3)_3$ | H | $CH_2CH_3$ | H | H |
| 303. | $CH_2C(CH_3)_3$ | H | $CH(CH_3)_2$ | H | H |
| 304. | $CH_2C(CH_3)_3$ | H | $CH_2CH(CH_3)_2$ | H | H |
| 305. | $CH_2C(CH_3)_3$ | H | $C(CH_3)_3$ | H | H |
| 306. | $CH_2C(CH_3)_3$ | H | $CH_2C(CH_3)_3$ | H | H |
| 307. | $CH_2C(CH_3)_3$ | H | $CH_2CH_2CF_3$ | H | H |
| 308. | $CH_2C(CH_3)_3$ | H | $CH_2C(CH_3)_2CF_3$ | H | H |
| 309. | $CH_2C(CH_3)_3$ | H | 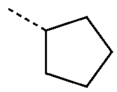 | H | H |
| 310. | $CH_2C(CH_3)_3$ | H | 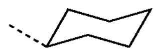 | H | H |
| 311. | $CH_2C(CH_3)_3$ | H | 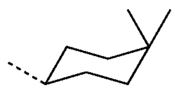 | H | H |
| 312. | $CH_2C(CH_3)_3$ | H | 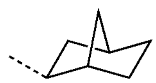 | H | H |
| 313. | $CH_2C(CH_3)_3$ | H | 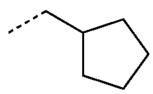 | H | H |
| 314. | $CH_2C(CH_3)_3$ | H | 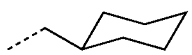 | H | H |
| 315. | 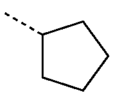 | H | $CH_2CH_3$ | H | H |
| 316. | 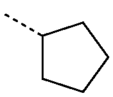 | H | $CH(CH_3)_2$ | H | H |
| 317. | 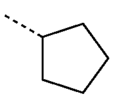 | H | $CH_2CH(CH_3)_2$ | H | H |
| 318. | 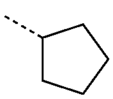 | H | $C(CH_3)_3$ | H | H |
| 319. | 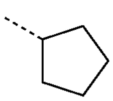 | H | $CH_2C(CH_3)_3$ | H | H |
| 320. | 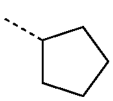 | H | 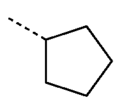 | H | H |
| 321. | 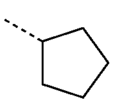 | H | 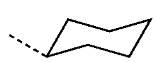 | H | H |

-continued
| i in Li | $R^{B1}$ | $R^{B2}$ | $R^{B3}$ | $R^{B4}$ | RB5 |
|---|---|---|---|---|---|
| 322. | 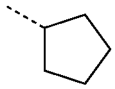 | H | 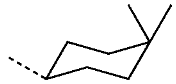 | H | H |
| 323. | 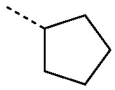 | H | 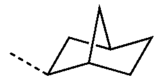 | H | H |
| 324. | 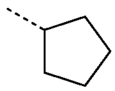 | H | 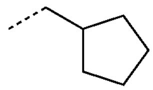 | H | H |
| 325. | 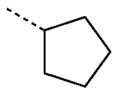 | H | 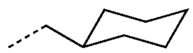 | H | H |
| 326. | 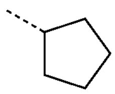 | H | $CH_2CH_3$ | H | H |
| 327. | 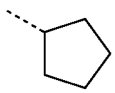 | H | $CH(CH_3)_2$ | H | H |
| 328. | 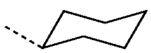 | H | $CH_2CH(CH_3)_2$ | H | H |
| 329. | 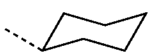 | H | $C(CH_3)_3$ | H | H |
| 330. | 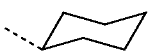 | H | $CH_2C(CH_3)_3$ | H | H |
| 331. | 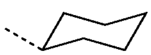 | H | 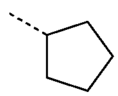 | H | H |
| 332. | 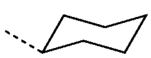 | H | 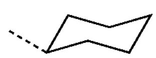 | H | H |
| 333. | 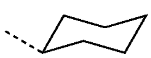 | H | 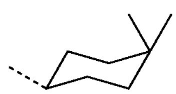 | H | H |
| 334. | 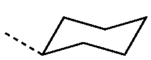 | H | 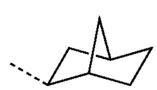 | H | H |
| 335. | 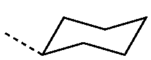 | H | 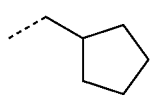 | H | H |
| 336. | 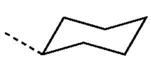 | H | 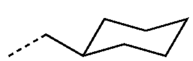 | H | H |
| 337. | 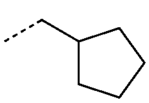 | H | $CH_2CH(CH_3)_2$ | H | H |
| 338. | 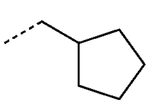 | H | $C(CH_3)_3$ | H | H |

-continued
| i in Li | $R^{B1}$ | $R^{B2}$ | $R^{B3}$ | $R^{B4}$ | RB5 |
| --- | --- | --- | --- | --- | --- |
| 339. | 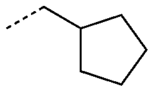 | H | $CH_2C(CH_3)_3$ | H | H |
| 340. | 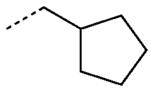 | H | 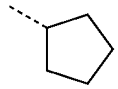 | H | H |
| 341. | 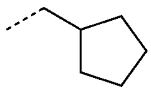 | H | 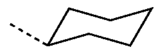 | H | H |
| 342. | 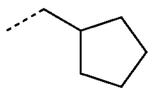 | H | 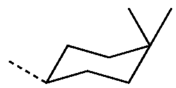 | H | H |
| 343. | 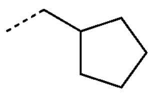 | H | 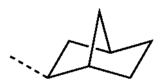 | H | H |
| 344. | 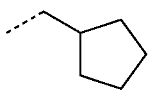 | H | 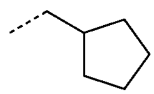 | H | H |
| 345. | 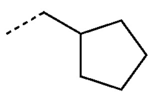 | H | 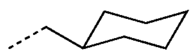 | H | H |
| 346. | 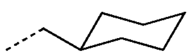 | H | $CH_2CH(CH_3)_2$ | H | H |
| 347. | 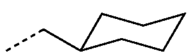 | H | $C(CH_3)_3$ | H | H |
| 348. | 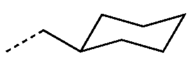 | H | $CH_2C(CH_3)_3$ | H | H |
| 349. | 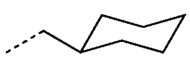 | H | 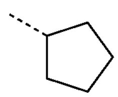 | H | H |
| 350. | 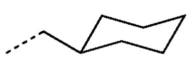 | H | 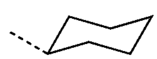 | H | H |
| 351. | 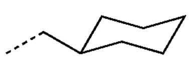 | H | 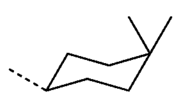 | H | H |
| 352. | 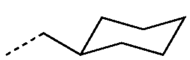 | H | 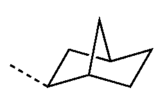 | H | H |
| 353. | 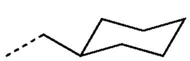 | H | 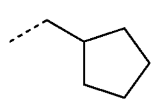 | H | H |
| 354. | 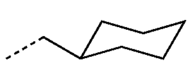 | H | 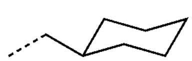 | H | H |
| 355. | 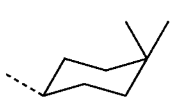 | H | $CH_2CH(CH_3)_2$ | H | H |

-continued

| i in Li | $R^{B1}$ | $R^{B2}$ | $R^{B3}$ | $R^{B4}$ | RB5 |
|---|---|---|---|---|---|
| 356. | 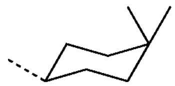 | H | $C(CH_3)_3$ | H | H |
| 357. | 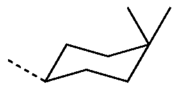 | H | $CH_2C(CH_3)_3$ | H | H |
| 358. | 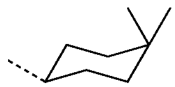 | H | 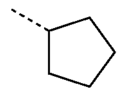 | H | H |
| 359. | 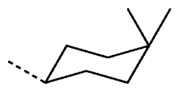 | H | 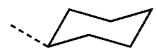 | H | H |
| 360. | 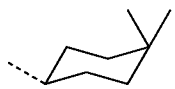 | H | 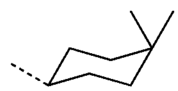 | H | H |
| 361. | 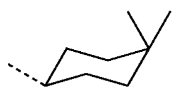 | H | 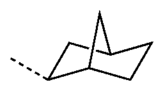 | H | H |
| 362. | 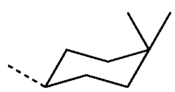 | H | 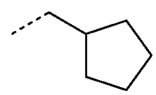 | H | H |
| 363. | 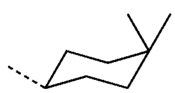 | H | 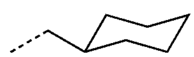 | H | H |
| 364. | H | H | H | H | H |
| 365. | $CD_3$ | H | H | H | H |
| 366. | H | $CD_3$ | H | H | H |
| 367. | H | H | $CD_3$ | H | H |
| 368. | $CD_3$ | $CD_3$ | H | $CD_3$ | H |
| 369. | $CD_3$ | H | $CD_3$ | H | H |
| 370. | $CD_3$ | H | H | $CD_3$ | H |
| 371. | H | $CD_3$ | $CD_3$ | H | H |
| 372. | H | $CD_3$ | H | $CD_3$ | H |
| 373. | H | H | $CD_3$ | $CD_3$ | H |
| 374. | $CD_3$ | $CD_3$ | $CD_3$ | H | H |
| 375. | $CD_3$ | $CD_3$ | H | $CD_3$ | H |
| 376. | $CD_3$ | H | $CD_3$ | $CD_3$ | H |
| 377. | H | $CD_3$ | $CD_3$ | $CD_3$ | H |
| 378. | $CD_3$ | $CD_3$ | $CD_3$ | $CD_3$ | H |
| 379. | $CD_2CH_3$ | H | H | H | H |
| 380. | $CD_2CH_3$ | $CD_3$ | H | $CD_3$ | H |
| 381. | $CD_2CH_3$ | H | $CD_3$ | H | H |
| 382. | $CD_2CH_3$ | H | H | $CD_3$ | H |
| 383. | $CD_2CH_3$ | $CD_3$ | $CD_3$ | H | H |
| 384. | $CD_2CH_3$ | $CD_3$ | H | $CD_3$ | H |
| 385. | $CD_2CH_3$ | H | $CD_3$ | $CD_3$ | H |
| 386. | $CD_2CH_3$ | $CD_3$ | $CD_3$ | $CD_3$ | H |
| 387. | H | $CD_2CH_3$ | H | H | H |
| 388. | $CH_3$ | $CD_2CH_3$ | H | $CD_3$ | H |
| 389. | H | $CD_2CH_3$ | $CD_3$ | H | H |
| 390. | H | $CD_2CH_3$ | H | $CD_3$ | H |
| 391. | $CD_3$ | $CD_2CH_3$ | $CD_3$ | H | H |
| 392. | $CD_3$ | $CD_2CH_3$ | H | $CD_3$ | H |
| 393. | H | $CD_2CH_3$ | $CD_3$ | $CD_3$ | H |
| 394. | $CD_3$ | $CD_2CH_3$ | $CD_3$ | $CD_3$ | H |
| 395. | H | H | $CD_2CH_3$ | H | H |
| 396. | $CD_3$ | H | $CD_2CH_3$ | H | H |
| 397. | H | $CD_3$ | $CD_2CH_3$ | H | H |
| 398. | H | H | $CD_2CH_3$ | $CD_3$ | H |
| 399. | $CD_3$ | $CD_3$ | $CD_2CH_3$ | H | H |
| 400. | $CD_3$ | H | $CD_2CH_3$ | $CD_3$ | H |
| 401. | H | $CD_3$ | $CD_2CH_3$ | $CD_3$ | H |

-continued

| i in Li | $R^{B1}$ | $R^{B2}$ | $R^{B3}$ | $R^{B4}$ | RB5 |
|---|---|---|---|---|---|
| 402. | $CD_3$ | $CD_3$ | $CD_2CH_3$ | $CD_3$ | H |
| 403. | $CD(CH_3)_2$ | H | H | H | H |
| 404. | $CD(CH_3)_2$ | $CD_3$ | H | $CD_3$ | H |
| 405. | $CD(CH_3)_2$ | H | $CD_3$ | H | H |
| 406. | $CD(CH_3)_2$ | H | H | $CD_3$ | H |
| 407. | $CD(CH_3)_2$ | $CD_3$ | $CD_3$ | H | H |
| 408. | $CD(CH_3)_2$ | $CD_3$ | H | $CD_3$ | H |
| 409. | $CD(CH_3)_2$ | H | $CD_3$ | $CD_3$ | H |
| 410. | $CD(CH_3)_2$ | $CD_3$ | $CD_3$ | $CD_3$ | H |
| 411. | H | $CD(CH_3)_2$ | H | H | H |
| 412. | $CD_3$ | $CD(CH_3)_2$ | H | $CD_3$ | H |
| 413. | H | $CD(CH_3)_2$ | $CD_3$ | H | H |
| 414. | H | $CD(CH_3)_2$ | H | $CD_3$ | H |
| 415. | $CD_3$ | $CD(CH_3)_2$ | $CD_3$ | H | H |
| 416. | $CD_3$ | $CD(CH_3)_2$ | H | $CD_3$ | H |
| 417. | H | $CD(CH_3)_2$ | $CD_3$ | $CD_3$ | H |
| 418. | $CD_3$ | $CD(CH_3)_2$ | $CD_3$ | $CD_3$ | H |
| 419. | H | H | $CD(CH_3)_2$ | H | H |
| 420. | $CD_3$ | H | $CD(CH_3)_2$ | H | H |
| 421. | H | $CD_3$ | $CD(CH_3)_2$ | H | H |
| 422. | H | H | $CD(CH_3)_2$ | $CD_3$ | H |
| 423. | $CD_3$ | $CD_3$ | $CD(CH_3)_2$ | H | H |
| 424. | $CD_3$ | H | $CD(CH_3)_2$ | $CD_3$ | H |
| 425. | H | $CD_3$ | $CD(CH_3)_2$ | $CD_3$ | H |
| 426. | $CD_3$ | $CD_3$ | $CD(CH_3)_2$ | $CD_3$ | H |
| 427. | $CD(CD_3)_2$ | H | H | H | H |
| 428. | $CD(CD_3)_2$ | $CD_3$ | H | $CD_3$ | H |
| 429. | $CD(CD_3)_2$ | H | $CD_3$ | H | H |
| 430. | $CD(CD_3)_2$ | H | H | $CD_3$ | H |
| 431. | $CD(CD_3)_2$ | $CD_3$ | $CD_3$ | H | H |
| 432. | $CD(CD_3)_2$ | $CD_3$ | H | $CD_3$ | H |
| 433. | $CD(CD_3)_2$ | H | $CD_3$ | $CD_3$ | H |
| 434. | $CD(CD_3)_2$ | $CD_3$ | $CD_3$ | $CD_3$ | H |
| 435. | H | $CD(CD_3)_2$ | H | H | H |
| 436. | $CH_3$ | $CD(CD_3)_2$ | H | $CD_3$ | H |
| 437. | H | $CD(CD_3)_2$ | $CD_3$ | H | H |
| 438. | H | $CD(CD_3)_2$ | H | $CD_3$ | H |
| 439. | $CD_3$ | $CD(CD_3)_2$ | $CD_3$ | H | H |
| 440. | $CD_3$ | $CD(CD_3)_2$ | H | $CD_3$ | H |
| 441. | H | $CD(CD_3)_2$ | $CD_3$ | $CD_3$ | H |
| 442. | $CD_3$ | $CD(CD_3)_2$ | $CD_3$ | $CD_3$ | H |
| 443. | H | H | $CD(CD_3)_2$ | H | H |
| 444. | $CD_3$ | H | $CD(CD_3)_2$ | H | H |
| 445. | H | $CD_3$ | $CD(CD_3)_2$ | H | H |
| 446. | H | H | $CD(CD_3)_2$ | $CD_3$ | H |
| 447. | $CD_3$ | $CD_3$ | $CD(CD_3)_2$ | H | H |
| 448. | $CD_3$ | H | $CD(CD_3)_2$ | $CD_3$ | H |
| 449. | H | $CD_3$ | $CD(CD_3)_2$ | $CD_3$ | H |
| 450. | $CD_3$ | $CD_3$ | $CD(CD_3)_2$ | $CD_3$ | H |
| 451. | $CD_2CH(CH_3)_2$ | H | H | H | H |
| 452. | $CD_2CH(CH_3)_2$ | $CD_3$ | H | $CD_3$ | H |
| 453. | $CD_2CH(CH_3)_2$ | H | $CD_3$ | H | H |
| 454. | $CD_2CH(CH_3)_2$ | H | H | $CD_3$ | H |
| 455. | $CD_2CH(CH_3)_2$ | $CD_3$ | $CD_3$ | H | H |
| 456. | $CD_2CH(CH_3)_2$ | $CD_3$ | H | $CD_3$ | H |
| 457. | $CD_2CH(CH_3)_2$ | H | $CD_3$ | $CD_3$ | H |
| 458. | $CD_2CH(CH_3)_2$ | $CD_3$ | $CD_3$ | $CD_3$ | H |
| 459. | H | $CD_2CH(CH_3)_2$ | H | H | H |
| 460. | CD3 | $CD_2CH(CH_3)_2$ | H | $CD_3$ | H |
| 461. | H | $CD_2CH(CH_3)_2$ | $CD_3$ | H | H |
| 462. | H | $CD_2CH(CH_3)_2$ | H | $CD_3$ | H |
| 463. | CD3 | $CD_2CH(CH_3)_2$ | $CD_3$ | H | H |
| 464. | CD3 | $CD_2CH(CH_3)_2$ | H | $CD_3$ | H |
| 465. | H | $CD_2CH(CH_3)_2$ | $CD_3$ | $CD_3$ | H |
| 466. | CD3 | $CD_2CH(CH_3)_2$ | $CD_3$ | $CD_3$ | H |
| 467. | H | H | $CD_2CH(CH_3)_2$ | H | H |
| 468. | $CD_3$ | H | $CD_2CH(CH_3)_2$ | H | H |
| 469. | H | $CD_3$ | $CD_2CH(CH_3)_2$ | H | H |
| 470. | H | H | $CD_2CH(CH_3)_2$ | $CD_3$ | H |
| 471. | $CD_3$ | $CD_3$ | $CD_2CH(CH_3)_2$ | H | H |
| 472. | $CD_3$ | H | $CD_2CH(CH_3)_2$ | $CD_3$ | H |
| 473. | H | $CD_3$ | $CD_2CH(CH_3)_2$ | $CD_3$ | H |
| 474. | $CD_3$ | $CD_3$ | $CD_2CH(CH_3)_2$ | $CD_3$ | H |
| 475. | $CD_2C(CH_3)_3$ | H | H | H | H |
| 476. | $CD_2C(CH_3)_3$ | $CD_3$ | H | $CD_3$ | H |
| 477. | $CD_2C(CH_3)_3$ | H | $CD_3$ | H | H |
| 478. | $CD_2C(CH_3)_3$ | H | H | $CD_3$ | H |

-continued

| i in Li | $R^{B1}$ | $R^{B2}$ | $R^{B3}$ | $R^{B4}$ | $R^{B5}$ |
|---|---|---|---|---|---|
| 479. | $CD_2C(CH_3)_3$ | $CD_3$ | $CD_3$ | H | H |
| 480. | $CD_2C(CH_3)_3$ | $CD_3$ | H | $CD_3$ | H |
| 481. | $CD_2C(CH_3)_3$ | H | $CD_3$ | $CD_3$ | H |
| 482. | $CD_2C(CH_3)_3$ | $CH_3$ | $CD_3$ | $CD_3$ | H |
| 483. | H | $CD_2C(CH_3)_3$ | H | H | H |
| 484. | $CD_3$ | $CD_2C(CH_3)_3$ | H | $CD_3$ | H |
| 485. | H | $CD_2C(CH_3)_3$ | $CD_3$ | H | H |
| 486. | H | $CD_2C(CH_3)_3$ | H | $CD_3$ | H |
| 487. | $CD_3$ | $CD_2C(CH_3)_3$ | $CD_3$ | H | H |
| 488. | $CD_3$ | $CD_2C(CH_3)_3$ | H | $CD_3$ | H |
| 489. | H | $CD_2C(CH_3)_3$ | $CD_3$ | $CD_3$ | H |
| 490. | $CD_3$ | $CD_2C(CH_3)_3$ | $CD_3$ | $CD_3$ | H |
| 491. | H | H | $CD_2C(CH_3)_3$ | H | H |
| 492. | $CD_3$ | H | $CD_2C(CH_3)_3$ | H | H |
| 493. | H | $CD_3$ | $CD_2C(CH_3)_3$ | H | H |
| 494. | H | H | $CD_2C(CH_3)_3$ | $CD_3$ | H |
| 495. | $CD_3$ | $CD_3$ | $CD_2C(CH_3)_3$ | H | H |
| 496. | $CD_3$ | H | $CD_2C(CH_3)_3$ | $CD_3$ | H |
| 497. | H | $CD_3$ | $CD_2C(CH_3)_3$ | $CD_3$ | H |
| 498. | $CD_3$ | $CD_3$ | $CD_2C(CH_3)_3$ | $CD_3$ | H |
| 499. | 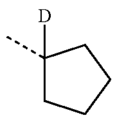 | H | H | H | H |
| 500. | 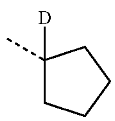 | $CD_3$ | H | $CD_3$ | H |
| 501. | 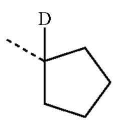 | H | $CD_3$ | H | H |
| 502. | 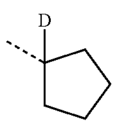 | H | H | $CD_3$ | H |
| 503. | 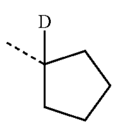 | $CD_3$ | $CD_3$ | H | H |
| 504. | 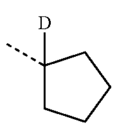 | $CD_3$ | H | $CD_3$ | H |
| 505. | 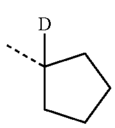 | H | $CD_3$ | $CD_3$ | H |
| 506. | 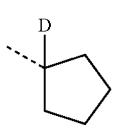 | $CD_3$ | $CD_3$ | $CD_3$ | H |
| 507. | H | 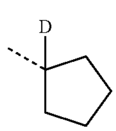 | H | H | H |

-continued
| i in Li | $R^{B1}$ | $R^{B2}$ | $R^{B3}$ | $R^{B4}$ | $R^{B5}$ |
|---|---|---|---|---|---|
| 508. | $CD_3$ | 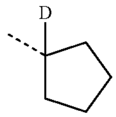 | H | $CD_3$ | H |
| 509. | H | 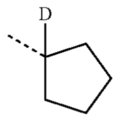 | $CD_3$ | H | H |
| 510. | H | 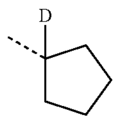 | H | $CD_3$ | H |
| 511. | $CD_3$ | 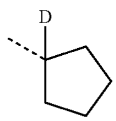 | $CD_3$ | H | H |
| 512. | $CD_3$ | 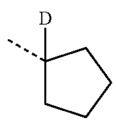 | H | $CD_3$ | H |
| 513. | H | 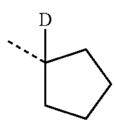 | $CD_3$ | $CD_3$ | H |
| 514. | $CD_3$ | 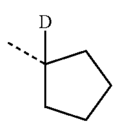 | $CD_3$ | $CD_3$ | H |
| 515. | H | H | 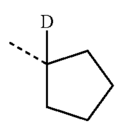 | H | H |
| 516. | $CD_3$ | H | 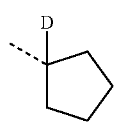 | H | H |
| 517. | H | $CD_3$ | 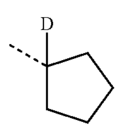 | H | H |
| 518. | H | H | 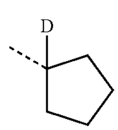 | $CD_3$ | H |
| 519. | $CD_3$ | $CD_3$ | 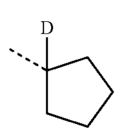 | H | H |

-continued
| i in Li | $R^{B1}$ | $R^{B2}$ | $R^{B3}$ | $R^{B4}$ | $R^{B5}$ |
|---|---|---|---|---|---|
| 520. | $CD_3$ | H | 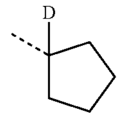 | $CD_3$ | H |
| 521. | H | $CD_3$ | 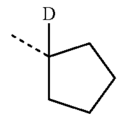 | $CD_3$ | H |
| 522. | $CD_3$ | $CD_3$ | 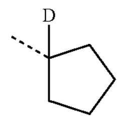 | $CD_3$ | H |
| 523. | 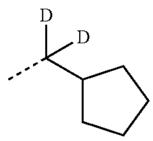 | H | H | H | H |
| 524. | 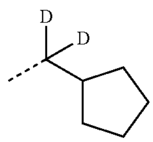 | $CD_3$ | H | $CD_3$ | H |
| 525. | 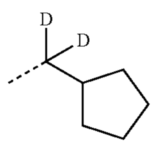 | H | $CD_3$ | H | H |
| 526. | 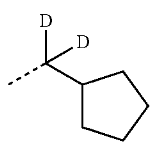 | H | H | $CD_3$ | H |
| 527. | 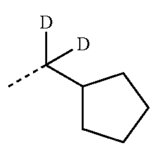 | $CD_3$ | $CD_3$ | H | H |
| 528. | 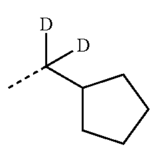 | $CD_3$ | H | $CD_3$ | H |
| 529. | 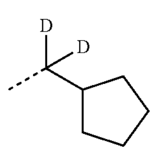 | H | $CD_3$ | $CD_3$ | H |
| 530. | 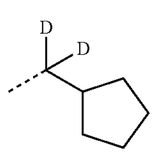 | $CD_3$ | $CD_3$ | $CD_3$ | H |

-continued
| i in Li | $R^{B1}$ | $R^{B2}$ | $R^{B3}$ | $R^{B4}$ | RB5 |
|---|---|---|---|---|---|
| 531. | H | 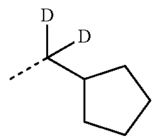 | H | H | H |
| 532. | $CH_3$ | 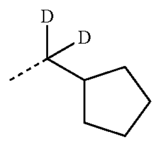 | H | $CD_3$ | H |
| 533. | H | 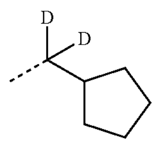 | $CD_3$ | H | H |
| 534. | H | 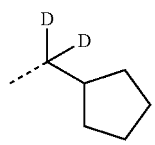 | H | $CD_3$ | H |
| 535. | $CD_3$ | 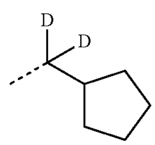 | $CD_3$ | H | H |
| 536. | $CD_3$ | 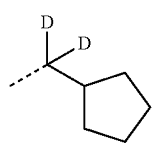 | H | $CD_3$ | H |
| 537. | H | 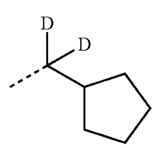 | $CD_3$ | $CD_3$ | H |
| 538. | $CH_3$ | 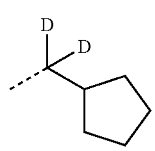 | $CD_3$ | $CD_3$ | H |
| 539. | H | H | 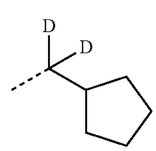 | H | H |
| 540. | $CD_3$ | H | 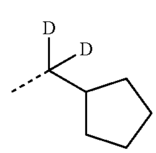 | H | H |

-continued
| i in Li | $R^{B1}$ | $R^{B2}$ | $R^{B3}$ | $R^{B4}$ | RB5 |
|---|---|---|---|---|---|
| 541. | H | $CD_3$ | 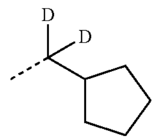 | H | H |
| 542. | H | H | 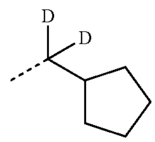 | $CD_3$ | H |
| 543. | $CD_3$ | $CD_3$ | 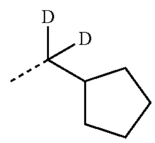 | H | H |
| 544. | $CD_3$ | H | 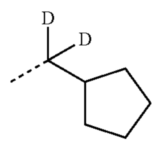 | $CD_3$ | H |
| 545. | H | $CD_3$ | 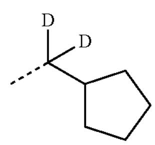 | $CD_3$ | H |
| 546. | $CD_3$ | $CD_3$ | 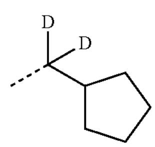 | $CD_3$ | H |
| 547. | 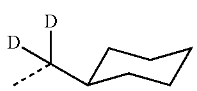 | H | H | H | H |
| 548. | 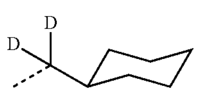 | $CD_3$ | H | $CD_3$ | H |
| 549. | 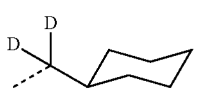 | H | $CD_3$ | H | H |
| 550. | 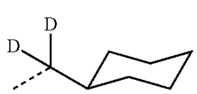 | H | H | $CD_3$ | H |
| 551. | 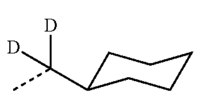 | $CD_3$ | $CD_3$ | H | H |
| 552. | 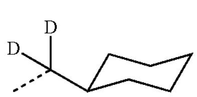 | $CD_3$ | H | $CD_3$ | H |
| 553. | 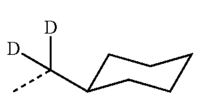 | H | $CD_3$ | $CD_3$ | H |

-continued
| i in Li | $R^{B1}$ | $R^{B2}$ | $R^{B3}$ | $R^{B4}$ | $R^{B5}$ |
|---|---|---|---|---|---|
| 554. | 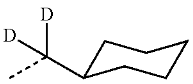 | $CD_3$ | $CD_3$ | $CD_3$ | H |
| 555. | H | 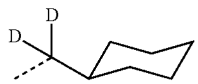 | H | H | H |
| 556. | $CD_3$ | 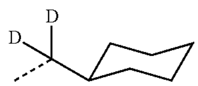 | H | $CD_3$ | H |
| 557. | H | 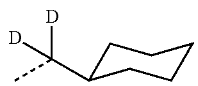 | $CD_3$ | H | H |
| 558. | H | 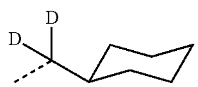 | H | $CD_3$ | H |
| 559. | $CD_3$ | 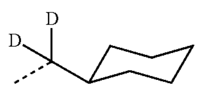 | $CD_3$ | H | H |
| 560. | $CD_3$ | 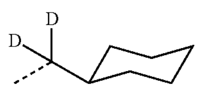 | H | $CD_3$ | H |
| 561. | H | 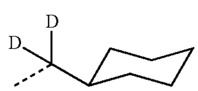 | $CD_3$ | $CD_3$ | H |
| 562. | $CD_3$ | 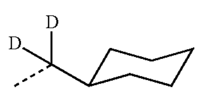 | $CD_3$ | $CD_3$ | H |
| 563. | H | H | 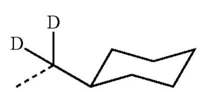 | H | H |
| 564. | $CD_3$ | H | 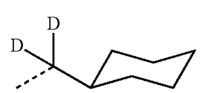 | H | H |
| 565. | H | $CD_3$ | 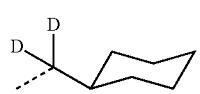 | H | H |
| 566. | H | H | 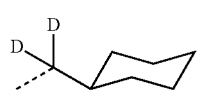 | $CD_3$ | H |
| 567. | $CD_3$ | $CD_3$ | 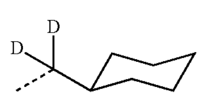 | H | H |
| 568. | $CD_3$ | H | 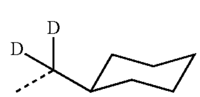 | $CD_3$ | H |
| 569. | H | $CD_3$ | 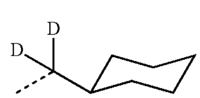 | $CD_3$ | H |

-continued
| i in Li | $R^{B1}$ | $R^{B2}$ | $R^{B3}$ | $R^{B4}$ | RB5 |
|---|---|---|---|---|---|
| 570. | $CD_3$ | $CD_3$ | 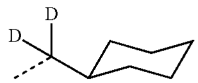 | $CD_3$ | H |
| 571. | 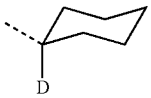 | H | H | H | H |
| 572. | 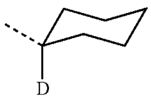 | $CD_3$ | H | $CD_3$ | H |
| 573. | 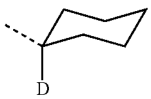 | H | $CD_3$ | H | H |
| 574. | 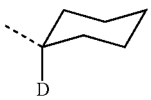 | H | H | $CD_3$ | H |
| 575. | 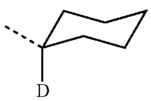 | $CD_3$ | $CD_3$ | H | H |
| 576. | 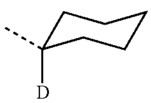 | $CD_3$ | H | $CD_3$ | H |
| 577. | 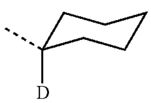 | H | $CD_3$ | $CD_3$ | H |
| 578. | 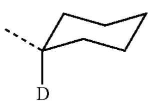 | $CD_3$ | $CD_3$ | $CD_3$ | H |
| 579. | H | 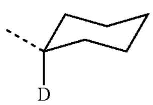 | H | H | H |
| 580. | $CD_3$ | 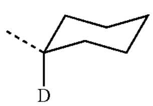 | H | $CD_3$ | H |
| 581. | H | 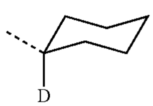 | $CD_3$ | H | H |
| 582. | H | 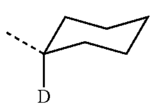 | H | $CD_3$ | H |
| 583. | $CD_3$ | 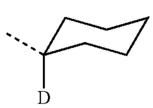 | $CD_3$ | H | H |

-continued
| i in Li | $R^{B1}$ | $R^{B2}$ | $R^{B3}$ | $R^{B4}$ | $R^{B5}$ |
|---|---|---|---|---|---|
| 584. | $CD_3$ | 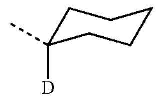 | H | $CD_3$ | H |
| 585. | H | 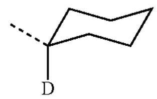 | $CD_3$ | $CD_3$ | H |
| 586. | $CD_3$ | 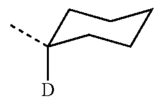 | $CD_3$ | $CD_3$ | H |
| 587. | H | H | 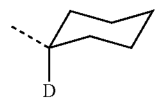 | H | H |
| 588. | $CD_3$ | H | 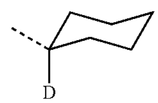 | H | H |
| 589. | H | $CD_3$ | 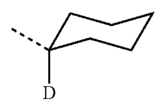 | H | H |
| 590. | H | H | 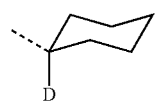 | $CD_3$ | H |
| 591. | $CD_3$ | $CD_3$ | 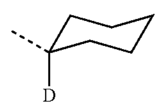 | H | H |
| 592. | $CD_3$ | H | 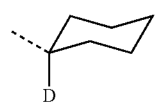 | $CD_3$ | H |
| 593. | H | $CD_3$ | 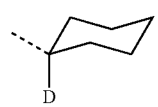 | $CD_3$ | H |
| 594. | $CD_3$ | $CD_3$ | 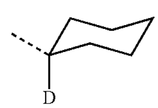 | $CD_3$ | H |
| 595. | 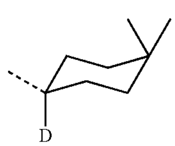 | H | H | H | H |
| 596. | 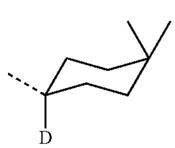 | $CD_3$ | H | $CD_3$ | H |

-continued
| i in Li | $R^{B1}$ | $R^{B2}$ | $R^{B3}$ | $R^{B4}$ | $R^{B5}$ |
|---|---|---|---|---|---|
| 597. | 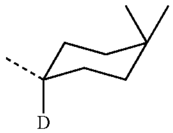 | H | $CD_3$ | H | H |
| 598. | 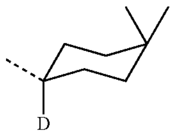 | H | H | $CD_3$ | H |
| 599. | 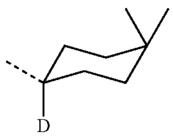 | $CD_3$ | $CD_3$ | H | H |
| 600. | 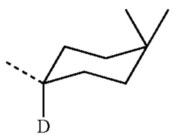 | $CD_3$ | H | $CD_3$ | H |
| 601. | 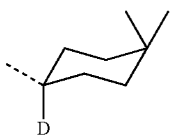 | H | $CD_3$ | $CD_3$ | H |
| 602. | 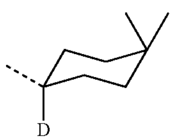 | $CD_3$ | $CD_3$ | $CD_3$ | H |
| 603. | H | 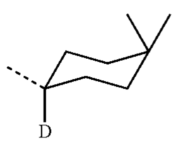 | H | H | H |
| 604. | $CD_3$ | 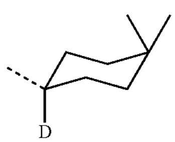 | H | $CD_3$ | H |
| 605. | H | 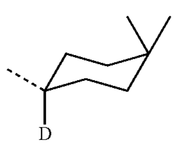 | $CD_3$ | H | H |
| 606. | H | 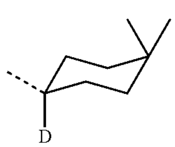 | H | $CD_3$ | H |
| 607. | $CD_3$ | 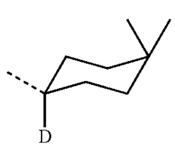 | $CD_3$ | H | H |

-continued
| i in Li | $R^{B1}$ | $R^{B2}$ | $R^{B3}$ | $R^{B4}$ | $R^{B5}$ |
|---|---|---|---|---|---|
| 608. | $CD_3$ | 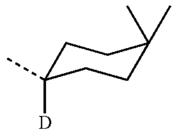 | H | $CD_3$ | H |
| 609. | H | 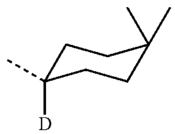 | $CD_3$ | $CD_3$ | H |
| 610. | $CD_3$ | 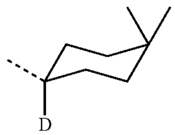 | $CD_3$ | $CD_3$ | H |
| 611. | H | H | 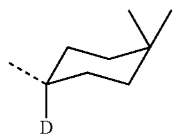 | H | H |
| 612. | $CD_3$ | H | 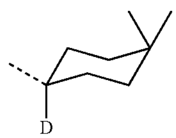 | H | H |
| 613. | H | $CD_3$ | 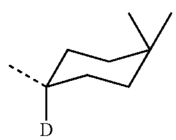 | H | H |
| 614. | H | H | 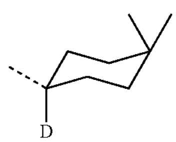 | $CD_3$ | H |
| 615. | $CD_3$ | $CD_3$ | 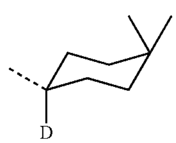 | H | H |
| 616. | $CD_3$ | H | 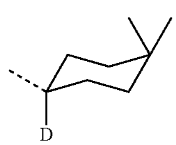 | $CD_3$ | H |
| 617. | H | $CD_3$ | 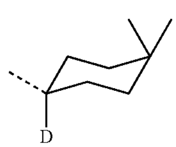 | $CD_3$ | H |

-continued
| i in Li | $R^{B1}$ | $R^{B2}$ | $R^{B3}$ | $R^{B4}$ | $R^{B5}$ |
|---|---|---|---|---|---|
| 618. | $CD_3$ | $CD_3$ | 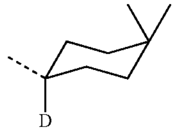 | $CD_3$ | H |
| 619. | 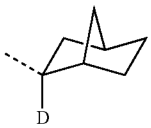 | H | H | H | H |
| 620. | 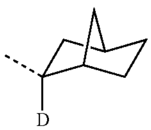 | $CD_3$ | H | $CD_3$ | H |
| 621. | 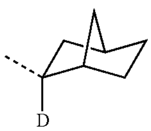 | H | $CD_3$ | H | H |
| 622. | 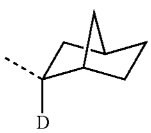 | H | H | $CD_3$ | H |
| 623. | 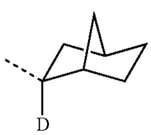 | $CH_3$ | $CH_3$ | H | H |
| 624. | 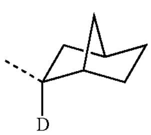 | $CD_3$ | H | $CD_3$ | H |
| 625. | 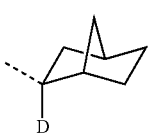 | H | $CD_3$ | $CD_3$ | H |
| 626. | 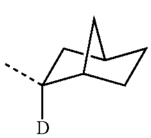 | $CD_3$ | $CD_3$ | $CD_3$ | H |
| 627. | H | 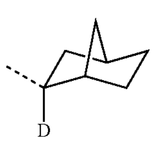 | H | H | H |
| 628. | $CD_3$ | 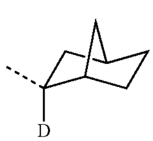 | H | $CD_3$ | H |

-continued
| i in Li | $R^{B1}$ | $R^{B2}$ | $R^{B3}$ | $R^{B4}$ | $R^{B5}$ |
|---|---|---|---|---|---|
| 629. | H | 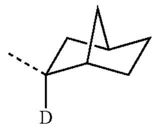 | $CD_3$ | H | H |
| 630. | H | 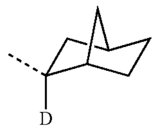 | H | $CD_3$ | H |
| 631. | $CD_3$ | 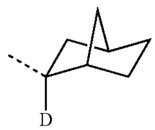 | $CD_3$ | H | H |
| 632. | $CD_3$ | 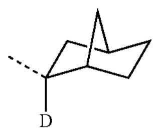 | H | $CD_3$ | H |
| 633. | H | 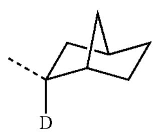 | $CD_3$ | $CD_3$ | H |
| 634. | $CD_3$ | 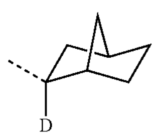 | $CD_3$ | $CD_3$ | H |
| 635. | H | H | 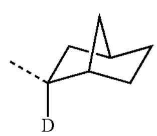 | H | H |
| 636. | $CD_3$ | H | 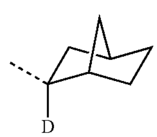 | H | H |
| 637. | H | $CD_3$ | 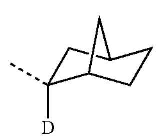 | H | H |
| 638. | H | H | 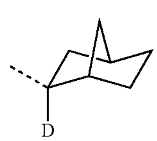 | $CH_3$ | H |
| 639. | $CD_3$ | $CD_3$ | 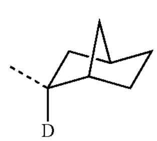 | H | H |

-continued
| i in Li | $R^{B1}$ | $R^{B2}$ | $R^{B3}$ | $R^{B4}$ | RB5 |
|---|---|---|---|---|---|
| 640. | $CD_3$ | H | 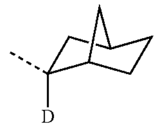 | $CD_3$ | H |
| 641. | H | $CD_3$ | 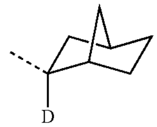 | $CD_3$ | H |
| 642. | CD3 | $CD_3$ | 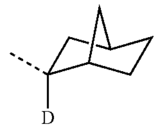 | $CD_3$ | H |
| 643. | $CD(CH_3)_2$ | H | $CD_2CH_3$ | H | H |
| 644. | $CD(CH_3)_2$ | H | $CD(CH_3)_2$ | H | H |
| 645. | $CD(CH_3)_2$ | H | $CD_2CH(CH_3)_2$ | H | H |
| 646. | $CD(CH_3)_2$ | H | $C(CH_3)_3$ | H | H |
| 647. | $CD(CH_3)_2$ | H | $CD_2C(CH_3)_3$ | H | H |
| 648. | $CD(CH_3)_2$ | H | 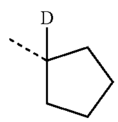 | H | H |
| 649. | $CD(CH_3)_2$ | H | 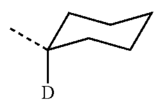 | H | H |
| 650. | $CD(CH_3)_2$ | H | 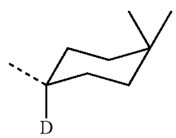 | H | H |
| 651. | $CD(CH_3)_2$ | H | 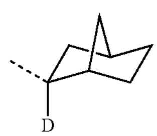 | H | H |
| 652. | $CD(CH_3)_2$ | H | 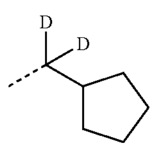 | H | H |
| 653. | $CD(CH_3)_2$ | H | 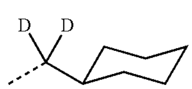 | H | H |
| 654. | $C(CH_3)_3$ | H | $CD_2CH_3$ | H | H |
| 655. | $C(CH_3)_3$ | H | $CD(CH_3)_2$ | H | H |
| 656. | $C(CH_3)_3$ | H | $CD_2CH(CH_3)_2$ | H | H |
| 657. | $C(CH_3)_3$ | H | $C(CH_3)_3$ | H | H |
| 658. | $C(CH_3)_3$ | H | $CD_2C(CH_3)_3$ | H | H |
| 659. | $C(CH_3)_3$ | H | 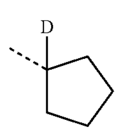 | H | H |

-continued
| i in Li | $R^{B1}$ | $R^{B2}$ | $R^{B3}$ | $R^{B4}$ | $R^{B5}$ |
|---|---|---|---|---|---|
| 660. | $C(CH_3)_3$ | H | 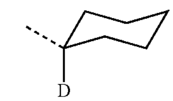 | H | H |
| 661. | $C(CH_3)_3$ | H | 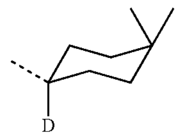 | H | H |
| 662. | $C(CH_3)_3$ | H | 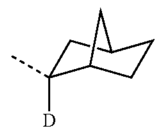 | H | H |
| 663. | $C(CH_3)_3$ | H | 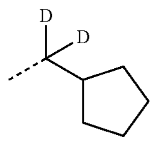 | H | H |
| 664. | $C(CH_3)_3$ | H | 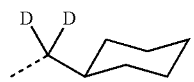 | H | H |
| 665. | $CD_2C(CH_3)_3$ | H | $CD_2CH_3$ | H | H |
| 666. | $CD_2C(CH_3)_3$ | H | $CD(CH_3)_2$ | H | H |
| 667. | $CD_2C(CH_3)_3$ | H | $CD_2CH(CH_3)_2$ | H | H |
| 668. | $CD_2C(CH_3)_3$ | H | $C(CH_3)_3$ | H | H |
| 669. | $CD_2C(CH_3)_3$ | H | $CD_2C(CH_3)_3$ | H | H |
| 670. | $CD_2C(CH_3)_3$ | H | 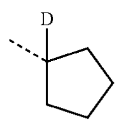 | H | H |
| 671. | $CD_2C(CH_3)_3$ | H | 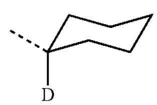 | H | H |
| 672. | $CD_2C(CH_3)_3$ | H | 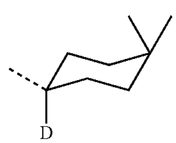 | H | H |
| 673. | $CD_2C(CH_3)_3$ | H | 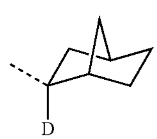 | H | H |
| 674. | $CD_2C(CH_3)_3$ | H | 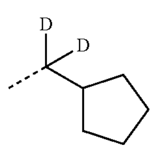 | H | H |
| 675. | $CD_2C(CH_3)_3$ | H | 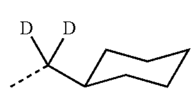 | H | H |

-continued
| i in Li | $R^{B1}$ | $R^{B2}$ | $R^{B3}$ | $R^{B4}$ | RB5 |
|---|---|---|---|---|---|
| 676. | 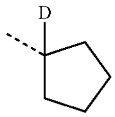 | H | $CD_2CH_3$ | H | H |
| 677. | 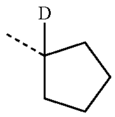 | H | $CD(CH_3)_2$ | H | H |
| 678. | 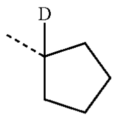 | H | $CD_2CH(CH_3)_2$ | H | H |
| 679. | 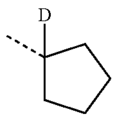 | H | $C(CH_3)_3$ | H | H |
| 680. | 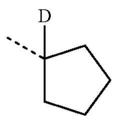 | H | $CD_2C(CH_3)_3$ | H | H |
| 681. | 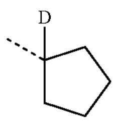 | H | 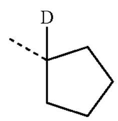 | H | H |
| 682. | 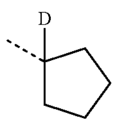 | H | 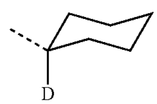 | H | H |
| 683. | 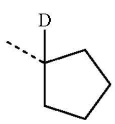 | H | 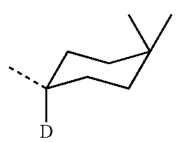 | H | H |
| 684. | 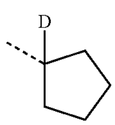 | H | 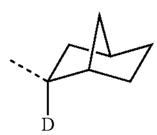 | H | H |
| 685. | 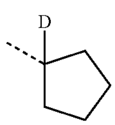 | H | 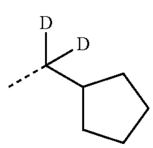 | H | H |
| 686. | 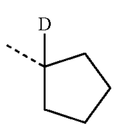 | H | 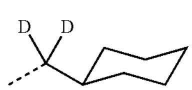 | H | H |
| 687. | 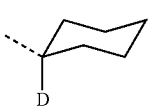 | H | $CD_2CH_3$ | H | H |

-continued
| i in Li | $R^{B1}$ | $R^{B2}$ | $R^{B3}$ | $R^{B4}$ | $R^{B5}$ |
|---|---|---|---|---|---|
| 688. | 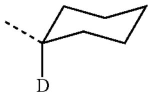 | H | $CD(CH_3)_2$ | H | H |
| 689. | 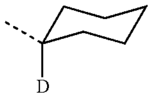 | H | $CD_2CH(CH_3)_2$ | H | H |
| 690. | 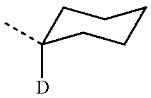 | H | $C(CH_3)_3$ | H | H |
| 691. | 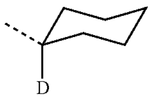 | H | $CD_2C(CH_3)_3$ | H | H |
| 692. | 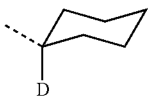 | H | 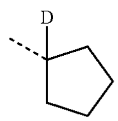 | H | H |
| 693. | 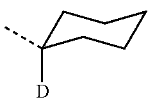 | H | 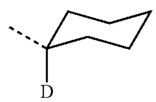 | H | H |
| 694. | 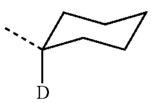 | H | 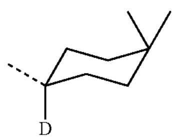 | H | H |
| 695. | 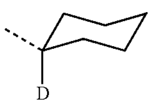 | H | 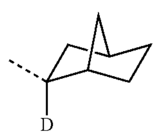 | H | H |
| 696. | 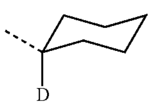 | H | 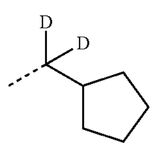 | H | H |
| 697. | 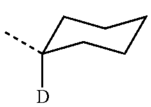 | H | 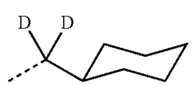 | H | H |
| 698. | 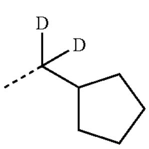 | H | $CD_2CH_3$ | H | H |
| 699. | 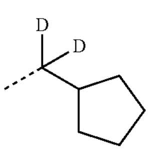 | H | $CD(CH_3)_2$ | H | H |

-continued
| i in Li | $R^{B1}$ | $R^{B2}$ | $R^{B3}$ | $R^{B4}$ | $R^{B5}$ |
|---|---|---|---|---|---|
| 700. | 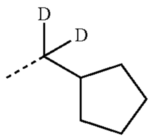 | H | $CD_2CH(CH_3)_2$ | H | H |
| 701. | 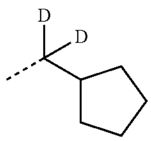 | H | $C(CH_3)_3$ | H | H |
| 702. | 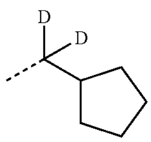 | H | $CD_2C(CH_3)_3$ | H | H |
| 703. | 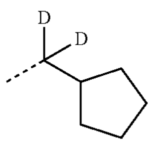 | H | 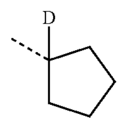 | H | H |
| 704. | 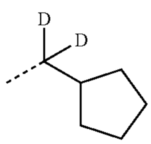 | H | 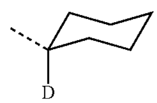 | H | H |
| 705. | 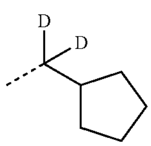 | H | 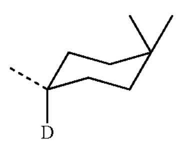 | H | H |
| 706. | 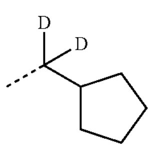 | H | 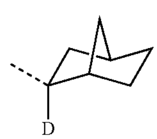 | H | H |
| 707. | 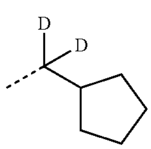 | H | 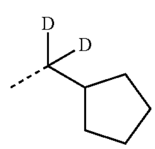 | H | H |
| 708. | 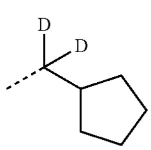 | H | 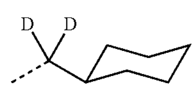 | H | H |
| 709. | 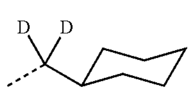 | H | $CD_2CH_3$ | H | H |
| 710. | 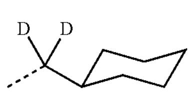 | H | $CD(CH_3)_2$ | H | H |

-continued
| i in Li | $R^{B1}$ | $R^{B2}$ | $R^{B3}$ | $R^{B4}$ | $R^{B5}$ |
|---|---|---|---|---|---|
| 711. | 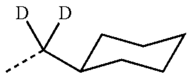 | H | $CD_2CH(CH_3)_2$ | H | H |
| 712. | 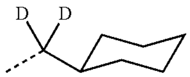 | H | $C(CH_3)_3$ | H | H |
| 713. | 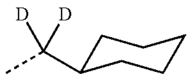 | H | $CD_2C(CH_3)_3$ | H | H |
| 714. | 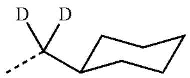 | H | 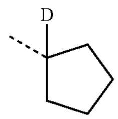 | H | H |
| 715. | 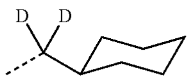 | H | 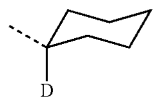 | H | H |
| 716. | 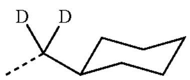 | H | 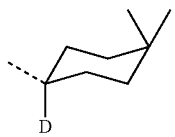 | H | H |
| 717. | 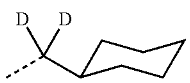 | H | 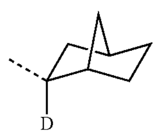 | H | H |
| 718. | 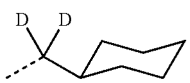 | H | 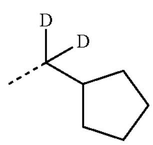 | H | H |
| 719. | 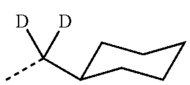 | H | 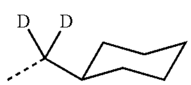 | H | H |
| 720. | 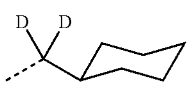 | H | $CD_2CH_3$ | H | H |
| 721. | 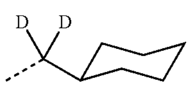 | H | $CD(CH_3)_2$ | H | H |
| 722. | 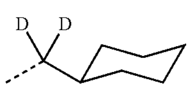 | H | $CD_2CH(CH_3)_2$ | H | H |
| 723. | 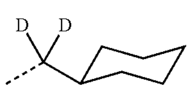 | H | $C(CH_3)_3$ | H | H |
| 724. | 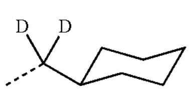 | H | $CD_2C(CH_3)_3$ | H | H |

-continued

| i in Li | $R^{B1}$ | $R^{B2}$ | $R^{B3}$ | $R^{B4}$ | RB5 |
|---|---|---|---|---|---|
| 725. | 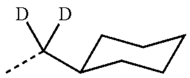 | H | 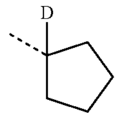 | H | H |
| 726. | 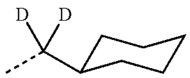 | H | 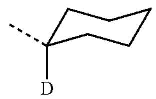 | H | H |
| 727. | 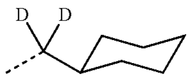 | H | 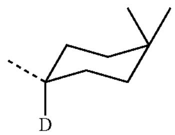 | H | H |
| 728. | 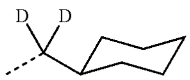 | H | 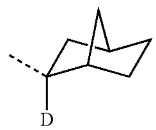 | H | H |
| 729. | 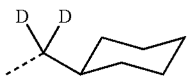 | H | 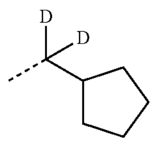 | H | H |
| 730. | 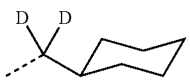 | H | 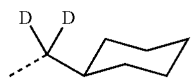 | H | H |
| 731. | H | H | H | H | Ph |
| 732. | $CH_3$ | H | H | H | Ph |
| 733. | H | $CH_3$ | H | H | Ph |
| 734. | H | H | $CH_3$ | H | Ph |
| 735. | $CH_3$ | $CH_3$ | H | $CH_3$ | Ph |
| 736. | $CH_3$ | H | $CH_3$ | H | Ph |
| 737. | $CH_3$ | H | H | $CH_3$ | Ph |
| 738. | H | $CH_3$ | $CH_3$ | H | Ph |
| 739. | H | $CH_3$ | H | $CH_3$ | Ph |
| 740. | H | H | $CH_3$ | $CH_3$ | Ph |
| 741. | $CH_3$ | $CH_3$ | $CH_3$ | H | Ph |
| 742. | $CH_3$ | $CH_3$ | H | $CH_3$ | Ph |
| 743. | $CH_3$ | H | $CH_3$ | $CH_3$ | Ph |
| 744. | H | $CH_3$ | $CH_3$ | $CH_3$ | Ph |
| 745. | CH | $CH_3$ | $CH_3$ | $CH_3$ | Ph |
| 746. | $CH_2CH_3$ | H | H | H | Ph |
| 747. | $CH_2CH_3$ | $CH_3$ | H | $CH_3$ | Ph |
| 748. | $CH_2CH_3$ | H | $CH_3$ | H | Ph |
| 749. | $CH_2CH_3$ | H | H | $CH_3$ | Ph |
| 750. | $CH_2CH_3$ | $CH_3$ | $CH_3$ | H | Ph |
| 751. | $CH_2CH_3$ | $CH_3$ | H | $CH_3$ | Ph |
| 752. | $CH_2CH_3$ | H | $CH_3$ | $CH_3$ | Ph |
| 753. | $CH_2CH_3$ | $CH_3$ | $CH_3$ | $CH_3$ | Ph |
| 754. | H | $CH_2CH_3$ | H | H | Ph |
| 755. | $CH_3$ | $CH_2CH_3$ | H | $CH_3$ | Ph |
| 756. | H | $CH_2CH_3$ | $CH_3$ | H | Ph |
| 757. | H | $CH_2CH_3$ | H | $CH_3$ | Ph |
| 758. | $CH_3$ | $CH_2CH_3$ | $CH_3$ | H | Ph |
| 759. | $CH_3$ | $CH_2CH_3$ | H | $CH_3$ | Ph |
| 760. | H | $CH_2CH_3$ | $CH_3$ | $CH_3$ | Ph |
| 761. | $CH_3$ | $CH_2CH_3$ | $CH_3$ | $CH_3$ | Ph |
| 762. | H | H | $CH_2CH_3$ | H | Ph |
| 763. | $CH_3$ | H | $CH_2CH_3$ | H | Ph |
| 764. | H | $CH_3$ | $CH_2CH_3$ | H | Ph |
| 765. | H | H | $CH_2CH_3$ | $CH_3$ | Ph |
| 766. | $CH_3$ | $CH_3$ | $CH_2CH_3$ | H | Ph |
| 767. | $CH_3$ | H | $CH_2CH_3$ | $CH_3$ | Ph |
| 768. | H | $CH_3$ | $CH_2CH_3$ | $CH_3$ | Ph |
| 769. | $CH_3$ | $CH_3$ | $CH_2CH_3$ | $CH_3$ | Ph |
| 770. | $CH(CH_3)_2$ | H | H | H | Ph |

-continued

| i in Li | $R^{B1}$ | $R^{B2}$ | $R^{B3}$ | $R^{B4}$ | $R^{B5}$ |
|---|---|---|---|---|---|
| 771. | $CH(CH_3)_2$ | $CH_3$ | H | $CH_3$ | Ph |
| 772. | $CH(CH_3)_2$ | H | $CH_3$ | H | Ph |
| 773. | $CH(CH_3)_2$ | H | H | $CH_3$ | Ph |
| 774. | $CH(CH_3)_2$ | $CH_3$ | $CH_3$ | H | Ph |
| 775. | $CH(CH_3)_2$ | $CH_3$ | H | $CH_3$ | Ph |
| 776. | $CH(CH_3)_2$ | H | $CH_3$ | $CH_3$ | Ph |
| 777. | $CH(CH_3)_2$ | $CH_3$ | $CH_3$ | $CH_3$ | Ph |
| 778. | H | $CH(CH_3)_2$ | H | H | Ph |
| 779. | $CH_3$ | $CH(CH_3)_2$ | H | $CH_3$ | Ph |
| 780. | H | $CH(CH_3)_2$ | $CH_3$ | H | Ph |
| 781. | H | $CH(CH_3)_2$ | H | $CH_3$ | Ph |
| 782. | $CH_3$ | $CH(CH_3)_2$ | $CH_3$ | H | Ph |
| 783. | $CH_3$ | $CH(CH_3)_2$ | H | $CH_3$ | Ph |
| 784. | H | $CH(CH_3)_2$ | $CH_3$ | $CH_3$ | Ph |
| 785. | $CH_3$ | $CH(CH_3)_2$ | $CH_3$ | $CH_3$ | Ph |
| 786. | H | H | $CH(CH_3)_2$ | H | Ph |
| 787. | $CH_3$ | H | $CH(CH_3)_2$ | H | Ph |
| 788. | H | $CH_3$ | $CH(CH_3)_2$ | H | Ph |
| 789. | H | H | $CH(CH_3)_2$ | $CH_3$ | Ph |
| 790. | $CH_3$ | $CH_3$ | $CH(CH_3)_2$ | H | Ph |
| 791. | $CH_3$ | H | $CH(CH_3)_2$ | $CH_3$ | Ph |
| 792. | H | $CH_3$ | $CH(CH_3)_2$ | $CH_3$ | Ph |
| 793. | $CH_3$ | $CH_3$ | $CH(CH_3)_2$ | $CH_3$ | Ph |
| 794. | $CH_2CH(CH_3)_2$ | H | H | H | Ph |
| 795. | $CH_2CH(CH_3)_2$ | $CH_3$ | H | $CH_3$ | Ph |
| 796. | $CH_2CH(CH_3)_2$ | H | $CH_3$ | H | Ph |
| 797. | $CH_2CH(CH_3)_2$ | H | H | $CH_3$ | Ph |
| 798. | $CH_2CH(CH_3)_2$ | $CH_3$ | $CH_3$ | H | Ph |
| 799. | $CH_2CH(CH_3)_2$ | $CH_3$ | H | $CH_3$ | Ph |
| 800. | $CH_2CH(CH_3)_2$ | H | $CH_3$ | $CH_3$ | Ph |
| 801. | $CH_2CH(CH_3)_2$ | $CH_3$ | $CH_3$ | $CH_3$ | Ph |
| 802. | H | $CH_2CH(CH_3)_2$ | H | H | Ph |
| 803. | $CH_3$ | $CH_2CH(CH_3)_2$ | H | $CH_3$ | Ph |
| 804. | H | $CH_2CH(CH_3)_2$ | $CH_3$ | H | Ph |
| 805. | H | $CH_2CH(CH_3)_2$ | H | $CH_3$ | Ph |
| 806. | $CH_3$ | $CH_2CH(CH_3)_2$ | $CH_3$ | H | Ph |
| 807. | $CH_3$ | $CH_2CH(CH_3)_2$ | H | $CH_3$ | Ph |
| 808. | H | $CH_2CH(CH_3)_2$ | $CH_3$ | $CH_3$ | Ph |
| 809. | $CH_3$ | $CH_2CH(CH_3)_2$ | $CH_3$ | $CH_3$ | Ph |
| 810. | H | H | $CH_2CH(CH_3)_2$ | H | Ph |
| 811. | $CH_3$ | H | $CH_2CH(CH_3)_2$ | H | Ph |
| 812. | H | $CH_3$ | $CH_2CH(CH_3)_2$ | H | Ph |
| 813. | H | H | $CH_2CH(CH_3)_2$ | $CH_3$ | Ph |
| 814. | $CH_3$ | $CH_3$ | $CH_2CH(CH_3)_2$ | H | Ph |
| 815. | $CH_3$ | H | $CH_2CH(CH_3)_2$ | $CH_3$ | Ph |
| 816. | H | $CH_3$ | $CH_2CH(CH_3)_2$ | $CH_3$ | Ph |
| 817. | $CH_3$ | $CH_3$ | $CH_2CH(CH_3)_2$ | $CH_3$ | Ph |
| 818. | $C(CH_3)_3$ | H | H | H | Ph |
| 819. | $C(CH_3)_3$ | $CH_3$ | H | $CH_3$ | Ph |
| 820. | $C(CH_3)_3$ | H | $CH_3$ | H | Ph |
| 821. | $C(CH_3)_3$ | H | H | $CH_3$ | Ph |
| 822. | $C(CH_3)_3$ | $CH_3$ | $CH_3$ | H | Ph |
| 823. | $C(CH_3)_3$ | $CH_3$ | H | $CH_3$ | Ph |
| 824. | $C(CH_3)_3$ | H | $CH_3$ | $CH_3$ | Ph |
| 825. | $C(CH_3)_3$ | $CH_3$ | $CH_3$ | $CH_3$ | Ph |
| 826. | H | $C(CH_3)_3$ | H | H | Ph |
| 827. | $CH_3$ | $C(CH_3)_3$ | H | $CH_3$ | Ph |
| 828. | H | $C(CH_3)_3$ | $CH_3$ | H | Ph |
| 829. | H | $C(CH_3)_3$ | H | $CH_3$ | Ph |
| 830. | $CH_3$ | $C(CH_3)_3$ | $CH_3$ | H | Ph |
| 831. | $CH_3$ | $C(CH_3)_3$ | H | $CH_3$ | Ph |
| 832. | H | $C(CH_3)_3$ | $CH_3$ | $CH_3$ | Ph |
| 833. | $CH_3$ | $C(CH_3)_3$ | $CH_3$ | $CH_3$ | Ph |
| 834. | H | H | $C(CH_3)_3$ | H | Ph |
| 835. | $CH_3$ | H | $C(CH_3)_3$ | H | Ph |
| 836. | H | $CH_3$ | $C(CH_3)_3$ | H | Ph |
| 837. | H | H | $C(CH_3)_3$ | $CH_3$ | Ph |
| 838. | $CH_3$ | $CH_3$ | $C(CH_3)_3$ | H | Ph |
| 839. | $CH_3$ | H | $C(CH_3)_3$ | $CH_3$ | Ph |
| 840. | H | $CH_3$ | $C(CH_3)_3$ | $CH_3$ | Ph |
| 841. | $CH_3$ | $CH_3$ | $C(CH_3)_3$ | $CH_3$ | Ph |
| 842. | $CH_2C(CH_3)_3$ | H | H | H | Ph |
| 843. | $CH_2C(CH_3)_3$ | $CH_3$ | H | $CH_3$ | Ph |
| 844. | $CH_2C(CH_3)_3$ | H | $CH_3$ | H | Ph |
| 845. | $CH_2C(CH_3)_3$ | H | H | $CH_3$ | Ph |
| 846. | $CH_2C(CH_3)_3$ | $CH_3$ | $CH_3$ | H | Ph |
| 847. | $CH_2C(CH_3)_3$ | $CH_3$ | H | $CH_3$ | Ph |

-continued

| i in Li | $R^{B1}$ | $R^{B2}$ | $R^{B3}$ | $R^{B4}$ | RB5 |
|---|---|---|---|---|---|
| 848. | $CH_2C(CH_3)_3$ | H | $CH_3$ | $CH_3$ | Ph |
| 849. | $CH_2C(CH_3)_3$ | $CH_3$ | $CH_3$ | $CH_3$ | Ph |
| 850. | H | $CH_2C(CH_3)_3$ | H | H | Ph |
| 851. | $CH_3$ | $CH_2C(CH_3)_3$ | H | $CH_3$ | Ph |
| 852. | H | $CH_2C(CH_3)_3$ | $CH_3$ | H | Ph |
| 853. | H | $CH_2C(CH_3)_3$ | H | $CH_3$ | Ph |
| 854. | $CH_3$ | $CH_2C(CH_3)_3$ | $CH_3$ | H | Ph |
| 855. | $CH_3$ | $CH_2C(CH_3)_3$ | H | $CH_3$ | Ph |
| 856. | H | $CH_2C(CH_3)_3$ | $CH_3$ | $CH_3$ | Ph |
| 857. | $CH_3$ | $CH_2C(CH_3)_3$ | $CH_3$ | $CH_3$ | Ph |
| 858. | H | H | $CH_2C(CH_3)_3$ | H | Ph |
| 859. | $CH_3$ | H | $CH_2C(CH_3)_3$ | H | Ph |
| 860. | H | $CH_3$ | $CH_2C(CH_3)_3$ | H | Ph |
| 861. | H | H | $CH_2C(CH_3)_3$ | $CH_3$ | Ph |
| 862. | $CH_3$ | $CH_3$ | $CH_2C(CH_3)_3$ | H | Ph |
| 863. | $CH_3$ | H | $CH_2C(CH_3)_3$ | $CH_3$ | Ph |
| 864. | H | $CH_3$ | $CH_2C(CH_3)_3$ | $CH_3$ | Ph |
| 865. | $CH_3$ | $CH_3$ | $CH_2C(CH_3)_3$ | $CH_3$ | Ph |
| 866. | 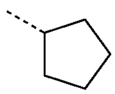 | H | H | H | Ph |
| 867. | 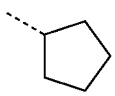 | $CH_3$ | H | $CH_3$ | Ph |
| 868. | 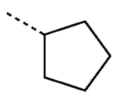 | H | $CH_3$ | H | Ph |
| 869. | 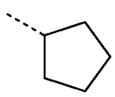 | H | H | $CH_3$ | Ph |
| 870. | 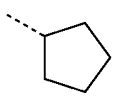 | $CH_3$ | $CH_3$ | H | Ph |
| 871. | 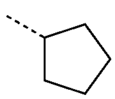 | $CH_3$ | H | $CH_3$ | Ph |
| 872. | 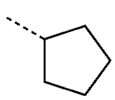 | H | $CH_3$ | $CH_3$ | Ph |
| 873. | 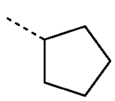 | $CH_3$ | $CH_3$ | $CH_3$ | Ph |
| 874. | H | 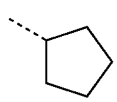 | H | H | Ph |
| 875. | $CH_3$ | 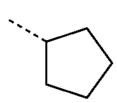 | H | $CH_3$ | Ph |
| 876. | H | 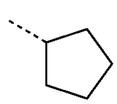 | $CH_3$ | H | Ph |

-continued
| i in Li | $R^{B1}$ | $R^{B2}$ | $R^{B3}$ | $R^{B4}$ | RB5 |
|---|---|---|---|---|---|
| 877. | H | 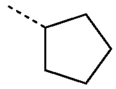 | H | $CH_3$ | Ph |
| 878. | $CH_3$ | 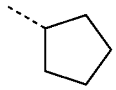 | $CH_3$ | H | Ph |
| 879. | $CH_3$ | 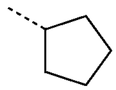 | H | $CH_3$ | Ph |
| 880. | H | 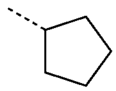 | $CH_3$ | $CH_3$ | Ph |
| 881. | $CH_3$ | 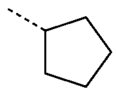 | $CH_3$ | $CH_3$ | Ph |
| 882. | H | H | 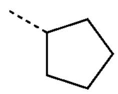 | H | Ph |
| 883. | $CH_3$ | H | 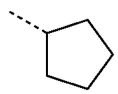 | H | Ph |
| 884. | H | $CH_3$ | 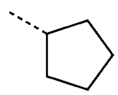 | H | Ph |
| 885. | H | H | 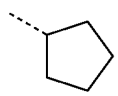 | $CH_3$ | Ph |
| 886. | $CH_3$ | $CH_3$ | 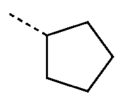 | H | Ph |
| 887. | $CH_3$ | H | 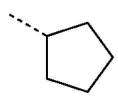 | $CH_3$ | Ph |
| 888. | H | $CH_3$ | 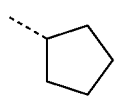 | $CH_3$ | Ph |
| 889. | $CH_3$ | $CH_3$ | 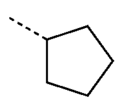 | $CH_3$ | Ph |
| 890. | 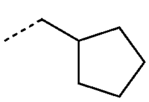 | H | H | H | Ph |
| 891. | 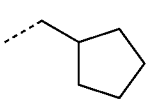 | $CH_3$ | H | $CH_3$ | Ph |

-continued
| i in Li | $R^{B1}$ | $R^{B2}$ | $R^{B3}$ | $R^{B4}$ | $R^{B5}$ |
|---|---|---|---|---|---|
| 892. | 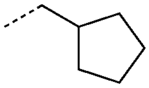 | H | $CH_3$ | H | Ph |
| 893. | 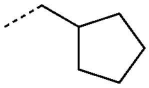 | H | H | $CH_3$ | Ph |
| 894. | 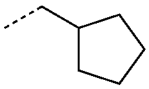 | $CH_3$ | $CH_3$ | H | Ph |
| 895. | 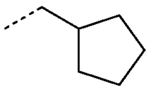 | $CH_3$ | H | $CH_3$ | Ph |
| 896. | 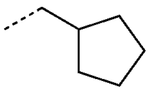 | H | $CH_3$ | $CH_3$ | Ph |
| 897. | 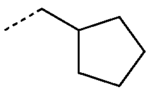 | $CH_3$ | $CH_3$ | $CH_3$ | Ph |
| 898. | H | 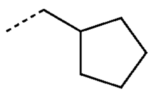 | H | H | Ph |
| 899. | $CH_3$ | 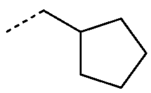 | H | $CH_3$ | Ph |
| 900. | H | 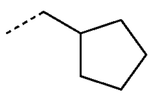 | $CH_3$ | H | Ph |
| 901. | H | 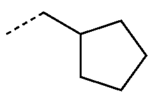 | H | $CH_3$ | Ph |
| 902. | $CH_3$ | 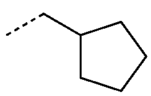 | $CH_3$ | H | Ph |
| 903. | $CH_3$ | 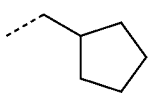 | H | $CH_3$ | Ph |
| 904. | H | 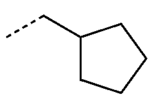 | $CH_3$ | $CH_3$ | Ph |
| 905. | $CH_3$ | 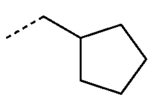 | $CH_3$ | $CH_3$ | Ph |
| 906. | H | H | 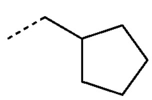 | H | Ph |

-continued
| i in Li | $R^{B1}$ | $R^{B2}$ | $R^{B3}$ | $R^{B4}$ | RB5 |
|---|---|---|---|---|---|
| 907. | $CH_3$ | H | 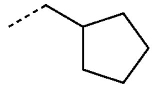 | H | Ph |
| 908. | H | $CH_3$ | 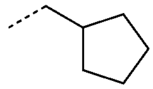 | H | Ph |
| 909. | H | H | 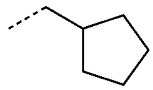 | H | Ph |
| 910. | $CH_3$ | $CH_3$ | 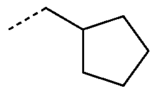 | H | Ph |
| 911. | $CH_3$ | H | 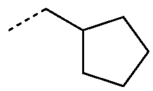 | $CH_3$ | Ph |
| 912. | H | $CH_3$ | 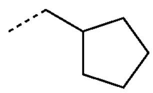 | $CH_3$ | Ph |
| 913. | $CH_3$ | $CH_3$ | 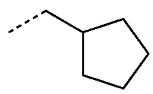 | $CH_3$ | Ph |
| 914. | 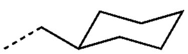 | H | H | H | Ph |
| 915. | 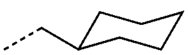 | $CH_3$ | H | $CH_3$ | Ph |
| 916. | 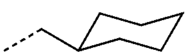 | H | $CH_3$ | H | Ph |
| 917. | 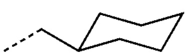 | H | H | $CH_3$ | Ph |
| 918. | 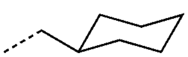 | $CH_3$ | $CH_3$ | H | Ph |
| 919. | 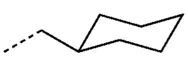 | $CH_3$ | H | $CH_3$ | Ph |
| 920. | 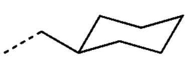 | H | $CH_3$ | $CH_3$ | Ph |
| 921. | 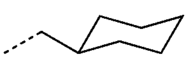 | $CH_3$ | $CH_3$ | $CH_3$ | Ph |
| 922. | H | 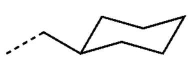 | H | H | Ph |
| 923. | $CH_3$ | 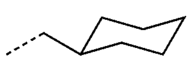 | H | $CH_3$ | Ph |
| 924. | H | 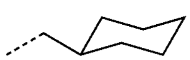 | $CH_3$ | H | Ph |
| 925. | H | 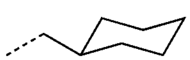 | H | $CH_3$ | Ph |
| 926. | $CH_3$ | 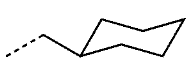 | $CH_3$ | H | Ph |

-continued
| i in Li | $R^{B1}$ | $R^{B2}$ | $R^{B3}$ | $R^{B4}$ | RB5 |
|---|---|---|---|---|---|
| 927. | $CH_3$ | 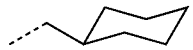 | H | $CH_3$ | Ph |
| 928. | H | 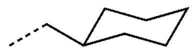 | $CH_3$ | $CH_3$ | Ph |
| 929. | $CH_3$ | 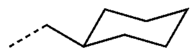 | $CH_3$ | $CH_3$ | Ph |
| 930. | H | H | 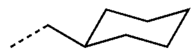 | H | Ph |
| 931. | $CH_3$ | H | 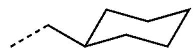 | H | Ph |
| 932. | H | $CH_3$ | 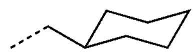 | H | Ph |
| 933. | H | H | 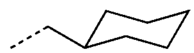 | $CH_3$ | Ph |
| 934. | $CH_3$ | $CH_3$ | 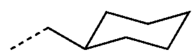 | H | Ph |
| 935. | $CH_3$ | H | 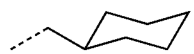 | $CH_3$ | Ph |
| 936. | H | $CH_3$ | 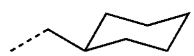 | $CH_3$ | Ph |
| 937. | $CH_3$ | $CH_3$ | 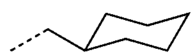 | $CH_3$ | Ph |
| 938. | 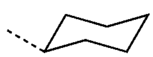 | H | H | H | Ph |
| 939. | 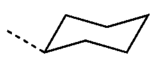 | $CH_3$ | H | $CH_3$ | Ph |
| 940. | 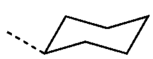 | H | $CH_3$ | H | Ph |
| 941. | 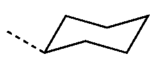 | H | H | $CH_3$ | Ph |
| 942. | 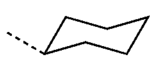 | $CH_3$ | $CH_3$ | H | Ph |
| 943. | 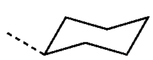 | $CH_3$ | H | $CH_3$ | Ph |
| 944. | 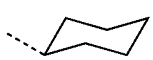 | H | $CH_3$ | $CH_3$ | Ph |
| 945. | 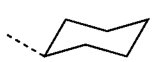 | $CH_3$ | $CH_3$ | $CH_3$ | Ph |
| 946. | H | 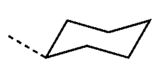 | H | H | Ph |
| 947. | $CH_3$ | 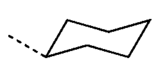 | H | $CH_3$ | Ph |
| 948. | H | 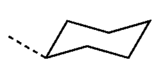 | $CH_3$ | H | Ph |
| 949. | H | 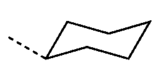 | H | $CH_3$ | Ph |
| 950. | $CH_3$ | 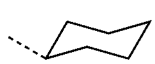 | $CH_3$ | H | Ph |

-continued
| i in Li | $R^{B1}$ | $R^{B2}$ | $R^{B3}$ | $R^{B4}$ | $R^{B5}$ |
|---|---|---|---|---|---|
| 951. | $CH_3$ | 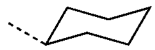 | H | $CH_3$ | Ph |
| 952. | H | 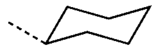 | $CH_3$ | $CH_3$ | Ph |
| 953. | $CH_3$ | 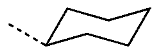 | $CH_3$ | $CH_3$ | Ph |
| 954. | H | H | 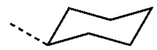 | H | Ph |
| 955. | $CH_3$ | H | 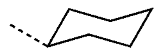 | H | Ph |
| 956. | H | $CH_3$ | 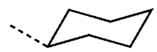 | H | Ph |
| 957. | H | H | 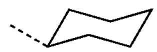 | $CH_3$ | Ph |
| 958. | $CH_3$ | $CH_3$ | 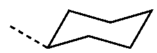 | H | Ph |
| 959. | $CH_3$ | H | 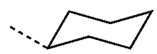 | $CH_3$ | Ph |
| 960. | H | $CH_3$ | 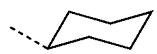 | $CH_3$ | Ph |
| 961. | $CH_3$ | $CH_3$ | 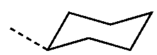 | $CH_3$ | Ph |
| 962. | 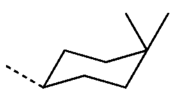 | H | H | H | Ph |
| 963. | 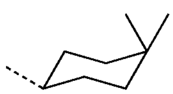 | $CH_3$ | H | $CH_3$ | Ph |
| 964. | 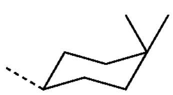 | H | $CH_3$ | H | Ph |
| 965. | 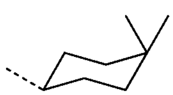 | H | H | $CH_3$ | Ph |
| 966. | 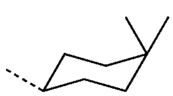 | $CH_3$ | $CH_3$ | H | Ph |
| 967. | 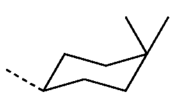 | $CH_3$ | H | $CH_3$ | Ph |
| 968. | 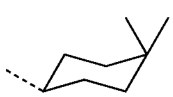 | H | $CH_3$ | $CH_3$ | Ph |
| 969. | 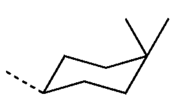 | $CH_3$ | $CH_3$ | $CH_3$ | Ph |

-continued
| i in Li | $R^{B1}$ | $R^{B2}$ | $R^{B3}$ | $R^{B4}$ | $R^{B5}$ |
|---|---|---|---|---|---|
| 970. | H | 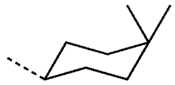 | H | H | Ph |
| 971. | $CH_3$ | 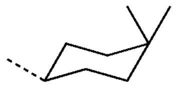 | H | $CH_3$ | Ph |
| 972. | H | 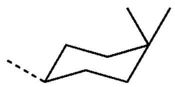 | $CH_3$ | H | Ph |
| 973. | H | 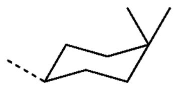 | H | $CH_3$ | Ph |
| 974. | $CH_3$ | 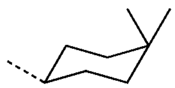 | $CH_3$ | H | Ph |
| 975. | $CH_3$ | 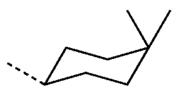 | H | $CH_3$ | Ph |
| 976. | H | 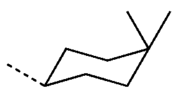 | $CH_3$ | $CH_3$ | Ph |
| 977. | $CH_3$ | 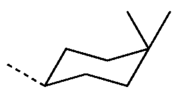 | $CH_3$ | $CH_3$ | Ph |
| 978. | H | H | 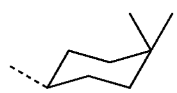 | H | Ph |
| 979. | $CH_3$ | H | 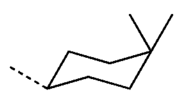 | H | Ph |
| 980. | H | $CH_3$ | 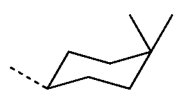 | H | Ph |
| 981. | H | H | 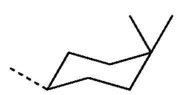 | $CH_3$ | Ph |
| 982. | $CH_3$ | $CH_3$ | 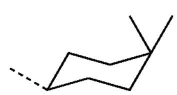 | H | Ph |
| 983. | $CH_3$ | H | 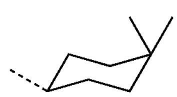 | $CH_3$ | Ph |
| 984. | H | $CH_3$ | 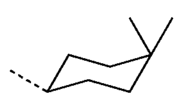 | $CH_3$ | Ph |
| 985. | $CH_3$ | $CH_3$ | 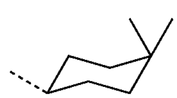 | $CH_3$ | Ph |

-continued
| i in Li | $R^{B1}$ | $R^{B2}$ | $R^{B3}$ | $R^{B4}$ | RB5 |
|---|---|---|---|---|---|
| 986. | 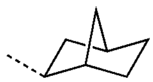 | H | H | H | Ph |
| 987. | 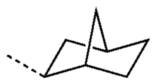 | $CH_3$ | H | $CH_3$ | Ph |
| 988. | 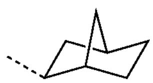 | H | $CH_3$ | H | Ph |
| 989. | 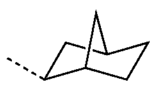 | H | H | $CH_3$ | Ph |
| 990. | 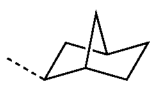 | $CH_3$ | $CH_3$ | H | Ph |
| 991. | 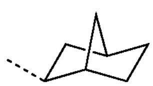 | $CH_3$ | H | $CH_3$ | Ph |
| 992. | 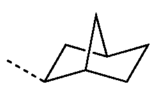 | H | $CH_3$ | $CH_3$ | Ph |
| 993. | 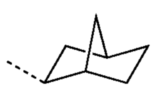 | $CH_3$ | $CH_3$ | $CH_3$ | Ph |
| 994. | H | 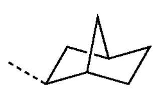 | H | H | Ph |
| 995. | $CH_3$ | 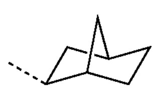 | H | $CH_3$ | Ph |
| 996. | H | 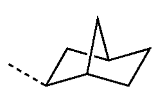 | $CH_3$ | H | Ph |
| 997. | H | 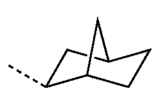 | H | $CH_3$ | Ph |
| 998. | $CH_3$ | 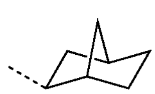 | $CH_3$ | H | Ph |
| 999. | $CH_3$ | 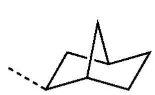 | H | $CH_3$ | Ph |
| 1000. | H | 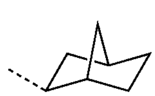 | $CH_3$ | $CH_3$ | Ph |
| 1001. | $CH_3$ | 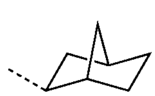 | $CH_3$ | $CH_3$ | Ph |

-continued

| i in Li | $R^{B1}$ | $R^{B2}$ | $R^{B3}$ | $R^{B4}$ | $R^{B5}$ |
|---|---|---|---|---|---|
| 1002. | H | H | 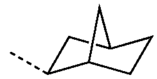 | H | Ph |
| 1003. | $CH_3$ | H | 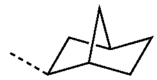 | H | Ph |
| 1004. | H | $CH_3$ | 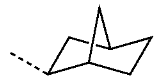 | H | Ph |
| 1005. | H | H | 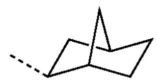 | $CH_3$ | Ph |
| 1006. | $CH_3$ | $CH_3$ |  | H | Ph |
| 1007. | $CH_3$ | H | 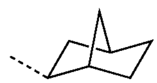 | $CH_3$ | Ph |
| 1008. | H | $CH_3$ | 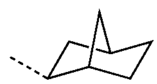 | $CH_3$ | Ph |
| 1009. | $CH_3$ | $CH_3$ | 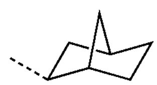 | $CH_3$ | Ph |
| 1010. | $CH(CH_3)_2$ | H | $CH_2CH_3$ | H | Ph |
| 1011. | $CH(CH_3)_2$ | H | $CH(CH_3)_2$ | H | Ph |
| 1012. | $CH(CH_3)_2$ | H | $CH_2CH(CH_3)_2$ | H | Ph |
| 1013. | $CH(CH_3)_2$ | H | $C(CH_3)_3$ | H | Ph |
| 1014. | $CH(CH_3)_2$ | H | $CH_2C(CH_3)_3$ | H | Ph |
| 1015. | $CH(CH_3)_2$ | H | 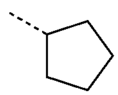 | H | Ph |
| 1016. | $CH(CH_3)_2$ | H | 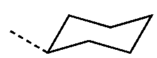 | H | Ph |
| 1017. | $CH(CH_3)_2$ | H | 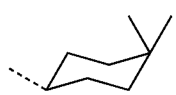 | H | Ph |
| 1018. | $CH(CH_3)_2$ | H | 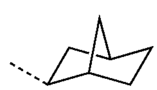 | H | Ph |
| 1019. | $CH(CH_3)_2$ | H | 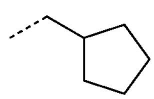 | H | Ph |
| 1020. | $CH(CH_3)_2$ | H | 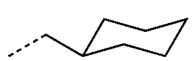 | H | Ph |
| 1021. | $C(CH_3)_3$ | H | $CH_2CH_3$ | H | Ph |
| 1022. | $C(CH_3)_3$ | H | $CH(CH_3)_2$ | H | Ph |
| 1023. | $C(CH_3)_3$ | H | $CH_2CH(CH_3)_2$ | H | Ph |
| 1024. | $C(CH_3)_3$ | H | $C(CH_3)_3$ | H | Ph |
| 1025. | $C(CH_3)_3$ | H | $CH_2C(CH_3)_3$ | H | Ph |

-continued
| i in Li | $R^{B1}$ | $R^{B2}$ | $R^{B3}$ | $R^{B4}$ | RB5 |
|---|---|---|---|---|---|
| 1026. | $C(CH_3)_3$ | H | 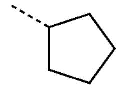 | H | Ph |
| 1027. | $C(CH_3)_3$ | H | 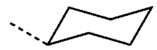 | H | Ph |
| 1028. | $C(CH_3)_3$ | H | 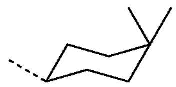 | H | Ph |
| 1029. | $C(CH_3)_3$ | H | 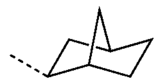 | H | Ph |
| 1030. | $C(CH_3)_3$ | H | 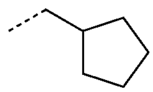 | H | Ph |
| 1031. | $C(CH_3)_3$ | H | 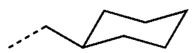 | H | Ph |
| 1032. | $CH_2C(CH_3)_3$ | H | $CH_2CH_3$ | H | Ph |
| 1033. | $CH_2C(CH_3)_3$ | H | $CH(CH_3)_2$ | H | Ph |
| 1034. | $CH_2C(CH_3)_3$ | H | $CH_2CH(CH_3)_2$ | H | Ph |
| 1035. | $CH_2C(CH_3)_3$ | H | $C(CH_3)_3$ | H | Ph |
| 1036. | $CH_2C(CH_3)_3$ | H | $CH_2C(CH_3)_3$ | H | Ph |
| 1037. | $CH_2C(CH_3)_3$ | H | 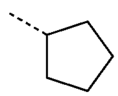 | H | Ph |
| 1038. | $CH_2C(CH_3)_3$ | H | 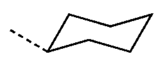 | H | Ph |
| 1039. | $CH_2C(CH_3)_3$ | H | 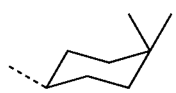 | H | Ph |
| 1040. | $CH_2C(CH_3)_3$ | H | 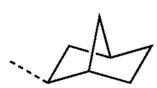 | H | Ph |
| 1041. | $CH_2C(CH_3)_3$ | H | 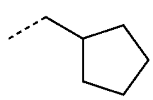 | H | Ph |
| 1042. | $CH_2C(CH_3)_3$ | H | 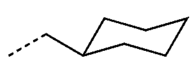 | H | Ph |
| 1043. | 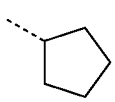 | H | $CH_2CH_3$ | H | Ph |
| 1044. | 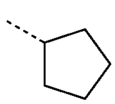 | H | $CH(CH_3)_2$ | H | Ph |
| 1045. | 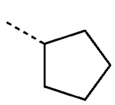 | H | $CH_2CH(CH_3)_2$ | H | Ph |

-continued
| i in Li | $R^{B1}$ | $R^{B2}$ | $R^{B3}$ | $R^{B4}$ | $R^{B5}$ |
|---|---|---|---|---|---|
| 1046. | 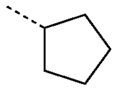 | H | $C(CH_3)_3$ | H | Ph |
| 1047. | 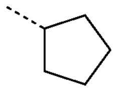 | H | $CH_2C(CH_3)_3$ | H | Ph |
| 1048. | 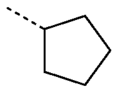 | H | 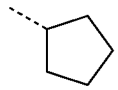 | H | Ph |
| 1049. | 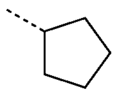 | H | 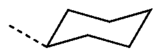 | H | Ph |
| 1050. | 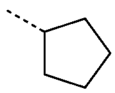 | H | 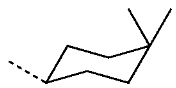 | H | Ph |
| 1051. | 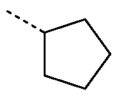 | H | 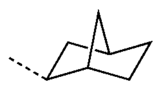 | H | Ph |
| 1052. | 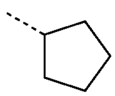 | H | 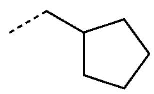 | H | Ph |
| 1053. | 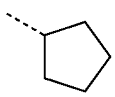 | H | 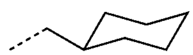 | H | Ph |
| 1054. | 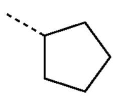 | H | $CH_2CH_3$ | H | Ph |
| 1055. | 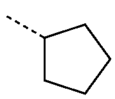 | H | $CH(CH_3)_2$ | H | Ph |
| 1056. | 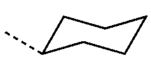 | H | $CH_2CH(CH_3)_2$ | H | Ph |
| 1057. | 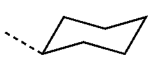 | H | $C(CH_3)_3$ | H | Ph |
| 1058. | 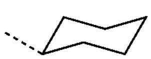 | H | $CH_2C(CH_3)_3$ | H | Ph |
| 1059. | 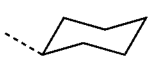 | H | 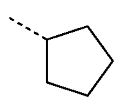 | H | Ph |
| 1060. | 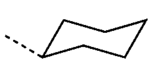 | H | 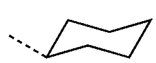 | H | Ph |
| 1061. | 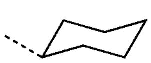 | H | 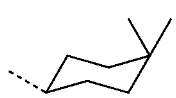 | H | Ph |
| 1062. | 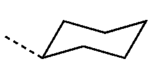 | H | 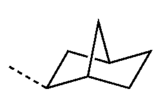 | H | Ph |

-continued
| i in Li | $R^{B1}$ | $R^{B2}$ | $R^{B3}$ | $R^{B4}$ | $R^{B5}$ |
|---|---|---|---|---|---|
| 1063. | 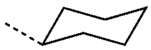 | H | 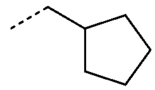 | H | Ph |
| 1064. | 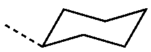 | H | 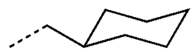 | H | Ph |
| 1065. | 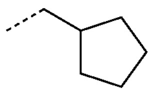 | H | $CH_2CH(CH_3)_2$ | H | Ph |
| 1066. | 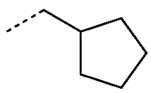 | H | $C(CH_3)_3$ | H | Ph |
| 1067. | 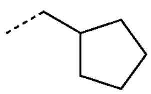 | H | $CH_2C(CH_3)_3$ | H | Ph |
| 1068. | 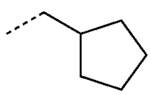 | H | 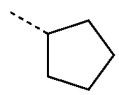 | H | Ph |
| 1069. | 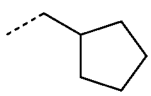 | H | 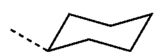 | H | Ph |
| 1070. | 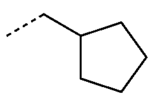 | H | 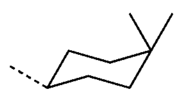 | H | Ph |
| 1071. | 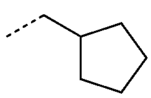 | H | 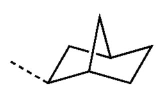 | H | Ph |
| 1072. | 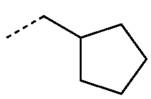 | H | 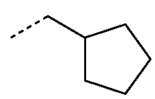 | H | Ph |
| 1073. | 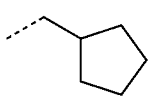 | H | 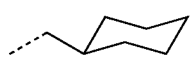 | H | Ph |
| 1074. | 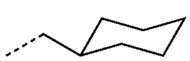 | H | $CH_2CH(CH_3)_2$ | H | Ph |
| 1075. | 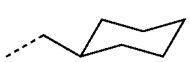 | H | $C(CH_3)_3$ | H | Ph |
| 1076. | 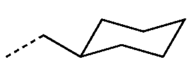 | H | $CH_2C(CH_3)_3$ | H | Ph |
| 1077. | 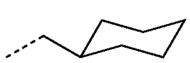 | H | 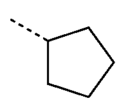 | H | Ph |
| 1078. | 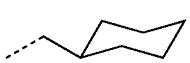 | H | 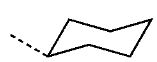 | H | Ph |
| 1079. | 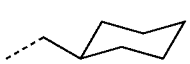 | H | 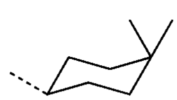 | H | Ph |

-continued

| i in Li | $R^{B1}$ | $R^{B2}$ | $R^{B3}$ | $R^{B4}$ | RB5 |
|---|---|---|---|---|---|
| 1080. |  | H | 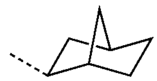 | H | Ph |
| 1081. | 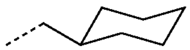 | H | 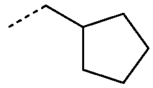 | H | Ph |
| 1082. | 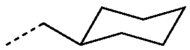 | H | 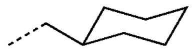 | H | Ph |
| 1083. | 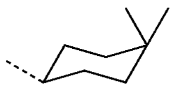 | H | $CH_2CH(CH_3)_2$ | H | Ph |
| 1084. | 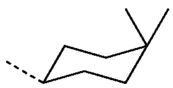 | H | $C(CH_3)_3$ | H | Ph |
| 1085. | 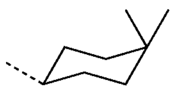 | H | $CH_2C(CH_3)_3$ | H | Ph |
| 1086. | 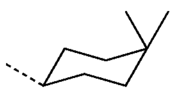 | H | 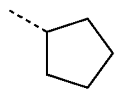 | H | Ph |
| 1087. | 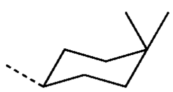 | H | 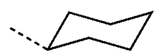 | H | Ph |
| 1088. | 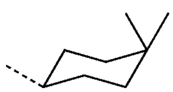 | H | 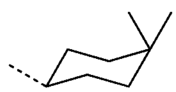 | H | Ph |
| 1089. | 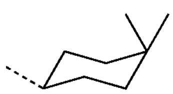 | H | 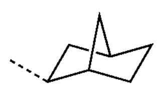 | H | Ph |
| 1090. | 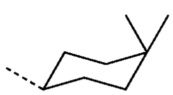 | H | 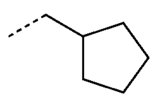 | H | Ph |
| 1091. | 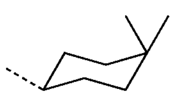 | H | 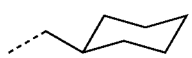 | H | Ph |
| 1092. | H | H | H | H | Ph |
| 1093. | $CD_3$ | H | H | H | Ph |
| 1094. | H | $CD_3$ | H | H | Ph |
| 1095. | H | H | $CD_3$ | H | Ph |
| 1096. | $CD_3$ | $CD_3$ | H | $CD_3$ | Ph |
| 1097. | $CD_3$ | H | $CD_3$ | H | Ph |
| 1098. | $CD_3$ | H | H | $CD_3$ | Ph |
| 1099. | H | $CD_3$ | $CD_3$ | H | Ph |
| 1100. | H | $CD_3$ | H | $CD_3$ | Ph |
| 1101. | H | H | $CD_3$ | $CD_3$ | Ph |
| 1102. | $CD_3$ | $CD_3$ | $CD_3$ | H | Ph |
| 1103. | $CD_3$ | $CD_3$ | H | $CD_3$ | Ph |
| 1104. | $CD_3$ | H | $CD_3$ | $CD_3$ | Ph |
| 1105. | H | $CD_3$ | $CD_3$ | $CD_3$ | Ph |
| 1106. | $CD_3$ | $CD_3$ | $CD_3$ | $CD_3$ | Ph |
| 1107. | $CD_2CH_3$ | H | H | H | Ph |
| 1108. | $CD_2CH_3$ | $CD_3$ | H | $CD_3$ | Ph |
| 1109. | $CD_2CH_3$ | H | $CD_3$ | H | Ph |
| 1110. | $CD_2CH_3$ | H | H | $CD_3$ | Ph |
| 1111. | $CD_2CH_3$ | $CD_3$ | $CD_3$ | H | Ph |

-continued

| i in Li | $R^{B1}$ | $R^{B2}$ | $R^{B3}$ | $R^{B4}$ | $R^{B5}$ |
|---|---|---|---|---|---|
| 1112. | $CD_2CH_3$ | $CD_3$ | H | $CD_3$ | Ph |
| 1113. | $CD_2CH_3$ | H | $CD_3$ | $CD_3$ | Ph |
| 1114. | $CD_2CH_3$ | $CD_3$ | $CD_3$ | $CD_3$ | Ph |
| 1115. | H | $CD_2CH_3$ | H | H | Ph |
| 1116. | $CH_3$ | $CD_2CH_3$ | H | $CD_3$ | Ph |
| 1117. | H | $CD_2CH_3$ | $CD_3$ | H | Ph |
| 1118. | H | $CD_2CH_3$ | H | $CD_3$ | Ph |
| 1119. | $CD_3$ | $CD_2CH_3$ | $CD_3$ | H | Ph |
| 1120. | $CD_3$ | $CD_2CH_3$ | H | $CD_3$ | Ph |
| 1121. | H | $CD_2CH_3$ | $CD_3$ | $CD_3$ | Ph |
| 1122. | $CD_3$ | $CD_2CH_3$ | $CD_3$ | $CD_3$ | Ph |
| 1123. | H | H | $CD_2CH_3$ | H | Ph |
| 1124. | $CD_3$ | H | $CD_2CH_3$ | H | Ph |
| 1125. | H | $CD_3$ | $CD_2CH_3$ | H | Ph |
| 1126. | H | H | $CD_2CH_3$ | $CD_3$ | Ph |
| 1127. | $CD_3$ | $CD_3$ | $CD_2CH_3$ | H | Ph |
| 1128. | $CD_3$ | H | $CD_2CH_3$ | $CD_3$ | Ph |
| 1129. | H | $CD_3$ | $CD_2CH_3$ | $CD_3$ | Ph |
| 1130. | $CD_3$ | $CD_3$ | $CD_2CH_3$ | $CD_3$ | Ph |
| 1131. | $CD(CH_3)_2$ | H | H | H | Ph |
| 1132. | $CD(CH_3)_2$ | $CD_3$ | H | $CD_3$ | Ph |
| 1133. | $CD(CH_3)_2$ | H | $CD_3$ | H | Ph |
| 1134. | $CD(CH_3)_2$ | H | H | $CD_3$ | Ph |
| 1135. | $CD(CH_3)_2$ | $CD_3$ | $CD_3$ | H | Ph |
| 1136. | $CD(CH_3)_2$ | $CD_3$ | H | $CD_3$ | Ph |
| 1137. | $CD(CH_3)_2$ | H | $CD_3$ | $CD_3$ | Ph |
| 1138. | $CD(CH_3)_2$ | $CD_3$ | $CD_3$ | $CD_3$ | Ph |
| 1139. | H | $CD(CH_3)_2$ | H | H | Ph |
| 1140. | $CD_3$ | $CD(CH_3)_2$ | H | $CD_3$ | Ph |
| 1141. | H | $CD(CH_3)_2$ | $CD_3$ | H | Ph |
| 1142. | H | $CD(CH_3)_2$ | H | $CD_3$ | Ph |
| 1143. | $CD_3$ | $CD(CH_3)_2$ | $CD_3$ | H | Ph |
| 1144. | $CD_3$ | $CD(CH_3)_2$ | H | $CD_3$ | Ph |
| 1145. | H | $CD(CH_3)_2$ | $CD_3$ | $CD_3$ | Ph |
| 1146. | $CD_3$ | $CD(CH_3)_2$ | $CD_3$ | $CD_3$ | Ph |
| 1147. | H | H | $CD(CH_3)_2$ | H | Ph |
| 1148. | $CD_3$ | H | $CD(CH_3)_2$ | H | Ph |
| 1149. | H | $CD_3$ | $CD(CH_3)_2$ | H | Ph |
| 1150. | H | H | $CD(CH_3)_2$ | $CD_3$ | Ph |
| 1151. | $CD_3$ | $CD_3$ | $CD(CH_3)_2$ | H | Ph |
| 1152. | $CD_3$ | H | $CD(CH_3)_2$ | $CD_3$ | Ph |
| 1153. | H | $CD_3$ | $CD(CH_3)_2$ | $CD_3$ | Ph |
| 1154. | $CD_3$ | $CD_3$ | $CD(CH_3)_2$ | $CD_3$ | Ph |
| 1155. | $CD(CD_3)_2$ | H | H | H | Ph |
| 1156. | $CD(CD_3)_2$ | $CD_3$ | H | $CD_3$ | Ph |
| 1157. | $CD(CD_3)_2$ | H | $CD_3$ | H | Ph |
| 1158. | $CD(CD_3)_2$ | H | H | $CD_3$ | Ph |
| 1159. | $CD(CD_3)_2$ | $CD_3$ | $CD_3$ | H | Ph |
| 1160. | $CD(CD_3)_2$ | $CD_3$ | H | $CD_3$ | Ph |
| 1161. | $CD(CD_3)_2$ | H | $CD_3$ | $CD_3$ | Ph |
| 1162. | $CD(CD_3)_2$ | $CD_3$ | $CD_3$ | $CD_3$ | Ph |
| 1163. | H | $CD(CD_3)_2$ | H | H | Ph |
| 1164. | $CH_3$ | $CD(CD_3)_2$ | H | $CD_3$ | Ph |
| 1165. | H | $CD(CD_3)_2$ | $CD_3$ | H | Ph |
| 1166. | H | $CD(CD_3)_2$ | H | $CD_3$ | Ph |
| 1167. | $CD_3$ | $CD(CD_3)_2$ | $CD_3$ | H | Ph |
| 1168. | $CD_3$ | $CD(CD_3)_2$ | H | $CD_3$ | Ph |
| 1169. | H | $CD(CD_3)_2$ | $CD_3$ | $CD_3$ | Ph |
| 1170. | $CD_3$ | $CD(CD_3)_2$ | $CD_3$ | $CD_3$ | Ph |
| 1171. | H | H | $CD(CD_3)_2$ | H | Ph |
| 1172. | $CD_3$ | H | $CD(CD_3)_2$ | H | Ph |
| 1173. | H | $CD_3$ | $CD(CD_3)_2$ | H | Ph |
| 1174. | H | H | $CD(CD_3)_2$ | $CD_3$ | Ph |
| 1175. | $CD_3$ | $CD_3$ | $CD(CD_3)_2$ | H | Ph |
| 1176. | $CD_3$ | H | $CD(CD_3)_2$ | $CD_3$ | Ph |
| 1177. | H | $CD_3$ | $CD(CD_3)_2$ | $CD_3$ | Ph |
| 1178. | $CD_3$ | $CD_3$ | $CD(CD_3)_2$ | $CD_3$ | Ph |
| 1179. | $CD_2CH(CH_3)_2$ | H | H | H | Ph |
| 1180. | $CD_2CH(CH_3)_2$ | $CD_3$ | H | $CD_3$ | Ph |
| 1181. | $CD_2CH(CH_3)_2$ | H | $CD_3$ | H | Ph |
| 1182. | $CD_2CH(CH_3)_2$ | H | H | $CD_3$ | Ph |
| 1183. | $CD_2CH(CH_3)_2$ | $CD_3$ | $CD_3$ | H | Ph |
| 1184. | $CD_2CH(CH_3)_2$ | $CD_3$ | H | $CD_3$ | Ph |
| 1185. | $CD_2CH(CH_3)_2$ | H | $CD_3$ | $CD_3$ | Ph |
| 1186. | $CD_2CH(CH_3)_2$ | $CD_3$ | $CD_3$ | $CD_3$ | Ph |
| 1187. | H | $CD_2CH(CH_3)_2$ | H | H | Ph |
| 1188. | $CD_3$ | $CD_2CH(CH_3)_2$ | H | $CD_3$ | Ph |

-continued

| i in Li | $R^{B1}$ | $R^{B2}$ | $R^{B3}$ | $R^{B4}$ | *RB5* |
|---|---|---|---|---|---|
| 1189. | H | $CD_2CH(CH_3)_2$ | $CD_3$ | H | Ph |
| 1190. | H | $CD_2CH(CH_3)_2$ | H | $CD_3$ | Ph |
| 1191. | $CD_3$ | $CD_2CH(CH_3)_2$ | $CD_3$ | H | Ph |
| 1192. | $CD_3$ | $CD_2CH(CH_3)_2$ | H | $CD_3$ | Ph |
| 1193. | H | $CD_2CH(CH_3)_2$ | $CD_3$ | $CD_3$ | Ph |
| 1194. | $CD_3$ | $CD_2CH(CH_3)_2$ | $CD_3$ | $CD_3$ | Ph |
| 1195. | H | H | $CD_2CH(CH_3)_2$ | H | Ph |
| 1196. | $CD_3$ | H | $CD_2CH(CH_3)_2$ | H | Ph |
| 1197. | H | $CD_3$ | $CD_2CH(CH_3)_2$ | H | Ph |
| 1198. | H | H | $CD_2CH(CH_3)_2$ | $CD_3$ | Ph |
| 1199. | $CD_3$ | $CD_3$ | $CD_2CH(CH_3)_2$ | H | Ph |
| 1200. | $CD_3$ | H | $CD_2CH(CH_3)_2$ | $CD_3$ | Ph |
| 1201. | H | $CD_3$ | $CD_2CH(CH_3)_2$ | $CD_3$ | Ph |
| 1202. | $CD_3$ | $CD_3$ | $CD_2CH(CH_3)_2$ | $CD_3$ | Ph |
| 1203. | $CD_2C(CH_3)_3$ | H | H | H | Ph |
| 1204. | $CD_2C(CH_3)_3$ | $CD_3$ | H | $CD_3$ | Ph |
| 1205. | $CD_2C(CH_3)_3$ | H | $CD_3$ | H | Ph |
| 1206. | $CD_2C(CH_3)_3$ | H | H | $CD_3$ | Ph |
| 1207. | $CD_2C(CH_3)_3$ | $CD_3$ | $CD_3$ | H | Ph |
| 1208. | $CD_2C(CH_3)_3$ | $CD_3$ | H | $CD_3$ | Ph |
| 1209. | $CD_2C(CH_3)_3$ | H | $CD_3$ | $CD_3$ | Ph |
| 1210. | $CD_2C(CH_3)_3$ | $CH_3$ | $CD_3$ | $CD_3$ | Ph |
| 1211. | H | $CD_2C(CH_3)_3$ | H | H | Ph |
| 1212. | $CD_3$ | $CD_2C(CH_3)_3$ | H | $CD_3$ | Ph |
| 1213. | H | $CD_2C(CH_3)_3$ | $CD_3$ | H | Ph |
| 1214. | H | $CD_2C(CH_3)_3$ | H | $CD_3$ | Ph |
| 1215. | $CD_3$ | $CD_2C(CH_3)_3$ | $CD_3$ | H | Ph |
| 1216. | $CD_3$ | $CD_2C(CH_3)_3$ | H | $CD_3$ | Ph |
| 1217. | H | $CD_2C(CH_3)_3$ | $CD_3$ | $CD_3$ | Ph |
| 1218. | $CD_3$ | $CD_2C(CH_3)_3$ | $CD_3$ | $CD_3$ | Ph |
| 1219. | H | H | $CD_2C(CH_3)_3$ | H | Ph |
| 1220. | $CD_3$ | H | $CD_2C(CH_3)_3$ | H | Ph |
| 1221. | H | $CD_3$ | $CD_2C(CH_3)_3$ | H | Ph |
| 1222. | H | H | $CD_2C(CH_3)_3$ | $CD_3$ | Ph |
| 1223. | $CD_3$ | $CD_3$ | $CD_2C(CH_3)_3$ | H | Ph |
| 1224. | $CD_3$ | H | $CD_2C(CH_3)_3$ | $CD_3$ | Ph |
| 1225. | H | $CD_3$ | $CD_2C(CH_3)_3$ | $CD_3$ | Ph |
| 1226. | $CD_3$ | $CD_3$ | $CD_2C(CH_3)_3$ | $CD_3$ | Ph |
| 1227. | 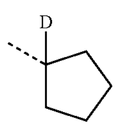 | H | H | H | Ph |
| 1228. | 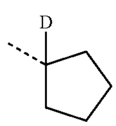 | $CD_3$ | H | $CD_3$ | Ph |
| 1229. | 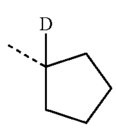 | H | $CD_3$ | H | Ph |
| 1230. | 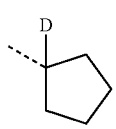 | H | H | $CD_3$ | Ph |
| 1231. | 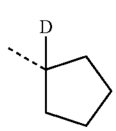 | $CD_3$ | $CD_3$ | H | Ph |
| 1232. | 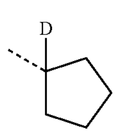 | $CD_3$ | H | $CD_3$ | Ph |

-continued
| i in Li | $R^{B1}$ | $R^{B2}$ | $R^{B3}$ | $R^{B4}$ | RB5 |
|---|---|---|---|---|---|
| 1233. | 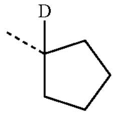 | H | $CD_3$ | $CD_3$ | Ph |
| 1234. | 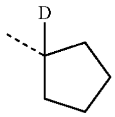 | $CD_3$ | $CD_3$ | $CD_3$ | Ph |
| 1235. | H | 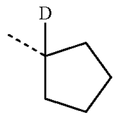 | H | H | Ph |
| 1236. | $CD_3$ | 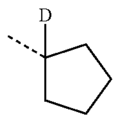 | H | $CD_3$ | Ph |
| 1237. | H | 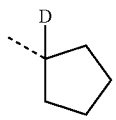 | $CD_3$ | H | Ph |
| 1238. | H | 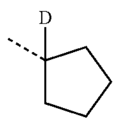 | H | $CD_3$ | Ph |
| 1239. | $CD_3$ | 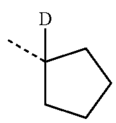 | $CD_3$ | H | Ph |
| 1240. | $CD_3$ | 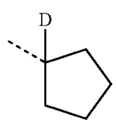 | H | $CD_3$ | Ph |
| 1241. | H | 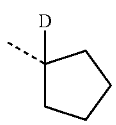 | $CD_3$ | $CD_3$ | Ph |
| 1242. | $CD_3$ | 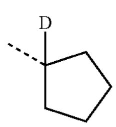 | $CD_3$ | $CD_3$ | Ph |
| 1243. | H | H | 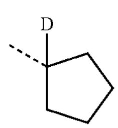 | H | Ph |
| 1244. | $CD_3$ | H | 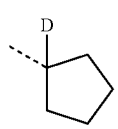 | H | Ph |

-continued
| i in Li | $R^{B1}$ | $R^{B2}$ | $R^{B3}$ | $R^{B4}$ | $R^{B5}$ |
|---|---|---|---|---|---|
| 1245. | H | $CD_3$ | 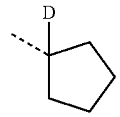 | H | Ph |
| 1246. | H | H | 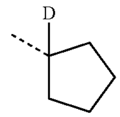 | $CD_3$ | Ph |
| 1247. | CD3 | $CD_3$ | 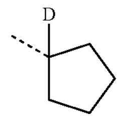 | H | Ph |
| 1248. | CD3 | H | 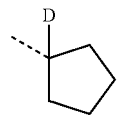 | $CD_3$ | Ph |
| 1249. | H | $CD_3$ | 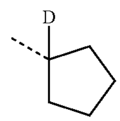 | $CD_3$ | Ph |
| 1250. | $CD_3$ | $CD_3$ | 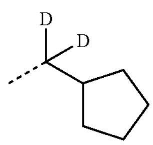 | $CD_3$ | Ph |
| 1251. | 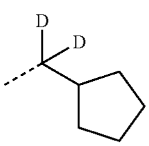 | H | H | H | Ph |
| 1252. | 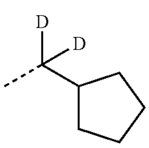 | $CD_3$ | H | $CD_3$ | Ph |
| 1253. | 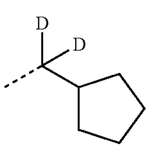 | H | $CD_3$ | H | Ph |
| 1254. | 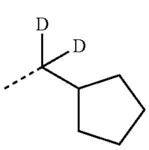 | H | H | $CD_3$ | Ph |
| 1255. | 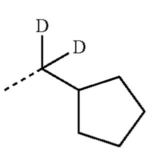 | $CD_3$ | $CD_3$ | H | Ph |

-continued
| i in Li | $R^{B1}$ | $R^{B2}$ | $R^{B3}$ | $R^{B4}$ | RB5 |
|---|---|---|---|---|---|
| 1256. | 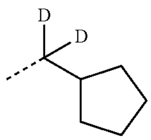 | $CD_3$ | H | $CD_3$ | Ph |
| 1257. | 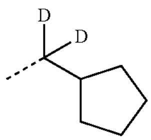 | H | $CD_3$ | $CD_3$ | Ph |
| 1258. | 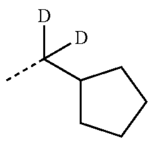 | $CD_3$ | $CD_3$ | $CD_3$ | Ph |
| 1259. | H | 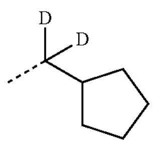 | H | H | Ph |
| 1260. | $CH_3$ | 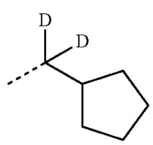 | H | $CD_3$ | Ph |
| 1261. | H | 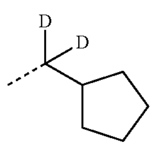 | $CD_3$ | H | Ph |
| 1262. | H | 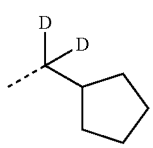 | H | $CD_3$ | Ph |
| 1263. | $CD_3$ | 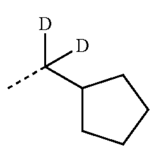 | $CD_3$ | H | Ph |
| 1264. | $CD_3$ | 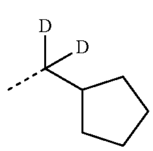 | H | $CD_3$ | Ph |
| 1265. | H | 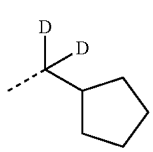 | $CD_3$ | $CD_3$ | Ph |

-continued
| i in Li | $R^{B1}$ | $R^{B2}$ | $R^{B3}$ | $R^{B4}$ | RB5 |
|---|---|---|---|---|---|
| 1266. | $CH_3$ | 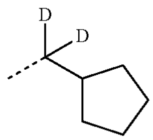 | $CD_3$ | $CD_3$ | Ph |
| 1267. | H | H | 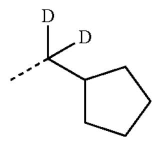 | H | Ph |
| 1268. | $CD_3$ | H | 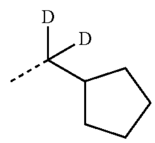 | H | Ph |
| 1269. | H | $CD_3$ | 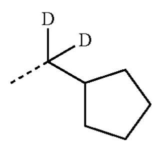 | H | Ph |
| 1270. | H | H | 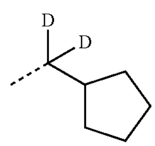 | $CD_3$ | Ph |
| 1271. | $CD_3$ | $CD_3$ | 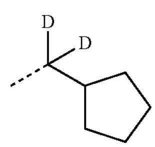 | H | Ph |
| 1272. | $CD_3$ | H | 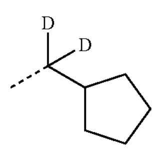 | $CD_3$ | Ph |
| 1273. | H | $CD_3$ | 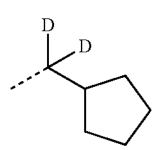 | $CD_3$ | Ph |
| 1274. | $CD_3$ | $CD_3$ | 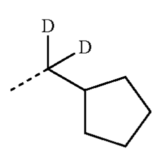 | $CD_3$ | Ph |
| 1275. | 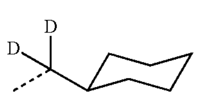 | H | H | H | Ph |
| 1276. | 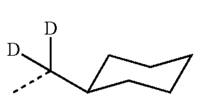 | $CD_3$ | H | $CD_3$ | Ph |

-continued
| i in Li | $R^{B1}$ | $R^{B2}$ | $R^{B3}$ | $R^{B4}$ | $R^{B5}$ |
|---|---|---|---|---|---|
| 1277. | 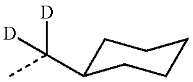 | H | $CD_3$ | H | Ph |
| 1278. | 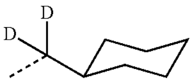 | H | H | $CD_3$ | Ph |
| 1279. | 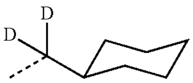 | $CD_3$ | $CD_3$ | H | Ph |
| 1280. | 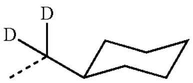 | $CD_3$ | H | $CD_3$ | Ph |
| 1281. | 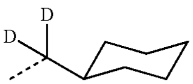 | H | $CD_3$ | $CD_3$ | Ph |
| 1282. | 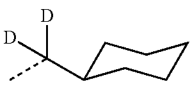 | $CD_3$ | $CD_3$ | $CD_3$ | Ph |
| 1283. | H | 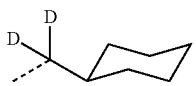 | H | H | Ph |
| 1284. | $CD_3$ | 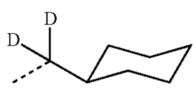 | H | $CD_3$ | Ph |
| 1285. | H | 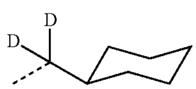 | $CD_3$ | H | Ph |
| 1286. | H | 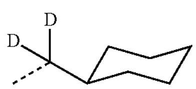 | H | $CD_3$ | Ph |
| 1287. | $CD_3$ | 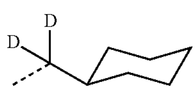 | $CD_3$ | H | Ph |
| 1288. | $CD_3$ | 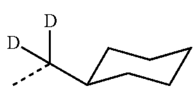 | H | $CD_3$ | Ph |
| 1289. | H | 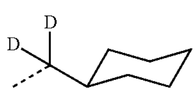 | $CD_3$ | $CD_3$ | Ph |
| 1290. | $CD_3$ | 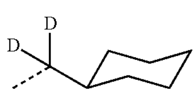 | $CD_3$ | $CD_3$ | Ph |
| 1291. | H | H | 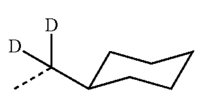 | H | Ph |
| 1292. | $CD_3$ | H | 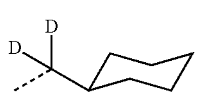 | H | Ph |

-continued
| i in Li | $R^{B1}$ | $R^{B2}$ | $R^{B3}$ | $R^{B4}$ | RB5 |
|---|---|---|---|---|---|
| 1293. | H | $CD_3$ | 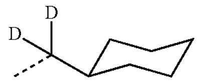 | H | Ph |
| 1294. | H | H | 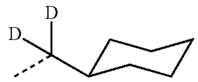 | $CD_3$ | Ph |
| 1295. | $CD_3$ | $CD_3$ | 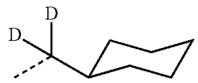 | H | Ph |
| 1296. | $CD_3$ | H | 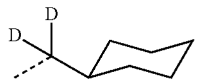 | $CD_3$ | Ph |
| 1297. | H | $CD_3$ | 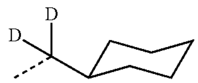 | $CD_3$ | Ph |
| 1298. | $CD_3$ | $CD_3$ | 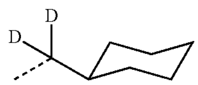 | $CD_3$ | Ph |
| 1299. | 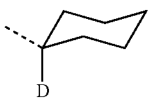 | H | H | H | Ph |
| 1300. | 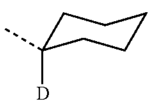 | $CD_3$ | H | $CD_3$ | Ph |
| 1301. | 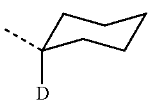 | H | $CD_3$ | H | Ph |
| 1302. | 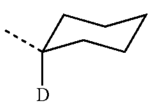 | H | H | $CD_3$ | Ph |
| 1303. | 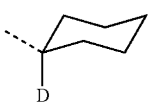 | $CD_3$ | $CD_3$ | H | Ph |
| 1304. | 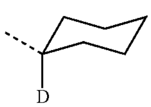 | $CD_3$ | H | $CD_3$ | Ph |
| 1305. | 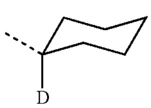 | H | $CD_3$ | $CD_3$ | Ph |
| 1306. | 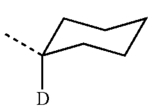 | $CD_3$ | $CD_3$ | $CD_3$ | Ph |
| 1307. | H | 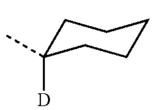 | H | H | Ph |

-continued
| i in Li | $R^{B1}$ | $R^{B2}$ | $R^{B3}$ | $R^{B4}$ | RB5 |
|---|---|---|---|---|---|
| 1308. | $CD_3$ | 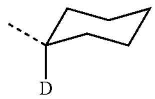 | H | $CD_3$ | Ph |
| 1309. | H | 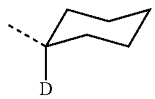 | $CD_3$ | H | Ph |
| 1310. | H | 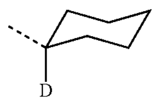 | H | $CD_3$ | Ph |
| 1311. | $CD_3$ | 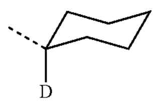 | $CD_3$ | H | Ph |
| 1312. | $CD_3$ | 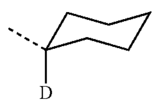 | H | $CD_3$ | Ph |
| 1313. | H | 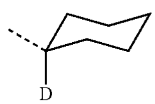 | $CD_3$ | $CD_3$ | Ph |
| 1314. | $CD_3$ | 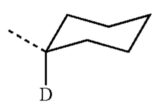 | $CD_3$ | $CD_3$ | Ph |
| 1315. | H | H | 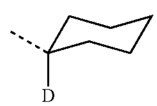 | H | Ph |
| 1316. | $CD_3$ | H | 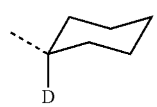 | H | Ph |
| 1317. | H | $CD_3$ | 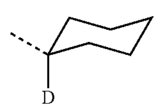 | H | Ph |
| 1318. | H | H | 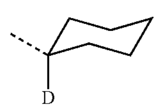 | $CD_3$ | Ph |
| 1319. | $CD_3$ | $CD_3$ | 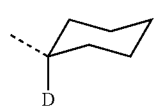 | H | Ph |
| 1320. | $CD_3$ | H | 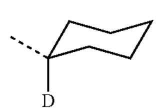 | $CD_3$ | Ph |
| 1321. | H | $CD_3$ | 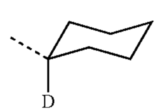 | $CD_3$ | Ph |

-continued
| i in Li | $R^{B1}$ | $R^{B2}$ | $R^{B3}$ | $R^{B4}$ | $R^{B5}$ |
|---|---|---|---|---|---|
| 1322. | $CD_3$ | $CD_3$ | 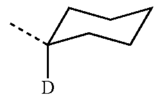 | $CD_3$ | Ph |
| 1323. | 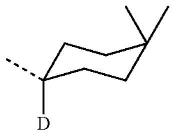 | H | H | H | Ph |
| 1324. | 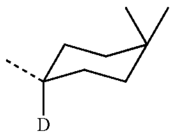 | $CD_3$ | H | $CD_3$ | Ph |
| 1325. | 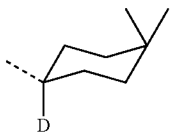 | H | $CD_3$ | H | Ph |
| 1326. | 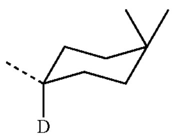 | H | H | $CD_3$ | Ph |
| 1327. | 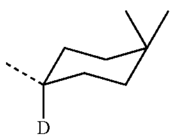 | $CD_3$ | $CD_3$ | H | Ph |
| 1328. | 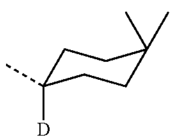 | $CD_3$ | H | $CD_3$ | Ph |
| 1329. | 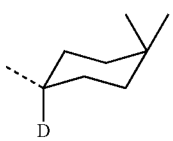 | H | $CD_3$ | $CD_3$ | Ph |
| 1330. | 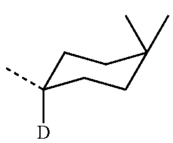 | $CD_3$ | $CD_3$ | $CD_3$ | Ph |
| 1331. | H | 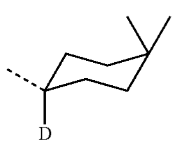 | H | H | Ph |
| 1332. | $CD_3$ | 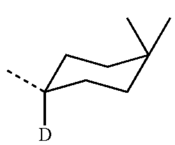 | H | $CD_3$ | Ph |

-continued
| i in Li | $R^{B1}$ | $R^{B2}$ | $R^{B3}$ | $R^{B4}$ | $R^{B5}$ |
|---|---|---|---|---|---|
| 1333. | H | 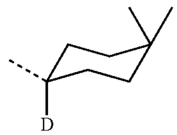 | $CD_3$ | H | Ph |
| 1334. | H | 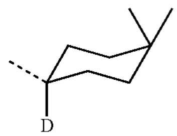 | H | $CD_3$ | Ph |
| 1335. | $CD_3$ | 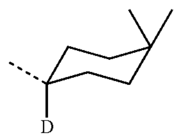 | $CD_3$ | H | Ph |
| 1336. | $CD_3$ | 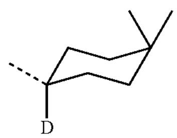 | H | $CD_3$ | Ph |
| 1337. | H | 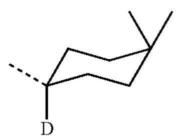 | $CD_3$ | $CD_3$ | Ph |
| 1338. | $CD_3$ | 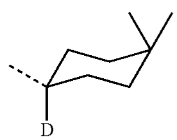 | $CD_3$ | $CD_3$ | Ph |
| 1339. | H | H | 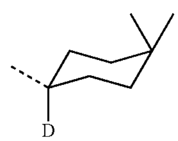 | H | Ph |
| 1340. | $CD_3$ | H | 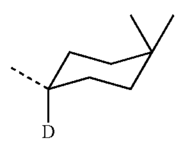 | H | Ph |
| 1341. | H | $CD_3$ | 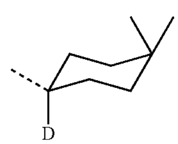 | H | Ph |
| 1342. | H | H | 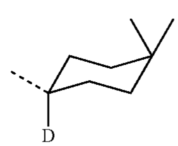 | $CD_3$ | Ph |
| 1343. | $CD_3$ | $CD_3$ | 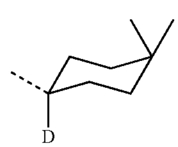 | H | Ph |

-continued
| i in Li | $R^{B1}$ | $R^{B2}$ | $R^{B3}$ | $R^{B4}$ | RB5 |
|---|---|---|---|---|---|
| 1344. | $CD_3$ | H | 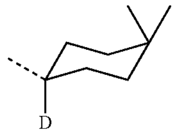 | $CD_3$ | Ph |
| 1345. | H | $CD_3$ | 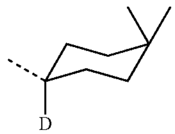 | $CD_3$ | Ph |
| 1346. | $CD_3$ | $CD_3$ | 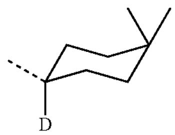 | $CD_3$ | Ph |
| 1347. | 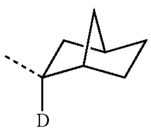 | H | H | H | Ph |
| 1348. | 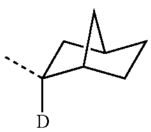 | $CD_3$ | H | $CD_3$ | Ph |
| 1349. | 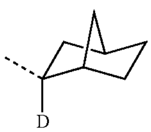 | H | $CD_3$ | H | Ph |
| 1350. | 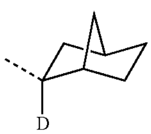 | H | H | $CD_3$ | Ph |
| 1351. | 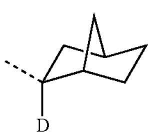 | $CH_3$ | $CH_3$ | H | Ph |
| 1352. | 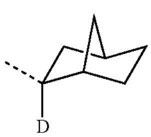 | $CD_3$ | H | $CD_3$ | Ph |
| 1353. | 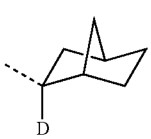 | H | $CD_3$ | $CD_3$ | Ph |
| 1354. | 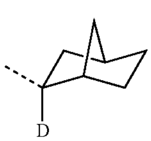 | $CD_3$ | $CD_3$ | $CD_3$ | Ph |

-continued
| i in Li | $R^{B1}$ | $R^{B2}$ | $R^{B3}$ | $R^{B4}$ | $R^{B5}$ |
|---|---|---|---|---|---|
| 1355. | H | 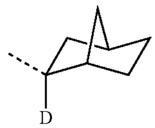 | H | H | Ph |
| 1356. | $CD_3$ | 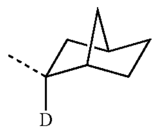 | H | $CD_3$ | Ph |
| 1357. | H | 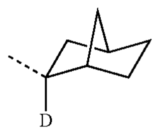 | $CD_3$ | H | Ph |
| 1358. | H | 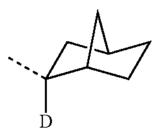 | H | $CD_3$ | Ph |
| 1359. | $CD_3$ | 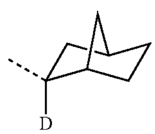 | $CD_3$ | H | Ph |
| 1360. | $CD_3$ | 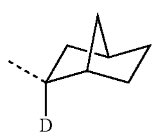 | H | $CD_3$ | Ph |
| 1361. | H | 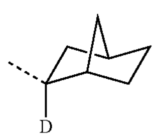 | $CD_3$ | $CD_3$ | Ph |
| 1362. | $CD_3$ | 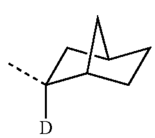 | $CD_3$ | $CD_3$ | Ph |
| 1363. | H | H | 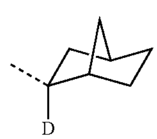 | H | Ph |
| 1364. | $CD_3$ | H | 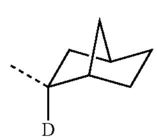 | H | Ph |
| 1365. | H | $CD_3$ | 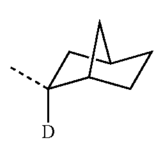 | H | Ph |

-continued
| i in Li | $R^{B1}$ | $R^{B2}$ | $R^{B3}$ | $R^{B4}$ | RB5 |
|---|---|---|---|---|---|
| 1366. | H | H | 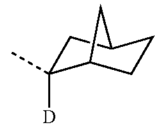 | $CH_3$ | Ph |
| 1367. | $CD_3$ | $CD_3$ | 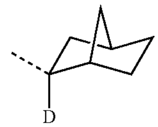 | H | Ph |
| 1368. | $CD_3$ | H | 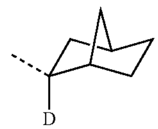 | $CD_3$ | Ph |
| 1369. | H | $CD_3$ | 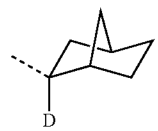 | $CD_3$ | Ph |
| 1370. | $CD_3$ | $CD_3$ | 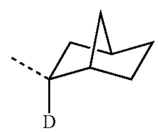 | $CD_3$ | Ph |
| 1371. | $CD(CH_3)_2$ | H | $CD_2CH_3$ | H | Ph |
| 1372. | $CD(CH_3)_2$ | H | $CD(CH_3)_2$ | H | Ph |
| 1373. | $CD(CH_3)_2$ | H | $CD_2CH(CH_3)_2$ | H | Ph |
| 1374. | $CD(CH_3)_2$ | H | $C(CH_3)_3$ | H | Ph |
| 1375. | $CD(CH_3)_2$ | H | $CD_2C(CH_3)_3$ | H | Ph |
| 1376. | $CD(CH_3)_2$ | H | 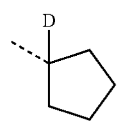 | H | Ph |
| 1377. | $CD(CH_3)_2$ | H | 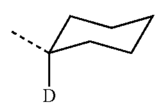 | H | Ph |
| 1378. | $CD(CH_3)_2$ | H | 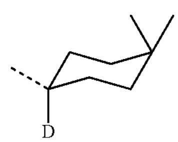 | H | Ph |
| 1379. | $CD(CH_3)_2$ | H | 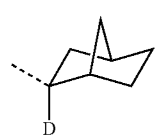 | H | Ph |
| 1380. | $CD(CH_3)_2$ | H | 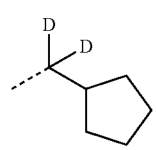 | H | Ph |
| 1381. | $CD(CH_3)_2$ | H | 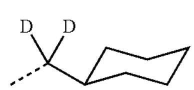 | H | Ph |

-continued
| i in Li | $R^{B1}$ | $R^{B2}$ | $R^{B3}$ | $R^{B4}$ | RB5 |
|---|---|---|---|---|---|
| 1382. | $C(CH_3)_3$ | H | $CD_2CH_3$ | H | Ph |
| 1383. | $C(CH_3)_3$ | H | $CD(CH_3)_2$ | H | Ph |
| 1384. | $C(CH_3)_3$ | H | $CD_2CH(CH_3)_2$ | H | Ph |
| 1385. | $C(CH_3)_3$ | H | $C(CH_3)_3$ | H | Ph |
| 1386. | $C(CH_3)_3$ | H | $CD_2C(CH_3)_3$ | H | Ph |
| 1387. | $C(CH_3)_3$ | H | 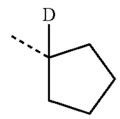 | H | Ph |
| 1388. | $C(CH_3)_3$ | H | 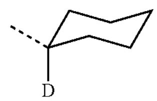 | H | Ph |
| 1389. | $C(CH_3)_3$ | H | 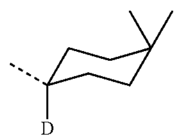 | Ph | |
| 1390. | $C(CH_3)_3$ | H | 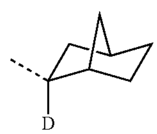 | H | Ph |
| 1391. | $C(CH_3)_3$ | H | 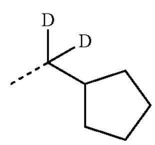 | H | Ph |
| 1392. | $C(CH_3)_3$ | H | 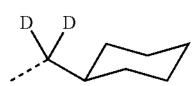 | H | Ph |
| 1393. | $CD_2C(CH_3)_3$ | H | $CD_2CH_3$ | H | Ph |
| 1394. | $CD_2C(CH_3)_3$ | H | $CD(CH_3)_2$ | H | Ph |
| 1395. | $CD_2C(CH_3)_3$ | H | $CD_2CH(CH_3)_2$ | H | Ph |
| 1396. | $CD_2C(CH_3)_3$ | H | $C(CH_3)_3$ | H | Ph |
| 1397. | $CD_2C(CH_3)_3$ | H | $CD_2C(CH_3)_3$ | H | Ph |
| 1398. | $CD_2C(CH_3)_3$ | H | 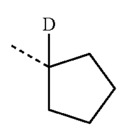 | H | Ph |
| 1399. | $CD_2C(CH_3)_3$ | H | 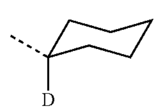 | H | Ph |
| 1400. | $CD_2C(CH_3)_3$ | H | 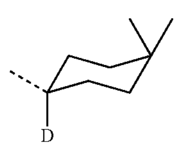 | H | Ph |
| 1401. | $CD_2C(CH_3)_3$ | H | 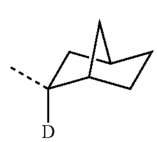 | H | Ph |

-continued
| i in Li | $R^{B1}$ | $R^{B2}$ | $R^{B3}$ | $R^{B4}$ | $R^{B5}$ |
| --- | --- | --- | --- | --- | --- |
| 1402. | $CD_2C(CH_3)_3$ | H | 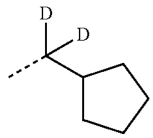 | H | Ph |
| 1403. | $CD_2C(CH_3)_3$ | H | 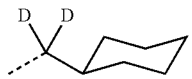 | H | Ph |
| 1404. | 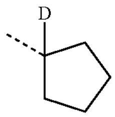 | H | $CD_2CH_3$ | H | Ph |
| 1405. | 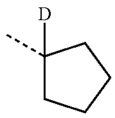 | H | $CD(CH_3)_2$ | H | Ph |
| 1406. | 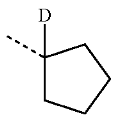 | H | $CD_2CH(CH_3)_2$ | H | Ph |
| 1407. | 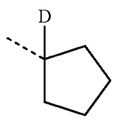 | H | $C(CH_3)_3$ | H | Ph |
| 1408. | 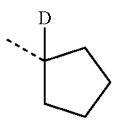 | H | $CD_2C(CH_3)_3$ | H | Ph |
| 1409. | 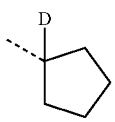 | H | 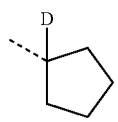 | H | Ph |
| 1410. | 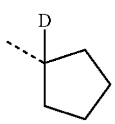 | H | 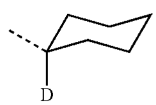 | H | Ph |
| 1411. | 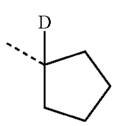 | H | 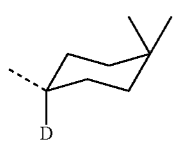 | H | Ph |
| 1412. | 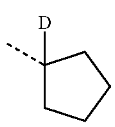 | H | 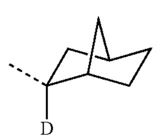 | H | Ph |
| 1413. | 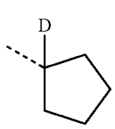 | H | 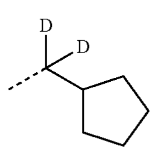 | H | Ph |

-continued
| i in Li | $R^{B1}$ | $R^{B2}$ | $R^{B3}$ | $R^{B4}$ | $R^{B5}$ |
|---|---|---|---|---|---|
| 1414. | 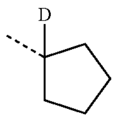 | H | 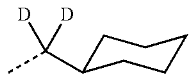 | H | Ph |
| 1415. | 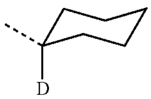 | H | $CD_2CH_3$ | H | Ph |
| 1416. | 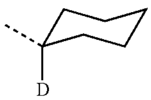 | H | $CD(CH_3)_2$ | H | Ph |
| 1417. | 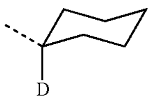 | H | $CD_2CH(CH_3)_2$ | H | Ph |
| 1418. | 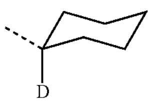 | H | $C(CH_3)_3$ | H | Ph |
| 1419. | 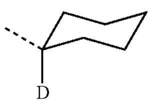 | H | $CD_2C(CH_3)_3$ | H | Ph |
| 1420. | 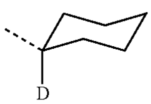 | H | 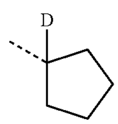 | H | Ph |
| 1421. | 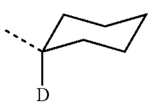 | H | 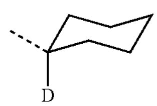 | H | Ph |
| 1422. | 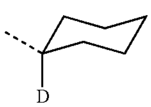 | H | 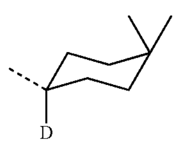 | H | Ph |
| 1423. | 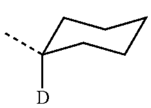 | H | 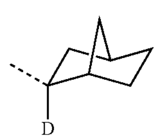 | H | Ph |
| 1424. | 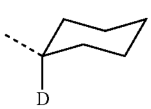 | H | 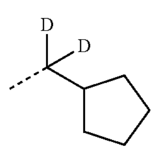 | H | Ph |
| 1425. | 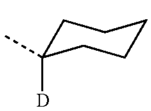 | H | 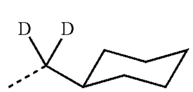 | H | Ph |

-continued
| i in Li | $R^{B1}$ | $R^{B2}$ | $R^{B3}$ | $R^{B4}$ | RB5 |
|---|---|---|---|---|---|
| 1426. | 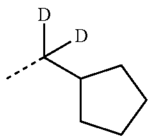 | H | $CD_2CH_3$ | H | Ph |
| 1427. | 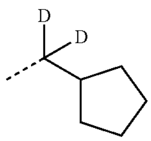 | H | $CD(CH_3)_2$ | H | Ph |
| 1428. | 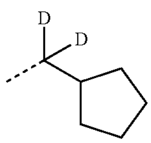 | H | $CD_2CH(CH_3)_2$ | H | Ph |
| 1429. | 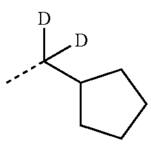 | H | $C(CH_3)_3$ | H | Ph |
| 1430. | 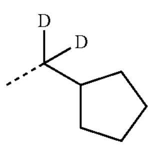 | H | $CD_2C(CH_3)_3$ | H | Ph |
| 1431. | 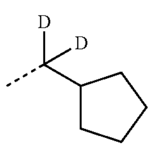 | H | 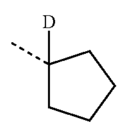 | H | Ph |
| 1432. | 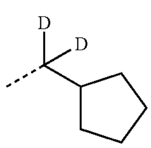 | H | 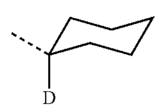 | H | Ph |
| 1433. | 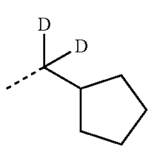 | H | 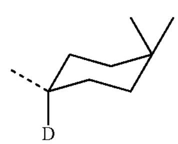 | H | Ph |
| 1434. | 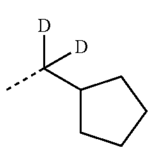 | H | 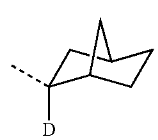 | H | Ph |
| 1435. | 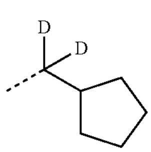 | H | 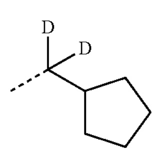 | H | Ph |

-continued
| i in Li | $R^{B1}$ | $R^{B2}$ | $R^{B3}$ | $R^{B4}$ | $R^{B5}$ |
|---|---|---|---|---|---|
| 1436. | 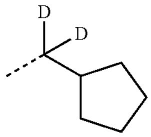 | H | 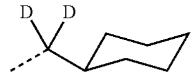 | H | Ph |
| 1437. | 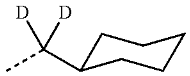 | H | $CD_2CH_3$ | H | Ph |
| 1438. | 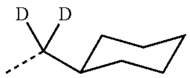 | H | $CD(CH_3)_2$ | H | Ph |
| 1439. | 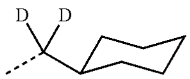 | H | $CD_2CH(CH_3)_2$ | H | Ph |
| 1440. | 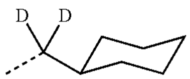 | H | $C(CH_3)_3$ | H | Ph |
| 1441. | 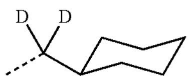 | H | $CD_2C(CH_3)_3$ | H | Ph |
| 1442. | 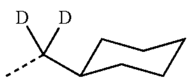 | H | 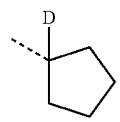 | H | Ph |
| 1443. | 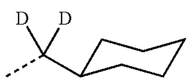 | H | 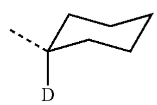 | H | Ph |
| 1444. | 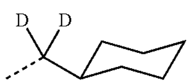 | H | 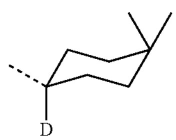 | H | Ph |
| 1445. | 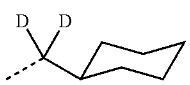 | H | 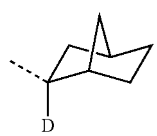 | H | Ph |
| 1446. | 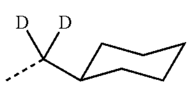 | H | 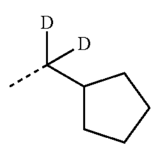 | H | Ph |
| 1447. | 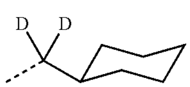 | H | 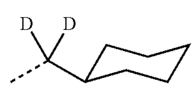 | H | Ph |
| 1448. | 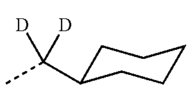 | H | $CD_2CH_3$ | H | Ph |
| 1449. | 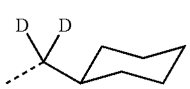 | H | $CD(CH_3)_2$ | H | Ph |

-continued
| i in Li | $R^{B1}$ | $R^{B2}$ | $R^{B3}$ | $R^{B4}$ | $R^{B5}$ |
|---|---|---|---|---|---|
| 1450. | 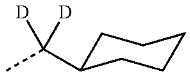 | H | $CD_2CH(CH_3)_2$ | H | Ph |
| 1451. | 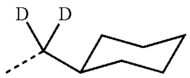 | H | $C(CH_3)_3$ | H | Ph |
| 1452. | 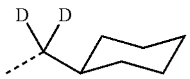 | H | $CD_2C(CH_3)_3$ | H | Ph |
| 1453. | 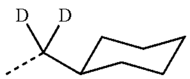 | H | 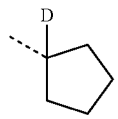 | H | Ph |
| 1454. | 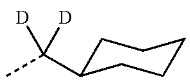 | H | 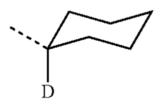 | H | Ph |
| 1455. | 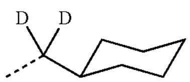 | H | 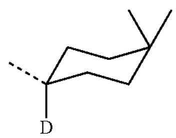 | H | Ph |
| 1456. | 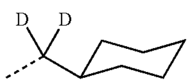 | H | 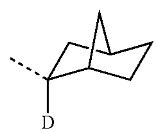 | H | Ph |
| 1457. | 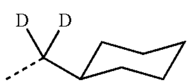 | H | 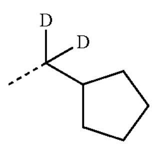 | H | Ph |
| 1458. | 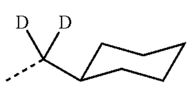 | H | 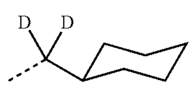 | H | Ph |
| 1459. | H | Ph | CD3 | H | H |
| 1460. | H | 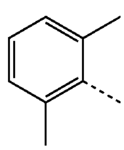 | CD3 | H | H |
| 1461. | H | 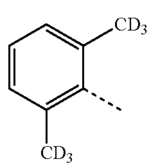 | CD3 | H | H |
| 1462. | H | 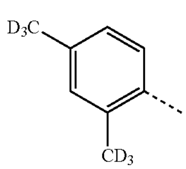 | CD3 | H | H |

-continued

| i in Li | $R^{B1}$ | $R^{B2}$ | $R^{B3}$ | $R^{B4}$ | $R^{B5}$ |
|---|---|---|---|---|---|
| 1463 | H | 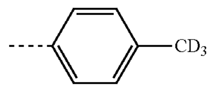 | H | H | H |

An organic light emitting device In some embodiments of the compound having the structure of $Ir(L_A)(L_B)(L_C)$, the compound is selected from the group consisting of Compound 1 to Compound 671 defined in the following table:

| Compound # | $L_A$ is | $L_B$ is $L_i$, where i is | $L_C$ is $L_i$, where i is |
|---|---|---|---|
| 1. | $L^{a}_{A1}$ | 371 | 1099 |
| 2. | $L^{a}_{A3}$ | 371 | 1099 |
| 3. | $L^{a}_{A7}$ | 371 | 1099 |
| 4. | $L^{a}_{A8}$ | 371 | 1099 |
| 5. | $L^{a}_{A10}$ | 371 | 1099 |
| 6. | $L^{a}_{A12}$ | 371 | 1099 |
| 7. | $L^{a}_{A16}$ | 371 | 1099 |
| 8. | $L^{a}_{A18}$ | 371 | 1099 |
| 9. | $L^{a}_{A22}$ | 371 | 1099 |
| 10. | $L^{a}_{A26}$ | 371 | 1099 |
| 11. | $L^{a}_{A36}$ | 371 | 1099 |
| 12. | $L^{a}_{A40}$ | 371 | 1099 |
| 13. | $L^{a}_{A41}$ | 371 | 1099 |
| 14. | $L^{a}_{A76}$ | 371 | 1099 |
| 15. | $L^{a}_{A80}$ | 371 | 1099 |
| 16. | $L^{a}_{A88}$ | 371 | 1099 |
| 17. | $L^{a}_{A94}$ | 371 | 1099 |
| 18. | $L^{a}_{A97}$ | 371 | 1099 |
| 19. | $L^{a}_{A139}$ | 371 | 1099 |
| 20. | $L^{a}_{A159}$ | 371 | 1099 |
| 21. | $L^{a}_{A177}$ | 371 | 1099 |
| 22. | $L^{a}_{A178}$ | 371 | 1099 |
| 23. | $L^{a}_{A179}$ | 371 | 1099 |
| 24. | $L^{a}_{A180}$ | 371 | 1099 |
| 25. | $L^{a}_{A181}$ | 371 | 1099 |
| 26. | $L^{a}_{A182}$ | 371 | 1099 |
| 27. | $L^{a}_{A183}$ | 371 | 1099 |
| 28. | $L^{a}_{A184}$ | 371 | 1099 |
| 29. | $L^{a}_{A185}$ | 371 | 1099 |
| 30. | $L^{a}_{A186}$ | 371 | 1099 |
| 31. | $L^{a}_{A187}$ | 371 | 1099 |
| 32. | $L^{a}_{A188}$ | 371 | 1099 |
| 33. | $L^{a}_{A189}$ | 371 | 1099 |
| 34. | $L^{a}_{A190}$ | 371 | 1099 |
| 35. | $L^{a}_{A191}$ | 371 | 1099 |
| 36. | $L^{a}_{A192}$ | 371 | 1099 |
| 37. | $L^{a}_{A1}$ | 374 | 1099 |
| 38. | $L^{a}_{A3}$ | 374 | 1099 |
| 39. | $L^{a}_{A7}$ | 374 | 1099 |
| 40. | $L^{a}_{A8}$ | 374 | 1099 |
| 41. | $L^{a}_{A10}$ | 374 | 1099 |
| 42. | $L^{a}_{A12}$ | 374 | 1099 |
| 43. | $L^{a}_{A16}$ | 374 | 1099 |
| 44. | $L^{a}_{A18}$ | 374 | 1099 |
| 45. | $L^{a}_{A22}$ | 374 | 1099 |
| 46. | $L^{a}_{A26}$ | 374 | 1099 |
| 47. | $L^{a}_{A36}$ | 374 | 1099 |
| 48. | $L^{a}_{A40}$ | 374 | 1099 |
| 49. | $L^{a}_{A41}$ | 374 | 1099 |
| 50. | $L^{a}_{A76}$ | 374 | 1099 |
| 51. | $L^{a}_{A80}$ | 374 | 1099 |
| 52. | $L^{a}_{A88}$ | 374 | 1099 |
| 53. | $L^{a}_{A94}$ | 374 | 1099 |
| 54. | $L^{a}_{A97}$ | 374 | 1099 |
| 55. | $L^{a}_{A139}$ | 371 | 1099 |
| 56. | $L^{a}_{A159}$ | 374 | 1099 |
| 57. | $L^{a}_{A177}$ | 374 | 1099 |
| 58. | $L^{a}_{A178}$ | 374 | 1099 |
| 59. | $L^{a}_{A179}$ | 374 | 1099 |
| 60. | $L^{a}_{A180}$ | 374 | 1099 |
| 61. | $L^{a}_{A181}$ | 374 | 1099 |
| 62. | $L^{a}_{A182}$ | 374 | 1099 |
| 63. | $L^{a}_{A183}$ | 374 | 1099 |
| 64. | $L^{a}_{A184}$ | 374 | 1099 |
| 65. | $L^{a}_{A185}$ | 374 | 1099 |
| 66. | $L^{a}_{A186}$ | 374 | 1099 |
| 67. | $L^{a}_{A187}$ | 374 | 1099 |
| 68. | $L^{a}_{A188}$ | 374 | 1099 |
| 69. | $L^{a}_{A189}$ | 374 | 1099 |
| 70. | $L^{a}_{A190}$ | 374 | 1099 |
| 71. | $L^{a}_{A191}$ | 374 | 1099 |
| 72. | $L^{a}_{A192}$ | 374 | 1099 |
| 73. | $L^{a}_{A210}$ | 374 | 1099 |
| 74. | $L^{a}_{A211}$ | 374 | 1099 |
| 75. | $L^{a}_{A1}$ | 371 | 1103 |
| 76. | $L^{a}_{A3}$ | 371 | 1103 |
| 77. | $L^{a}_{A7}$ | 371 | 1103 |
| 78. | $L^{a}_{A8}$ | 371 | 1103 |
| 79. | $L^{a}_{A10}$ | 371 | 1103 |
| 80. | $L^{a}_{A12}$ | 371 | 1103 |
| 81. | $L^{a}_{A16}$ | 371 | 1103 |
| 82. | $L^{a}_{A18}$ | 371 | 1103 |
| 83. | $L^{a}_{A22}$ | 371 | 1103 |
| 84. | $L^{a}_{A26}$ | 371 | 1103 |
| 85. | $L^{a}_{A36}$ | 371 | 1103 |
| 86. | $L^{a}_{A40}$ | 371 | 1103 |
| 87. | $L^{a}_{A41}$ | 371 | 1103 |
| 88. | $L^{a}_{A76}$ | 371 | 1103 |
| 89. | $L^{a}_{A80}$ | 371 | 1103 |
| 90. | $L^{a}_{A88}$ | 371 | 1103 |
| 91. | $L^{a}_{A94}$ | 371 | 1103 |
| 92. | $L^{a}_{A97}$ | 371 | 1103 |
| 93. | $L^{a}_{A139}$ | 371 | 1103 |
| 94. | $L^{a}_{A159}$ | 371 | 1103 |
| 95. | $L^{a}_{A177}$ | 371 | 1103 |
| 96. | $L^{a}_{A178}$ | 371 | 1103 |
| 97. | $L^{a}_{A179}$ | 371 | 1103 |
| 98. | $L^{a}_{A180}$ | 371 | 1103 |
| 99. | $L^{a}_{A181}$ | 371 | 1103 |
| 100. | $L^{a}_{A182}$ | 371 | 1103 |
| 101. | $L^{a}_{A183}$ | 371 | 1103 |
| 102. | $L^{a}_{A184}$ | 371 | 1103 |
| 103. | $L^{a}_{A185}$ | 371 | 1103 |
| 104. | $L^{a}_{A186}$ | 371 | 1103 |
| 105. | $L^{a}_{A187}$ | 371 | 1103 |
| 106. | $L^{a}_{A188}$ | 371 | 1103 |
| 107. | $L^{a}_{A189}$ | 371 | 1103 |
| 108. | $L^{a}_{A190}$ | 371 | 1103 |
| 109. | $L^{a}_{A191}$ | 371 | 1103 |
| 110. | $L^{a}_{A192}$ | 371 | 1103 |
| 111. | $L^{a}_{A210}$ | 374 | 1099 |
| 112. | $L^{a}_{A211}$ | 374 | 1099 |
| 113. | $L^{a}_{A1}$ | 374 | 1103 |
| 114. | $L^{a}_{A3}$ | 374 | 1103 |
| 115. | $L^{a}_{A7}$ | 374 | 1103 |
| 116. | $L^{a}_{A8}$ | 374 | 1103 |
| 117. | $L^{a}_{A10}$ | 374 | 1103 |
| 118. | $L^{a}_{A12}$ | 374 | 1103 |
| 119. | $L^{a}_{A16}$ | 374 | 1103 |
| 120. | $L^{a}_{A18}$ | 374 | 1103 |
| 121. | $L^{a}_{A22}$ | 374 | 1103 |
| 122. | $L^{a}_{A26}$ | 374 | 1103 |
| 123. | $L^{a}_{A36}$ | 374 | 1103 |
| 124. | $L^{a}_{A40}$ | 374 | 1103 |
| 125. | $L^{a}_{A41}$ | 374 | 1103 |
| 126. | $L^{a}_{A76}$ | 374 | 1103 |
| 127. | $L^{a}_{A80}$ | 374 | 1103 |
| 128. | $L^{a}_{A88}$ | 374 | 1103 |

-continued

| | | | |
|---|---|---|---|
| 129. | $L^{a}_{A94}$ | 374 | 1103 |
| 130. | $L^{a}_{A97}$ | 374 | 1103 |
| 131. | $L^{a}_{A139}$ | 374 | 1103 |
| 132. | $L^{a}_{A159}$ | 374 | 1103 |
| 133. | $L^{a}_{A177}$ | 374 | 1103 |
| 134. | $L^{a}_{A178}$ | 374 | 1103 |
| 135. | $L^{a}_{A179}$ | 374 | 1103 |
| 136. | $L^{a}_{A180}$ | 374 | 1103 |
| 137. | $L^{a}_{A181}$ | 374 | 1103 |
| 138. | $L^{a}_{A182}$ | 374 | 1103 |
| 139. | $L^{a}_{A183}$ | 374 | 1103 |
| 140. | $L^{a}_{A184}$ | 374 | 1103 |
| 141. | $L^{a}_{A185}$ | 374 | 1103 |
| 142. | $L^{a}_{A186}$ | 374 | 1103 |
| 143. | $L^{a}_{A187}$ | 374 | 1103 |
| 144. | $L^{a}_{A188}$ | 374 | 1103 |
| 145. | $L^{a}_{A189}$ | 374 | 1103 |
| 146. | $L^{a}_{A190}$ | 374 | 1103 |
| 147. | $L^{a}_{A191}$ | 374 | 1103 |
| 148. | $L^{a}_{A210}$ | 374 | 1103 |
| 149. | $L^{a}_{A211}$ | 374 | 1103 |
| 150. | $L^{a}_{A192}$ | 374 | 1103 |
| 151. | $L^{b}_{A1}$ | 371 | 1099 |
| 152. | $L^{b}_{A3}$ | 371 | 1099 |
| 153. | $L^{b}_{A7}$ | 371 | 1099 |
| 154. | $L^{b}_{A8}$ | 371 | 1099 |
| 155. | $L^{b}_{A10}$ | 371 | 1099 |
| 156. | $L^{b}_{A12}$ | 371 | 1099 |
| 157. | $L^{b}_{A16}$ | 371 | 1099 |
| 158. | $L^{b}_{A18}$ | 371 | 1099 |
| 159. | $L^{b}_{A22}$ | 371 | 1099 |
| 160. | $L^{b}_{A26}$ | 371 | 1099 |
| 161. | $L^{b}_{A36}$ | 371 | 1099 |
| 162. | $L^{b}_{A40}$ | 371 | 1099 |
| 163. | $L^{b}_{A41}$ | 371 | 1099 |
| 164. | $L^{b}_{A76}$ | 371 | 1099 |
| 165. | $L^{b}_{A80}$ | 371 | 1099 |
| 166. | $L^{b}_{A88}$ | 371 | 1099 |
| 167. | $L^{b}_{A94}$ | 371 | 1099 |
| 168. | $L^{b}_{A97}$ | 371 | 1099 |
| 169. | $L^{b}_{A139}$ | 371 | 1099 |
| 170. | $L^{b}_{A159}$ | 371 | 1099 |
| 171. | $L^{b}_{A177}$ | 371 | 1099 |
| 172. | $L^{b}_{A178}$ | 371 | 1099 |
| 173. | $L^{b}_{A179}$ | 371 | 1099 |
| 174. | $L^{b}_{A180}$ | 371 | 1099 |
| 175. | $L^{b}_{A181}$ | 371 | 1099 |
| 176. | $L^{b}_{A182}$ | 371 | 1099 |
| 177. | $L^{b}_{A183}$ | 371 | 1099 |
| 178. | $L^{b}_{A184}$ | 371 | 1099 |
| 179. | $L^{b}_{A185}$ | 371 | 1099 |
| 180. | $L^{b}_{A186}$ | 371 | 1099 |
| 181. | $L^{b}_{A187}$ | 371 | 1099 |
| 182. | $L^{b}_{A188}$ | 371 | 1099 |
| 183. | $L^{b}_{A189}$ | 371 | 1099 |
| 184. | $L^{b}_{A190}$ | 371 | 1099 |
| 185. | $L^{b}_{A191}$ | 371 | 1099 |
| 186. | $L^{b}_{A192}$ | 371 | 1099 |
| 187. | $L^{b}_{A210}$ | 371 | 1099 |
| 188. | $L^{b}_{A211}$ | 371 | 1099 |
| 189. | $L^{b}_{A1}$ | 374 | 1099 |
| 190. | $L^{b}_{A3}$ | 374 | 1099 |
| 191. | $L^{b}_{A7}$ | 374 | 1099 |
| 192. | $L^{b}_{A8}$ | 374 | 1099 |
| 193. | $L^{b}_{A10}$ | 374 | 1099 |
| 194. | $L^{b}_{A12}$ | 374 | 1099 |
| 195. | $L^{b}_{A16}$ | 374 | 1099 |
| 196. | $L^{b}_{A18}$ | 374 | 1099 |
| 197. | $L^{b}_{A22}$ | 374 | 1099 |
| 198. | $L^{b}_{A26}$ | 374 | 1099 |
| 199. | $L^{b}_{A36}$ | 374 | 1099 |
| 200. | $L^{b}_{A40}$ | 374 | 1099 |
| 201. | $L^{b}_{A41}$ | 374 | 1099 |
| 202. | $L^{b}_{A76}$ | 374 | 1099 |
| 203. | $L^{b}_{A80}$ | 374 | 1099 |
| 204. | $L^{b}_{A88}$ | 374 | 1099 |
| 205. | $L^{b}_{A94}$ | 374 | 1099 |
| 206. | $L^{b}_{A97}$ | 374 | 1099 |
| 207. | $L^{b}_{A139}$ | 374 | 1099 |

-continued

| | | | |
|---|---|---|---|
| 208. | $L^{b}_{A159}$ | 374 | 1099 |
| 209. | $L^{b}_{A177}$ | 374 | 1099 |
| 210. | $L^{b}_{A178}$ | 374 | 1099 |
| 211. | $L^{b}_{A179}$ | 374 | 1099 |
| 212. | $L^{b}_{A180}$ | 374 | 1099 |
| 213. | $L^{b}_{A181}$ | 374 | 1099 |
| 214. | $L^{b}_{A182}$ | 374 | 1099 |
| 215. | $L^{b}_{A183}$ | 374 | 1099 |
| 216. | $L^{b}_{A184}$ | 374 | 1099 |
| 217. | $L^{b}_{A185}$ | 374 | 1099 |
| 218. | $L^{b}_{A186}$ | 374 | 1099 |
| 219. | $L^{b}_{A187}$ | 374 | 1099 |
| 220. | $L^{b}_{A188}$ | 374 | 1099 |
| 221. | $L^{b}_{A189}$ | 374 | 1099 |
| 222. | $L^{b}_{A190}$ | 374 | 1099 |
| 223. | $L^{b}_{A191}$ | 374 | 1099 |
| 224. | $L^{b}_{A192}$ | 374 | 1099 |
| 225. | $L^{b}_{A1}$ | 371 | 1103 |
| 226. | $L^{b}_{A3}$ | 371 | 1103 |
| 227. | $L^{b}_{A7}$ | 371 | 1103 |
| 228. | $L^{b}_{A8}$ | 371 | 1103 |
| 229. | $L^{b}_{A10}$ | 371 | 1103 |
| 230. | $L^{b}_{A12}$ | 371 | 1103 |
| 231. | $L^{b}_{A16}$ | 371 | 1103 |
| 232. | $L^{b}_{A18}$ | 371 | 1103 |
| 233. | $L^{b}_{A22}$ | 371 | 1103 |
| 234. | $L^{b}_{A26}$ | 371 | 1103 |
| 235. | $L^{b}_{A36}$ | 371 | 1103 |
| 236. | $L^{b}_{A40}$ | 371 | 1103 |
| 237. | $L^{b}_{A41}$ | 371 | 1103 |
| 238. | $L^{b}_{A76}$ | 371 | 1103 |
| 239. | $L^{b}_{A80}$ | 371 | 1103 |
| 240. | $L^{b}_{A88}$ | 371 | 1103 |
| 241. | $L^{b}_{A94}$ | 371 | 1103 |
| 242. | $L^{b}_{A97}$ | 371 | 1103 |
| 243. | $L^{b}_{A159}$ | 371 | 1103 |
| 244. | $L^{b}_{A177}$ | 371 | 1103 |
| 245. | $L^{b}_{A178}$ | 371 | 1103 |
| 246. | $L^{b}_{A179}$ | 371 | 1103 |
| 247. | $L^{b}_{A180}$ | 371 | 1103 |
| 248. | $L^{b}_{A181}$ | 371 | 1103 |
| 249. | $L^{b}_{A182}$ | 371 | 1103 |
| 250. | $L^{b}_{A183}$ | 371 | 1103 |
| 251. | $L^{b}_{A184}$ | 371 | 1103 |
| 252. | $L^{b}_{A185}$ | 371 | 1103 |
| 253. | $L^{b}_{A186}$ | 371 | 1103 |
| 254. | $L^{b}_{A187}$ | 371 | 1103 |
| 255. | $L^{b}_{A188}$ | 371 | 1103 |
| 256. | $L^{a}_{A189}$ | 371 | 1103 |
| 257. | $L^{a}_{A190}$ | 371 | 1103 |
| 258. | $L^{a}_{A191}$ | 371 | 1103 |
| 259. | $L^{a}_{A192}$ | 371 | 1103 |
| 260. | $L^{b}_{A210}$ | 371 | 1099 |
| 261. | $L^{b}_{A211}$ | 371 | 1099 |
| 262. | $L^{b}_{A1}$ | 374 | 1103 |
| 263. | $L^{b}_{A3}$ | 374 | 1103 |
| 264. | $L^{b}_{A7}$ | 374 | 1103 |
| 265. | $L^{b}_{A8}$ | 374 | 1103 |
| 266. | $L^{b}_{A10}$ | 374 | 1103 |
| 267. | $L^{b}_{A12}$ | 374 | 1103 |
| 268. | $L^{b}_{A16}$ | 374 | 1103 |
| 269. | $L^{b}_{A18}$ | 374 | 1103 |
| 270. | $L^{b}_{A22}$ | 374 | 1103 |
| 271. | $L^{b}_{A26}$ | 374 | 1103 |
| 272. | $L^{b}_{A36}$ | 374 | 1103 |
| 273. | $L^{b}_{A40}$ | 374 | 1103 |
| 274. | $L^{b}_{A41}$ | 374 | 1103 |
| 275. | $L^{b}_{A76}$ | 374 | 1103 |
| 276. | $L^{b}_{A80}$ | 374 | 1103 |
| 277. | $L^{b}_{A88}$ | 374 | 1103 |
| 278. | $L^{b}_{A94}$ | 374 | 1103 |
| 279. | $L^{b}_{A97}$ | 374 | 1103 |
| 280. | $L^{b}_{A139}$ | 374 | 1103 |
| 281. | $L^{b}_{A159}$ | 374 | 1103 |
| 282. | $L^{b}_{A177}$ | 374 | 1103 |
| 283. | $L^{b}_{A178}$ | 374 | 1103 |
| 284. | $L^{b}_{A179}$ | 374 | 1103 |
| 285. | $L^{b}_{A180}$ | 374 | 1103 |
| 286. | $L^{b}_{A181}$ | 374 | 1103 |

-continued

| | | | |
|---|---|---|---|
| 287. | $L^{b}_{A182}$ | 374 | 1103 |
| 288. | $L^{b}_{A183}$ | 374 | 1103 |
| 289. | $L^{b}_{A184}$ | 374 | 1103 |
| 290. | $L^{b}_{A185}$ | 374 | 1103 |
| 291. | $L^{b}_{A186}$ | 374 | 1103 |
| 292. | $L^{b}_{A187}$ | 374 | 1103 |
| 293. | $L^{b}_{A188}$ | 374 | 1103 |
| 294. | $L^{b}_{A189}$ | 374 | 1103 |
| 295. | $L^{b}_{A190}$ | 374 | 1103 |
| 296. | $L^{b}_{A191}$ | 374 | 1103 |
| 297. | $L^{b}_{A192}$ | 374 | 1103 |
| 298. | $L^{b}_{A210}$ | 374 | 1103 |
| 299. | $L^{b}_{A211}$ | 374 | 1103 |
| 300. | $L^{c}_{A1}$ | 371 | 1097 |
| 301. | $L^{c}_{A3}$ | 371 | 1097 |
| 302. | $L^{c}_{A7}$ | 371 | 1097 |
| 303. | $L^{c}_{A8}$ | 371 | 1097 |
| 304. | $L^{c}_{A10}$ | 371 | 1097 |
| 305. | $L^{c}_{A12}$ | 371 | 1097 |
| 306. | $L^{c}_{A16}$ | 371 | 1097 |
| 307. | $L^{c}_{A18}$ | 371 | 1097 |
| 308. | $L^{c}_{A22}$ | 371 | 1097 |
| 309. | $L^{c}_{A26}$ | 371 | 1097 |
| 310. | $L^{c}_{A36}$ | 371 | 1097 |
| 311. | $L^{c}_{A40}$ | 371 | 1097 |
| 312. | $L^{c}_{A41}$ | 371 | 1097 |
| 313. | $L^{c}_{A76}$ | 371 | 1097 |
| 314. | $L^{c}_{A80}$ | 371 | 1097 |
| 315. | $L^{c}_{A88}$ | 371 | 1097 |
| 316. | $L^{c}_{A94}$ | 371 | 1097 |
| 317. | $L^{c}_{A97}$ | 371 | 1097 |
| 318. | $L^{c}_{A139}$ | 371 | 1097 |
| 319. | $L^{c}_{A154}$ | 731 | 1097 |
| 320. | $L^{c}_{A159}$ | 371 | 1097 |
| 321. | $L^{c}_{A177}$ | 371 | 1097 |
| 322. | $L^{c}_{A178}$ | 371 | 1097 |
| 323. | $L^{c}_{A179}$ | 371 | 1097 |
| 324. | $L^{c}_{A180}$ | 371 | 1097 |
| 325. | $L^{c}_{A181}$ | 371 | 1097 |
| 326. | $L^{c}_{A182}$ | 371 | 1097 |
| 327. | $L^{c}_{A183}$ | 371 | 1097 |
| 328. | $L^{c}_{A184}$ | 371 | 1097 |
| 329. | $L^{c}_{A185}$ | 371 | 1097 |
| 330. | $L^{c}_{A186}$ | 371 | 1097 |
| 331. | $L^{c}_{A187}$ | 371 | 1097 |
| 332. | $L^{c}_{A188}$ | 371 | 1097 |
| 333. | $L^{c}_{A189}$ | 371 | 1097 |
| 334. | $L^{c}_{A190}$ | 371 | 1097 |
| 335. | $L^{c}_{A191}$ | 371 | 1097 |
| 336. | $L^{c}_{A192}$ | 371 | 1097 |
| 337. | $L^{c}_{A210}$ | 371 | 1097 |
| 338. | $L^{c}_{A211}$ | 371 | 1097 |
| 339. | $L^{c}_{A1}$ | 371 | 1099 |
| 340. | $L^{c}_{A3}$ | 371 | 1099 |
| 341. | $L^{c}_{A7}$ | 371 | 1099 |
| 342. | $L^{c}_{A8}$ | 371 | 1099 |
| 343. | $L^{c}_{A10}$ | 371 | 1099 |
| 344. | $L^{c}_{A12}$ | 371 | 1099 |
| 345. | $L^{c}_{A16}$ | 371 | 1099 |
| 346. | $L^{c}_{A18}$ | 371 | 1099 |
| 347. | $L^{c}_{A22}$ | 371 | 1099 |
| 348. | $L^{c}_{A26}$ | 371 | 1099 |
| 349. | $L^{c}_{A36}$ | 371 | 1099 |
| 350. | $L^{c}_{A40}$ | 371 | 1099 |
| 351. | $L^{c}_{A41}$ | 371 | 1099 |
| 352. | $L^{c}_{A76}$ | 371 | 1099 |
| 353. | $L^{c}_{A80}$ | 371 | 1099 |
| 354. | $L^{c}_{A88}$ | 371 | 1099 |
| 355. | $L^{c}_{A94}$ | 371 | 1099 |
| 356. | $L^{c}_{A97}$ | 371 | 1099 |
| 357. | $L^{c}_{A139}$ | 371 | 1099 |
| 358. | $L^{c}_{A154}$ | 731 | 1099 |
| 359. | $L^{c}_{A159}$ | 371 | 1099 |
| 360. | $L^{c}_{A177}$ | 371 | 1099 |
| 361. | $L^{c}_{A178}$ | 371 | 1099 |
| 362. | $L^{c}_{A179}$ | 371 | 1099 |
| 363. | $L^{c}_{A180}$ | 371 | 1099 |
| 364. | $L^{c}_{A181}$ | 371 | 1099 |
| 365. | $L^{c}_{A182}$ | 371 | 1099 |
| 366. | $L^{c}_{A183}$ | 371 | 1099 |
| 367. | $L^{c}_{A184}$ | 371 | 1099 |
| 368. | $L^{c}_{A185}$ | 371 | 1099 |
| 369. | $L^{c}_{A186}$ | 371 | 1099 |
| 370. | $L^{c}_{A187}$ | 371 | 1099 |
| 371. | $L^{c}_{A188}$ | 371 | 1099 |
| 372. | $L^{c}_{A189}$ | 371 | 1099 |
| 373. | $L^{c}_{A190}$ | 371 | 1099 |
| 374. | $L^{c}_{A191}$ | 371 | 1099 |
| 375. | $L^{c}_{A192}$ | 371 | 1099 |
| 376. | $L^{c}_{A210}$ | 371 | 1099 |
| 377. | $L^{c}_{A211}$ | 371 | 1099 |
| 378. | $L^{c}_{A1}$ | 374 | 1099 |
| 379. | $L^{c}_{A3}$ | 374 | 1099 |
| 380. | $L^{c}_{A7}$ | 374 | 1099 |
| 381. | $L^{c}_{A8}$ | 374 | 1099 |
| 382. | $L^{c}_{A10}$ | 374 | 1099 |
| 383. | $L^{c}_{A12}$ | 374 | 1099 |
| 384. | $L^{c}_{A16}$ | 374 | 1099 |
| 385. | $L^{c}_{A18}$ | 374 | 1099 |
| 386. | $L^{c}_{A22}$ | 374 | 1099 |
| 387. | $L^{c}_{A26}$ | 374 | 1099 |
| 388. | $L^{c}_{A36}$ | 374 | 1099 |
| 389. | $L^{c}_{A40}$ | 374 | 1099 |
| 390. | $L^{c}_{A41}$ | 374 | 1099 |
| 391. | $L^{c}_{A76}$ | 374 | 1099 |
| 392. | $L^{c}_{A80}$ | 374 | 1099 |
| 393. | $L^{c}_{A88}$ | 374 | 1099 |
| 394. | $L^{c}_{A94}$ | 374 | 1099 |
| 395. | $L^{c}_{A97}$ | 374 | 1099 |
| 396. | $L^{c}_{A139}$ | 374 | 1099 |
| 397. | $L^{c}_{A154}$ | 374 | 1099 |
| 398. | $L^{c}_{A159}$ | 374 | 1099 |
| 399. | $L^{c}_{A177}$ | 374 | 1099 |
| 400. | $L^{c}_{A178}$ | 374 | 1099 |
| 401. | $L^{c}_{A179}$ | 374 | 1099 |
| 402. | $L^{c}_{A180}$ | 374 | 1099 |
| 403. | $L^{c}_{A181}$ | 374 | 1099 |
| 404. | $L^{c}_{A182}$ | 374 | 1099 |
| 405. | $L^{c}_{A183}$ | 374 | 1099 |
| 406. | $L^{c}_{A184}$ | 374 | 1099 |
| 407. | $L^{c}_{A185}$ | 374 | 1099 |
| 408. | $L^{c}_{A186}$ | 374 | 1099 |
| 409. | $L^{c}_{A187}$ | 374 | 1099 |
| 410. | $L^{c}_{A188}$ | 374 | 1099 |
| 411. | $L^{c}_{A189}$ | 374 | 1099 |
| 412. | $L^{c}_{A190}$ | 374 | 1099 |
| 413. | $L^{c}_{A191}$ | 374 | 1099 |
| 414. | $L^{c}_{A192}$ | 374 | 1099 |
| 415. | $L^{c}_{A210}$ | 374 | 1099 |
| 416. | $L^{c}_{A211}$ | 374 | 1099 |
| 417. | $L^{c}_{A1}$ | 371 | 1103 |
| 418. | $L^{c}_{A3}$ | 371 | 1103 |
| 419. | $L^{c}_{A7}$ | 371 | 1103 |
| 420. | $L^{c}_{A8}$ | 371 | 1103 |
| 421. | $L^{c}_{A10}$ | 371 | 1103 |
| 422. | $L^{c}_{A12}$ | 371 | 1103 |
| 423. | $L^{c}_{A16}$ | 371 | 1103 |
| 424. | $L^{c}_{A18}$ | 371 | 1103 |
| 425. | $L^{c}_{A22}$ | 371 | 1103 |
| 426. | $L^{c}_{A26}$ | 371 | 1103 |
| 427. | $L^{c}_{A36}$ | 371 | 1103 |
| 428. | $L^{c}_{A40}$ | 371 | 1103 |
| 429. | $L^{c}_{A41}$ | 371 | 1103 |
| 430. | $L^{c}_{A76}$ | 371 | 1103 |
| 431. | $L^{c}_{A80}$ | 371 | 1103 |
| 432. | $L^{c}_{A88}$ | 371 | 1103 |
| 433. | $L^{c}_{A94}$ | 371 | 1103 |
| 434. | $L^{c}_{A97}$ | 371 | 1103 |
| 435. | $L^{c}_{A139}$ | 371 | 1103 |
| 436. | $L^{c}_{A154}$ | 371 | 1103 |
| 437. | $L^{c}_{A159}$ | 371 | 1103 |
| 438. | $L^{c}_{A177}$ | 371 | 1103 |
| 439. | $L^{c}_{A178}$ | 371 | 1103 |
| 440. | $L^{c}_{A179}$ | 371 | 1103 |
| 441. | $L^{c}_{A180}$ | 371 | 1103 |
| 442. | $L^{c}_{A181}$ | 371 | 1103 |
| 443. | $L^{c}_{A182}$ | 371 | 1103 |
| 444. | $L^{c}_{A183}$ | 371 | 1103 |

| | | | |
|---|---|---|---|
| 445. | $L^{c}_{A184}$ | 371 | 1103 |
| 446. | $L^{c}_{A185}$ | 371 | 1103 |
| 447. | $L^{c}_{A186}$ | 371 | 1103 |
| 448. | $L^{c}_{A187}$ | 371 | 1103 |
| 449. | $L^{c}_{A188}$ | 371 | 1103 |
| 450. | $L^{c}_{A189}$ | 371 | 1103 |
| 451. | $L^{c}_{A190}$ | 371 | 1103 |
| 452. | $L^{c}_{A191}$ | 371 | 1103 |
| 453. | $L^{c}_{A192}$ | 371 | 1103 |
| 454. | $L^{c}_{A210}$ | 371 | 1103 |
| 455. | $L^{c}_{A211}$ | 371 | 1103 |
| 456. | $L^{c}_{A1}$ | 374 | 1103 |
| 457. | $L^{c}_{A3}$ | 374 | 1103 |
| 458. | $L^{c}_{A7}$ | 374 | 1103 |
| 459. | $L^{c}_{A8}$ | 374 | 1103 |
| 460. | $L^{c}_{A10}$ | 374 | 1103 |
| 461. | $L^{c}_{A12}$ | 374 | 1103 |
| 462. | $L^{c}_{A16}$ | 374 | 1103 |
| 463. | $L^{c}_{A18}$ | 374 | 1103 |
| 464. | $L^{c}_{A22}$ | 374 | 1103 |
| 465. | $L^{c}_{A26}$ | 374 | 1103 |
| 466. | $L^{c}_{A36}$ | 374 | 1103 |
| 467. | $L^{c}_{A40}$ | 374 | 1103 |
| 468. | $L^{c}_{A41}$ | 374 | 1103 |
| 469. | $L^{c}_{A76}$ | 374 | 1103 |
| 470. | $L^{c}_{A80}$ | 374 | 1103 |
| 471. | $L^{c}_{A88}$ | 374 | 1103 |
| 472. | $L^{c}_{A94}$ | 374 | 1103 |
| 473. | $L^{c}_{A97}$ | 374 | 1103 |
| 474. | $L^{c}_{A139}$ | 374 | 1103 |
| 475. | $L^{c}_{A154}$ | 374 | 1103 |
| 476. | $L^{c}_{A159}$ | 374 | 1103 |
| 477. | $L^{c}_{A177}$ | 374 | 1103 |
| 478. | $L^{c}_{A178}$ | 374 | 1103 |
| 479. | $L^{c}_{A179}$ | 374 | 1103 |
| 480. | $L^{c}_{A180}$ | 374 | 1103 |
| 481. | $L^{c}_{A181}$ | 374 | 1103 |
| 482. | $L^{c}_{A182}$ | 374 | 1103 |
| 483. | $L^{c}_{A183}$ | 374 | 1103 |
| 484. | $L^{c}_{A184}$ | 374 | 1103 |
| 485. | $L^{c}_{A185}$ | 374 | 1103 |
| 486. | $L^{c}_{A186}$ | 374 | 1103 |
| 487. | $L^{c}_{A187}$ | 374 | 1103 |
| 488. | $L^{c}_{A188}$ | 374 | 1103 |
| 489. | $L^{c}_{A189}$ | 374 | 1103 |
| 490. | $L^{c}_{A190}$ | 374 | 1103 |
| 491. | $L^{c}_{A191}$ | 374 | 1103 |
| 492. | $L^{c}_{A192}$ | 374 | 1103 |
| 493. | $L^{c}_{A210}$ | 374 | 1103 |
| 494. | $L^{c}_{A211}$ | 374 | 1103 |
| 495. | $L^{d}_{A41}$ | 371 | 1103 |
| 496. | $L^{d}_{A41}$ | 374 | 1103 |
| 497. | $L^{f}_{A41}$ | 371 | 1103 |
| 498. | $L^{f}_{A41}$ | 374 | 1103 |
| 499. | $L^{d}_{A211}$ | 369 | 1462 |
| 500. | $L^{d}_{A212}$ | 369 | 1462 |
| 501. | $L^{d}_{A211}$ | 369 | 1463 |

| Compnd # | $L_A$ is | $L_B$ is | $L_C$is |
|---|---|---|---|
| 502. | $L^{b}_{A1}$ | $L^{a}_{A139}$ | $L_1$ |
| 503. | $L^{b}_{A3}$ | $L^{a}_{A139}$ | $L_1$ |
| 504. | $L^{b}_{A7}$ | $L^{a}_{A139}$ | $L_1$ |
| 505. | $L^{b}_{A8}$ | $L^{a}_{A139}$ | $L_1$ |
| 506. | $L^{b}_{A10}$ | $L^{a}_{A139}$ | $L_1$ |
| 507. | $L^{b}_{A12}$ | $L^{a}_{A139}$ | $L_1$ |
| 508. | $L^{b}_{A16}$ | $L^{a}_{A139}$ | $L_1$ |
| 509. | $L^{b}_{A18}$ | $L^{a}_{A139}$ | $L_1$ |
| 510. | $L^{b}_{A22}$ | $L^{a}_{A139}$ | $L_1$ |
| 511. | $L^{b}_{A26}$ | $L^{a}_{A139}$ | $L_1$ |
| 512. | $L^{b}_{A36}$ | $L^{a}_{A139}$ | $L_1$ |
| 513. | $L^{b}_{A40}$ | $L^{a}_{A139}$ | $L_1$ |
| 514. | $L^{b}_{A41}$ | $L^{a}_{A139}$ | $L_1$ |
| 515. | $L^{b}_{A76}$ | $L^{a}_{A139}$ | $L_1$ |
| 516. | $L^{b}_{A80}$ | $L^{a}_{A139}$ | $L_1$ |
| 517. | $L^{b}_{A88}$ | $L^{a}_{A139}$ | $L_1$ |
| 518. | $L^{b}_{A94}$ | $L^{a}_{A139}$ | $L_1$ |
| 519. | $L^{b}_{A97}$ | $L^{a}_{A139}$ | $L_1$ |
| 520. | $L^{b}_{A159}$ | $L^{a}_{A139}$ | $L_1$ |

| | | | |
|---|---|---|---|
| 521. | $L^{b}_{A177}$ | $L^{a}_{A139}$ | $L_1$ |
| 522. | $L^{b}_{A178}$ | $L^{a}_{A139}$ | $L_1$ |
| 523. | $L^{b}_{A179}$ | $L^{a}_{A139}$ | $L_1$ |
| 524. | $L^{b}_{A180}$ | $L^{a}_{A139}$ | $L_1$ |
| 525. | $L^{b}_{A181}$ | $L^{a}_{A139}$ | $L_1$ |
| 526. | $L^{b}_{A182}$ | $L^{a}_{A139}$ | $L_1$ |
| 527. | $L^{b}_{A183}$ | $L^{a}_{A139}$ | $L_1$ |
| 528. | $L^{b}_{A184}$ | $L^{a}_{A139}$ | $L_1$ |
| 529. | $L^{b}_{A185}$ | $L^{a}_{A139}$ | $L_1$ |
| 530. | $L^{b}_{A186}$ | $L^{a}_{A139}$ | $L_1$ |
| 531. | $L^{b}_{A187}$ | $L^{a}_{A139}$ | $L_1$ |
| 532. | $L^{b}_{A188}$ | $L^{a}_{A139}$ | $L_1$ |
| 533. | $L^{b}_{A189}$ | $L^{a}_{A139}$ | $L_1$ |
| 534. | $L^{b}_{A190}$ | $L^{a}_{A139}$ | $L_1$ |
| 535. | $L^{b}_{A191}$ | $L^{a}_{A139}$ | $L_1$ |
| 536. | $L^{b}_{A1}$ | $L^{a}_{A209}$ | $L_1$ |
| 537. | $L^{b}_{A3}$ | $L^{a}_{A209}$ | $L_1$ |
| 538. | $L^{b}_{A7}$ | $L^{a}_{A209}$ | $L_1$ |
| 539. | $L^{b}_{A8}$ | $L^{a}_{A209}$ | $L_1$ |
| 540. | $L^{b}_{A10}$ | $L^{a}_{A209}$ | $L_1$ |
| 541. | $L^{b}_{A12}$ | $L^{a}_{A209}$ | $L_1$ |
| 542. | $L^{b}_{A16}$ | $L^{a}_{A209}$ | $L_1$ |
| 543. | $L^{b}_{A18}$ | $L^{a}_{A209}$ | $L_1$ |
| 544. | $L^{b}_{A22}$ | $L^{a}_{A209}$ | $L_1$ |
| 545. | $L^{b}_{A26}$ | $L^{a}_{A209}$ | $L_1$ |
| 546. | $L^{b}_{A36}$ | $L^{a}_{A209}$ | $L_1$ |
| 547. | $L^{b}_{A40}$ | $L^{a}_{A209}$ | $L_1$ |
| 548. | $L^{b}_{A41}$ | $L^{a}_{A209}$ | $L_1$ |
| 549. | $L^{b}_{A76}$ | $L^{a}_{A209}$ | $L_1$ |
| 550. | $L^{b}_{A80}$ | $L^{a}_{A209}$ | $L_1$ |
| 551. | $L^{b}_{A88}$ | $L^{a}_{A209}$ | $L_1$ |
| 552. | $L^{b}_{A94}$ | $L^{a}_{A209}$ | $L_1$ |
| 553. | $L^{b}_{A97}$ | $L^{a}_{A209}$ | $L_1$ |
| 554. | $L^{b}_{A159}$ | $L^{a}_{A209}$ | $L_1$ |
| 555. | $L^{b}_{A177}$ | $L^{a}_{A209}$ | $L_1$ |
| 556. | $L^{b}_{A178}$ | $L^{a}_{A209}$ | $L_1$ |
| 557. | $L^{b}_{A179}$ | $L^{a}_{A209}$ | $L_1$ |
| 558. | $L^{b}_{A180}$ | $L^{a}_{A209}$ | $L_1$ |
| 559. | $L^{b}_{A181}$ | $L^{a}_{A209}$ | $L_1$ |
| 560. | $L^{b}_{A182}$ | $L^{a}_{A209}$ | $L_1$ |
| 561. | $L^{b}_{A183}$ | $L^{a}_{A209}$ | $L_1$ |
| 562. | $L^{b}_{A184}$ | $L^{a}_{A209}$ | $L_1$ |
| 563. | $L^{b}_{A185}$ | $L^{a}_{A209}$ | $L_1$ |
| 564. | $L^{b}_{A186}$ | $L^{a}_{A209}$ | $L_1$ |
| 565. | $L^{b}_{A187}$ | $L^{a}_{A209}$ | $L_1$ |
| 566. | $L^{b}_{A188}$ | $L^{a}_{A209}$ | $L_1$ |
| 567. | $L^{b}_{A189}$ | $L^{a}_{A209}$ | $L_1$ |
| 568. | $L^{b}_{A190}$ | $L^{a}_{A209}$ | $L_1$ |
| 569. | $L^{b}_{A191}$ | $L^{a}_{A209}$ | $L_1$ |
| 570. | $L^{b}_{A1}$ | $L^{b}_{A3}$ | $L_1$ |
| 571. | $L^{b}_{A3}$ | $L^{b}_{A3}$ | $L_1$ |
| 572. | $L^{b}_{A7}$ | $L^{b}_{A3}$ | $L_1$ |
| 573. | $L^{b}_{A8}$ | $L^{b}_{A3}$ | $L_1$ |
| 574. | $L^{b}_{A10}$ | $L^{b}_{A3}$ | $L_1$ |
| 575. | $L^{b}_{A12}$ | $L^{b}_{A3}$ | $L_1$ |
| 576. | $L^{b}_{A16}$ | $L^{b}_{A3}$ | $L_1$ |
| 577. | $L^{b}_{A18}$ | $L^{b}_{A3}$ | $L_1$ |
| 578. | $L^{b}_{A22}$ | $L^{b}_{A3}$ | $L_1$ |
| 579. | $L^{b}_{A26}$ | $L^{b}_{A3}$ | $L_1$ |
| 580. | $L^{b}_{A36}$ | $L^{b}_{A3}$ | $L_1$ |
| 581. | $L^{b}_{A40}$ | $L^{b}_{A3}$ | $L_1$ |
| 582. | $L^{b}_{A41}$ | $L^{b}_{A3}$ | $L_1$ |
| 583. | $L^{b}_{A76}$ | $L^{b}_{A3}$ | $L_1$ |
| 584. | $L^{b}_{A80}$ | $L^{b}_{A3}$ | $L_1$ |
| 585. | $L^{b}_{A88}$ | $L^{b}_{A3}$ | $L_1$ |
| 586. | $L^{b}_{A94}$ | $L^{b}_{A3}$ | $L_1$ |
| 587. | $L^{b}_{A97}$ | $L^{b}_{A3}$ | $L_1$ |
| 588. | $L^{b}_{A159}$ | $L^{b}_{A3}$ | $L_1$ |
| 589. | $L^{b}_{A177}$ | $L^{b}_{A3}$ | $L_1$ |
| 590. | $L^{b}_{A178}$ | $L^{b}_{A3}$ | $L_1$ |
| 591. | $L^{b}_{A179}$ | $L^{b}_{A3}$ | $L_1$ |
| 592. | $L^{b}_{A180}$ | $L^{b}_{A3}$ | $L_1$ |
| 593. | $L^{b}_{A181}$ | $L^{b}_{A3}$ | $L_1$ |
| 594. | $L^{b}_{A182}$ | $L^{b}_{A3}$ | $L_1$ |
| 595. | $L^{b}_{A183}$ | $L^{b}_{A3}$ | $L_1$ |
| 596. | $L^{b}_{A184}$ | $L^{b}_{A3}$ | $L_1$ |
| 597. | $L^{b}_{A185}$ | $L^{b}_{A3}$ | $L_1$ |
| 598. | $L^{b}_{A186}$ | $L^{b}_{A3}$ | $L_1$ |
| 599. | $L^{b}_{A187}$ | $L^{b}_{A3}$ | $L_1$ |

-continued

| | | | |
|---|---|---|---|
| 600. | $L^{b}_{A188}$ | $L^{b}_{A3}$ | $L_1$ |
| 601. | $L^{b}_{A189}$ | $L^{b}_{A3}$ | $L_1$ |
| 602. | $L^{b}_{A190}$ | $L^{b}_{A3}$ | $L_1$ |
| 603. | $L^{b}_{A191}$ | $L^{b}_{A3}$ | $L_1$ |
| 604. | $L^{c}_{A7}$ | $L^{A}_{A210}$ | $L_1$ |
| 605. | $L^{c}_{A8}$ | $L^{A}_{A210}$ | $L_1$ |
| 606. | $L^{c}_{A10}$ | $L^{A}_{A210}$ | $L_1$ |
| 607. | $L^{c}_{A12}$ | $L^{A}_{A210}$ | $L_1$ |
| 608. | $L^{c}_{A16}$ | $L^{A}_{A210}$ | $L_1$ |
| 609. | $L^{c}_{A18}$ | $L^{A}_{A210}$ | $L_1$ |
| 610. | $L^{c}_{A22}$ | $L^{A}_{A210}$ | $L_1$ |
| 611. | $L^{c}_{A26}$ | $L^{A}_{A210}$ | $L_1$ |
| 612. | $L^{c}_{A36}$ | $L^{A}_{A210}$ | $L_1$ |
| 613. | $L^{c}_{A40}$ | $L^{A}_{A210}$ | $L_1$ |
| 614. | $L^{c}_{A41}$ | $L^{A}_{A210}$ | $L_1$ |
| 615. | $L^{c}_{A76}$ | $L^{A}_{A210}$ | $L_1$ |
| 616. | $L^{c}_{A80}$ | $L^{A}_{A210}$ | $L_1$ |
| 617. | $L^{c}_{A88}$ | $L^{A}_{A210}$ | $L_1$ |
| 618. | $L^{c}_{A94}$ | $L^{A}_{A210}$ | $L_1$ |
| 619. | $L^{c}_{A97}$ | $L^{A}_{A210}$ | $L_1$ |
| 620. | $L^{c}_{A139}$ | $L^{A}_{A210}$ | $L_1$ |
| 621. | $L^{c}_{A159}$ | $L^{A}_{A210}$ | $L_1$ |
| 622. | $L^{c}_{A177}$ | $L^{A}_{A210}$ | $L_1$ |
| 623. | $L^{c}_{A178}$ | $L^{A}_{A210}$ | $L_1$ |
| 624. | $L^{c}_{A179}$ | $L^{A}_{A210}$ | $L_1$ |
| 625. | $L^{c}_{A180}$ | $L^{A}_{A210}$ | $L_1$ |
| 626. | $L^{c}_{A181}$ | $L^{A}_{A210}$ | $L_1$ |
| 627. | $L^{c}_{A182}$ | $L^{A}_{A210}$ | $L_1$ |
| 628. | $L^{c}_{A183}$ | $L^{A}_{A210}$ | $L_1$ |
| 629. | $L^{c}_{A184}$ | $L^{A}_{A210}$ | $L_1$ |
| 630. | $L^{c}_{A185}$ | $L^{A}_{A210}$ | $L_1$ |
| 631. | $L^{c}_{A186}$ | $L^{A}_{A210}$ | $L_1$ |
| 632. | $L^{c}_{A187}$ | $L^{A}_{A210}$ | $L_1$ |
| 633. | $L^{c}_{A188}$ | $L^{A}_{A210}$ | $L_1$ |
| 634. | $L^{c}_{A189}$ | $L^{A}_{A210}$ | $L_1$ |
| 635. | $L^{c}_{A190}$ | $L^{A}_{A210}$ | $L_1$ |
| 636. | $L^{c}_{A191}$ | $L^{A}_{A210}$ | $L_1$ |
| 637. | $L^{c}_{A192}$ | $L^{A}_{A210}$ | $L_1$ |
| 638. | $L^{c}_{A210}$ | $L^{A}_{A210}$ | $L_1$ |
| 639. | $L^{c}_{A8}$ | $L^{A}_{A211}$ | $L_1$ |
| 640. | $L^{c}_{A10}$ | $L^{A}_{A211}$ | $L_1$ |
| 641. | $L^{c}_{A12}$ | $L^{A}_{A211}$ | $L_1$ |
| 642. | $L^{c}_{A16}$ | $L^{A}_{A211}$ | $L_1$ |
| 643. | $L^{c}_{A18}$ | $L^{A}_{A211}$ | $L_1$ |
| 644. | $L^{c}_{A22}$ | $L^{A}_{A211}$ | $L_1$ |
| 645. | $L^{c}_{A26}$ | $L^{A}_{A211}$ | $L_1$ |
| 646. | $L^{c}_{A36}$ | $L^{A}_{A211}$ | $L_1$ |
| 647. | $L^{c}_{A40}$ | $L^{A}_{A211}$ | $L_1$ |
| 648. | $L^{c}_{A41}$ | $L^{A}_{A211}$ | $L_1$ |
| 649. | $L^{c}_{A76}$ | $L^{A}_{A211}$ | $L_1$ |
| 650. | $L^{c}_{A80}$ | $L^{A}_{A211}$ | $L_1$ |
| 651. | $L^{c}_{A88}$ | $L^{A}_{A211}$ | $L_1$ |
| 652. | $L^{c}_{A94}$ | $L^{A}_{A211}$ | $L_1$ |
| 653. | $L^{c}_{A97}$ | $L^{A}_{A211}$ | $L_1$ |
| 654. | $L^{c}_{A139}$ | $L^{A}_{A211}$ | $L_1$ |
| 655. | $L^{c}_{A159}$ | $L^{A}_{A211}$ | $L_1$ |
| 656. | $L^{c}_{A177}$ | $L^{A}_{A211}$ | $L_1$ |
| 657. | $L^{c}_{A178}$ | $L^{A}_{A211}$ | $L_1$ |
| 658. | $L^{c}_{A179}$ | $L^{A}_{A211}$ | $L_1$ |
| 659. | $L^{c}_{A180}$ | $L^{A}_{A211}$ | $L_1$ |
| 660. | $L^{c}_{A181}$ | $L^{A}_{A211}$ | $L_1$ |
| 661. | $L^{c}_{A182}$ | $L^{A}_{A211}$ | $L_1$ |
| 662. | $L^{c}_{A183}$ | $L^{A}_{A211}$ | $L_1$ |
| 663. | $L^{c}_{A184}$ | $L^{A}_{A211}$ | $L_1$ |
| 664. | $L^{c}_{A185}$ | $L^{A}_{A211}$ | $L_1$ |
| 665. | $L^{c}_{A186}$ | $L^{A}_{A211}$ | $L_1$ |
| 666. | $L^{c}_{A187}$ | $L^{A}_{A211}$ | $L_1$ |
| 667. | $L^{c}_{A188}$ | $L^{A}_{A211}$ | $L_1$ |
| 668. | $L^{c}_{A189}$ | $L^{A}_{A211}$ | $L_1$ |
| 669. | $L^{c}_{A190}$ | $L^{A}_{A211}$ | $L_1$ |
| 670. | $L^{c}_{A191}$ | $L^{A}_{A211}$ | $L_1$ |
| 671. | $L^{c}_{A192}$ | $L^{A}_{A211}$ | $L_1$ |
| 672. | $L^{c}_{A210}$ | $L^{A}_{A211}$ | $L_1$ |
| 673. | $L^{c}_{A213}$ | $L^{A}_{A211}$ | 371 |

and stereoisomers thereof.

According to another aspect of the present disclosure, an OLED is disclosed. The OLED comprising: an anode; a cathode; and an organic layer, disposed between the anode and the cathode, comprising a compound having the formula $Ir(L_A)(L_B)(L_C)$;

wherein the ligand $L_A$ is selected from the group consisting of:

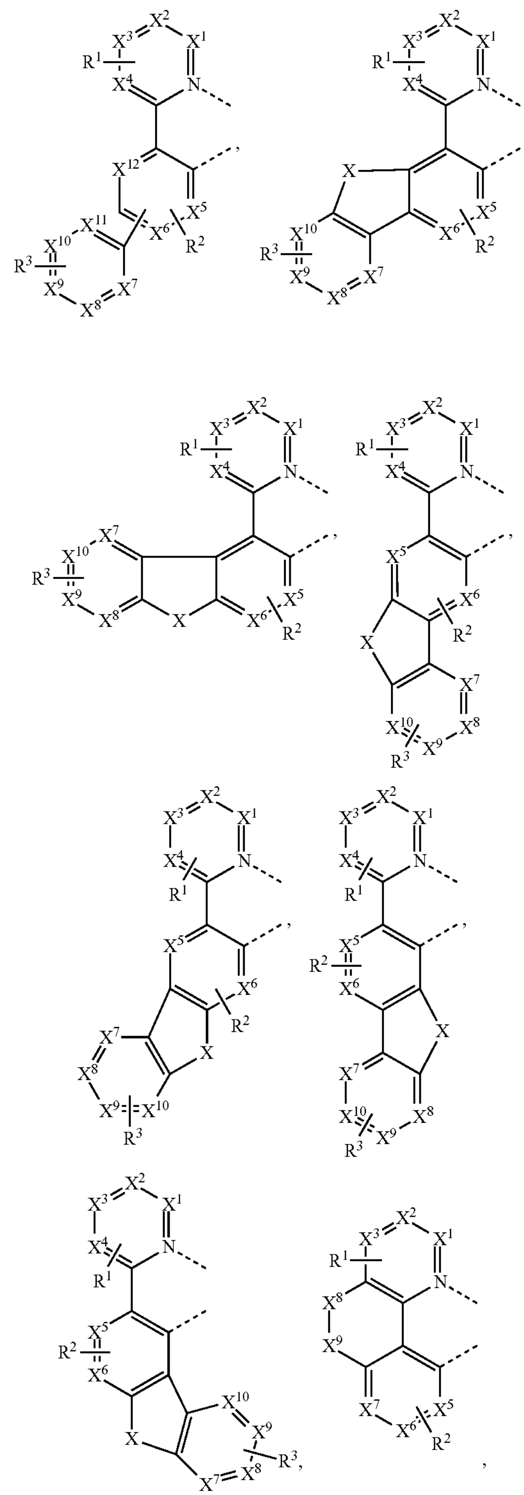

-continued

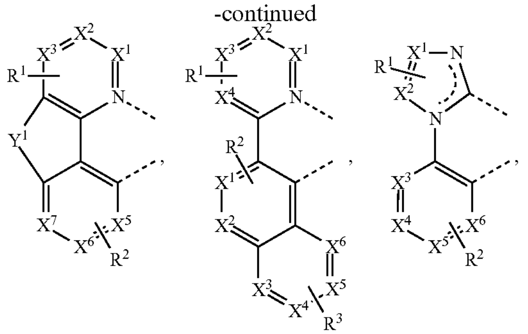

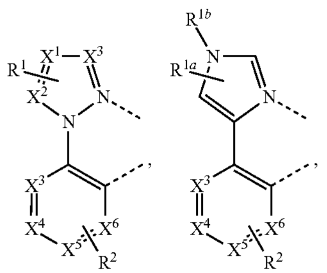

and

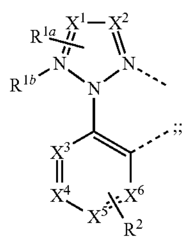

wherein the ligand $L_B$ is

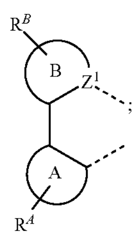

wherein the ligand $L_C$ is

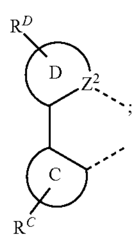

wherein rings A, B, C, and D are each independently a 5 or 6-membered carbocyclic or heterocyclic ring;

wherein $R^1$, $R^2$, $R^3$, $R^A$, $R^B$, $R^C$, and $R^D$ each independently represents mono, to a maximum possible number of substitution, or no substitution;

wherein $X^1$ to $X^{12}$, $Z^1$, and $Z^2$ are each independently C or N;

wherein X is selected from the group consisting of BR', NR', PR', O, S, Se, C═O, S═O, $SO_2$, CR'R", SiR'R", and GeR'R";

wherein $L_A$, $L_B$, and $L_C$ are different from each other;

wherein $R^1$, $R^2$, $R^3$, $R^A$, $R^B$, $R^C$, $R^D$, R', and R" are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any two or more substitutents among $R^1$, $R^2$, $R^3$, $R^A$, $R^B$, $R^C$, $R^D$, R', and R" are optionally joined or fused into a ring.

In some embodiments of the OLED, any two substituents among $R^1$, $R^2$, $R^3$, $R^A$, $R^B$, $R^C$, $R^D$, R', and R" are optionally joined or fused into a ring.

In some embodiments of the OLED, the organic layer is an emissive layer and the compound is an emissive dopant or a non-emissive dopant.

In some embodiments of the OLED, the organic layer further comprises a host, wherein the host comprises a triphenylene containing benzo-fused thiophene or benzo-fused furan;

wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH═CH—C_nH_{2n+1}$, $C≡CC_nH_{2n+1}$, $Ar_1$, $Ar_1—Ar_2$, and $C_nH_{2n}—Ar_1$, or the host has no substitutions;

wherein n is from 1 to 10; and wherein $Ar_1$ and $Ar_2$ are independently selected from the group consisting of benzene, biphenyl, naphthalene, triphenylene, carbazole, and heteroaromatic analogs thereof.

In some embodiments of the OLED, the organic layer further comprises a host, wherein host comprises at least one chemical group selected from the group consisting of triphenylene, carbazole, dibenzothiphene, dibenzofuran, dibenzoselenophene, azatriphenylene, azacarbazole, aza-dibenzothiophene, aza-dibenzofuran, and aza-dibenzoselenophene.

In some embodiments of the OLED, the organic layer further comprises a host, wherein the host is selected from the group consisting of:

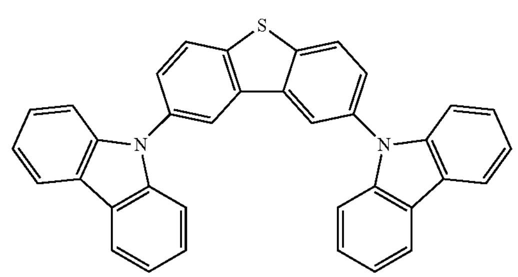

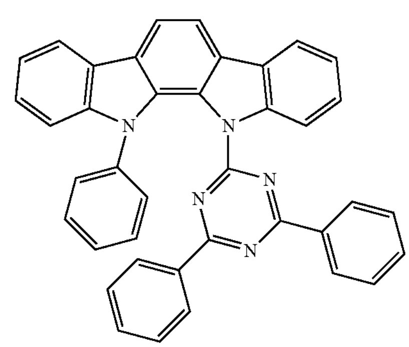

-continued
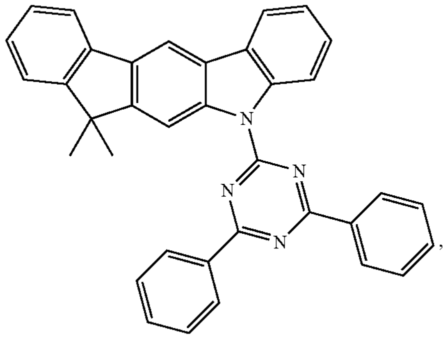
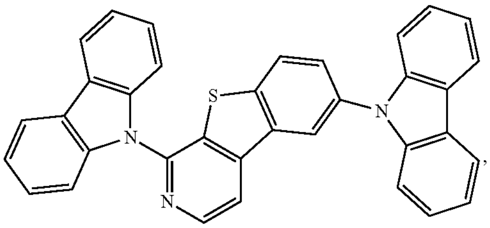
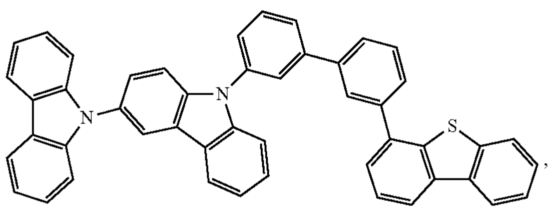
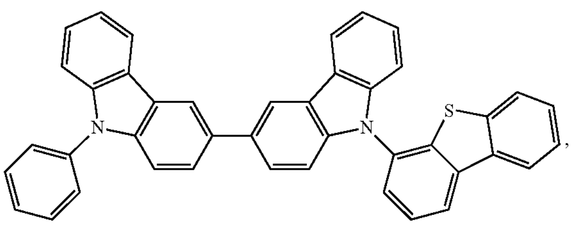
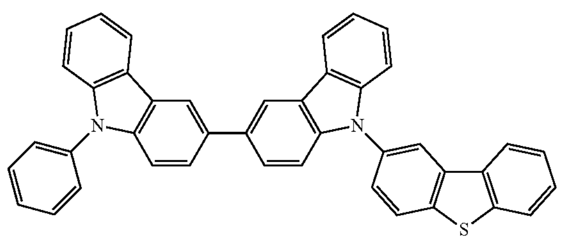
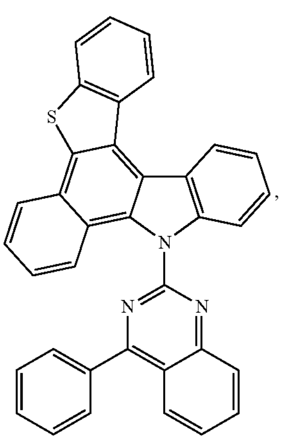
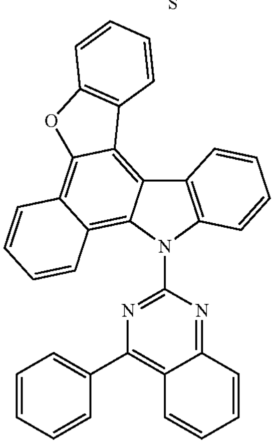
-continued
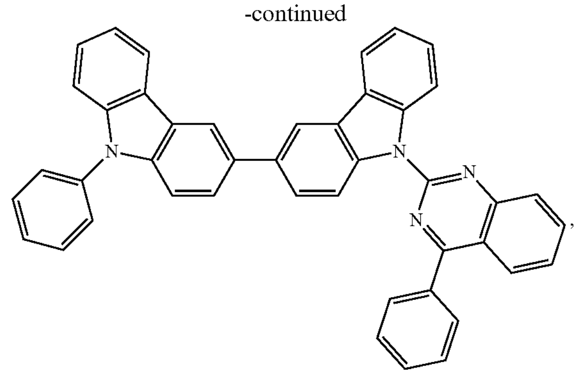
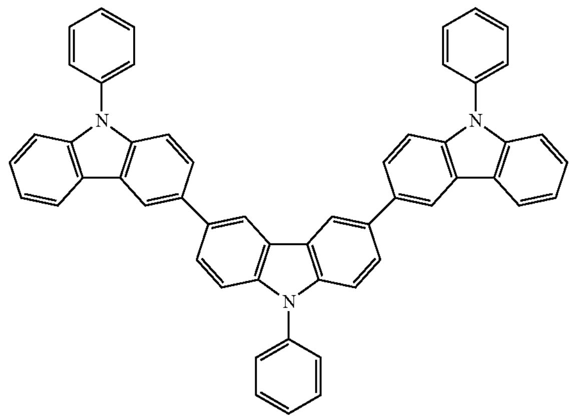
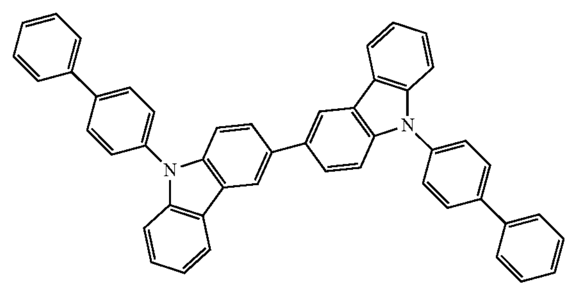
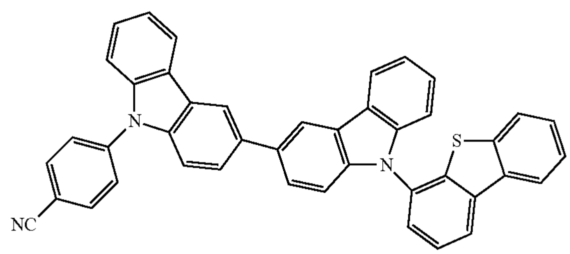
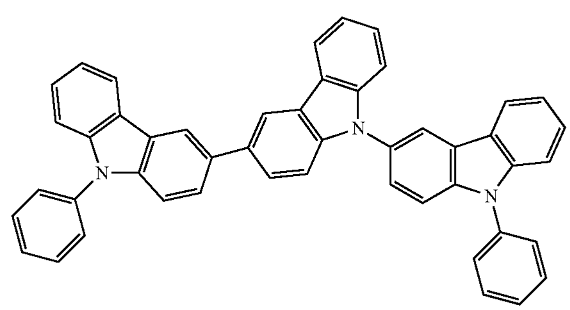

-continued

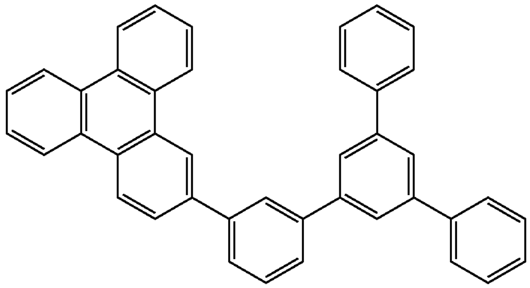
,

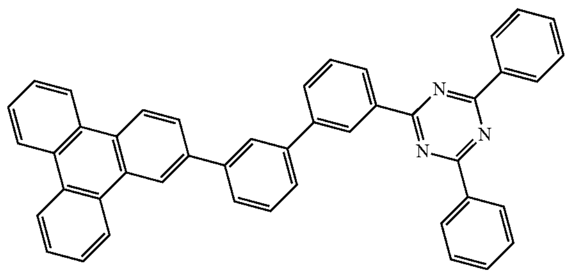
,

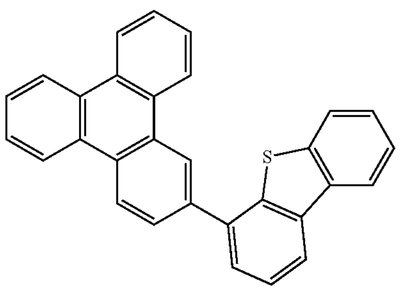
,

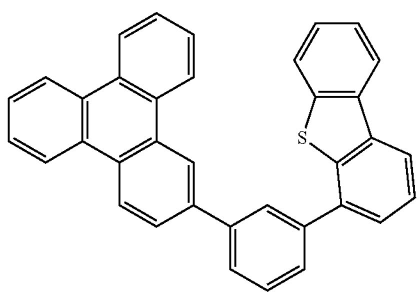
,

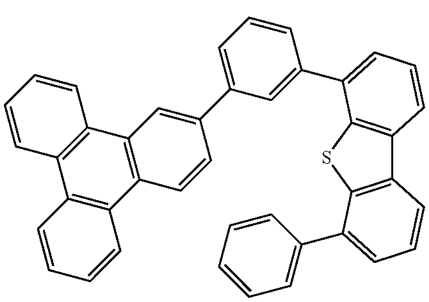
,

-continued

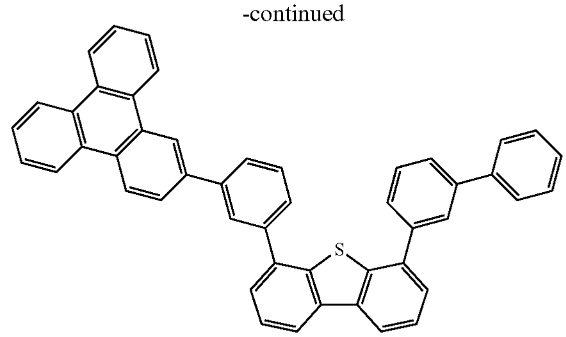
,

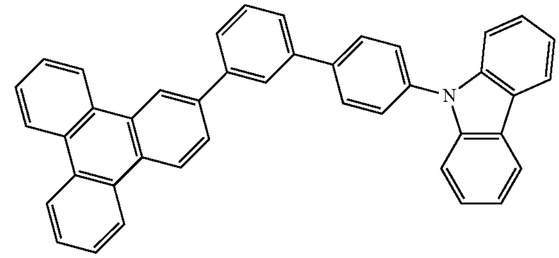
,

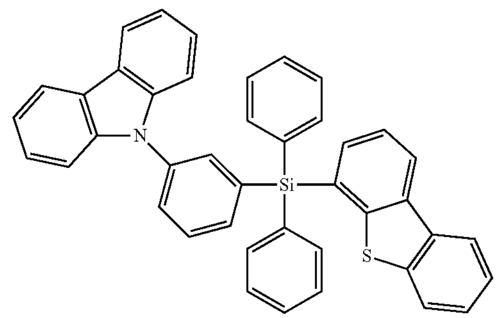
,

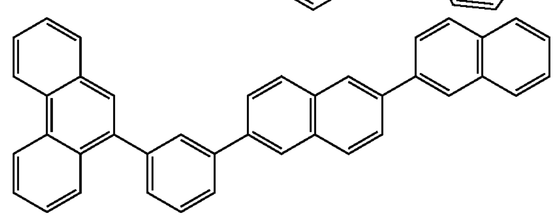
, and combinations thereof.

In some embodiments of the OLED, the organic layer further comprises a host, wherein the host comprises a metal complex.

According to another aspect, a consumer product comprising the OLED defined above is disclosed.

According to another aspect, a formulation comprising the compound comprising formula $Ir(L_A)(L_B)(L_C)$ defined above is disclosed.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The formulation can include one or more components selected from the group consisting of a solvent, a host, a hole injection material, hole transport material, and an electron transport layer material, disclosed herein.

Synthesis of Compound 499

Step 1

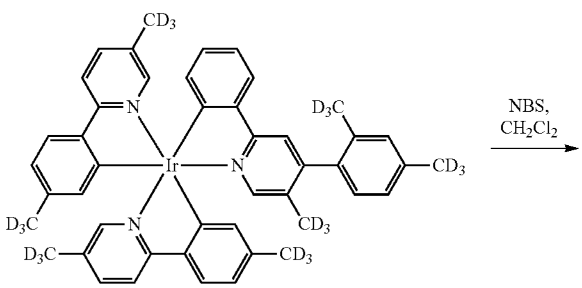

CC-2

-continued

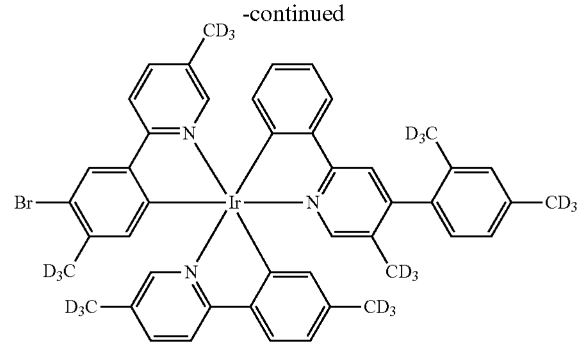

CC-2-Br

CC-2 (2.3 g, 2.71 mmol) was dissolved in dry dichloromethane (400 ml). The mixture was degassed with $N_2$ and cooled to 0° C. 1-Bromopyrrolidine-2,5-dione (0.81 g, 2.71 mmol) was dissolved in DCM (300 mL) and added dropwise. After addition, the temperature was gradually raised to room temperature and reaction was stirred for 12 hrs. Saturated $NaHCO_3$ (20 mL) solution was added. The organic phase was separated and collected. The solvent was removed and the residue was coated on Celite and purified on silica gel column eluted with toluene/heptane 70/30 (v/v) to give the product CC-2-Br (0.6 g, 24%).

Step 2

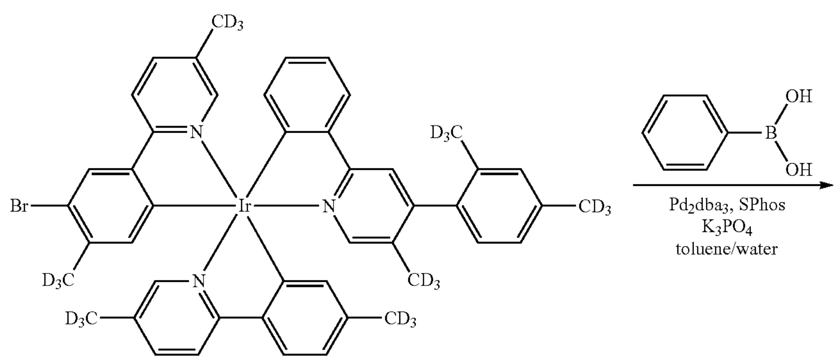

CC-2-Br

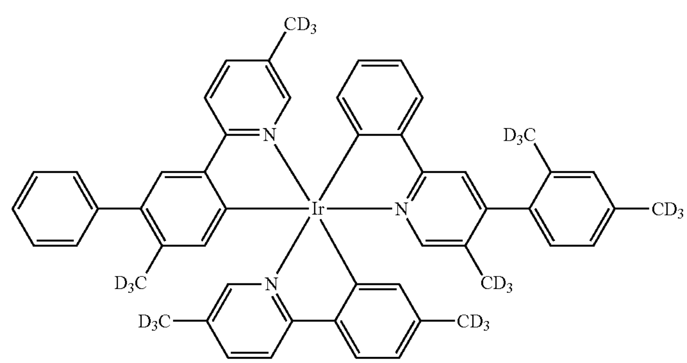

Compound 499

CC-2-Br (0.72 g, 0.775 mmol) was dissolved in a mixture of toluene (40 ml) and water (4 ml). The mixture was purged with $N_2$ for 10 mins. $K_3PO_4$ (0.411 g 1.937 mmol), SPhos (0.095 g, 0.232 mmol), $Pd_2dba_3$ (0.043 g, 0.046 mmol), and phenylboronic acid (0.189 g, 1.55 mmol) were added. The mixture was heated under $N_2$ at 110° C. for 12 hrs. The reaction then was cooled down to room temperature, the product was extracted with DCM. The organic phase was separated and collected. The solvent was removed and the residue was coated on Celite and purified on silica gel column eluted with toluene/heptane 70/30 (v/v). The product was purified by crystallization from toluene/MeOH to give compound 499 (0.7 g).

Synthesis of Compound 500

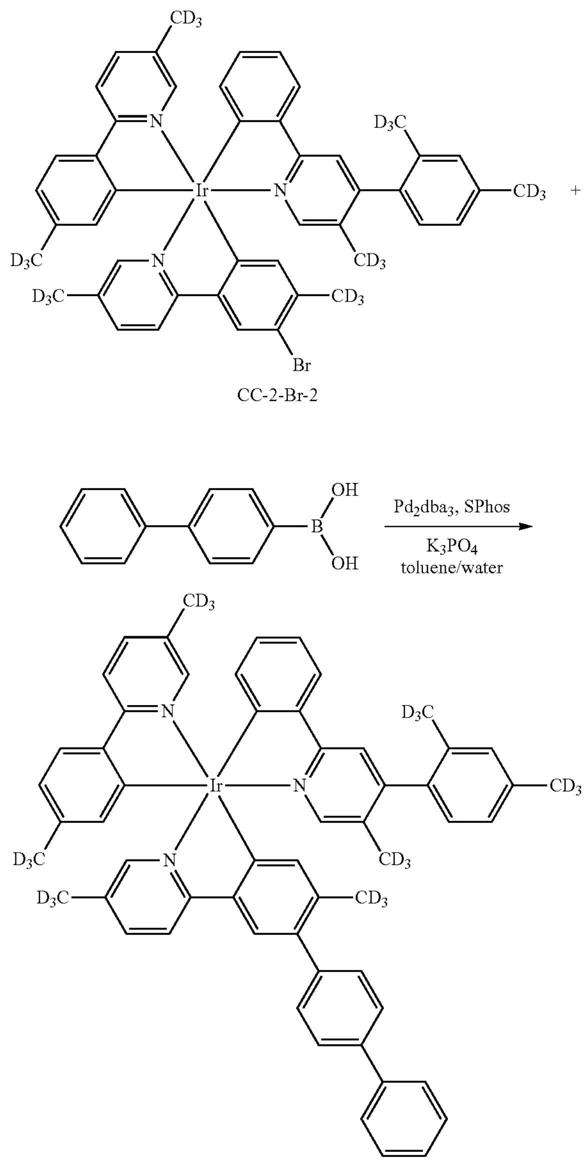

Compound 500

CC-2-Br-2 (0.6 g, 0.646 mmol) was dissolved in a mixture of toluene (100 ml) and water (10 ml). The mixture was purged with $N_2$ for 10 mins. Potassium phosphate tribasic hydrate (0.343 g, 1.61 mmol), SPhos (0.080 g, 0.19 mmol), $Pd_2dba_3$ (0.035 g, 0.039 mmol), and [1,1-biphenyl]4-ylboronic acid (0.256 g, 1.29 mmol) were added. The mixture was heated under $N_2$ at 110° C. for 12 hrs. Then the reaction was cooled down to room temperature, the product was extracted with DCM and organic phase was separated. The solvent was removed and the residue was coated on Celite and purified on silica gel column eluted with toluene/heptane 70/30 (v/v). The product was purified by crystallization from toluene/MeOH to give compound 500 (0.64 g).

Synthesis of Compound 501

Step 1

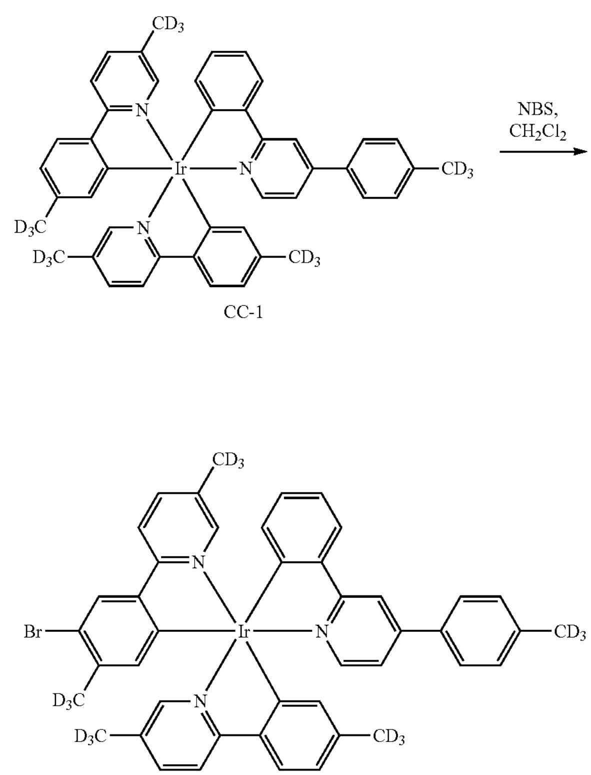

CC-Br

CC-1 (2.04 g, 2.500 mmol) was dissolved in dry dichloromethane (400 ml). The mixture was degassed with $N_2$ and cooled down to 0° C. 1-bromopyrrolidine-2,5-dione (0.445 g, 2.500 mmol) was dissolved in DCM (200 mL) and added dropwise. After addition, the temperature was gradually raised to room temperature and stirred for 16 hrs. Sat. $NaHCO_3$ (20 mL) solution was added. The organic phase was separated and collected. The solvent was removed and the residue was coated on Celite and purified on silica gel column eluted by using 70/30 toluene/heptane to give the product CC-Br (0.6 g).

Step 2

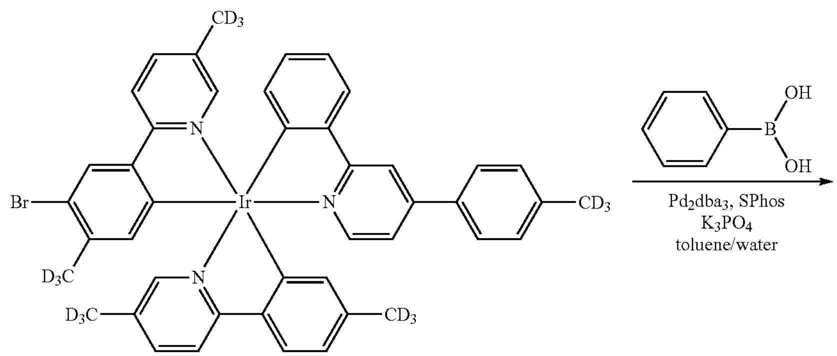

CC-Br

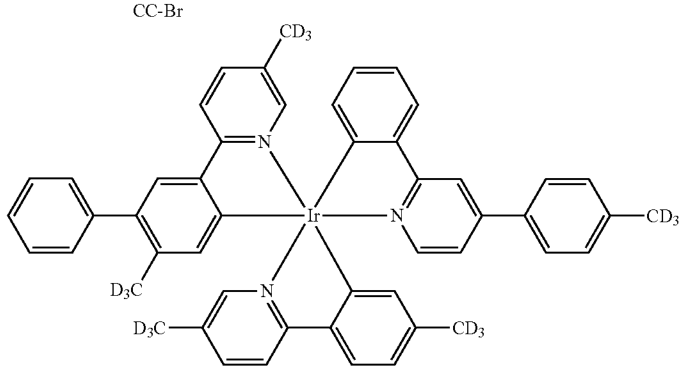

Compound 501

CC-Br (1.16 g, 1.296 mmol) was dissolved in a mixture of toluene (120 ml) and water (12.00 ml). The mixture was purged with $N_2$ for 10 mins. Potassium phosphate hydrate (0.688 g, 3.24 mmol, Sphos (0.160 g, 0.389 mmol), $Pd_2dba_3$ (0.071 g, 0.078 mmol), and phenylboronic acid (0.316 g, 2.59 mmol) was added. The mixture was heated under $N_2$ at 110° C. for 16 hrs. After the reaction was cooled down to room temperature, the product was extracted with DCM. The organic phase was separated and collected. The solvent was removed and the residue was coated on Celite and purified on silica gel column eluted by using 70/30 toluene/heptane. The product was purified by recrystallization in toluene/MeOH to give Compound 501 (1.0 g).

Synthesis of Compound 673

Step 1

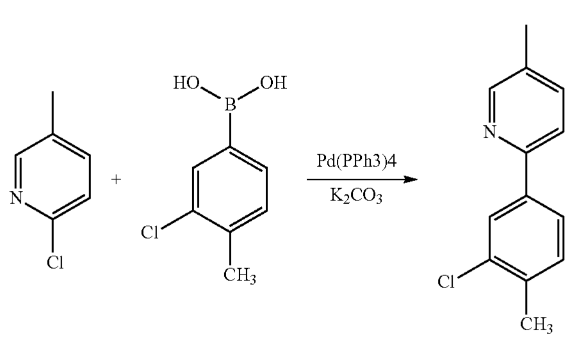

2-Chloro-5-methylpyridine (10.03 g, 79 mmol), (3-chloro-4-methylphenyl)boronic acid (13.4 g, 79 mmol), and potassium carbonate (21.74 g, 157 mmol) were dissolved in the mixture of DME (150 ml) and water (20 ml) under nitrogen to give a colorless suspension. $Pd(PPh_3)_4$ (0.909 g, 0.786 mmol) was added to the reaction mixture, then the reaction mixture was degassed and heated to 95° C. for 12 hrs. It was then cooled down to room temperature, separated organic phase and evaporated. The residue was subjected to column chromatography on silica gel column, eluted with heptanes/THF 9/1 (v/v), providing after crystallization from heptanes 10 g of 2-(3-chloro-4-methylphenyl)-5-methylpyridine (58% yield) of white solid.

Step 2

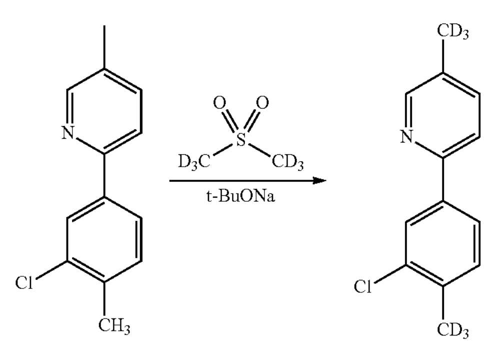 [SMILES: "t-BuONa" ; Cc1ccc(-c2ccc(C)c(Cl)c2)nc1 ; [2H]C([2H])([2H])S(=O)(=O)C([2H])([2H])[2H] ; [2H]C([2H])([2H])c1ccc(-c2ccc(C([2H])([2H])[2H])c(Cl)c2)nc1]

2-(3-Chloro-4-methylphenyl)-5-methylpyridine (10 g, 45.9 mmol), ((methyl-d3)sulfonyl)methane-d3 (92 g, 919 mmol), and sodium 2-methylpropan-2-olate (2.65 g, 27.6 mmol) were dissolved together under nitrogen to give a dark solution. The reaction mixture was heated to 80° C. under nitrogen for 12 hrs, cooled down, diluted with ethyl acetate, washed with water, dried over sodium sulfate, filtered and evaporated. Purified by column chromatography on silica gel, eluted with heptanes/THF 9/1 (v/v), providing off-white solid, then crystallized from heptanes, providing white crystalline material (9.1 g, 81% yield).

Step 3

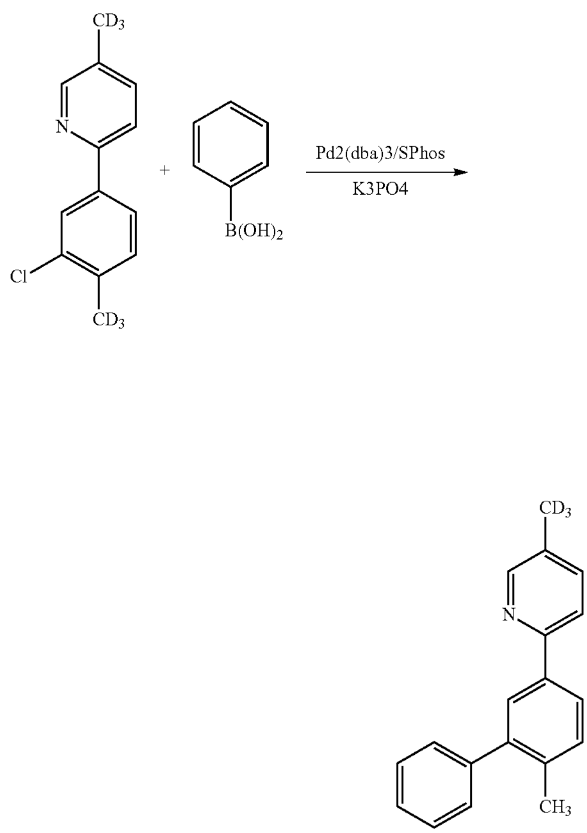

2-(3-Chloro-4-(methyl-d3)phenyl)-5-(methyl-d3)pyridine (7.45 g, 33.3 mmol), phenylboronic acid (6.09 g, 49.9 mmol), potassium phosphate (15.34 g, 66.6 mmol), $Pd_2(dba)_3$ (0.305 g, 0.333 mmol) and dicyclohexyl(2',6'-dimethoxy-[1,1'-biphenyl]-2-yl)phosphane (Sphos, 0.273 g, 0.666 mmol) were dissolved in the mixture of DME (150 ml) and water (25 ml) under nitrogen to give a red suspension. Their reaction mixture was degassed and heated to reflux under nitrogen. After 14 hrs heating about 80% conversion was achieved. Addition of more Ph boronic acid and catalyst didn't improve conversion. Separated organic phase, evaporated, purified by column chromatography on silica gel, eluted with heptanes/THF 9/1, then crystallized from heptanes. White solid (6.2 g, 70% yield).

Step 4

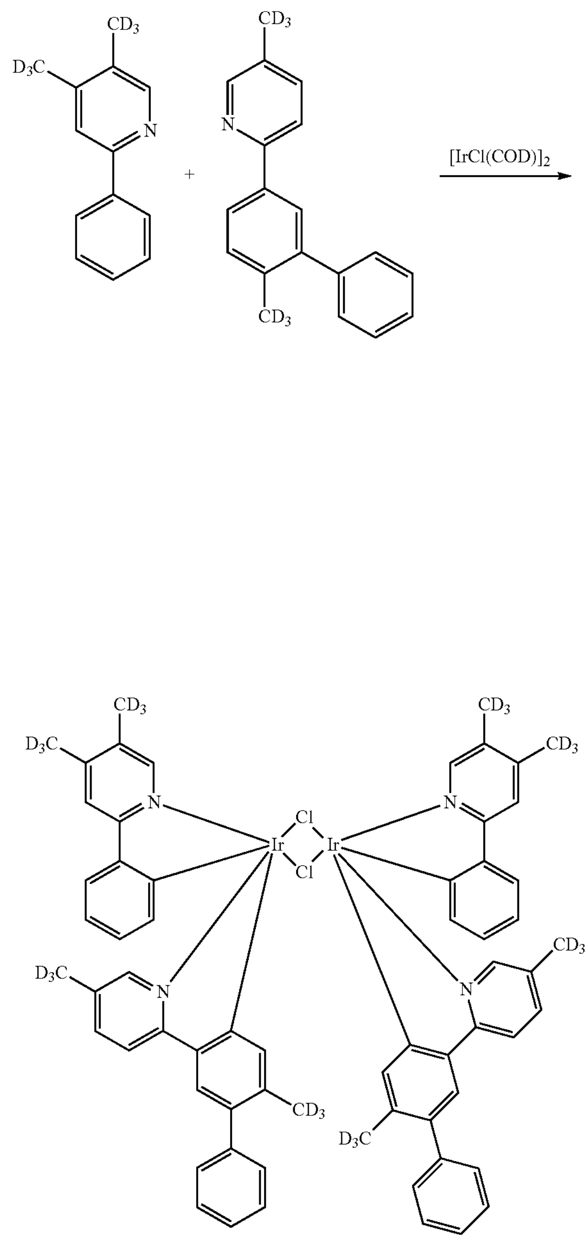

Under nitrogen atmosphere 4,5-bis(methyl-d3)-2-phenylpyridine (1.427 g, 7.54 mmol), 5-(methyl-d3)-2-(6-(methyl-d3)-[1,1'-biphenyl]-3-yl)pyridine (2 g, 7.54 mmol), and [IrCl(COD)]2 (2.53 g, 3.77 mmol) were dissolved in ethoxyethanol (50 ml) under nitrogen to give a red solution. The reaction mixture was heated to reflux for 1 hr, then precipitate was formed. Added 30 mL more of ethoxyethanol and continued to reflux for 48 hrs, then the reaction mixture was cooled down to room temperature. The crude material was used without additional purification on the next step.

Step 5

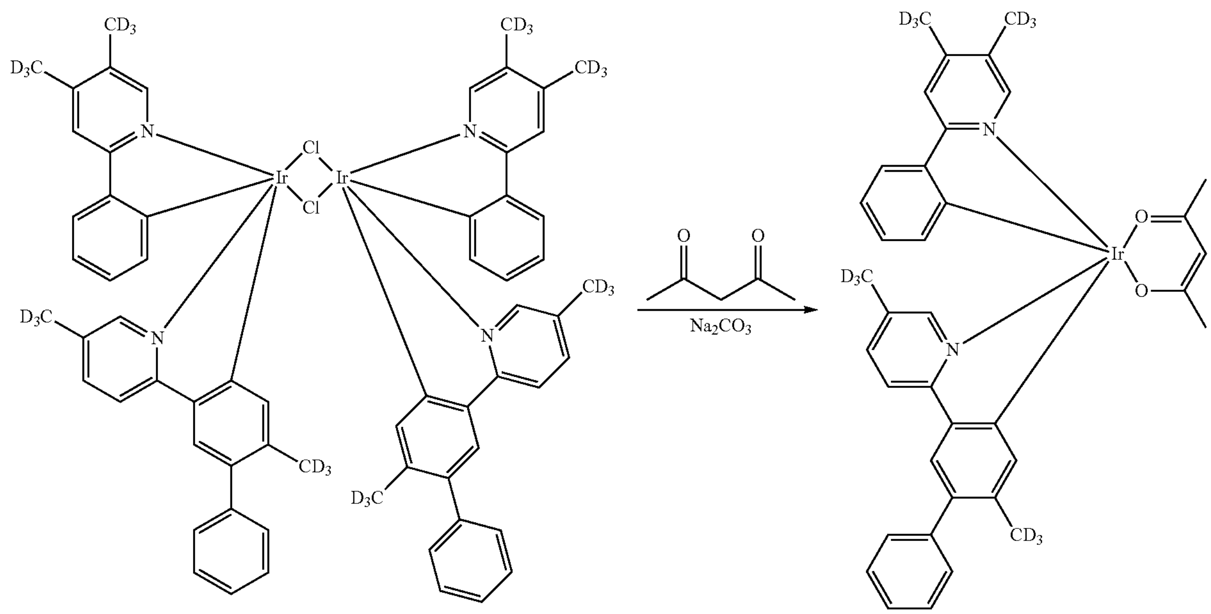

Iridium dimer suspended in ethoxyethanol was mixed under nitrogen atmosphere with pentane-2,4-dione (2.59 g, 25.9 mmol) and sodium carbonate (3.43 g, 32.3 mmol) in 50 ml of methanol, stirred 24 hrs under nitrogen at 55° C. and evaporated. The yellow residue was subjected to column chromatography on silica gel column, eluted with gradient mixture heptanes/toluene, providing 5 g (36% yield) of the target complex.

Step 6

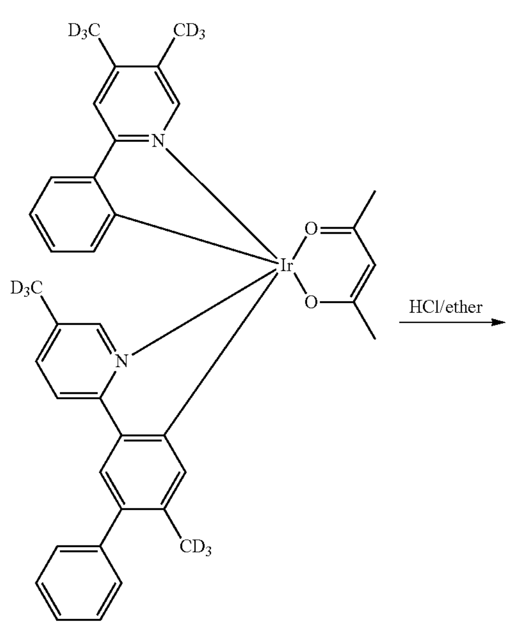

-continued

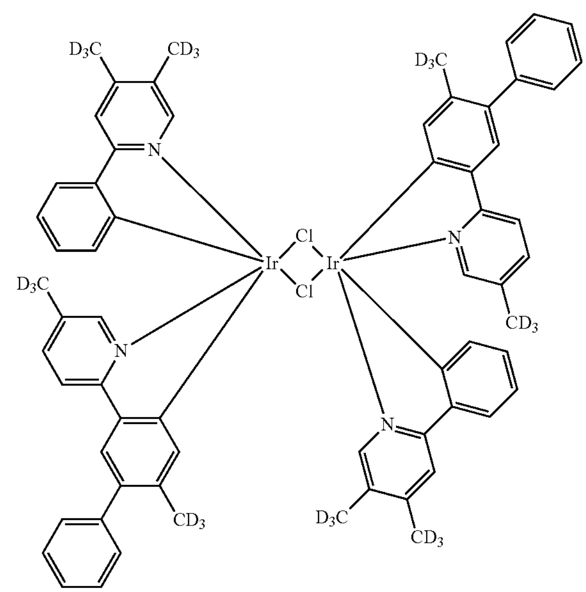

The acac complex (5 g, 6.72 mmol) was dissolved in DCM (20 mL), then HCl in ether (16.80 ml, 33.6 mmol) was added as one portion, stirred for 10 min, evaporated. The residue was triturated in methanol. The solid was filtered and washed with methanol and heptanes to obtain yellow solid (4.55 g, 100% yield).

Step 7

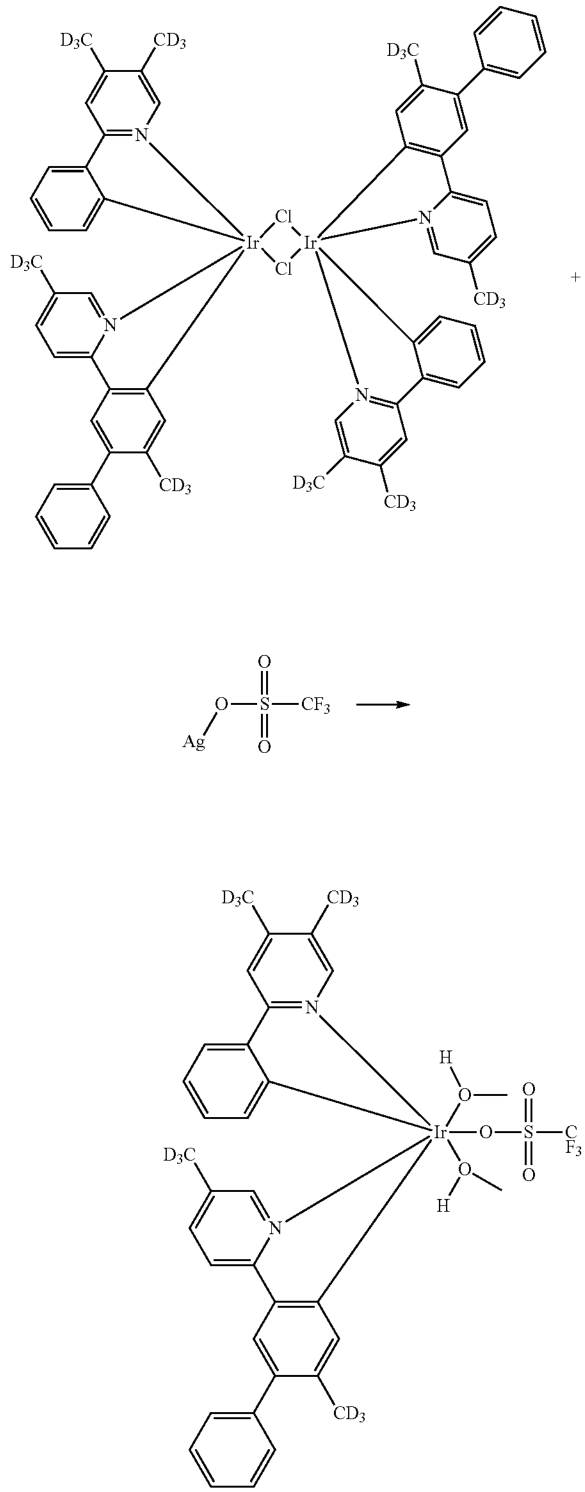

The Ir dimer (4.55 g, 3.34 mmol) and (((trifluoromethyl) sulfonyl)oxy)silver (2.062 g, 8.03 mmol) were suspended in 50 ml of DCM/methanol 1/1 (v/v) mixture and stirred over 72 hrs at room temperature, filtered through celite and evaporated, providing yellow solid (4.75 g, 83% yield).

Step 8

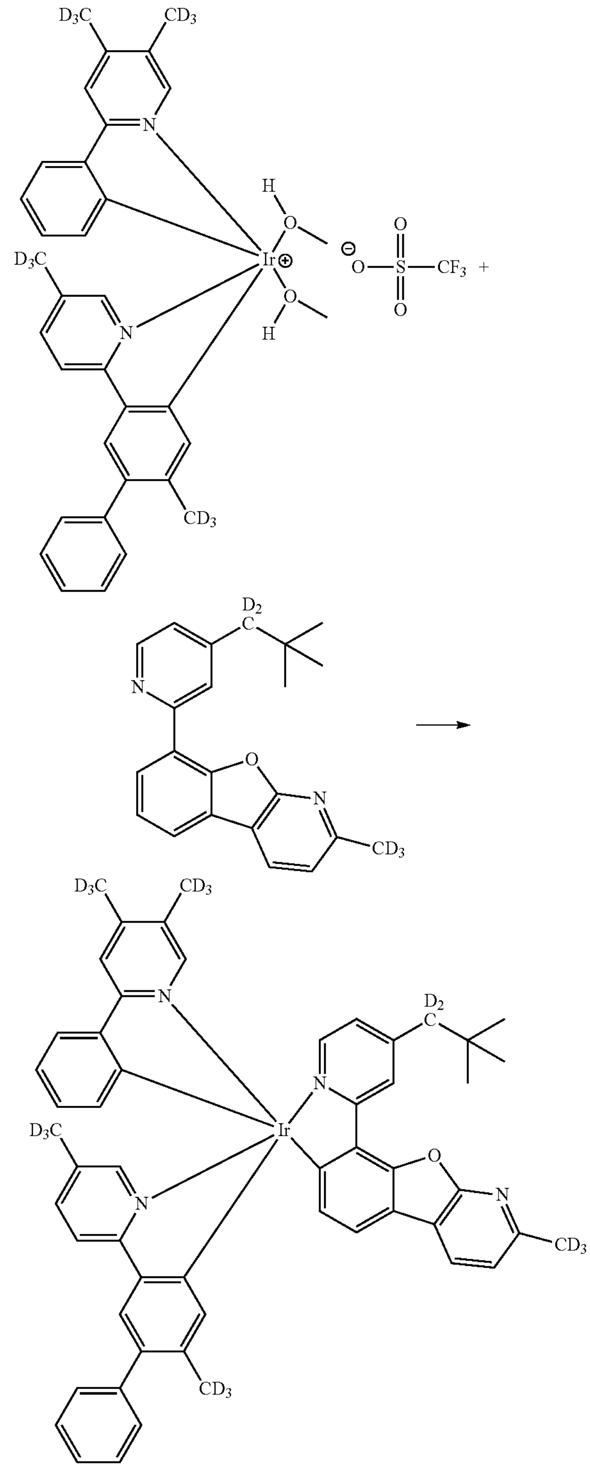

The mixture of triflic salt (3 g, 3.5 mmol) and 2-(13-methyl-d2)-8-(4-(2,2-dimethylpropyl-1,1-d2)pyridin-2-yl) benzofuro[2,3-b]pyridine (2.56 g, 7.7 mmol) in 30 mL of methanol were stirred under nitrogen at 65° C. for 5 days. Then material was cooled down, and methanol was evaporated. The residue was subjected to column chromatography on the silica gel column, eluted with 2% of ethyl acetate in toluene, providing two isomers of the product (1.7 g with high $R_f$ and 0.7 g of complex with low $R_f$). Complex with low $R_f$ is the target compound 673.

Device Examples

All example devices were fabricated by high vacuum ($<10^{-7}$ Torr) thermal evaporation. The anode electrode was 750 Å of indium tin oxide (ITO). The cathode consisted of 10 Å of Liq (8-hydroxyquinoline lithium) followed by 1,000 Å of A1. All devices were encapsulated with a glass lid sealed with an epoxy resin in a nitrogen glove box (<1 ppm of $H_2O$ and $O_2$) immediately after fabrication with a moisture getter incorporated inside the package. The organic stack of the device examples consisted of sequentially, from the ITO Surface: 100 Å of HAT-CN as the hole injection layer (HIL); 450 Å of HTM as a hole transporting layer (HTL); emissive layer (EML) with thickness 400 Å. Emissive layer containing H-host (H1): E-host (H2) in 6:4 ratio and 12 weight % of green emitter. 350 Å of Liq (8-hydroxyquinoline lithium) doped with 40% of ETM as the ETL. Device structure is shown in Table 1 below. Table 1 shows the schematic device structure. The chemical structures of the device materials are shown below.

H1

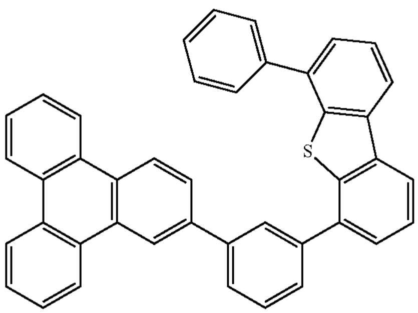

H2

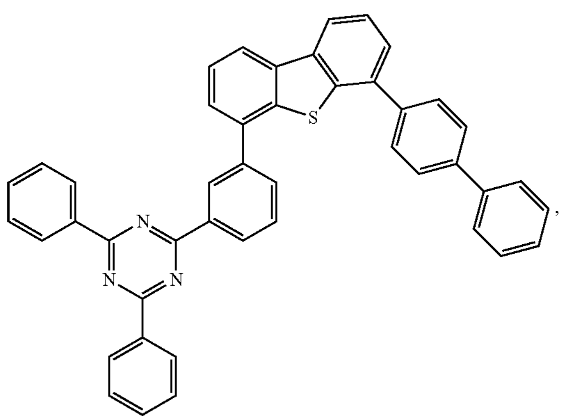

Compound 499

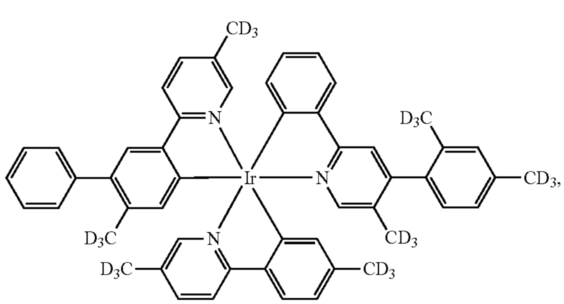

-continued

Compound 500

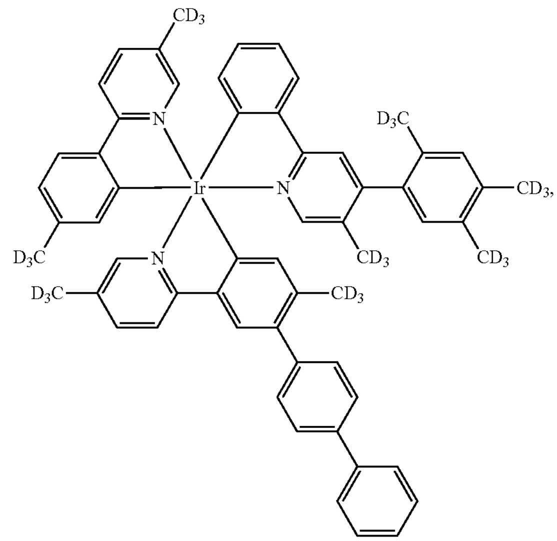

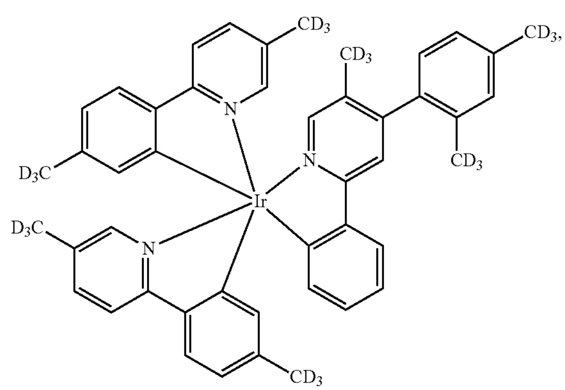

Comparative example

CC-1

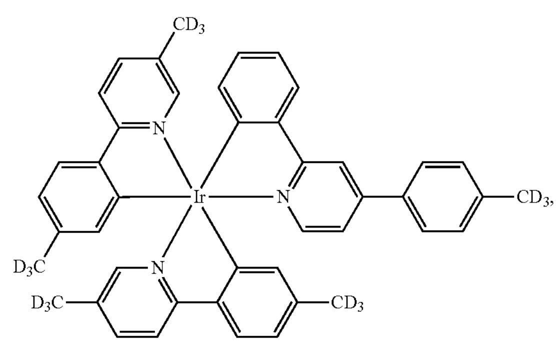

-continued

CC-2

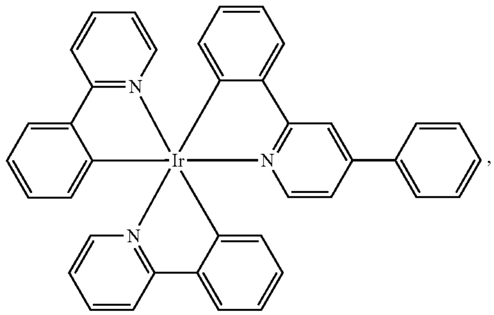

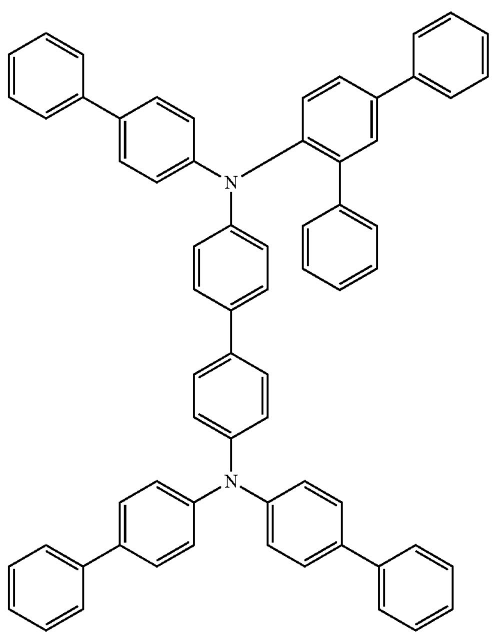

HTM

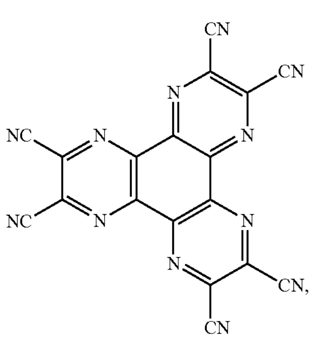

HATACN

-continued

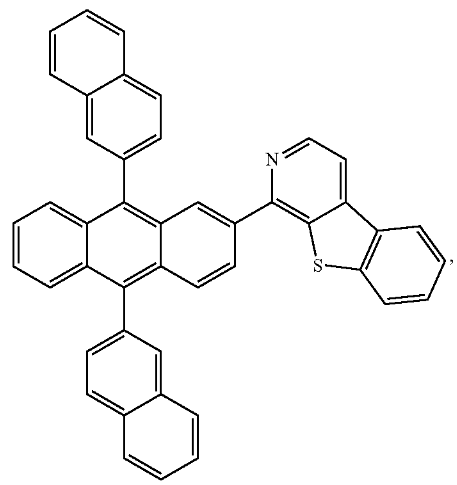

ETM

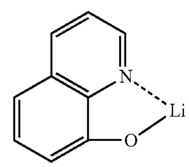

Liq

Upon fabrication the devices have been measured for EL, JVL, and lifetime tested at DC 80 mA/cm$^2$. Device performance is shown in Table 2, voltage, LE, EQE, PE, and LT97% are all normalized to the comparative compound.

TABLE 1

| schematic device structure | | |
|---|---|---|
| Layer | Material | Thickness [Å] |
| Anode | ITO | 800 |
| HIL | HAT-CN | 100 |
| HTL | HTM | 450 |
| Green EML | H1:H2: example dopant | 400 |
| ETL | Liq:ETM 40% | 350 |
| EIL | Liq | 10 |
| Cathode | Al | 1,000 |

TABLE 2

| Device performance | | | | | | | | | | |
|---|---|---|---|---|---|---|---|---|---|---|
| | 1931 CIE | | | | | | | | | |
| | | | λ | | At 10 mA/$cm^2$ | | | | at 80 mA/$cm^2$* | |
| Emitter [12%] | x | y | max [nm] | FWHM [nm] | Voltage [rel] | LE [rel] | EQE [rel] | PE [rel] | Lo [nits] | $LT_{97\%}$ [rel] |
| Comparative example | 0.319 | 0.624 | 521 | 73 | 1.00 | 1.00 | 1.00 | 1.00 | 46,497 | 1.00 |
| Compound 500 | 0.315 | 0.628 | 519 | 71 | 1.02 | 1.04 | 1.03 | 1.02 | 46,542 | 1.70 |
| Compound 499 | 0.313 | 0.628 | 518 | 71 | 0.99 | 1.12 | 1.12 | 1.14 | 51,738 | 3.00 |

Comparing compounds 499 and 500 with the comparative example; the efficiency of both compound 499 and 500 are higher than the comparative example. Presumably compound 499 and compound 500 have higher horizontal emitting dipole orientation than comparative example. Elongated and planar substituents with high electrostatic potential enlarge the interacting surface region between Ir complex and host molecules; resulting in stacking Ir complexes parallel to film surface and increasing the out coupling efficiency. Moreover; the $LT_{97\%}$ at 80 mA/$cm^2$ of both compound 499 and compound 500 is greater than comparative example; indicating the elongated substituents not only increase the efficiency; but also increase the stability of the complexes in device.

Provided in Table 3 below is a summary of the device data recorded at 9000 nits for device examples, the EQE value is normalized to Device C-2.

TABLE 3

| Device ID | Dopant | Color | EQE (%) |
|---|---|---|---|
| Device 3 | Compound 501 | Yellow | 1.24 |
| Device C-1 | CC-1 | Yellow | 1.10 |
| Device C-2 | CC-2 | Yellow | 1.00 |

The data in Table D2 show that the device using the inventive compound as the emitter achieves the same color but higher efficiency in comparison with the comparative examples. It is noted that the only difference between the inventive compound (Compound 501) and the comparative compound (CC-1) is that the inventive compound has a phenyl moiety replacing one of the protons in the comparative compounds, which increases the distance between the terminal atoms in one direction across the Ir metal center. The device results show that the larger aspect ratio of the emitter molecule seems to be critical in achieving higher device efficiency.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804 and US2012146012.

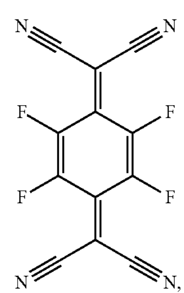

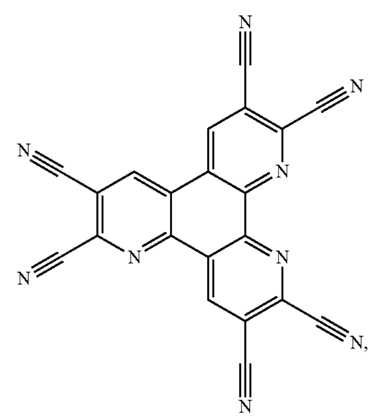

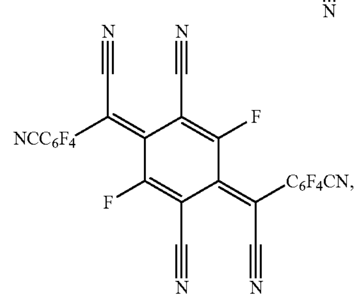

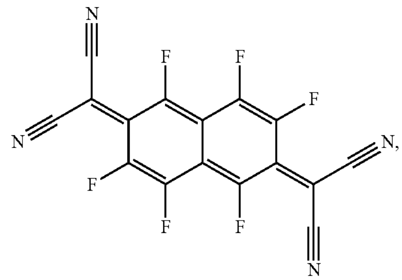

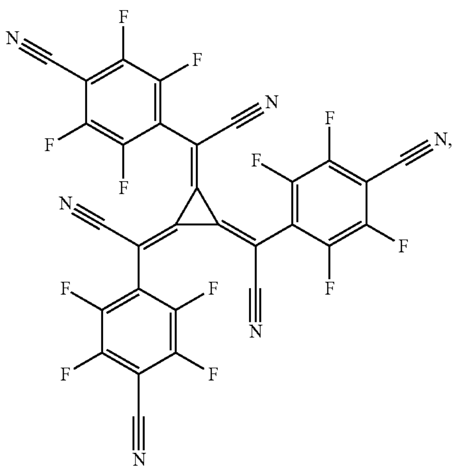

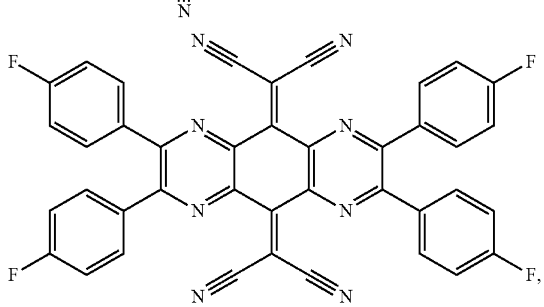

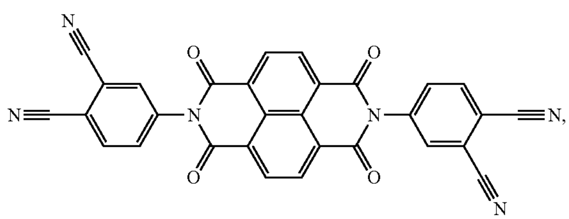

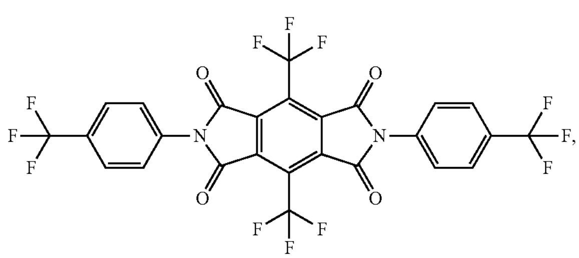

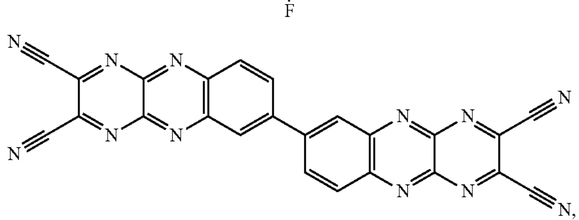

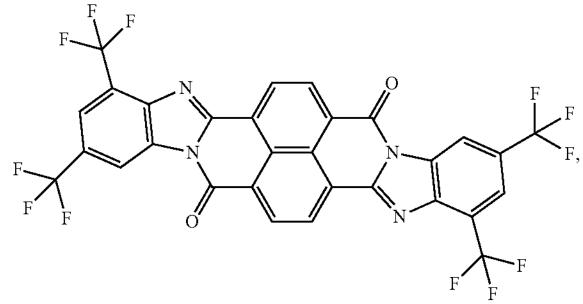

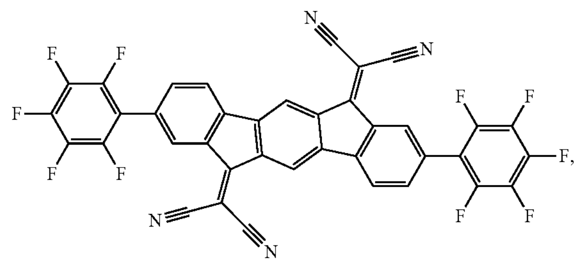

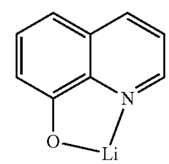

, and

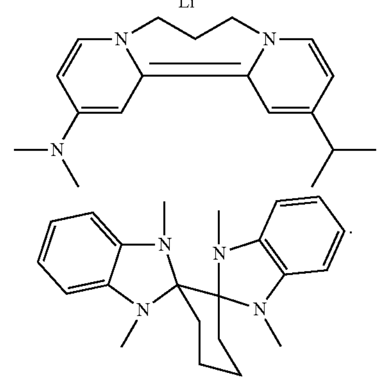

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

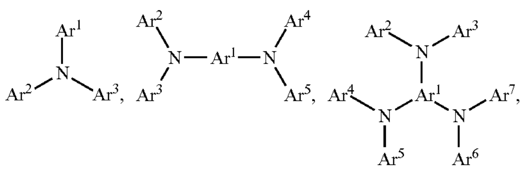

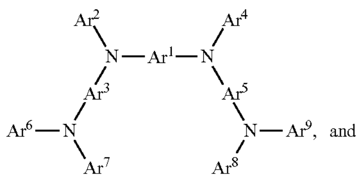

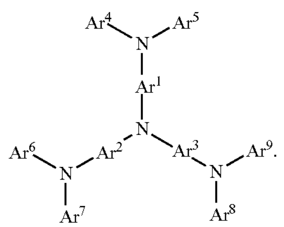

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

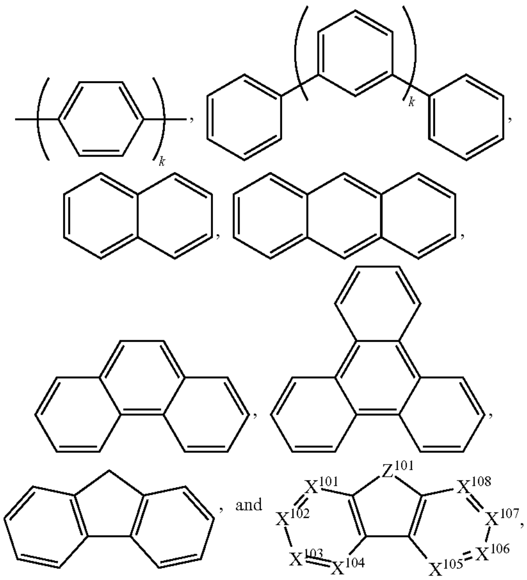

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

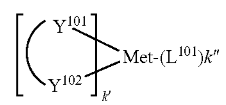

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S.

Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.
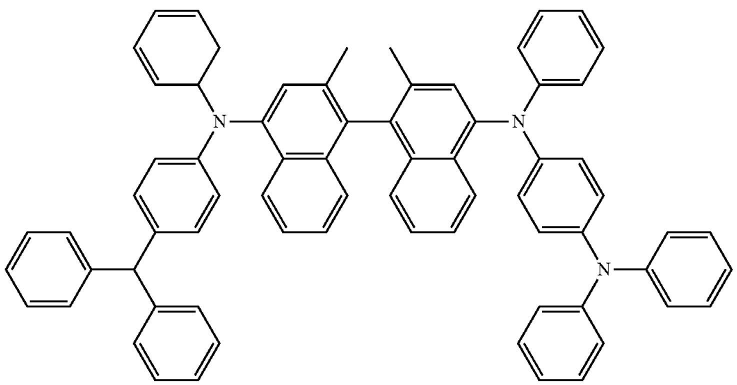
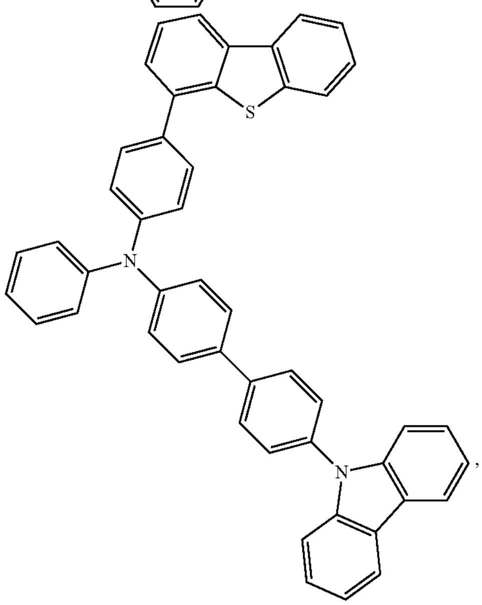
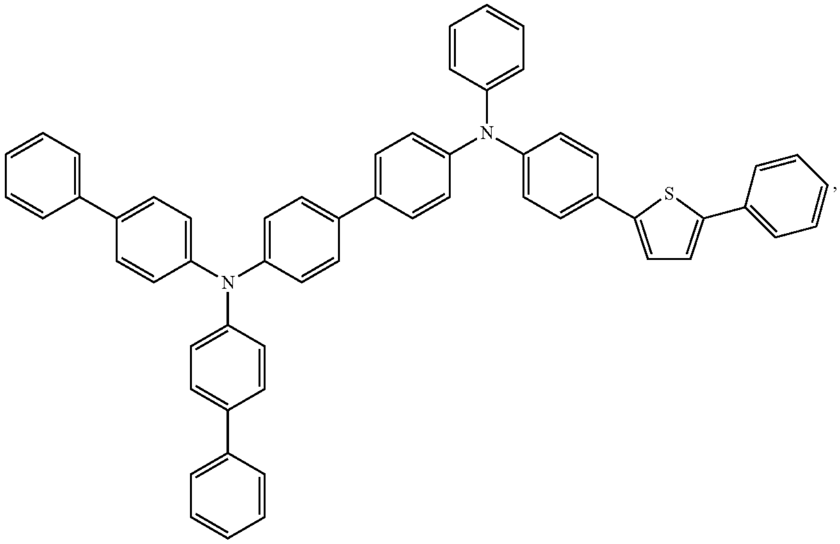

-continued
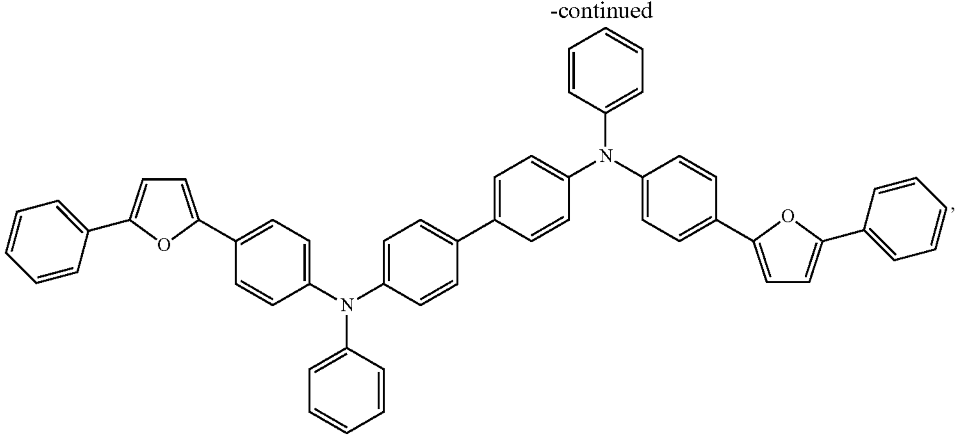
,
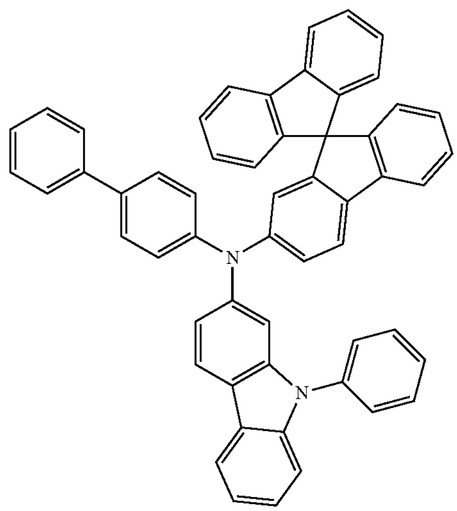
,
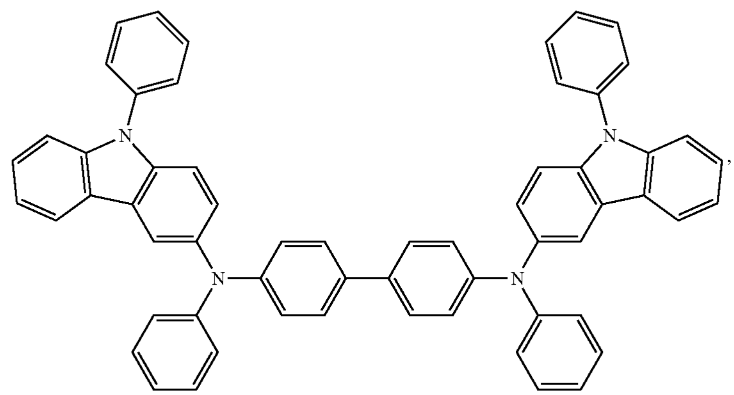
,
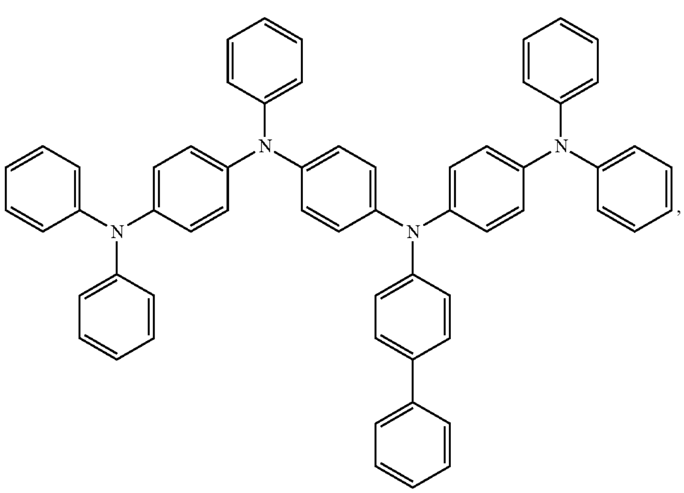
,

-continued
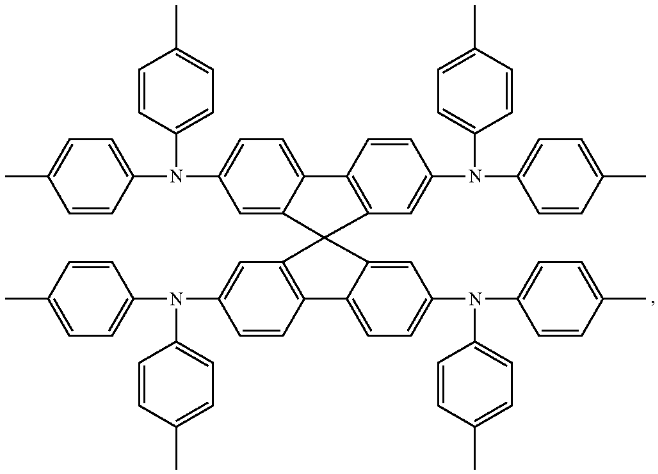
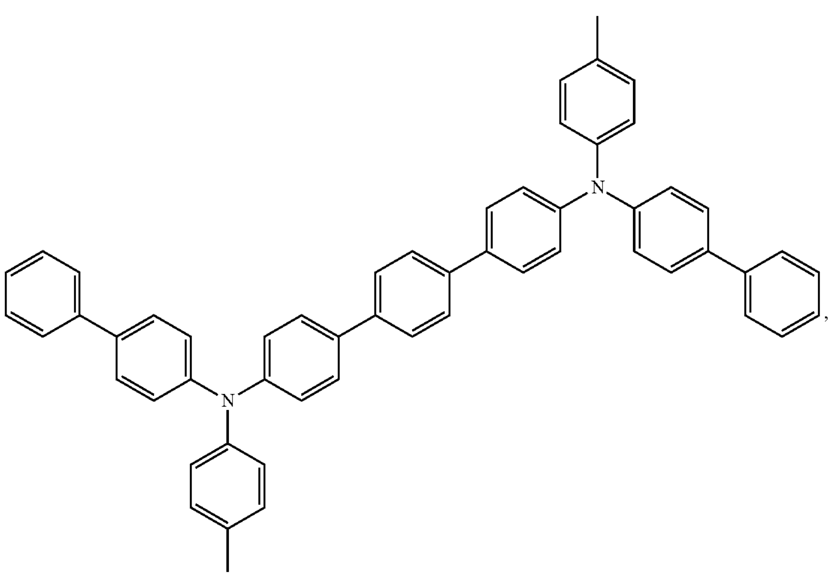

-continued
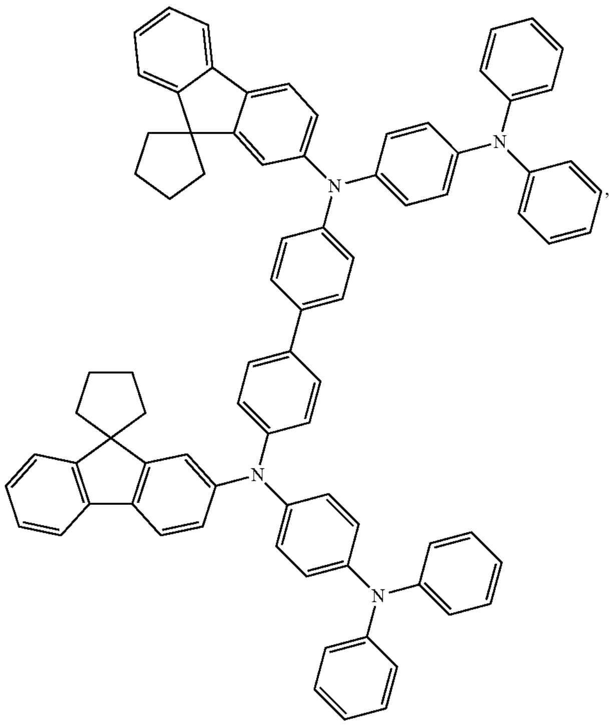
,
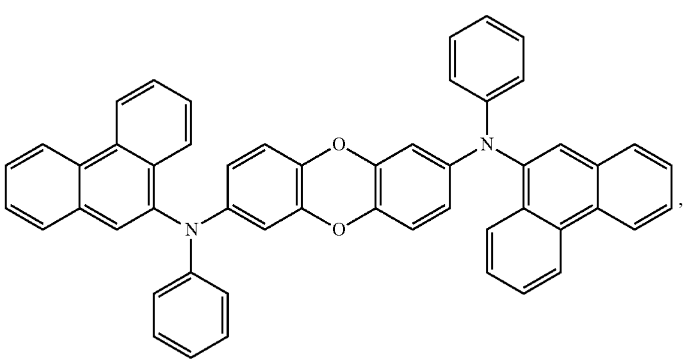
,
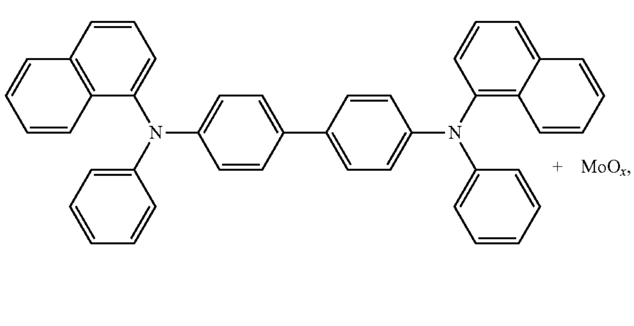
+ $MoO_x$,

-continued
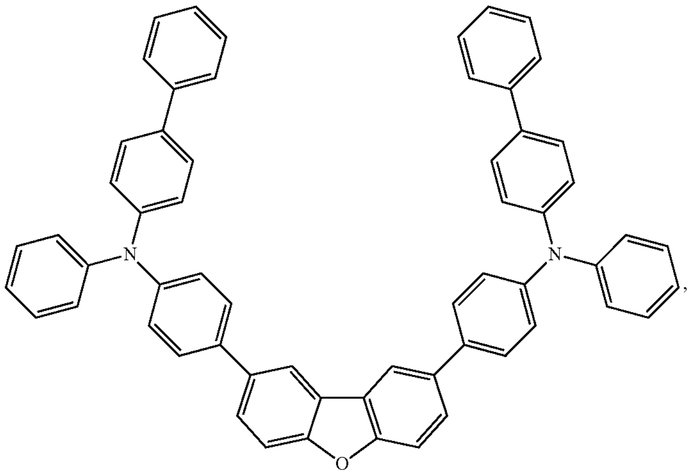
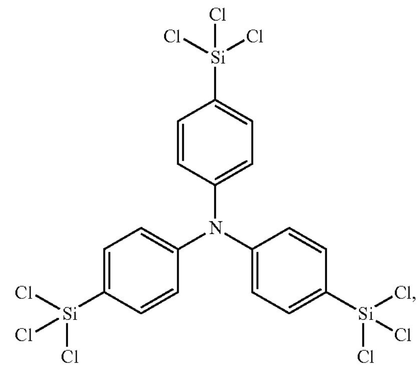
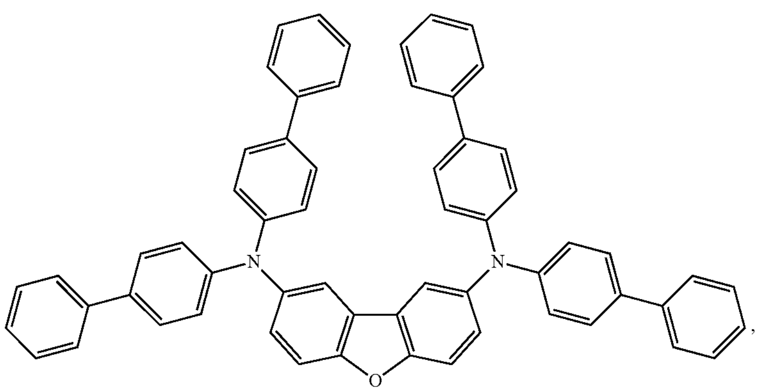
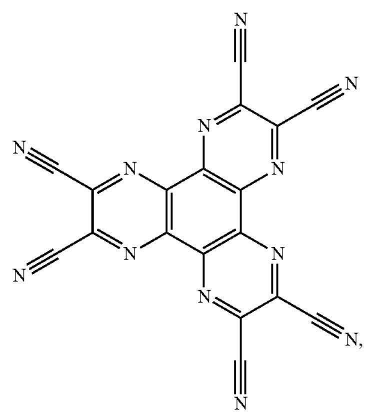
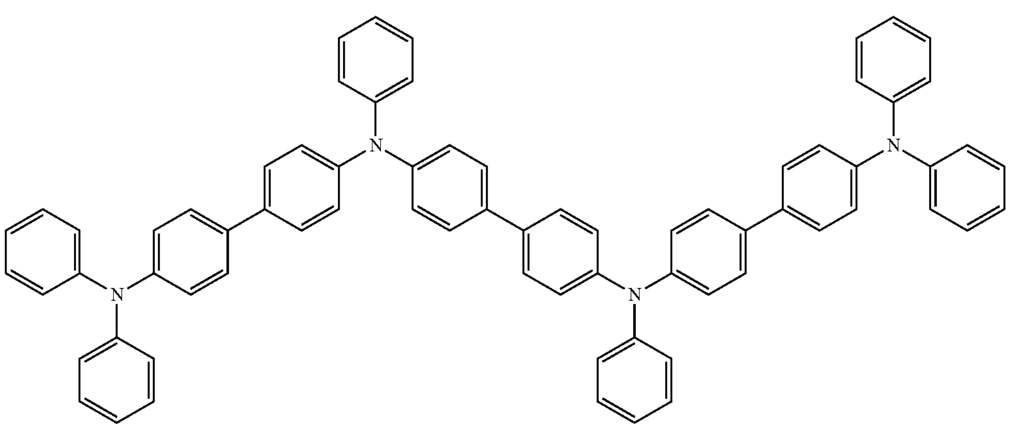
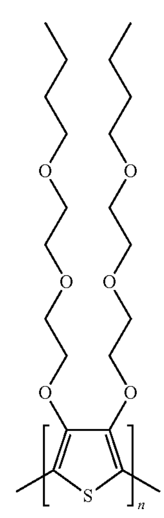

-continued
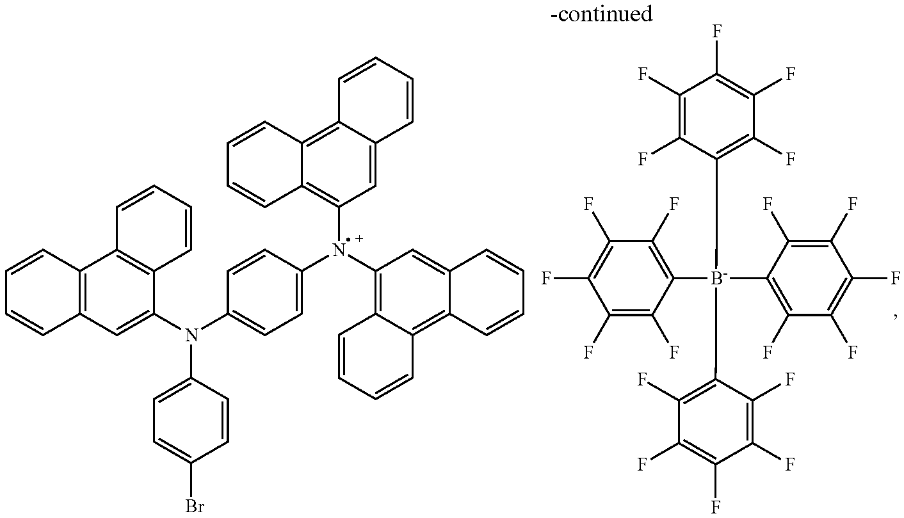
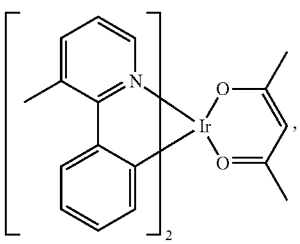
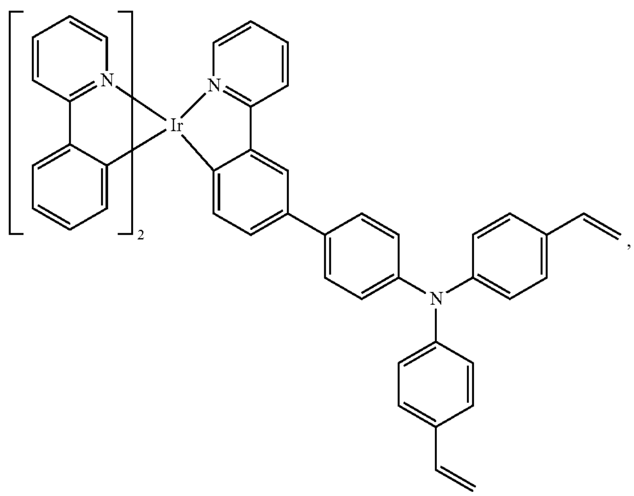
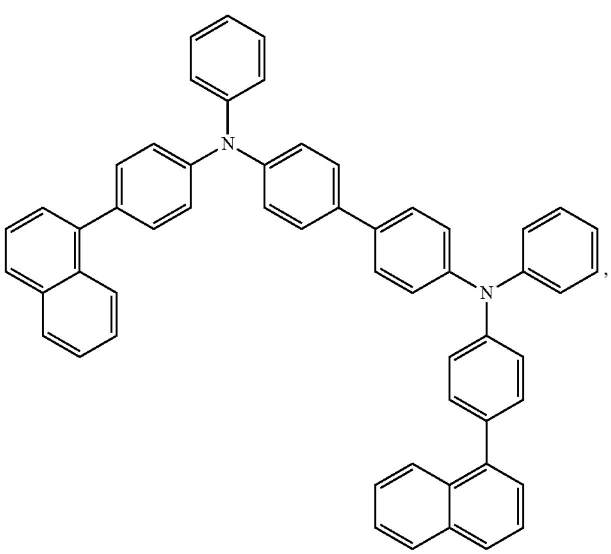

-continued
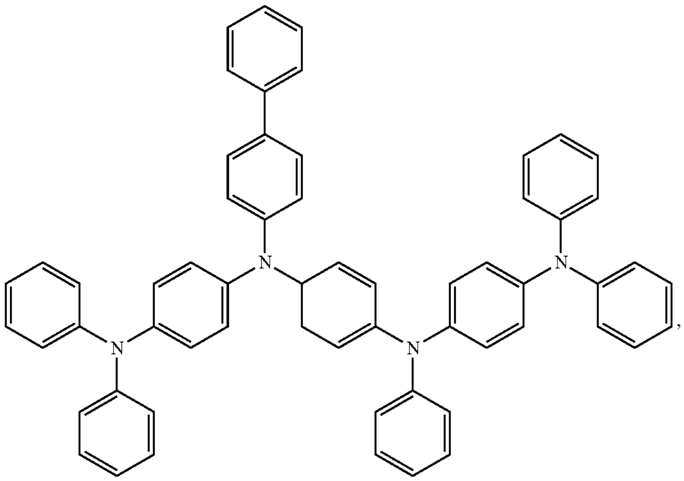
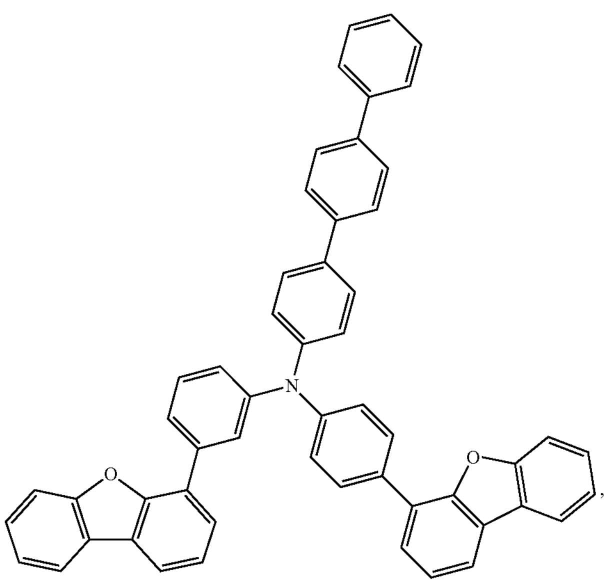
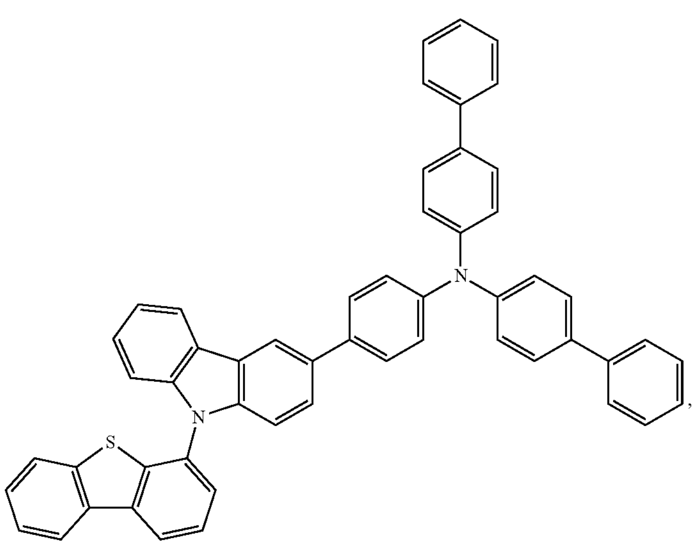

-continued
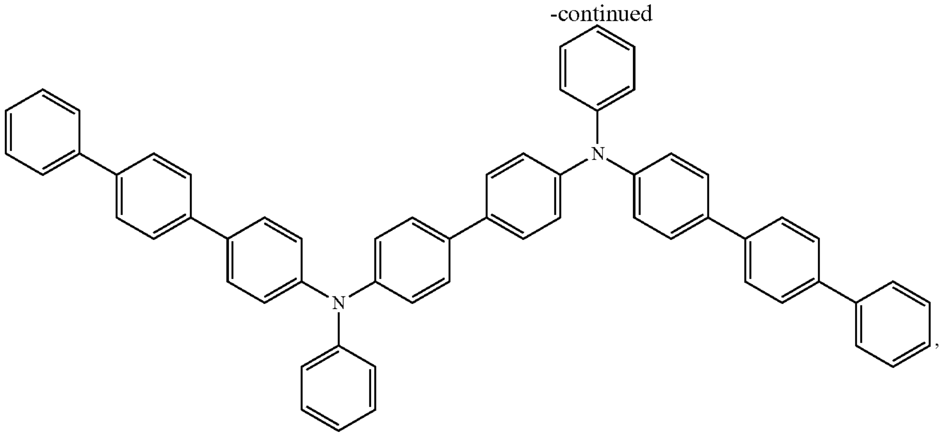
,
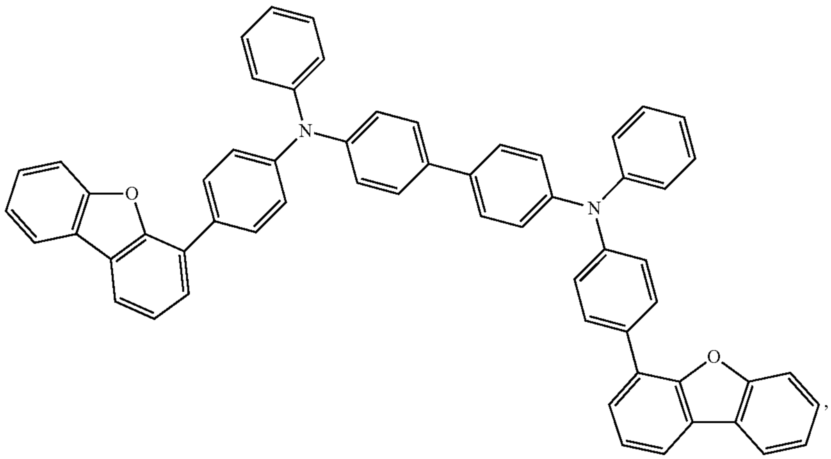
,
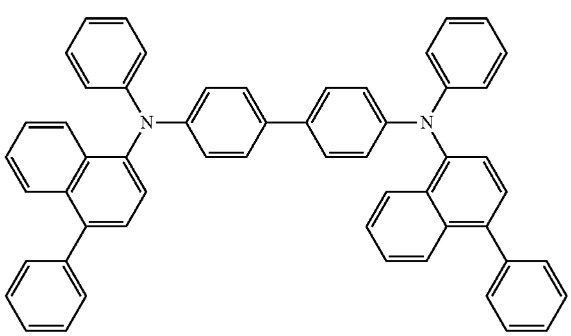
,
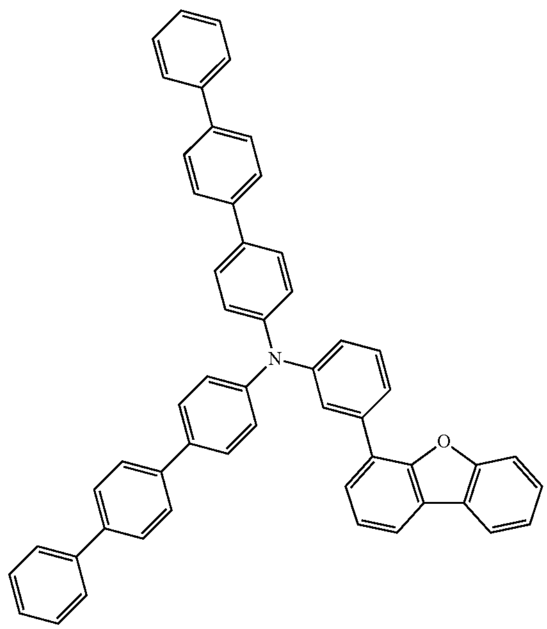
,

-continued
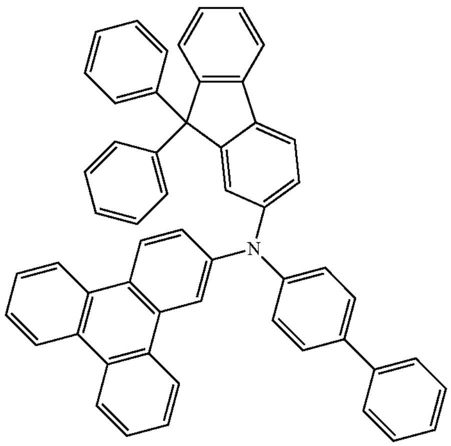
,
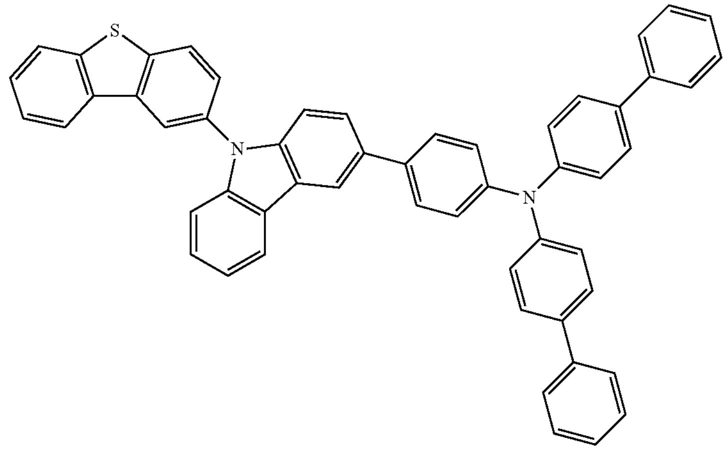
,
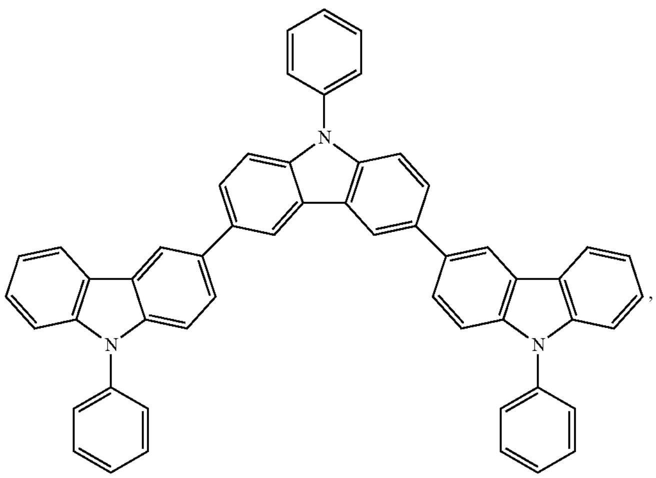
,
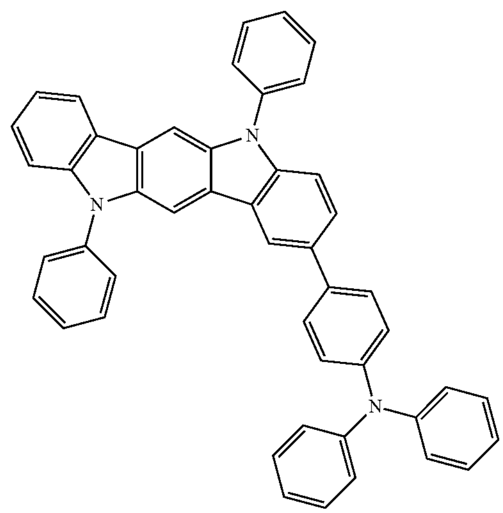
,
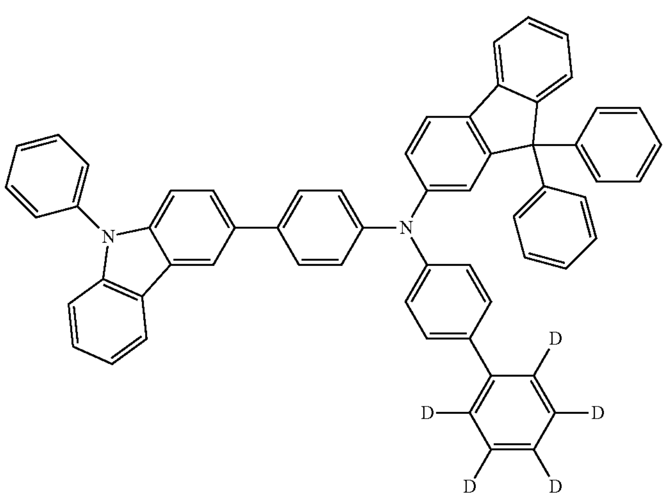
, -continued
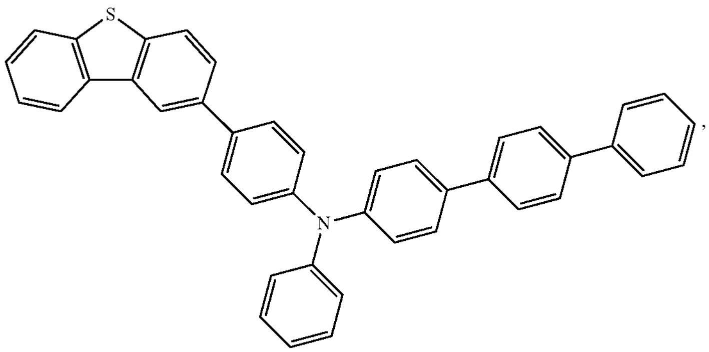
,
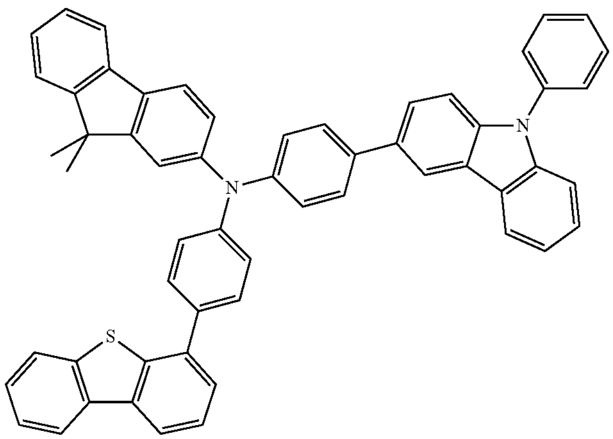
,
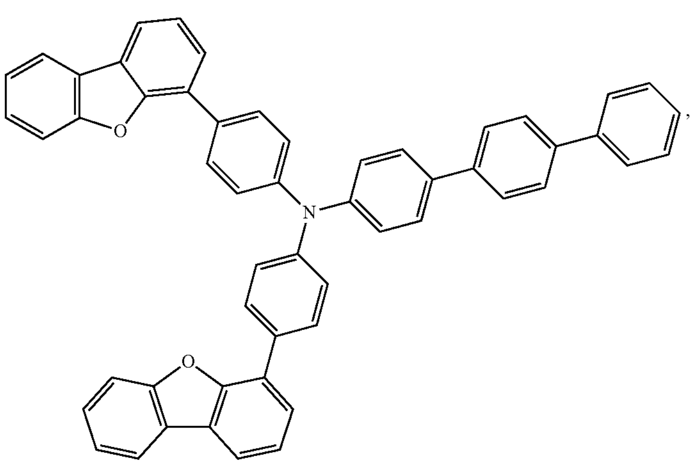
, -continued
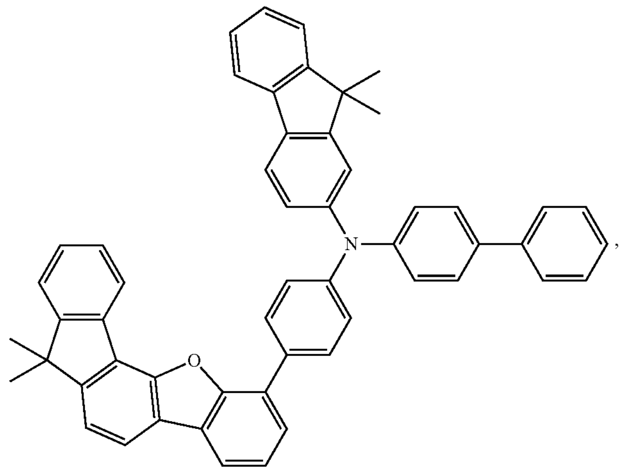
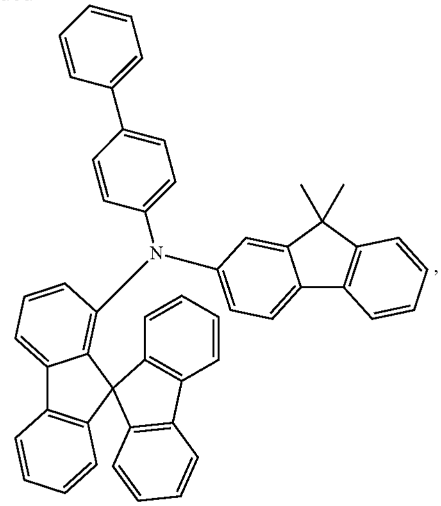
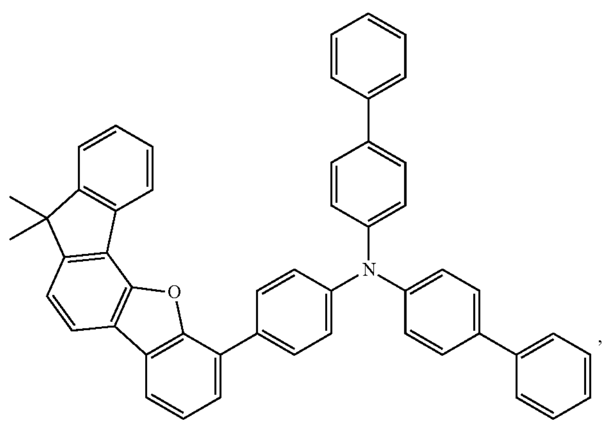
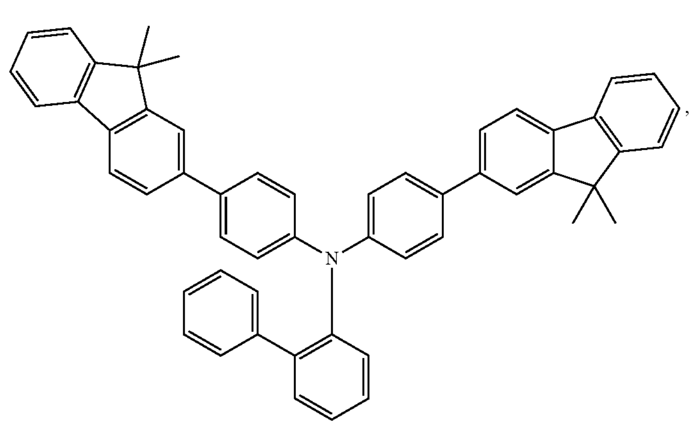

-continued
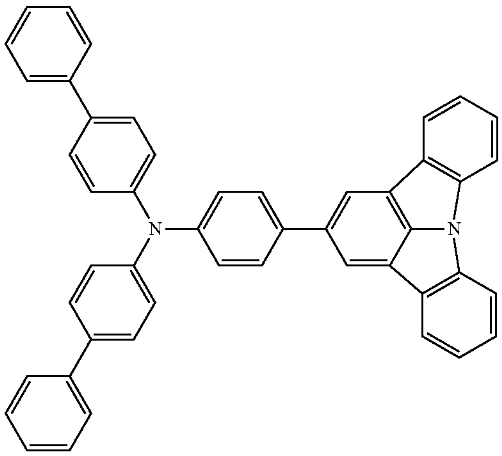
,
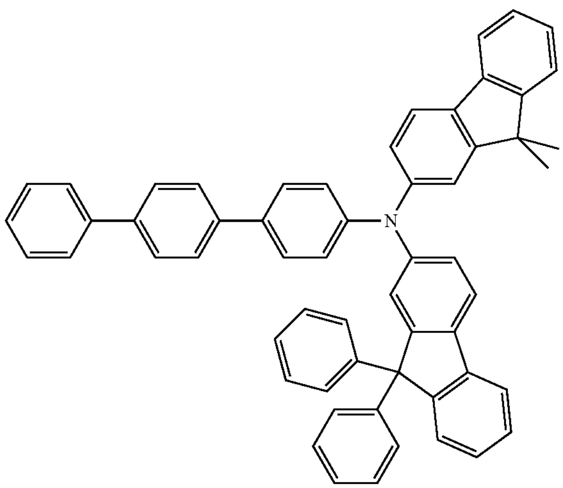
,
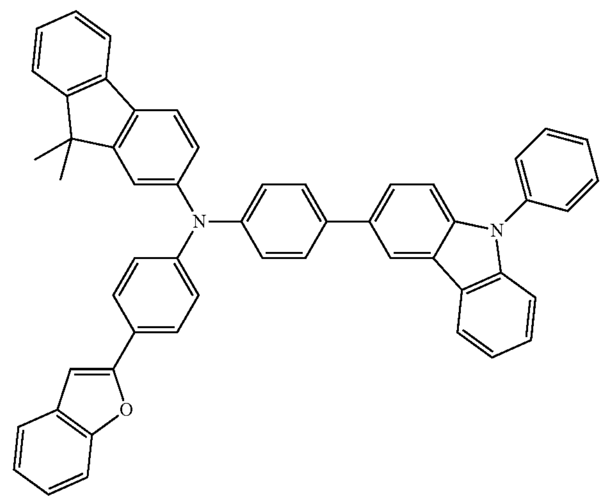
,
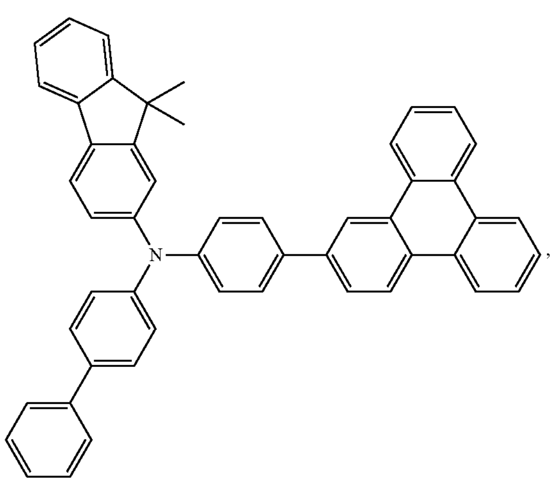
,
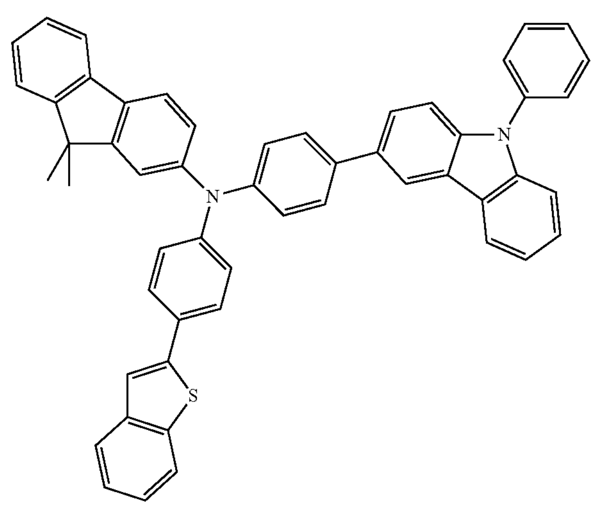
, -continued
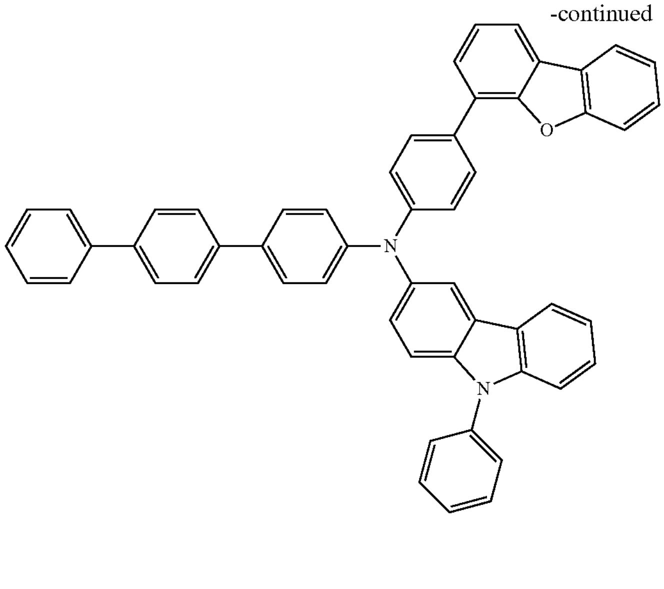
,
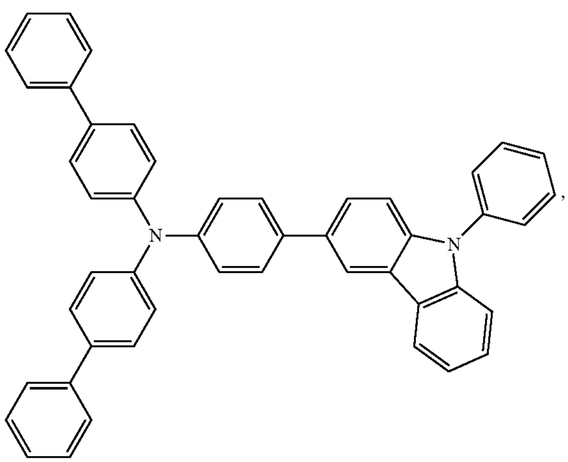
,
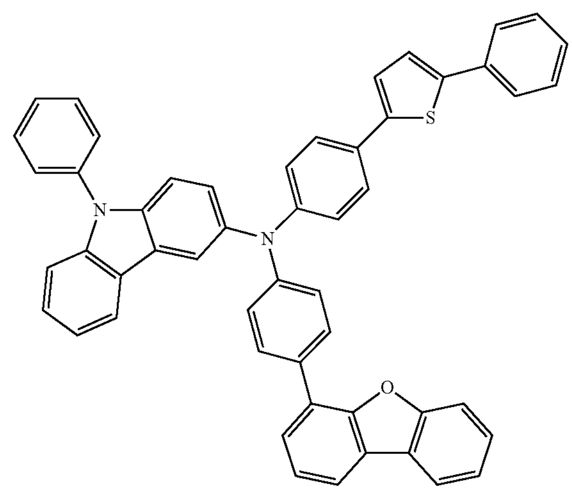
,
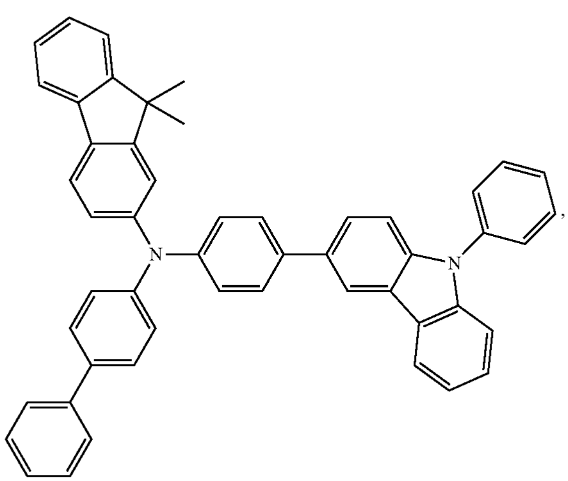
,
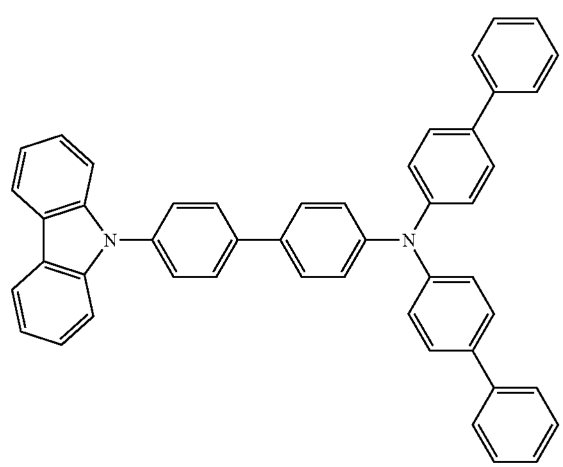
, -continued
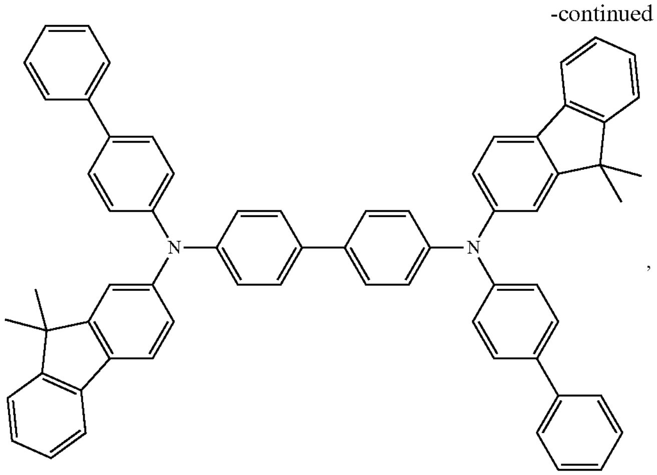
,
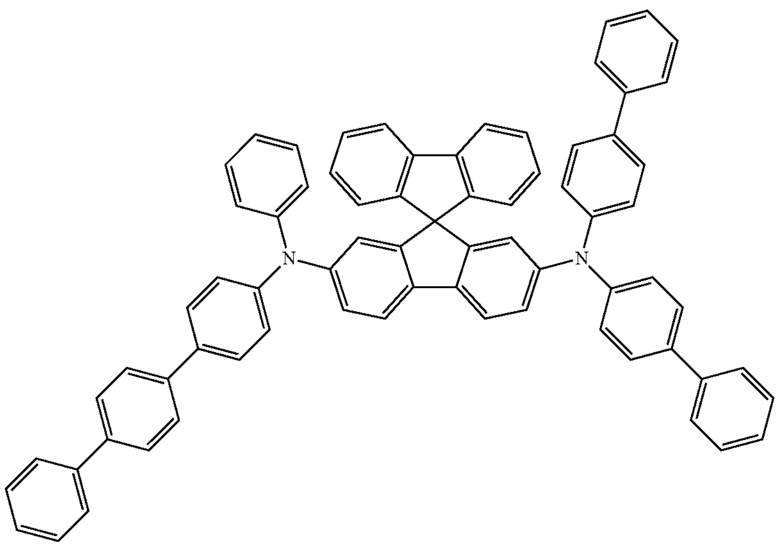
,
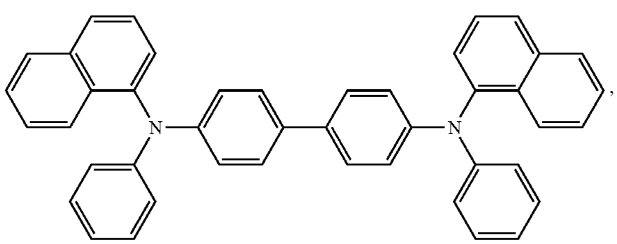
,
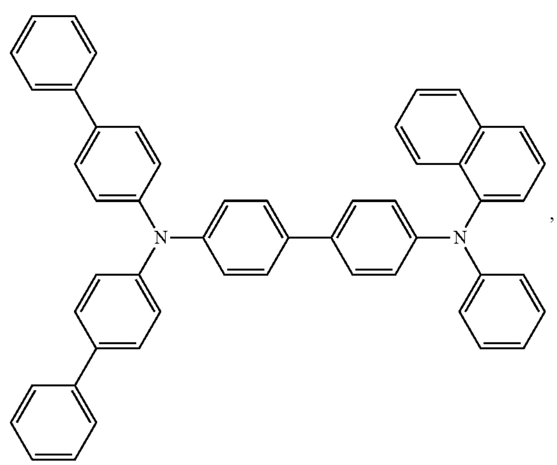
, -continued
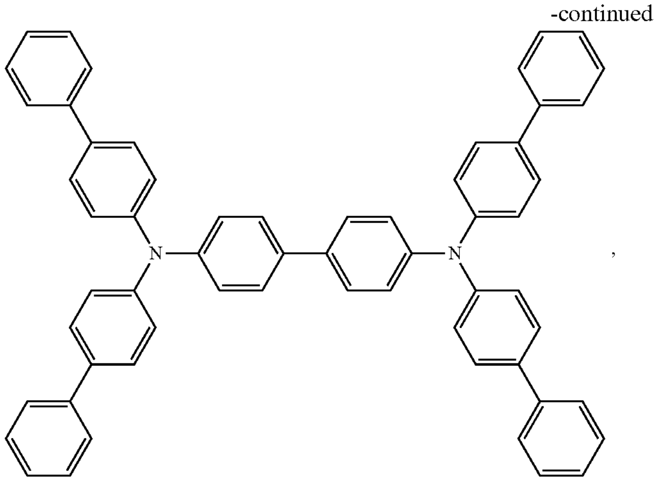
,
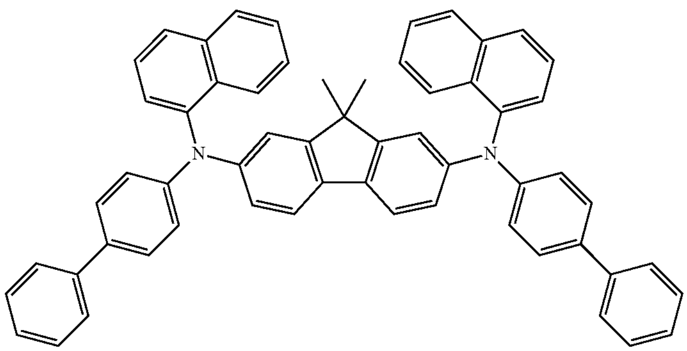
,
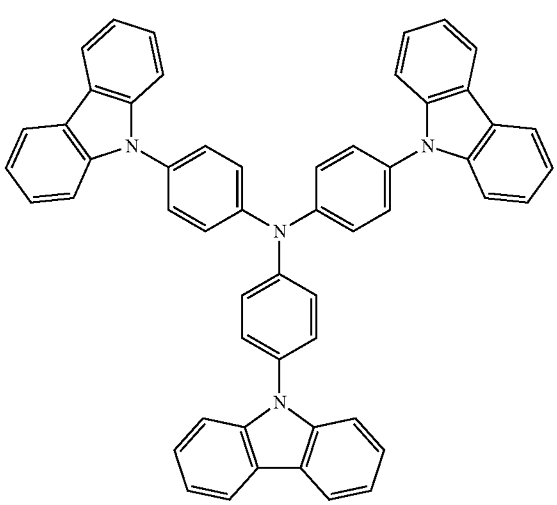
,
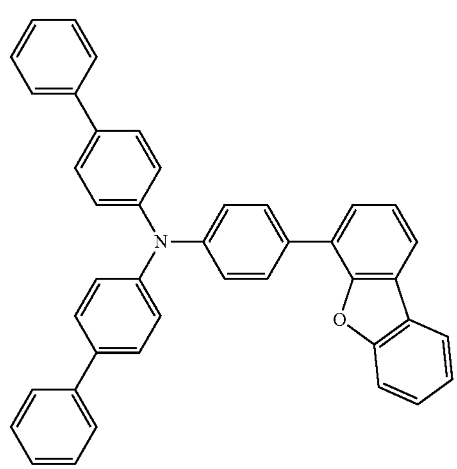
, -continued

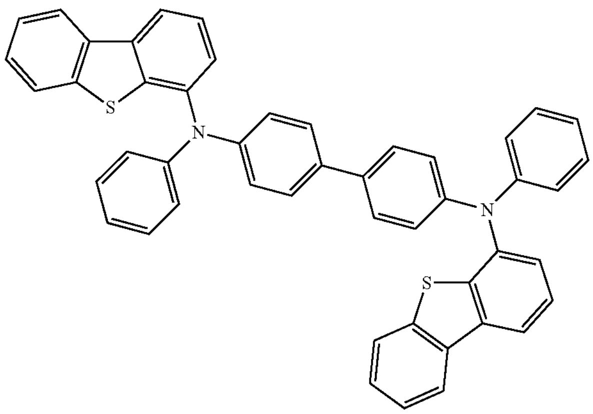

,

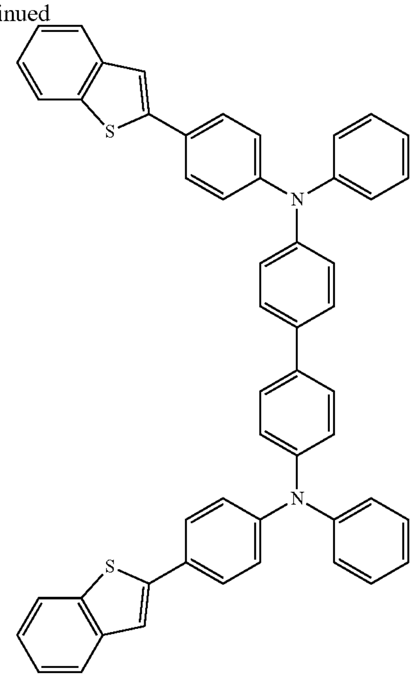

, and

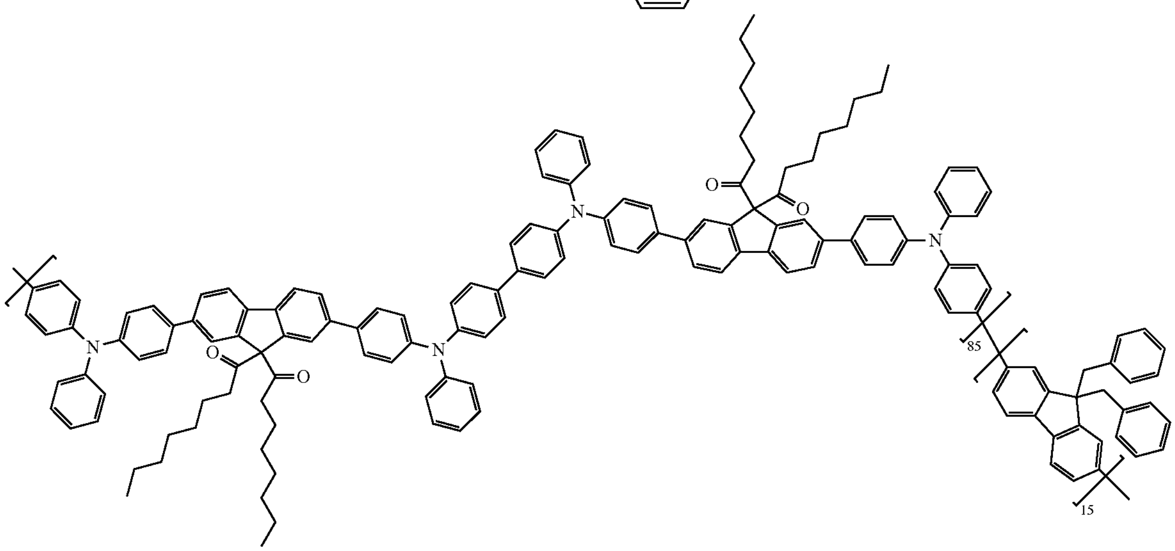

.

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

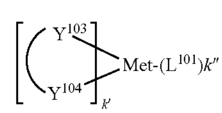

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

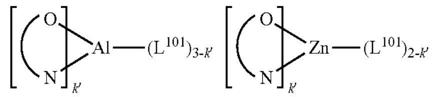

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the host compound contains at least one of the following groups in the molecule:

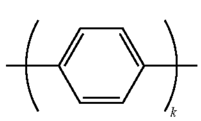,
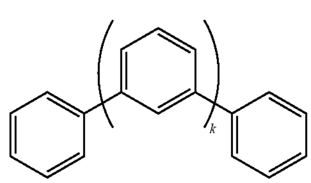,
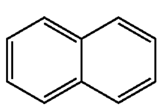,
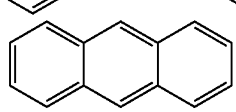,
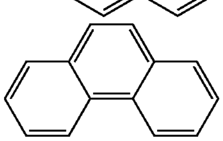,
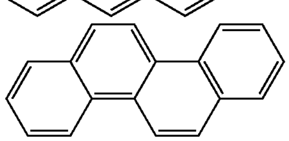, -continued

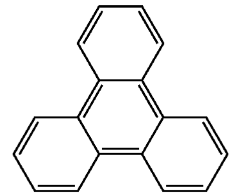,
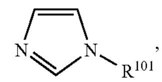,
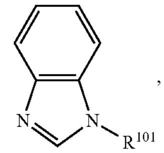,
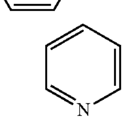,
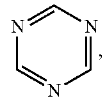,
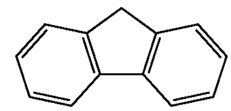,
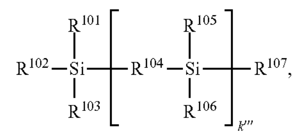
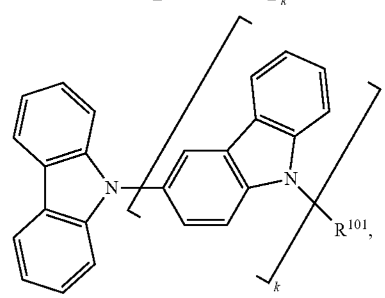
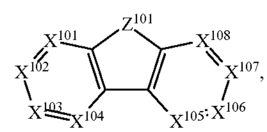
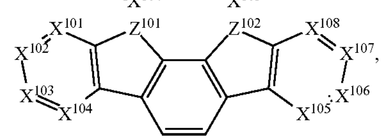
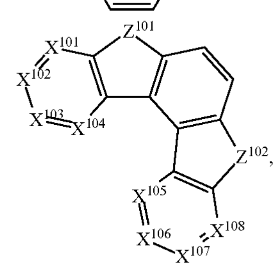
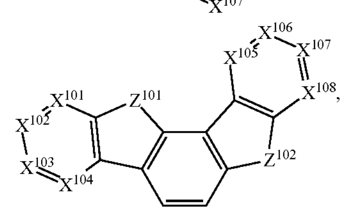
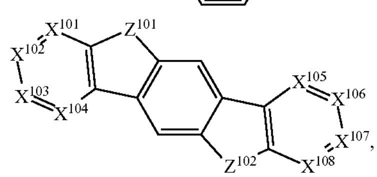 and -continued

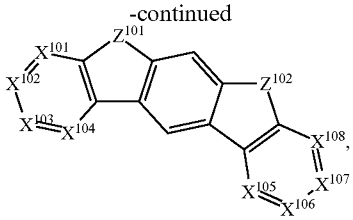

wherein each of $R^{101}$ to $R^{107}$ is independently selected from the group consisting of hydrogen deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20; k''' is an integer from 0 to 20. $X^{101}$ to $X^{108}$ is selected from C (including CH) or N.

$Z^{101}$ and $Z^{102}$ is selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472,

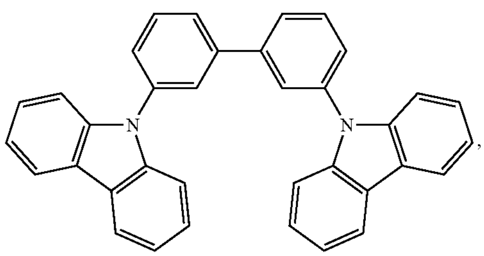

,

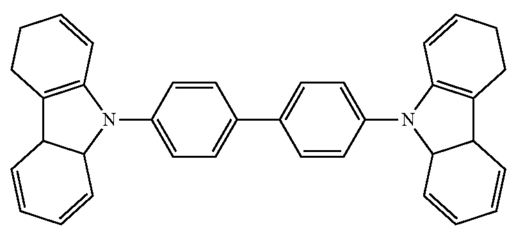

,

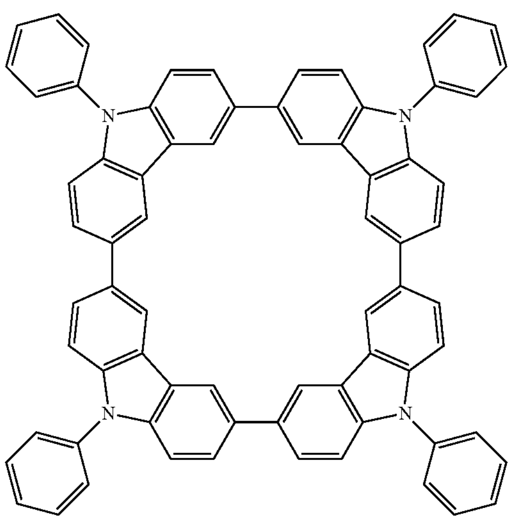

,

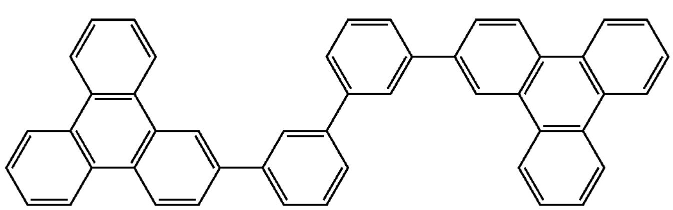
,

-continued
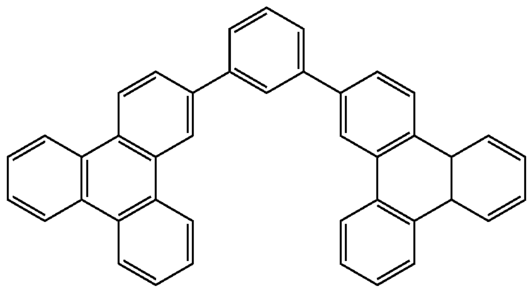,
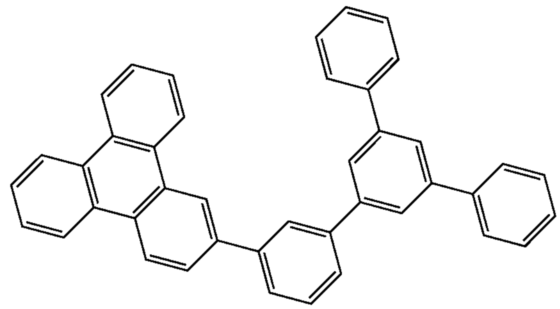,
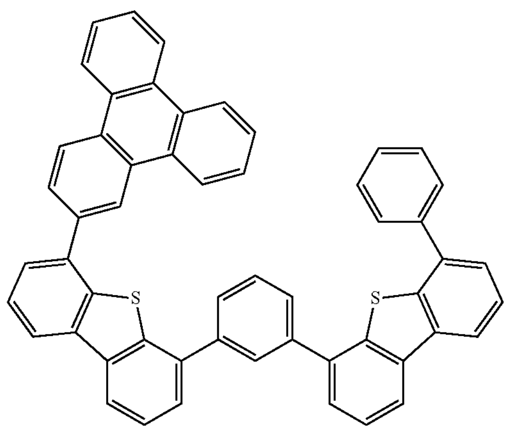,
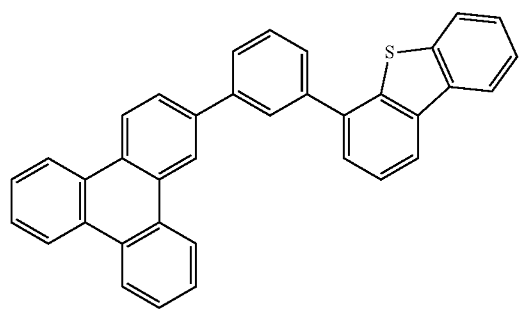,
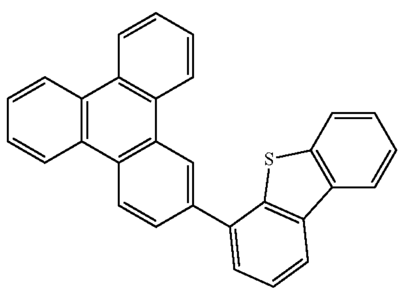,
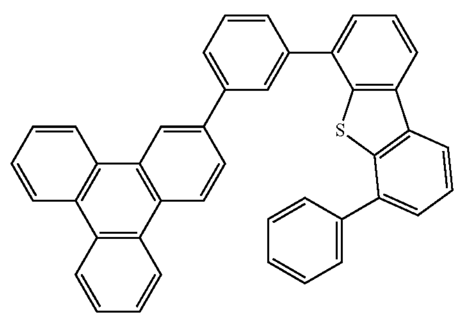,
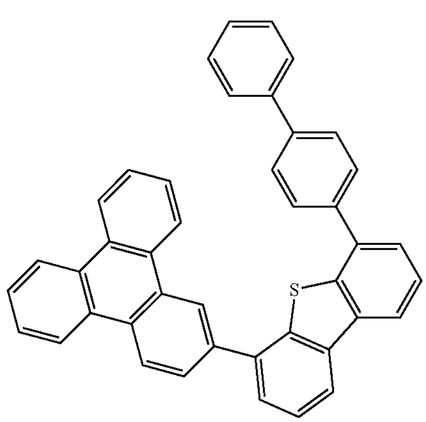,
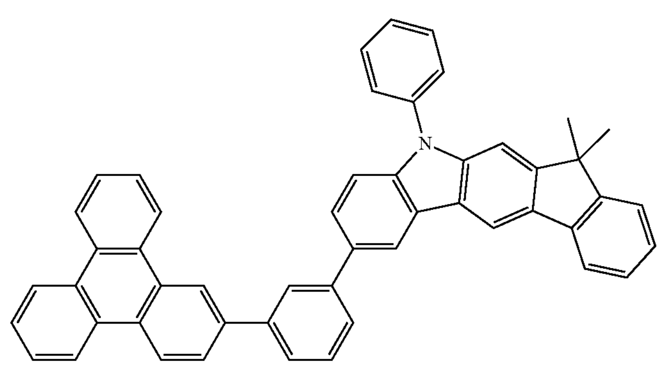, -continued
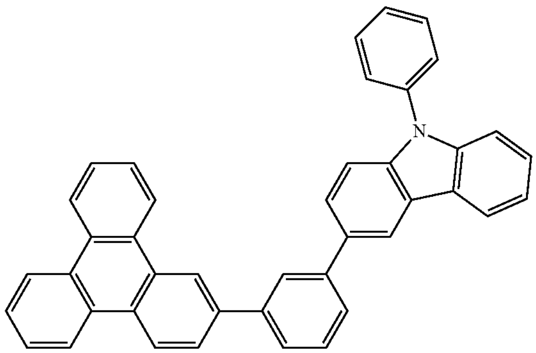
,
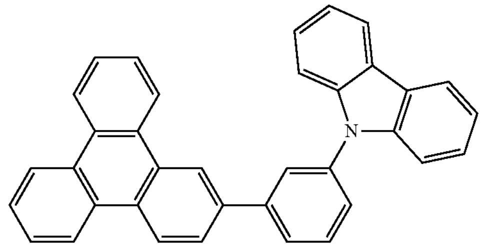
,
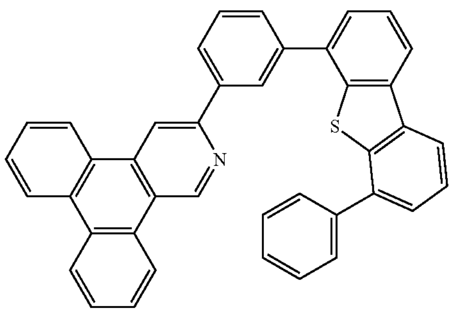
,
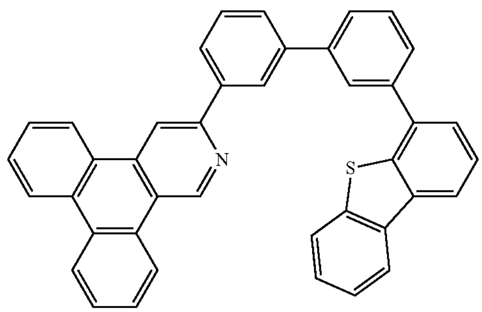
,
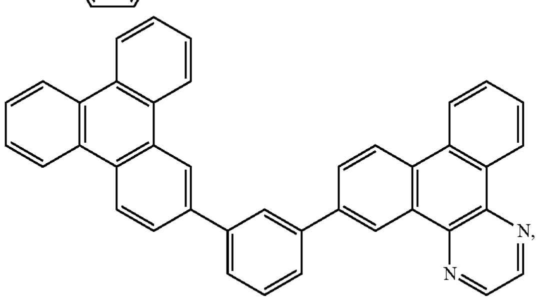
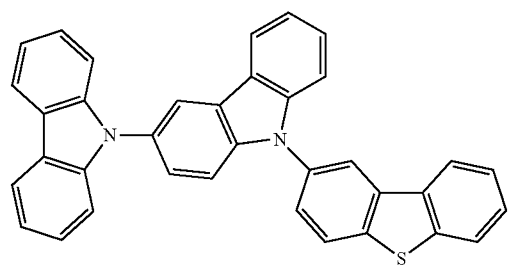
,
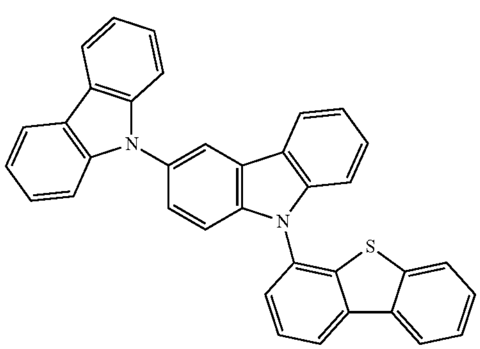
,
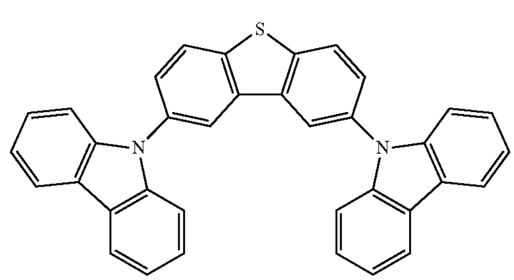
,
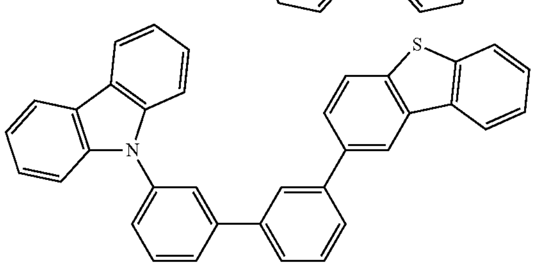
,
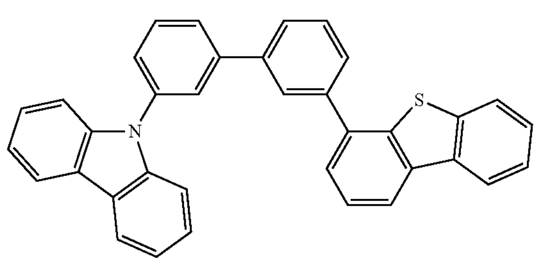
, -continued
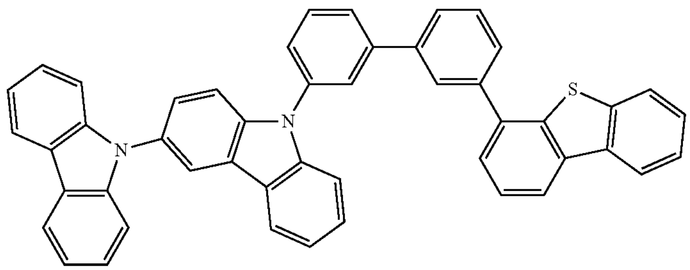
,
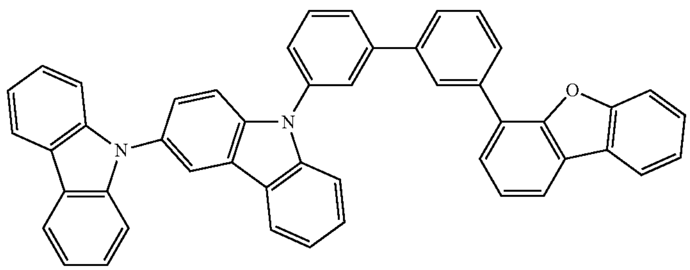
,
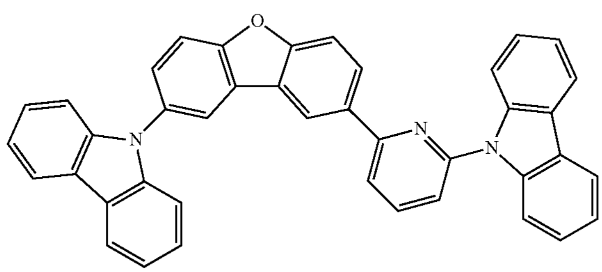
,
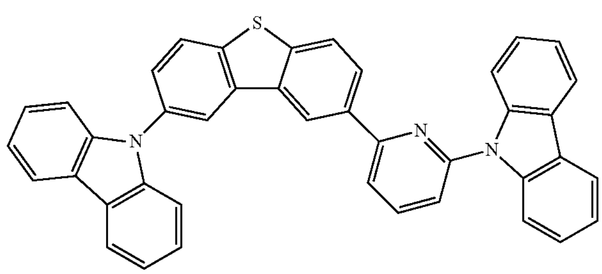
,
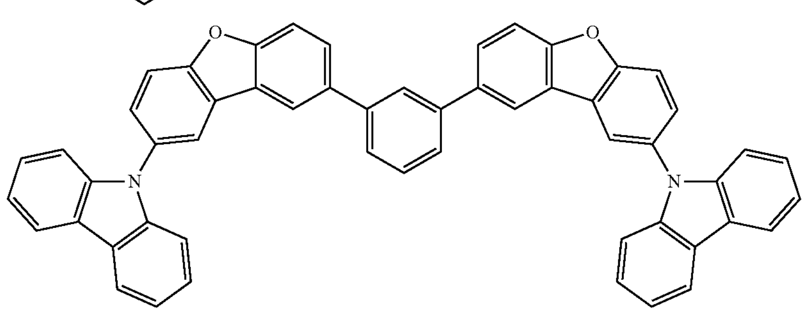
,
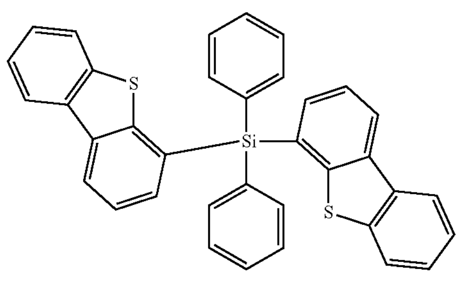
,
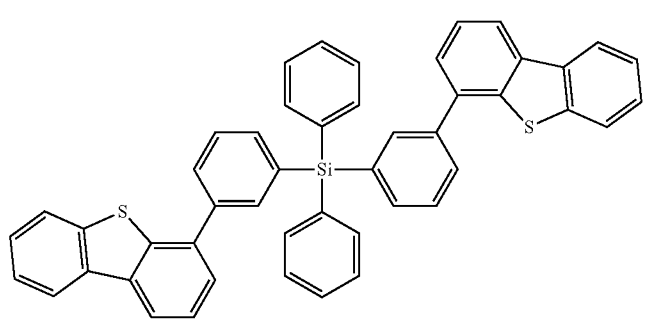
, -continued
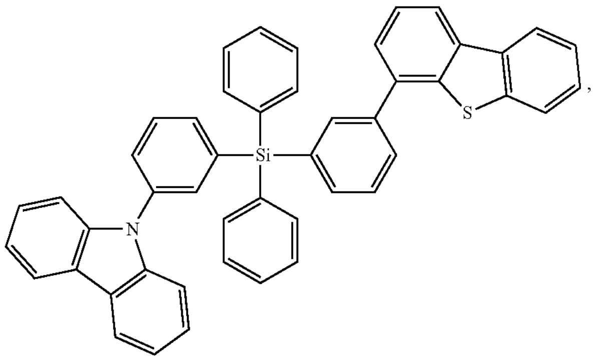
,
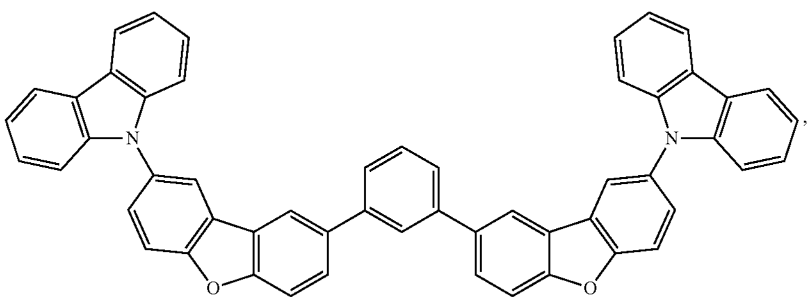
,
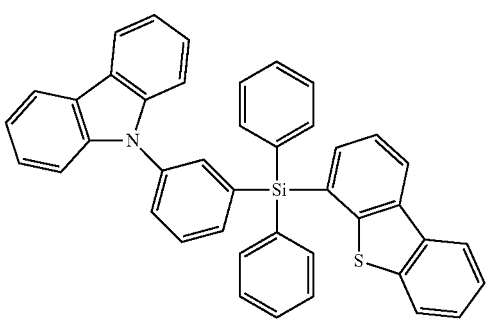
,
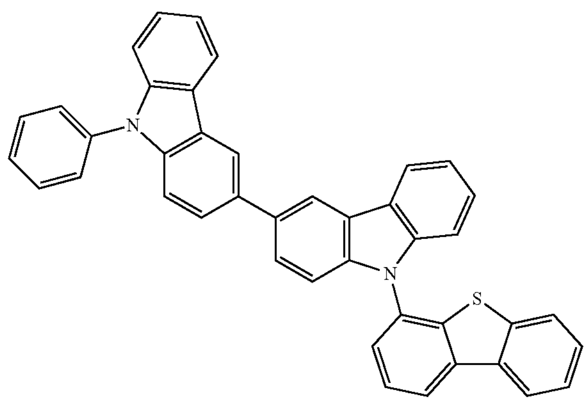
,
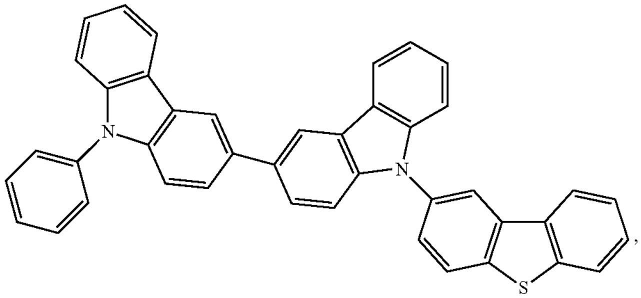
, -continued
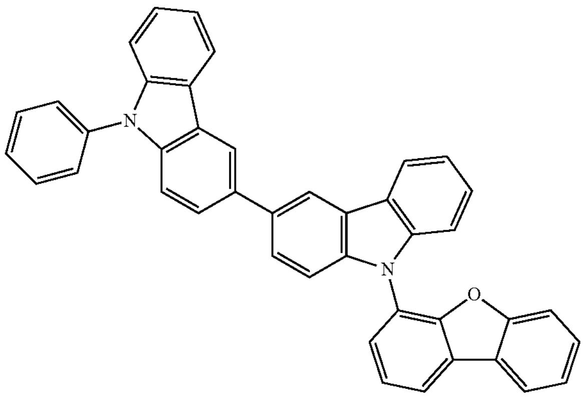
,
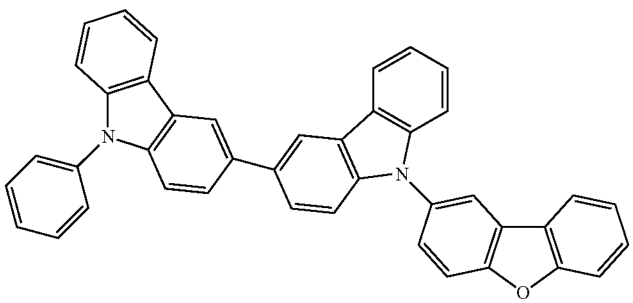
,
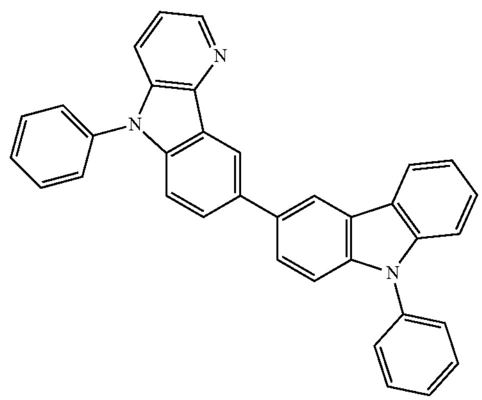
,
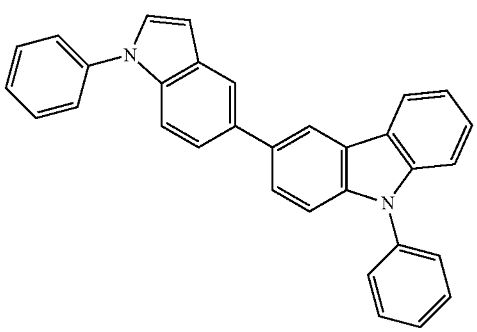
,
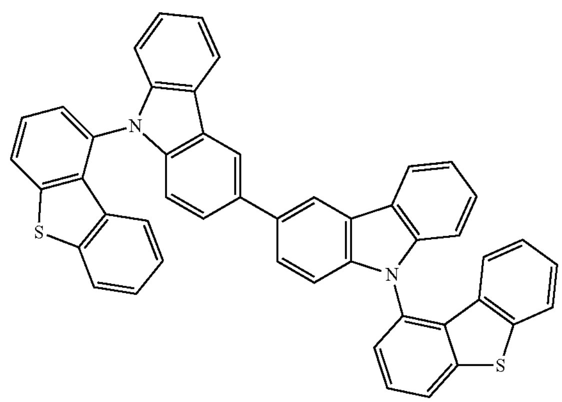
,
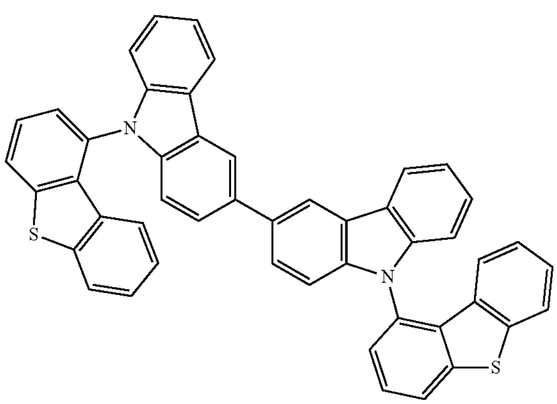
, -continued
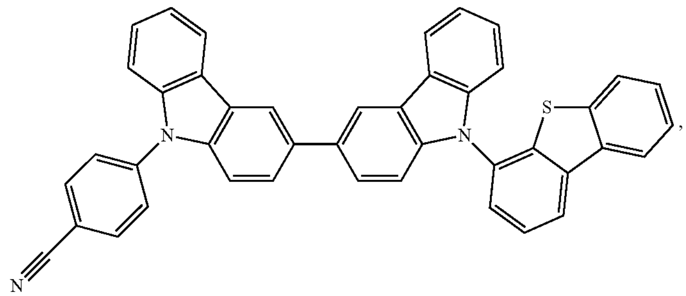
,
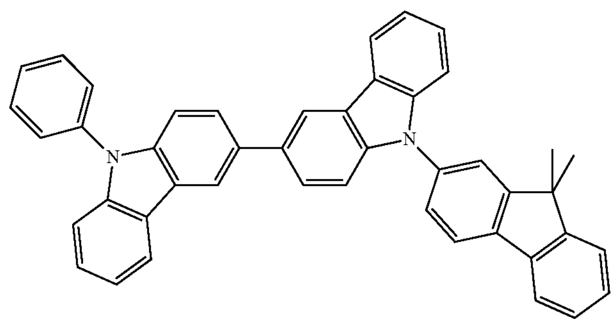
,
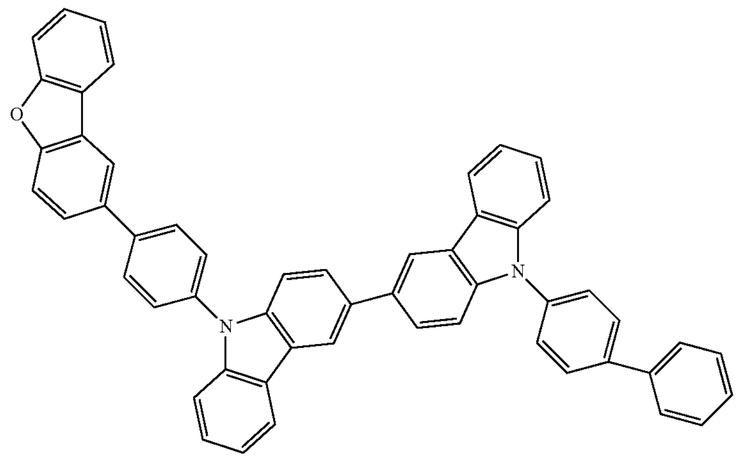
,
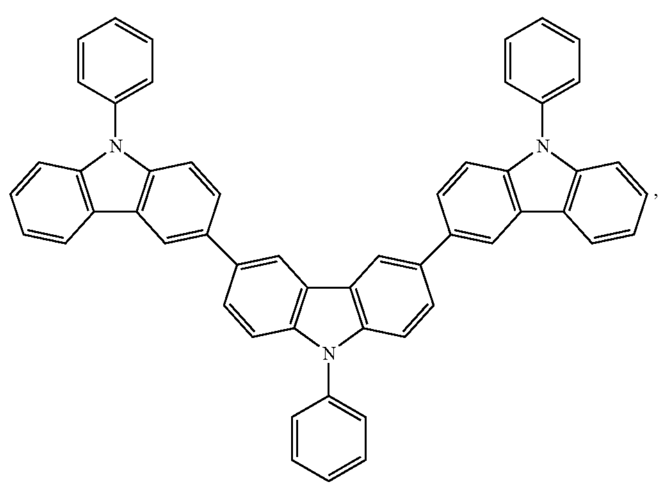
, -continued
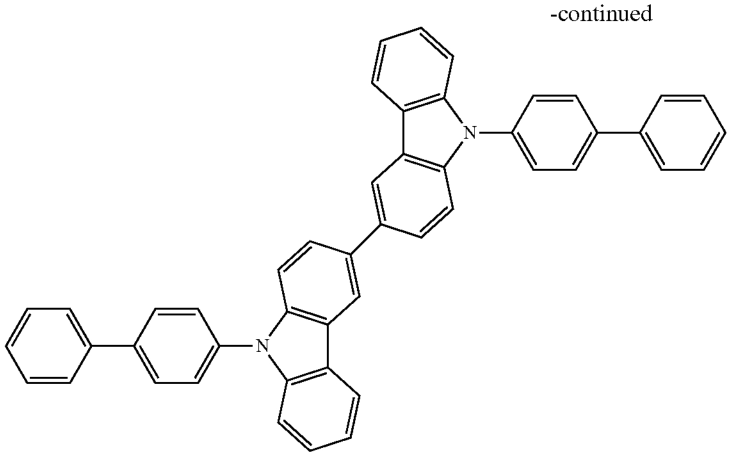
,
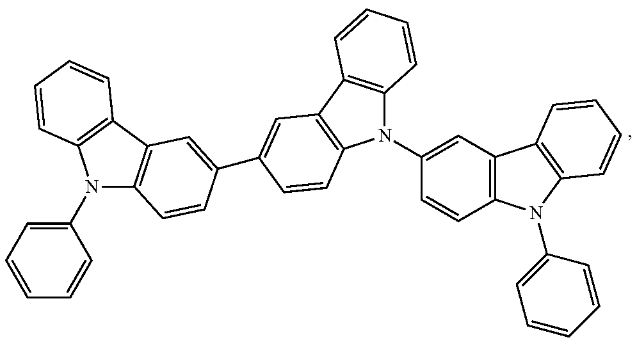
,
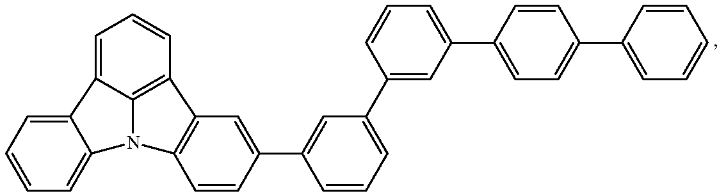
,
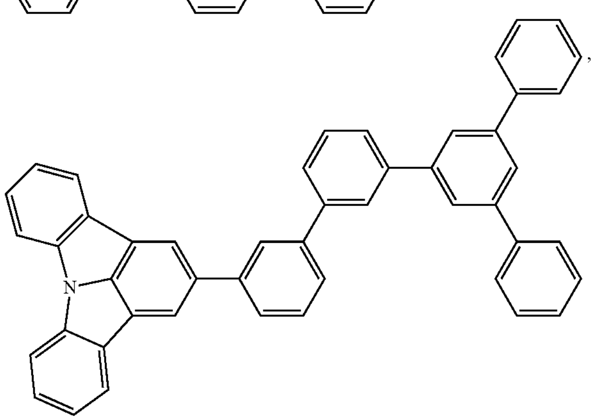
,
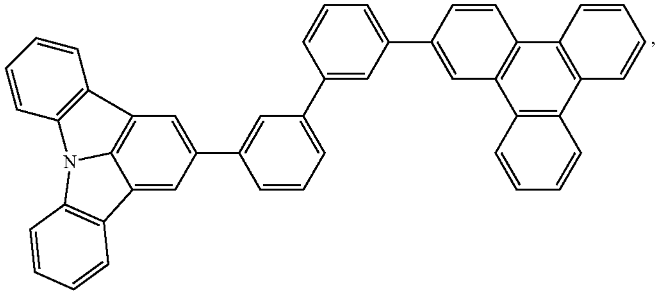
, -continued
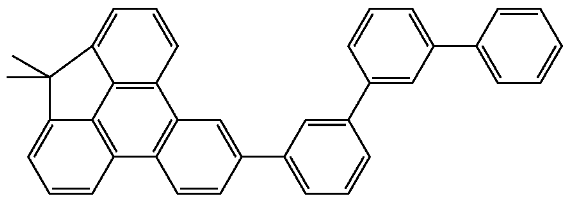
,
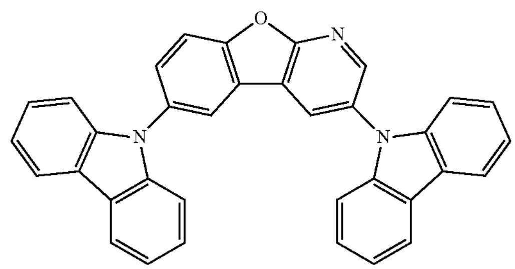
,
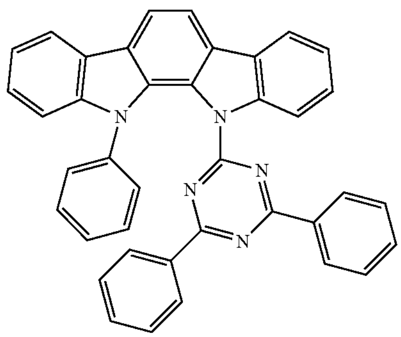
,
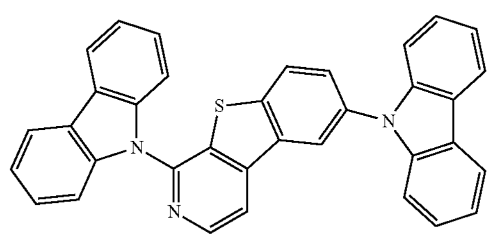
,
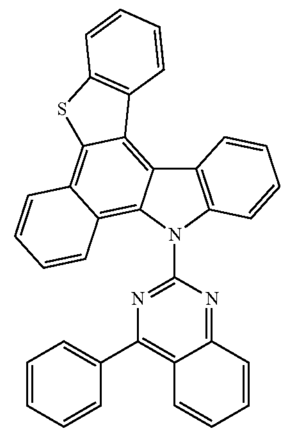
,
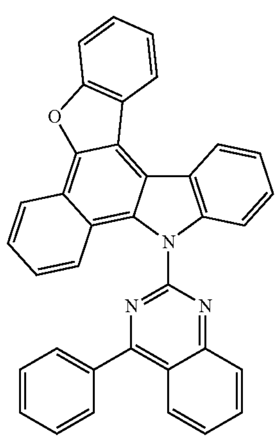
,
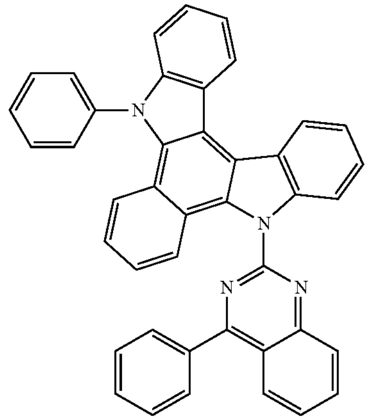
,
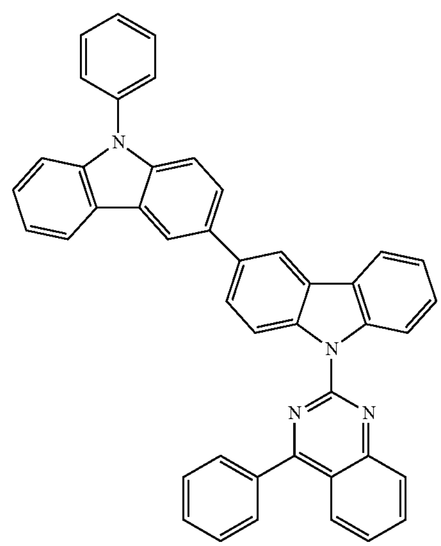
,
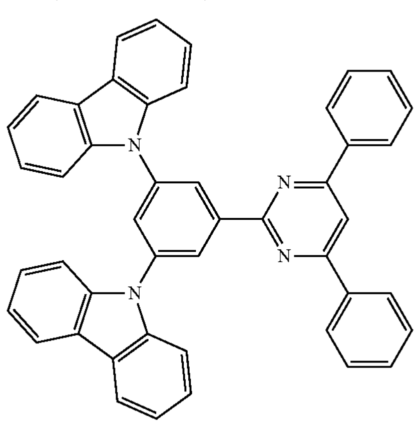
,
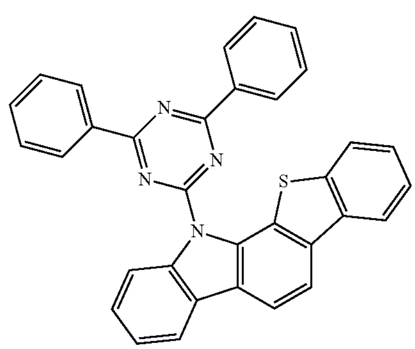
, -continued
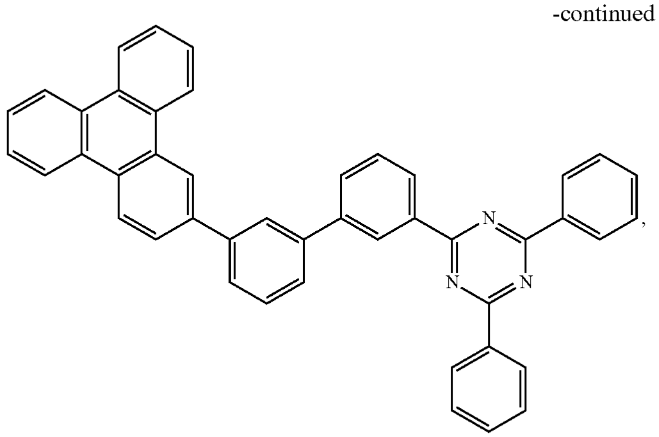
,
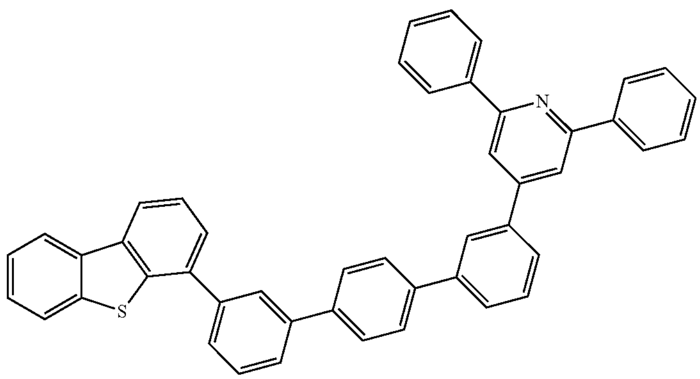
,
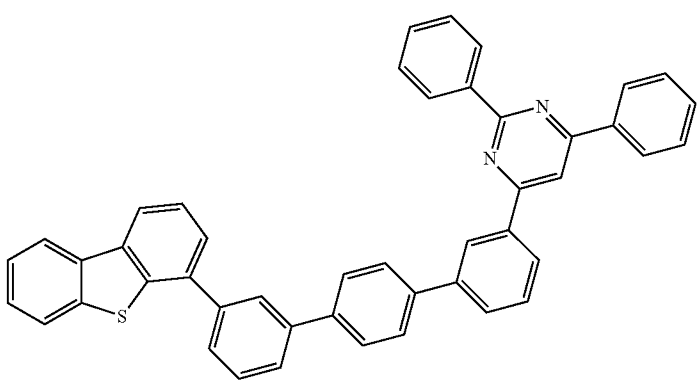
,
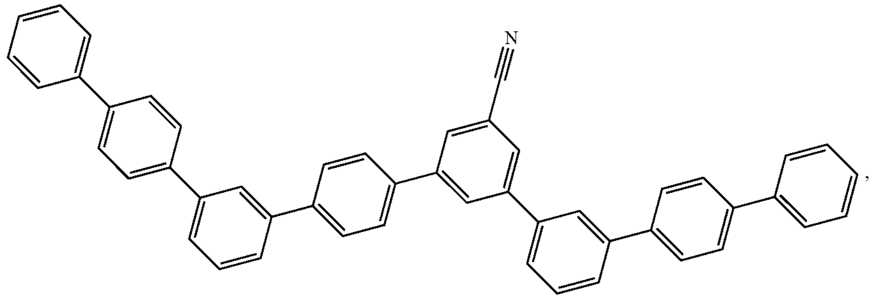
, -continued

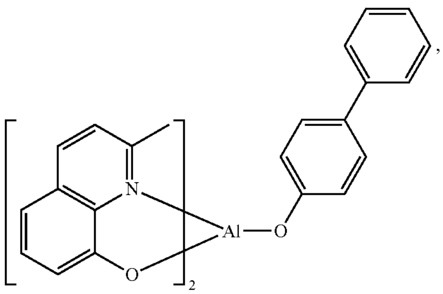

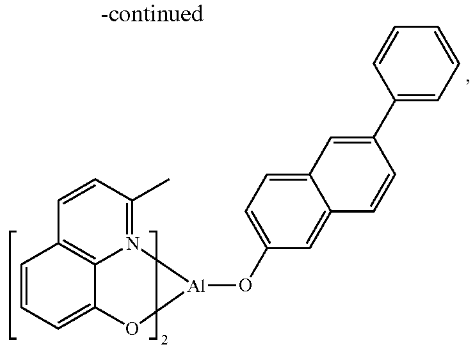

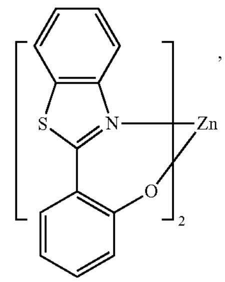

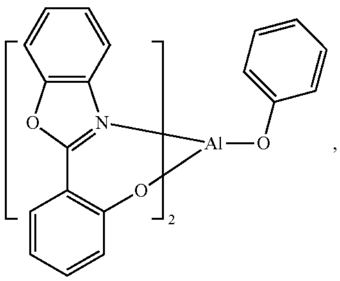

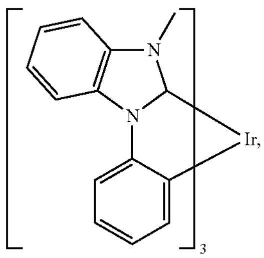

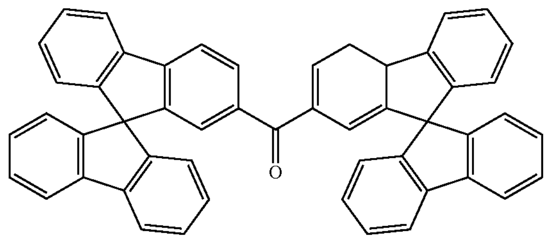

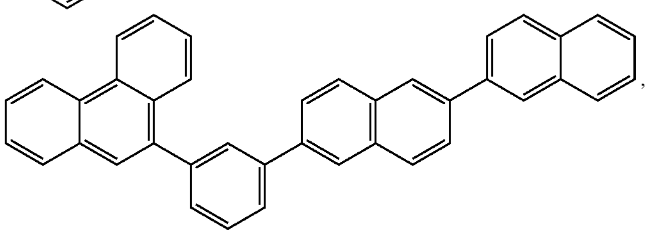

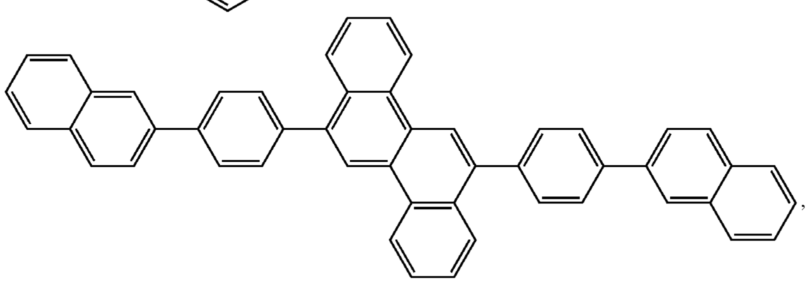

and

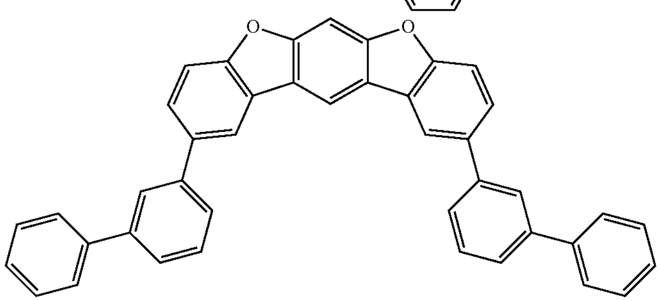

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.
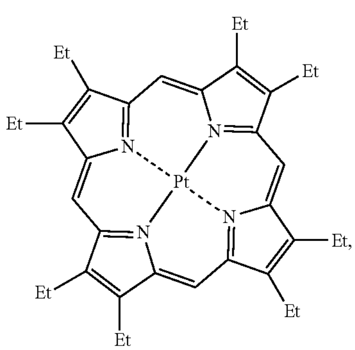
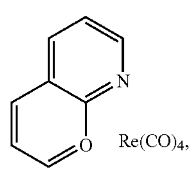
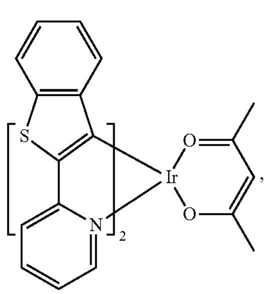
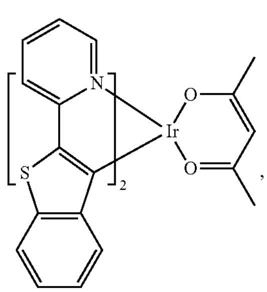
-continued
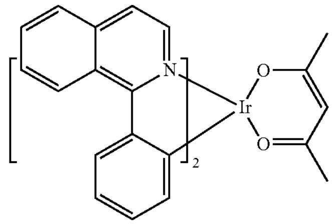
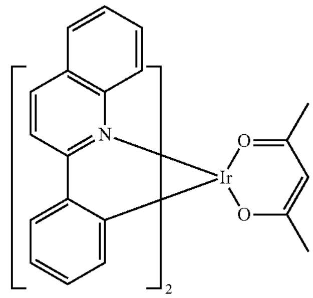
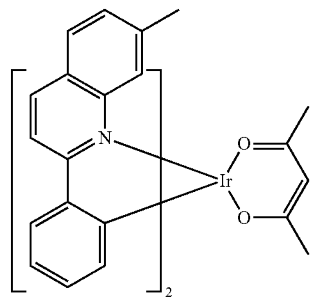
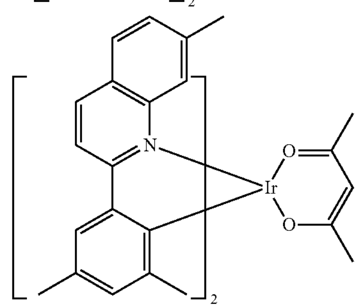
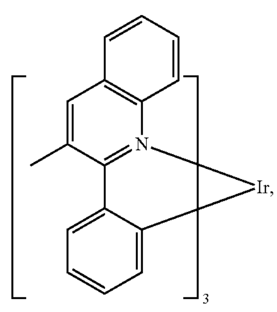
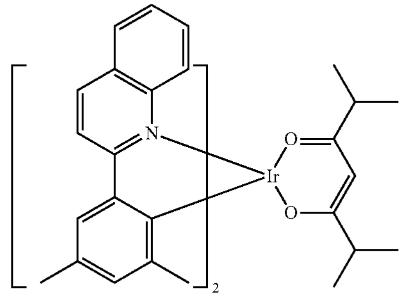

-continued
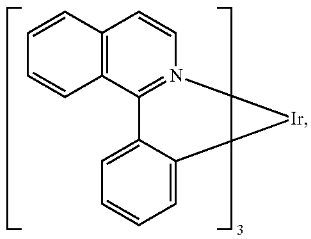
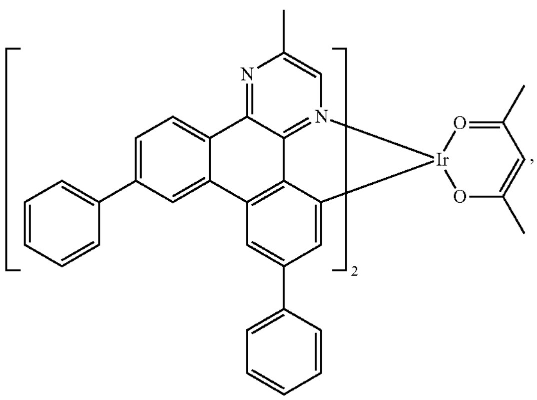
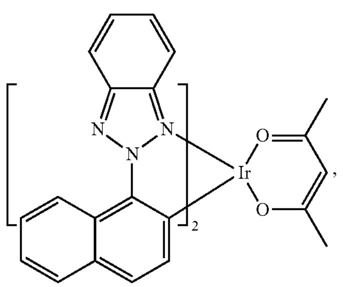
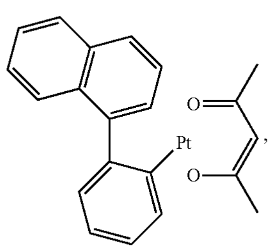
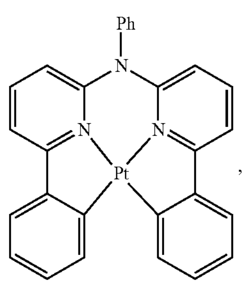
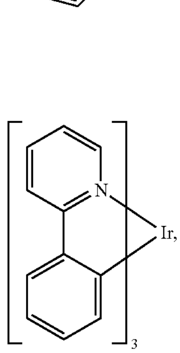
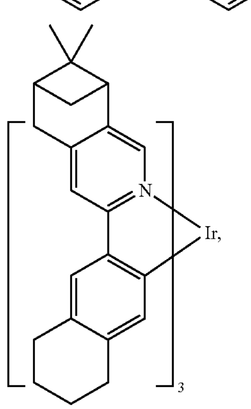
-continued
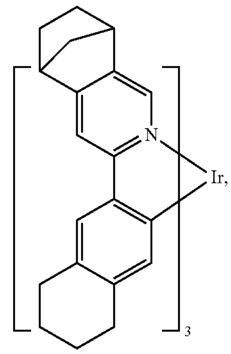
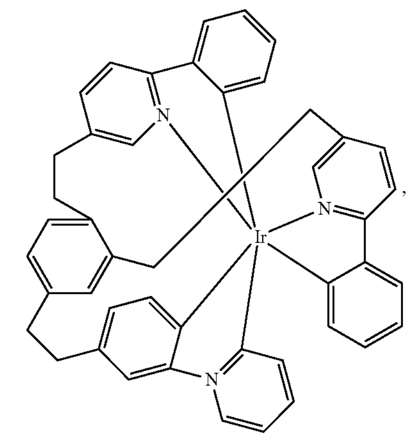
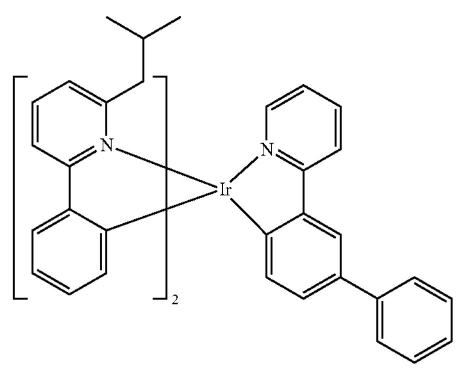
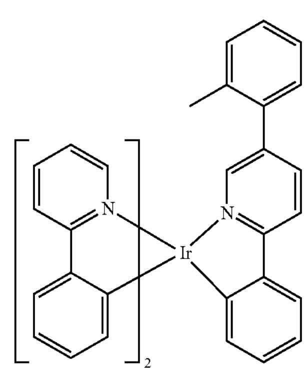

-continued
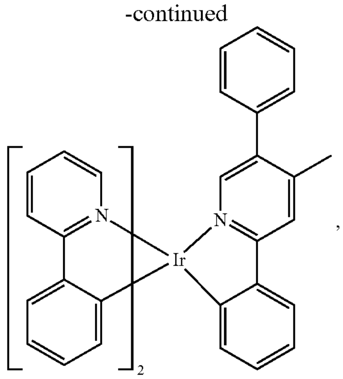
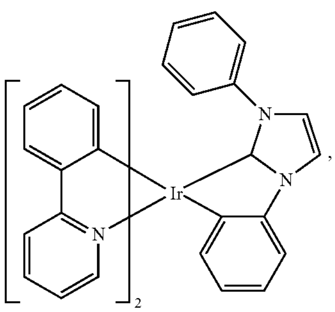
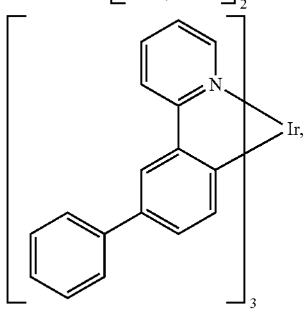
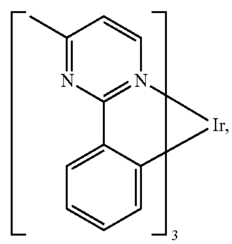
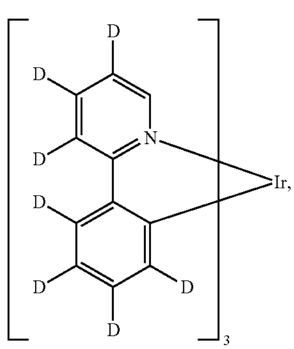
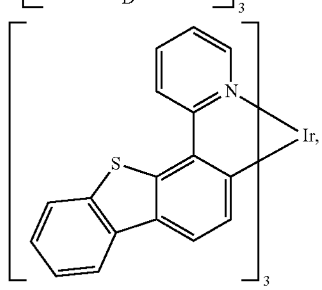
-continued
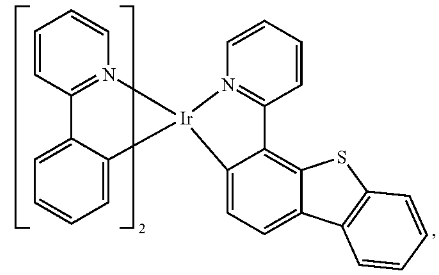
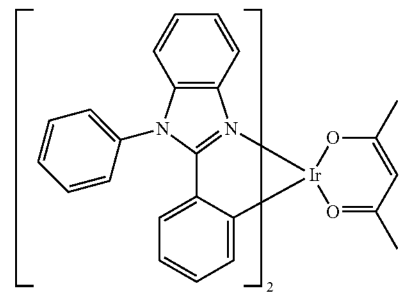
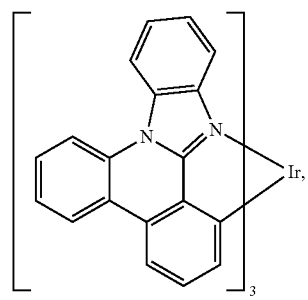
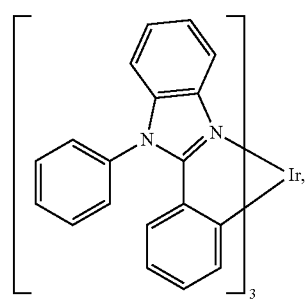
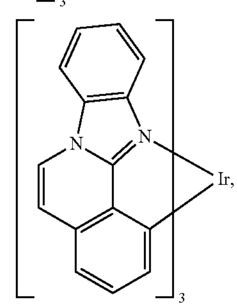
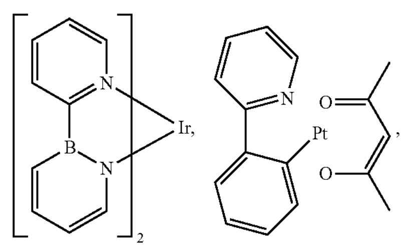
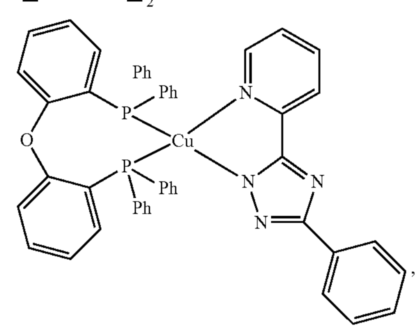

-continued
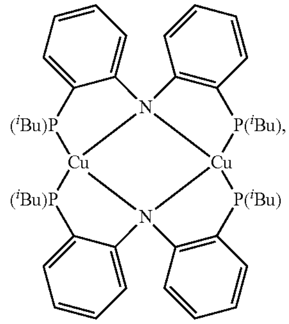
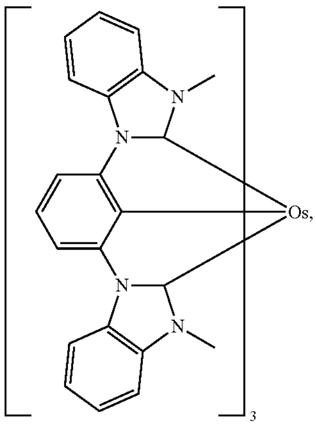
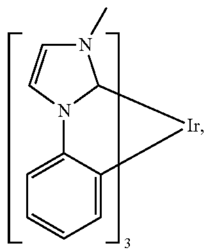
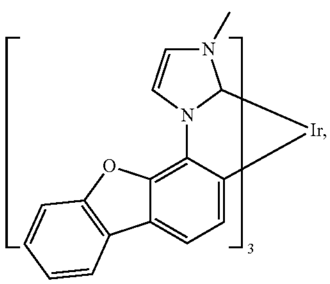
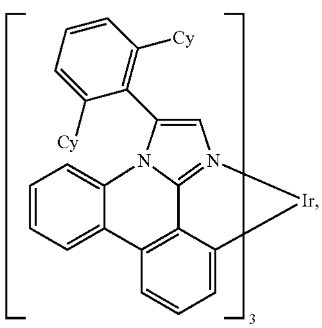
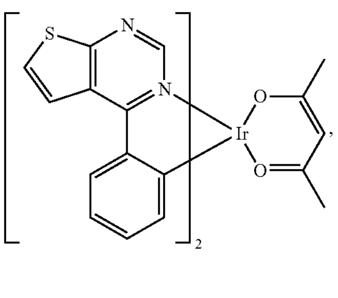
-continued
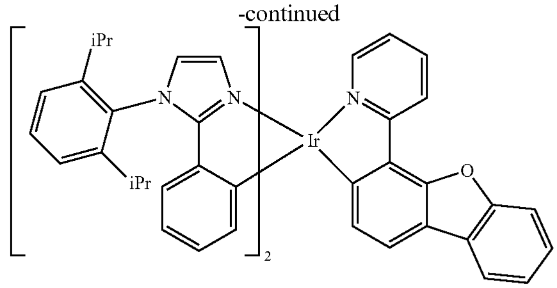
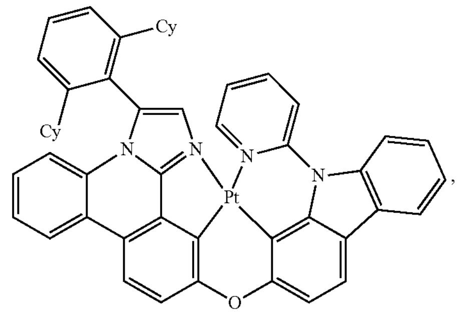
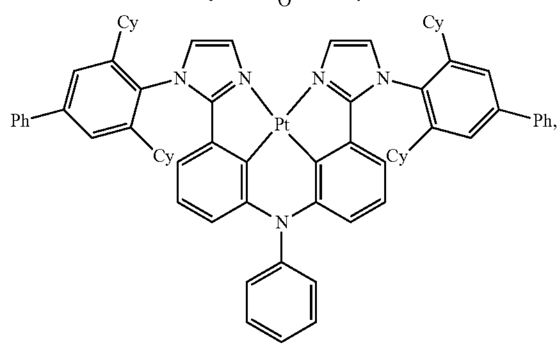
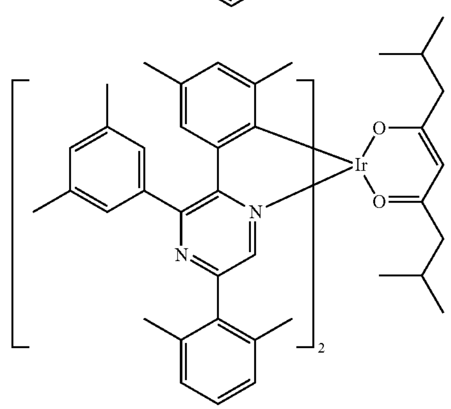
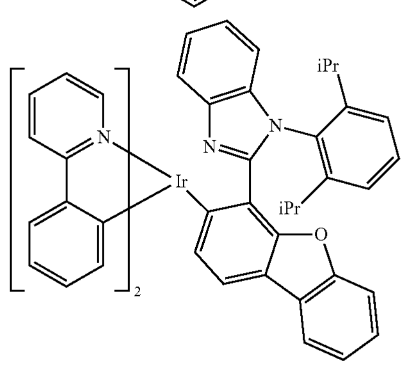

-continued
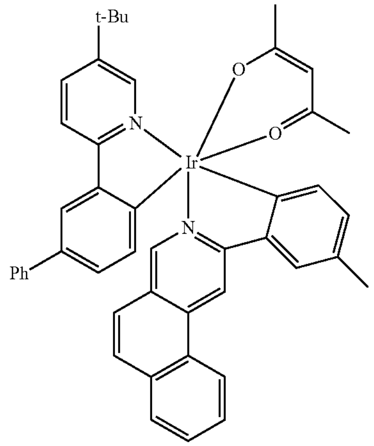
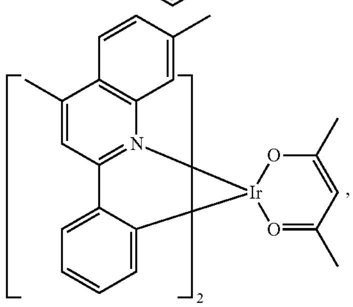
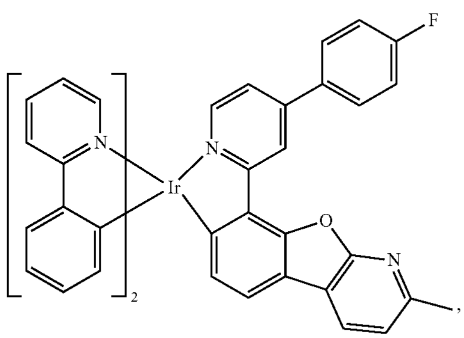
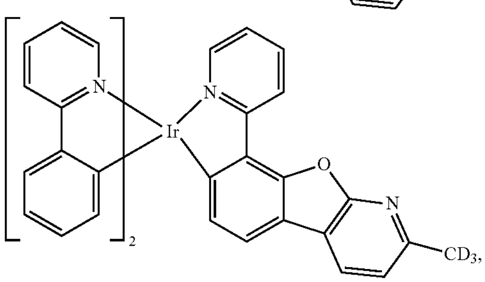
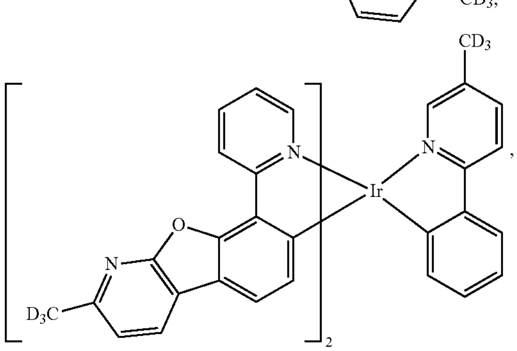
-continued
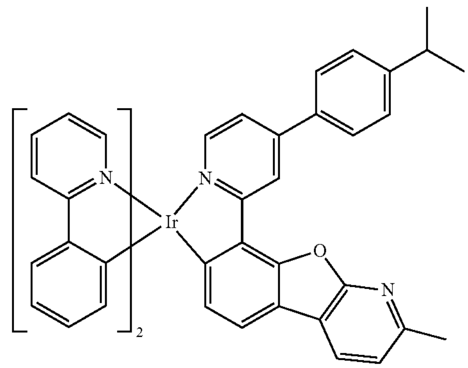
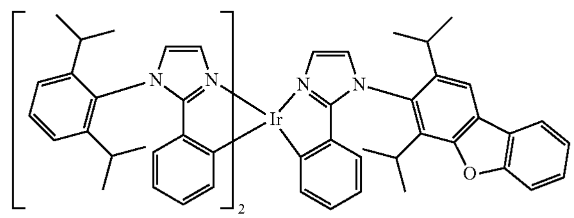
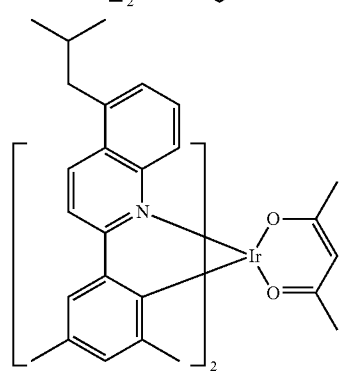
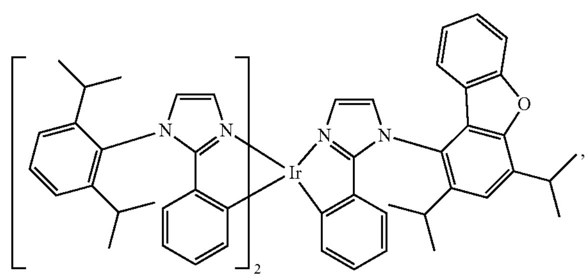
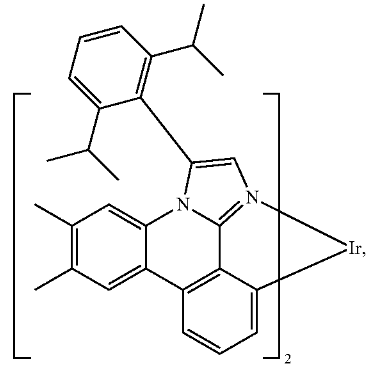

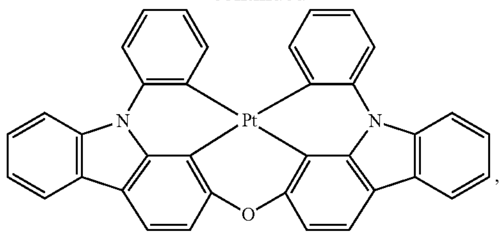
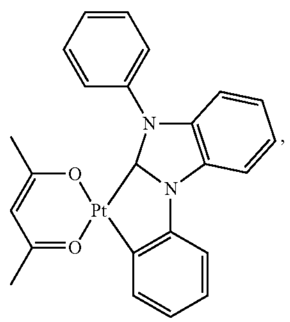
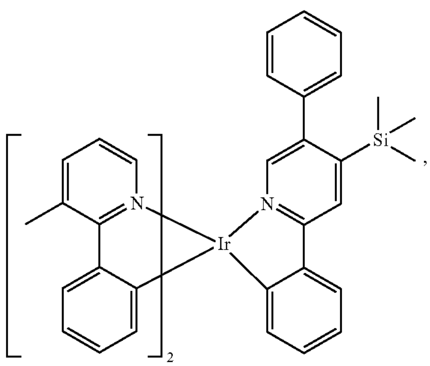
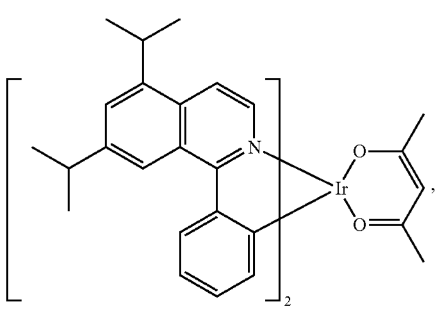
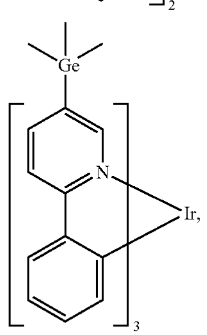
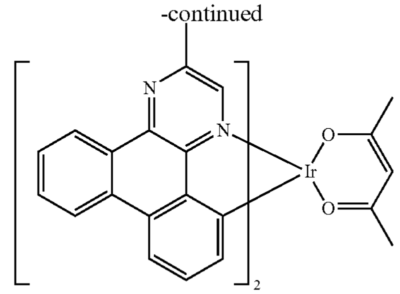
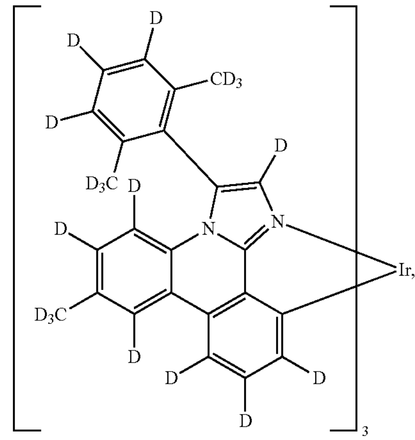
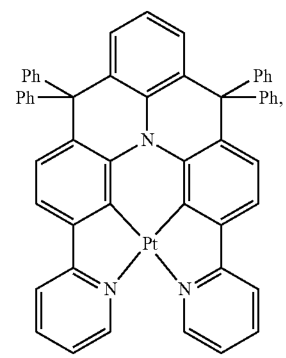
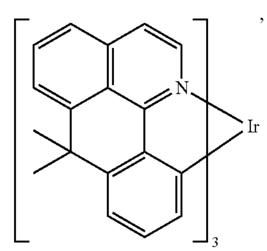
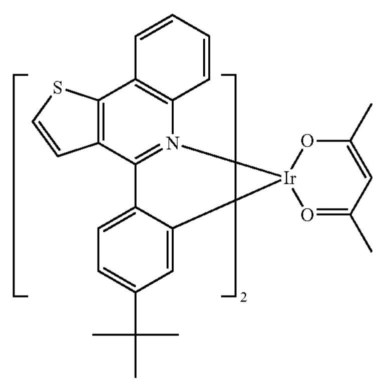
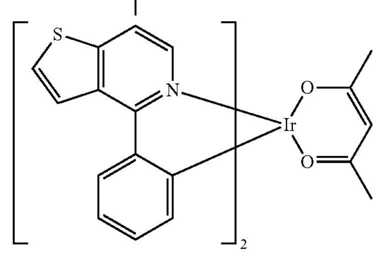

-continued
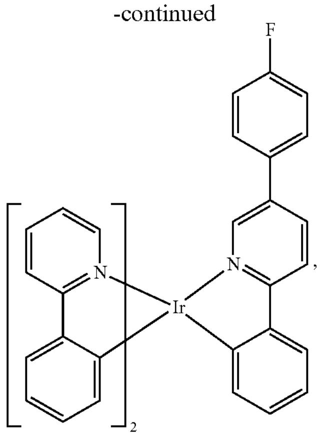
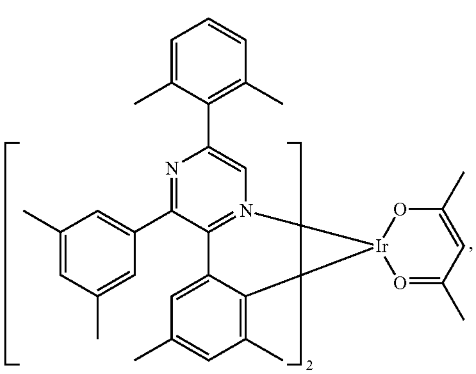
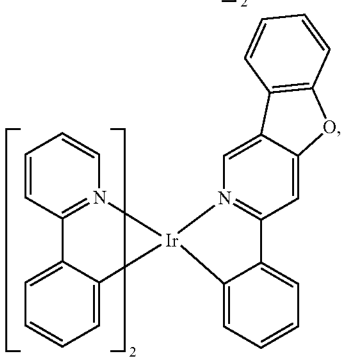
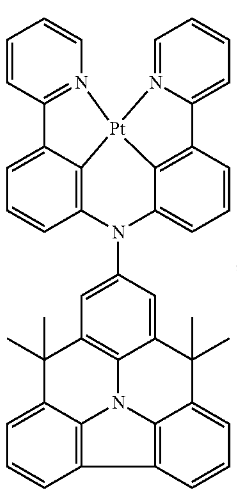
-continued
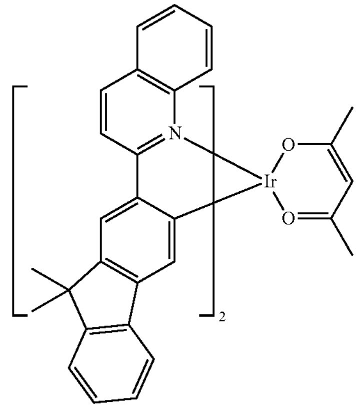
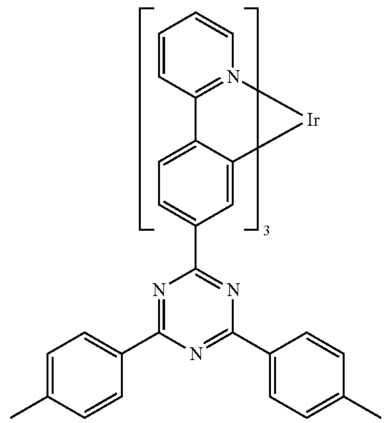
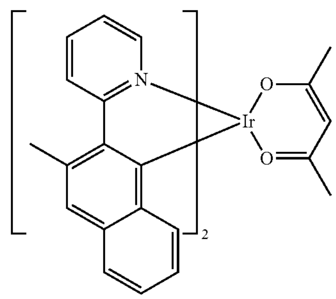
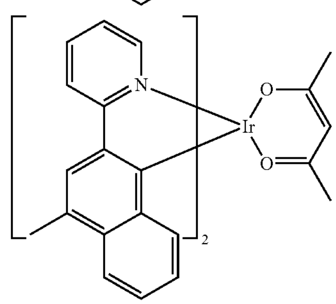
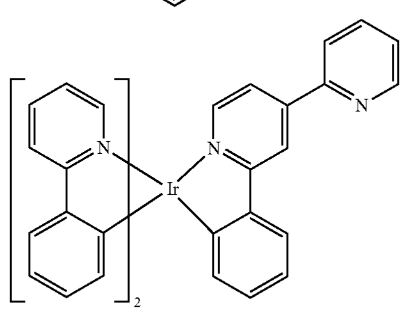

-continued
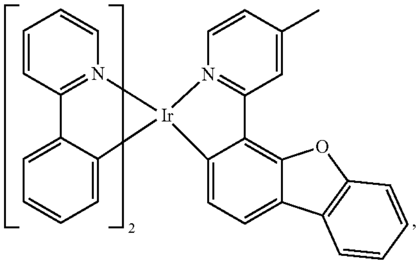
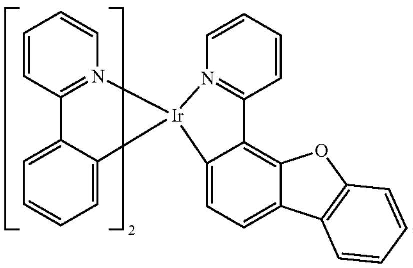
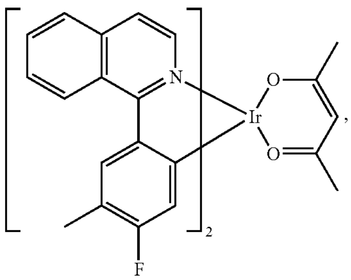
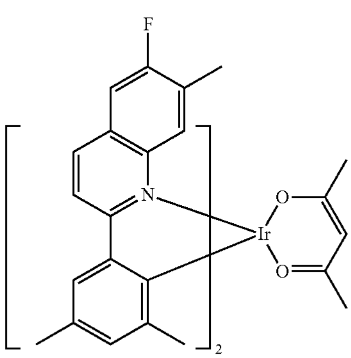
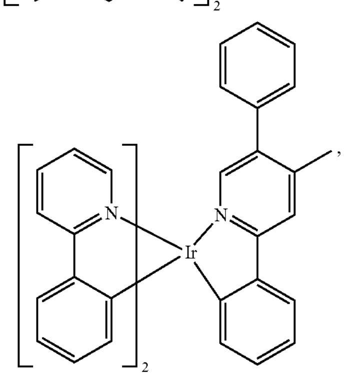
-continued
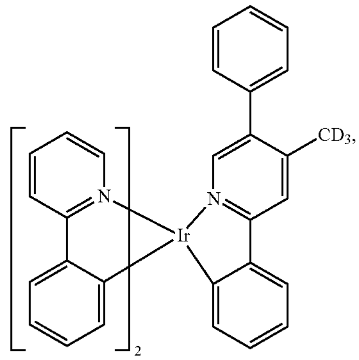
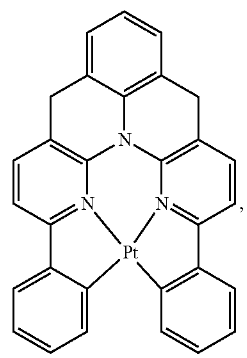
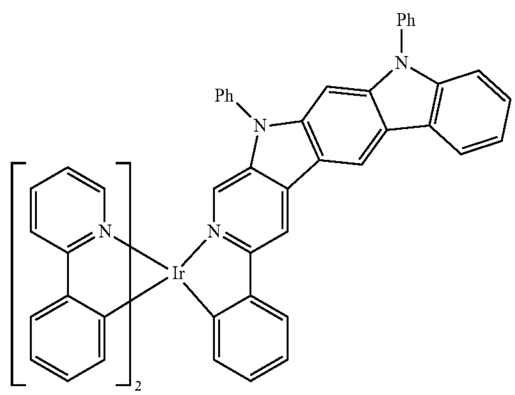
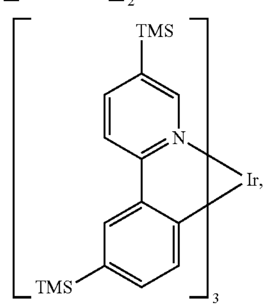
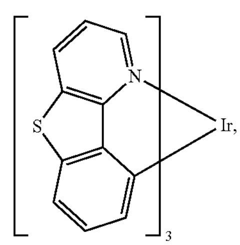
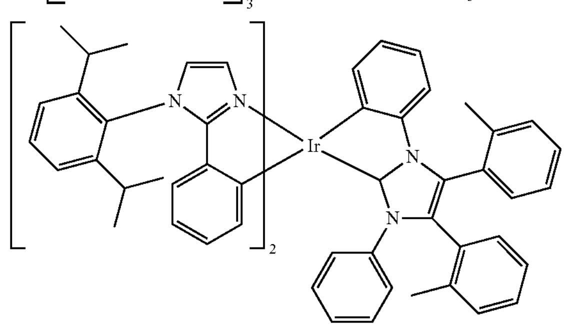

-continued
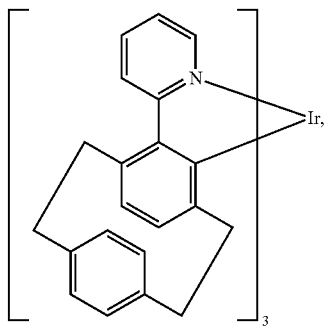
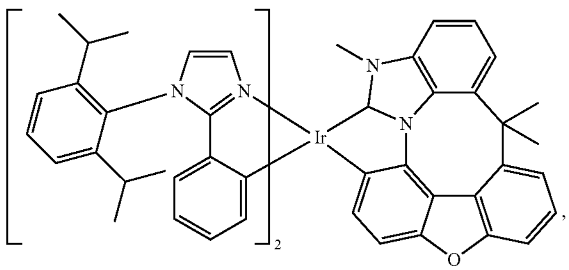
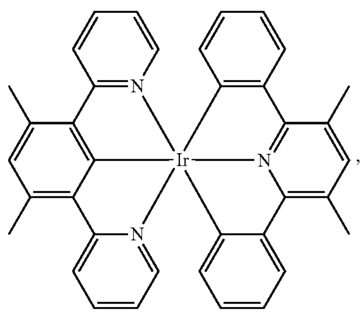
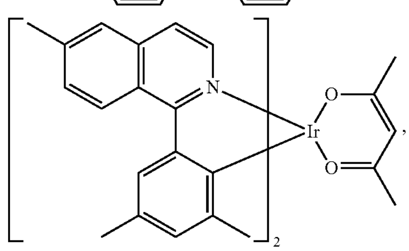
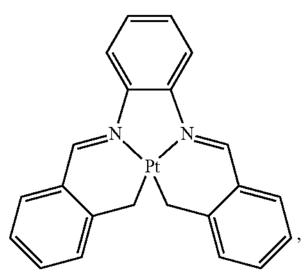
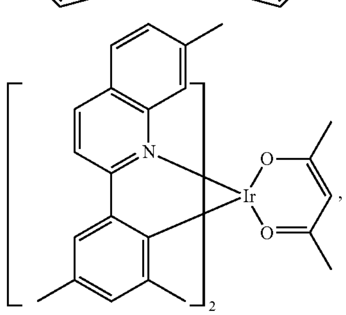
-continued
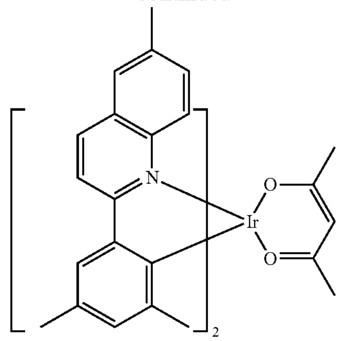
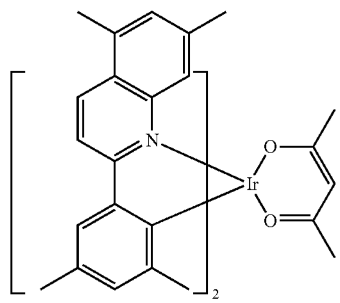
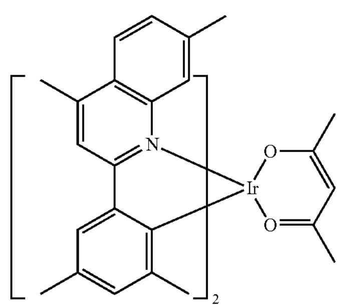
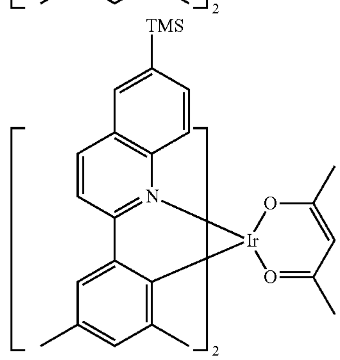
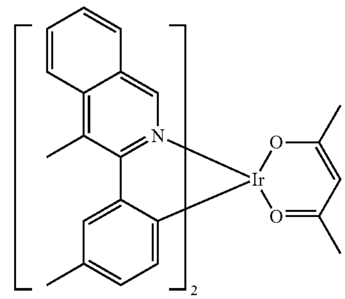

-continued
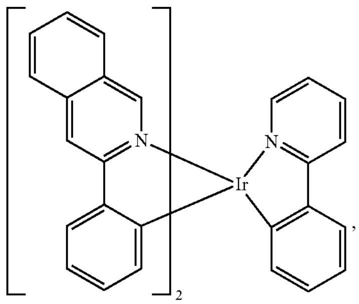
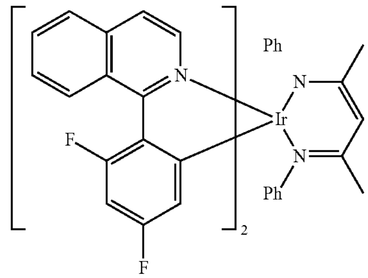
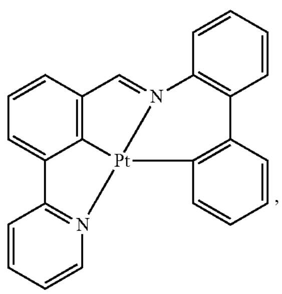
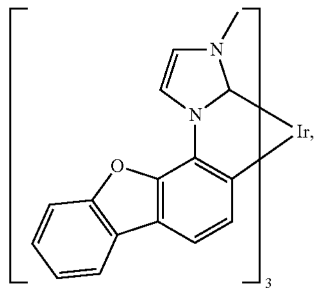
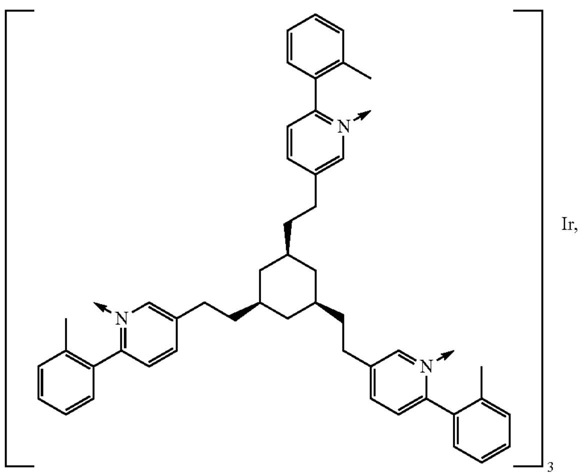
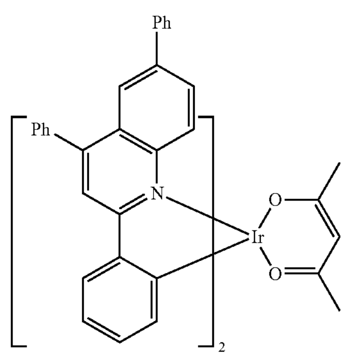
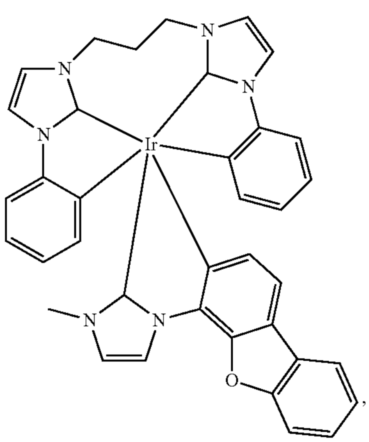
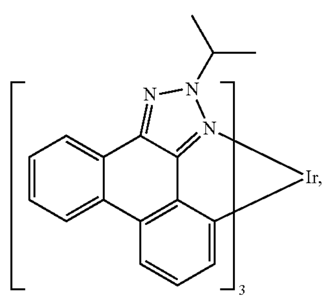
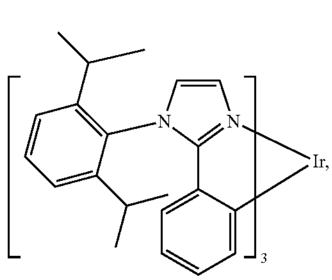
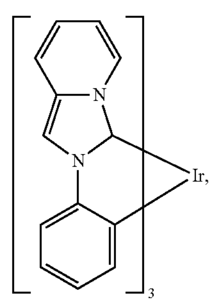

-continued

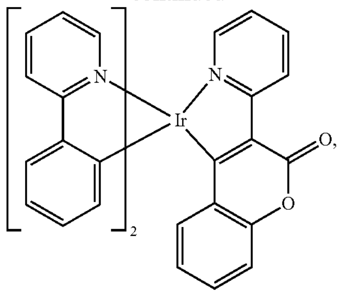

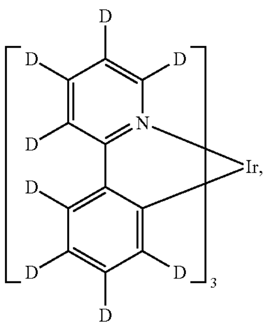

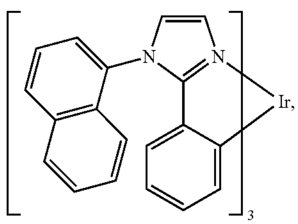

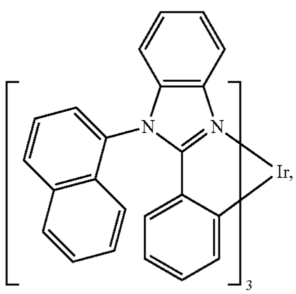

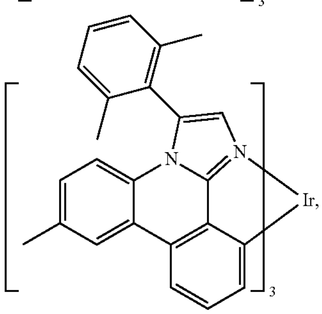

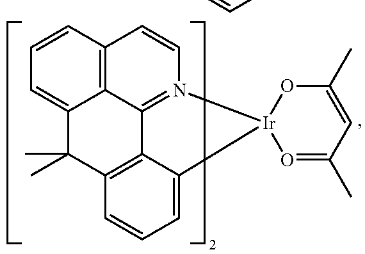

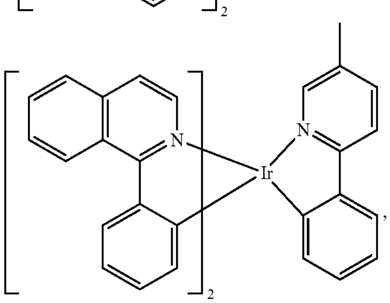

-continued

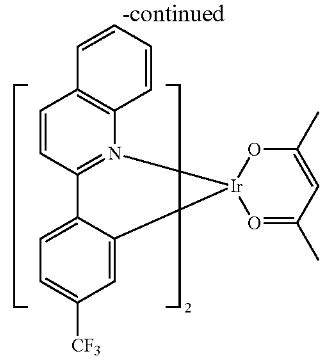

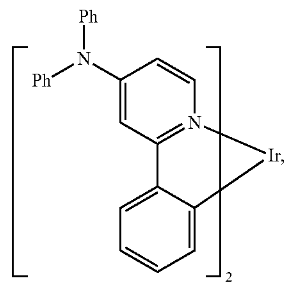

and

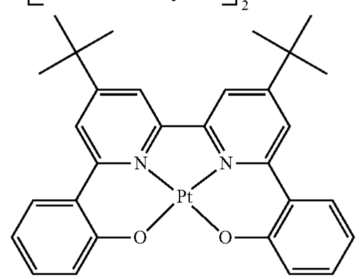

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

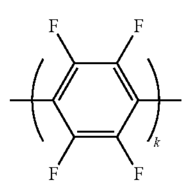

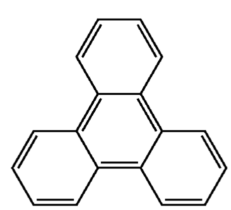

-continued

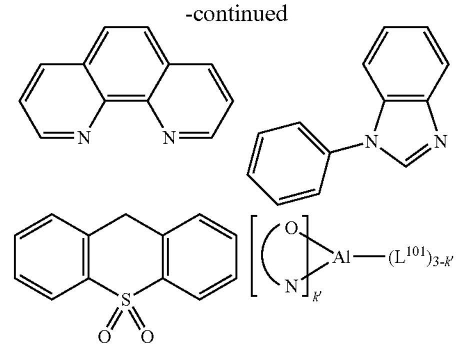

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

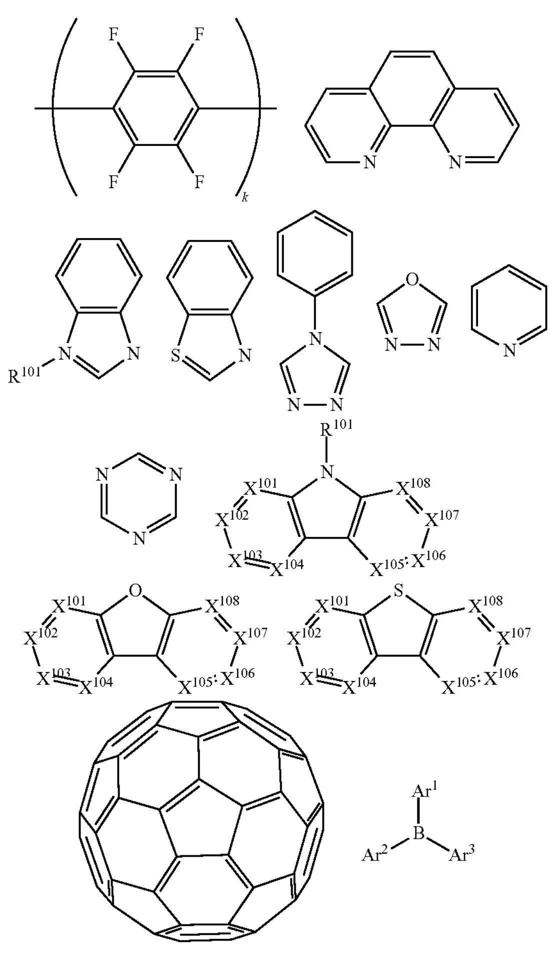

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

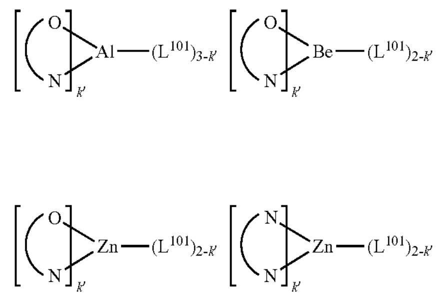

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

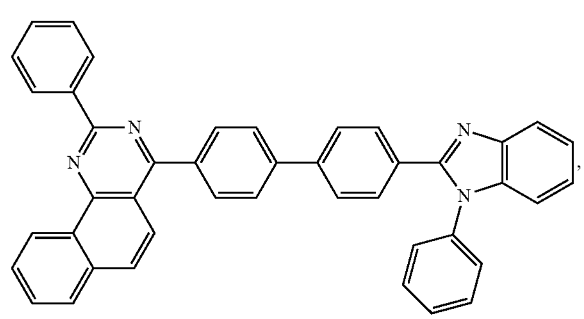
,

-continued
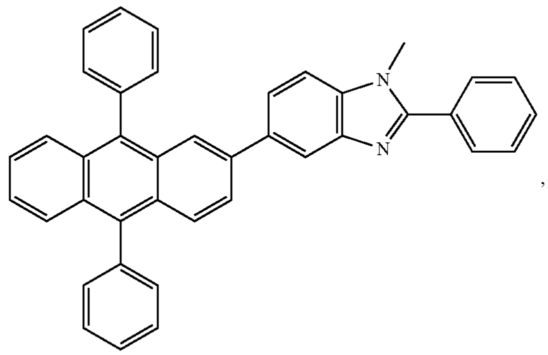
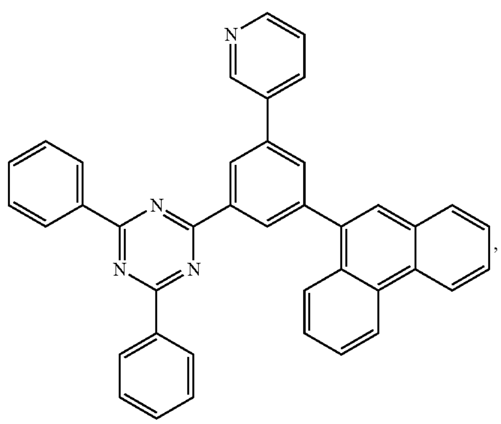
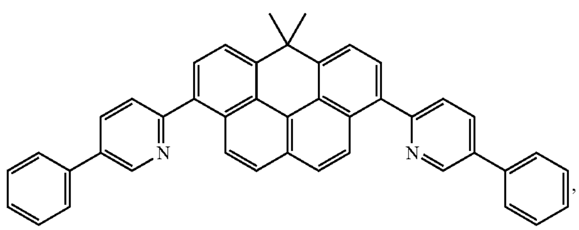
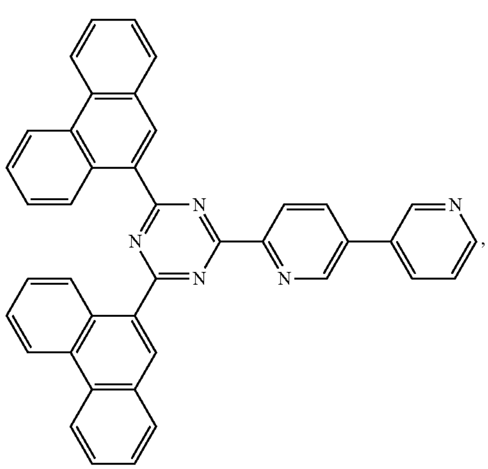
-continued
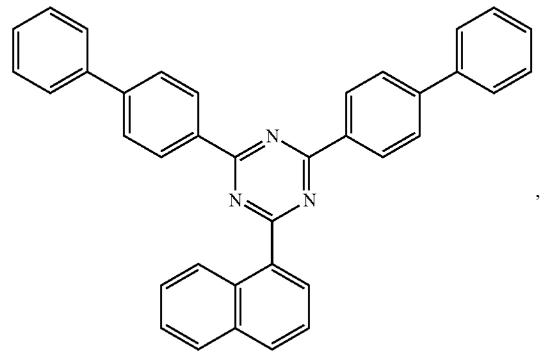
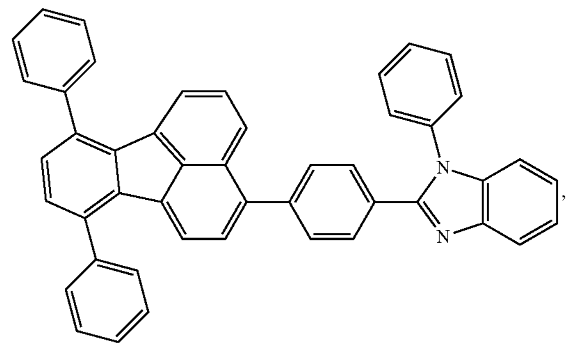
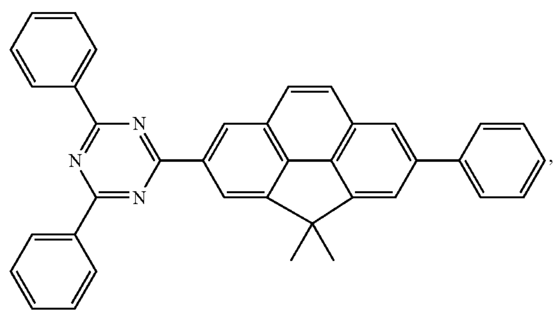
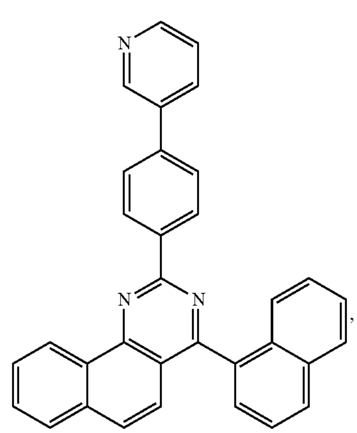

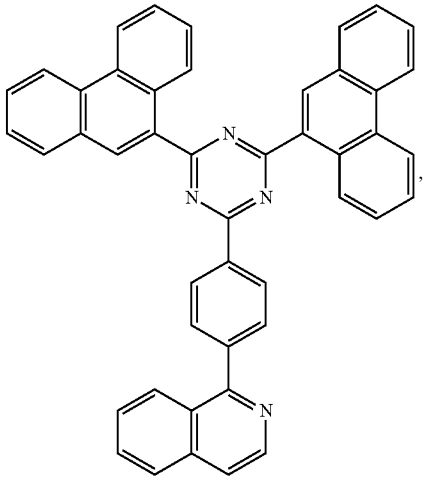
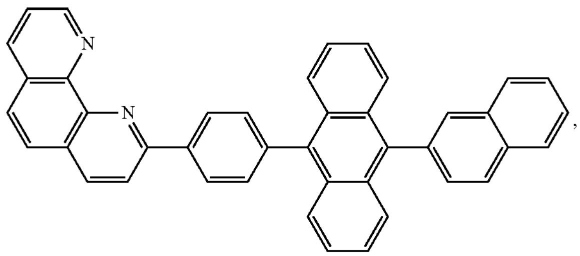
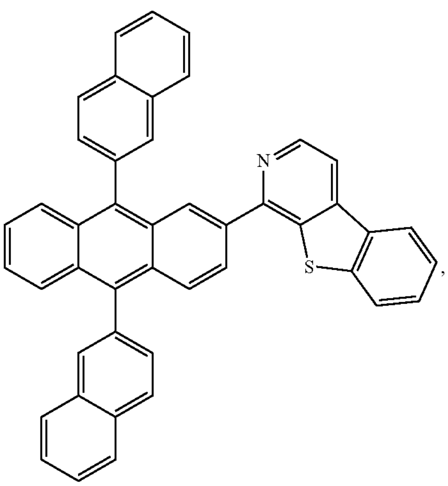
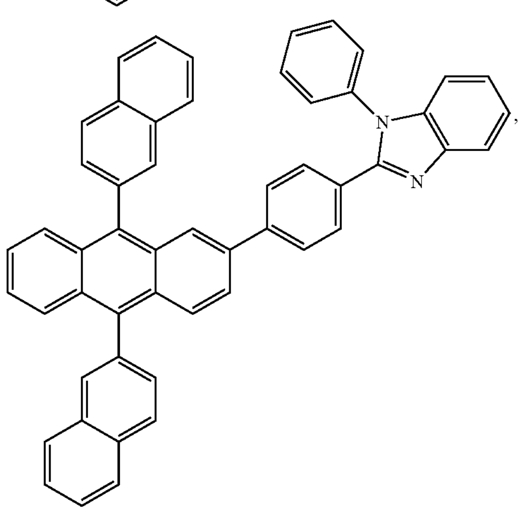
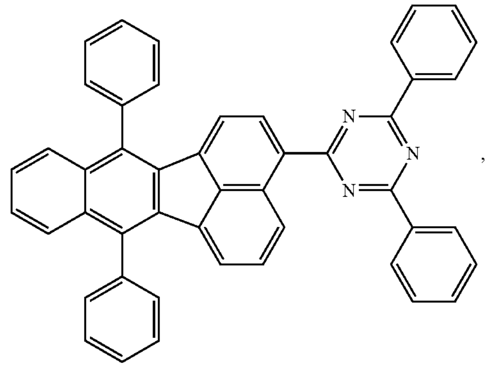
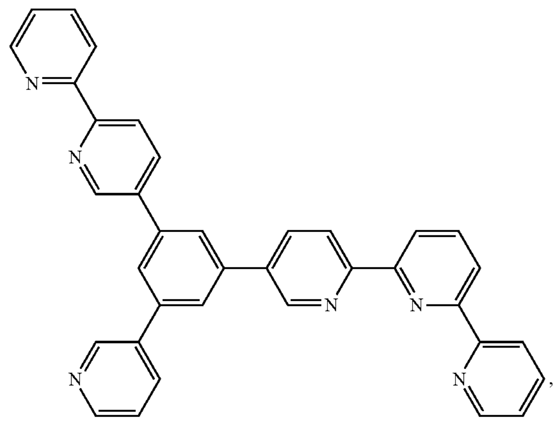
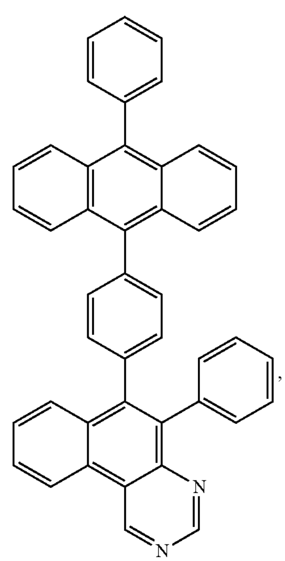

-continued
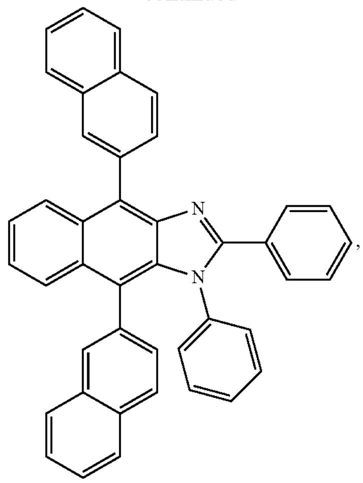
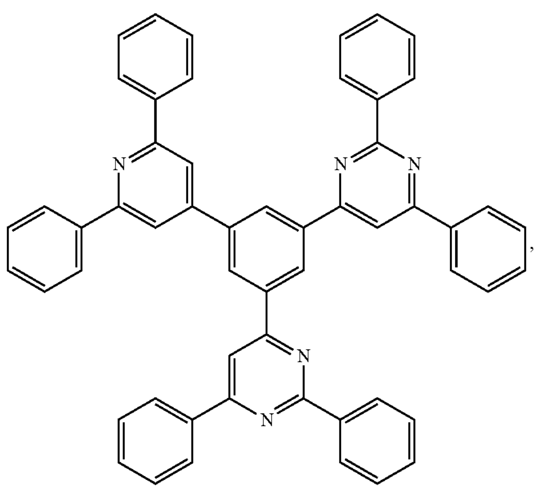
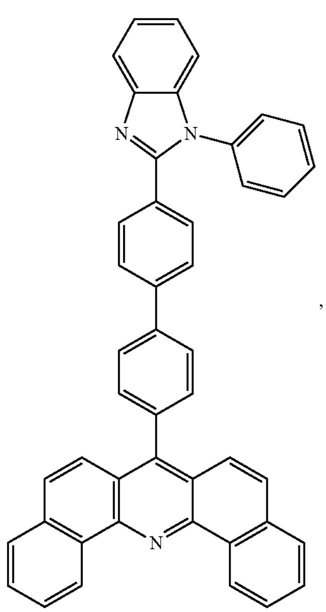
-continued
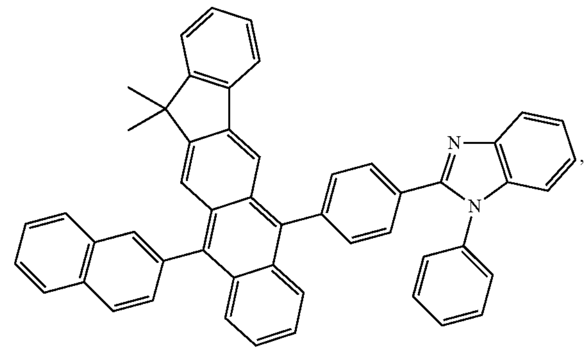
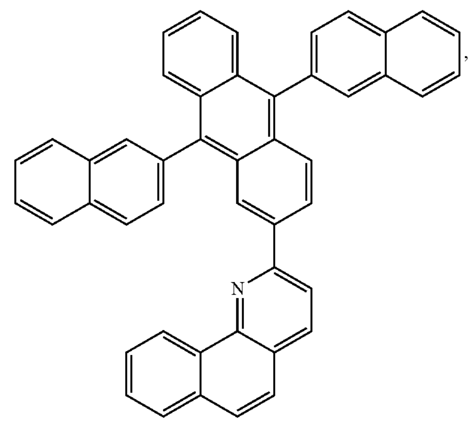
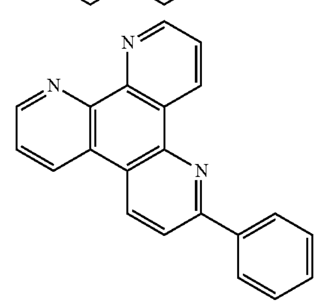
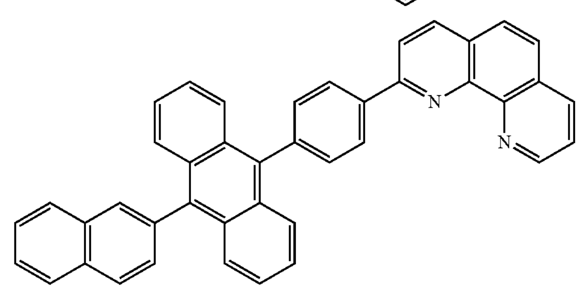
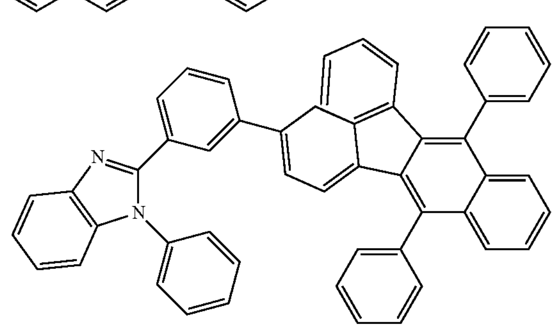

-continued
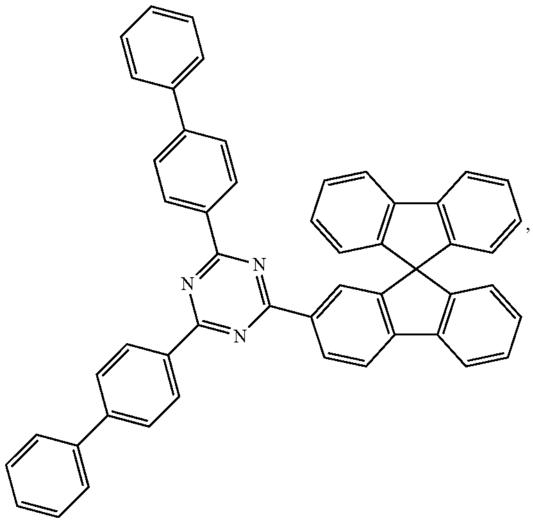
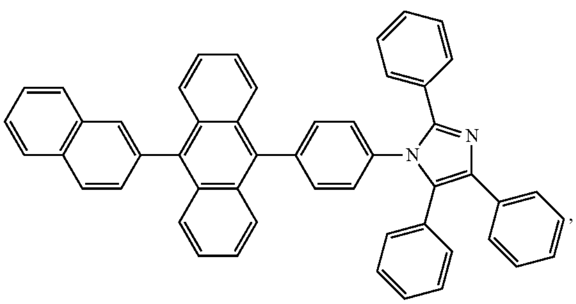
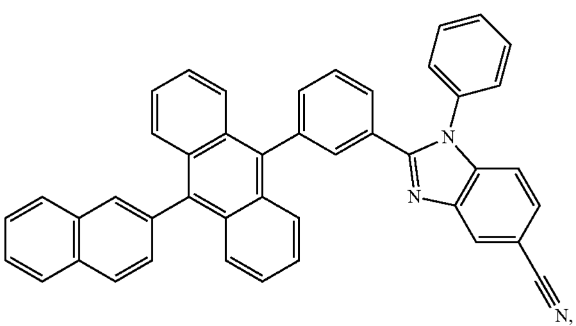
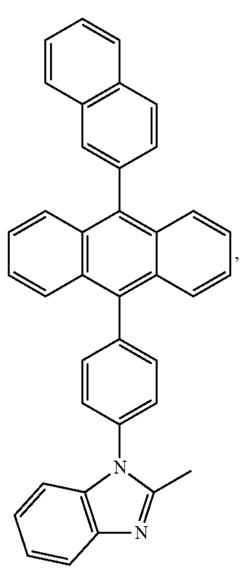
-continued
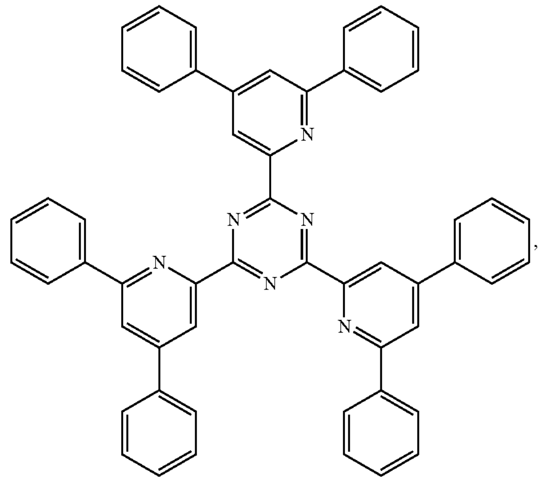
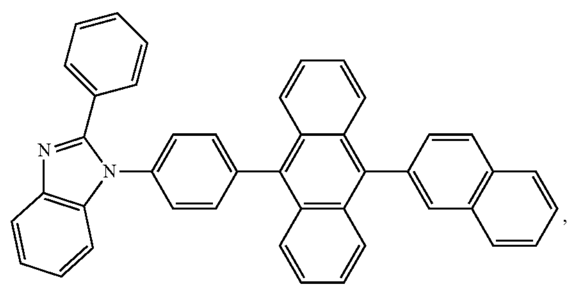
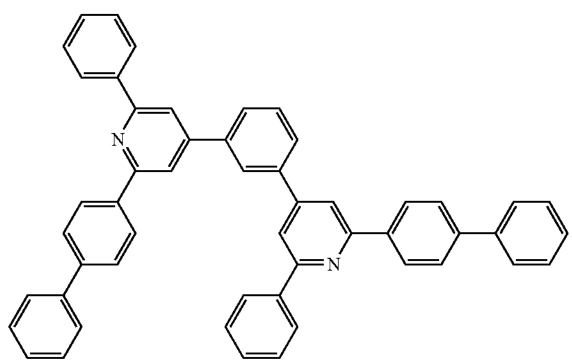
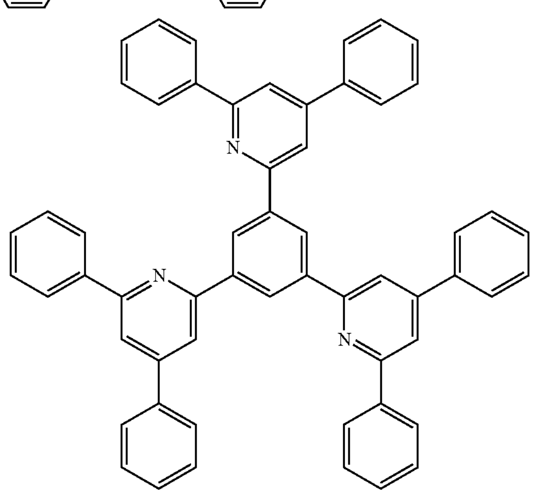

-continued

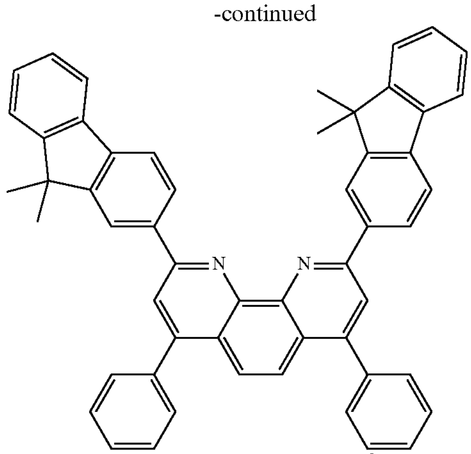

, and

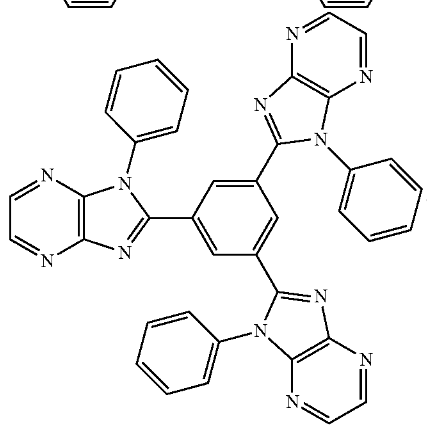

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having a formula $Ir(L_A)(L_B)(L_C)$;

wherein the ligand $L_A$ and the ligand $L_B$ are each independently selected from the group consisting of:

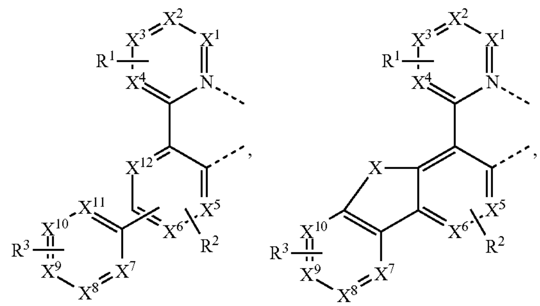

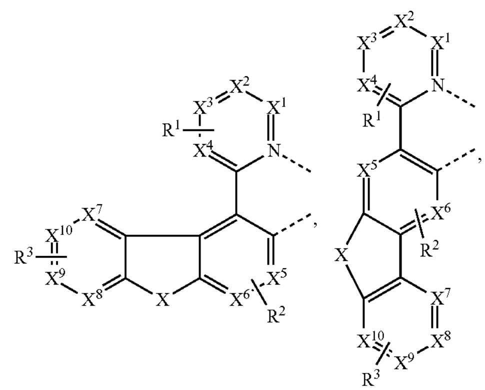

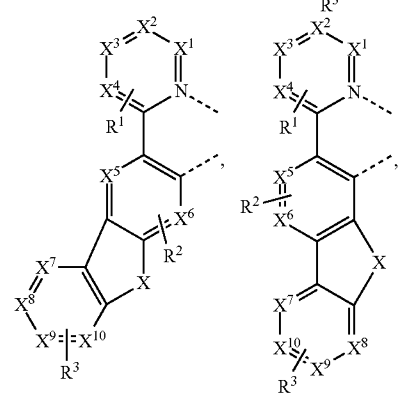

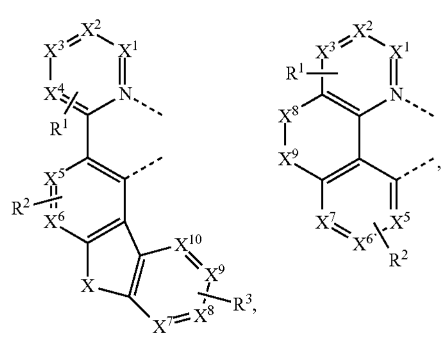

-continued

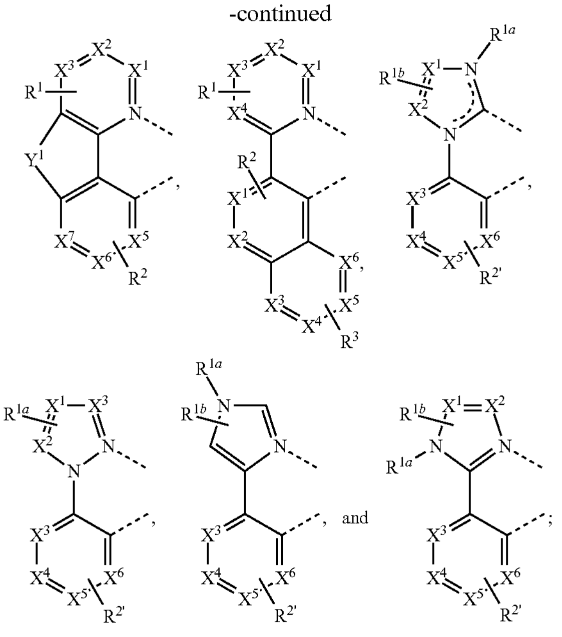

wherein the ligand $L_C$ is

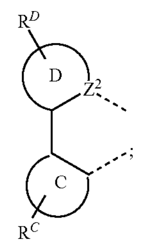

wherein rings C and D are each independently a 5 or 6-membered carbocyclic or heterocyclic ring;

wherein $R^1$, $R^{1a}$, $R^{1b}$, $R^2$, $R^{2'}$, $R^3$, $R^C$, and $R^D$ each independently represents mono, to a maximum possible number of substitutions, or no substitution;

wherein $X^1$ to $X^{12}$, $Z^1$ and $Z^2$ are each independently C or N;

wherein $Y^1$ is selected from the group consisting of O, S, Se, and Ge;

wherein X is selected from the group consisting of BR', NR', PR', O, S, Se, C═O, S═O, $SO_2$, CR'R", SiR'R", and GeR'R";

wherein $L_A$, $L_B$, and $L_C$ are different from each other, and can be connected to each other to form multidentate ligand;

wherein, when present, at least one substituent $R^{2'}$ comprises aryl or heteroaryl and can be further substituted by one or more moieties selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein $R^1$, $R^{1a}$, $R^{1b}$, $R^2$, $R^{2'}$, $R^3$, $R^A$, $R^B$, $R^C$, $R^D$, R', and R" are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two or more substituents among possible ring forming substituents are optionally joined or fused into a ring;

wherein $R^{1a}$, $R^{1b}$, $R^2$, $R^{2'}$, $R^3$, $R^A$, $R^C$, $R^D$, R', and R" are possible ring forming substituents;

wherein (a) at least four of $R^1$, $R^2$, and $R^{2'}$comprises a moiety selected from the group consisting of alkyl, cycloalkyl, aryl and heteroaryl, (b) at least three of $R^1$, $R^2$, and $R^{2'}$ comprises alkyl, cycloalkyl, aryl, or heteroaryl, with at least one of $R^1$, $R^2$, and $R^{2'}$comprising cycloalkyl, aryl, or heteroaryl, (c)(i) $L_A$ and $L_B$ are both selected from the croup consisting of

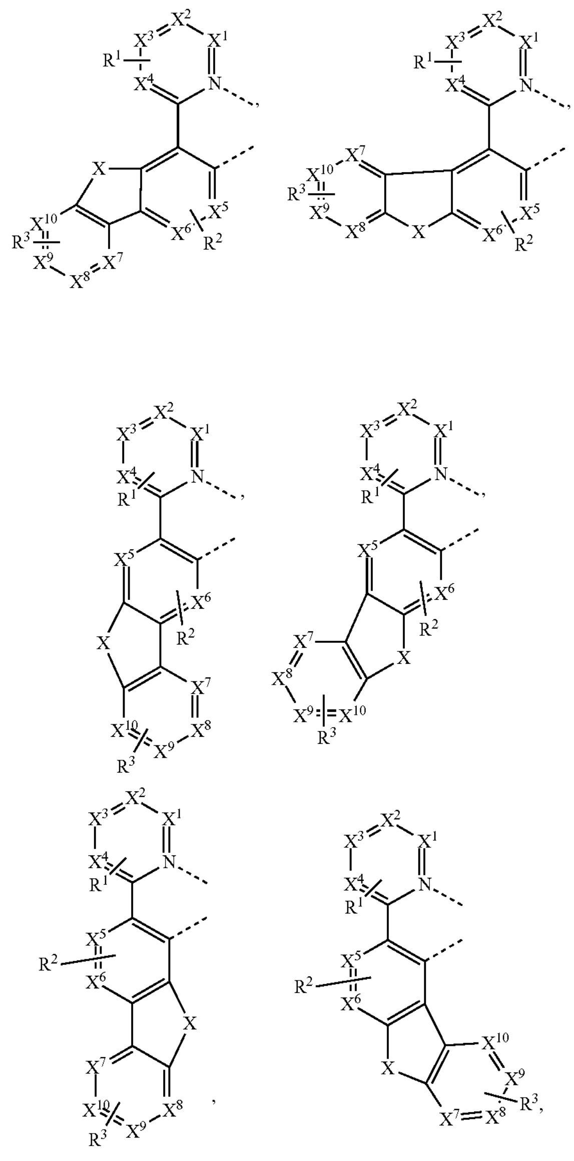

(ii) at least three of $R^1$, $R^2$, and $R^3$ comprise alkyl, cycloalkyl, aryl, or heteroaryl, and (iii) exactly one of $X^5$ to $X^{10}$ is N, or at least one X is selected from the group consisting of BR', NR', PR', Se, C═O, S═O, SO2, CR'R", SiR'R", or GeR'R", or (d) any combination of (a), (b), or (c);

wherein:

if $Z^1$ is C or Ring B is a five-membered carbocyclic or heterocyclic ring, then $R^B$ is one of the possible ring forming substituents, and if $Z^1$ is N, then (i) at least one $R^B$ comprises aryl or heteroaryl and the $R^B$ substituents are not joined or fused into a ring, or (ii) at least one $R^A$ or $R^B$ comprises cycloalkyl; and wherein:

if $Z^2$ is C or Ring D is a five-membered carbocyclic or heterocyclic ring, then $R^D$ is one of the possible ring forming substituents, and if $Z^2$ is N, then $R^D$ substituents are not joined or fused into a ring.

2. The compound of claim 1, wherein the ring A and C is benzene, and the ring is pyridine.

3. The compound of claim 1, wherein the rings C and D are each independently selected from the group consisting of phenyl, pyridine, imidazole, and imidazole derived carbene.

4. The compound of claim 1, wherein $Z^2$ is N.

5. The compound of claim 1, wherein at least one X is selected from the group consisting of NR', O, CR'R", and SiR'R".

6. The compound of claim 1, wherein at least four of $R^1$, $R^2$, and $R^{2'}$ comprises a moiety selected from the group consisting of alkyl, cycloalkyl, aryl and heteroaryl.

7. The compound of claim 1, wherein at least one of $L_A$, $L_B$, and $L_C$ is selected from the group consisting of:

$L^a_{Ai}$

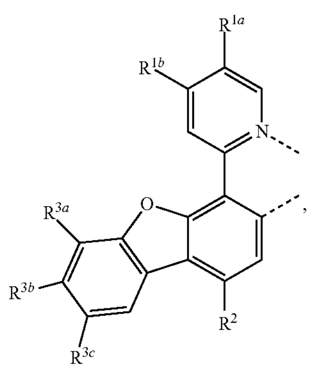

$L^b_{Ai}$

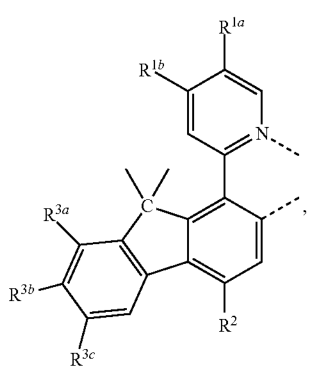

-continued $L^c_{Ai}$

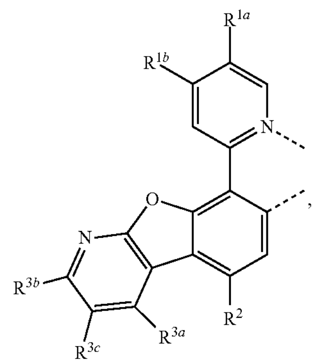

$L^d_{Ai}$

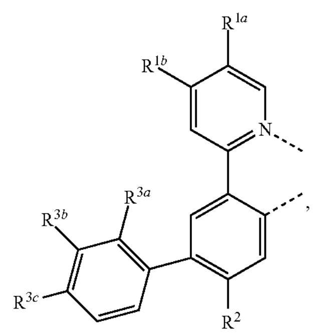

$L^e_{Ai}$

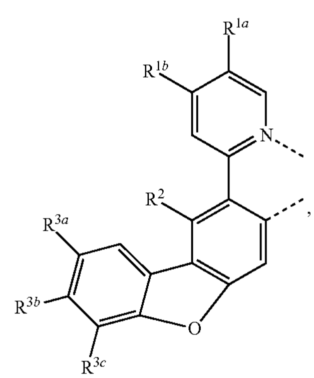

-continued
$L^f_{Ai}$
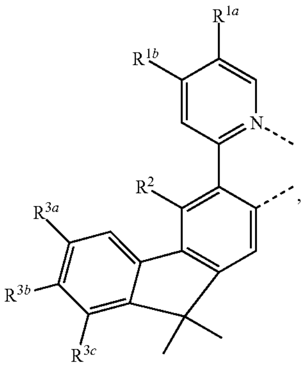
$L^g_{Ai}$
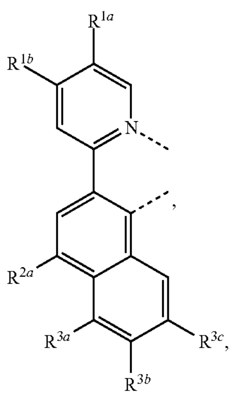
$L^h_{Ai}$
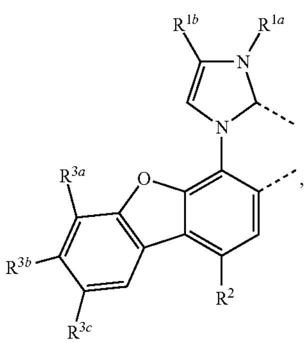
-continued
$L^i_{Ai}$
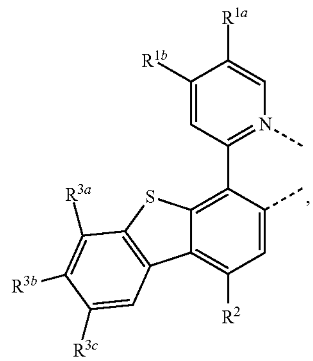
$L^j_{Ai}$
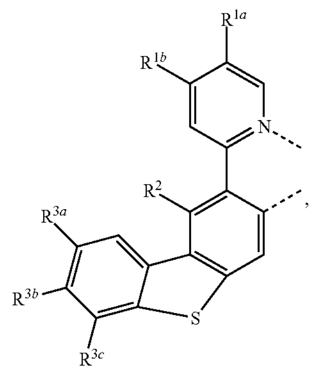
$L^k_{Ai}$
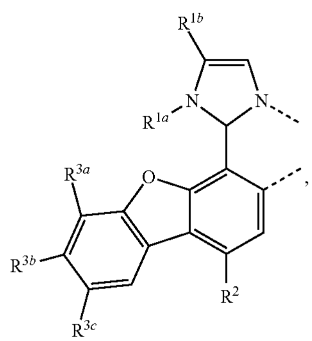
where i in Ai is 1 to 192 and 194 to 212 and the substituents in $L^a_{Ai}$ to $L^k_{Ai}$ are defined as,
| $L^a_{Ai}$ to $L^k_{Ai}$, where i is | $R^{1a}$ | $R^{1b}$ | $R^2$ | $R^{3a}$ | $R^{3b}$ | $R^{3c}$ |
|---|---|---|---|---|---|---|
| 1. | H | H | H | H | H | H |
| 2. | H | CH3 | H | H | H | H |
| 3. | H | CD3 | H | H | H | H |
| 4. | H | C2H5 | H | H | H | H |
| 5. | H | CD2CH3 | H | H | H | H |
| 6. | H | CHMe2 | H | H | H | H |
| 7. | H | CDMe2 | H | H | H | H |
| 8. | H | 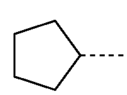 | H | H | H | H |
| 9. | H | 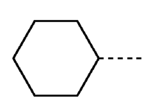 | H | H | H | H |

-continued
| $L^{a}_{Ai\ to}$ $L^{k}_{Ai,}$ where i is | $R^{1a}$ | $R^{1b}$ | $R^{2}$ | $R^{3a}$ | $R^{3b}$ | $R^{3c}$ |
|---|---|---|---|---|---|---|
| 10. | H | 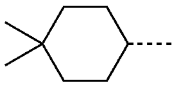 | H | H | H | H |
| 11. | H | 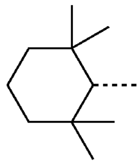 | H | H | H | H |
| 12. | H | 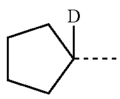 | H | H | H | H |
| 13. | H | 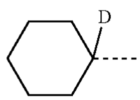 | H | H | H | H |
| 14. | H | 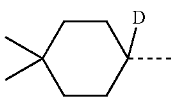 | H | H | H | H |
| 15. | H | 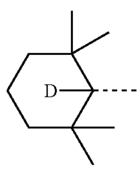 | H | H | H | H |
| 16. | H | 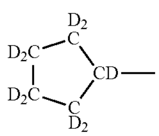 | H | H | H | H |
| 17. | H | CH2CMe3 | H | H | H | H |
| 18. | H | CD2CMe3 | H | H | H | H |
| 19. | H | 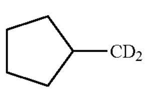 | H | H | H | H |
| 20. | H | 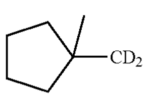 | H | H | H | H |
| 21. | CH3 | H | H | H | H | H |
| 22. | CD3 | H | H | H | H | H |
| 23. | C2H5 | H | H | H | H | H |
| 24. | CD2CH3 | H | H | H | H | H |
| 25. | CHMe2 | H | H | H | H | H |
| 26. | CDMe2 | H | H | H | H | H |
| 27. | 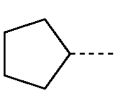 | H | H | H | H | H |
| 28. | 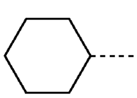 | H | H | H | H | H |

-continued
| $L^{a}_{Ai\ to}$ $L^{k}_{Ai}$, where i is | $R^{1a}$ | $R^{1b}$ | $R^{2}$ | $R^{3a}$ | $R^{3b}$ | $R^{3c}$ |
|---|---|---|---|---|---|---|
| 29. | 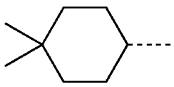 | H | H | H | H | H |
| 30. | 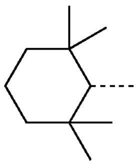 | H | H | H | H | H |
| 31. | 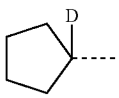 | H | H | H | H | H |
| 32. | 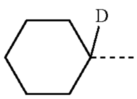 | H | H | H | H | H |
| 33. | 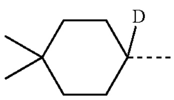 | H | H | H | H | H |
| 34. | 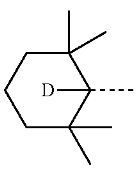 | H | H | H | H | H |
| 35. | 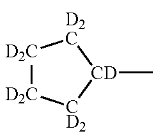 | H | H | H | H | H |
| 36. | CH2CMe3 | H | H | H | H | H |
| 37. | CD2CMe3 | H | H | H | H | H |
| 38. | 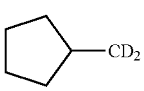 | H | H | H | H | H |
| 39. | 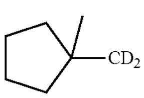 | H | H | H | H | H |
| 40. | CD3 | CH3 | H | H | H | H |
| 41. | CD3 | CD3 | H | H | H | H |
| 42. | CD3 | C2H5 | H | H | H | H |
| 43. | CD3 | CD2CH3 | H | H | H | H |
| 44. | CD3 | CHMe2 | H | H | H | H |
| 45. | CD3 | CDMe2 | H | H | H | H |
| 46. | CD3 | 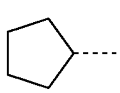 | H | H | H | H |
| 47. | CD3 | 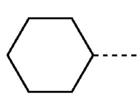 | H | H | H | H |

-continued
| $L^a_{Ai\ to}$ $L^k_{Ai}$, where i is | $R^{1a}$ | $R^{1b}$ | $R^2$ | $R^{3a}$ | $R^{3b}$ | $R^{3c}$ |
|---|---|---|---|---|---|---|
| 48. | CD3 | 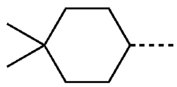 | H | H | H | H |
| 49. | CD3 | 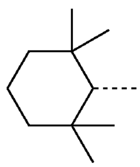 | H | H | H | H |
| 50. | CD3 | 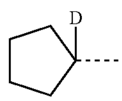 | H | H | H | H |
| 51. | CD3 | 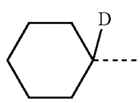 | H | H | H | H |
| 52. | CD3 | 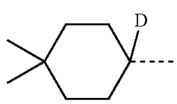 | H | H | H | H |
| 53. | CD3 | 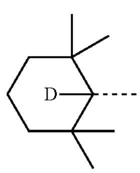 | H | H | H | H |
| 54. | CD3 | 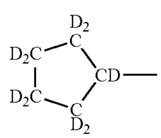 | H | H | H | H |
| 55. | CD3 | CH2CMe3 | H | H | H | H |
| 56. | CD3 | CD2CMe3 | H | H | H | H |
| 57. | CH2CH3 | CD3 | H | H | H | H |
| 58. | CD2CD3 | CD3 | H | H | H | H |
| 59. | C2H5 | CD3 | H | H | H | H |
| 60. | CD2CH3 | CD2CD3 | H | H | H | H |
| 61. | CHMe2 | CD3 | H | H | H | H |
| 62. | CDMe2 | CD3 | H | H | H | H |
| 63. | 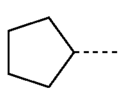 | CD3 | H | H | H | H |
| 64. | 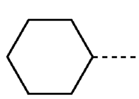 | CD3 | H | H | H | H |
| 65. | 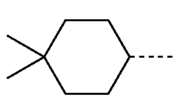 | CD3 | H | H | H | H |

-continued
| $L^a_{Ai}$ to $L^k_{Ai}$, where i is | $R^{1a}$ | $R^{1b}$ | $R^2$ | $R^{3a}$ | $R^{3b}$ | $R^{3c}$ |
|---|---|---|---|---|---|---|
| 66. | 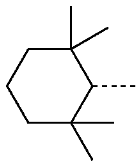 | CD3 | H | H | H | H |
| 67. | 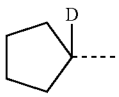 | CD3 | H | H | H | H |
| 68. | 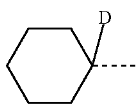 | CD3 | H | H | H | H |
| 69. | 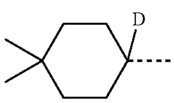 | CD3 | H | H | H | H |
| 70. | 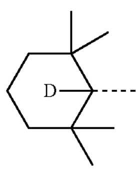 | CD3 | H | H | H | H |
| 71. | 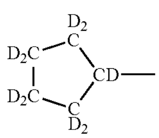 | CD3 | H | H | H | H |
| 72. | CH2CMe3 | CD3 | H | H | H | H |
| 73. | CD2CMe3 | CD3 | H | H | H | H |
| 74. | H | H | CD3 | H | H | H |
| 75. | H | CH3 | CD3 | H | H | H |
| 76. | H | CD3 | CD3 | H | H | H |
| 77. | H | C2H5 | CD3 | H | H | H |
| 78. | H | CD2CH3 | CD3 | H | H | H |
| 79. | H | CHMe2 | CD3 | H | H | H |
| 80. | H | CDMe2 | CD3 | H | H | H |
| 81. | H | 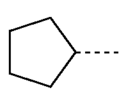 | CD3 | H | H | H |
| 82. | H | 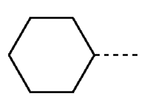 | CD3 | H | H | H |
| 83. | H | 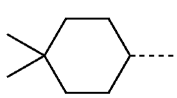 | CD3 | H | H | H |
| 84. | H | 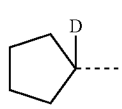 | CD3 | H | H | H |
| 85. | H | 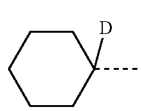 | CD3 | H | H | H |

-continued
| $L^a_{Ai}$ to $L^k_{Ai}$, where i is | $R^{1a}$ | $R^{1b}$ | $R^2$ | $R^{3a}$ | $R^{3b}$ | $R^{3c}$ |
|---|---|---|---|---|---|---|
| 86. | H | 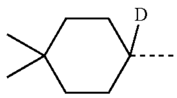 | CD3 | H | H | H |
| 87. | H | 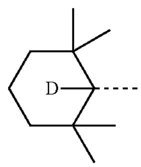 | CD3 | H | H | H |
| 88. | H | 1-Ad | CD3 | H | H | H |
| 89. | H | 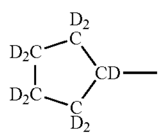 | CD3 | H | H | H |
| 90. | H | CH2CMe3 | CD3 | H | H | H |
| 91. | H | CD2CMe3 | CD3 | H | H | H |
| 92. | H | 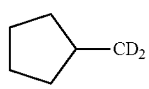 | CD3 | H | H | H |
| 93. | H | 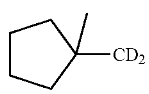 | CD3 | H | H | H |
| 94. | H | 2-Ad | CD3 | H | H | H |
| 95. | H | H | CD3 | H | H | CD3 |
| 96. | H | CH3 | CD3 | H | H | CD3 |
| 97. | H | CD3 | CD3 | H | H | CD3 |
| 98. | H | C2H5 | CD3 | H | H | CD3 |
| 99. | H | CD2CH3 | CD3 | H | H | CD3 |
| 100. | H | CHMe2 | CD3 | H | H | CD3 |
| 101. | H | CDMe2 | CD3 | H | H | CD3 |
| 102. | H | 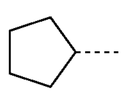 | CD3 | H | H | CD3 |
| 103. | H | 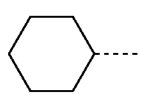 | CD3 | H | H | CD3 |
| 104. | H | 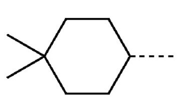 | CD3 | H | H | CD3 |
| 105. | H | 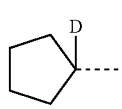 | CD3 | H | H | CD3 |
| 106. | H | 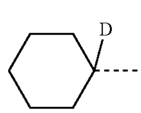 | CD3 | H | H | CD3 |

-continued
| $L^a_{Ai}$ to $L^k_{Ai}$, where i is | $R^{1a}$ | $R^{1b}$ | $R^2$ | $R^{3a}$ | $R^{3b}$ | $R^{3c}$ |
|---|---|---|---|---|---|---|
| 107. | H | 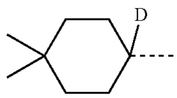 | CD3 | H | H | CD3 |
| 108. | H | 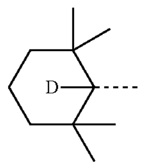 | CD3 | H | H | CD3 |
| 109. | H | 1-Ad | CD3 | H | H | CD3 |
| 110. | H | 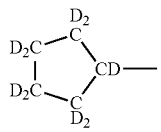 | CD3 | H | H | CD3 |
| 111. | H | CH2CMe3 | CD3 | H | H | CD3 |
| 112. | H | CD2CMe3 | CD3 | H | H | CD3 |
| 113. | H | 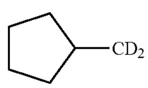 | CD3 | H | H | CD3 |
| 114. | H | 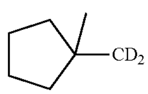 | CD3 | H | H | CD3 |
| 115. | H | 2-Ad | CD3 | H | H | H |
| 116. | H | H | CD3 | H | H | H |
| 117. | H | CH3 | CD3 | H | H | H |
| 118. | H | CD3 | CD3 | H | H | H |
| 119. | H | C2H5 | CD3 | H | H | H |
| 120. | H | CD2CH3 | CD3 | H | H | H |
| 121. | H | CHMe2 | CD3 | H | H | H |
| 122. | H | CDMe2 | CD3 | H | H | H |
| 123. | H | 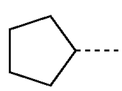 | CD3 | H | H | H |
| 124. | H | 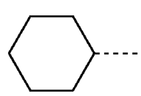 | CD3 | H | H | H |
| 125. | H | 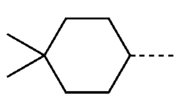 | CD3 | H | H | H |
| 126. | H | 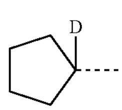 | CD3 | H | H | H |
| 127. | H | 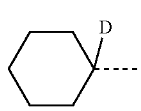 | CD3 | H | H | H |
| 128. | H | 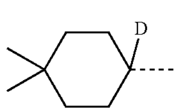 | CD3 | H | H | H |

-continued
| $L^{a}_{Ai}$ to $L^{k}_{Ai}$, where i is | $R^{1a}$ | $R^{1b}$ | $R^2$ | $R^{3a}$ | $R^{3b}$ | $R^{3c}$ |
|---|---|---|---|---|---|---|
| 129. | H | 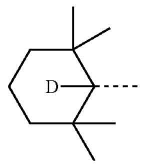 | CD3 | H | H | H |
| 130. | H | 1-Ad | CD3 | H | H | H |
| 131. | H | 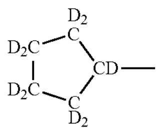 | CD3 | H | H | H |
| 132. | H | CH2CMe3 | CD3 | H | H | H |
| 133. | H | CD2CMe3 | CD3 | H | H | H |
| 134. | H | 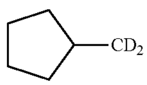 | CD3 | H | H | H |
| 135. | H | 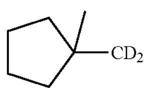 | CD3 | H | H | H |
| 136. | H | 2-Ad | CD3 | H | H | H |
| 137. | H | H | H | H | CD3 | H |
| 138. | H | CH3 | H | H | CD3 | H |
| 139. | H | CD3 | H | H | CD3 | H |
| 140. | H | C2H5 | H | H | CD3 | H |
| 141. | H | CD2CH3 | H | H | CD3 | H |
| 142. | H | CHMe2 | H | H | CD3 | H |
| 143. | H | CDMe2 | H | H | CD3 | H |
| 144. | H | 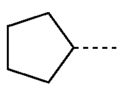 | H | H | CD3 | H |
| 145. | H | 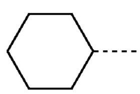 | H | H | CD3 | H |
| 146. | H | 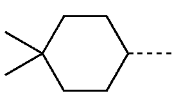 | H | H | CD3 | H |
| 147. | H | 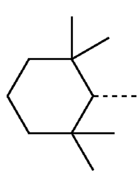 | H | H | CD3 | H |
| 148. | H | 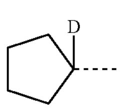 | H | H | CD3 | H |
| 149. | H | 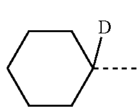 | H | H | CD3 | H |

-continued
| $L^{a}_{Ai}$ to $L^{k}_{Ai}$, where i is | $R^{1a}$ | $R^{1b}$ | $R^{2}$ | $R^{3a}$ | $R^{3b}$ | $R^{3c}$ |
|---|---|---|---|---|---|---|
| 150. | H | 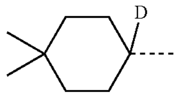 | H | H | CD3 | H |
| 151. | H | 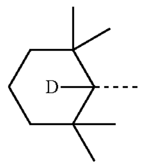 | H | H | CD3 | H |
| 152. | H | 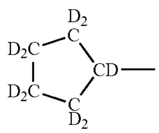 | H | H | CD3 | H |
| 153. | H | CH2CMe3 | H | H | CD3 | H |
| 154. | H | CD2CMe3 | H | H | CD3 | H |
| 155. | H | 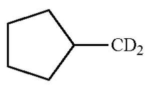 | H | H | CD3 | H |
| 156. | H | 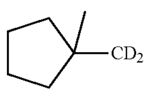 | H | H | CD3 | H |
| 157. | H | H | H | CD3 | H | H |
| 158. | H | CH3 | H | CD3 | H | H |
| 159. | H | CD3 | H | CD3 | H | H |
| 160. | H | C2H5 | H | CD3 | H | H |
| 161. | H | CD2CH3 | H | CD3 | H | H |
| 162. | H | CHMe2 | H | CD3 | H | H |
| 163. | H | CDMe2 | H | CD3 | H | H |
| 164. | H | 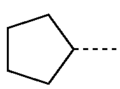 | H | CD3 | H | H |
| 165. | H | 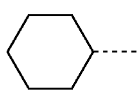 | H | CD3 | H | H |
| 166. | H | 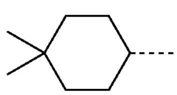 | H | CD3 | H | H |
| 167. | H | 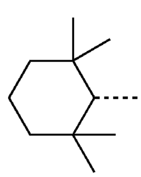 | H | CD3 | H | H |
| 168. | H | 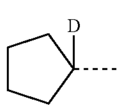 | H | CD3 | H | H |
| 169. | H | 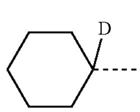 | H | CD3 | H | H |

-continued
| $L^a_{Ai\ to}$ $L^k_{Ai,}$ where i is | $R^{1a}$ | $R^{1b}$ | $R^2$ | $R^{3a}$ | $R^{3b}$ | $R^{3c}$ |
|---|---|---|---|---|---|---|
| 170. | H | 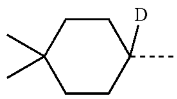 | H | CD3 | H | H |
| 171. | H | 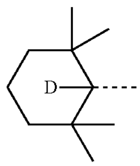 | H | CD3 | H | H |
| 172. | H | 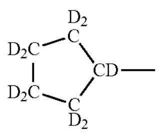 | H | CD3 | H | H |
| 173. | H | CH2CMe3 | H | CD3 | H | H |
| 174. | H | CD2CMe3 | H | CD3 | H | H |
| 175. | H | 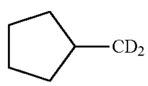 | H | CD3 | H | H |
| 176. | H | 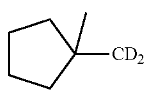 | H | CD3 | H | H |
| 177. | CD3 | Ph | H | H | H | H |
| 178. | CD3 | 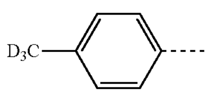 | H | H | H | H |
| 179. | CD3 | 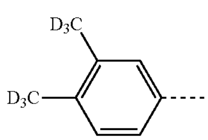 | H | H | H | H |
| 180. | CD3 | 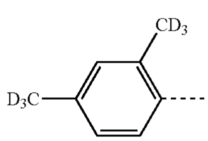 | H | H | H | H |
| 181. | H | Ph | H | H | H | H |
| 182. | H | 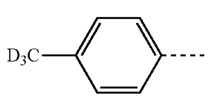 | H | H | H | H |
| 183. | H | 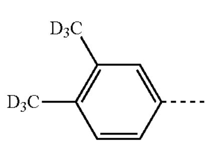 | H | H | H | H |

-continued
| $L^a_{Ai\ to}$ $L^k_{Ai,}$ where i is | $R^{1a}$ | $R^{1b}$ | $R^2$ | $R^{3a}$ | $R^{3b}$ | $R^{3c}$ |
|---|---|---|---|---|---|---|
| 184. | H | 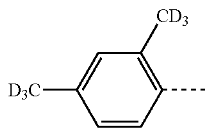 | H | H | H | H |
| 185. | CD3 | Ph | CD3 | H | H | H |
| 186. | CD3 | 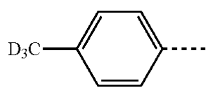 | CD3 | H | H | H |
| 187. | CD3 | 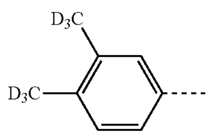 | CD3 | H | H | H |
| 188. | CD3 | 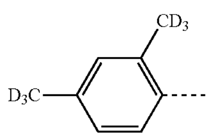 | CD3 | H | H | H |
| 189. | H | Ph | CD3 | H | H | H |
| 190. | H | 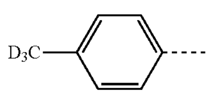 | CD3 | H | H | H |
| 191. | H | 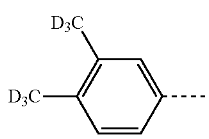 | CD3 | H | H | H |
| 192. | H | 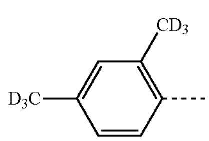 | CD3 | H | H | H |
| 193. | H | H | H | H | H | H |
| 194. | H | CH3 | H | H | H | H |
| 195. | H | CD3 | H | H | H | H |
| 196. | H | C2H5 | H | H | H | H |
| 197. | H | CD2CH3 | H | H | H | H |
| 198. | H | CHMe2 | H | H | H | H |
| 199. | H | CDMe2 | H | H | H | H |
| 200. | H | 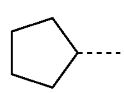 | H | H | H | H |
| 201. | H | 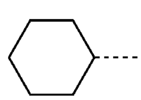 | H | H | H | H |
| 202. | H | 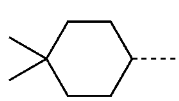 | H | H | H | H |

-continued

| $L^a_{Ai\ to}$ $L^k_{Ai}$, where i is | $R^{1a}$ | $R^{1b}$ | $R^2$ | $R^{3a}$ | $R^{3b}$ | $R^{3c}$ |
|---|---|---|---|---|---|---|
| 203. | H | 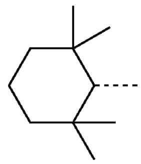 | H | H | H | H |
| 204. | H | 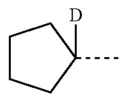 | H | H | H | H |
| 205. | H | 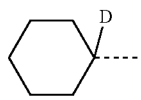 | H | H | H | H |
| 206. | H | 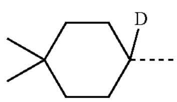 | H | H | H | H |
| 207. | H | 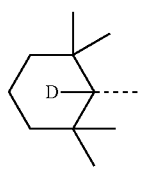 | H | H | H | H |
| 208. | H | 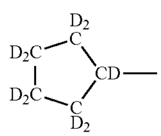 | H | H | H | H |
| 209. | CD3 | CD3 | H | H | CD3 | H |
| 210. | H | CD3 | H | CD3 | H | CD3 |
| 211. | CD3 | H | CD3 | H | H | H |
| 212. | CD3 | H | CD3 | H | H | 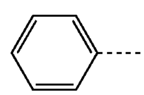 |

and $L_i$, wherein $L_i$ is wherein for each i from 1 to 1462, $R^{B1}$, $R^{B2}$, $R^{B3}$, and $R^{B4}$ are defined as follows for each i:

| i in Li | $R^{B1}$ | $R^{B2}$ | $R^{B3}$ | $R^{B4}$ | $R^{B5}$ |
|---|---|---|---|---|---|
| 1. | H | H | H | H | H |
| 2. | $CH_3$ | H | H | H | H |
| 3. | H | $CH_3$ | H | H | H |
| 4. | H | H | $CH_3$ | H | H |
| 5. | $CH_3$ | $CH_3$ | H | $CH_3$ | H |
| 6. | $CH_3$ | H | $CH_3$ | H | H |
| 7. | $CH_3$ | H | H | $CH_3$ | H |
| 8. | H | $CH_3$ | $CH_3$ | H | H |
| 9. | H | $CH_3$ | H | $CH_3$ | H |
| 10. | H | H | $CH_3$ | $CH_3$ | H |
| 11. | $CH_3$ | $CH_3$ | $CH_3$ | H | H |
| 12. | $CH_3$ | $CH_3$ | H | $CH_3$ | H |
| 13. | $CH_3$ | H | $CH_3$ | $CH_3$ | H |
| 14. | H | $CH_3$ | $CH_3$ | $CH_3$ | H |
| 15. | $CH_3$ | $CH_3$ | $CH_3$ | $CH_3$ | H |
| 16. | $CH_2CH_3$ | H | H | H | H |
| 17. | $CH_2CH_3$ | $CH_3$ | H | $CH_3$ | H |

-continued

| i in Li | $R^{B1}$ | $R^{B2}$ | $R^{B3}$ | $R^{B4}$ | $R^{B5}$ |
|---|---|---|---|---|---|
| 18. | $CH_2CH_3$ | H | $CH_3$ | H | H |
| 19. | $CH_2CH_3$ | H | H | $CH_3$ | H |
| 20. | $CH_2CH_3$ | $CH_3$ | $CH_3$ | H | H |
| 21. | $CH_2CH_3$ | $CH_3$ | H | $CH_3$ | H |
| 22. | $CH_2CH_3$ | H | $CH_3$ | $CH_3$ | H |
| 23. | $CH_2CH_3$ | $CH_3$ | $CH_3$ | $CH_3$ | H |
| 24. | H | $CH_2CH_3$ | H | H | H |
| 25. | $CH_3$ | $CH_2CH_3$ | H | $CH_3$ | H |
| 26. | H | $CH_2CH_3$ | $CH_3$ | H | H |
| 27. | H | $CH_2CH_3$ | H | $CH_3$ | H |
| 28. | $CH_3$ | $CH_2CH_3$ | $CH_3$ | H | H |
| 29. | $CH_3$ | $CH_2CH_3$ | H | $CH_3$ | H |
| 30. | H | $CH_2CH_3$ | $CH_3$ | $CH_3$ | H |
| 31. | $CH_3$ | $CH_2CH_3$ | $CH_3$ | $CH_3$ | H |
| 32. | H | H | $CH_2CH_3$ | H | H |
| 33. | $CH_3$ | H | $CH_2CH_3$ | H | H |
| 34. | H | $CH_3$ | $CH_2CH_3$ | H | H |
| 35. | H | H | $CH_2CH_3$ | $CH_3$ | H |
| 36. | $CH_3$ | $CH_3$ | $CH_2CH_3$ | H | H |
| 37. | $CH_3$ | H | $CH_2CH_3$ | $CH_3$ | H |
| 38. | H | $CH_3$ | $CH_2CH_3$ | $CH_3$ | H |
| 39. | $CH_3$ | $CH_3$ | $CH_2CH_3$ | $CH_3$ | H |
| 40. | $CH(CH_3)_2$ | H | H | H | H |
| 41. | $CH(CH_3)_2$ | $CH_3$ | H | $CH_3$ | H |
| 42. | $CH(CH_3)_2$ | H | $CH_3$ | H | H |
| 43. | $CH(CH_3)_2$ | H | H | $CH_3$ | H |
| 44. | $CH(CH_3)_2$ | $CH_3$ | $CH_3$ | H | H |
| 45. | $CH(CH_3)_2$ | $CH_3$ | H | $CH_3$ | H |
| 46. | $CH(CH_3)_2$ | H | $CH_3$ | $CH_3$ | H |
| 47. | $CH(CH_3)_2$ | $CH_3$ | $CH_3$ | $CH_3$ | H |
| 48. | H | $CH(CH_3)_2$ | H | H | H |
| 49. | $CH_3$ | $CH(CH_3)_2$ | H | $CH_3$ | H |
| 50. | H | $CH(CH_3)_2$ | $CH_3$ | H | H |
| 51. | H | $CH(CH_3)_2$ | H | $CH_3$ | H |
| 52. | $CH_3$ | $CH(CH_3)_2$ | $CH_3$ | H | H |
| 53. | CH3 | $CH(CH_3)_2$ | H | $CH_3$ | H |
| 54. | H | $CH(CH_3)_2$ | $CH_3$ | $CH_3$ | H |
| 55. | $CH_3$ | $CH(CH_3)_2$ | $CH_3$ | $CH_3$ | H |
| 56. | H | H | $CH(CH_3)_2$ | H | H |
| 57. | $CH_3$ | H | $CH(CH_3)_2$ | H | H |
| 58. | H | $CH_3$ | $CH(CH_3)_2$ | H | H |
| 59. | H | H | $CH(CH_3)_2$ | $CH_3$ | H |
| 60. | $CH_3$ | $CH_3$ | $CH(CH_3)_2$ | H | H |
| 61. | $CH_3$ | H | $CH(CH_3)_2$ | $CH_3$ | H |
| 62. | H | $CH_3$ | $CH(CH_3)_2$ | $CH_3$ | H |
| 63. | $CH_3$ | $CH_3$ | $CH(CH_3)_2$ | $CH_3$ | H |
| 64. | $CH_2CH(CH_3)_2$ | H | H | H | H |
| 65. | $CH_2CH(CH_3)_2$ | $CH_3$ | H | $CH_3$ | H |
| 66. | $CH_2CH(CH_3)_2$ | H | $CH_3$ | H | H |
| 67. | $CH_2CH(CH_3)_2$ | H | H | $CH_3$ | H |
| 68. | $CH_2CH(CH_3)_2$ | $CH_3$ | $CH_3$ | H | H |
| 69. | $CH_2CH(CH_3)_2$ | $CH_3$ | H | $CH_3$ | H |
| 70. | $CH_2CH(CH_3)_2$ | H | $CH_3$ | $CH_3$ | H |
| 71. | $CH_2CH(CH_3)_2$ | $CH_3$ | $CH_3$ | $CH_3$ | H |
| 72. | H | $CH_2CH(CH_3)_2$ | H | H | H |
| 73. | $CH_3$ | $CH_2CH(CH_3)_2$ | H | $CH_3$ | H |
| 74. | H | $CH_2CH(CH_3)_2$ | $CH_3$ | H | H |
| 75. | H | $CH_2CH(CH_3)_2$ | H | $CH_3$ | H |
| 76. | $CH_3$ | $CH_2CH(CH_3)_2$ | $CH_3$ | H | H |
| 77. | $CH_3$ | $CH_2CH(CH_3)_2$ | H | $CH_3$ | H |
| 78. | H | $CH_2CH(CH_3)_2$ | $CH_3$ | $CH_3$ | H |
| 79. | $CH_3$ | $CH_2CH(CH_3)_2$ | $CH_3$ | $CH_3$ | H |
| 80. | H | H | $CH_2CH(CH_3)_2$ | H | H |
| 81. | $CH_3$ | H | $CH_2CH(CH_3)_2$ | H | H |
| 82. | H | $CH_3$ | $CH_2CH(CH_3)_2$ | H | H |
| 83. | H | H | $CH_2CH(CH_3)_2$ | $CH_3$ | H |
| 84. | $CH_3$ | $CH_3$ | $CH_2CH(CH_3)_2$ | H | H |
| 85. | $CH_3$ | H | $CH_2CH(CH_3)_2$ | $CH_3$ | H |
| 86. | H | $CH_3$ | $CH_2CH(CH_3)_2$ | $CH_3$ | H |
| 87. | $CH_3$ | $CH_3$ | $CH_2CH(CH_3)_2$ | $CH_3$ | H |
| 88. | $C(CH_3)_3$ | H | H | H | H |
| 89. | $C(CH_3)_3$ | $CH_3$ | H | $CH_3$ | H |
| 90. | $C(CH_3)_3$ | H | $CH_3$ | H | H |
| 91. | $C(CH_3)_3$ | H | H | $CH_3$ | H |
| 92. | $C(CH_3)_3$ | $CH_3$ | $CH_3$ | H | H |
| 93. | $C(CH_3)_3$ | $CH_3$ | H | $CH_3$ | H |
| 94. | $C(CH_3)_3$ | H | $CH_3$ | $CH_3$ | H |

-continued

| i in Li | $R^{B1}$ | $R^{B2}$ | $R^{B3}$ | $R^{B4}$ | $R^{B5}$ |
|---|---|---|---|---|---|
| 95. | $C(CH_3)_3$ | $CH_3$ | $CH_3$ | $CH_3$ | H |
| 96. | H | $C(CH_3)_3$ | H | H | H |
| 97. | $CH_3$ | $C(CH_3)_3$ | H | $CH_3$ | H |
| 98. | H | $C(CH_3)_3$ | $CH_3$ | H | H |
| 99. | H | $C(CH_3)_3$ | H | $CH_3$ | H |
| 100. | $CH_3$ | $C(CH_3)_3$ | $CH_3$ | H | H |
| 101. | $CH_3$ | $C(CH_3)_3$ | H | $CH_3$ | H |
| 102. | H | $C(CH_3)_3$ | $CH_3$ | $CH_3$ | H |
| 103. | $CH_3$ | $C(CH_3)_3$ | $CH_3$ | $CH_3$ | H |
| 104. | H | H | $C(CH_3)_3$ | H | H |
| 105. | $CH_3$ | H | $C(CH_3)_3$ | H | H |
| 106. | H | $CH_3$ | $C(CH_3)_3$ | H | H |
| 107. | H | H | $C(CH_3)_3$ | $CH_3$ | H |
| 108. | $CH_3$ | $CH_3$ | $C(CH_3)_3$ | H | H |
| 109. | $CH_3$ | H | $C(CH_3)_3$ | $CH_3$ | H |
| 110. | H | $CH_3$ | $C(CH_3)_3$ | $CH_3$ | H |
| 111. | $CH_3$ | $CH_3$ | $C(CH_3)_3$ | $CH_3$ | H |
| 112. | $CH_2C(CH_3)_3$ | H | H | H | H |
| 113. | $CH_2C(CH_3)_3$ | $CH_3$ | H | $CH_3$ | H |
| 114. | $CH_2C(CH_3)_3$ | H | $CH_3$ | H | H |
| 115. | $CH_2C(CH_3)_3$ | H | H | $CH_3$ | H |
| 116. | $CH_2C(CH_3)_3$ | $CH_3$ | $CH_3$ | H | H |
| 117. | $CH_2C(CH_3)_3$ | $CH_3$ | H | $CH_3$ | H |
| 118. | $CH_2C(CH_3)_3$ | H | $CH_3$ | $CH_3$ | H |
| 119. | $CH_2C(CH_3)_3$ | $CH_3$ | $CH_3$ | $CH_3$ | H |
| 120. | H | $CH_2C(CH_3)_3$ | H | H | H |
| 121. | $CH_3$ | $CH_2C(CH_3)_3$ | H | $CH_3$ | H |
| 122. | H | $CH_2C(CH_3)_3$ | $CH_3$ | H | H |
| 123. | H | $CH_2C(CH_3)_3$ | H | $CH_3$ | H |
| 124. | $CH_3$ | $CH_2C(CH_3)_3$ | $CH_3$ | H | H |
| 125. | $CH_3$ | $CH_2C(CH_3)_3$ | H | $CH_3$ | H |
| 126. | H | $CH_2C(CH_3)_3$ | $CH_3$ | $CH_3$ | H |
| 127. | $CH_3$ | $CH_2C(CH_3)_3$ | $CH_3$ | $CH_3$ | H |
| 128. | H | H | $CH_2C(CH_3)_3$ | H | H |
| 129. | $CH_3$ | H | $CH_2C(CH_3)_3$ | H | H |
| 130. | H | $CH_3$ | $CH_2C(CH_3)_3$ | H | H |
| 131. | H | H | $CH_2C(CH_3)_3$ | $CH_3$ | H |
| 132. | $CH_3$ | $CH_3$ | $CH_2C(CH_3)_3$ | H | H |
| 133. | $CH_3$ | H | $CH_2C(CH_3)_3$ | $CH_3$ | H |
| 134. | H | $CH_3$ | $CH_2C(CH_3)_3$ | $CH_3$ | H |
| 135. | $CH_3$ | $CH_3$ | $CH_2C(CH_3)_3$ | $CH_3$ | H |
| 136. | 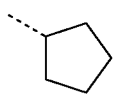 | H | H | H | H |
| 137. | 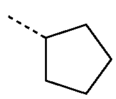 | $CH_3$ | H | $CH_3$ | H |
| 138. | 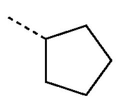 | H | $CH_3$ | H | H |
| 139. | 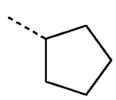 | H | H | $CH_3$ | H |
| 140. | 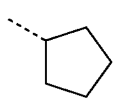 | $CH_3$ | $CH_3$ | H | H |
| 141. | 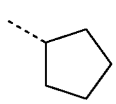 | $CH_3$ | H | $CH_3$ | H |
| 142. | 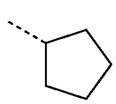 | H | $CH_3$ | $CH_3$ | H |

-continued
| i in Li | $R^{B1}$ | $R^{B2}$ | $R^{B3}$ | $R^{B4}$ | $R^{B5}$ |
|---|---|---|---|---|---|
| 143. | 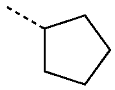 | $CH_3$ | $CH_3$ | $CH_3$ | H |
| 144. | H | 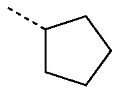 | H | H | H |
| 145. | $CH_3$ | 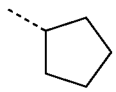 | H | $CH_3$ | H |
| 146. | H | 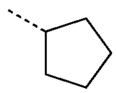 | $CH_3$ | H | H |
| 147. | H | 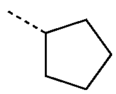 | H | $CH_3$ | H |
| 148. | $CH_3$ | 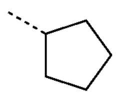 | $CH_3$ | H | H |
| 149. | $CH_3$ | 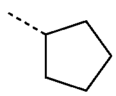 | H | $CH_3$ | H |
| 150. | H | 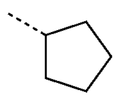 | $CH_3$ | $CH_3$ | H |
| 151. | $CH_3$ | 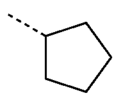 | $CH_3$ | $CH_3$ | H |
| 152. | H | H | 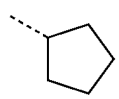 | H | H |
| 153. | $CH_3$ | H | 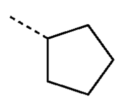 | H | H |
| 154. | H | $CH_3$ | 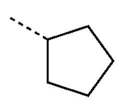 | H | H |
| 155. | H | H | 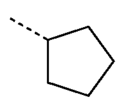 | $CH_3$ | H |
| 156. | $CH_3$ | $CH_3$ | 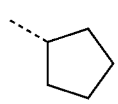 | H | H |
| 157. | $CH_3$ | H | 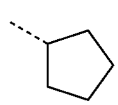 | $CH_3$ | H |

-continued
| i in Li | $R^{B1}$ | $R^{B2}$ | $R^{B3}$ | $R^{B4}$ | $R^{B5}$ |
|---|---|---|---|---|---|
| 158. | H | $CH_3$ | 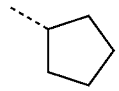 | $CH_3$ | H |
| 159. | $CH_3$ | $CH_3$ | 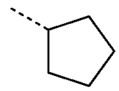 | $CH_3$ | H |
| 160. | 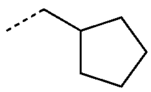 | H | H | H | H |
| 161. | 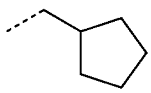 | $CH_3$ | H | $CH_3$ | H |
| 162. | 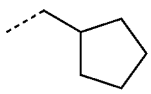 | H | $CH_3$ | H | H |
| 163. | 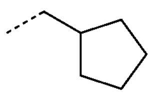 | H | H | $CH_3$ | H |
| 164. | 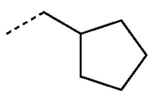 | $CH_3$ | $CH_3$ | H | H |
| 165. | 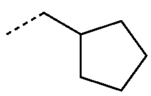 | $CH_3$ | H | $CH_3$ | H |
| 166. | 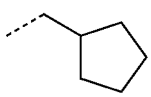 | H | $CH_3$ | $CH_3$ | H |
| 167. | 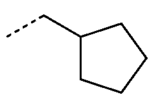 | $CH_3$ | $CH_3$ | $CH_3$ | H |
| 168. | H | 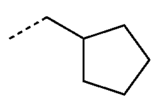 | H | H | H |
| 169. | $CH_3$ | 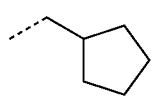 | H | $CH_3$ | H |
| 170. | H | 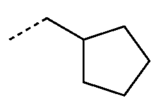 | $CH_3$ | H | H |
| 171. | H | 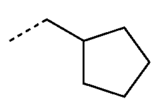 | H | $CH_3$ | H |
| 172. | $CH_3$ | 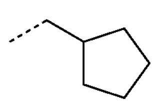 | $CH_3$ | H | H |

-continued
| i in Li | $R^{B1}$ | $R^{B2}$ | $R^{B3}$ | $R^{B4}$ | $R^{B5}$ |
|---|---|---|---|---|---|
| 173. | $CH_3$ | 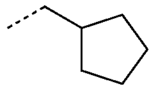 | H | $CH_3$ | H |
| 174. | H | 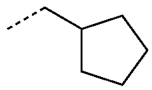 | $CH_3$ | $CH_3$ | H |
| 175. | $CH_3$ | 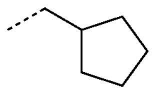 | $CH_3$ | $CH_3$ | H |
| 176. | H | H | 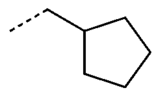 | H | H |
| 177. | $CH_3$ | H | 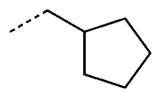 | H | H |
| 178. | H | $CH_3$ | 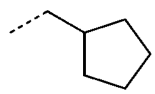 | H | H |
| 179. | H | H | 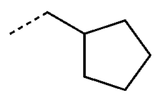 | $CH_3$ | H |
| 180. | $CH_3$ | $CH_3$ | 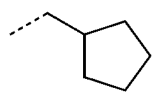 | H | H |
| 181. | $CH_3$ | H | 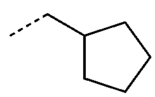 | $CH_3$ | H |
| 182. | H | $CH_3$ | 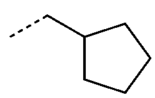 | $CH_3$ | H |
| 183. | $CH_3$ | $CH_3$ | 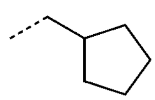 | $CH_3$ | H |
| 184. | 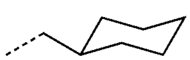 | H | H | H | H |
| 185. | 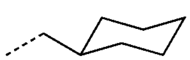 | $CH_3$ | H | $CH_3$ | H |
| 186. | 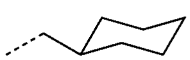 | H | $CH_3$ | H | H |
| 187. | 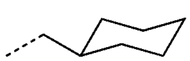 | H | H | $CH_3$ | H |
| 188. | 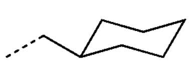 | $CH_3$ | $CH_3$ | H | H |
| 189. | 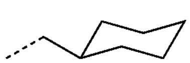 | $CH_3$ | H | $CH_3$ | H |
| 190. | 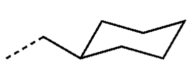 | H | $CH_3$ | $CH_3$ | H |

-continued
| i in Li | $R^{B1}$ | $R^{B2}$ | $R^{B3}$ | $R^{B4}$ | $R^{B5}$ |
|---|---|---|---|---|---|
| 191. | 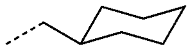 | $CH_3$ | $CH_3$ | $CH_3$ | H |
| 192. | H | 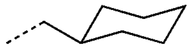 | H | H | H |
| 193. | $CH_3$ |  | H | $CH_3$ | H |
| 194. | H | 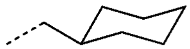 | $CH_3$ | H | H |
| 195. | H | 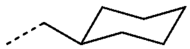 | H | $CH_3$ | H |
| 196. | $CH_3$ | 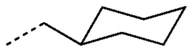 | $CH_3$ | H | H |
| 197. | $CH_3$ | 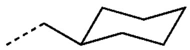 | H | $CH_3$ | H |
| 198. | H | 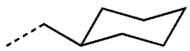 | $CH_3$ | $CH_3$ | H |
| 199. | $CH_3$ | 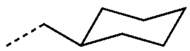 | $CH_3$ | $CH_3$ | H |
| 200. | H | H | 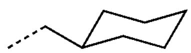 | H | H |
| 201. | $CH_3$ | H | 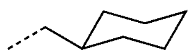 | H | H |
| 202. | H | $CH_3$ | 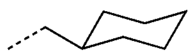 | H | H |
| 203. | H | H | 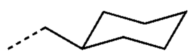 | $CH_3$ | H |
| 204. | $CH_3$ | $CH_3$ | 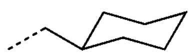 | H | H |
| 205. | $CH_3$ | H | 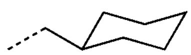 | $CH_3$ | H |
| 206. | H | $CH_3$ | 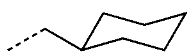 | $CH_3$ | H |
| 207. | $CH_3$ | $CH_3$ | 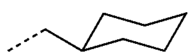 | $CH_3$ | H |
| 208. | 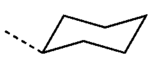 | H | H | H | H |
| 209. | 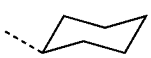 | $CH_3$ | H | $CH_3$ | H |
| 210. | 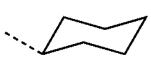 | H | $CH_3$ | H | H |
| 211. | 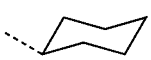 | H | H | $CH_3$ | H |
| 212. | 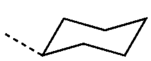 | $CH_3$ | $CH_3$ | H | H |
| 213. | 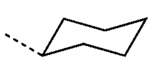 | $CH_3$ | H | $CH_3$ | H |
| 214. | 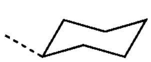 | H | $CH_3$ | $CH_3$ | H |
| 215. | 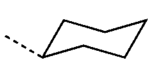 | $CH_3$ | $CH_3$ | $CH_3$ | H |

-continued
| i in Li | $R^{B1}$ | $R^{B2}$ | $R^{B3}$ | $R^{B4}$ | $R^{B5}$ |
|---|---|---|---|---|---|
| 216. | H | 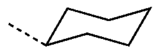 | H | H | H |
| 217. | $CH_3$ | 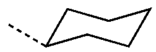 | H | $CH_3$ | H |
| 218. | H | 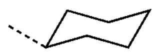 | $CH_3$ | H | H |
| 219. | H | 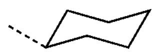 | H | $CH_3$ | H |
| 220. | $CH_3$ | 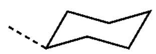 | $CH_3$ | H | H |
| 221. | $CH_3$ | 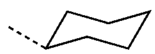 | H | $CH_3$ | H |
| 222. | H | 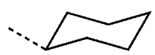 | $CH_3$ | $CH_3$ | H |
| 223. | $CH_3$ | 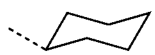 | $CH_3$ | $CH_3$ | H |
| 224. | H | H | 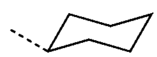 | H | H |
| 225. | $CH_3$ | H | 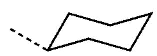 | H | H |
| 226. | H | $CH_3$ | 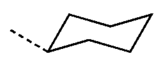 | H | H |
| 227. | H | H | 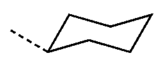 | $CH_3$ | H |
| 228. | $CH_3$ | $CH_3$ | 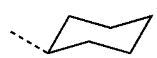 | H | H |
| 229. | $CH_3$ | H | 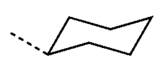 | $CH_3$ | H |
| 230. | H | $CH_3$ | 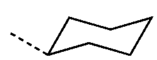 | $CH_3$ | H |
| 231. | $CH_3$ | $CH_3$ | 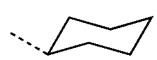 | $CH_3$ | H |
| 232. | 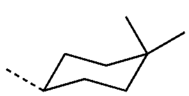 | H | H | H | H |
| 233. | 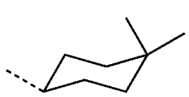 | $CH_3$ | H | $CH_3$ | H |
| 234. | 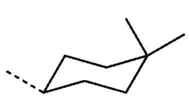 | H | $CH_3$ | H | H |
| 235. | 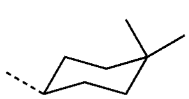 | H | H | $CH_3$ | H |
| 236. | 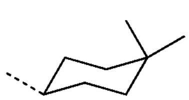 | $CH_3$ | $CH_3$ | H | H |

-continued
| i in Li | $R^{B1}$ | $R^{B2}$ | $R^{B3}$ | $R^{B4}$ | $R^{B5}$ |
|---|---|---|---|---|---|
| 237. | 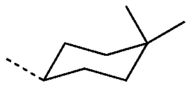 | $CH_3$ | H | $CH_3$ | H |
| 238. | 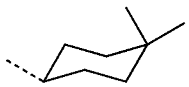 | H | $CH_3$ | $CH_3$ | H |
| 239. | 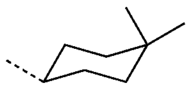 | $CH_3$ | $CH_3$ | $CH_3$ | H |
| 240. | H | 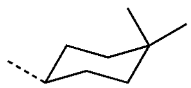 | H | H | H |
| 241. | $CH_3$ | 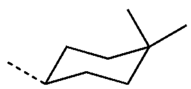 | H | $CH_3$ | H |
| 242. | H | 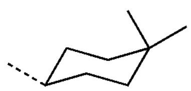 | $CH_3$ | H | H |
| 243. | H | 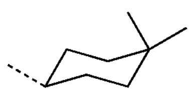 | H | $CH_3$ | H |
| 244. | $CH_3$ | 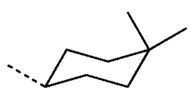 | $CH_3$ | H | H |
| 245. | $CH_3$ | 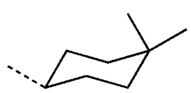 | H | $CH_3$ | H |
| 246. | H | 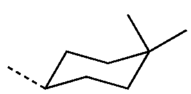 | $CH_3$ | $CH_3$ | H |
| 247. | $CH_3$ | 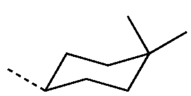 | $CH_3$ | $CH_3$ | H |
| 248. | H | H | 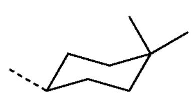 | H | H |
| 249. | $CH_3$ | H | 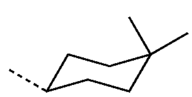 | H | H |
| 250. | H | $CH_3$ | 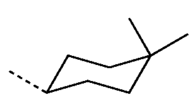 | H | H |
| 251. | H | H | 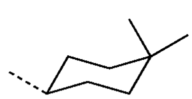 | $CH_3$ | H |
| 252. | $CH_3$ | $CH_3$ | 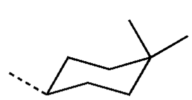 | H | H |

-continued
| i in Li | $R^{B1}$ | $R^{B2}$ | $R^{B3}$ | $R^{B4}$ | $R^{B5}$ |
|---|---|---|---|---|---|
| 253. | $CH_3$ | H | 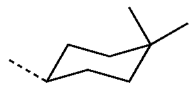 | $CH_3$ | H |
| 254. | H | $CH_3$ | 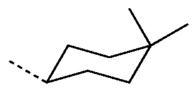 | $CH_3$ | H |
| 255. | $CH_3$ | $CH_3$ | 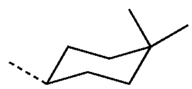 | $CH_3$ | H |
| 256. | 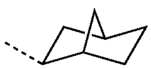 | H | H | H | H |
| 257. | 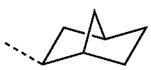 | $CH_3$ | H | $CH_3$ | H |
| 258. | 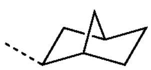 | H | $CH_3$ | H | H |
| 259. | 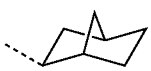 | H | H | $CH_3$ | H |
| 260. | 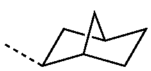 | $CH_3$ | $CH_3$ | H | H |
| 261. | 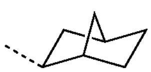 | $CH_3$ | H | $CH_3$ | H |
| 262. | 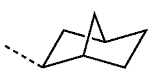 | H | $CH_3$ | $CH_3$ | H |
| 263. | 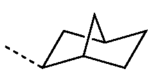 | $CH_3$ | $CH_3$ | $CH_3$ | H |
| 264. | H | 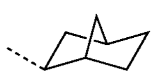 | H | H | H |
| 265. | $CH_3$ | 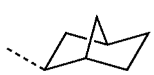 | H | $CH_3$ | H |
| 266. | H | 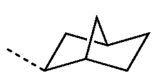 | $CH_3$ | H | H |
| 267. | H | 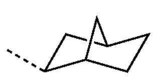 | H | $CH_3$ | H |
| 268. | $CH_3$ | 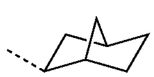 | $CH_3$ | H | H |
| 269. | $CH_3$ | 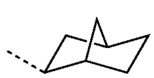 | H | $CH_3$ | H |
| 270. | H | 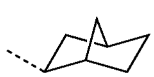 | $CH_3$ | $CH_3$ | H |

-continued

| i in Li | $R^{B1}$ | $R^{B2}$ | $R^{B3}$ | $R^{B4}$ | $R^{B5}$ |
|---|---|---|---|---|---|
| 271. | $CH_3$ | 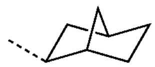 | $CH_3$ | $CH_3$ | H |
| 272. | H | H | 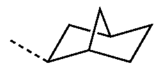 | H | H |
| 273. | $CH_3$ | H | 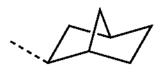 | H | H |
| 274. | H | $CH_3$ | 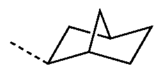 | H | H |
| 275. | H | H | 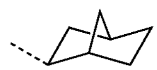 | $CH_3$ | H |
| 276. | $CH_3$ | $CH_3$ | 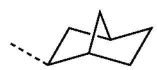 | H | H |
| 277. | $CH_3$ | H | 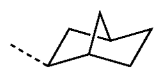 | $CH_3$ | H |
| 278. | H | $CH_3$ | 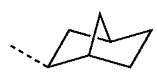 | $CH_3$ | H |
| 279. | $CH_3$ | $CH_3$ | 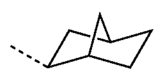 | $CH_3$ | H |
| 280. | $CH(CH_3)_2$ | H | $CH_2CH_3$ | H | H |
| 281. | $CH(CH_3)_2$ | H | $CH(CH_3)_2$ | H | H |
| 282. | $CH(CH_3)_2$ | H | $CH_2CH(CH_3)_2$ | H | H |
| 283. | $CH(CH_3)_2$ | H | $C(CH_3)_3$ | H | H |
| 284. | $CH(CH_3)_2$ | H | $CH_2C(CH_3)_3$ | H | H |
| 285. | $CH(CH_3)_2$ | H | 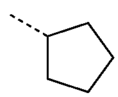 | H | H |
| 286. | $CH(CH_3)_2$ | H | 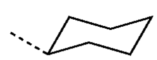 | H | H |
| 287. | $CH(CH_3)_2$ | H | 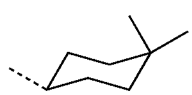 | H | H |
| 288. | $CH(CH_3)_2$ | H | 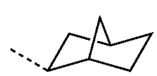 | H | H |
| 289. | $CH(CH_3)_2$ | H | 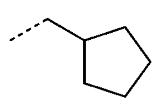 | H | H |
| 290. | $CH(CH_3)_2$ | H | 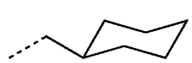 | H | H |
| 291. | $C(CH_3)_3$ | H | $CH_2CH_3$ | H | H |
| 292. | $C(CH_3)_3$ | H | $CH(CH_3)_2$ | H | H |
| 293. | $C(CH_3)_3$ | H | $CH_2CH(CH_3)_2$ | H | H |
| 294. | $C(CH_3)_3$ | H | $C(CH_3)_3$ | H | H |
| 295. | $C(CH_3)_3$ | H | $CH_2C(CH_3)_3$ | H | H |
| 296. | $C(CH_3)_3$ | H | 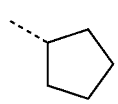 | H | H |

-continued
| i in Li | $R^{B1}$ | $R^{B2}$ | $R^{B3}$ | $R^{B4}$ | $R^{B5}$ |
|---|---|---|---|---|---|
| 297. | $C(CH_3)_3$ | H | 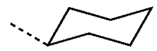 | H | H |
| 298. | $C(CH_3)_3$ | H | 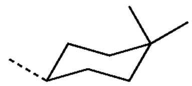 | H | H |
| 299. | $C(CH_3)_3$ | H | 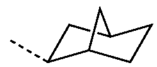 | H | H |
| 300. | $C(CH_3)_3$ | H | 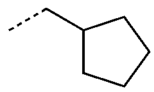 | H | H |
| 301. | $C(CH_3)_3$ | H | 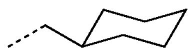 | H | H |
| 302. | $CH_2C(CH_3)_3$ | H | $CH_2CH_3$ | H | H |
| 303. | $CH_2C(CH_3)_3$ | H | $CH(CH_3)_2$ | H | H |
| 304. | $CH_2C(CH_3)_3$ | H | $CH_2CH(CH_3)_2$ | H | H |
| 305. | $CH_2C(CH_3)_3$ | H | $C(CH_3)_3$ | H | H |
| 306. | $CH_2C(CH_3)_3$ | H | $CH_2C(CH_3)_3$ | H | H |
| 307. | $CH_2C(CH_3)_3$ | H | $CH_2CH_2CF_3$ | H | H |
| 308. | $CH_2C(CH_3)_3$ | H | $CH_2C(CH_3)_2CF_3$ | H | H |
| 309. | $CH_2C(CH_3)_3$ | H | 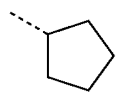 | H | H |
| 310. | $CH_2C(CH_3)_3$ | H | 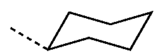 | H | H |
| 311. | $CH_2C(CH_3)_3$ | H | 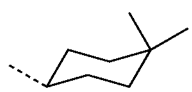 | H | H |
| 312. | $CH_2C(CH_3)_3$ | H | 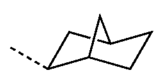 | H | H |
| 313. | $CH_2C(CH_3)_3$ | H | 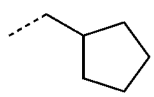 | H | H |
| 314. | $CH_2C(CH_3)_3$ | H | 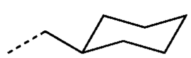 | H | H |
| 315. | 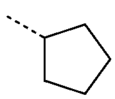 | H | $CH_2CH_3$ | H | H |
| 316. | 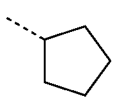 | H | $CH(CH_3)_2$ | H | H |
| 317. | 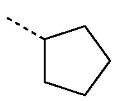 | H | $CH_2CH(CH_3)_2$ | H | H |
| 318. | 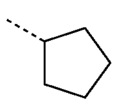 | H | $C(CH_3)_3$ | H | H |

-continued
| i in Li | $R^{B1}$ | $R^{B2}$ | $R^{B3}$ | $R^{B4}$ | $R^{B5}$ |
|---|---|---|---|---|---|
| 319. | 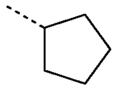 | H | $CH_2C(CH_3)_3$ | H | H |
| 320. | 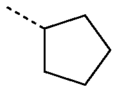 | H | 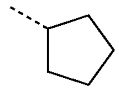 | H | H |
| 321. | 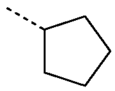 | H | 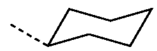 | H | H |
| 322. | 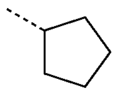 | H | 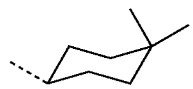 | H | H |
| 323. | 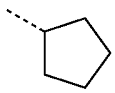 | H | 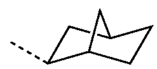 | H | H |
| 324. | 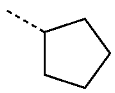 | H | 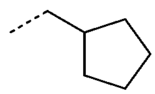 | H | H |
| 325. | 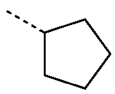 | H | 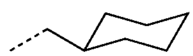 | H | H |
| 326. | 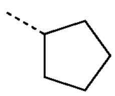 | H | $CH_2CH_3$ | H | H |
| 327. | 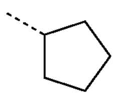 | H | $CH(CH_3)_2$ | H | H |
| 328. | 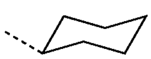 | H | $CH_2CH(CH_3)_2$ | H | H |
| 329. | 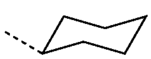 | H | $C(CH_3)_3$ | H | H |
| 330. | 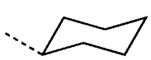 | H | $CH_2C(CH_3)_3$ | H | H |
| 331. | 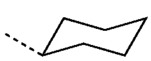 | H | 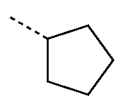 | H | H |
| 332. | 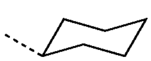 | H | 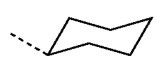 | H | H |
| 333. | 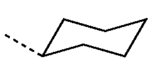 | H | 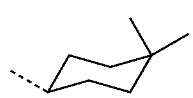 | H | H |
| 334. | 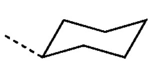 | H | 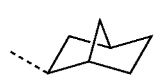 | H | H |
| 335. | 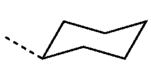 | H | 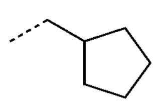 | H | H |

-continued
| i in Li | $R^{B1}$ | $R^{B2}$ | $R^{B3}$ | $R^{B4}$ | $R^{B5}$ |
|---|---|---|---|---|---|
| 336. | 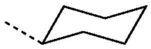 | H | 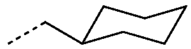 | H | H |
| 337. | 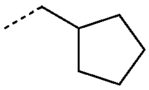 | H | $CH_2CH(CH_3)_2$ | H | H |
| 338. | 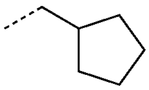 | H | $C(CH_3)_3$ | H | H |
| 339. | 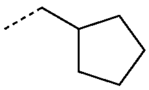 | H | $CH_2C(CH_3)_3$ | H | H |
| 340. | 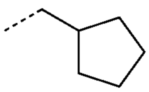 | H | 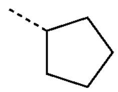 | H | H |
| 341. | 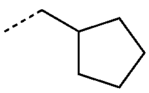 | H | 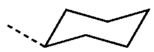 | H | H |
| 342. | 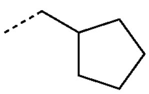 | H | 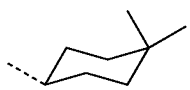 | H | H |
| 343. | 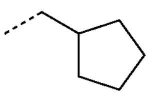 | H | 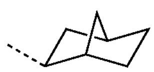 | H | H |
| 344. | 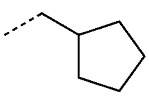 | H | 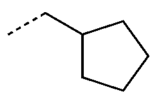 | H | H |
| 345. | 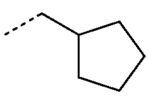 | H | 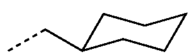 | H | H |
| 346. | 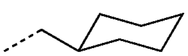 | H | $CH_2CH(CH_3)_2$ | H | H |
| 347. | 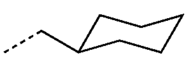 | H | $C(CH_3)_3$ | H | H |
| 348. | 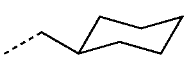 | H | $CH_2C(CH_3)_3$ | H | H |
| 349. | 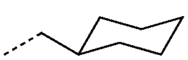 | H | 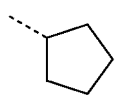 | H | H |
| 350. | 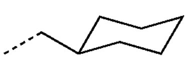 | H | 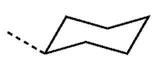 | H | H |
| 351. | 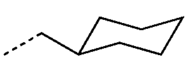 | H | 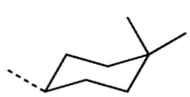 | H | H |
| 352. | 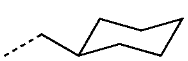 | H | 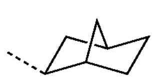 | H | H |

-continued

| i in Li | $R^{B1}$ | $R^{B2}$ | $R^{B3}$ | $R^{B4}$ | $R^{B5}$ |
|---|---|---|---|---|---|
| 353. | 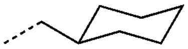 | H | 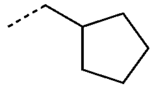 | H | H |
| 354. | 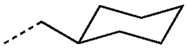 | H |  | H | H |
| 355. | 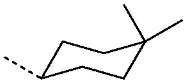 | H | $CH_2CH(CH_3)_2$ | H | H |
| 356. | 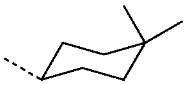 | H | $C(CH_3)_3$ | H | H |
| 357. | 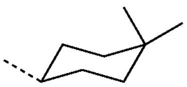 | H | $CH_2C(CH_3)_3$ | H | H |
| 358. | 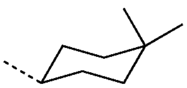 | H | 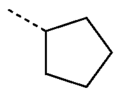 | H | H |
| 359. | 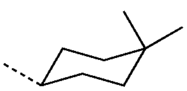 | H | 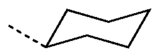 | H | H |
| 360. | 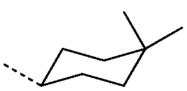 | H | 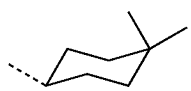 | H | H |
| 361. | 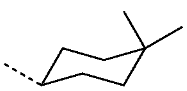 | H | 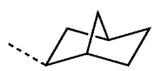 | H | H |
| 362. | 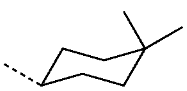 | H | 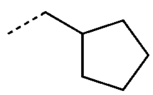 | H | H |
| 363. | 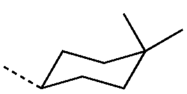 | H | 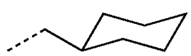 | H | H |
| 364. | H | H | H | H | H |
| 365. | $CD_3$ | H | H | H | H |
| 366. | H | $CD_3$ | H | H | H |
| 367. | H | H | $CD_3$ | H | H |
| 368. | $CD_3$ | $CD_3$ | H | $CD_3$ | H |
| 369. | $CD_3$ | H | $CD_3$ | H | H |
| 370. | $CD_3$ | H | H | $CD_3$ | H |
| 371. | H | $CD_3$ | $CD_3$ | H | H |
| 372. | H | $CD_3$ | H | $CD_3$ | H |
| 373. | H | H | $CD_3$ | $CD_3$ | H |
| 374. | $CD_3$ | $CD_3$ | $CD_3$ | H | H |
| 375. | $CD_3$ | $CD_3$ | H | $CD_3$ | H |
| 376. | $CD_3$ | H | $CD_3$ | $CD_3$ | H |
| 377. | H | $CD_3$ | $CD_3$ | $CD_3$ | H |
| 378. | $CD_3$ | $CD_3$ | $CD_3$ | $CD_3$ | H |
| 379. | $CD_2CH_3$ | H | H | H | H |
| 380. | $CD_2CH_3$ | $CD_3$ | H | $CD_3$ | H |
| 381. | $CD_2CH_3$ | H | $CD_3$ | H | H |
| 382. | $CD_2CH_3$ | H | H | $CD_3$ | H |
| 383. | $CD_2CH_3$ | $CD_3$ | $CD_3$ | H | H |
| 384. | $CD_2CH_3$ | $CD_3$ | H | $CD_3$ | H |
| 385. | $CD_2CH_3$ | H | $CD_3$ | $CD_3$ | H |
| 386. | $CD_2CH_3$ | $CD_3$ | $CD_3$ | $CD_3$ | H |
| 387. | H | $CD_2CH_3$ | H | H | H |
| 388. | $CH_3$ | $CD_2CH_3$ | H | $CD_3$ | H |

-continued

| i in Li | $R^{B1}$ | $R^{B2}$ | $R^{B3}$ | $R^{B4}$ | $R^{B5}$ |
|---|---|---|---|---|---|
| 389. | H | $CD_2CH_3$ | $CD_3$ | H | H |
| 390. | H | $CD_2CH_3$ | H | $CD_3$ | H |
| 391. | $CD_3$ | $CD_2CH_3$ | $CD_3$ | H | H |
| 392. | $CD_3$ | $CD_2CH_3$ | H | $CD_3$ | H |
| 393. | H | $CD_2CH_3$ | $CD_3$ | $CD_3$ | H |
| 394. | $CD_3$ | $CD_2CH_3$ | $CD_3$ | $CD_3$ | H |
| 395. | H | H | $CD_2CH_3$ | H | H |
| 396. | $CD_3$ | H | $CD_2CH_3$ | H | H |
| 397. | H | $CD_3$ | $CD_2CH_3$ | H | H |
| 398. | H | H | $CD_2CH_3$ | $CD_3$ | H |
| 399. | $CD_3$ | $CD_3$ | $CD_2CH_3$ | H | H |
| 400. | $CD_3$ | H | $CD_2CH_3$ | $CD_3$ | H |
| 401. | H | $CD_3$ | $CD_2CH_3$ | $CD_3$ | H |
| 402. | $CD_3$ | $CD_3$ | $CD_2CH_3$ | $CD_3$ | H |
| 403. | $CD(CH_3)_2$ | H | H | H | H |
| 404. | $CD(CH_3)_2$ | $CD_3$ | H | $CD_3$ | H |
| 405. | $CD(CH_3)_2$ | H | $CD_3$ | H | H |
| 406. | $CD(CH_3)_2$ | H | H | $CD_3$ | H |
| 407. | $CD(CH_3)_2$ | $CD_3$ | $CD_3$ | H | H |
| 408. | $CD(CH_3)_2$ | $CD_3$ | H | $CD_3$ | H |
| 409. | $CD(CH_3)_2$ | H | $CD_3$ | $CD_3$ | H |
| 410. | $CD(CH_3)_2$ | $CD_3$ | $CD_3$ | $CD_3$ | H |
| 411. | H | $CD(CH_3)_2$ | H | H | H |
| 412. | $CD_3$ | $CD(CH_3)_2$ | H | $CD_3$ | H |
| 413. | H | $CD(CH_3)_2$ | $CD_3$ | H | H |
| 414. | H | $CD(CH_3)_2$ | H | $CD_3$ | H |
| 415. | $CD_3$ | $CD(CH_3)_2$ | $CD_3$ | H | H |
| 416. | $CD_3$ | $CD(CH_3)_2$ | H | $CD_3$ | H |
| 417. | H | $CD(CH_3)_2$ | $CD_3$ | $CD_3$ | H |
| 418. | $CD_3$ | $CD(CH_3)_2$ | $CD_3$ | $CD_3$ | H |
| 419. | H | H | $CD(CH_3)_2$ | H | H |
| 420. | $CD_3$ | H | $CD(CH_3)_2$ | H | H |
| 421. | H | $CD_3$ | $CD(CH_3)_2$ | H | H |
| 422. | H | H | $CD(CH_3)_2$ | $CD_3$ | H |
| 423. | $CD_3$ | $CD_3$ | $CD(CH_3)_2$ | H | H |
| 424. | $CD_3$ | H | $CD(CH_3)_2$ | $CD_3$ | H |
| 425. | H | $CD_3$ | $CD(CH_3)_2$ | $CD_3$ | H |
| 426. | $CD_3$ | $CD_3$ | $CD(CH_3)_2$ | $CD_3$ | H |
| 427. | $CD(CD_3)_2$ | H | H | H | H |
| 428. | $CD(CD_3)_2$ | $CD_3$ | H | $CD_3$ | H |
| 429. | $CD(CD_3)_2$ | H | $CD_3$ | H | H |
| 430. | $CD(CD_3)_2$ | H | H | $CD_3$ | H |
| 431. | $CD(CD_3)_2$ | $CD_3$ | $CD_3$ | H | H |
| 432. | $CD(CD_3)_2$ | $CD_3$ | H | $CD_3$ | H |
| 433. | $CD(CD_3)_2$ | H | $CD_3$ | $CD_3$ | H |
| 434. | $CD(CD_3)_2$ | $CD_3$ | $CD_3$ | $CD_3$ | H |
| 435. | H | $CD(CD_3)_2$ | H | H | H |
| 436. | $CD_3$ | $CD(CD_3)_2$ | H | $CD_3$ | H |
| 437. | H | $CD(CD_3)_2$ | $CD_3$ | H | H |
| 438. | H | $CD(CD_3)_2$ | H | $CD_3$ | H |
| 439. | $CD_3$ | $CD(CD_3)_2$ | $CD_3$ | H | H |
| 440. | $CD_3$ | $CD(CD_3)_2$ | H | $CD_3$ | H |
| 441. | H | $CD(CD_3)_2$ | $CD_3$ | $CD_3$ | H |
| 442. | $CD_3$ | $CD(CD_3)_2$ | $CD_3$ | $CD_3$ | H |
| 443. | H | H | $CD(CD_3)_2$ | H | H |
| 444. | $CD_3$ | H | $CD(CD_3)_2$ | H | H |
| 445. | H | $CD_3$ | $CD(CD_3)_2$ | H | H |
| 446. | H | H | $CD(CD_3)_2$ | $CD_3$ | H |
| 447. | $CD_3$ | $CD_3$ | $CD(CD_3)_2$ | H | H |
| 448. | $CD_3$ | H | $CD(CD_3)_2$ | $CD_3$ | H |
| 449. | H | $CD_3$ | $CD(CD_3)_2$ | $CD_3$ | H |
| 450. | $CD_3$ | $CD_3$ | $CD(CD_3)_2$ | $CD_3$ | H |
| 451. | $CD_2CH(CH_3)_2$ | H | H | H | H |
| 452. | $CD_2CH(CH_3)_2$ | $CD_3$ | H | $CD_3$ | H |
| 453. | $CD_2CH(CH_3)_2$ | H | $CD_3$ | H | H |
| 454. | $CD_2CH(CH_3)_2$ | H | H | $CD_3$ | H |
| 455. | $CD_2CH(CH_3)_2$ | $CD_3$ | $CD_3$ | H | H |
| 456. | $CD_2CH(CH_3)_2$ | $CD_3$ | H | $CD_3$ | H |
| 457. | $CD_2CH(CH_3)_2$ | H | $CD_3$ | $CD_3$ | H |
| 458. | $CD_2CH(CH_3)_2$ | $CD_3$ | $CD_3$ | $CD_3$ | H |
| 459. | H | $CD_2CH(CH_3)_2$ | H | H | H |
| 460. | $CD_3$ | $CD_2CH(CH_3)_2$ | H | $CD_3$ | H |
| 461. | H | $CD_2CH(CH_3)2$ | $CD_3$ | H | H |
| 462. | H | $CD_2CH(CH_3)2$ | H | $CD_3$ | H |
| 463. | $CD_3$ | $CD_2CH(CH_3)_2$ | $CD_3$ | H | H |
| 464. | $CD_3$ | $CD_2CH(CH_3)_2$ | H | $CD_3$ | H |
| 465. | H | $CD_2CH(CH_3)_2$ | $CD_3$ | $CD_3$ | H |

-continued

| i in Li | $R^{B1}$ | $R^{B2}$ | $R^{B3}$ | $R^{B4}$ | $R^{B5}$ |
|---|---|---|---|---|---|
| 466. | $CD_3$ | $CD_2CH(CH_3)_2$ | $CD_3$ | $CD_3$ | H |
| 467. | H | H | $CD_2CH(CH_3)_2$ | H | H |
| 468. | $CD_3$ | H | $CD_2CH(CH_3)_2$ | H | H |
| 469. | H | $CD_3$ | $CD_2CH(CH_3)_2$ | H | H |
| 470. | H | H | $CD_2CH(CH_3)_2$ | $CD_3$ | H |
| 471. | $CD_3$ | $CD_3$ | $CD_2CH(CH_3)_2$ | H | H |
| 472. | $CD_3$ | H | $CD_2CH(CH_3)_2$ | $CD_3$ | H |
| 473. | H | $CD_3$ | $CD_2CH(CH_3)_2$ | $CD_3$ | H |
| 474. | $CD_3$ | $CD_3$ | $CD_2CH(CH_3)_2$ | $CD_3$ | H |
| 475. | $CD_2C(CH_3)_3$ | H | H | H | H |
| 476. | $CD_2C(CH_3)_3$ | $CD_3$ | H | $CD_3$ | H |
| 477. | $CD_2C(CH_3)_3$ | H | $CD_3$ | H | H |
| 478. | $CD_2C(CH_3)_3$ | H | H | $CD_3$ | H |
| 479. | $CD_2C(CH_3)_3$ | $CD_3$ | $CD_3$ | H | H |
| 480. | $CD_2C(CH_3)_3$ | $CD_3$ | H | $CD_3$ | H |
| 481. | $CD_2C(CH_3)_3$ | H | $CD_3$ | $CD_3$ | H |
| 482. | $CD_2C(CH_3)_3$ | $CH_3$ | $CD_3$ | $CD_3$ | H |
| 483. | H | $CD_2C(CH_3)_3$ | H | H | H |
| 484. | $CD_3$ | $CD_2C(CH_3)_3$ | H | $CD_3$ | H |
| 485. | H | $CD_2C(CH_3)_3$ | $CD_3$ | H | H |
| 486. | H | $CD_2C(CH_3)_3$ | H | $CD_3$ | H |
| 487. | $CD_3$ | $CD_2C(CH_3)_3$ | $CD_3$ | H | H |
| 488. | $CD_3$ | $CD_2C(CH_3)_3$ | H | $CD_3$ | H |
| 489. | H | $CD_2C(CH_3)_3$ | $CD_3$ | $CD_3$ | H |
| 490. | $CD_3$ | $CD_2C(CH_3)_3$ | $CD_3$ | $CD_3$ | H |
| 491. | H | H | $CD_2C(CH_3)_3$ | H | H |
| 492. | $CD_3$ | H | $CD_2C(CH_3)_3$ | H | H |
| 493. | H | $CD_3$ | $CD_2C(CH_3)_3$ | H | H |
| 494. | H | H | $CD_2C(CH_3)_3$ | $CD_3$ | H |
| 495. | $CD_3$ | $CD_3$ | $CD_2C(CH_3)_3$ | H | H |
| 496. | $CD_3$ | H | $CD_2C(CH_3)_3$ | $CD_3$ | H |
| 497. | H | $CD_3$ | $CD_2C(CH_3)_3$ | $CD_3$ | H |
| 498. | $CD_3$ | $CD_3$ | $CD_2C(CH_3)_3$ | $CD_3$ | H |
| 499. | 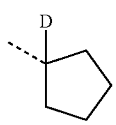 | H | H | H | H |
| 500. | 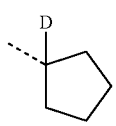 | $CD_3$ | H | $CD_3$ | H |
| 501. | 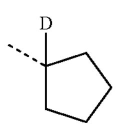 | H | $CD_3$ | H | H |
| 502. | 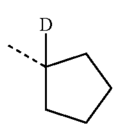 | H | H | $CD_3$ | H |
| 503. | 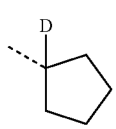 | $CD_3$ | $CD_3$ | H | H |
| 504. | 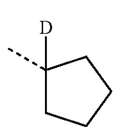 | $CD_3$ | H | $CD_3$ | H |
| 505. | 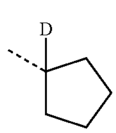 | H | $CD_3$ | $CD_3$ | H |

-continued
| i in Li | $R^{B1}$ | $R^{B2}$ | $R^{B3}$ | $R^{B4}$ | $R^{B5}$ |
|---|---|---|---|---|---|
| 506. | 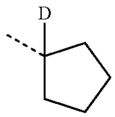 | $CD_3$ | $CD_3$ | $CD_3$ | H |
| 507. | H | 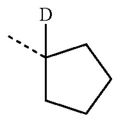 | H | H | H |
| 508. | $CD_3$ | 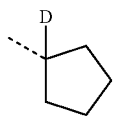 | H | $CD_3$ | H |
| 509. | H | 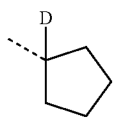 | $CD_3$ | H | H |
| 510. | H | 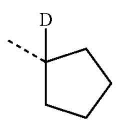 | H | $CD_3$ | H |
| 511. | $CD_3$ | 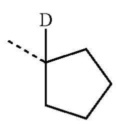 | $CD_3$ | H | H |
| 512. | $CD_3$ | 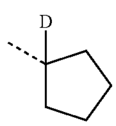 | H | $CD_3$ | H |
| 513. | H | 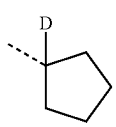 | $CD_3$ | $CD_3$ | H |
| 514. | $CD_3$ | 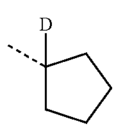 | $CD_3$ | $CD_3$ | H |
| 515. | H | H | 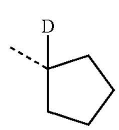 | H | H |
| 516. | $CD_3$ | H | 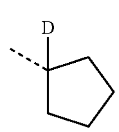 | H | H |
| 517. | H | $CD_3$ | 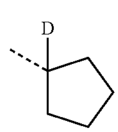 | H | H |

-continued
| i in Li | $R^{B1}$ | $R^{B2}$ | $R^{B3}$ | $R^{B4}$ | $R^{B5}$ |
| --- | --- | --- | --- | --- | --- |
| 518. | H | H | 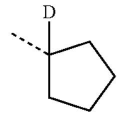 | $CD_3$ | H |
| 519. | $CD_3$ | $CD_3$ | 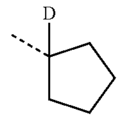 | H | H |
| 520. | $CD_3$ | H | 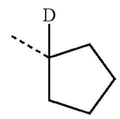 | $CD_3$ | H |
| 521. | H | $CD_3$ | 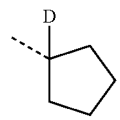 | $CD_3$ | H |
| 522. | $CD_3$ | $CD_3$ | 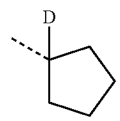 | $CD_3$ | H |
| 523. | 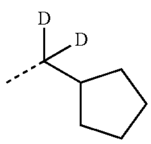 | H | H | H | H |
| 524. | 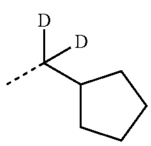 | $CD_3$ | H | $CD_3$ | H |
| 525. | 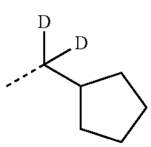 | H | $CD_3$ | H | H |
| 526. | 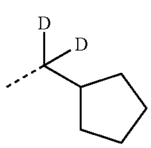 | H | H | $CD_3$ | H |
| 527. | 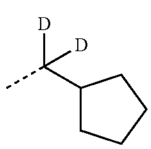 | $CD_3$ | $CD_3$ | H | H |
| 528. | 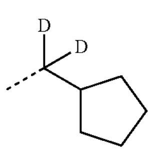 | $CD_3$ | H | $CD_3$ | H |

-continued
| i in Li | $R^{B1}$ | $R^{B2}$ | $R^{B3}$ | $R^{B4}$ | $R^{B5}$ |
|---|---|---|---|---|---|
| 529. | 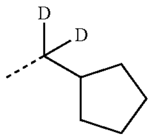 | H | $CD_3$ | $CD_3$ | H |
| 530. | 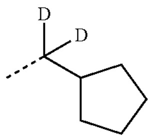 | $CD_3$ | $CD_3$ | $CD_3$ | H |
| 531. | H | 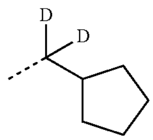 | H | H | H |
| 532. | $CH_3$ | 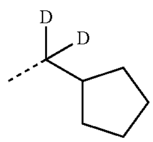 | H | $CD_3$ | H |
| 533. | H | 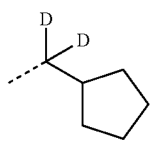 | $CD_3$ | H | H |
| 534. | H | 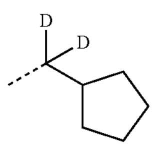 | H | $CD_3$ | H |
| 535. | $CD_3$ | 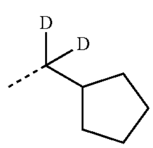 | $CD_3$ | H | H |
| 536. | $CD_3$ | 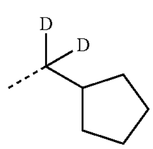 | H | $CD_3$ | H |
| 537. | H | 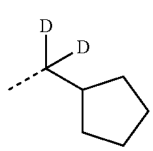 | $CD_3$ | $CD_3$ | H |
| 538. | $CH_3$ | 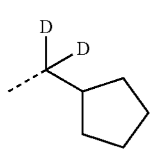 | $CD_3$ | $CD_3$ | H |

-continued
| i in Li | $R^{B1}$ | $R^{B2}$ | $R^{B3}$ | $R^{B4}$ | $R^{B5}$ |
|---|---|---|---|---|---|
| 539. | H | H | 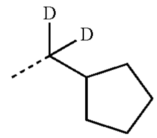 | H | H |
| 540. | $CD_3$ | H | 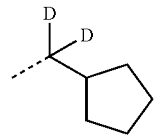 | H | H |
| 541. | H | $CD_3$ | 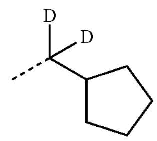 | H | H |
| 542. | H | H | 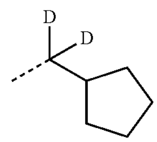 | $CD_3$ | H |
| 543. | $CD_3$ | $CD_3$ | 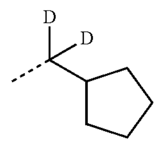 | H | H |
| 544. | $CD_3$ | H | 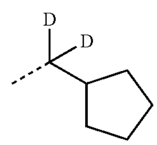 | $CD_3$ | H |
| 545. | H | $CD_3$ | 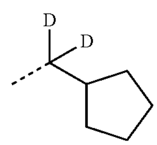 | $CD_3$ | H |
| 546. | $CD_3$ | $CD_3$ | 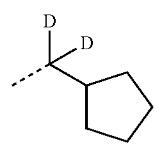 | $CD_3$ | H |
| 547. | 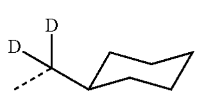 | H | H | H | H |
| 548. | 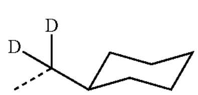 | $CD_3$ | H | $CD_3$ | H |
| 549. | 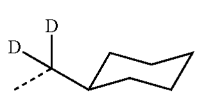 | H | $CD_3$ | H | H |
| 550. | 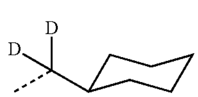 | H | H | $CD_3$ | H |

-continued
| i in Li | $R^{B1}$ | $R^{B2}$ | $R^{B3}$ | $R^{B4}$ | $R^{B5}$ |
|---|---|---|---|---|---|
| 551. | 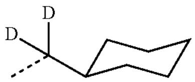 | $CD_3$ | $CD_3$ | H | H |
| 552. | 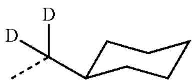 | $CD_3$ | H | $CD_3$ | H |
| 553. | 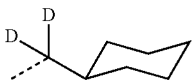 | H | $CD_3$ | $CD_3$ | H |
| 554. | 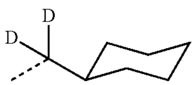 | $CD_3$ | $CD_3$ | $CD_3$ | H |
| 555. | H | 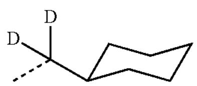 | H | H | H |
| 556. | $CD_3$ | 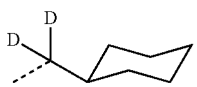 | H | $CD_3$ | H |
| 557. | H | 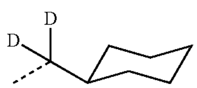 | $CD_3$ | H | H |
| 558. | H | 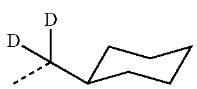 | H | $CD_3$ | H |
| 559. | $CD_3$ | 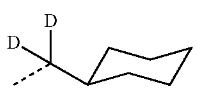 | $CD_3$ | H | H |
| 560. | $CD_3$ | 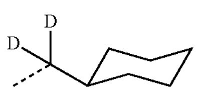 | H | $CD_3$ | H |
| 561. | H | 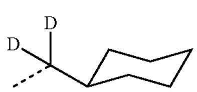 | $CD_3$ | $CD_3$ | H |
| 562. | $CD_3$ | 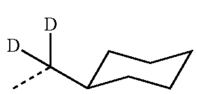 | $CD_3$ | $CD_3$ | H |
| 563. | H | H | 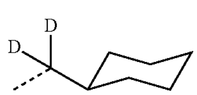 | H | H |
| 564. | $CD_3$ | H | 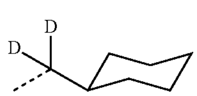 | H | H |
| 565. | H | $CD_3$ | 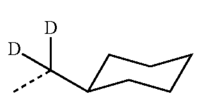 | H | H |
| 566. | H | H | 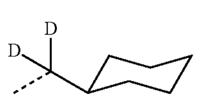 | $CD_3$ | H |

-continued
| i in Li | $R^{B1}$ | $R^{B2}$ | $R^{B3}$ | $R^{B4}$ | $R^{B5}$ |
|---|---|---|---|---|---|
| 567. | $CD_3$ | $CD_3$ | 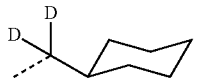 | H | H |
| 568. | $CD_3$ | H | 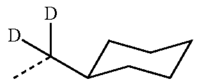 | $CD_3$ | H |
| 569. | H | $CD_3$ | 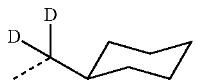 | $CD_3$ | H |
| 570. | $CD_3$ | $CD_3$ | 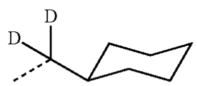 | $CD_3$ | H |
| 571. | 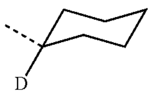 | H | H | H | H |
| 572. | 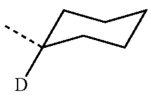 | $CD_3$ | H | $CD_3$ | H |
| 573. | 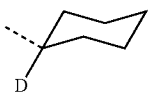 | H | $CD_3$ | H | H |
| 574. | 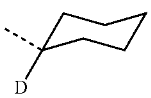 | H | H | $CD_3$ | H |
| 575. | 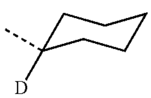 | $CD_3$ | $CD_3$ | H | H |
| 576. | 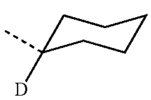 | $CD_3$ | H | $CD_3$ | H |
| 577. | 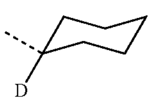 | H | $CD_3$ | $CD_3$ | H |
| 578. | 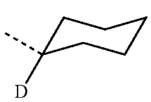 | $CD_3$ | $CD_3$ | $CD_3$ | H |
| 579. | H | 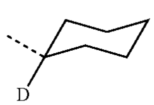 | H | H | H |
| 580. | $CD_3$ | 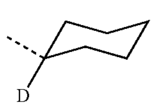 | H | $CD_3$ | H |
| 581. | H | 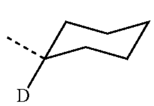 | $CD_3$ | H | H |

-continued
| i in Li | $R^{B1}$ | $R^{B2}$ | $R^{B3}$ | $R^{B4}$ | $R^{B5}$ |
|---|---|---|---|---|---|
| 582. | H | 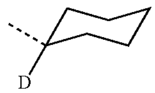 | H | $CD_3$ | H |
| 583. | $CD_3$ | 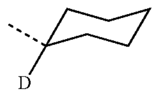 | $CD_3$ | H | H |
| 584. | $CD_3$ | 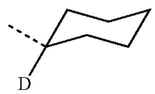 | H | $CD_3$ | H |
| 585. | H | 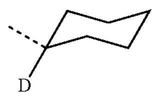 | $CD_3$ | $CD_3$ | H |
| 586. | $CD_3$ | 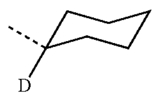 | $CD_3$ | $CD_3$ | H |
| 587. | H | H | 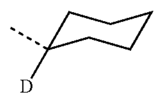 | H | H |
| 588. | $CD_3$ | H | 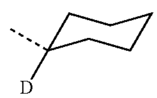 | H | H |
| 589. | H | $CD_3$ | 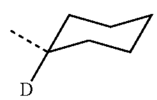 | H | H |
| 590. | H | H | 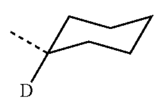 | $CD_3$ | H |
| 591. | $CD_3$ | $CD_3$ | 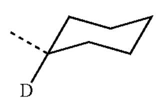 | H | H |
| 592. | $CD_3$ | H | 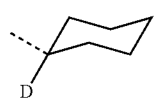 | $CD_3$ | H |
| 593. | H | $CD_3$ | 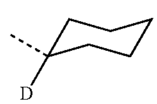 | $CD_3$ | H |
| 594. | $CD_3$ | $CD_3$ | 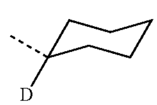 | $CD_3$ | H |
| 595. | 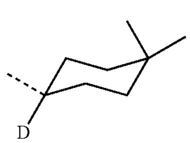 | H | H | H | H |

-continued
| i in Li | $R^{B1}$ | $R^{B2}$ | $R^{B3}$ | $R^{B4}$ | $R^{B5}$ |
|---|---|---|---|---|---|
| 596. | 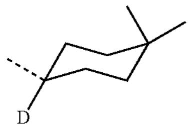 | $CD_3$ | H | $CD_3$ | H |
| 597. | 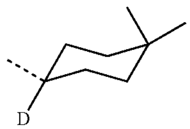 | H | $CD_3$ | H | H |
| 598. | 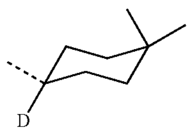 | H | H | $CD_3$ | H |
| 599. | 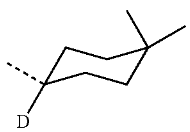 | $CD_3$ | $CD_3$ | H | H |
| 600. | 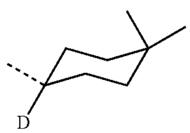 | $CD_3$ | H | $CD_3$ | H |
| 601. | 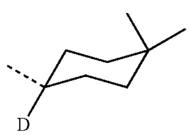 | H | $CD_3$ | $CD_3$ | H |
| 602. | 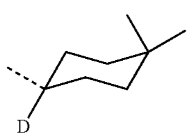 | $CD_3$ | $CD_3$ | $CD_3$ | H |
| 603. | H | 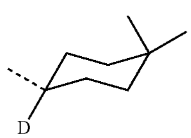 | H | H | H |
| 604. | $CD_3$ | 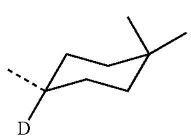 | H | $CD_3$ | H |
| 605. | H | 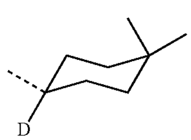 | $CD_3$ | H | H |
| 606. | H | 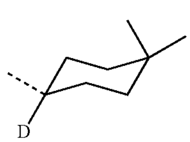 | H | $CD_3$ | H |

-continued
| i in Li | $R^{B1}$ | $R^{B2}$ | $R^{B3}$ | $R^{B4}$ | $R^{B5}$ |
|---|---|---|---|---|---|
| 607. | $CD_3$ | 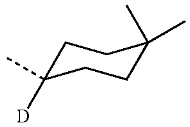 | $CD_3$ | H | H |
| 608. | $CD_3$ | 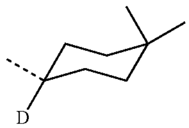 | H | $CD_3$ | H |
| 609. | H | 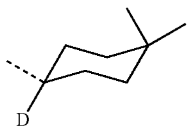 | $CD_3$ | $CD_3$ | H |
| 610. | $CD_3$ | 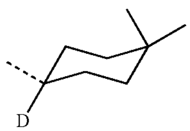 | $CD_3$ | $CD_3$ | H |
| 611. | H | H | 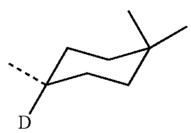 | H | H |
| 612. | $CD_3$ | H | 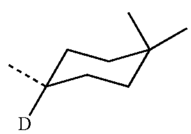 | H | H |
| 613. | H | $CD_3$ | 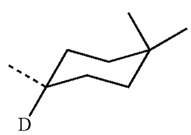 | H | H |
| 614. | H | H | 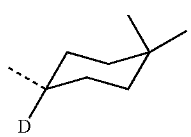 | $CD_3$ | H |
| 615. | $CD_3$ | $CD_3$ | 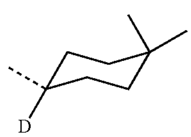 | H | H |
| 616. | $CD_3$ | H | 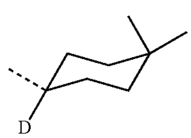 | $CD_3$ | H |
| 617. | H | $CD_3$ | 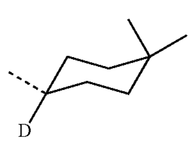 | $CD_3$ | H |

-continued
| i in Li | $R^{B1}$ | $R^{B2}$ | $R^{B3}$ | $R^{B4}$ | $R^{B5}$ |
|---|---|---|---|---|---|
| 618. | $CD_3$ | $CD_3$ | 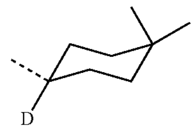 | $CD_3$ | H |
| 619. | 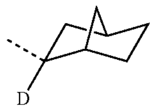 | H | H | H | H |
| 620. | 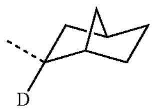 | $CD_3$ | H | $CD_3$ | H |
| 621. | 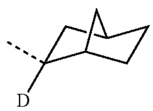 | H | $CD_3$ | H | H |
| 622. | 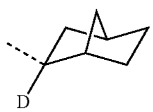 | H | H | $CD_3$ | H |
| 623. | 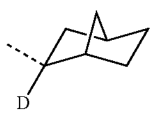 | $CH_3$ | $CH_3$ | H | H |
| 624. | 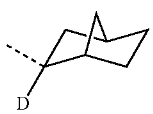 | $CD_3$ | H | $CD_3$ | H |
| 625. | 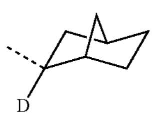 | H | $CD_3$ | $CD_3$ | H |
| 626. | 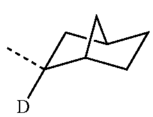 | $CD_3$ | $CD_3$ | $CD_3$ | H |
| 627. | H | 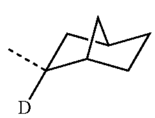 | H | H | H |
| 628. | $CD_3$ | 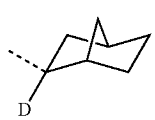 | H | $CD_3$ | H |
| 629. | H | 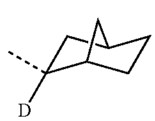 | $CD_3$ | H | H |
| 630. | H | 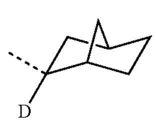 | H | $CD_3$ | H |

-continued
| i in Li | $R^{B1}$ | $R^{B2}$ | $R^{B3}$ | $R^{B4}$ | $R^{B5}$ |
|---|---|---|---|---|---|
| 631. | $CD_3$ | 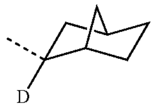 | $CD_3$ | H | H |
| 632. | $CD_3$ | 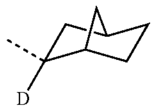 | H | $CD_3$ | H |
| 633. | H | 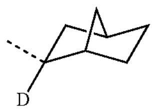 | $CD_3$ | $CD_3$ | H |
| 634. | $CD_3$ | 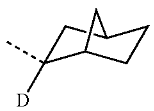 | $CD_3$ | $CD_3$ | H |
| 635. | H | H | 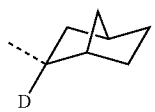 | H | H |
| 636. | $CD_3$ | H | 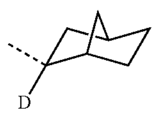 | H | H |
| 637. | H | $CD_3$ | 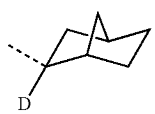 | H | H |
| 638. | H | H | 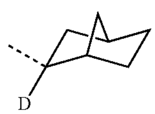 | $CH_3$ | H |
| 639. | $CD_3$ | $CD_3$ | 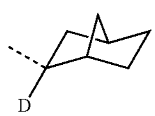 | H | H |
| 640. | $CD_3$ | H | 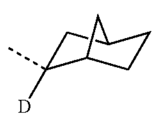 | $CD_3$ | H |
| 641. | H | $CD_3$ | 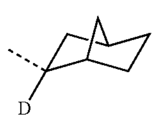 | $CD_3$ | H |
| 642. | $CD_3$ | $CD_3$ | 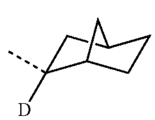 | $CD_3$ | H |
| 643. | $CD(CH_3)_2$ | H | $CD_2CH_3$ | H | H |
| 644. | $CD(CH_3)_2$ | H | $CD(CH_3)_2$ | H | H |
| 645. | $CD(CH_3)_2$ | H | $CD_2CH(CH_3)_2$ | H | H |
| 646. | $CD(CH_3)_2$ | H | $C(CH_3)_3$ | H | H |
| 647. | $CD(CH_3)_2$ | H | $CD_2C(CH_3)_3$ | H | H |

-continued
| i in Li | $R^{B1}$ | $R^{B2}$ | $R^{B3}$ | $R^{B4}$ | $R^{B5}$ |
|---|---|---|---|---|---|
| 648. | $CD(CH_3)_2$ | H | 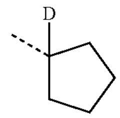 | H | H |
| 649. | $CD(CH_3)_2$ | H | 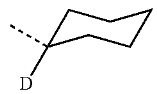 | H | H |
| 650. | $CD(CH_3)_2$ | H | 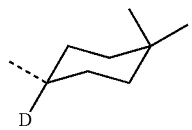 | H | H |
| 651. | $CD(CH_3)_2$ | H | 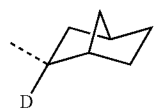 | H | H |
| 652. | $CD(CH_3)_2$ | H | 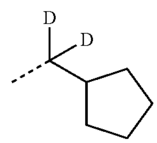 | H | H |
| 653. | $CD(CH_3)_2$ | H | 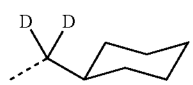 | H | H |
| 654. | $C(CH_3)_3$ | H | $CD_2CH_3$ | H | H |
| 655. | $C(CH_3)_3$ | H | $CD(CH_3)_2$ | H | H |
| 656. | $C(CH_3)_3$ | H | $CD_2CH(CH_3)_2$ | H | H |
| 657. | $C(CH_3)_3$ | H | $C(CH_3)_3$ | H | H |
| 658. | $C(CH_3)_3$ | H | $CD_2C(CH_3)_3$ | H | H |
| 659. | $C(CH_3)_3$ | H | 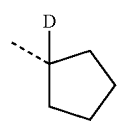 | H | H |
| 660. | $C(CH_3)_3$ | H | 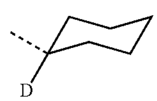 | H | H |
| 661. | $C(CH_3)_3$ | H | 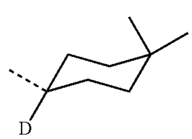 | H | H |
| 662. | $C(CH_3)_3$ | H | 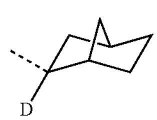 | H | H |
| 663. | $C(CH_3)_3$ | H | 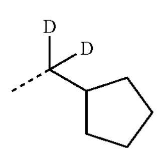 | H | H |
| 664. | $C(CH_3)_3$ | H | 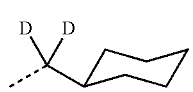 | H | H |

-continued
| i in Li | $R^{B1}$ | $R^{B2}$ | $R^{B3}$ | $R^{B4}$ | $R^{B5}$ |
|---|---|---|---|---|---|
| 665. | $CD_2C(CH_3)_3$ | H | $CD_2CH_3$ | H | H |
| 666. | $CD_2C(CH_3)_3$ | H | $CD(CH_3)_2$ | H | H |
| 667. | $CD_2C(CH_3)_3$ | H | $CD_2CH(CH_3)_2$ | H | H |
| 668. | $CD_2C(CH_3)_3$ | H | $C(CH_3)_3$ | H | H |
| 669. | $CD_2C(CH_3)_3$ | H | $CD_2C(CH_3)_3$ | H | H |
| 670. | $CD_2C(CH_3)_3$ | H | 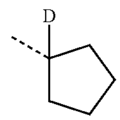 | H | H |
| 671. | $CD_2C(CH_3)_3$ | H | 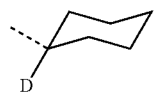 | H | H |
| 672. | $CD_2C(CH_3)_3$ | H | 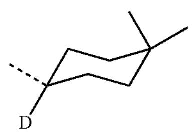 | H | H |
| 673. | $CD_2C(CH_3)_3$ | H | 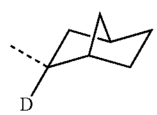 | H | H |
| 674. | $CD_2C(CH_3)_3$ | H | 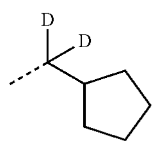 | H | H |
| 675. | $CD_2C(CH_3)_3$ | H | 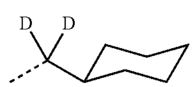 | H | H |
| 676. | 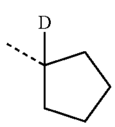 | H | $CD_2CH_3$ | H | H |
| 677. | 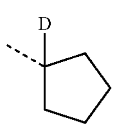 | H | $CD(CH_3)_2$ | H | H |
| 678. | 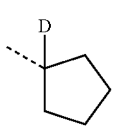 | H | $CD_2CH(CH_3)_2$ | H | H |
| 679. | 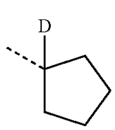 | H | $C(CH_3)_3$ | H | H |
| 680. | 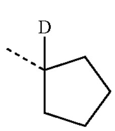 | H | $CD_2C(CH_3)_3$ | H | H |

-continued
| i in Li | $R^{B1}$ | $R^{B2}$ | $R^{B3}$ | $R^{B4}$ | $R^{B5}$ |
|---|---|---|---|---|---|
| 681. | 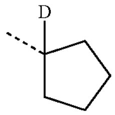 | H | 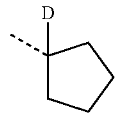 | H | H |
| 682. | 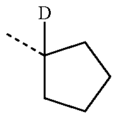 | H | 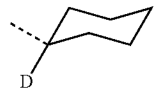 | H | H |
| 683. | 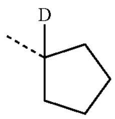 | H | 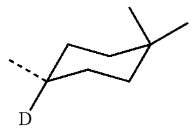 | H | H |
| 684. | 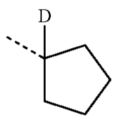 | H | 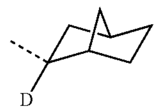 | H | H |
| 685. | 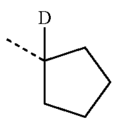 | H | 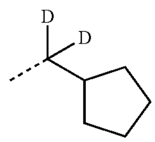 | H | H |
| 686. | 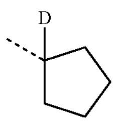 | H | 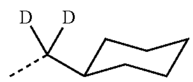 | H | H |
| 687. | 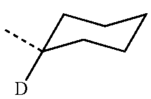 | H | $CD_2CH_3$ | H | H |
| 688. | 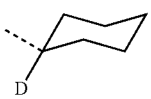 | H | $CD(CH_3)_2$ | H | H |
| 689. | 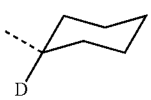 | H | $CD_2CH(CH_3)_2$ | H | H |
| 690. | 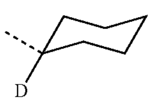 | H | $C(CH_3)_3$ | H | H |
| 691. | 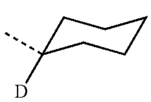 | H | $CD_2C(CH_3)_3$ | H | H |
| 692. | 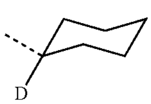 | H | 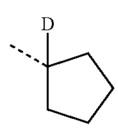 | H | H |
| 693. | 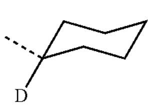 | H | 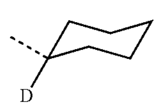 | H | H |

-continued
| i in Li | $R^{B1}$ | $R^{B2}$ | $R^{B3}$ | $R^{B4}$ | $R^{B5}$ |
|---|---|---|---|---|---|
| 694. | 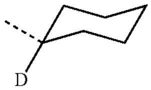 | H | 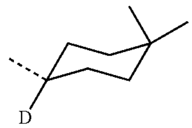 | H | H |
| 695. | 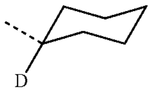 | H | 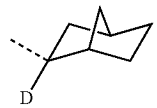 | H | H |
| 696. | 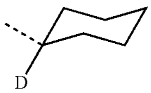 | H | 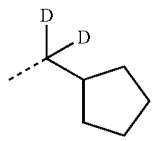 | H | H |
| 697. | 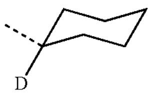 | H | 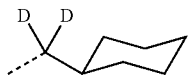 | H | H |
| 698. | 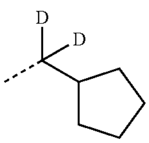 | H | $CD_2CH_3$ | H | H |
| 699. | 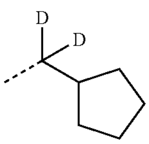 | H | $CD(CH_3)_2$ | H | H |
| 700. | 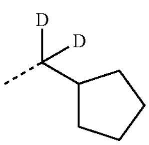 | H | $CD_2CH(CH_3)_2$ | H | H |
| 701. | 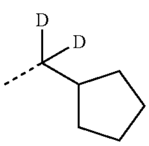 | H | $C(CH_3)_3$ | H | H |
| 702. | 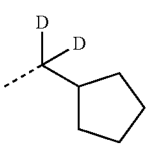 | H | $CD_2C(CH_3)_3$ | H | H |
| 703. | 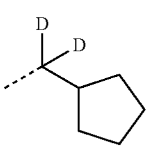 | H | 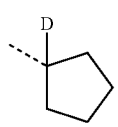 | H | H |
| 704. | 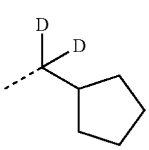 | H | 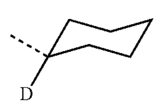 | H | H |

-continued
| i in Li | $R^{B1}$ | $R^{B2}$ | $R^{B3}$ | $R^{B4}$ | $R^{B5}$ |
|---|---|---|---|---|---|
| 705. | 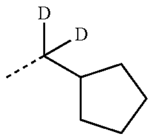 | H | 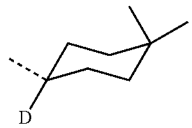 | H | H |
| 706. | 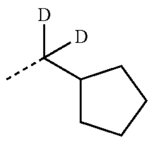 | H | 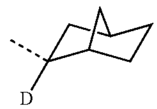 | H | H |
| 707. | 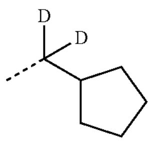 | H | 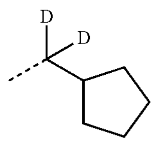 | H | H |
| 708. | 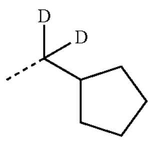 | H | 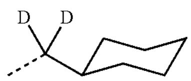 | H | H |
| 709. | 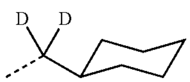 | H | $CD_2CH_3$ | H | H |
| 710. | 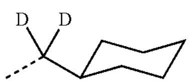 | H | $CD(CH_3)_2$ | H | H |
| 711. | 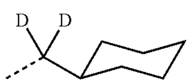 | H | $CD_2CH(CH_3)_2$ | H | H |
| 712. | 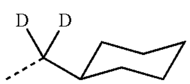 | H | $C(CH_3)_3$ | H | H |
| 713. | 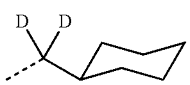 | H | $CD_2C(CH_3)_3$ | H | H |
| 714. | 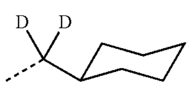 | H | 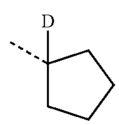 | H | H |
| 715. | 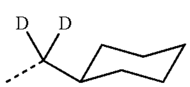 | H | 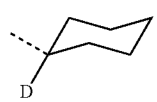 | H | H |
| 716. | 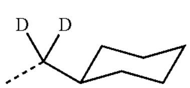 | H | 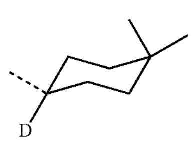 | H | H |
| 717. | 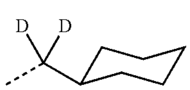 | H | 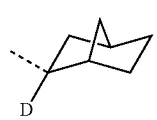 | H | H |

-continued
| i in Li | $R^{B1}$ | $R^{B2}$ | $R^{B3}$ | $R^{B4}$ | $R^{B5}$ |
|---|---|---|---|---|---|
| 718. | 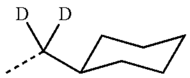 | H | 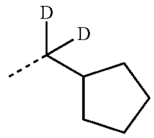 | H | H |
| 719. | 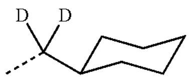 | H | 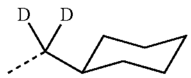 | H | H |
| 720. | 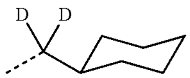 | H | $CD_2CH_3$ | H | H |
| 721. | 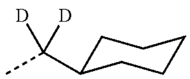 | H | $CD(CH_3)_2$ | H | H |
| 722. | 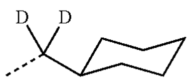 | H | $CD_2CH(CH_3)_2$ | H | H |
| 723. | 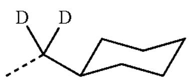 | H | $C(CH_3)_3$ | H | H |
| 724. | 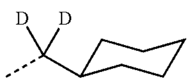 | H | $CD_2C(CH_3)_3$ | H | H |
| 725. | 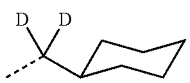 | H | 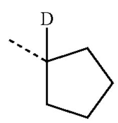 | H | H |
| 726. | 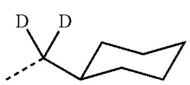 | H | 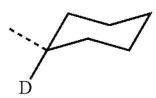 | H | H |
| 727. | 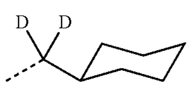 | H | 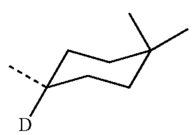 | H | H |
| 728. | 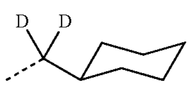 | H | 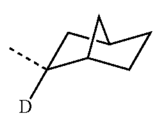 | H | H |
| 729. | 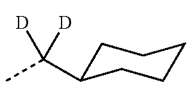 | H | 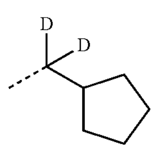 | H | H |
| 730. | 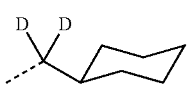 | H | 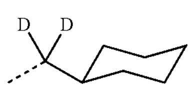 | H | H |
| 731. | H | H | H | H | Ph |
| 732. | $CH_3$ | H | H | H | Ph |
| 733. | H | $CH_3$ | H | H | Ph |
| 734. | H | H | $CH_3$ | H | Ph |
| 735. | $CH_3$ | $CH_3$ | H | $CH_3$ | Ph |
| 736. | $CH_3$ | H | $CH_3$ | H | Ph |
| 737. | $CH_3$ | H | H | $CH_3$ | Ph |

-continued

| i in Li | $R^{B1}$ | $R^{B2}$ | $R^{B3}$ | $R^{B4}$ | $R^{B5}$ |
|---|---|---|---|---|---|
| 738. | H | $CH_3$ | $CH_3$ | H | Ph |
| 739. | H | $CH_3$ | H | $CH_3$ | Ph |
| 740. | H | H | $CH_3$ | $CH_3$ | Ph |
| 741. | $CH_3$ | $CH_3$ | $CH_3$ | H | Ph |
| 742. | $CH_3$ | $CH_3$ | H | $CH_3$ | Ph |
| 743. | $CH_3$ | H | $CH_3$ | $CH_3$ | Ph |
| 744. | H | $CH_3$ | $CH_3$ | $CH_3$ | Ph |
| 745. | $CH_3$ | $CH_3$ | $CH_3$ | $CH_3$ | Ph |
| 746. | $CH_2CH_3$ | H | H | H | Ph |
| 747. | $CH_2CH_3$ | $CH_3$ | H | $CH_3$ | Ph |
| 748. | $CH_2CH_3$ | H | $CH_3$ | H | Ph |
| 749. | $CH_2CH_3$ | H | H | $CH_3$ | Ph |
| 750. | $CH_2CH_3$ | $CH_3$ | $CH_3$ | H | Ph |
| 751. | $CH_2CH_3$ | $CH_3$ | H | $CH_3$ | Ph |
| 752. | $CH_2CH_3$ | H | $CH_3$ | $CH_3$ | Ph |
| 753. | $CH_2CH_3$ | $CH_3$ | $CH_3$ | $CH_3$ | Ph |
| 754. | H | $CH_2CH_3$ | H | H | Ph |
| 755. | $CH_3$ | $CH_2CH_3$ | H | $CH_3$ | Ph |
| 756. | H | $CH_2CH_3$ | $CH_3$ | H | Ph |
| 757. | H | $CH_2CH_3$ | H | $CH_3$ | Ph |
| 758. | $CH_3$ | $CH_2CH_3$ | $CH_3$ | H | Ph |
| 759. | $CH_3$ | $CH_2CH_3$ | H | $CH_3$ | Ph |
| 760. | H | $CH_2CH_3$ | $CH_3$ | $CH_3$ | Ph |
| 761. | $CH_3$ | $CH_2CH_3$ | $CH_3$ | $CH_3$ | Ph |
| 762. | H | H | $CH_2CH_3$ | H | Ph |
| 763. | $CH_3$ | H | $CH_2CH_3$ | H | Ph |
| 764. | H | $CH_3$ | $CH_2CH_3$ | H | Ph |
| 765. | H | H | $CH_2CH_3$ | $CH_3$ | Ph |
| 766. | $CH_3$ | $CH_3$ | $CH_2CH_3$ | H | Ph |
| 767. | $CH_3$ | H | $CH_2CH_3$ | $CH_3$ | Ph |
| 768. | H | $CH_3$ | $CH_2CH_3$ | $CH_3$ | Ph |
| 769. | $CH_3$ | $CH_3$ | $CH_2CH_3$ | $CH_3$ | Ph |
| 770. | $CH(CH_3)_2$ | H | H | H | Ph |
| 771. | $CH(CH_3)_2$ | $CH_3$ | H | $CH_3$ | Ph |
| 772. | $CH(CH_3)_2$ | H | $CH_3$ | H | Ph |
| 773. | $CH(CH_3)_2$ | H | H | $CH_3$ | Ph |
| 774. | $CH(CH_3)_2$ | $CH_3$ | $CH_3$ | H | Ph |
| 775. | $CH(CH_3)_2$ | $CH_3$ | H | $CH_3$ | Ph |
| 776. | $CH(CH_3)_2$ | H | $CH_3$ | $CH_3$ | Ph |
| 777. | $CH(CH_3)_2$ | $CH_3$ | $CH_3$ | $CH_3$ | Ph |
| 778. | H | $CH(CH_3)_2$ | H | H | Ph |
| 779. | $CH_3$ | $CH(CH_3)_2$ | H | $CH_3$ | Ph |
| 780. | H | $CH(CH_3)_2$ | $CH_3$ | H | Ph |
| 781. | H | $CH(CH_3)_2$ | H | $CH_3$ | Ph |
| 782. | $CH_3$ | $CH(CH_3)_2$ | $CH_3$ | H | Ph |
| 783. | $CH_3$ | $CH(CH_3)_2$ | H | $CH_3$ | Ph |
| 784. | H | $CH(CH_3)_2$ | $CH_3$ | $CH_3$ | Ph |
| 785. | $CH_3$ | $CH(CH_3)_2$ | $CH_3$ | $CH_3$ | Ph |
| 786. | H | H | $CH(CH_3)_2$ | H | Ph |
| 787. | $CH_3$ | H | $CH(CH_3)_2$ | H | Ph |
| 788. | H | $CH_3$ | $CH(CH_3)_2$ | H | Ph |
| 789. | H | H | $CH(CH_3)_2$ | $CH_3$ | Ph |
| 790. | $CH_3$ | $CH_3$ | $CH(CH_3)_2$ | H | Ph |
| 791. | $CH_3$ | H | $CH(CH_3)_2$ | $CH_3$ | Ph |
| 792. | H | $CH_3$ | $CH(CH_3)_2$ | $CH_3$ | Ph |
| 793. | $CH_3$ | $CH_3$ | $CH(CH_3)_2$ | $CH_3$ | Ph |
| 794. | $CH_2CH(CH_3)_2$ | H | H | H | Ph |
| 795. | $CH_2CH(CH_3)_2$ | $CH_3$ | H | $CH_3$ | Ph |
| 796. | $CH_2CH(CH_3)_2$ | H | $CH_3$ | H | Ph |
| 797. | $CH_2CH(CH_3)_2$ | H | H | $CH_3$ | Ph |
| 798. | $CH_2CH(CH_3)_2$ | $CH_3$ | $CH_3$ | H | Ph |
| 799. | $CH_2CH(CH_3)_2$ | $CH_3$ | H | $CH_3$ | Ph |
| 800. | $CH_2CH(CH_3)_2$ | H | $CH_3$ | $CH_3$ | Ph |
| 801. | $CH_2CH(CH_3)_2$ | $CH_3$ | $CH_3$ | $CH_3$ | Ph |
| 802. | H | $CH_2CH(CH_3)_2$ | H | H | Ph |
| 803. | $CH_3$ | $CH_2CH(CH_3)_2$ | H | $CH_3$ | Ph |
| 804. | H | $CH_2CH(CH_3)_2$ | $CH_3$ | H | Ph |
| 805. | H | $CH_2CH(CH_3)_2$ | H | $CH_3$ | Ph |
| 806. | $CH_3$ | $CH_2CH(CH_3)_2$ | $CH_3$ | H | Ph |
| 807. | $CH_3$ | $CH_2CH(CH_3)_2$ | H | $CH_3$ | Ph |
| 808. | H | $CH_2CH(CH_3)_2$ | $CH_3$ | $CH_3$ | Ph |
| 809. | $CH_3$ | $CH_2CH(CH_3)_2$ | $CH_3$ | $CH_3$ | Ph |
| 810. | H | H | $CH_2CH(CH_3)_2$ | H | Ph |
| 811. | $CH_3$ | H | $CH_2CH(CH_3)_2$ | H | Ph |
| 812. | H | $CH_3$ | $CH_2CH(CH_3)_2$ | H | Ph |
| 813. | H | H | $CH_2CH(CH_3)_2$ | $CH_3$ | Ph |
| 814. | $CH_3$ | $CH_3$ | $CH_2CH(CH_3)_2$ | H | Ph |

-continued

| i in Li | $R^{B1}$ | $R^{B2}$ | $R^{B3}$ | $R^{B4}$ | $R^{B5}$ |
|---|---|---|---|---|---|
| 815. | $CH_3$ | H | $CH_2CH(CH_3)_2$ | $CH_3$ | Ph |
| 816. | H | $CH_3$ | $CH_2CH(CH_3)_2$ | $CH_3$ | Ph |
| 817. | $CH_3$ | $CH_3$ | $CH_2CH(CH_3)_2$ | $CH_3$ | Ph |
| 818. | $C(CH_3)_3$ | H | H | H | Ph |
| 819. | $C(CH_3)_3$ | $CH_3$ | H | $CH_3$ | Ph |
| 820. | $C(CH_3)_3$ | H | $CH_3$ | H | Ph |
| 821. | $C(CH_3)_3$ | H | H | $CH_3$ | Ph |
| 822. | $C(CH_3)_3$ | $CH_3$ | $CH_3$ | H | Ph |
| 823. | $C(CH_3)_3$ | $CH_3$ | H | $CH_3$ | Ph |
| 824. | $C(CH_3)_3$ | H | $CH_3$ | $CH_3$ | Ph |
| 825. | $C(CH_3)_3$ | $CH_3$ | $CH_3$ | $CH_3$ | Ph |
| 826. | H | $C(CH_3)_3$ | H | H | Ph |
| 827. | $CH_3$ | $C(CH_3)_3$ | H | $CH_3$ | Ph |
| 828. | H | $C(CH_3)_3$ | $CH_3$ | H | Ph |
| 829. | H | $C(CH_3)_3$ | H | $CH_3$ | Ph |
| 830. | $CH_3$ | $C(CH_3)_3$ | $CH_3$ | H | Ph |
| 831. | $CH_3$ | $C(CH_3)_3$ | H | $CH_3$ | Ph |
| 832. | H | $C(CH_3)_3$ | $CH_3$ | $CH_3$ | Ph |
| 833. | $CH_3$ | $C(CH_3)_3$ | $CH_3$ | $CH_3$ | Ph |
| 834. | H | H | $C(CH_3)_3$ | H | Ph |
| 835. | $CH_3$ | H | $C(CH_3)_3$ | H | Ph |
| 836. | H | $CH_3$ | $C(CH_3)_3$ | H | Ph |
| 837. | H | H | $C(CH_3)_3$ | $CH_3$ | Ph |
| 838. | $CH_3$ | $CH_3$ | $C(CH_3)_3$ | H | Ph |
| 839. | $CH_3$ | H | $C(CH_3)_3$ | $CH_3$ | Ph |
| 840. | H | $CH_3$ | $C(CH_3)_3$ | $CH_3$ | Ph |
| 841. | $CH_3$ | $CH_3$ | C(CH3)3 | $CH_3$ | Ph |
| 842. | $CH_2C(CH_3)_3$ | H | H | H | Ph |
| 843. | $CH_2C(CH_3)_3$ | $CH_3$ | H | $CH_3$ | Ph |
| 844. | $CH_2C(CH_3)_3$ | H | $CH_3$ | H | Ph |
| 845. | $CH_2C(CH_3)_3$ | H | H | $CH_3$ | Ph |
| 846. | $CH_2C(CH_3)_3$ | $CH_3$ | $CH_3$ | H | Ph |
| 847. | $CH_2C(CH_3)_3$ | $CH_3$ | H | $CH_3$ | Ph |
| 848. | $CH_2C(CH_3)_3$ | H | $CH_3$ | $CH_3$ | Ph |
| 849. | $CH_2C(CH_3)_3$ | $CH_3$ | $CH_3$ | $CH_3$ | Ph |
| 850. | H | $CH_2C(CH_3)_3$ | H | H | Ph |
| 851. | $CH_3$ | $CH_2C(CH_3)_3$ | H | $CH_3$ | Ph |
| 852. | H | $CH_2C(CH_3)_3$ | $CH_3$ | H | Ph |
| 853. | H | $CH_2C(CH_3)_3$ | H | $CH_3$ | Ph |
| 854. | $CH_3$ | $CH_2C(CH_3)_3$ | $CH_3$ | H | Ph |
| 855. | $CH_3$ | $CH_2C(CH_3)_3$ | H | $CH_3$ | Ph |
| 856. | H | $CH_2C(CH_3)_3$ | $CH_3$ | $CH_3$ | Ph |
| 857. | $CH_3$ | $CH_2C(CH_3)_3$ | $CH_3$ | $CH_3$ | Ph |
| 858. | H | H | $CH_2C(CH_3)_3$ | H | Ph |
| 859. | $CH_3$ | H | $CH_2C(CH_3)_3$ | H | Ph |
| 860. | H | $CH_3$ | $CH_2C(CH_3)_3$ | H | Ph |
| 861. | H | H | $CH_2C(CH_3)_3$ | $CH_3$ | Ph |
| 862. | $CH_3$ | $CH_3$ | $CH_2C(CH_3)_3$ | H | Ph |
| 863. | $CH_3$ | H | $CH_2C(CH_3)_3$ | $CH_3$ | Ph |
| 864. | H | $CH_3$ | $CH_2C(CH_3)_3$ | $CH_3$ | Ph |
| 865. | $CH_3$ | $CH_3$ | $CH_2C(CH_3)_3$ | $CH_3$ | Ph |
| 866. | 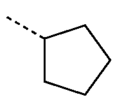 | H | H | H | Ph |
| 867. | 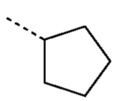 | $CH_3$ | H | $CH_3$ | Ph |
| 868. | 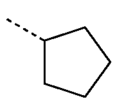 | H | $CH_3$ | H | Ph |
| 869. | 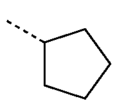 | H | H | $CH_3$ | Ph |
| 870. | 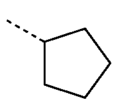 | $CH_3$ | $CH_3$ | H | Ph |

-continued
| i in Li | $R^{B1}$ | $R^{B2}$ | $R^{B3}$ | $R^{B4}$ | $R^{B5}$ |
|---|---|---|---|---|---|
| 871. | 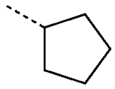 | $CH_3$ | H | $CH_3$ | Ph |
| 872. | 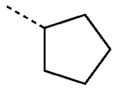 | H | $CH_3$ | $CH_3$ | Ph |
| 873. | 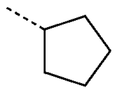 | $CH_3$ | $CH_3$ | $CH_3$ | Ph |
| 874. | H | 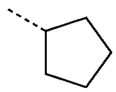 | H | H | Ph |
| 875. | $CH_3$ | 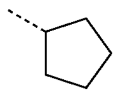 | H | $CH_3$ | Ph |
| 876. | H | 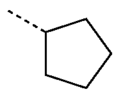 | $CH_3$ | H | Ph |
| 877. | H | 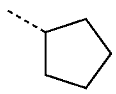 | H | $CH_3$ | Ph |
| 878. | $CH_3$ | 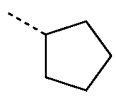 | $CH_3$ | H | Ph |
| 879. | $CH_3$ | 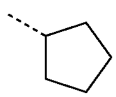 | H | $CH_3$ | Ph |
| 880. | H | 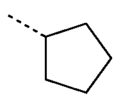 | $CH_3$ | $CH_3$ | Ph |
| 881. | $CH_3$ | 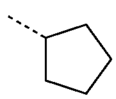 | $CH_3$ | $CH_3$ | Ph |
| 882. | H | H | 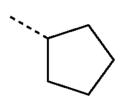 | H | Ph |
| 883. | $CH_3$ | H | 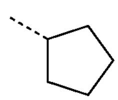 | H | Ph |
| 884. | H | $CH_3$ | 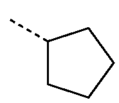 | H | Ph |
| 885. | H | H | 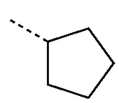 | $CH_3$ | Ph |

-continued
| i in Li | $R^{B1}$ | $R^{B2}$ | $R^{B3}$ | $R^{B4}$ | $R^{B5}$ |
|---|---|---|---|---|---|
| 886. | $CH_3$ | $CH_3$ | 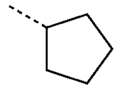 | H | Ph |
| 887. | $CH_3$ | H | 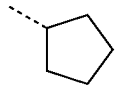 | $CH_3$ | Ph |
| 888. | H | $CH_3$ | 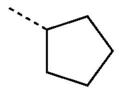 | $CH_3$ | Ph |
| 889. | $CH_3$ | $CH_3$ | 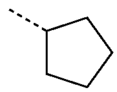 | $CH_3$ | Ph |
| 890. | 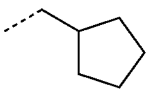 | H | H | H | Ph |
| 891. | 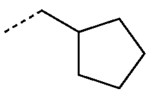 | $CH_3$ | H | $CH_3$ | Ph |
| 892. | 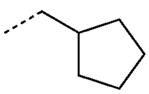 | H | $CH_3$ | H | Ph |
| 893. | 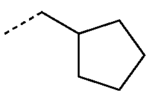 | H | H | $CH_3$ | Ph |
| 894. | 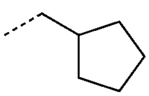 | $CH_3$ | $CH_3$ | H | Ph |
| 895. | 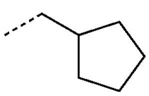 | $CH_3$ | H | $CH_3$ | Ph |
| 896. | 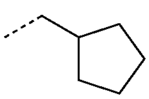 | H | $CH_3$ | $CH_3$ | Ph |
| 897. | 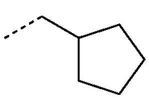 | $CH_3$ | $CH_3$ | $CH_3$ | Ph |
| 898. | H | 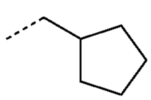 | H | H | Ph |
| 899. | $CH_3$ | 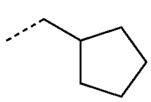 | H | $CH_3$ | Ph |
| 900. | H | 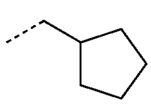 | $CH_3$ | H | Ph |

-continued
| i in Li | $R^{B1}$ | $R^{B2}$ | $R^{B3}$ | $R^{B4}$ | $R^{B5}$ |
|---|---|---|---|---|---|
| 901. | H | 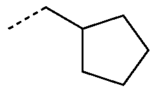 | H | $CH_3$ | Ph |
| 902. | $CH_3$ | 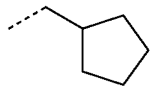 | $CH_3$ | H | Ph |
| 903. | $CH_3$ | 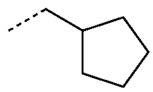 | H | $CH_3$ | Ph |
| 904. | H | 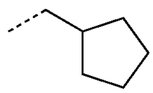 | $CH_3$ | $CH_3$ | Ph |
| 905. | $CH_3$ | 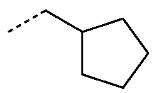 | $CH_3$ | $CH_3$ | Ph |
| 906. | H | H | 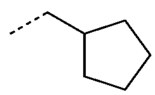 | H | Ph |
| 907. | $CH_3$ | H | 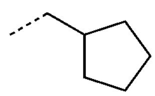 | H | Ph |
| 908. | H | $CH_3$ | 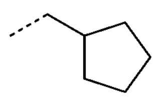 | H | Ph |
| 909. | H | H | 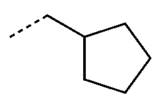 | $CH_3$ | Ph |
| 910. | $CH_3$ | $CH_3$ | 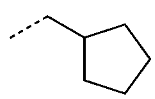 | H | Ph |
| 911. | $CH_3$ | H | 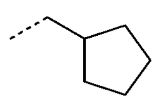 | $CH_3$ | Ph |
| 912. | H | $CH_3$ | 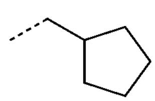 | $CH_3$ | Ph |
| 913. | $CH_3$ | $CH_3$ | 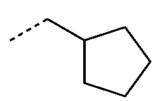 | $CH_3$ | Ph |
| 914. | 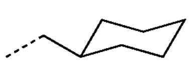 | H | H | H | Ph |
| 915. | 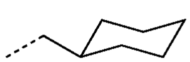 | $CH_3$ | H | $CH_3$ | Ph |
| 916. | 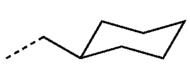 | H | $CH_3$ | H | Ph |
| 917. | 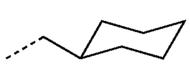 | H | H | $CH_3$ | Ph |

-continued
| i in Li | $R^{B1}$ | $R^{B2}$ | $R^{B3}$ | $R^{B4}$ | $R^{B5}$ |
|---|---|---|---|---|---|
| 918. | 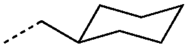 | $CH_3$ | $CH_3$ | H | Ph |
| 919. | 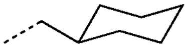 | $CH_3$ | H | $CH_3$ | Ph |
| 920. |  | H | $CH_3$ | $CH_3$ | Ph |
| 921. | 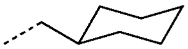 | $CH_3$ | $CH_3$ | $CH_3$ | Ph |
| 922. | H | 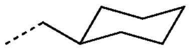 | H | H | Ph |
| 923. | $CH_3$ | 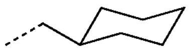 | H | $CH_3$ | Ph |
| 924. | H | 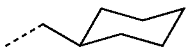 | $CH_3$ | H | Ph |
| 925. | H | 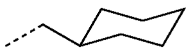 | H | $CH_3$ | Ph |
| 926. | $CH_3$ | 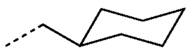 | $CH_3$ | H | Ph |
| 927. | $CH_3$ | 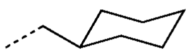 | H | $CH_3$ | Ph |
| 928. | H | 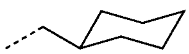 | $CH_3$ | $CH_3$ | Ph |
| 929. | $CH_3$ | 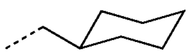 | $CH_3$ | $CH_3$ | Ph |
| 930. | H | H | 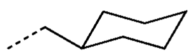 | H | Ph |
| 931. | $CH_3$ | H | 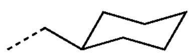 | H | Ph |
| 932. | H | $CH_3$ | 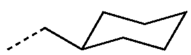 | H | Ph |
| 933. | H | H | 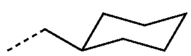 | $CH_3$ | Ph |
| 934. | $CH_3$ | $CH_3$ | 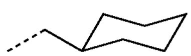 | H | Ph |
| 935. | $CH_3$ | H | 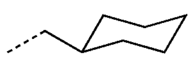 | $CH_3$ | Ph |
| 936. | H | $CH_3$ | 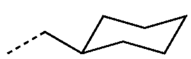 | $CH_3$ | Ph |
| 937. | $CH_3$ | $CH_3$ | 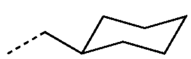 | $CH_3$ | Ph |
| 938. | 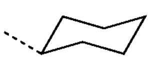 | H | H | H | Ph |
| 939. | 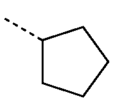 | $CH_3$ | H | $CH_3$ | Ph |
| 940. | 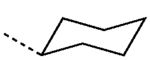 | H | $CH_3$ | H | Ph |
| 941. | 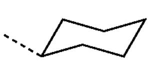 | H | H | $CH_3$ | Ph |

-continued
| i in Li | $R^{B1}$ | $R^{B2}$ | $R^{B3}$ | $R^{B4}$ | $R^{B5}$ |
|---|---|---|---|---|---|
| 942. | 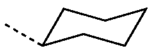 | $CH_3$ | $CH_3$ | H | Ph |
| 943. | 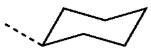 | $CH_3$ | H | $CH_3$ | Ph |
| 944. | 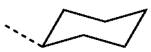 | H | $CH_3$ | $CH_3$ | Ph |
| 945. | 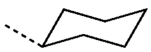 | $CH_3$ | $CH_3$ | $CH_3$ | Ph |
| 946. | H | 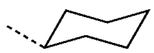 | H | H | Ph |
| 947. | $CH_3$ | 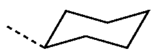 | H | $CH_3$ | Ph |
| 948. | H | 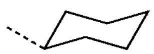 | $CH_3$ | H | Ph |
| 949. | H | 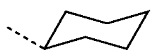 | H | $CH_3$ | Ph |
| 950. | $CH_3$ | 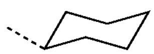 | $CH_3$ | H | Ph |
| 951. | $CH_3$ | 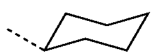 | H | $CH_3$ | Ph |
| 952. | H | 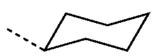 | $CH_3$ | $CH_3$ | Ph |
| 953. | $CH_3$ | 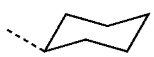 | $CH_3$ | $CH_3$ | Ph |
| 954. | H | H | 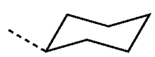 | H | Ph |
| 955. | $CH_3$ | H | 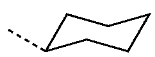 | H | Ph |
| 956. | H | $CH_3$ | 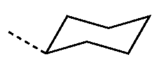 | H | Ph |
| 957. | H | H | 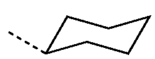 | $CH_3$ | Ph |
| 958. | $CH_3$ | $CH_3$ | 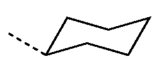 | H | Ph |
| 959. | $CH_3$ | H | 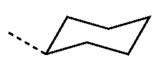 | $CH_3$ | Ph |
| 960. | H | $CH_3$ | 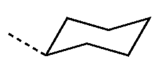 | $CH_3$ | Ph |
| 961. | $CH_3$ | $CH_3$ | 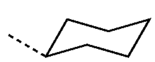 | $CH_3$ | Ph |
| 962. | 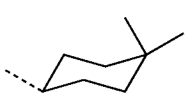 | H | H | H | Ph |
| 963. | 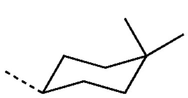 | $CH_3$ | H | $CH_3$ | Ph |
| 964. | 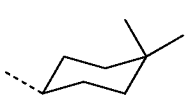 | H | $CH_3$ | H | Ph |

-continued
| i in Li | $R^{B1}$ | $R^{B2}$ | $R^{B3}$ | $R^{B4}$ | $R^{B5}$ |
|---|---|---|---|---|---|
| 965. | 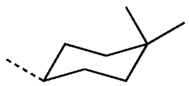 | H | H | $CH_3$ | Ph |
| 966. | 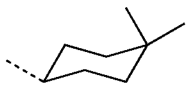 | $CH_3$ | $CH_3$ | H | Ph |
| 967. | 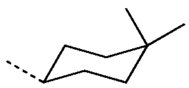 | $CH_3$ | H | $CH_3$ | Ph |
| 968. | 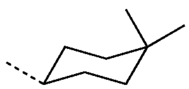 | H | $CH_3$ | $CH_3$ | Ph |
| 969. | 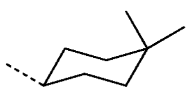 | $CH_3$ | $CH_3$ | $CH_3$ | Ph |
| 970. | H | 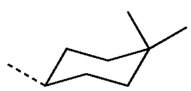 | H | H | Ph |
| 971. | $CH_3$ | 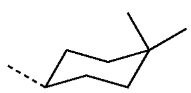 | H | $CH_3$ | Ph |
| 972. | H | 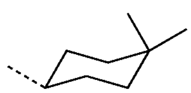 | $CH_3$ | H | Ph |
| 973. | H | 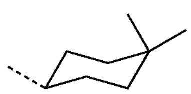 | H | $CH_3$ | Ph |
| 974. | $CH_3$ | 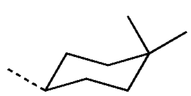 | $CH_3$ | H | Ph |
| 975. | $CH_3$ | 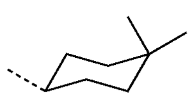 | H | $CH_3$ | Ph |
| 976. | H | 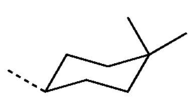 | $CH_3$ | $CH_3$ | Ph |
| 977. | $CH_3$ | 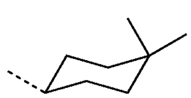 | $CH_3$ | $CH_3$ | Ph |
| 978. | H | H | 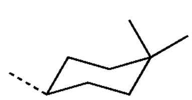 | H | Ph |
| 979. | $CH_3$ | H | 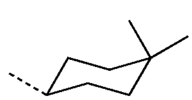 | H | Ph |

-continued
| i in Li | $R^{B1}$ | $R^{B2}$ | $R^{B3}$ | $R^{B4}$ | $R^{B5}$ |
|---|---|---|---|---|---|
| 980. | H | $CH_3$ | 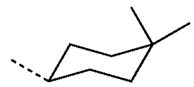 | H | Ph |
| 981. | H | H | 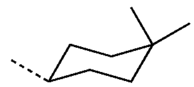 | $CH_3$ | Ph |
| 982. | $CH_3$ | $CH_3$ | 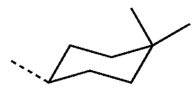 | H | Ph |
| 983. | $CH_3$ | H | 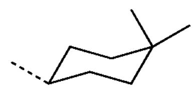 | $CH_3$ | Ph |
| 984. | H | $CH_3$ | 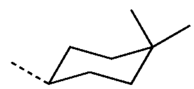 | $CH_3$ | Ph |
| 985. | $CH_3$ | $CH_3$ | 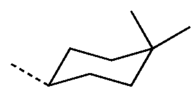 | $CH_3$ | Ph |
| 986. | 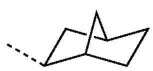 | H | H | H | Ph |
| 987. | 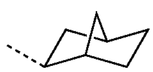 | $CH_3$ | H | $CH_3$ | Ph |
| 988. | 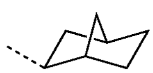 | H | $CH_3$ | H | Ph |
| 989. | 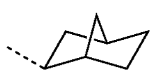 | H | H | $CH_3$ | Ph |
| 990. | 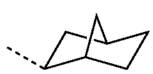 | $CH_3$ | $CH_3$ | H | Ph |
| 991. | 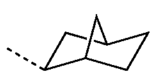 | $CH_3$ | H | $CH_3$ | Ph |
| 992. | 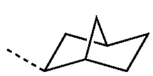 | H | $CH_3$ | $CH_3$ | Ph |
| 993. | 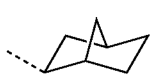 | $CH_3$ | $CH_3$ | $CH_3$ | Ph |
| 994. | H | 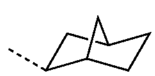 | H | H | Ph |
| 995. | $CH_3$ | 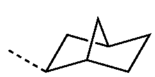 | H | $CH_3$ | Ph |
| 996. | H | 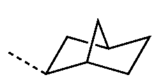 | $CH_3$ | H | Ph |
| 997. | H | 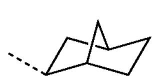 | H | $CH_3$ | Ph |

-continued
| i in Li | $R^{B1}$ | $R^{B2}$ | $R^{B3}$ | $R^{B4}$ | $R^{B5}$ |
|---|---|---|---|---|---|
| 998. | $CH_3$ |  | $CH_3$ | H | Ph |
| 999. | $CH_3$ | 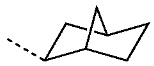 | H | $CH_3$ | Ph |
| 1000. | H | 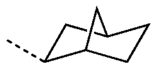 | $CH_3$ | $CH_3$ | Ph |
| 1001. | $CH_3$ | 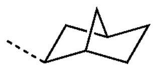 | $CH_3$ | $CH_3$ | Ph |
| 1002. | H | H | 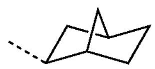 | H | Ph |
| 1003. | $CH_3$ | H | 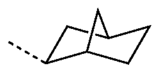 | H | Ph |
| 1004. | H | $CH_3$ |  | H | Ph |
| 1005. | H | H |  | $CH_3$ | Ph |
| 1006. | $CH_3$ | $CH_3$ | 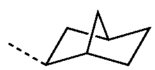 | H | Ph |
| 1007. | $CH_3$ | H | 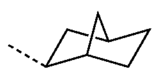 | $CH_3$ | Ph |
| 1008. | H | $CH_3$ | 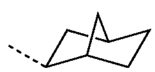 | $CH_3$ | Ph |
| 1009. | $CH_3$ | $CH_3$ | 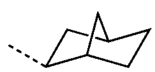 | $CH_3$ | Ph |
| 1010. | $CH(CH_3)_2$ | H | $CH_2CH_3$ | H | Ph |
| 1011. | $CH(CH_3)_2$ | H | $CH(CH_3)_2$ | H | Ph |
| 1012. | $CH(CH_3)_2$ | H | $CH_2CH(CH_3)_2$ | H | Ph |
| 1013. | $CH(CH_3)_2$ | H | $C(CH_3)_3$ | H | Ph |
| 1014. | $CH(CH_3)_2$ | H | $CH_2C(CH_3)_3$ | H | Ph |
| 1015. | $CH(CH_3)_2$ | H | 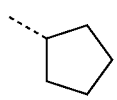 | H | Ph |
| 1016. | $CH(CH_3)_2$ | H | 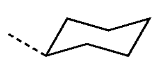 | H | Ph |
| 1017. | $CH(CH_3)_2$ | H | 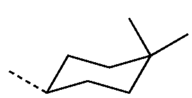 | H | Ph |
| 1018. | $CH(CH_3)_2$ | H | 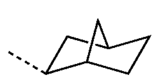 | H | Ph |
| 1019. | $CH(CH_3)_2$ | H | 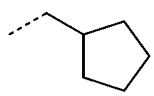 | H | Ph |

-continued

| i in Li | $R^{B1}$ | $R^{B2}$ | $R^{B3}$ | $R^{B4}$ | $R^{B5}$ |
|---|---|---|---|---|---|
| 1020. | $CH(CH_3)_2$ | H |  | H | Ph |
| 1021. | $C(CH_3)_3$ | H | $CH_2CH_3$ | H | Ph |
| 1022. | $C(CH_3)_3$ | H | $CH(CH_3)_2$ | H | Ph |
| 1023. | $C(CH_3)_3$ | H | $CH_2CH(CH_3)_2$ | H | Ph |
| 1024. | $C(CH_3)_3$ | H | $C(CH_3)_3$ | H | Ph |
| 1025. | $C(CH_3)_3$ | H | $CH_2C(CH_3)_3$ | H | Ph |
| 1026. | $C(CH_3)_3$ | H | 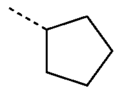 | H | Ph |
| 1027. | $C(CH_3)_3$ | H | 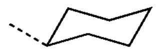 | H | Ph |
| 1028. | $C(CH_3)_3$ | H | 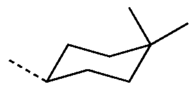 | H | Ph |
| 1029. | $C(CH_3)_3$ | H | 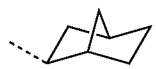 | H | Ph |
| 1030. | $C(CH_3)_3$ | H | 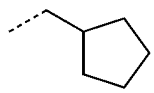 | H | Ph |
| 1031. | $C(CH_3)_3$ | H | 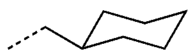 | H | Ph |
| 1032. | $CH_2C(CH_3)_3$ | H | $CH_2CH_3$ | H | Ph |
| 1033. | $CH_2C(CH_3)_3$ | H | $CH(CH_3)_2$ | H | Ph |
| 1034. | $CH_2C(CH_3)_3$ | H | $CH_2CH(CH_3)_2$ | H | Ph |
| 1035. | $CH_2C(CH_3)_3$ | H | $C(CH_3)_3$ | H | Ph |
| 1036. | $CH_2C(CH_3)_3$ | H | $CH_2C(CH_3)_3$ | H | Ph |
| 1037. | $CH_2C(CH_3)_3$ | H | 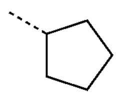 | H | Ph |
| 1038. | $CH_2C(CH_3)_3$ | H | 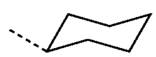 | H | Ph |
| 1039. | $CH_2C(CH_3)_3$ | H | 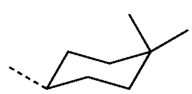 | H | Ph |
| 1040. | $CH_2C(CH_3)_3$ | H | 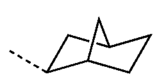 | H | Ph |
| 1041. | $CH_2C(CH_3)_3$ | H | 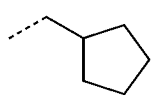 | H | Ph |
| 1042. | $CH_2C(CH_3)_3$ | H | 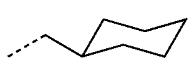 | H | Ph |
| 1043. | 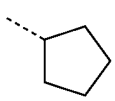 | H | $CH_2CH_3$ | H | Ph |
| 1044. | 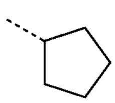 | H | $CH(CH_3)_2$ | H | Ph |

-continued
| i in Li | $R^{B1}$ | $R^{B2}$ | $R^{B3}$ | $R^{B4}$ | $R^{B5}$ |
|---|---|---|---|---|---|
| 1045. | 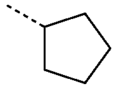 | H | $CH_2CH(CH_3)_2$ | H | Ph |
| 1046. | 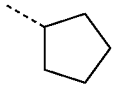 | H | $C(CH_3)_3$ | H | Ph |
| 1047. | 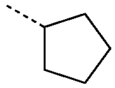 | H | $CH_2C(CH_3)_3$ | H | Ph |
| 1048. | 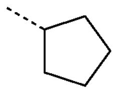 | H | 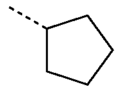 | H | Ph |
| 1049. | 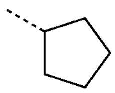 | H | 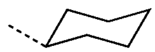 | H | Ph |
| 1050. | 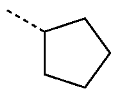 | H | 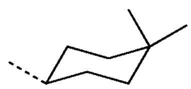 | H | Ph |
| 1051. | 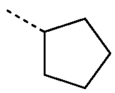 | H |  | H | Ph |
| 1052. | 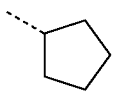 | H | 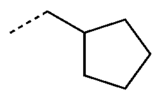 | H | Ph |
| 1053. | 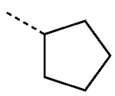 | H | 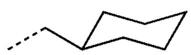 | H | Ph |
| 1054. | 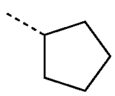 | H | $CH_2CH_3$ | H | Ph |
| 1055. | 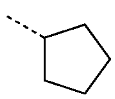 | H | CH(CH3)2 | H | Ph |
| 1056. | 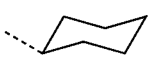 | H | $CH_2CH(CH_3)_2$ | H | Ph |
| 1057. | 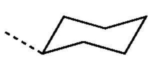 | H | $C(CH_3)_3$ | H | Ph |
| 1058. | 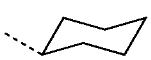 | H | $CH_2C(CH_3)_3$ | H | Ph |
| 1059. | 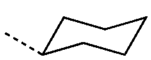 | H | 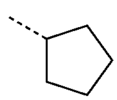 | H | Ph |
| 1060. | 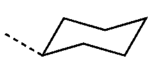 | H | 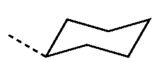 | H | Ph |
| 1061. | 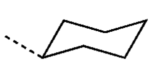 | H | 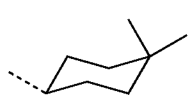 | H | Ph |

-continued
| i in Li | $R^{B1}$ | $R^{B2}$ | $R^{B3}$ | $R^{B4}$ | $R^{B5}$ |
|---|---|---|---|---|---|
| 1062. | 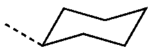 | H | 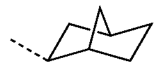 | H | Ph |
| 1063. | 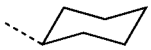 | H | 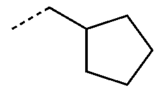 | H | Ph |
| 1064. | 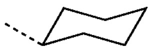 | H | 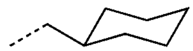 | H | Ph |
| 1065. | 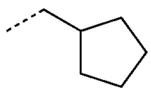 | H | $CH_2CH(CH_3)_2$ | H | Ph |
| 1066. | 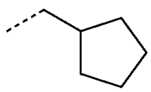 | H | $C(CH_3)_3$ | H | Ph |
| 1067. | 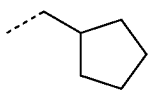 | H | $CH_2C(CH_3)_3$ | H | Ph |
| 1068. | 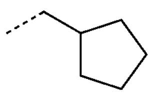 | H | 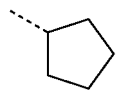 | H | Ph |
| 1069. | 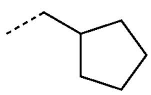 | H | 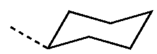 | H | Ph |
| 1070. | 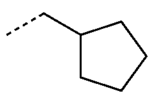 | H | 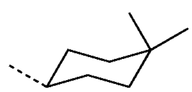 | H | Ph |
| 1071. | 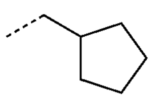 | H | 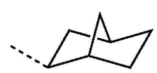 | H | Ph |
| 1072. | 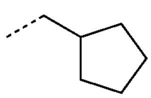 | H | 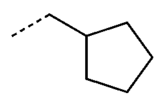 | H | Ph |
| 1073. | 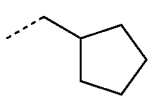 | H | 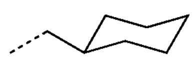 | H | Ph |
| 1074. | 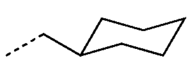 | H | $CH_2CH(CH_3)_2$ | H | Ph |
| 1075. | 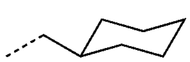 | H | $C(CH_3)_3$ | H | Ph |
| 1076. | 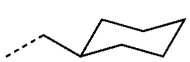 | H | $CH_2C(CH_3)_3$ | H | Ph |
| 1077. | 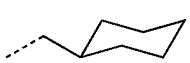 | H | 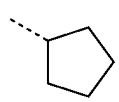 | H | Ph |
| 1078. | 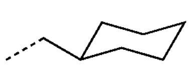 | H | 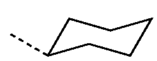 | H | Ph |

-continued

| i in Li | $R^{B1}$ | $R^{B2}$ | $R^{B3}$ | $R^{B4}$ | $R^{B5}$ |
|---|---|---|---|---|---|
| 1079. | 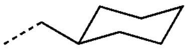 | H | 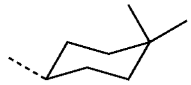 | H | Ph |
| 1080. |  | H | 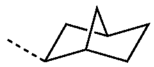 | H | Ph |
| 1081. | 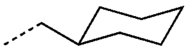 | H | 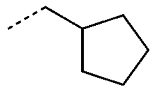 | H | Ph |
| 1082. | 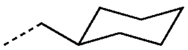 | H | 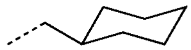 | H | Ph |
| 1083. | 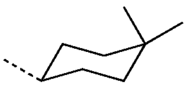 | H | $CH_2CH(CH_3)_2$ | H | Ph |
| 1084. | 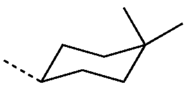 | H | $C(CH_3)_3$ | H | Ph |
| 1085. | 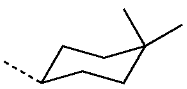 | H | $CH_2C(CH_3)_3$ | H | Ph |
| 1086. | 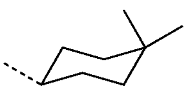 | H | 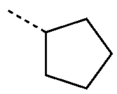 | H | Ph |
| 1087. | 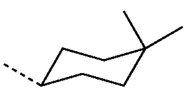 | H | 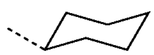 | H | Ph |
| 1088. | 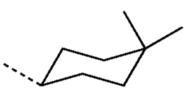 | H | 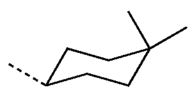 | H | Ph |
| 1089. | 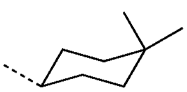 | H | 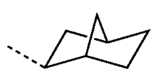 | H | Ph |
| 1090. | 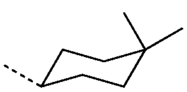 | H | 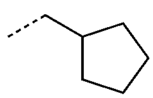 | H | Ph |
| 1091. | 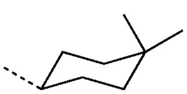 | H | 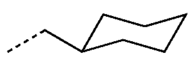 | H | Ph |
| 1092. | H | H | H | H | Ph |
| 1093. | $CD_3$ | H | H | H | Ph |
| 1094. | H | $CD_3$ | H | H | Ph |
| 1095. | H | H | $CD_3$ | H | Ph |
| 1096. | $CD_3$ | $CD_3$ | H | $CD_3$ | Ph |
| 1097. | $CD_3$ | H | $CD_3$ | H | Ph |
| 1098. | $CD_3$ | H | H | $CD_3$ | Ph |
| 1099. | H | $CD_3$ | $CD_3$ | H | Ph |
| 1100. | H | $CD_3$ | H | $CD_3$ | Ph |
| 1101. | H | H | $CD_3$ | $CD_3$ | Ph |
| 1102. | $CD_3$ | $CD_3$ | $CD_3$ | H | Ph |
| 1103. | $CD_3$ | $CD_3$ | H | $CD_3$ | Ph |
| 1104. | $CD_3$ | H | $CD_3$ | $CD_3$ | Ph |
| 1105. | H | $CD_3$ | $CD_3$ | $CD_3$ | Ph |
| 1106. | $CD_3$ | $CD_3$ | $CD_3$ | $CD_3$ | Ph |
| 1107. | $CD_2CH_3$ | H | H | H | Ph |

-continued

| i in Li | $R^{B1}$ | $R^{B2}$ | $R^{B3}$ | $R^{B4}$ | $R^{B5}$ |
|---|---|---|---|---|---|
| 1108. | $CD_2CH_3$ | $CD_3$ | H | $CD_3$ | Ph |
| 1109. | $CD_2CH_3$ | H | $CD_3$ | H | Ph |
| 1110. | $CD_2CH_3$ | H | H | $CD_3$ | Ph |
| 1111. | $CD_2CH_3$ | $CD_3$ | $CD_3$ | H | Ph |
| 1112. | $CD_2CH_3$ | $CD_3$ | H | $CD_3$ | Ph |
| 1113. | $CD_2CH_3$ | H | $CD_3$ | $CD_3$ | Ph |
| 1114. | $CD_2CH_3$ | $CD_3$ | $CD_3$ | $CD_3$ | Ph |
| 1115. | H | $CD_2CH_3$ | H | H | Ph |
| 1116. | $CH_3$ | $CD_2CH_3$ | H | $CD_3$ | Ph |
| 1117. | H | $CD_2CH_3$ | $CD_3$ | H | Ph |
| 1118. | H | $CD_2CH_3$ | H | $CD_3$ | Ph |
| 1119. | $CD_3$ | $CD_2CH_3$ | $CD_3$ | H | Ph |
| 1120. | $CD_3$ | $CD_2CH_3$ | H | $CD_3$ | Ph |
| 1121. | H | $CD_2CH_3$ | $CD_3$ | $CD_3$ | Ph |
| 1122. | $CD_3$ | $CD_2CH_3$ | $CD_3$ | $CD_3$ | Ph |
| 1123. | H | H | $CD_2CH_3$ | H | Ph |
| 1124. | $CD_3$ | H | $CD_2CH_3$ | H | Ph |
| 1125. | H | $CD_3$ | $CD_2CH_3$ | H | Ph |
| 1126. | H | H | $CD_2CH_3$ | $CD_3$ | Ph |
| 1127. | $CD_3$ | $CD_3$ | $CD_2CH_3$ | H | Ph |
| 1128. | $CD_3$ | H | $CD_2CH_3$ | $CD_3$ | Ph |
| 1129. | H | $CD_3$ | $CD_2CH_3$ | $CD_3$ | Ph |
| 1130. | $CD_3$ | $CD_3$ | $CD_2CH_3$ | $CD_3$ | Ph |
| 1131. | $CD(CH_3)_2$ | H | H | H | Ph |
| 1132. | $CD(CH_3)_2$ | $CD_3$ | H | $CD_3$ | Ph |
| 1133. | $CD(CH_3)_2$ | H | $CD_3$ | H | Ph |
| 1134. | $CD(CH_3)_2$ | H | H | $CD_3$ | Ph |
| 1135. | $CD(CH_3)_2$ | $CD_3$ | $CD_3$ | H | Ph |
| 1136. | $CD(CH_3)_2$ | $CD_3$ | H | $CD_3$ | Ph |
| 1137. | $CD(CH_3)_2$ | H | $CD_3$ | $CD_3$ | Ph |
| 1138. | $CD(CH_3)_2$ | $CD_3$ | $CD_3$ | $CD_3$ | Ph |
| 1139. | H | $CD(CH_3)_2$ | H | H | Ph |
| 1140. | $CD_3$ | $CD(CH_3)_2$ | H | $CD_3$ | Ph |
| 1141. | H | $CD(CH_3)_2$ | $CD_3$ | H | Ph |
| 1142. | H | $CD(CH_3)_2$ | H | $CD_3$ | Ph |
| 1143. | $CD_3$ | $CD(CH_3)_2$ | $CD_3$ | H | Ph |
| 1144. | $CD_3$ | $CD(CH_3)_2$ | H | $CD_3$ | Ph |
| 1145. | H | $CD(CH_3)_2$ | $CD_3$ | $CD_3$ | Ph |
| 1146. | $CD_3$ | $CD(CH_3)_2$ | $CD_3$ | $CD_3$ | Ph |
| 1147. | H | H | $CD(CH_3)_2$ | H | Ph |
| 1148. | $CD_3$ | H | $CD(CH_3)_2$ | H | Ph |
| 1149. | H | $CD_3$ | $CD(CH_3)_2$ | H | Ph |
| 1150. | H | H | $CD(CH_3)_2$ | $CD_3$ | Ph |
| 1151. | $CD_3$ | $CD_3$ | $CD(CH_3)_2$ | H | Ph |
| 1152. | $CD_3$ | H | $CD(CH_3)_2$ | $CD_3$ | Ph |
| 1153. | H | $CD_3$ | $CD(CH_3)_2$ | $CD_3$ | Ph |
| 1154. | $CD_3$ | $CD_3$ | $CD(CH_3)_2$ | $CD_3$ | Ph |
| 1155. | $CD(CD_3)_2$ | H | H | H | Ph |
| 1156. | $CD(CD_3)_2$ | $CD_3$ | H | $CD_3$ | Ph |
| 1157. | $CD(CD_3)_2$ | H | $CD_3$ | H | Ph |
| 1158. | $CD(CD_3)_2$ | H | H | $CD_3$ | Ph |
| 1159. | $CD(CD_3)_2$ | $CD_3$ | $CD_3$ | H | Ph |
| 1160. | $CD(CD_3)_2$ | $CD_3$ | H | $CD_3$ | Ph |
| 1161. | $CD(CD_3)_2$ | H | $CD_3$ | $CD_3$ | Ph |
| 1162. | $CD(CD_3)_2$ | $CD_3$ | $CD_3$ | $CD_3$ | Ph |
| 1163. | H | $CD(CD_3)_2$ | H | H | Ph |
| 1164. | $CH_3$ | $CD(CD_3)_2$ | H | $CD_3$ | Ph |
| 1165. | H | $CD(CD_3)_2$ | $CD_3$ | H | Ph |
| 1166. | H | $CD(CD_3)_2$ | H | $CD_3$ | Ph |
| 1167. | $CD_3$ | $CD(CD_3)_2$ | $CD_3$ | H | Ph |
| 1168. | $CD_3$ | $CD(CD_3)_2$ | H | $CD_3$ | Ph |
| 1169. | H | $CD(CD_3)_2$ | $CD_3$ | $CD_3$ | Ph |
| 1170. | $CD_3$ | $CD(CD_3)_2$ | $CD_3$ | $CD_3$ | Ph |
| 1171. | H | H | $CD(CD_3)_2$ | H | Ph |
| 1172. | $CD_3$ | H | $CD(CD_3)_2$ | H | Ph |
| 1173. | H | $CD_3$ | $CD(CD_3)_2$ | H | Ph |
| 1174. | H | H | $CD(CD_3)_2$ | $CD_3$ | Ph |
| 1175. | $CD_3$ | $CD_3$ | $CD(CD_3)_2$ | H | Ph |
| 1176. | $CD_3$ | H | $CD(CD_3)_2$ | $CD_3$ | Ph |
| 1177. | H | $CD_3$ | $CD(CD_3)_2$ | $CD_3$ | Ph |
| 1178. | $CD_3$ | $CD_3$ | $CD(CD_3)_2$ | $CD_3$ | Ph |
| 1179. | $CD_2CH(CH_3)_2$ | H | H | H | Ph |
| 1180. | $CD_2CH(CH_3)_2$ | $CD_3$ | H | $CD_3$ | Ph |
| 1181. | $CD_2CH(CH_3)_2$ | H | $CD_3$ | H | Ph |
| 1182. | $CD_2CH(CH_3)_2$ | H | H | $CD_3$ | Ph |
| 1183. | $CD_2CH(CH_3)_2$ | $CD_3$ | $CD_3$ | H | Ph |
| 1184. | $CD_2CH(CH_3)2$ | $CD_3$ | H | $CD_3$ | Ph |

-continued

| i in Li | $R^{B1}$ | $R^{B2}$ | $R^{B3}$ | $R^{B4}$ | $R^{B5}$ |
|---|---|---|---|---|---|
| 1185. | $CD_2CH(CH_3)_2$ | H | $CD_3$ | $CD_3$ | Ph |
| 1186. | $CD_2CH(CH_3)_2$ | $CD_3$ | $CD_3$ | $CD_3$ | Ph |
| 1187. | H | $CD_2CH(CH_3)_2$ | H | H | Ph |
| 1188. | $CD_3$ | $CD_2CH(CH_3)_2$ | H | $CD_3$ | Ph |
| 1189. | H | $CD_2CH(CH_3)_2$ | $CD_3$ | H | Ph |
| 1190. | H | $CD_2CH(CH_3)_2$ | H | $CD_3$ | Ph |
| 1191. | $CD_3$ | $CD_2CH(CH_3)_2$ | $CD_3$ | H | Ph |
| 1192. | $CD_3$ | $CD_2CH(CH_3)_2$ | H | $CD_3$ | Ph |
| 1193. | H | $CD_2CH(CH_3)_2$ | $CD_3$ | $CD_3$ | Ph |
| 1194. | $CD_3$ | $CD_2CH(CH_3)_2$ | $CD_3$ | $CD_3$ | Ph |
| 1195. | H | H | $CD_2CH(CH_3)_2$ | H | Ph |
| 1196. | $CD_3$ | H | $CD_2CH(CH_3)_2$ | H | Ph |
| 1197. | H | $CD_3$ | $CD_2CH(CH_3)_2$ | H | Ph |
| 1198. | H | H | $CD_2CH(CH_3)_2$ | $CD_3$ | Ph |
| 1199. | $CD_3$ | $CD_3$ | $CD_2CH(CH_3)_2$ | H | Ph |
| 1200. | $CD_3$ | H | $CD_2CH(CH_3)_2$ | $CD_3$ | Ph |
| 1201. | H | $CD_3$ | $CD_2CH(CH_3)_2$ | $CD_3$ | Ph |
| 1202. | $CD_3$ | $CD_3$ | $CD_2CH(CH_3)_2$ | $CD_3$ | Ph |
| 1203. | $CD_2C(CH_3)_3$ | H | H | H | Ph |
| 1204. | $CD_2C(CH_3)_3$ | $CD_3$ | H | $CD_3$ | Ph |
| 1205. | $CD_2C(CH_3)_3$ | H | $CD_3$ | H | Ph |
| 1206. | $CD_2C(CH_3)_3$ | H | H | $CD_3$ | Ph |
| 1207. | $CD_2C(CH_3)_3$ | $CD_3$ | $CD_3$ | H | Ph |
| 1208. | $CD_2C(CH_3)_3$ | $CD_3$ | H | $CD_3$ | Ph |
| 1209. | $CD_2C(CH_3)_3$ | H | $CD_3$ | $CD_3$ | Ph |
| 1210. | $CD_2C(CH_3)_3$ | $CH_3$ | $CD_3$ | $CD_3$ | Ph |
| 1211. | H | $CD_2C(CH_3)_3$ | H | H | Ph |
| 1212. | $CD_3$ | $CD_2C(CH3)_3$ | H | $CD_3$ | Ph |
| 1213. | H | $CD_2C(CH_3)_3$ | $CD_3$ | H | Ph |
| 1214. | H | $CD_2C(CH_3)_3$ | H | $CD_3$ | Ph |
| 1215. | $CD_3$ | $CD_2C(CH_3)_3$ | $CD_3$ | H | Ph |
| 1216. | $CD_3$ | $CD_2C(CH_3)_3$ | H | $CD_3$ | Ph |
| 1217. | H | $CD_2C(CH_3)_3$ | $CD_3$ | $CD_3$ | Ph |
| 1218. | $CD_3$ | $CD_2C(CH_3)_3$ | $CD_3$ | $CD_3$ | Ph |
| 1219. | H | H | $CD_2C(CH_3)_3$ | H | Ph |
| 1220. | $CD_3$ | H | $CD_2C(CH_3)_3$ | H | Ph |
| 1221. | H | $CD_3$ | $CD_2C(CH_3)_3$ | H | Ph |
| 1222. | H | H | $CD_2C(CH_3)_3$ | $CD_3$ | Ph |
| 1223. | $CD_3$ | $CD_3$ | $CD_2C(CH_3)_3$ | H | Ph |
| 1224. | $CD_3$ | H | $CD_2C(CH_3)_3$ | $CD_3$ | Ph |
| 1225. | H | $CD_3$ | $CD_2C(CH_3)_3$ | $CD_3$ | Ph |
| 1226. | $CD_3$ | $CD_3$ | $CD_2C(CH_3)_3$ | $CD_3$ | Ph |
| 1227. | 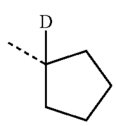 | H | H | H | Ph |
| 1228. | 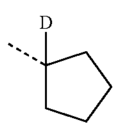 | $CD_3$ | H | $CD_3$ | Ph |
| 1229. | 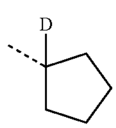 | H | $CD_3$ | H | Ph |
| 1230. | 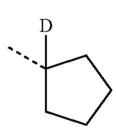 | H | H | $CD_3$ | Ph |
| 1231. | 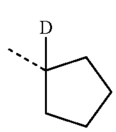 | $CD_3$ | $CD_3$ | H | Ph |

-continued
| i in Li | $R^{B1}$ | $R^{B2}$ | $R^{B3}$ | $R^{B4}$ | $R^{B5}$ |
|---|---|---|---|---|---|
| 1232. | 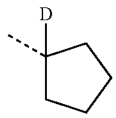 | $CD_3$ | H | $CD_3$ | Ph |
| 1233. | 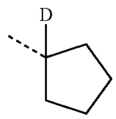 | H | $CD_3$ | $CD_3$ | Ph |
| 1234. | 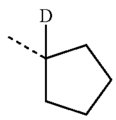 | $CD_3$ | $CD_3$ | $CD_3$ | Ph |
| 1235. | H | 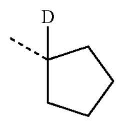 | H | H | Ph |
| 1236. | $CD_3$ | 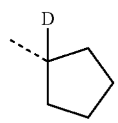 | H | $CD_3$ | Ph |
| 1237. | H | 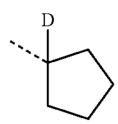 | $CD_3$ | H | Ph |
| 1238. | H | 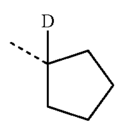 | H | $CD_3$ | Ph |
| 1239. | $CD_3$ | 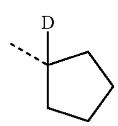 | $CD_3$ | H | Ph |
| 1240. | $CD_3$ | 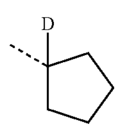 | H | $CD_3$ | Ph |
| 1241. | H | 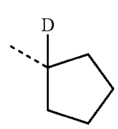 | $CD_3$ | $CD_3$ | Ph |
| 1242. | $CD_3$ | 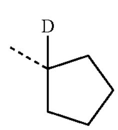 | $CD_3$ | $CD_3$ | Ph |
| 1243. | H | H | 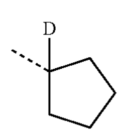 | H | Ph |

-continued
| i in Li | $R^{B1}$ | $R^{B2}$ | $R^{B3}$ | $R^{B4}$ | $R^{B5}$ |
|---|---|---|---|---|---|
| 1244. | $CD_3$ | H | 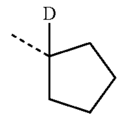 | H | Ph |
| 1245. | H | $CD_3$ | 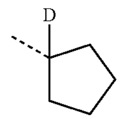 | H | Ph |
| 1246. | H | H | 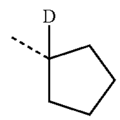 | $CD_3$ | Ph |
| 1247. | $CD_3$ | $CD_3$ | 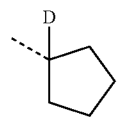 | H | Ph |
| 1248. | $CD_3$ | H | 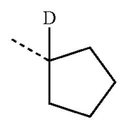 | $CD_3$ | Ph |
| 1249. | H | $CD_3$ | 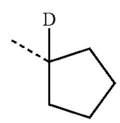 | $CD_3$ | Ph |
| 1250. | $CD_3$ | $CD_3$ | 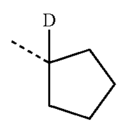 | $CD_3$ | Ph |
| 1251. | 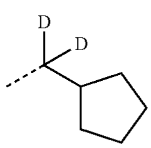 | H | H | H | Ph |
| 1252. | 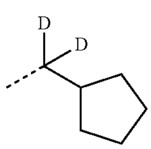 | $CD_3$ | H | $CD_3$ | Ph |
| 1253. | 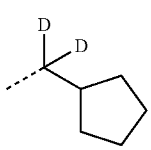 | H | $CD_3$ | H | Ph |
| 1254. | 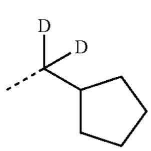 | H | H | $CD_3$ | Ph |

-continued
| i in Li | $R^{B1}$ | $R^{B2}$ | $R^{B3}$ | $R^{B4}$ | $R^{B5}$ |
|---|---|---|---|---|---|
| 1255. | 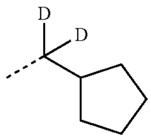 | $CD_3$ | $CD_3$ | H | Ph |
| 1256. | 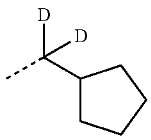 | $CD_3$ | H | $CD_3$ | Ph |
| 1257. | 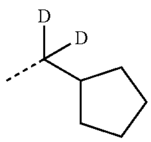 | H | $CD_3$ | $CD_3$ | Ph |
| 1258. | 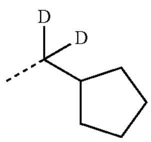 | $CD_3$ | $CD_3$ | $CD_3$ | Ph |
| 1259. | H | 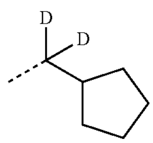 | H | H | Ph |
| 1260. | $CH_3$ | 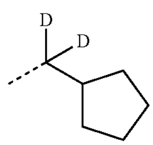 | H | $CD_3$ | Ph |
| 1261. | H | 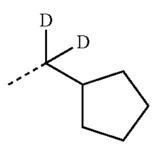 | $CD_3$ | H | Ph |
| 1262. | H | 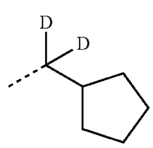 | H | $CD_3$ | Ph |
| 1263. | $CD_3$ | 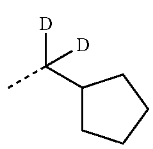 | $CD_3$ | H | Ph |
| 1264. | $CD_3$ | 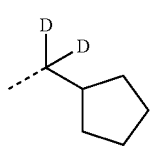 | H | $CD_3$ | Ph |

-continued
| i in Li | $R^{B1}$ | $R^{B2}$ | $R^{B3}$ | $R^{B4}$ | $R^{B5}$ |
|---|---|---|---|---|---|
| 1265. | H | 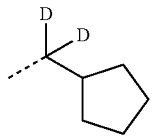 | $CD_3$ | $CD_3$ | Ph |
| 1266. | $CH_3$ | 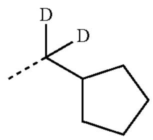 | $CD_3$ | $CD_3$ | Ph |
| 1267. | H | H | 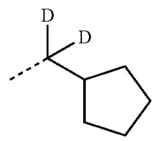 | H | Ph |
| 1268. | $CD_3$ | H | 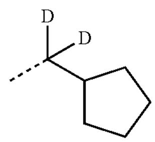 | H | Ph |
| 1269. | H | $CD_3$ | 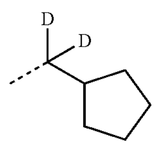 | H | Ph |
| 1270. | H | H | 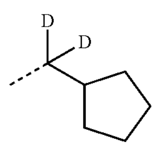 | $CD_3$ | Ph |
| 1271. | $CD_3$ | $CD_3$ | 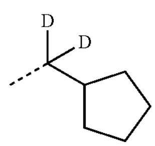 | H | Ph |
| 1272. | $CD_3$ | H | 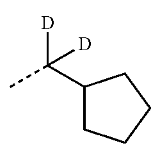 | $CD_3$ | Ph |
| 1273. | H | $CD_3$ | 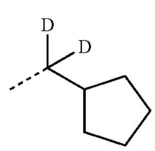 | $CD_3$ | Ph |
| 1274. | $CD_3$ | $CD_3$ | 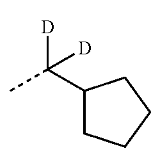 | $CD_3$ | Ph |
| 1275. | 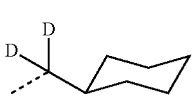 | H | H | H | Ph |

-continued
| i in Li | $R^{B1}$ | $R^{B2}$ | $R^{B3}$ | $R^{B4}$ | $R^{B5}$ |
|---|---|---|---|---|---|
| 1276. | 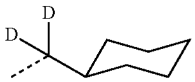 | $CD_3$ | H | $CD_3$ | Ph |
| 1277. | 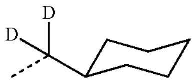 | H | $CD_3$ | H | Ph |
| 1278. | 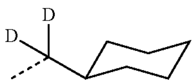 | H | H | $CD_3$ | Ph |
| 1279. | 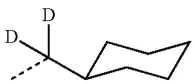 | $CD_3$ | $CD_3$ | H | Ph |
| 1280. | 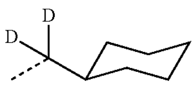 | $CD_3$ | H | $CD_3$ | Ph |
| 1281. | 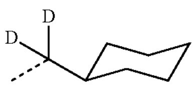 | H | $CD_3$ | $CD_3$ | Ph |
| 1282. | 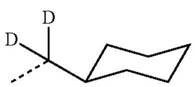 | $CD_3$ | $CD_3$ | $CD_3$ | Ph |
| 1283. | H | 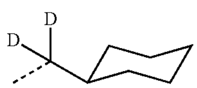 | H | H | Ph |
| 1284. | $CD_3$ | 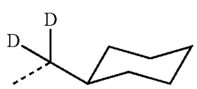 | H | $CD_3$ | Ph |
| 1285. | H | 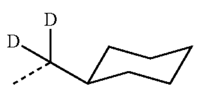 | $CD_3$ | H | Ph |
| 1286. | H | 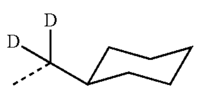 | H | $CD_3$ | Ph |
| 1287. | $CD_3$ | 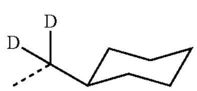 | $CD_3$ | H | Ph |
| 1288. | $CD_3$ | 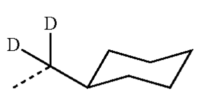 | H | $CD_3$ | Ph |
| 1289. | H | 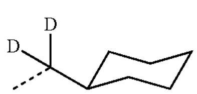 | $CD_3$ | $CD_3$ | Ph |
| 1290. | $CD_3$ | 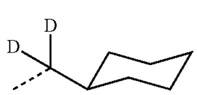 | $CD_3$ | $CD_3$ | Ph |
| 1291. | H | H | 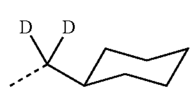 | H | Ph |

-continued
| i in Li | $R^{B1}$ | $R^{B2}$ | $R^{B3}$ | $R^{B4}$ | $R^{B5}$ |
|---|---|---|---|---|---|
| 1292. | $CD_3$ | H | 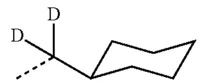 | H | Ph |
| 1293. | H | $CD_3$ | 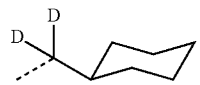 | H | Ph |
| 1294. | H | H | 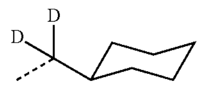 | $CD_3$ | Ph |
| 1295. | $CD_3$ | $CD_3$ | 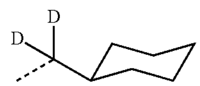 | H | Ph |
| 1296. | $CD_3$ | H | 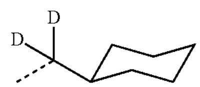 | $CD_3$ | Ph |
| 1297. | H | $CD_3$ | 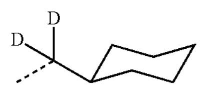 | $CD_3$ | Ph |
| 1298. | $CD_3$ | $CD_3$ | 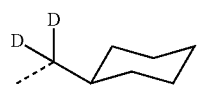 | $CD_3$ | Ph |
| 1299. | 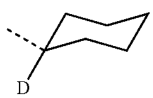 | H | H | H | Ph |
| 1300. | 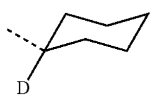 | $CD_3$ | H | $CD_3$ | Ph |
| 1301. | 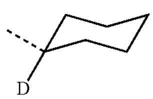 | H | $CD_3$ | H | Ph |
| 1302. | 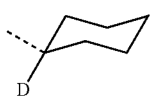 | H | H | $CD_3$ | Ph |
| 1303. | 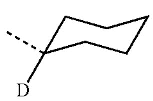 | $CD_3$ | $CD_3$ | H | Ph |
| 1304. | 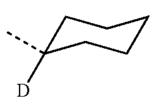 | $CD_3$ | H | $CD_3$ | Ph |
| 1305. | 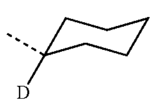 | H | $CD_3$ | $CD_3$ | Ph |
| 1306. | 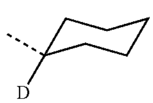 | $CD_3$ | $CD_3$ | $CD_3$ | Ph |

-continued
| i in Li | $R^{B1}$ | $R^{B2}$ | $R^{B3}$ | $R^{B4}$ | $R^{B5}$ |
|---|---|---|---|---|---|
| 1307. | H | 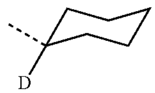 | H | H | Ph |
| 1308. | $CD_3$ | 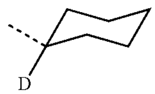 | H | $CD_3$ | Ph |
| 1309. | H | 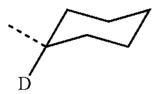 | $CD_3$ | H | Ph |
| 1310. | H | 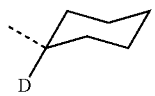 | H | $CD_3$ | Ph |
| 1311. | $CD_3$ | 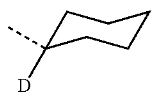 | $CD_3$ | H | Ph |
| 1312. | $CD_3$ | 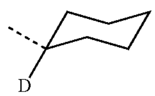 | H | $CD_3$ | Ph |
| 1313. | H | 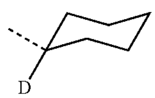 | $CD_3$ | $CD_3$ | Ph |
| 1314. | $CD_3$ | 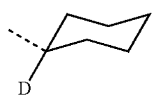 | $CD_3$ | $CD_3$ | Ph |
| 1315. | H | H | 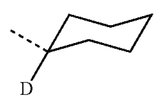 | H | Ph |
| 1316. | $CD_3$ | H | 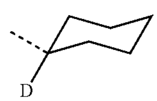 | H | Ph |
| 1317. | H | $CD_3$ | 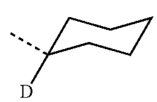 | H | Ph |
| 1318. | H | H | 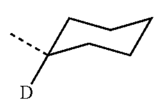 | $CD_3$ | Ph |
| 1319. | $CD_3$ | $CD_3$ | 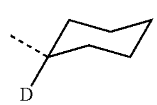 | H | Ph |
| 1320. | $CD_3$ | H | 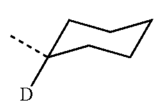 | $CD_3$ | Ph |
| 1321. | H | $CD_3$ | 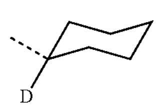 | $CD_3$ | Ph |

-continued
| i in Li | $R^{B1}$ | $R^{B2}$ | $R^{B3}$ | $R^{B4}$ | $R^{B5}$ |
|---|---|---|---|---|---|
| 1322. | $CD_3$ | $CD_3$ | 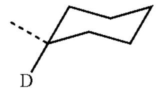 | $CD_3$ | Ph |
| 1323. | 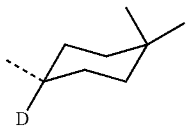 | H | H | H | Ph |
| 1324. | 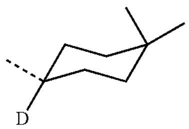 | $CD_3$ | H | $CD_3$ | Ph |
| 1325. | 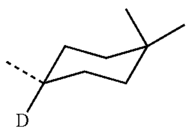 | H | $CD_3$ | H | Ph |
| 1326. | 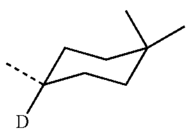 | H | H | $CD_3$ | Ph |
| 1327. | 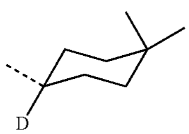 | $CD_3$ | $CD_3$ | H | Ph |
| 1328. | 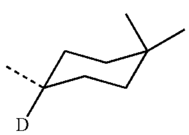 | $CD_3$ | H | $CD_3$ | Ph |
| 1329. | 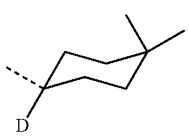 | H | $CD_3$ | $CD_3$ | Ph |
| 1330. | 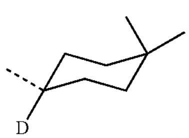 | $CD_3$ | $CD_3$ | $CD_3$ | Ph |
| 1331. | H | 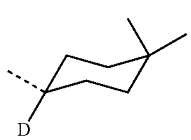 | H | H | Ph |
| 1332. | $CD_3$ | 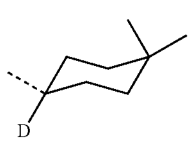 | H | $CD_3$ | Ph |

-continued
| i in Li | $R^{B1}$ | $R^{B2}$ | $R^{B3}$ | $R^{B4}$ | $R^{B5}$ |
|---|---|---|---|---|---|
| 1333. | H | 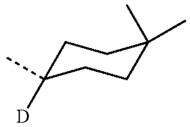 | $CD_3$ | H | Ph |
| 1334. | H | 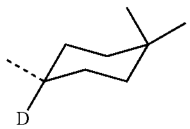 | H | $CD_3$ | Ph |
| 1335. | $CD_3$ | 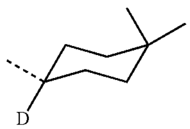 | $CD_3$ | H | Ph |
| 1336. | $CD_3$ | 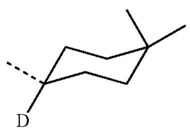 | H | $CD_3$ | Ph |
| 1337. | H | 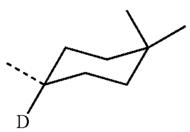 | $CD_3$ | $CD_3$ | Ph |
| 1338. | $CD_3$ | 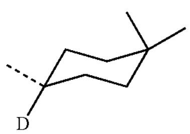 | $CD_3$ | $CD_3$ | Ph |
| 1339. | H | H | 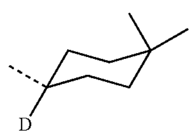 | H | Ph |
| 1340. | $CD_3$ | H | 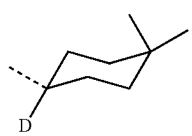 | H | Ph |
| 1341. | H | $CD_3$ | 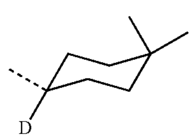 | H | Ph |
| 1342. | H | H | 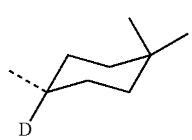 | $CD_3$ | Ph |
| 1343. | $CD_3$ | $CD_3$ | 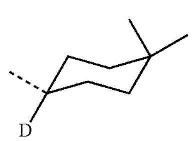 | H | Ph |

-continued
| i in Li | $R^{B1}$ | $R^{B2}$ | $R^{B3}$ | $R^{B4}$ | $R^{B5}$ |
|---|---|---|---|---|---|
| 1344. | $CD_3$ | H | 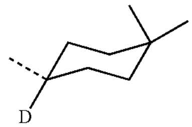 | $CD_3$ | Ph |
| 1345. | H | $CD_3$ | 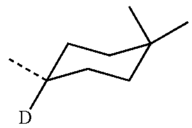 | $CD_3$ | Ph |
| 1346. | $CD_3$ | $CD_3$ | 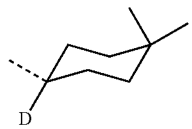 | $CD_3$ | Ph |
| 1347. | 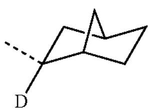 | H | H | H | Ph |
| 1348. | 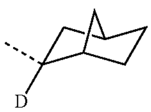 | $CD_3$ | H | $CD_3$ | Ph |
| 1349. | 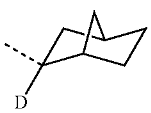 | H | $CD_3$ | H | Ph |
| 1350. | 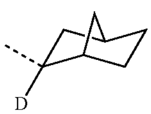 | H | H | $CD_3$ | Ph |
| 1351. | 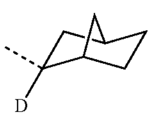 | $CH_3$ | $CH_3$ | H | Ph |
| 1352. | 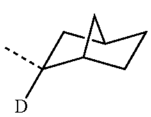 | $CD_3$ | H | $CD_3$ | Ph |
| 1353. | 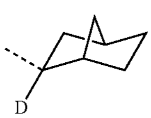 | H | $CD_3$ | $CD_3$ | Ph |
| 1354. | 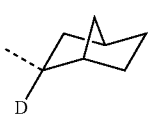 | $CD_3$ | $CD_3$ | $CD_3$ | Ph |
| 1355. | H | 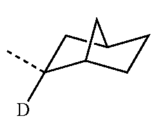 | H | H | Ph |

-continued
| i in Li | $R^{B1}$ | $R^{B2}$ | $R^{B3}$ | $R^{B4}$ | $R^{B5}$ |
|---|---|---|---|---|---|
| 1356. | $CD_3$ | 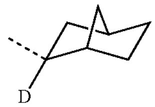 | H | $CD_3$ | Ph |
| 1357. | H | 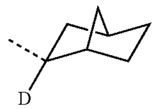 | $CD_3$ | H | Ph |
| 1358. | H | 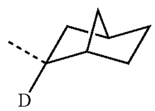 | H | $CD_3$ | Ph |
| 1359. | $CD_3$ | 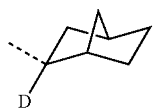 | $CD_3$ | H | Ph |
| 1360. | $CD_3$ | 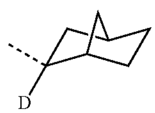 | H | $CD_3$ | Ph |
| 1361. | H | 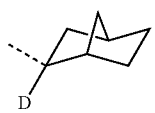 | $CD_3$ | $CD_3$ | Ph |
| 1362. | $CD_3$ | 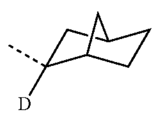 | $CD_3$ | $CD_3$ | Ph |
| 1363. | H | H | 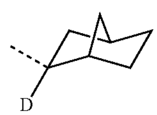 | H | Ph |
| 1364. | $CD_3$ | H | 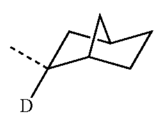 | H | Ph |
| 1365. | H | $CD_3$ | 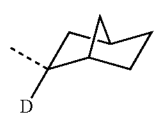 | H | Ph |
| 1366. | H | H | 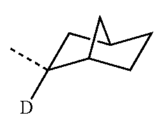 | $CD_3$ | Ph |
| 1367. | $CD_3$ | $CD_3$ | 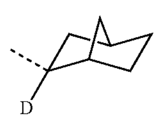 | H | Ph |
| 1368. | $CD_3$ | H | 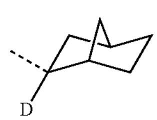 | $CD_3$ | Ph |

-continued
| i in Li | $R^{B1}$ | $R^{B2}$ | $R^{B3}$ | $R^{B4}$ | $R^{B5}$ |
|---|---|---|---|---|---|
| 1369. | H | $CD_3$ | 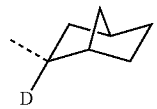 | $CD_3$ | Ph |
| 1370. | $CD_3$ | $CD_3$ | 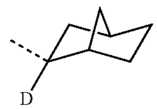 | $CD_3$ | Ph |
| 1371. | $CD(CH_3)_2$ | H | $CD_2CH_3$ | H | Ph |
| 1372. | $CD(CH_3)_2$ | H | $CD(CH_3)_2$ | H | Ph |
| 1373. | $CD(CH_3)_2$ | H | $CD_2CH(CH_3)_2$ | H | Ph |
| 1374. | $CD(CH_3)_2$ | H | $C(CH_3)_3$ | H | Ph |
| 1375. | $CD(CH_3)_2$ | H | $CD_2C(CH_3)_3$ | H | Ph |
| 1376. | $CD(CH_3)_2$ | H | 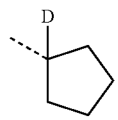 | H | Ph |
| 1377. | $CD(CH_3)_2$ | H | 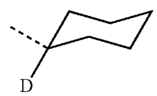 | H | Ph |
| 1378. | CD(CH3)2 | H | 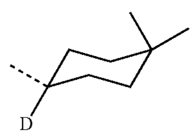 | H | Ph |
| 1379. | $CD(CH_3)_2$ | H | 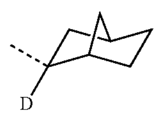 | H | Ph |
| 1380. | $CD(CH_3)_2$ | H | 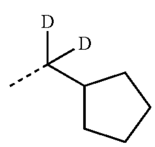 | H | Ph |
| 1381. | $CD(CH_3)_2$ | H | 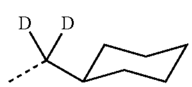 | H | Ph |
| 1382. | $C(CH_3)_3$ | H | $CD_2CH_3$ | H | Ph |
| 1383. | $C(CH_3)_3$ | H | $CD(CH_3)_2$ | H | Ph |
| 1384. | $C(CH_3)_3$ | H | $CD_2CH(CH_3)_2$ | H | Ph |
| 1385. | $C(CH_3)_3$ | H | $C(CH_3)_3$ | H | Ph |
| 1386. | $C(CH_3)_3$ | H | $CD_2C(CH_3)_3$ | H | Ph |
| 1387. | $C(CH_3)_3$ | H | 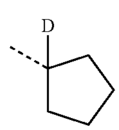 | H | Ph |
| 1388. | $C(CH_3)_3$ | H | 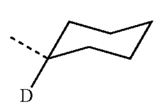 | H | Ph |

-continued
| i in Li | $R^{B1}$ | $R^{B2}$ | $R^{B3}$ | $R^{B4}$ | $R^{B5}$ |
|---|---|---|---|---|---|
| 1389. | $C(CH_3)_3$ | H | 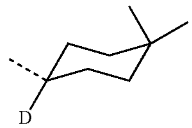 | H | Ph |
| 1390. | $C(CH_3)_3$ | H | 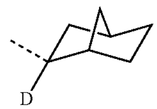 | H | Ph |
| 1391. | $C(CH_3)_3$ | H | 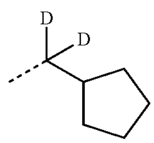 | H | Ph |
| 1392. | $C(CH_3)_3$ | H | 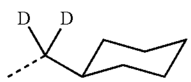 | H | Ph |
| 1393. | $CD_2C(CH_3)_3$ | H | $CD_2CH_3$ | H | Ph |
| 1394. | $CD_2C(CH_3)_3$ | H | $CD(CH_3)_2$ | H | Ph |
| 1395. | $CD_2C(CH_3)_3$ | H | $CD_2CH(CH_3)_2$ | H | Ph |
| 1396. | $CD_2C(CH_3)_3$ | H | $C(CH_3)_3$ | H | Ph |
| 1397. | $CD_2C(CH_3)_3$ | H | $CD_2C(CH_3)_3$ | H | Ph |
| 1398. | $CD_2C(CH_3)_3$ | H | 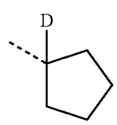 | H | Ph |
| 1399. | $CD_2C(CH_3)_3$ | H | 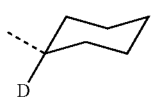 | H | Ph |
| 1400. | $CD_2C(CH_3)_3$ | H | 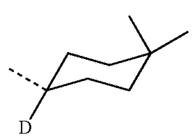 | H | Ph |
| 1401. | $CD_2C(CH_3)_3$ | H | 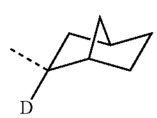 | H | Ph |
| 1402. | $CD_2C(CH_3)_3$ | H | 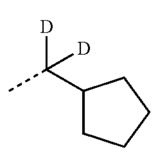 | H | Ph |
| 1403. | $CD_2C(CH_3)_3$ | H | 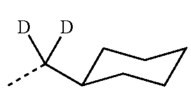 | H | Ph |
| 1404. | 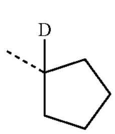 | H | $CD_2CH_3$ | H | Ph |

-continued
| i in Li | $R^{B1}$ | $R^{B2}$ | $R^{B3}$ | $R^{B4}$ | $R^{B5}$ |
|---|---|---|---|---|---|
| 1405. | 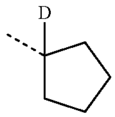 | H | $CD(CH_3)_2$ | H | Ph |
| 1406. | 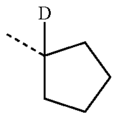 | H | $CD_2CH(CH_3)_2$ | H | Ph |
| 1407. | 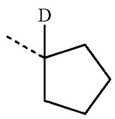 | H | $C(CH_3)_3$ | H | Ph |
| 1408. | 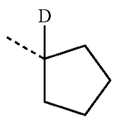 | H | $CD_2C(CH_3)_3$ | H | Ph |
| 1409. | 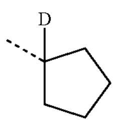 | H | 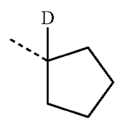 | H | Ph |
| 1410. | 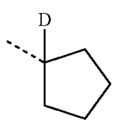 | H | 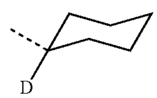 | H | Ph |
| 1411. | 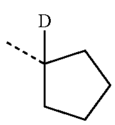 | H | 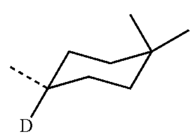 | H | Ph |
| 1412. | 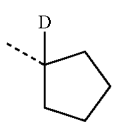 | H | 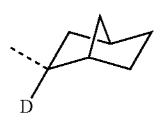 | H | Ph |
| 1413. | 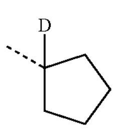 | H | 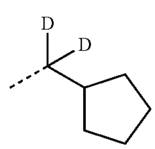 | H | Ph |
| 1414. | 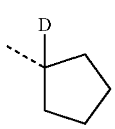 | H | 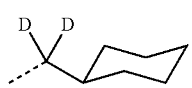 | H | Ph |
| 1415. | 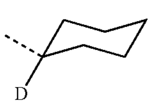 | H | $CD_2CH_3$ | H | Ph |
| 1416. | 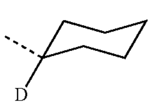 | H | $CD(CH_3)_2$ | H | Ph |

-continued
| i in Li | $R^{B1}$ | $R^{B2}$ | $R^{B3}$ | $R^{B4}$ | $R^{B5}$ |
|---|---|---|---|---|---|
| 1417. | 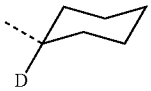 | H | $CD_2CH(CH_3)_2$ | H | Ph |
| 1418. | 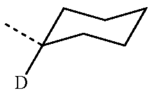 | H | $C(CH_3)_3$ | H | Ph |
| 1419. | 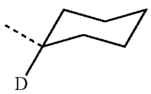 | H | $CD_2C(CH_3)_3$ | H | Ph |
| 1420. | 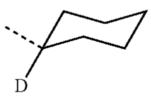 | H | 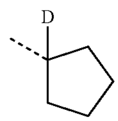 | H | Ph |
| 1421. | 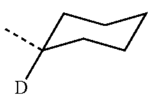 | H | 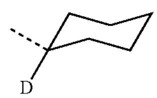 | H | Ph |
| 1422. | 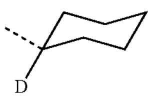 | H | 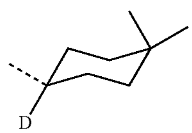 | H | Ph |
| 1423. | 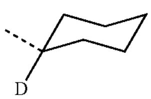 | H | 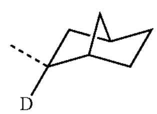 | H | Ph |
| 1424. | 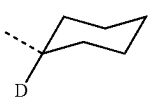 | H | 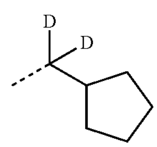 | H | Ph |
| 1425. | 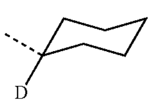 | H | 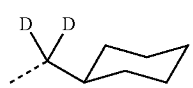 | H | Ph |
| 1426. | 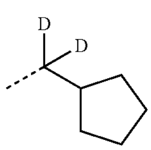 | H | $CD_2CH_3$ | H | Ph |
| 1427. | 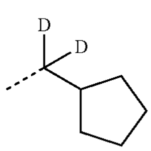 | H | $CD(CH_3)_2$ | H | Ph |
| 1428. | 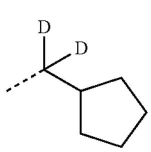 | H | $CD_2CH(CH_3)_2$ | H | Ph |

-continued
| i in Li | $R^{B1}$ | $R^{B2}$ | $R^{B3}$ | $R^{B4}$ | $R^{B5}$ |
|---|---|---|---|---|---|
| 1429. | 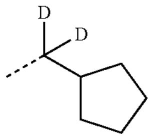 | H | $C(CH_3)_3$ | H | Ph |
| 1430. | 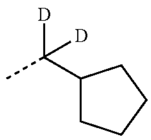 | H | $CD_2C(CH_3)_3$ | H | Ph |
| 1431. | 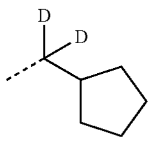 | H | 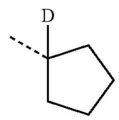 | H | Ph |
| 1432. | 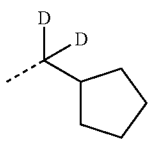 | H | 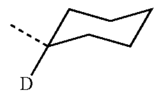 | H | Ph |
| 1433. | 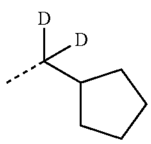 | H | 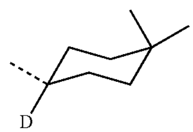 | H | Ph |
| 1434. | 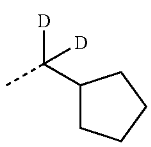 | H | 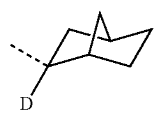 | H | Ph |
| 1435. | 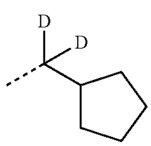 | H | 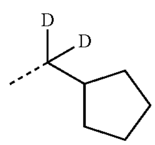 | H | Ph |
| 1436. | 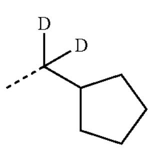 | H | 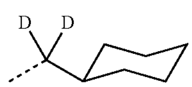 | H | Ph |
| 1437. | 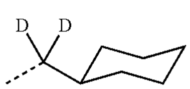 | H | $CD_2CH_3$ | H | Ph |
| 1438. | 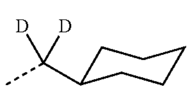 | H | $CD(CH_3)_2$ | H | Ph |
| 1439. | 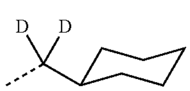 | H | $CD_2CH(CH_3)_2$ | H | Ph |
| 1440. | 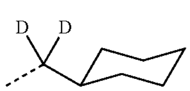 | H | $C(CH_3)_3$ | H | Ph |

-continued
| i in Li | $R^{B1}$ | $R^{B2}$ | $R^{B3}$ | $R^{B4}$ | $R^{B5}$ |
|---|---|---|---|---|---|
| 1441. | 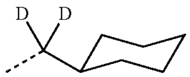 | H | $CD_2C(CH_3)_3$ | H | Ph |
| 1442. | 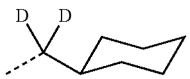 | H | 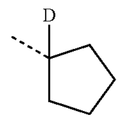 | H | Ph |
| 1443. | 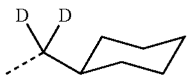 | H | 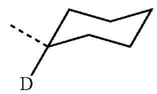 | H | Ph |
| 1444. | 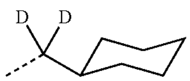 | H | 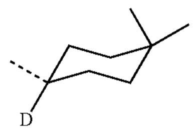 | H | Ph |
| 1445. | 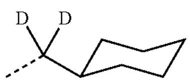 | H | 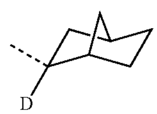 | H | Ph |
| 1446. | 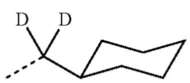 | H | 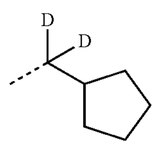 | H | Ph |
| 1447. | 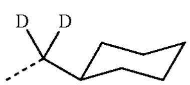 | H | 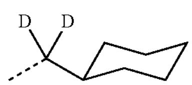 | H | Ph |
| 1448. | 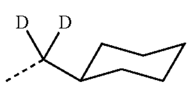 | H | $CD_2CH_3$ | H | Ph |
| 1449. | 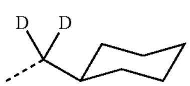 | H | $CD(CH_3)_2$ | H | Ph |
| 1450. | 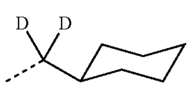 | H | $CD_2CH(CH_3)_2$ | H | Ph |
| 1451. | 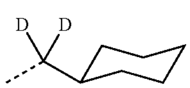 | H | $C(CH_3)_3$ | H | Ph |
| 1452. | 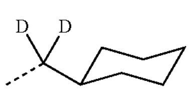 | H | $CD_2C(CH_3)_3$ | H | Ph |
| 1453. | 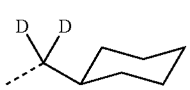 | H | 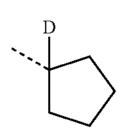 | H | Ph |
| 1454. | 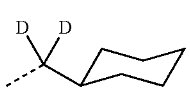 | H | 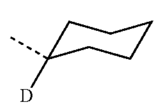 | H | Ph |

-continued

| i in Li | $R^{B1}$ | $R^{B2}$ | $R^{B3}$ | $R^{B4}$ | $R^{B5}$ |
|---|---|---|---|---|---|
| 1455. | 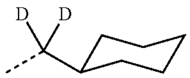 | H | 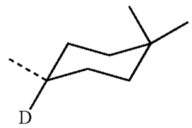 | H | Ph |
| 1456. | 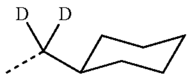 | H | 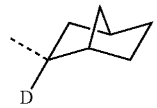 | H | Ph |
| 1457. | 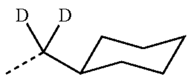 | H | 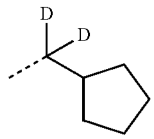 | H | Ph |
| 1458. | 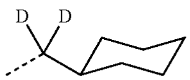 | H | 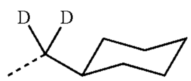 | H | Ph |
| 1459. | H | Ph | CD3 | H | H |
| 1460. | H | 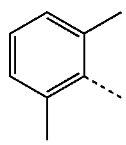 | CD3 | H | H |
| 1461. | H | 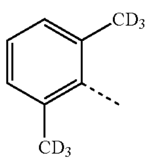 | CD3 | H | H |
| 1462. | H | 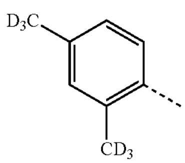 | CD3 | H | H |

8. The compound of claim 7, wherein the compound is selected from the group consisting of:

| Compnd # | $L_A$ is | $L_B$ is | $L_C$ is |
|---|---|---|---|
| 504 | $L^b_{A8}$ | $L^a_{A139}$ | $L_1$ |
| 505 | $L^b_{A10}$ | $L^a_{A139}$ | $L_1$ |
| 506 | $L^b_{A12}$ | $L^a_{A139}$ | $L_1$ |
| 507 | $L^b_{A16}$ | $L^a_{A139}$ | $L_1$ |
| 516 | $L^b_{A88}$ | $L^a_{A139}$ | $L_1$ |
| 517 | $L^b_{A94}$ | $L^a_{A139}$ | $L_1$ |
| 520 | $L^b_{A177}$ | $L^a_{A139}$ | $L_1$ |
| 521 | $L^b_{A178}$ | $L^a_{A139}$ | $L_1$ |
| 522 | $L^b_{A179}$ | $L^a_{A139}$ | $L_1$ |
| 523 | $L^b_{A180}$ | $L^a_{A139}$ | $L_1$ |
| 524 | $L^b_{A181}$ | $L^a_{A139}$ | $L_1$ |
| 525 | $L^b_{A182}$ | $L^a_{A139}$ | $L_1$ |
| 526 | $L^b_{A183}$ | $L^a_{A139}$ | $L_1$ |
| 527 | $L^b_{A184}$ | $L^a_{A139}$ | $L_1$ |
| 528 | $L^b_{A185}$ | $L^a_{A139}$ | $L_1$ |
| 529 | $L^b_{A186}$ | $L^a_{A139}$ | $L_1$ |
| 530 | $L^b_{A187}$ | $L^a_{A139}$ | $L_1$ |
| 531 | $L^b_{A188}$ | $L^a_{A139}$ | $L_1$ |

-continued

| Compnd # | $L_A$ is | $L_B$ is | $L_C$ is |
|---|---|---|---|
| 532 | $L^b_{A189}$ | $L^a_{A139}$ | $L_1$ |
| 533 | $L^b_{A190}$ | $L^a_{A139}$ | $L_1$ |
| 534 | $L^b_{A191}$ | $L^a_{A139}$ | $L_1$ |
| 538 | $L^b_{A8}$ | $L^a_{A209}$ | $L_1$ |
| 539 | $L^b_{A10}$ | $L^a_{A209}$ | $L_1$ |
| 540 | $L^b_{A12}$ | $L^a_{A209}$ | $L_1$ |
| 541 | $L^b_{A16}$ | $L^a_{A209}$ | $L_1$ |
| 550 | $L^b_{A88}$ | $L^a_{A209}$ | $L_1$ |
| 551 | $L^b_{A94}$ | $L^a_{A209}$ | $L_1$ |
| 554 | $L^b_{A177}$ | $L^a_{A209}$ | $L_1$ |
| 555 | $L^b_{A178}$ | $L^a_{A209}$ | $L_1$ |
| 556 | $L^b_{A179}$ | $L^a_{A209}$ | $L_1$ |
| 557 | $L^b_{A180}$ | $L^a_{A209}$ | $L_1$ |
| 558 | $L^b_{A181}$ | $L^a_{A209}$ | $L_1$ |
| 559 | $L^b_{A182}$ | $L^a_{A209}$ | $L_1$ |
| 560 | $L^b_{A183}$ | $L^a_{A209}$ | $L_1$ |
| 561 | $L^b_{A184}$ | $L^a_{A209}$ | $L_1$ |
| 562 | $L^b_{A185}$ | $L^a_{A209}$ | $L_1$ |
| 563 | $L^b_{A186}$ | $L^a_{A209}$ | $L_1$ |
| 564 | $L^b_{A187}$ | $L^a_{A209}$ | $L_1$ |
| 565 | $L^b_{A188}$ | $L^a_{A209}$ | $L_1$ |

-continued

| Compnd # | $L_A$ is | $L_B$ is | $L_C$ is |
|---|---|---|---|
| 566 | $L^{b}_{A189}$ | $L^{a}_{A209}$ | $L_1$ |
| 567 | $L^{b}_{A190}$ | $L^{a}_{A209}$ | $L_1$ |
| 572 | $L^{b}_{A8}$ | $L^{b}_{A3}$ | $L_1$ |
| 573 | $L^{b}_{A10}$ | $L^{b}_{A3}$ | $L_1$ |
| 574 | $L^{b}_{A12}$ | $L^{b}_{A3}$ | $L_1$ |
| 575 | $L^{b}_{A16}$ | $L^{b}_{A3}$ | $L_1$ |
| 584 | $L^{b}_{A88}$ | $L^{b}_{A3}$ | $L_1$ |
| 585 | $L^{b}_{A94}$ | $L^{b}_{A3}$ | $L_1$ |
| 588 | $L^{b}_{A177}$ | $L^{b}_{A3}$ | $L_1$ |
| 589 | $L^{b}_{A178}$ | $L^{b}_{A3}$ | $L_1$ |
| 590 | $L^{b}_{A179}$ | $L^{b}_{A3}$ | $L_1$ |
| 591 | $L^{b}_{A180}$ | $L^{b}_{A3}$ | $L_1$ |
| 592 | $L^{b}_{A181}$ | $L^{b}_{A3}$ | $L_1$ |
| 593 | $L^{b}_{A182}$ | $L^{b}_{A3}$ | $L_1$ |
| 594 | $L^{b}_{A183}$ | $L^{b}_{A3}$ | $L_1$ |
| 595 | $L^{b}_{A184}$ | $L^{b}_{A3}$ | $L_1$ |
| 596 | $L^{b}_{A185}$ | $L^{b}_{A3}$ | $L_1$ |
| 597 | $L^{b}_{A186}$ | $L^{b}_{A3}$ | $L_1$ |
| 598 | $L^{b}_{A187}$ | $L^{b}_{A3}$ | $L_1$ |
| 599 | $L^{b}_{A188}$ | $L^{b}_{A3}$ | $L_1$ |
| 600 | $L^{b}_{A189}$ | $L^{b}_{A3}$ | $L_1$ |
| 601 | $L^{b}_{A190}$ | $L^{b}_{A3}$ | $L_1$ |
| 602 | $L^{b}_{A191}$ | $L^{b}_{A3}$ | $L_1$ |
| 604 | $L^{c}_{A8}$ | $L^{A}_{A210}$ | $L_1$ |
| 605 | $L^{c}_{A10}$ | $L^{A}_{A210}$ | $L_1$ |
| 606 | $L^{c}_{A12}$ | $L^{A}_{A210}$ | $L_1$ |
| 607 | $L^{c}_{A16}$ | $L^{A}_{A210}$ | $L_1$ |
| 616 | $L^{c}_{A88}$ | $L^{A}_{A210}$ | $L_1$ |
| 617 | $L^{c}_{A94}$ | $L^{A}_{A210}$ | $L_1$ |
| 621 | $L^{c}_{A177}$ | $L^{A}_{A210}$ | $L_1$ |
| 622 | $L^{c}_{A178}$ | $L^{A}_{A210}$ | $L_1$ |
| 623 | $L^{c}_{A179}$ | $L^{A}_{A210}$ | $L_1$ |
| 624 | $L^{c}_{A180}$ | $L^{A}_{A210}$ | $L_1$ |
| 625 | $L^{c}_{A181}$ | $L^{A}_{A210}$ | $L_1$ |
| 626 | $L^{c}_{A182}$ | $L^{A}_{A210}$ | $L_1$ |
| 627 | $L^{c}_{A183}$ | $L^{A}_{A210}$ | $L_1$ |
| 628 | $L^{c}_{A184}$ | $L^{A}_{A210}$ | $L_1$ |
| 629 | $L^{c}_{A185}$ | $L^{A}_{A210}$ | $L_1$ |
| 630 | $L^{c}_{A186}$ | $L^{A}_{A210}$ | $L_1$ |
| 631 | $L^{c}_{A187}$ | $L^{A}_{A210}$ | $L_1$ |
| 632 | $L^{c}_{A188}$ | $L^{A}_{A210}$ | $L_1$ |
| 633 | $L^{c}_{A189}$ | $L^{A}_{A210}$ | $L_1$ |
| 634 | $L^{c}_{A190}$ | $L^{A}_{A210}$ | $L_1$ |
| 635 | $L^{c}_{A191}$ | $L^{A}_{A210}$ | $L_1$ |
| 636 | $L^{c}_{A192}$ | $L^{A}_{A210}$ | $L_1$ |
| 638 | $L^{c}_{A8}$ | $L^{A}_{A211}$ | $L_1$ |
| 639 | $L^{c}_{A10}$ | $L^{A}_{A211}$ | $L_1$ |
| 640 | $L^{c}_{A12}$ | $L^{A}_{A211}$ | $L_1$ |
| 641 | $L^{c}_{A16}$ | $L^{A}_{A211}$ | $L_1$ |
| 650 | $L^{c}_{A88}$ | $L^{A}_{A211}$ | $L_1$ |
| 651 | $L^{c}_{A94}$ | $L^{A}_{A211}$ | $L_1$ |
| 655 | $L^{c}_{A177}$ | $L^{A}_{A211}$ | $L_1$ |
| 656 | $L^{c}_{A178}$ | $L^{A}_{A211}$ | $L_1$ |
| 657 | $L^{c}_{A179}$ | $L^{A}_{A211}$ | $L_1$ |
| 658 | $L^{c}_{A180}$ | $L^{A}_{A211}$ | $L_1$ |
| 659 | $L^{c}_{A181}$ | $L^{A}_{A211}$ | $L_1$ |
| 660 | $L^{c}_{A182}$ | $L^{A}_{A211}$ | $L_1$ |
| 661 | $L^{c}_{A183}$ | $L^{A}_{A211}$ | $L_1$ |
| 662 | $L^{c}_{A184}$ | $L^{A}_{A211}$ | $L_1$ |
| 663 | $L^{c}_{A185}$ | $L^{A}_{A211}$ | $L_1$ |
| 664 | $L^{c}_{A186}$ | $L^{A}_{A211}$ | $L_1$ |
| 665 | $L^{c}_{A187}$ | $L^{A}_{A211}$ | $L_1$ |
| 666 | $L^{c}_{A188}$ | $L^{A}_{A211}$ | $L_1$ |
| 667 | $L^{c}_{A189}$ | $L^{A}_{A211}$ | $L_1$ |
| 668 | $L^{c}_{A190}$ | $L^{A}_{A211}$ | $L_1$ |
| 669 | $L^{c}_{A191}$ | $L^{A}_{A211}$ | $L_1$ |
| 670 | $L^{c}_{A192}$ | $L^{A}_{A211}$ | $L_1$, |

and stereoisomers thereof.

9. The compound of claim 1, wherein the compound is selected from the group consisting of:

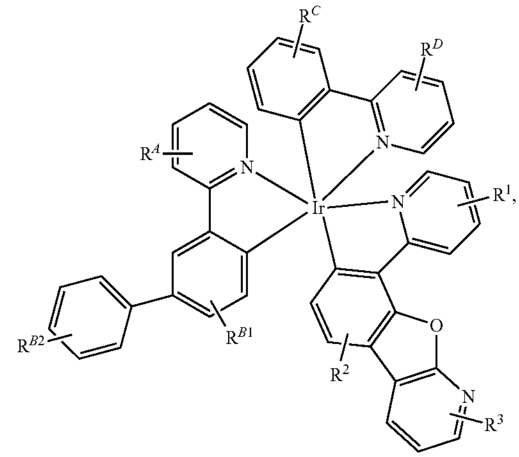

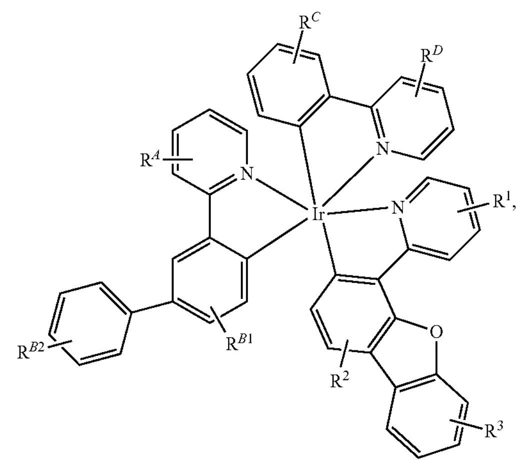

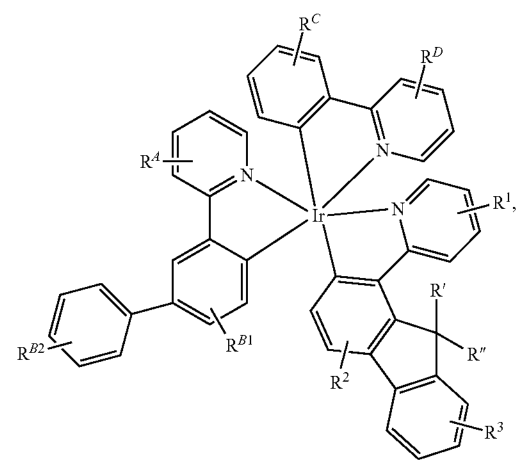

-continued
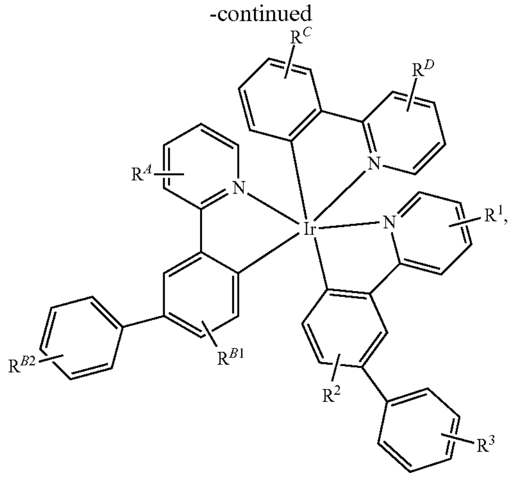
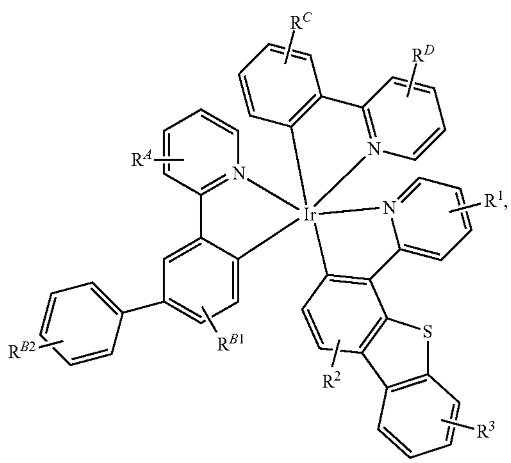
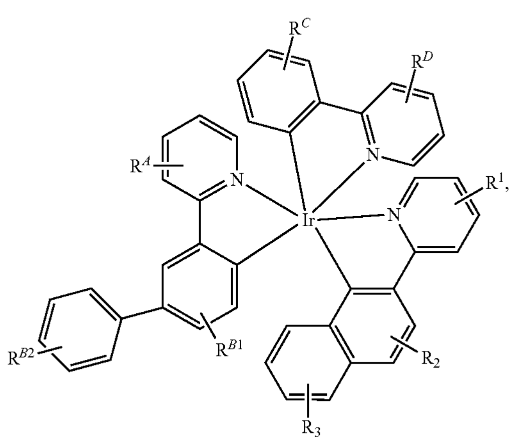
-continued
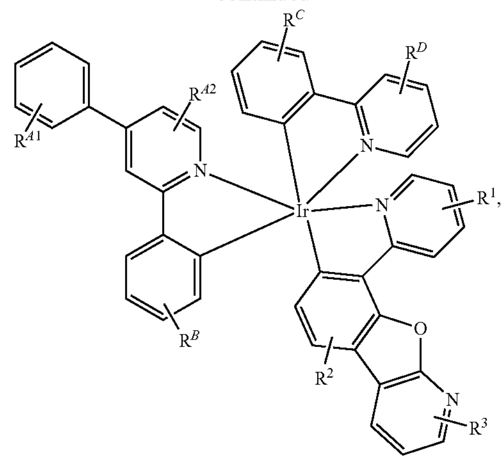
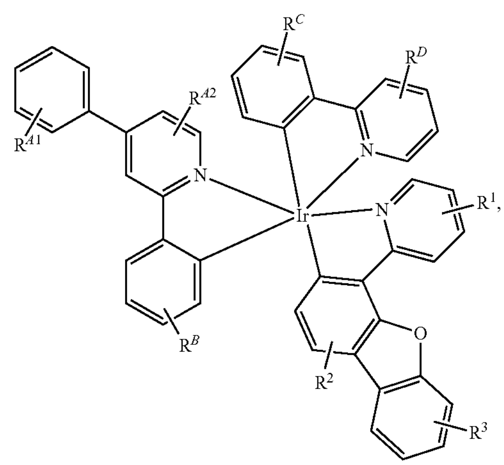
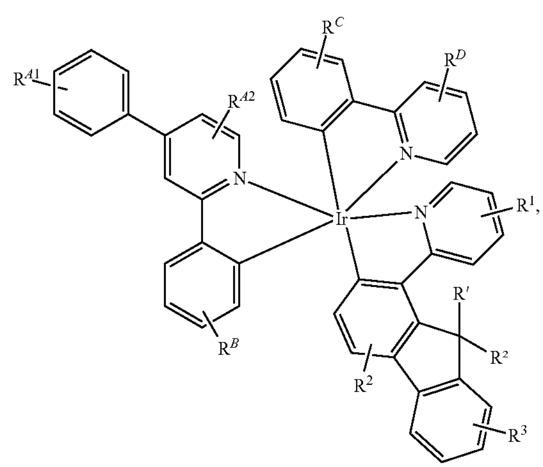

-continued
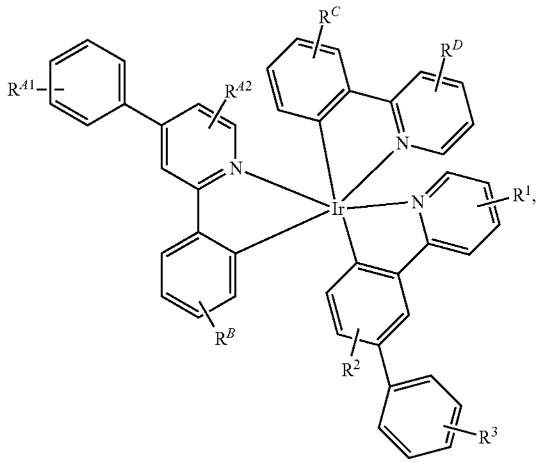
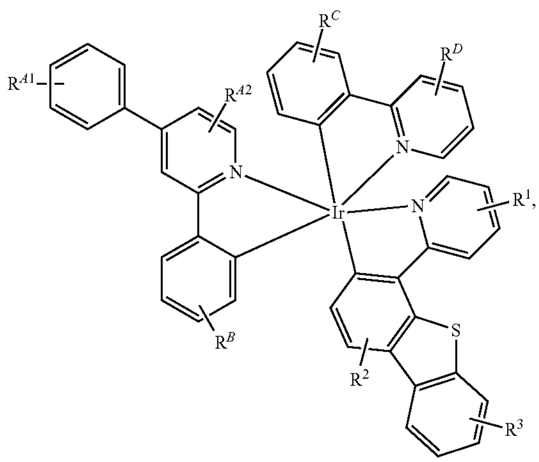
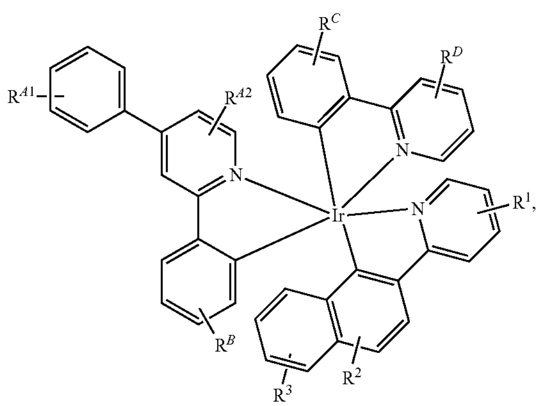
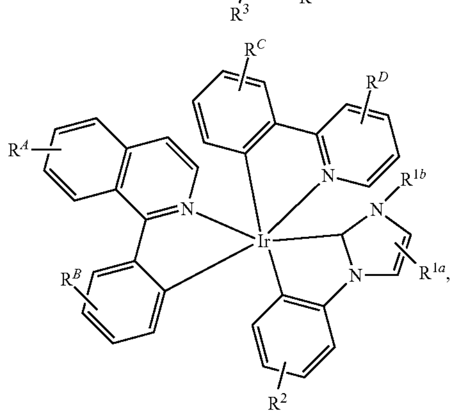
-continued
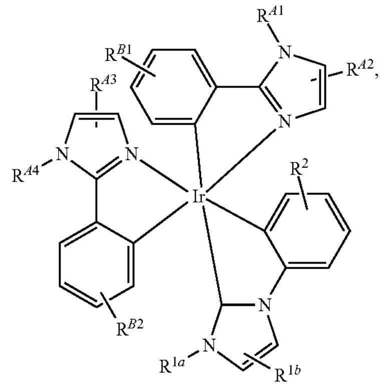
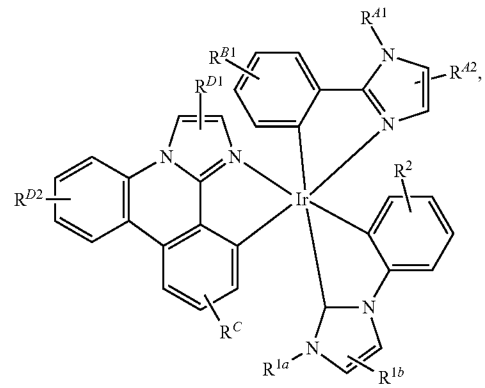
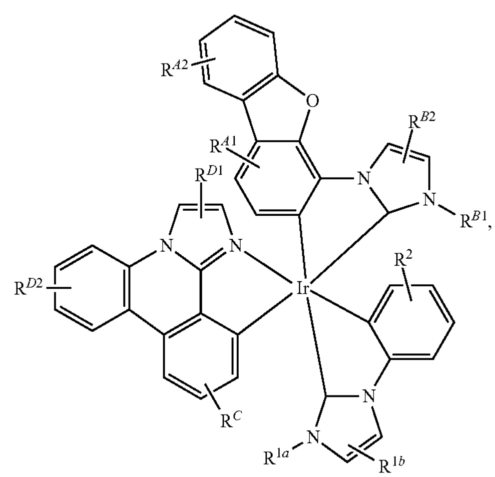
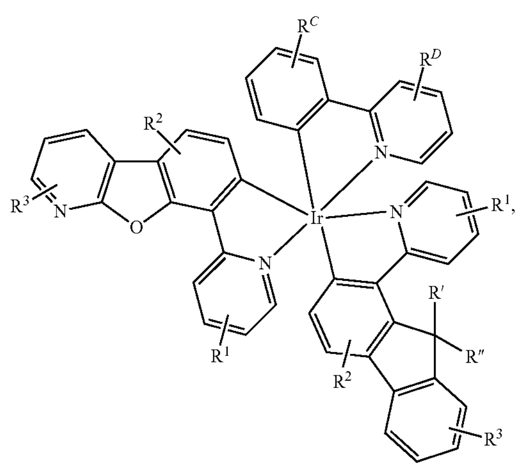
and -continued

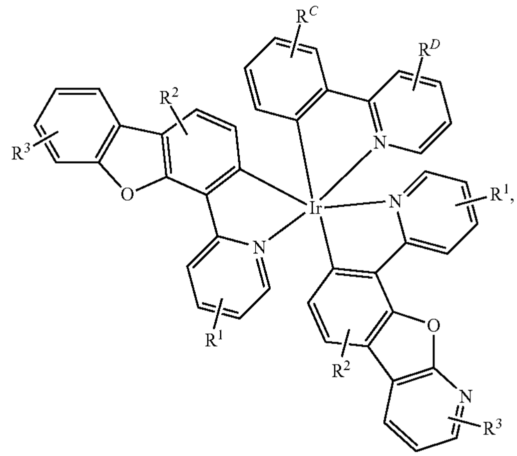

$R^A$ and $R^{A1}$ have the same definition as $R^2$;

$R^{A2}$ has the same definition as $R^3$;

$R^B$, $R^{B1}$, and $R^{B2}$ have the same definition as $R^1$;

$R^{C1}$ and $R^{C2}$ have the same definition as $R^C$;

$R^{D1}$ and $R^{D2}$ have the same definition as $R^D$.

10. The compound of claim 1, wherein at least five of $R^1$, $R^2$, and $R^{2'}$ comprises a moiety selected from the group consisting of alkyl, cycloalkyl, aryl and heteroaryl.

11. The compound of claim 1, wherein at least three of $R^1$, $R^2$, and $R^{2'}$ comprises alkyl, cycloalkyl, aryl, or heteroaryl, with at least one of $R^1$, $R^2$, and $R^{2'}$ comprising cycloalkyl, aryl, or heteroaryl.

12. The compound of claim 1, wherein ligand $L_A$ is selected from the group consisting of:

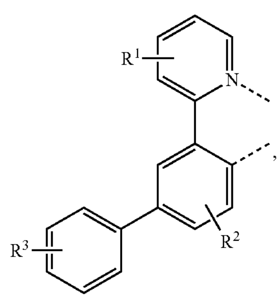

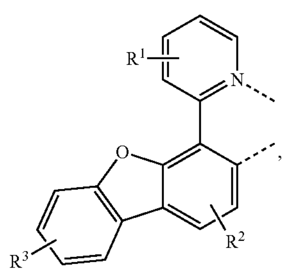

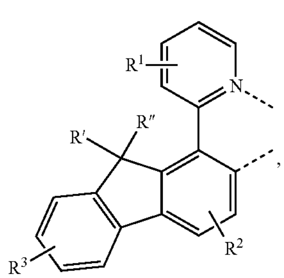

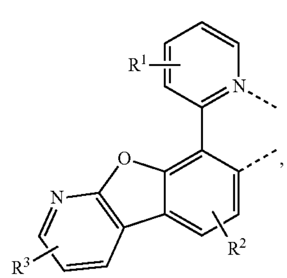

-continued

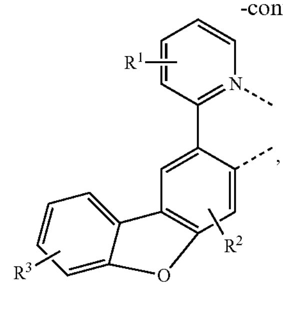

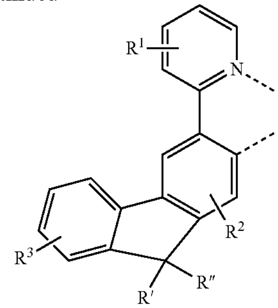

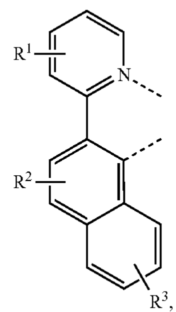

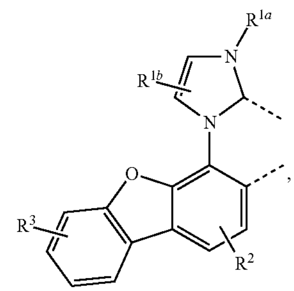

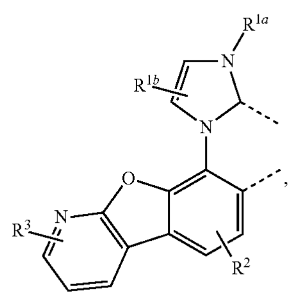

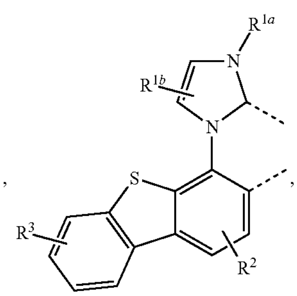

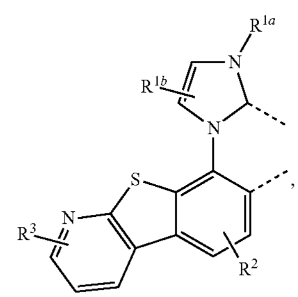

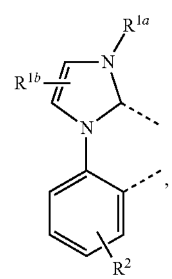

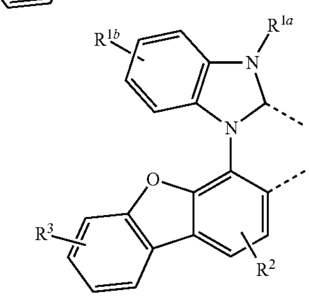

-continued
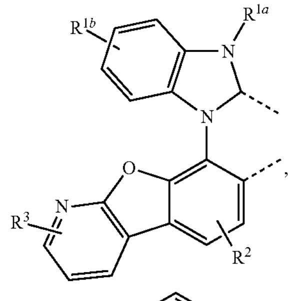
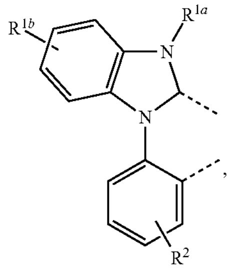
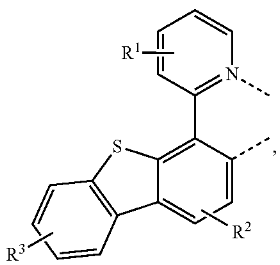
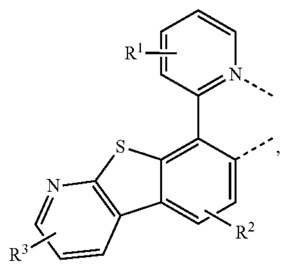
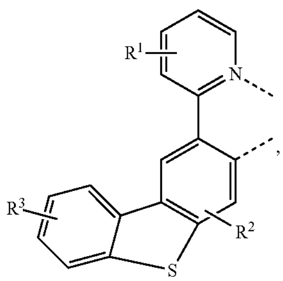
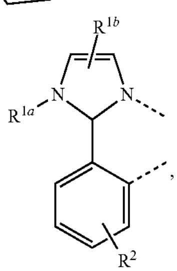
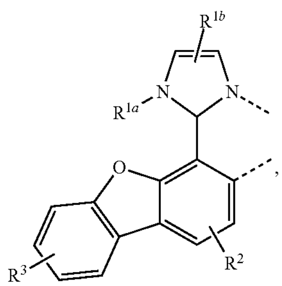
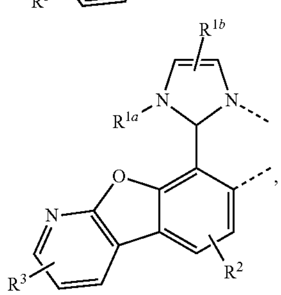
and
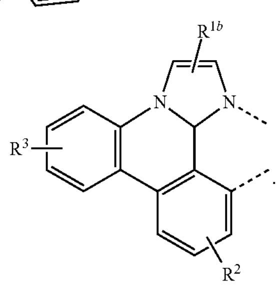
13. An organic light emitting device (OLED) comprising:
an anode;
a cathode; and
an organic layer, disposed between the anode and the cathode, comprising a compound having a formula $Ir(L_A)(L_B)(L_C)$;
wherein the ligand $L_A$ and the ligand $L_B$ are each independently selected from the group consisting of:
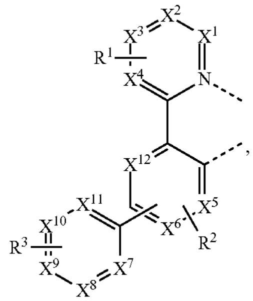
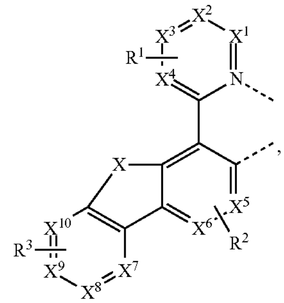
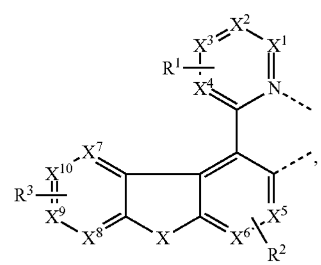
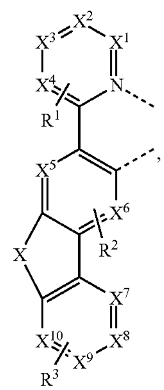
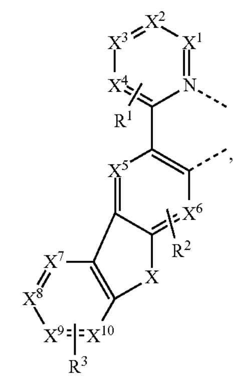
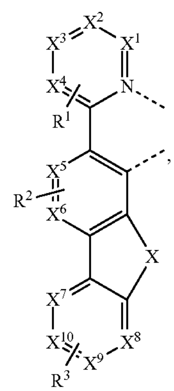
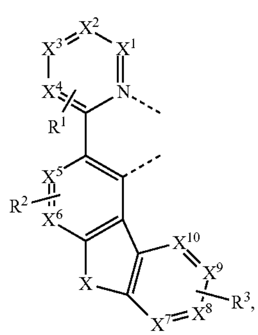
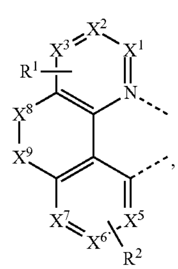

-continued

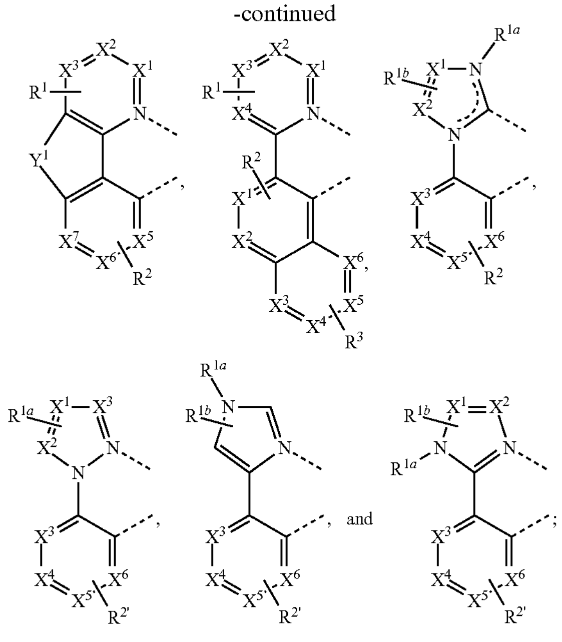

wherein the ligand $L_C$ is

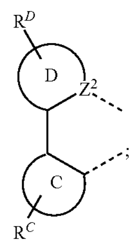

wherein rings C and D are each independently a 5 or 6-membered carbocyclic or heterocyclic ring;

wherein $R^1$, $R^{1a}$, $R^{1b}$, $R^2$, $R^{2'}$, $R^3$, $R^C$, and $R^D$ each independently represents mono, to a maximum possible number of substitutions, or no substitution;

wherein $X^1$ to $X^{12}$, $Z^1$, and $Z^2$ are each independently C or N;

wherein $Y^1$ is selected from the group consisting of O, S, Se, and Ge;

wherein X is selected from the group consisting of BR', NR', PR', O, S, Se, C═O, S═O, $SO_2$, CR'R", SiR'R", and GeR'R";

wherein $L_A$, $L_B$, and $L_C$ are different from each other, and can be connected to each other to form multidentate ligand;

wherein, when present, at least one substituent $R^{2'}$ comprises aryl or heteroaryl and can be further substituted by one or more moieties selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein $R^1$, $R^{1a}$, $R^{1b}$, $R^2$, $R^{2'}$, $R^3$, $R^A$, $R^B$, $R^C$, $R^D$, R', and R" are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two or more substituents among possible ring forming substituents are optionally joined or fused into a ring;

wherein $R^{1a}$, $R^{1b}$, $R^2$, $R^{2'}$, $R^3$, $R^A$, $R^C$, $R^D$, R', and R" are possible ring forming substituents;

wherein (a) at least four of $R^1$, $R^2$, and $R^{2'}$ comprises a moiety selected from the group consisting of alkyl, cycloalkyl, aryl and heteroaryl, (b) at least three of $R^1$, $R^2$, and $R^{2'}$ comprises alkyl, cycloalkyl, aryl, or heteroaryl, with at least one of $R^1$, $R^2$, and $R^{2'}$ comprising cycloalkyl, aryl, or heteroaryl, (c)(i) $L_A$ and $L_B$ are both selected from the croup consisting of

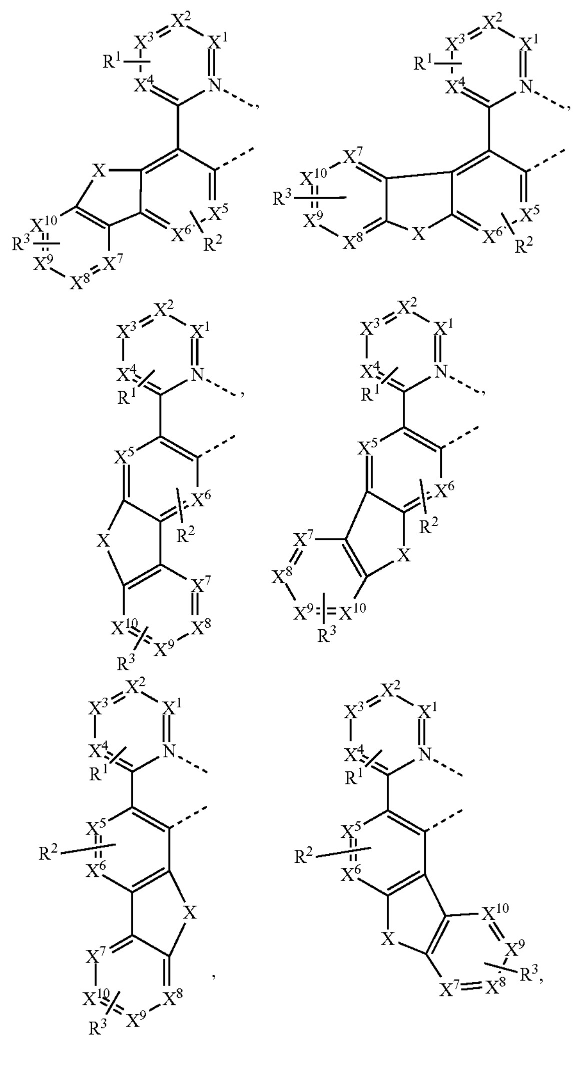

(ii) at least three of $R^1$, $R^2$, and $R^3$ comprise alkyl, cycloalkyl, aryl, or heteroaryl, and (iii) exactly one of $X^5$ to $X^{10}$ is N, or at least one X is selected from the group consisting of BR', NR', PR', Se, C═O, S═O, SO2, CR'R", SiR'R", or GeR'R", or (d) any combination of (a), (b), or (c);

wherein:

if $Z^1$ is C or Ring B is a five-membered carbocyclic or heterocyclic ring, then $R^B$ is one of the possible ring forming substituents, and if $Z^1$ is N, then (i) at least one $R^B$ comprises aryl or heteroaryl and the $R^B$ substituents are not joined or fused into a ring, or (ii) at least one $R^A$ or $R^B$ comprises cycloalkyl; and wherein:

if $Z^2$ is C or Ring D is a five-membered carbocyclic or heterocyclic ring, then $R^D$ is one of the possible ring forming substituents, and if $Z^2$ is N, then $R^D$ substituents are not joined or fused into a ring.

14. The OLED of claim 13, wherein the organic layer is an emissive layer and the compound is an emissive dopant or a non-emissive dopant.

15. The OLED of claim 13, wherein the organic layer further comprises a host, wherein the host comprises a triphenylene containing benzo-fused thiophene or benzo-fused furan;

wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}CC_nH_{2n+1}$, $Ar_1$, $Ar_1$-$Ar_2$, and $C_nH_{2n}$-$Ar_1$, or the host has no substitutions;

wherein n is from 1 to 10; and wherein $Ar_1$ and $Ar_2$ are each independently selected from the group consisting of benzene, biphenyl, naphthalene, triphenylene, carbazole, and heteroaromatic analogs thereof.

16. The OLED of claim 13, wherein the organic layer further comprises a host, wherein host comprises at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

17. The OLED of claim 13, wherein the organic layer further comprises a host, wherein the host is selected from the group consisting of:

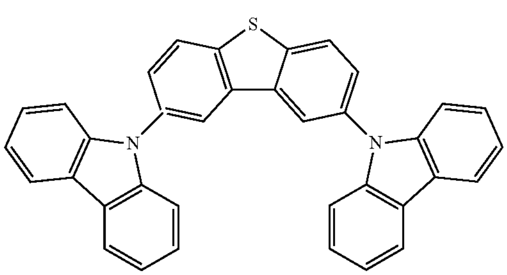

,

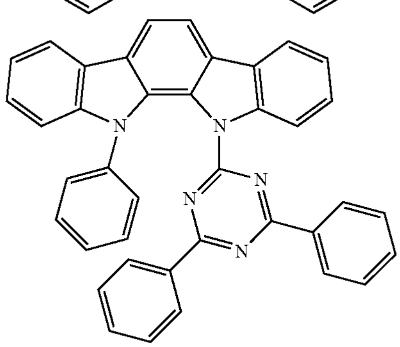

,

-continued

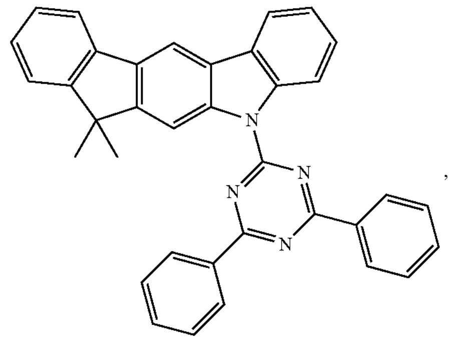

,

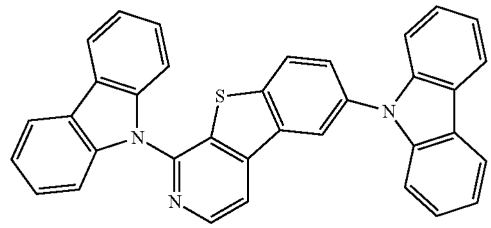

,

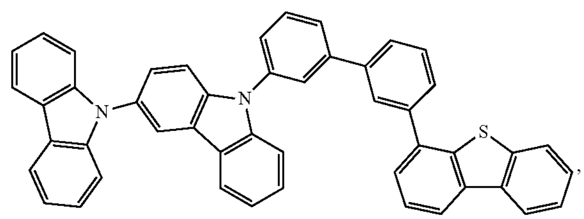

,

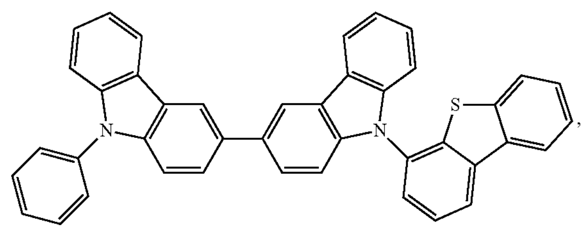

,

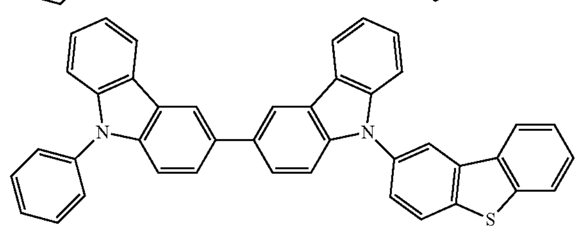

,

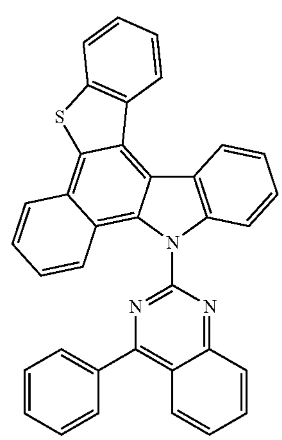

,

-continued
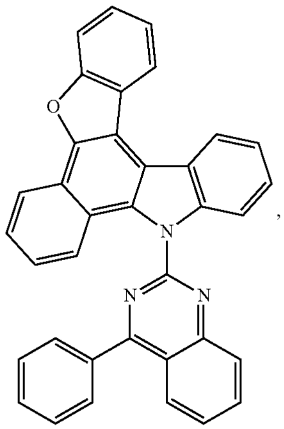
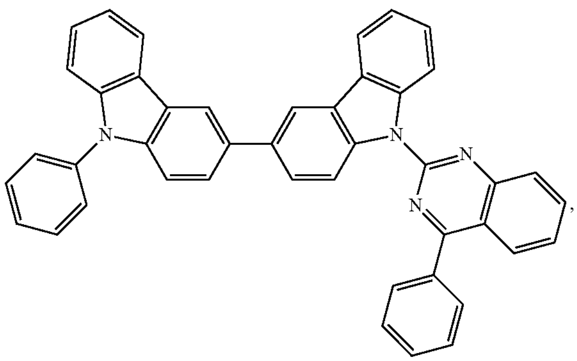
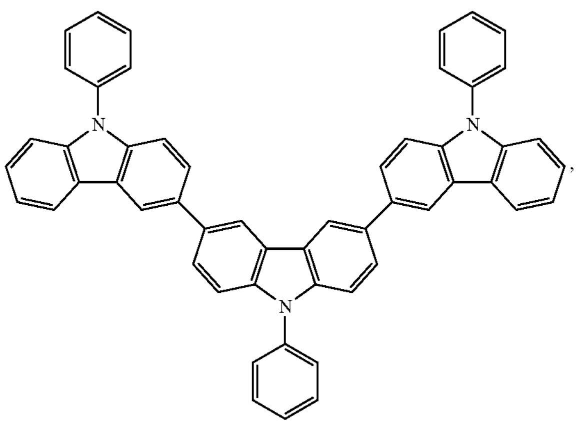
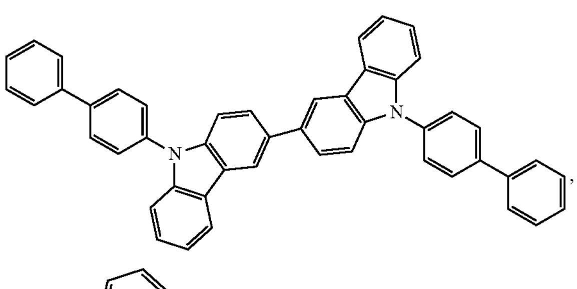
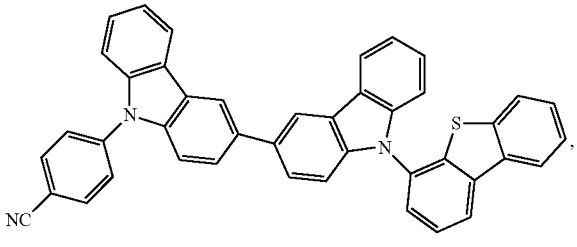
-continued
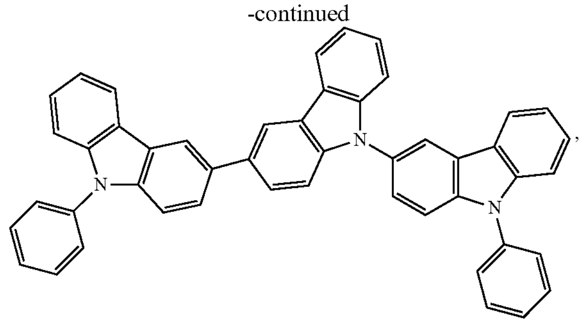
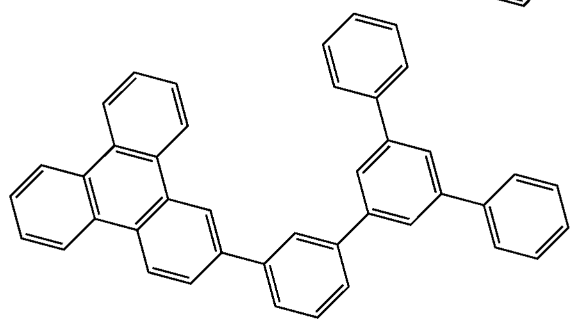
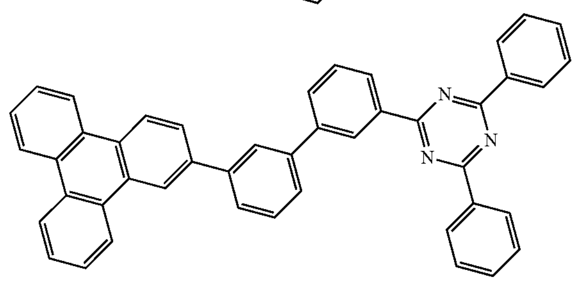
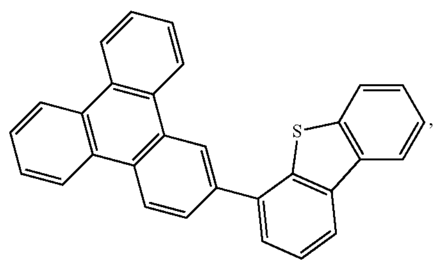
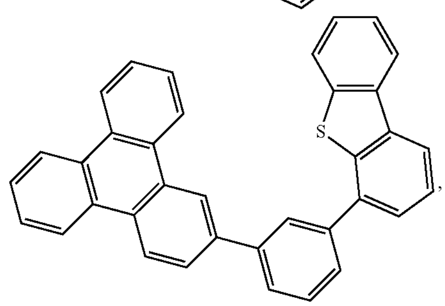
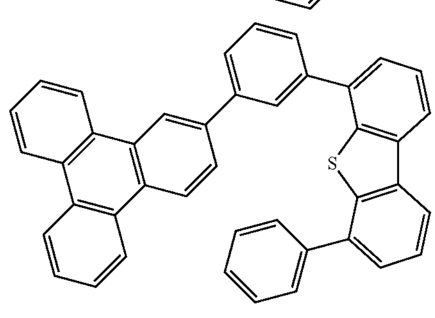

-continued

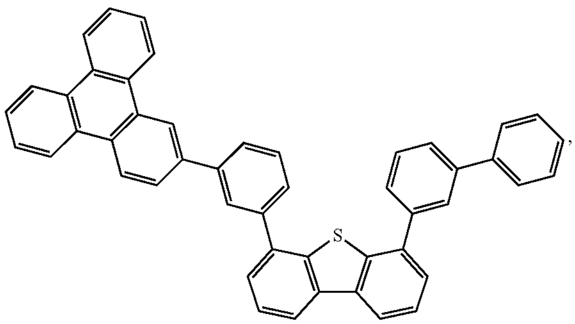

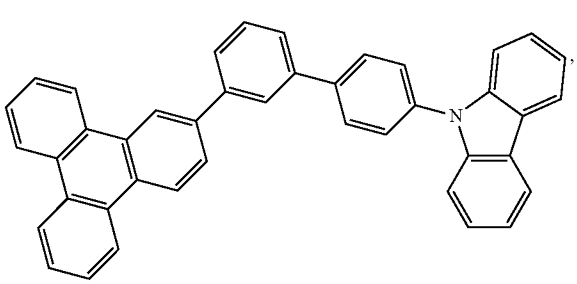

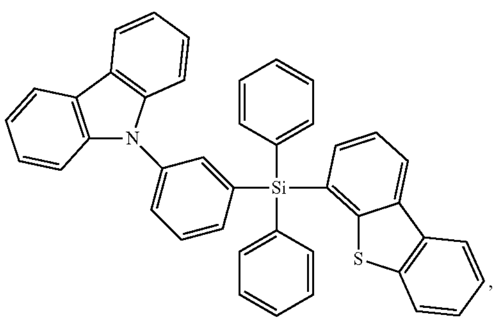

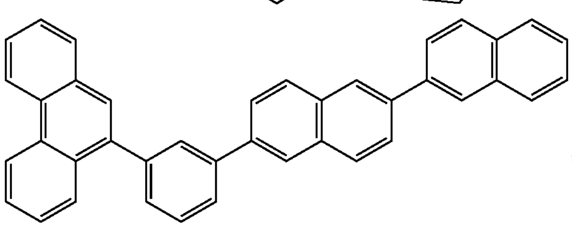

and combinations thereof.

18. The OLED of claim 13, wherein the organic layer further comprises a host, wherein the host comprises a metal complex.

19. A consumer product comprising an organic light-emitting device (OLED) comprising:

an anode;

a cathode; and an organic layer, disposed between the anode and the cathode, comprising a compound having a formula $Ir(L_A)(L_B)(L_C)$;

wherein the ligand $L_A$ and the ligand $L_B$ are each independently selected from the group consisting of:

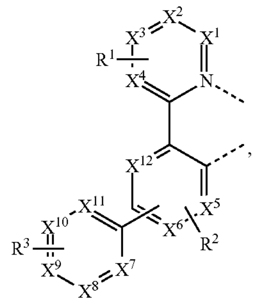

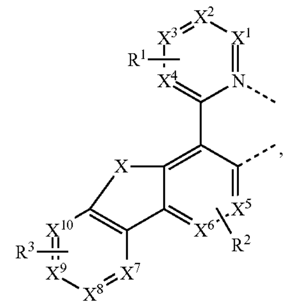

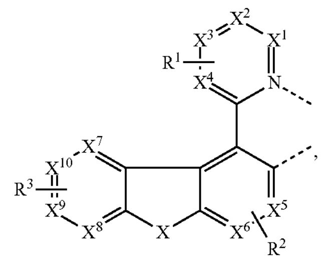

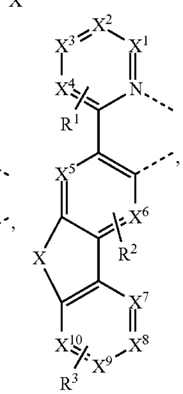

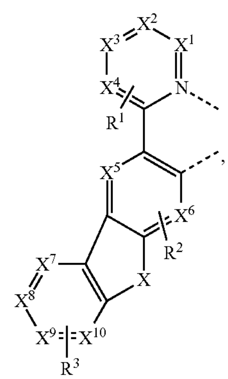

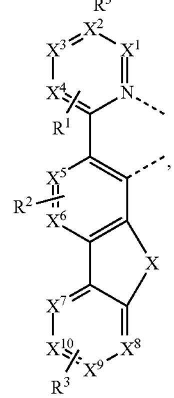

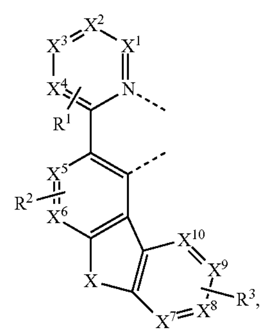

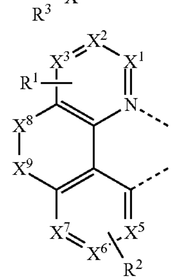

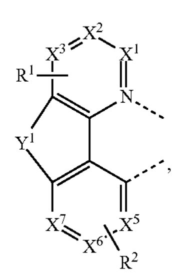

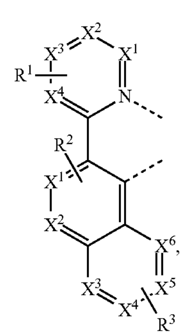

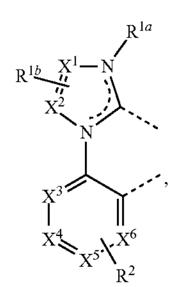

-continued

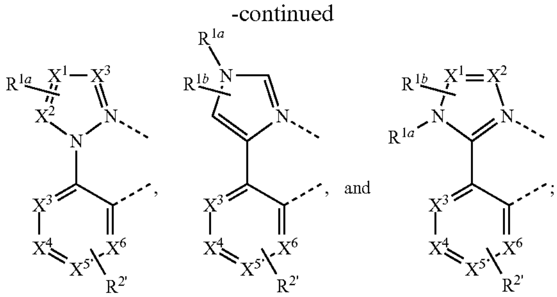

wherein the ligand $L_C$ is

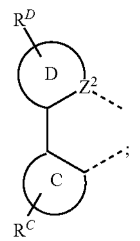

wherein rings C and D are each independently a 5 or 6-membered carbocyclic or heterocyclic ring;

wherein $R^1$, $R^{1a}$, $R^{1b}$, $R^2$, $R^{2'}$, $R^3$, $R^C$, and $R^D$ each independently represents mono, to a maximum possible number of substitutions, or no substitution;

wherein $X^1$ to $X^{12}$, $Z^1$, and $Z^2$ are each independently C or N;

wherein $Y^1$ is selected from the group consisting of O, S, Se, and Ge;

wherein X is selected from the group consisting of BR', NR', PR', O, S, Se, C═O, S═O, $SO_2$, CR'R", SiR'R", and GeR'R";

wherein $L_A$, $L_B$, and $L_C$ are different from each other, and can be connected to each other to form multidentate ligand;

wherein, when present, at least one substituent $R^{2'}$ comprises aryl or heteroaryl and can be further substituted by one or more moieties selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein $R^1$, $R^{1a}$, $R^{1b}$, $R^2$, $R^{2'}$, $R^3$, $R^A$, $R^B$, $R^C$, $R^D$, R', and R" are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two or more substituents among possible ring forming substituents are optionally joined or fused into a ring;

wherein $R^{1a}$, $R^{1b}$, $R^2$, $R^{2'}$, $R^3$, $R^A$, $R^C$, $R^D$, R', and R" are possible ring forming substituents;

wherein (a) at least four of $R^1$, $R^2$, and $R^{2'}$ comprises a moiety selected from the group consisting of alkyl, cycloalkyl, aryl and heteroaryl, (b) at least three of $R^1$, $R^2$, and $R^{2'}$ comprises alkyl, cycloalkyl, aryl, or heteroaryl, with at least one of $R^1$, $R^2$, and $R^{2'}$ comprising cycloalkyl, aryl, or heteroaryl, (c)(i) $L_A$ and $L_B$ are both selected from the croup consisting of

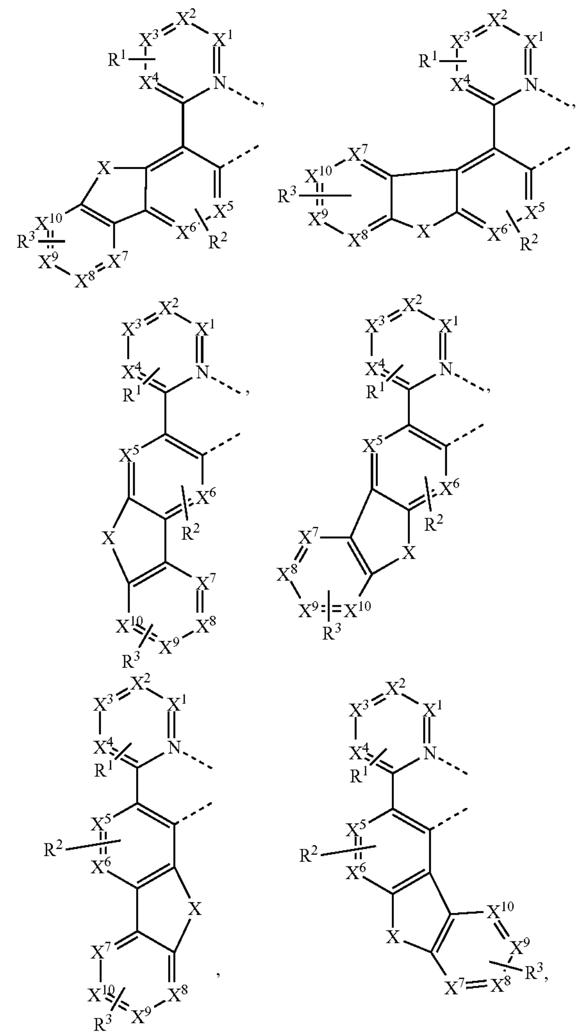

(ii) at least three of $R^1$, $R^2$, and $R^3$ comprise alkyl, cycloalkyl, aryl, or heteroaryl, and (iii) exactly one of $X^5$ to $X^{10}$ is N, or at least one X is selected from the group consisting of BR', NR', PR', Se, C═O, S═O, SO2, CR'R", SiR'R", or GeR'R", or (d) any combination of (a), (b), or (c);

wherein:

if $Z^1$ is C or Ring B is a five-membered carbocyclic or heterocyclic ring, then $R^B$ is one of the possible ring forming substituents, and if $Z^1$ is N, then (i) at least one $R^B$ comprises aryl or heteroaryl and the $R^B$ substituents are not joined or fused into a ring, or (ii) at least one $R^A$ or $R^B$ comprises cycloalkyl; and wherein:

if $Z^2$ is C or Ring D is a five-membered carbocyclic or heterocyclic ring, then $R^D$ is one of the possible ring forming substituents, and if $Z^2$ is N, then $R^D$ substituents are not joined or fused into a ring.

20. The consumer product of claim 19, wherein the consumer product is selected from the group consisting of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign.

* * * * *

UNITED STATES PATENT AND TRADEMARK OFFICE

CERTIFICATE OF CORRECTION

PATENT NO. : 11,482,683 B2
APPLICATION NO. : 15/619190
DATED : October 25, 2022
INVENTOR(S) : Jui-Yi Tsai et al.

It is certified that error appears in the above-identified patent and that said Letters Patent is hereby corrected as shown below:

In the Claims

In Claim 9, Column 476, Lines 5-26, please delete compound

"

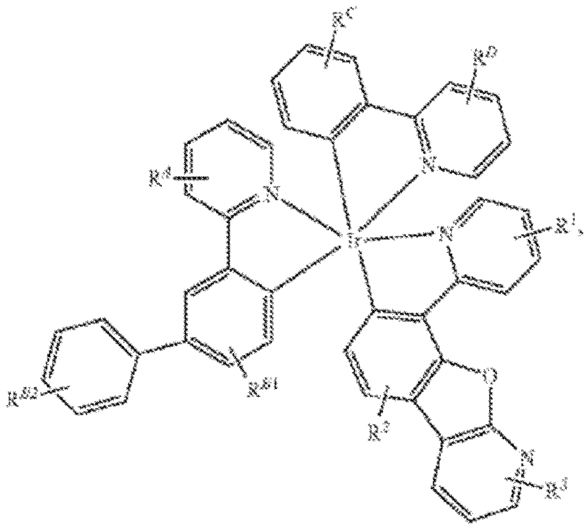

" and insert

Signed and Sealed this
Twenty-first Day of March, 2023

Katherine Kelly Vidal

Katherine Kelly Vidal
*Director of the United States Patent and Trademark Office*

-- 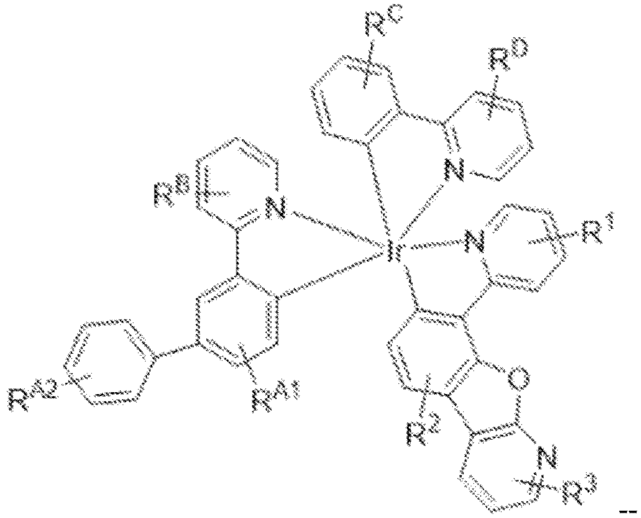 --
In Claim 9, Column 476, Lines 27-47, please delete compound
" 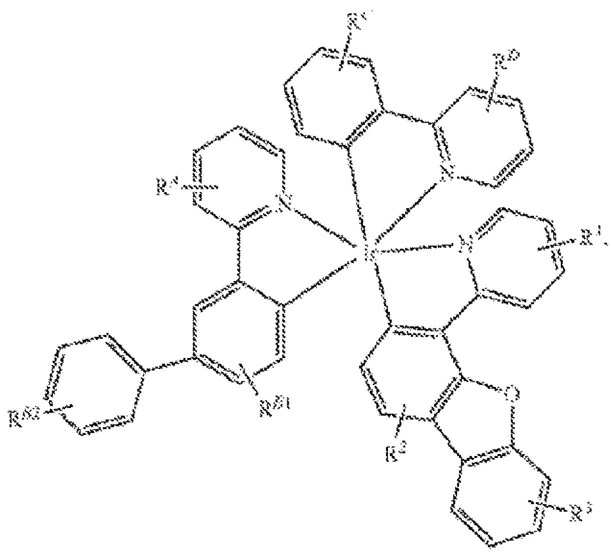 " and insert
-- 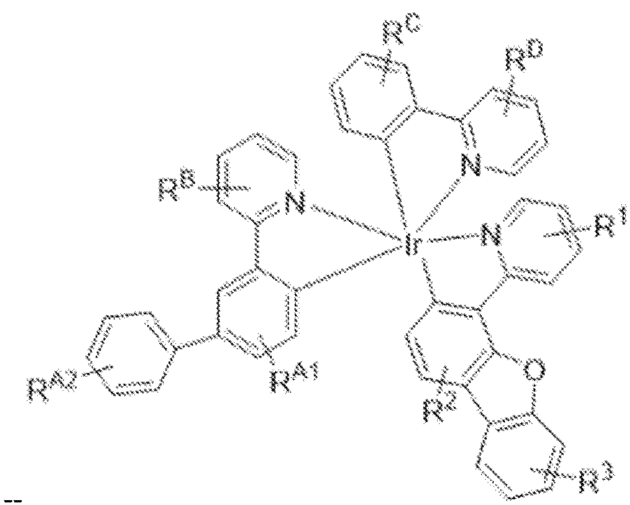 --

In Claim 9, Column 476, Lines 48-67, please delete compound
"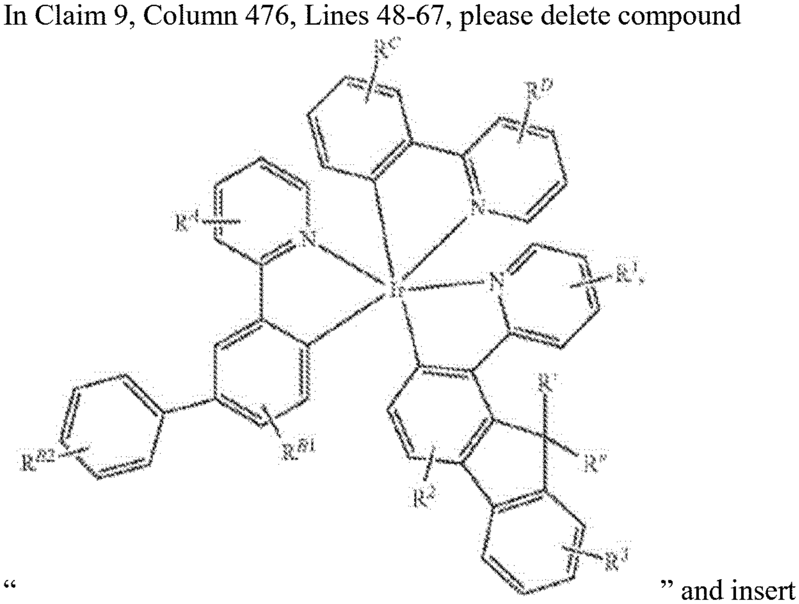" and insert
--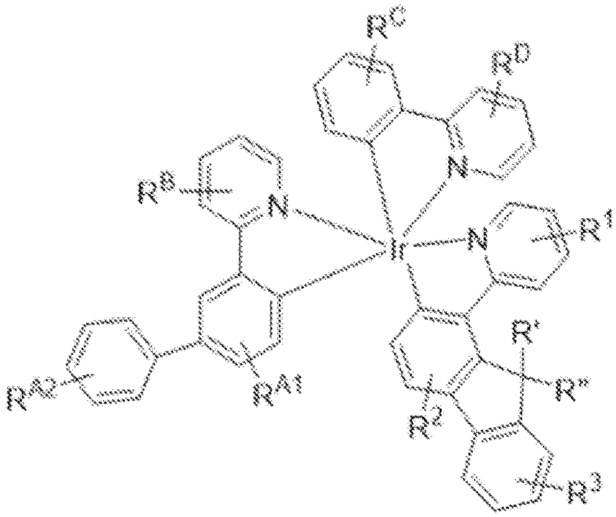--

In Claim 9, Column 477, Lines 1-26, please delete compound
"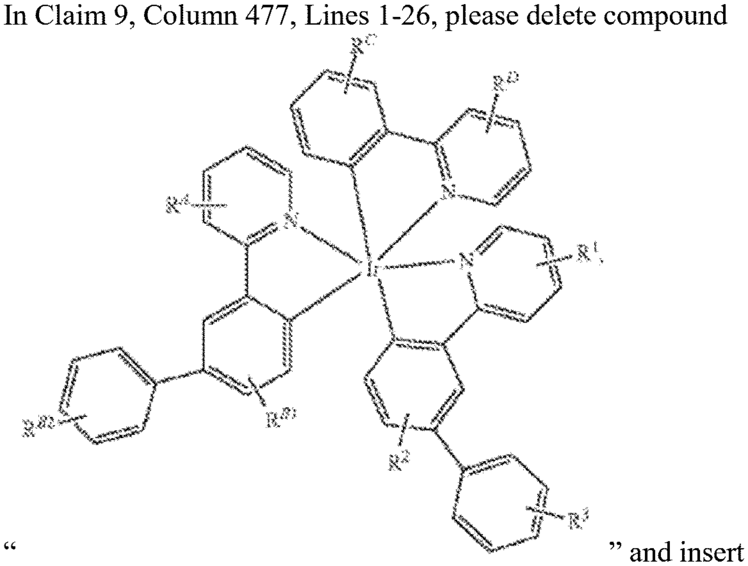" and insert
--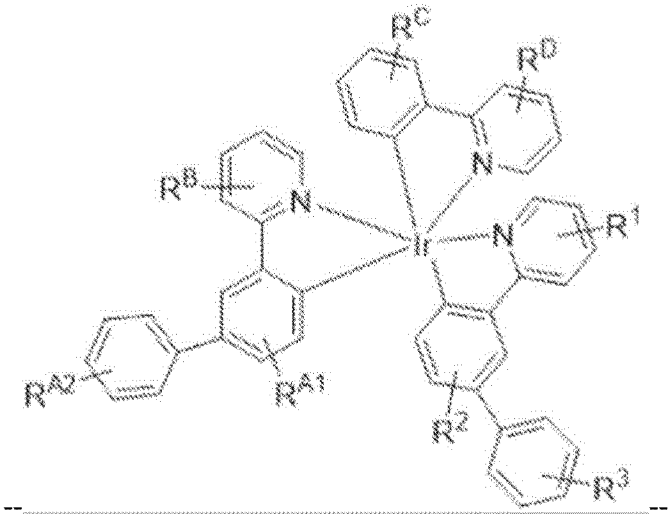--

In Claim 9, Column 477, Lines 27-49, please delete compound
“ 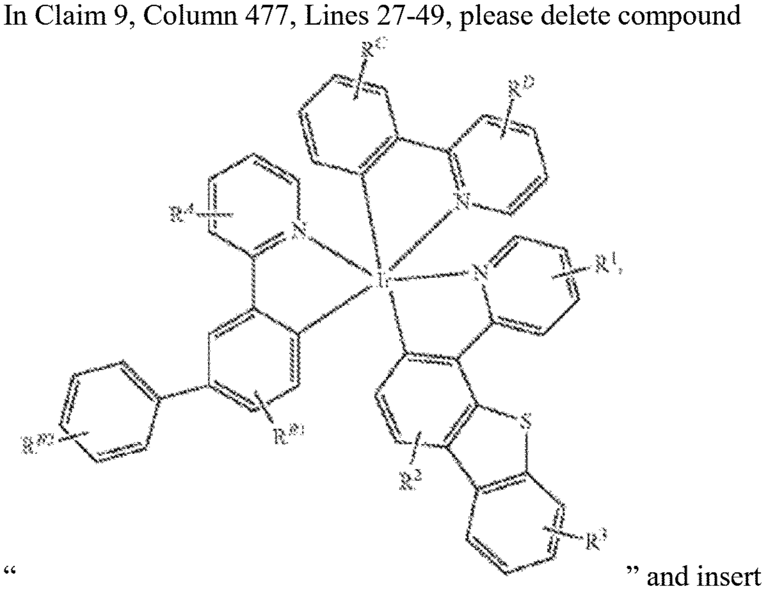 ” and insert
-- 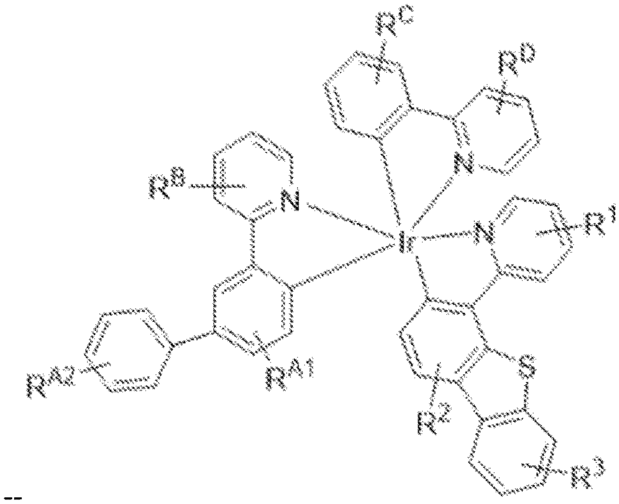 --

In Claim 9, Column 477, Lines 50-67, please delete compound
"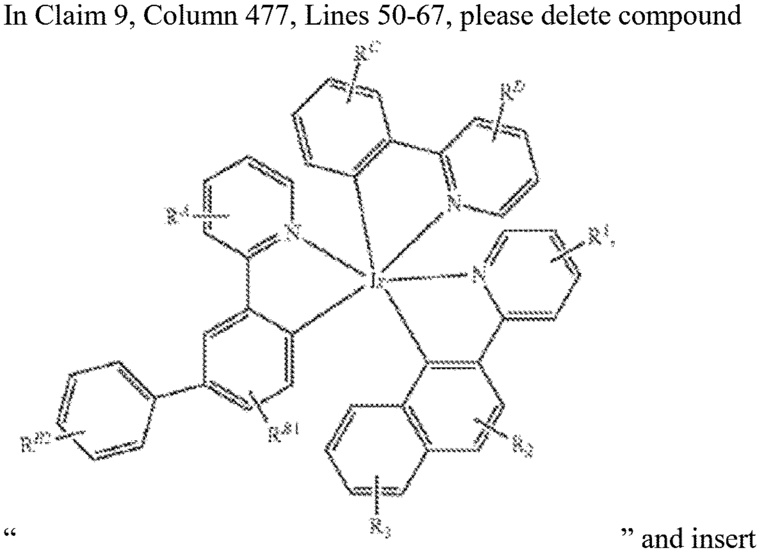" and insert
--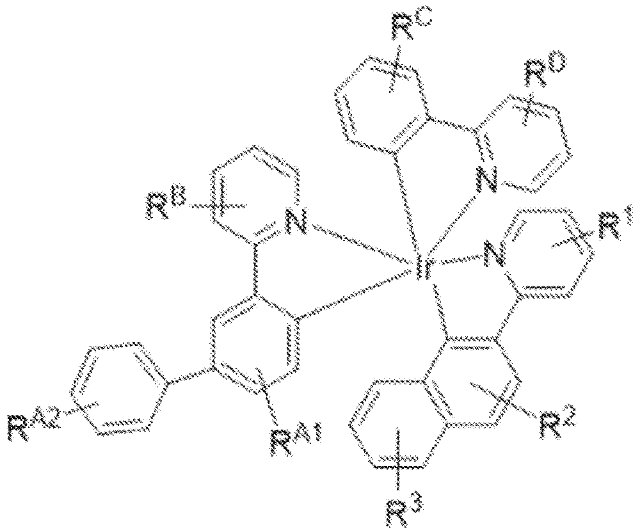--

In Claim 9, Column 478, Lines 1-26, please delete compound
"
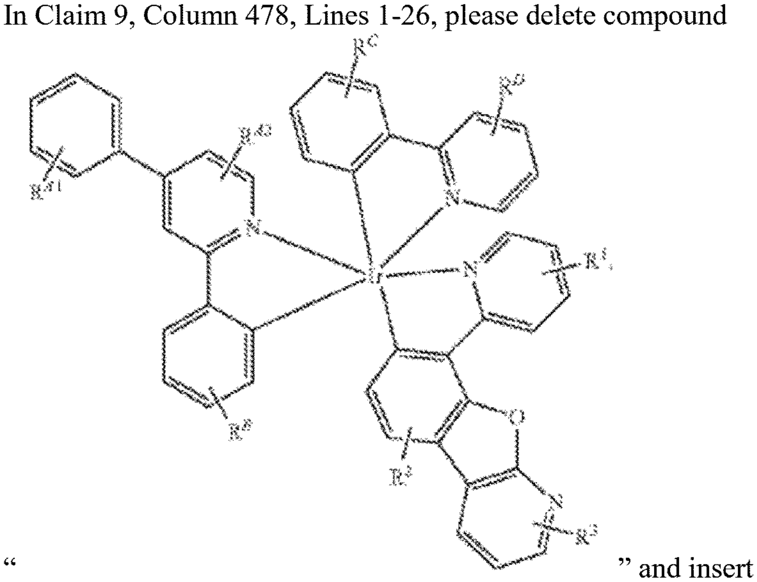
" and insert
--
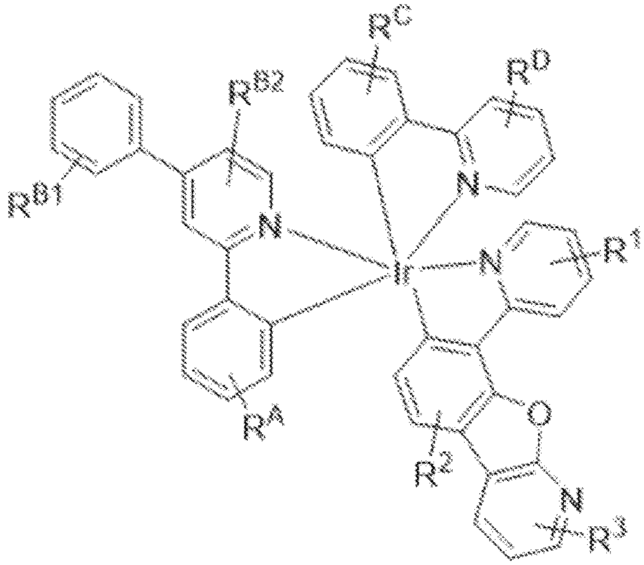
--

In Claim 9, Column 478, Lines 27-48, please delete compound
"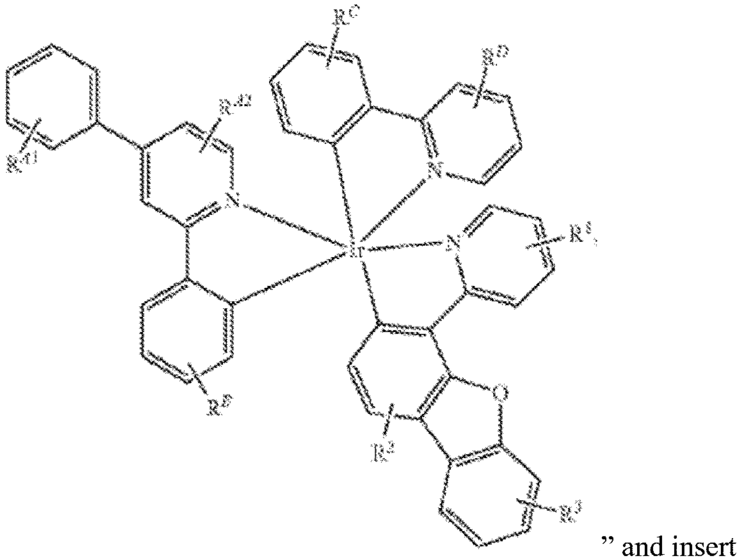
" and insert
--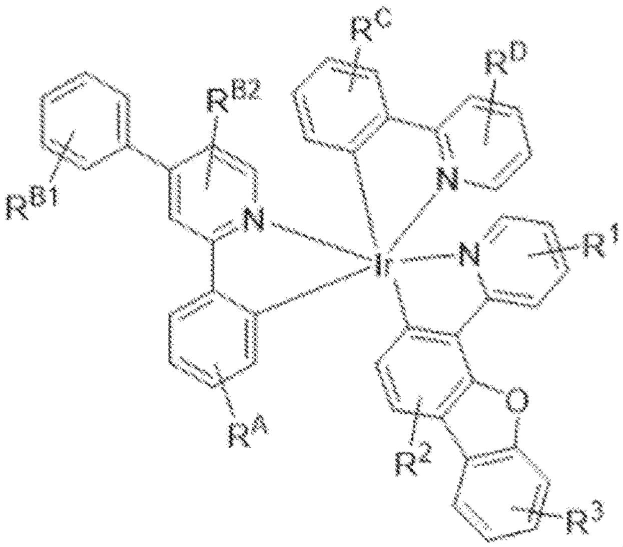
--

In Claim 9, Column 478, Lines 49-67, please delete compound
" 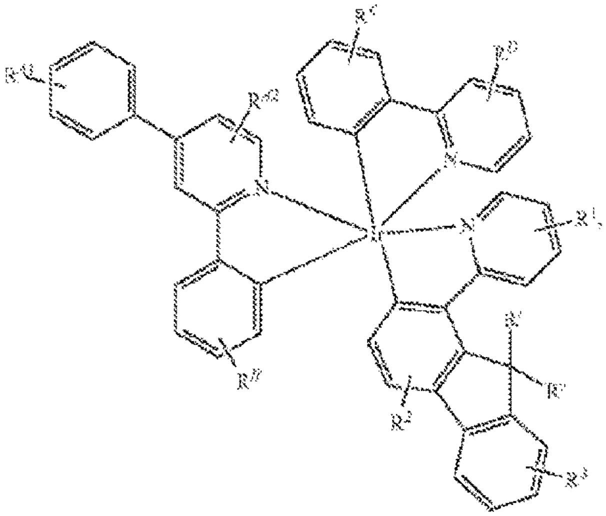 " and insert
-- 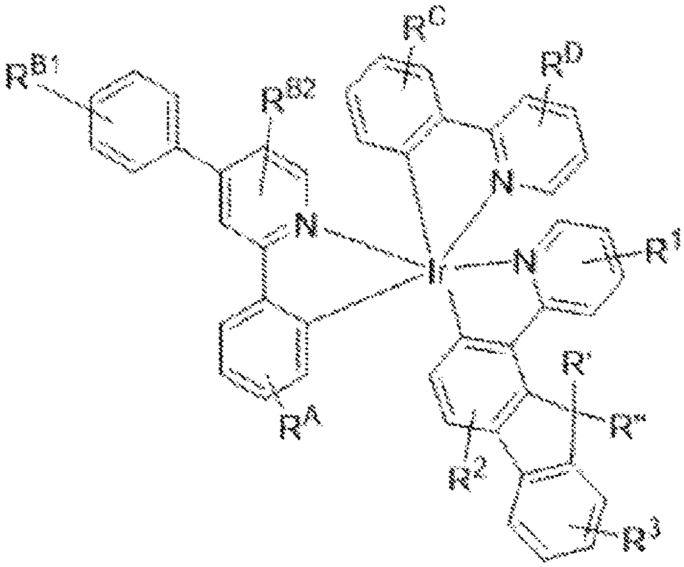 --

In Claim 9, Column 479, Lines 1-19, please delete compound
"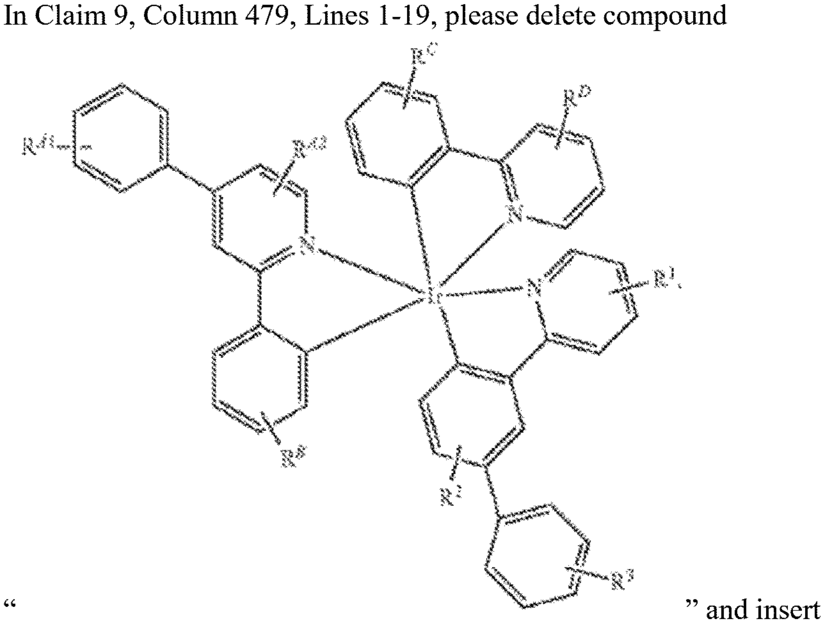" and insert
--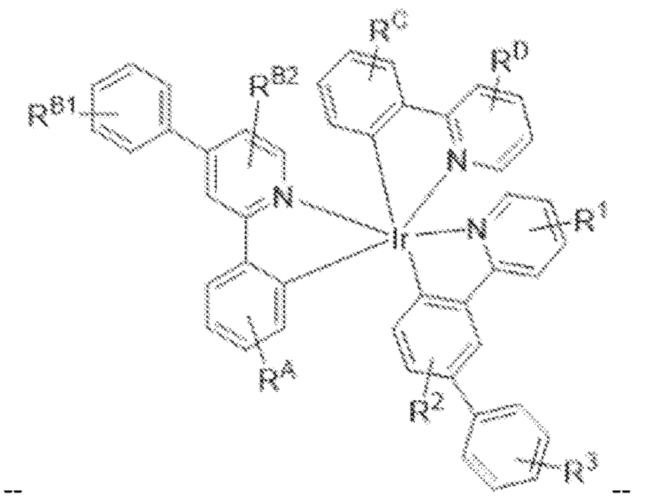--

In Claim 9, Column 479, Lines 20-37, please delete compound
" 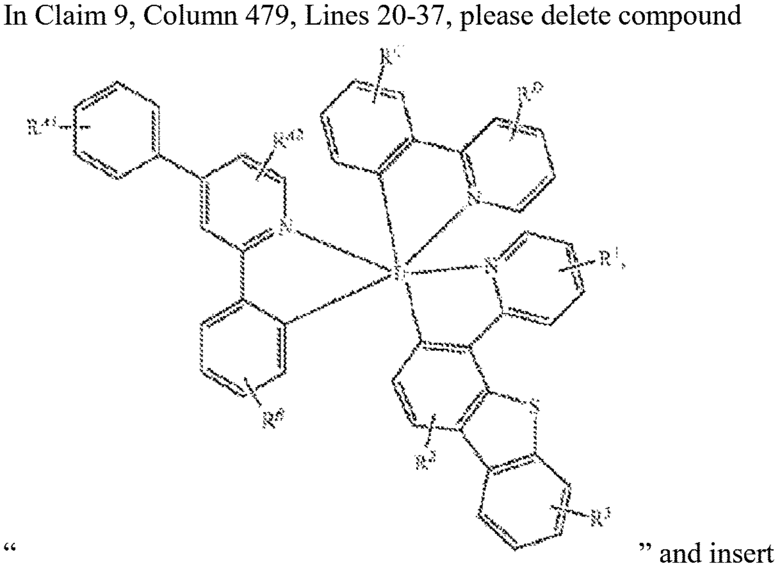 " and insert
-- 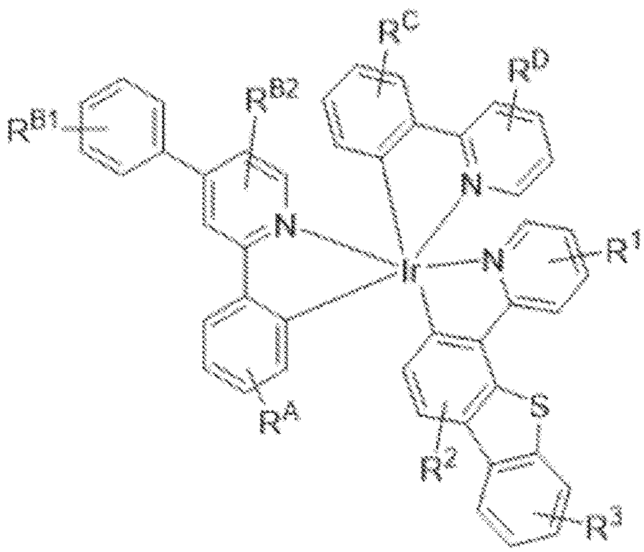 --
In Claim 9, Column 479, Lines 38-52, please delete compound
" 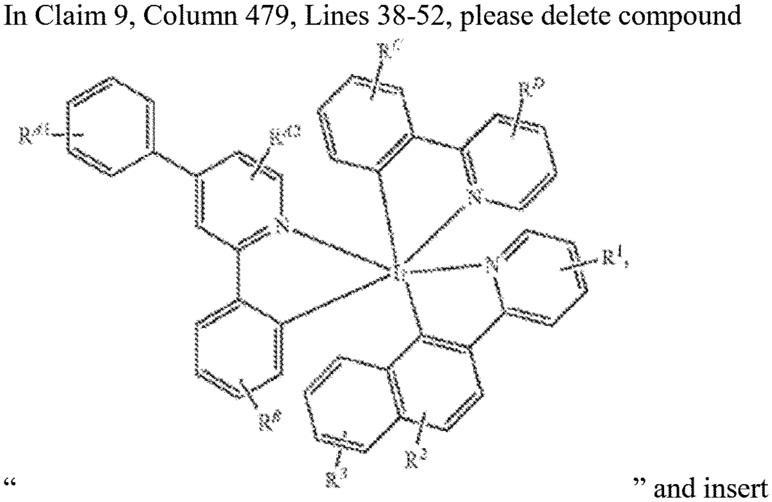 " and insert

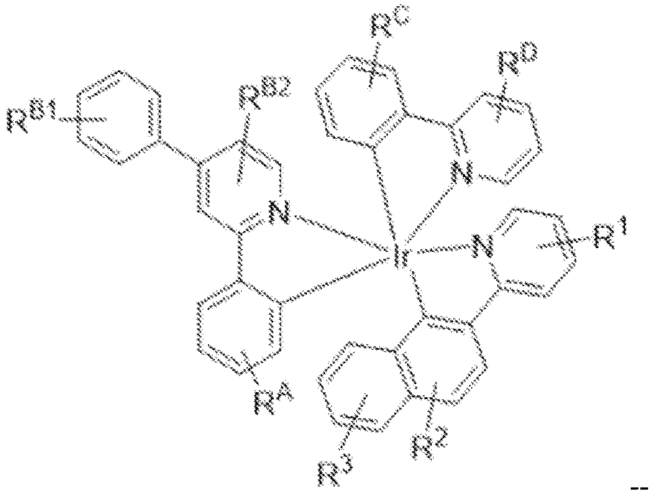
-- --
In Claim 9, Column 479, Lines 53-67, please delete compound
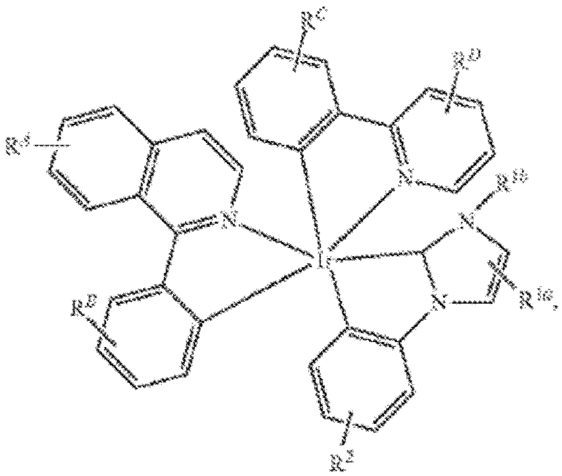
" " and insert
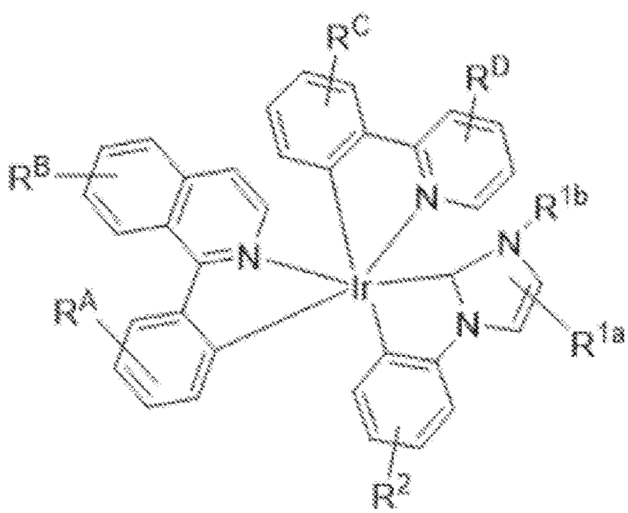
-- --

In Claim 9, Column 480, Lines 1-16, please delete compound
"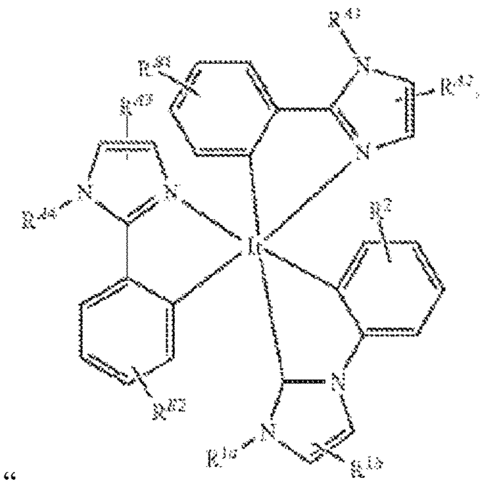" and insert
--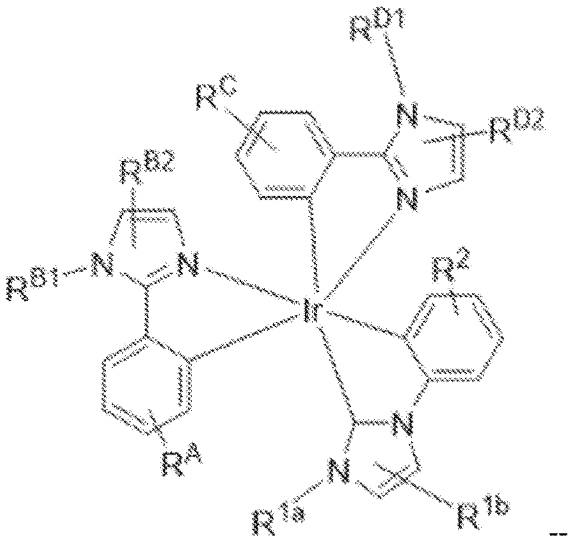
--
In Claim 9, Column 480, Lines 17-31, please delete compound
"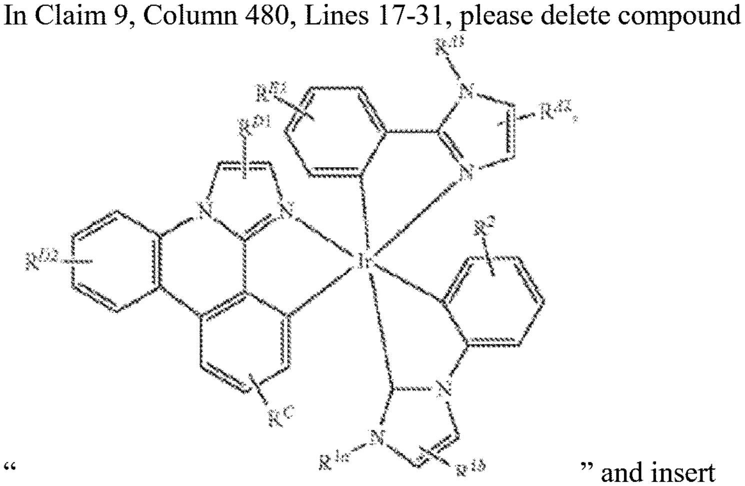" and insert

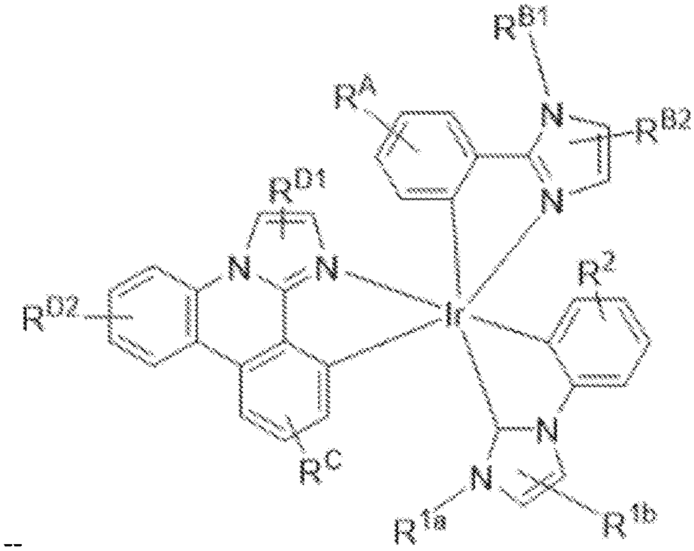
-- --
In Claim 9, Column 480, Lines 50-67, please delete compound
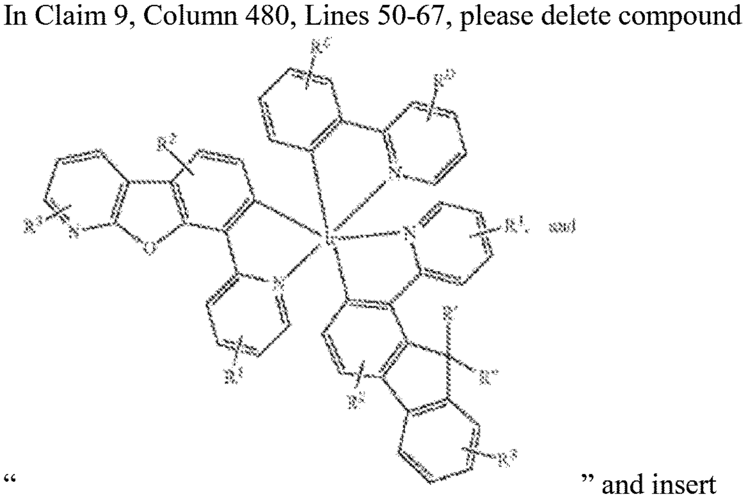
" " and insert
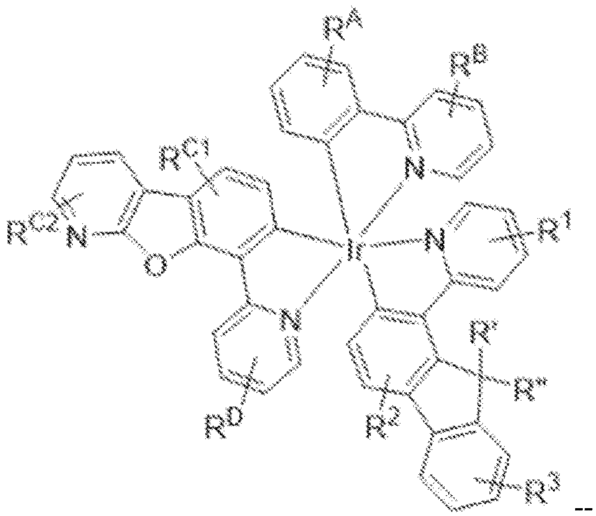
-- --

In Claim 9, Column 481, Lines 1-20, please delete compound
" 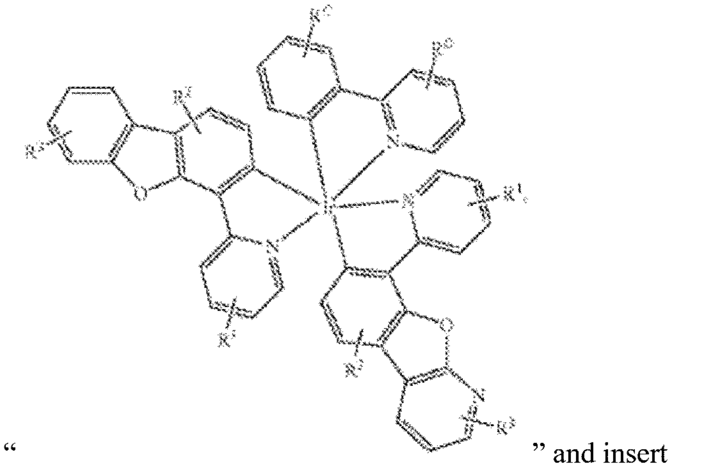 " and insert
-- 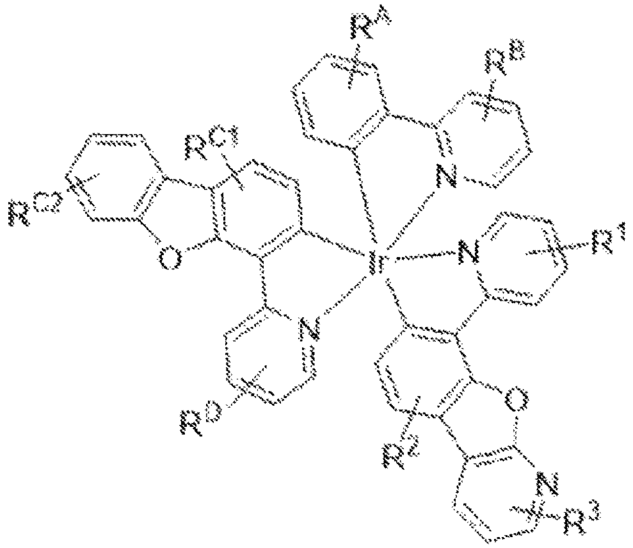 --